(12) United States Patent
Meijer et al.

(10) Patent No.: US 11,988,619 B2
(45) Date of Patent: May 21, 2024

(54) NV-CENTER-BASED MICROWAVE-FREE QUANTUM SENSOR AND USES AND CHARACTERISTICS THEREOF

(71) Applicant: Quantum Technologies GmbH, Leipzig (DE)

(72) Inventors: Jan Berend Meijer, Bochum (DE); Robert Staacke, Leipzig (DE); Nils Meijer, Bochum (DE); Bernd Burchard, Essen (DE)

(73) Assignee: QUANTUM TECHNOLOGIES GMBH, Leipzig (DE)

( * ) Notice: Subject to any disclaimer, the term of this patent is extended or adjusted under 35 U.S.C. 154(b) by 177 days.

(21) Appl. No.: 17/629,171

(22) PCT Filed: Jul. 22, 2020

(86) PCT No.: PCT/DE2020/100648
§ 371 (c)(1),
(2) Date: Jan. 21, 2022

(87) PCT Pub. No.: WO2021/013308
PCT Pub. Date: Jan. 28, 2021

(65) Prior Publication Data
US 2022/0307997 A1    Sep. 29, 2022

(30) Foreign Application Priority Data

Jul. 25, 2019 (DE) .................... 10 2019 009 153.1
Aug. 5, 2019 (DE) .................... 10 2019 005 484.9
(Continued)

(51) Int. Cl.
*G01V 3/00*        (2006.01)
*C01B 32/26*       (2017.01)
(Continued)

(52) U.S. Cl.
CPC .......... *G01N 24/006* (2013.01); *C01B 32/26* (2017.08); *C01B 32/28* (2017.08); *C09K 11/65* (2013.01);
(Continued)

(58) Field of Classification Search
CPC .... G01R 33/307; G01R 33/30; G01R 33/302; G01R 33/305; G01N 24/08
(Continued)

(56) References Cited

U.S. PATENT DOCUMENTS 4,124,690 A    11/1978  Strong et al.
5,637,878 A     6/1997  Herer et al.
(Continued)

FOREIGN PATENT DOCUMENTS

CN    105158709 A    12/2015
CN    107256047 B    10/2017
(Continued)

OTHER PUBLICATIONS

Wickenbrock, Arne et al. "Microwave-free magnetometry with nitrogen-vacancy centers in diamond," arxiv.org, Cornell University Library, 201 Olin Library Cornell University Ithaca, NY 14853, Jun. 9, 2016 (Jun. 9, 2016), DOI: 10.1063/ 1.4960171 XP080965843 (5 pages).
(Continued)

*Primary Examiner* — Alter L Lindsay, Jr.
*Assistant Examiner* — Frederick Wenderoth
(74) *Attorney, Agent, or Firm* — Mindful IP Law; Michael J. McCandlish

(57) ABSTRACT

A sensor system is based on diamonds with a high density of NV centers. The description includes a) methods for producing the necessary diamonds of high NV center density, b) characteristics of such diamonds, c) sensing elements for utilizing the fluorescence radiation of such diamonds, d)
(Continued)

sensing elements for utilizing the photocurrent of such diamonds, e) systems for evaluating these quantities, f) reduced noise systems for evaluating these systems, g) enclosures for using such systems in automatic placement equipment, g) methods for testing these systems, and h) a musical instrument as an example of an ultimate application of all these devices and methods.

16 Claims, 99 Drawing Sheets

(30) Foreign Application Priority Data

| | | | |
|---|---|---|---|
| Aug. 5, 2019 | (DE) | ..................... | 10 2019 009 155.8 |
| Oct. 28, 2019 | (DE) | ..................... | 10 2019 129 092.9 |
| Nov. 7, 2019 | (DE) | ..................... | 10 2019 130 115.7 |
| Mar. 22, 2020 | (DE) | ..................... | 10 2020 107 831.5 |
| Apr. 5, 2020 | (DE) | ..................... | 10 2020 003 532.9 |

(51) Int. Cl.
  *C01B 32/28*  (2017.01)
  *C09K 11/65*  (2006.01)
  *G01N 24/00*  (2006.01)
(52) U.S. Cl.
  CPC ...... *C01P 2002/52* (2013.01); *C01P 2006/60* (2013.01); *C01P 2006/88* (2013.01)
(58) Field of Classification Search
  USPC ......................................................... 324/304
  See application file for complete search history.

(56) References Cited

U.S. PATENT DOCUMENTS

| | | |
|---|---|---|
| 6,697,402 B2 | 2/2004 | Crawford |
| 7,604,846 B2 | 10/2009 | Park et al. |
| 7,812,692 B2 | 10/2010 | Ayazi et al. |
| 8,168,413 B2 | 5/2012 | Chang |
| 8,547,090 B2 | 10/2013 | Lukin et al. |
| 8,766,154 B2 | 7/2014 | Schweninger |
| 8,947,080 B2 | 2/2015 | Lukin et al. |
| 8,952,680 B2 | 2/2015 | Nagai et al. |
| 8,961,920 B1 | 2/2015 | Pope, II et al. |
| 8,986,646 B2 | 3/2015 | Twitchen et al. |
| 9,185,762 B2 | 11/2015 | Mark et al. |
| 9,222,887 B2 | 12/2015 | Englund |
| 19,222,887 | 12/2015 | Englund |
| 9,368,936 B1 | 6/2016 | Lenius et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,599,562 B2 | 3/2017 | Englund et al. |
| 9,632,045 B2 | 4/2017 | Englund et al. |
| 9,638,821 B2 | 5/2017 | Meyer et al. |
| 9,658,301 B2 | 5/2017 | Walsworth et al. |
| 9,664,767 B2 | 5/2017 | Cappellaro et al. |
| 9,720,055 B1 | 8/2017 | Hahn et al. |
| 9,817,081 B2 | 11/2017 | Hahn et al. |
| 9,823,314 B2 | 11/2017 | Hahn et al. |
| 9,829,545 B2 | 11/2017 | Stetson, Jr. et al. |
| 9,910,104 B2 | 3/2018 | Boesch et al. |
| 9,910,105 B2 | 3/2018 | Boesch et al. |
| 9,958,320 B2 | 5/2018 | Burchard et al. |
| 10,006,973 B2 | 6/2018 | Hahn et al. |
| 10,007,885 B1 | 6/2018 | Gorshkov et al. |
| 10,012,704 B2 | 7/2018 | Coar et al. |
| 10,120,039 B2 | 11/2018 | Stetson, Jr. et al. |
| 10,168,393 B2 | 1/2019 | Stetson, Jr. et al. |
| 10,193,304 B2 | 1/2019 | Winer et al. |
| 10,241,158 B2 | 3/2019 | Manickam et al. |
| 10,345,396 B2 | 7/2019 | Manickam et al. |
| 10,359,479 B2 | 7/2019 | Manickam et al. |
| 10,408,889 B2 | 9/2019 | Kaup et al. |
| 10,408,890 B2 | 9/2019 | Bruce et al. |
| 2005/0218397 A1 | 10/2005 | Tran |
| 2006/0044429 A1 | 3/2006 | Toda et al. |
| 2008/0170143 A1 | 7/2008 | Yoshida |
| 2009/0110626 A1 | 4/2009 | Hemley et al. |
| 2010/0176280 A1 | 7/2010 | Yokogawa |
| 2015/0090033 A1 | 4/2015 | Budker et al. |
| 2017/0328965 A1 | 11/2017 | Hruby et al. |
| 2018/0203080 A1 | 7/2018 | Acosta et al. |

FOREIGN PATENT DOCUMENTS

| | | | | |
|---|---|---|---|---|
| CN | 107840331 A | 3/2018 | | |
| CN | 108254591 A | 7/2018 | | |
| CN | 108983121 A | 12/2018 | | |
| DE | 19546563 C2 | 6/1994 | | |
| DE | 4322830 A1 | 1/1995 | | |
| DE | 19514062 A1 | 11/1995 | | |
| DE | 19546563 C2 | 9/1997 | | |
| DE | 19914362 A1 | 10/1999 | | |
| DE | 102008021588 A1 | 12/2009 | | |
| DE | 102006036167 B4 | 2/2011 | | |
| DE | 102009060873 A1 | 7/2011 | | |
| DE | 10 2012 025 088 A1 | 6/2014 | | |
| DE | 102014105482 A1 | 10/2014 | | |
| DE | 10 2014 219 547 A1 | 3/2016 | | |
| DE | 102015208151 A1 | 11/2016 | | |
| DE | 102016116875 A1 | 3/2017 | | |
| DE | 102015015390 A1 | 5/2017 | | |
| DE | 102016116368 A1 | 3/2018 | | |
| DE | 102016116369 A1 | 3/2018 | | |
| DE | 102017100879 A1 | 7/2018 | | |
| DE | 102017122365 B3 | 7/2018 | | |
| DE | 102018106860 A1 | 9/2018 | | |
| DE | 102018106861 A1 | 9/2018 | | |
| DE | 102017121713 A1 | 3/2019 | | |
| DE | 102019117423 A | 6/2019 | | |
| DE | 102019120076 A | 7/2019 | | |
| DE | 102019121028 A | 8/2019 | | |
| DE | 102019121029 A | 8/2019 | | |
| DE | 102019121137 A | 8/2019 | | |
| DE | 102020101784 A | 1/2020 | | |
| DE | 10 2018 127 394 A1 | 5/2020 | | |
| DE | 102018127394 A1 | 5/2020 | | |
| DE | 102020129332 A | 11/2020 | | |
| DE | 202020106145 U1 * | 12/2020 | ............. | G01D 3/063 |
| EP | 0014528 B1 | 3/1983 | | |
| EP | 0275063 A2 | 7/1988 | | |
| EP | 0316856 B1 | 2/1993 | | |
| EP | 0615954 A1 | 9/1994 | | |
| EP | 1490772 B1 | 6/2005 | | |
| EP | 1097107 B1 | 3/2006 | | |
| EP | 1645664 A1 | 4/2006 | | |
| EP | 2521179 B1 | 10/2015 | | |
| EP | 3301473 A1 | 9/2016 | | |
| JP | H0536399 B2 | 5/1993 | | |
| JP | H05140550 A | 6/1993 | | |
| RU | 2145365 C1 | 2/2000 | | |
| RU | 2015132335 A | 2/2017 | | |
| WO | 0173617 A2 | 10/2001 | | |
| WO | 2009106316 A2 | 9/2009 | | |
| WO | 2016083140 A1 | 6/2016 | | |
| WO | 2017148772 A1 | 9/2017 | | |
| WO | 2018169997 A1 | 9/2018 | | |
| WO | 2019108781 A1 | 6/2019 | | |
| WO | 2020239172 A1 | 12/2020 | | |
| WO | 2021089091 A1 | 5/2021 | | |

OTHER PUBLICATIONS

Capelli, M. et al. "Increased nitrogen-vacancy centre creation yield in diamond through electron beam irradiation at high temperature "Carbon, GB, vol. 143, Nov. 24, 2018 (Nov. 24, 2018), pp. 714-719DOI: 10.1016/j.carbon.2018 .11.051ISSN: 0008-6223 , XP055743361 (6 pages).

(56) References Cited

OTHER PUBLICATIONS

Bourgeois E. et al. "Photoelectric detection of electron spin resonance of nitrogen-vacancy centres in diamond "Nature Communications, vol. 6, No. 1, Oct. 21, 2015 (Oct. 21, 2015), DOI: 10.1038/ncomms9577XP055743125 (8 pages).

Meijer J. et al. "Generation of single color centers by focused nitrogen implantation," (13 pages).

Manheller, Marcel et al. "Reliable fabrication of 3 nm gaps between nanoelectrodes by electron-beam lithography," IOP Publishing Nanotechnology doi:10.1088/0957-4484/23/12/125302 (7 pages).

Leger J.R. et al. "Design and performance of diffractive optics for custom laser resonators," Applied Optics, May 10, 1995, Optical Society of America, Washington, DC, US, DOI: https://dx.doi.org/10.1364/AO.34.002498, Source details: vol. 34., Nr.:14. (13 pages).

Balasubramanian, Gopalakrishnan et al. "Nanoscale imaging magnetometry with diamond spins under ambient conditions" Nature, Oct. 2, 2008, Macmillan Journals Ltd., etc., DOI: https://dx.doi.org/10.1038/nature07278, Source details: vol. 455, Nr.: 7213, pp. 648-651.

Dutt, Gurudev et al. "Quantum Register Based on Individual Electronic and Nuclear Spin Qubits in Diamond" Science, Jun. 1, 2007, American Association for the Advancement of Science, US, DOI: https://dx.doi.org/10.1126/science.1139831, Source details: vol. 316, pp. 1312-1316.

Webb James L. et al. "Nanotesla sensitivity magnetic field sensing using a compact diamond nitrogen-vacancy magnetometer" Applied Physics Letters, Jun. 13, 2019, American Institute of Physics, 2 Huntington Quadrangle, Melville, NY 11747, DOI: https://dx.doi.org/10.1063/1.5095241, Source details: vol. 114, Nr.:23 (6 pages).

Wikipedia "Pulsmodulation" original document with English translation.

Albrecht, Andreas et al. "Testing quantum gravity by nanodiamond interferometry with nitrogen-vacancy centers," arXiv:1403.6038v2 [quant-ph] Oct. 8, 2014 (22 pages).

Beaufils, C. et al. "Optical properties of an ensemble of G-centers in silicon," arXiv:1708.05238v1 [physics.app-ph] Jul. 13, 2017 (13 pages).

Smeltzer, Benjamin et al. "Robust control of individual nuclear spins in diamond," arXiv:0909.3896v1 [quant-ph] Sep. 22, 2009 (22 pages).

Burchard, Bernd Dipl.-ing "Diamond-based electronic and optoelectronic devices and device structures," Dissertation to obtain the degree of Doctor Engineer of the Department of Electrical Engineering of the University of Hagen, English translation (237 pages).

Cai Jianming et al. "Hybrid sensors based on colour centres in diamond and piezoactive layers," Nature Communications, Received Nov. 21, 2013, Accepted May 8, 2014, Published Jun. 9, 2014, DOI: 10.1038/nocomms5065 (6 pages).

Castelletto, Stefania et al. "Silicon carbide color centers for quantum applications," JPhys Photonics received Aug. 16, 2019, revised Nov. 23, 2019, accepted for publication Feb. 18, 2020, published Mar. 6, 2020 (30 pages).

Dolde F. et al. "Electric-field sensing using single diamond spins," Nature Physics, Published Oneline: Apr. 17, 2011, DOI:10.1038/NPHYS1969 (5 pages).

Diamond Quality Factors, Fancy Color Diamond Quality Factors, https://www.gia.edu/fancy-color-diamond-quality-factor#, Mar. 5, 2020, 16:08 (3 pages).

Häubler ßtefan et al. "Photoluminescence excitation spectroscopy of SiV- and GeV- color center in diamond," New J. Phys. 19 (2017) 063036, https://doi.org/10.1088/1367-2630/aa73e5 (10 pages).

Horsthemke, Ludwig et al. "Highly Sensitive Compact Room Temperature Quantum Scalar Magnetometer," DOI: 10.5162/SMSI2020/A1.4 (3 pages).

King John M., Editor "GIA Colored Diamonds Color Reference Charts," ISBN 0-87311-053-6 (21 pages).

Klein, U. "Radio astronomy: tools, applications and impacts," Course astro 841, Argelander-Institut fur Astronomie Bonn, Jan. 2006, (Last revision Sep. 2011) (311 pages).

Diamanten—Die 4 C's—Koenig Jewellery—Juwelier, https://www.koenigjewellery.com/diamanten/die-welt-der-diamanten/gia (3 pages).

Kress, Bernard C. et al. "Applied Digital Optics From Micro-Optics to Nanophotonics," Wiley a John Wiley and Sons, Ltd, Publication, ISBN 978-0-470-02263-4 (cloth) (640 pages).

Kucsko G. et al. "Nanometer scale thermometry in a living cell," NIH Public Access Author Manuscript, PMC Nov. 6, 2014, Nature. Aug. 1, 2013; 500(7460): 54-58. doi: 10.1038/nature12373.

LIN Specification Package, Revision 2.1, Nov. 24, 2006, © LIN Consortium, 2006, Website: www.lin-subbus.org Contact: Technical-Contact@lin-subbus.org (191 pages).

Metsch, Mathias H. et al. "Initialization and Readout of Nuclear Spins via negatively charged Silicon-Vacancy Center in Diamond," arXiv:1902.02965v3 [quant-ph] Feb. 19, 2019 (6 pages).

Fancy Colour Diamonds | Fancy Diamond Colour Wheel | Nina's Jewellery, https://www.ninasjewellery.com.au/fancy-coloured-diamonds (2 pages).

OSRAM Opto Semiconductors, www.osram-os.com, PLT5 520, Metal Can TO56, Green Laser Diode in TO56 Package, Version 1.3 | May 20, 2020 (17 pages).

Pfender, Matthias et al. "Protecting a diamond quantum memory by charge state control," arXiv:1702.01590v1 [quant-ph] Feb. 6, 2017 (9 pages).

Proctor, Timothy J. et al. "Universal quantum computation by the unitary control of ancilla qubits and using a fixed ancilla-register interaction," arXiv:1307.6095v3 [quant-ph] Oct. 24, 2013 (10 pages).

Saleh, Bahaa E. A. et al. "Fundamentals of Photonics," Copyright 1991 by John Wiley & Sons, Inc., ISBN 0-471-83965-5 (36 pages).

Siyushev, Petr et al. "Photoelectrical imaging and coherent spin-state readout of single nitrogen-vacancy centers in diamond," Quantum Optics, Science 363, 728-731 (2019) Feb. 15, 2019 (5 pages).

Snyman Lukas W. et al. "High Intensity 100 nW 5 GHz Silicon Avalanche LED utilizing carrier energy and momentum engineering," Conference Paper in Proceedings of SPIE—The International Society for Optical Engineering, Feb. 2014, DOI: 10.1117/12.2038195 (13 pages).

Staacke, Robert et al. "Isotropic Scalar Quantum Sensing of Magnetic Fields for Industrial Application," Adv. Quantum Technol. DOI: 10.1002/qute.202000037 (8 pages).

Alegre, T. P. Mayer "Microstrip resonator for microwaves with controllable polarization," arXiv:0708.0777v2 [cond-mat.other] Oct. 11, 2007 (3 pages).

UHU The All Purpose Adhesive Crystal-Clear Synthetic Resin Adhesive for a Universal Application, 63661—UHU All Purpose Adhesive Folding Box 35 ML GB / ID / PRC / TW / TH (3 pages).

Unden, Thomas et al. "Coherent control of solid state nuclear spin nano-ensembles," npj Quantum Information, www.nature.com/npjqi, Received: Feb. 6, 2018 Revised: Jul. 6, 2018 Accepted: Jul. 26, 2018, Published online: Aug. 14, 2018 (6 pages).

Vishay Semiconductors, "Dome Lens SMD LED," www.vishay.com, Rev. 1.0, Feb. 12, 2019 1 Document No. 80003 (11 pages).

Zaitsev, Alexander M. "Optical Properties of Diamond, A Data Handbook," Springer (508 pages).

International Search Report re PCT/DE2020/100648 dated Jan. 12, 2021 (11 pages).

German language Written Opinion re PCT/DE2020/100648 dated Jan. 12, 2021 (15 pages).

Brahim Mohamed I et al, "Room-Temperature Quantum Sensing in CMOS: On-Chip Detection of Electronic Spin States in Diamond Color Centers for Magnetometry", IEEE Symposium on VLSI Circuits, Jun. 18, 2018, pp. 249-250, DOI: 10.1109/VLSIC.2018.8502329, IEEE, Honolulu, HI, USA.

Boudou Jean-Paul et al. "High yield fabrication of fluorescent nanodiamonds nanotechnology," Institute of Physics publishing GB vol. 20 No. 23 Jun. 10, 2009 p. 235602 issn 0957-4484 xp020160565.

Treussart, Francois et al., Chapter 7,"Photoluminescence of color centers in nanodiamonds" Editor(s): Jean-Charles Arnault, In Micro and Nano Technologies, Nanodiamonds, Elsevier, 2017, pp. 155-181, ISBN 9780323430296, https://doi.org/10.1016/B978-0-32-343029-6.00007-6.

(56) References Cited

OTHER PUBLICATIONS

Kobashi Koji "Diamond Films: Chemical Vapor Deposition for Oriented and Heteroepitaxial Growth" Elsevier Science, Nov. 30, 2005, ISBN 9780080447230 (this is a book—copies not allowed by law).

Aboujja, "Avalanche Breakdown Electroluminescence in Silicon Carbide Light Emitting Diodes", Jan. 2000Materials Science Forum 338-342:691-694, DOI: 10.4028/www.scientific.net/MSF.338-342.691.

Meijer et al. "A Set Up for Quantum Dot Generation by Means of Ultra High Resolution Single Ion Implantation" WE_Heraeus-Seminar, Bad Honnef, Germany Oct. 13- 15, 2003.

Meijer J. et al. "Towards the implanting of ions and positioning of nanoparticles with nm spatial resolution" Appl. Phys. A 91, 567-571 (2008).

Song Xerui et al. "Generation of nitrogen-vacancy color center in nano-diamonds by high temperature annealing", Applied Physics Letters 102(13), Apr. 2013.

Plakhotnik Taras et al. "NV-centers in Nano-diamonds: How good they are" Diamond and Related Materials 82, Dec. 2017.

Smith, Bradley R. et al. "Five-Nanometer Diamond with Luminescent Nitrogen-Vacancy Defect Centers" Small 5(14):1649-1653; Mar. 2009.

Bernhard et al. "Applied Digital Optics" Wiley, 2009.

Kim, D. et al. "CMOS-Integrated Diamond Nitrogen-Vacancy Quantum Sensor" arXiv: 1810.01056v1 [physics.app-ph] Oct. 2, 2018.

Mochalin Vadym N. "Nanodiamond-polymer composites" Diamond & Related Materials 58 (2015) 161-171.

Röcke H.et al. "White electroluminescent nanostructure in silicon fabricated using focused ion implantation" Nuclear Instruments and Methods in Physics Research B 181 (1001) pp. 274-279.

Burchard B. et al. "NM Scale Resolution Single Ion Implantation Into Diamond for Quantum Dot Production" 15th European Conference on Diamond, Diamond-Like Materials, Carbon Nanotubes, Nitrides and Silicon Carbide (Diamond 2004), at Sep. 12-17, 2004 · Riva del Garda, Italy.

Kress B.et al., "Digital Diffractive Optics" J. Wiley & Sons, London, 2000.

Burchard Bernd, Disseration titled "Diamond-based electronic and optoelectronic devices and device structures," Hagen 1994.

International Search Report re PCT/DE2020/100648 mailed Jan. 12, 2021 (11 pages).

German language Written Opinion re PCT/DE2020/100648 mailed Jan. 12, 2021 (15 pages).

\* cited by examiner

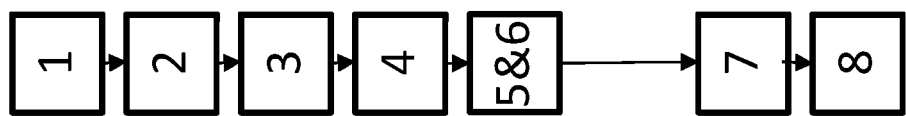
b
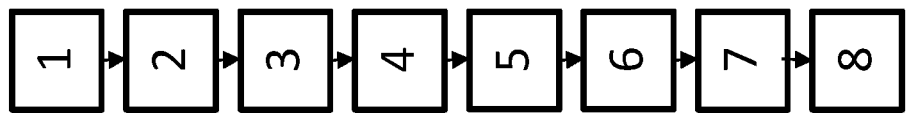
a
Fig. 50

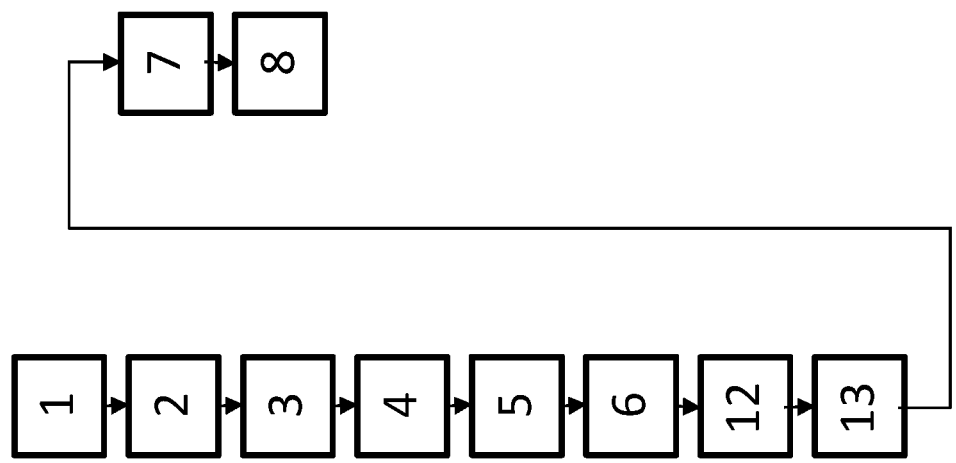
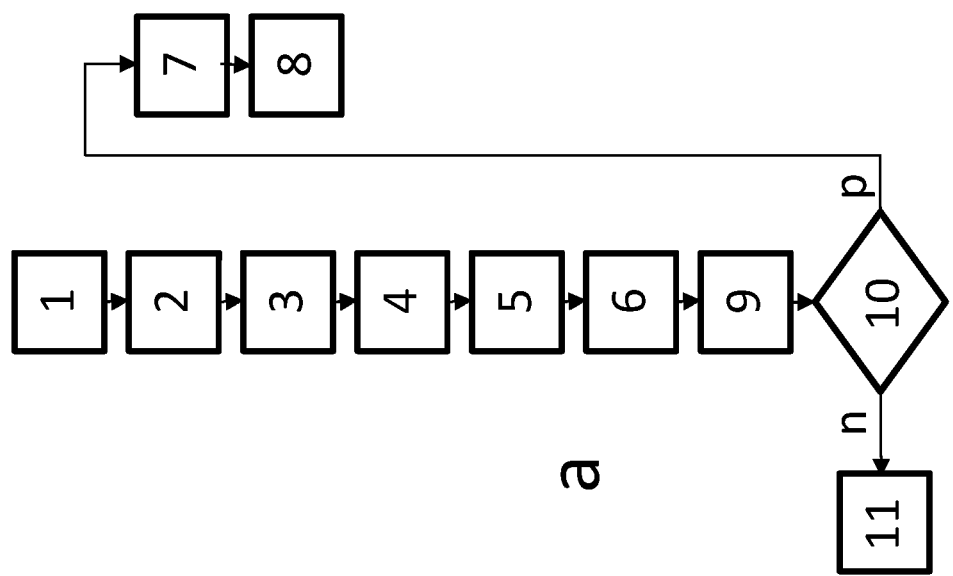
Fig. 51

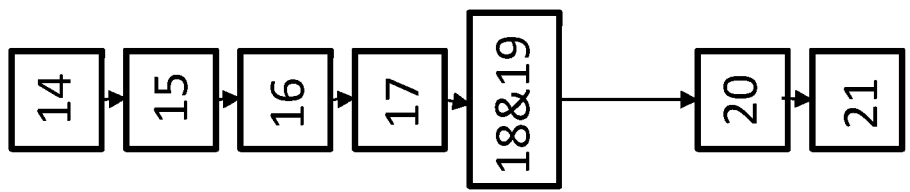
b
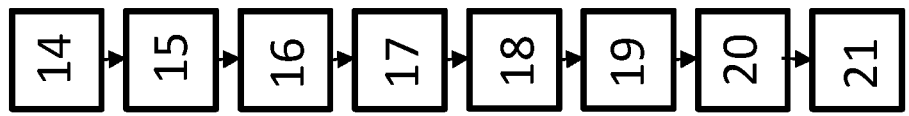
a
Fig. 69

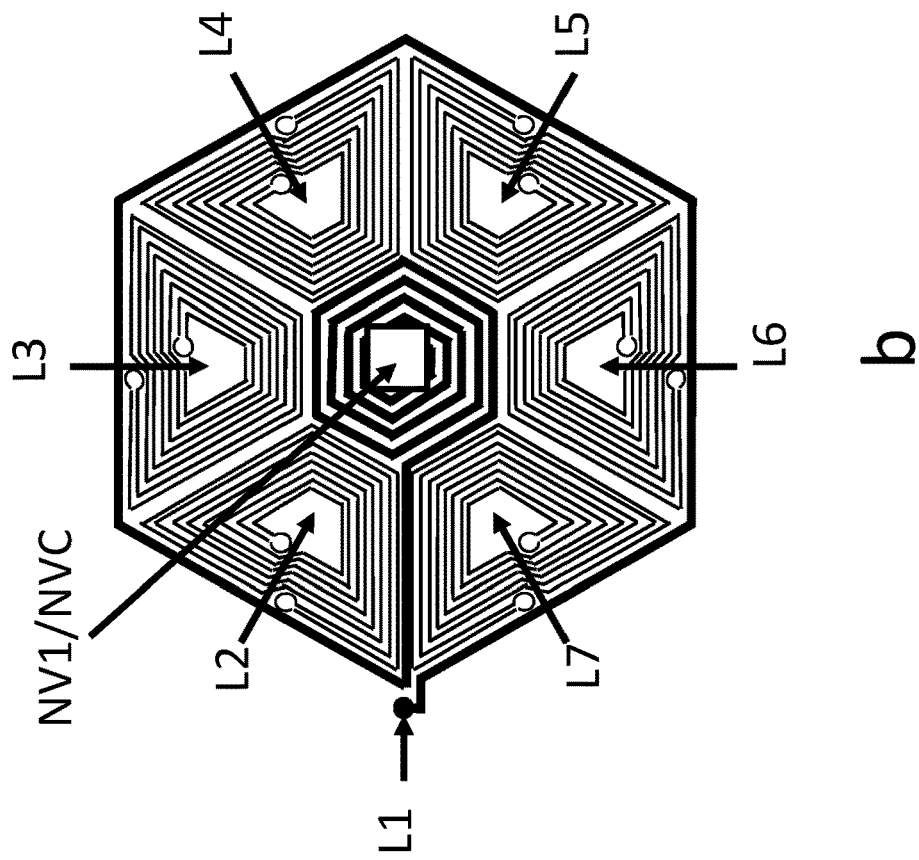
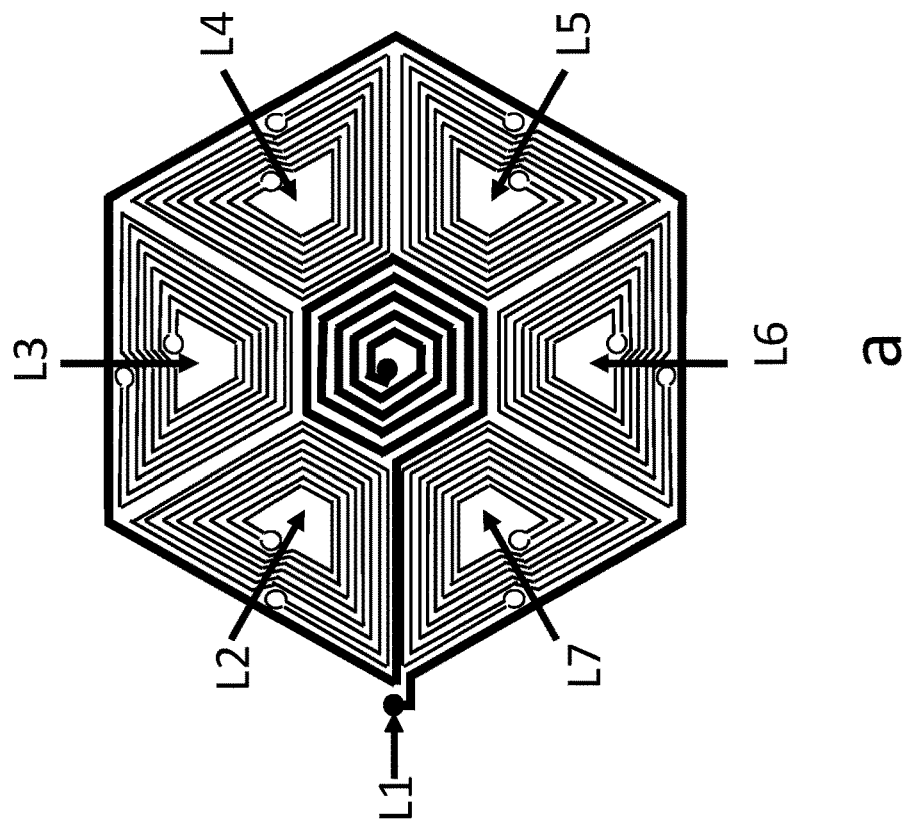
Fig. 70

NV-CENTER-BASED MICROWAVE-FREE QUANTUM SENSOR AND USES AND CHARACTERISTICS THEREOF

CROSS REFERENCE TO RELATED APPLICATIONS

The present patent application is a national stage of, and claims priority to, Patent Cooperation Treaty Application No. PCT/DE2020/100648, filed on Jul. 22, 2020, which application claims the priority of the German patent applications DE 10 2019 009 153.1 filed on Jul. 25, 2019, DE 10 2019 009 155.8 filed on Aug. 5, 2019, DE 10 2019 005 484.9 filed on Aug. 5, 2019, DE 10 2019 129 092.9 filed on Oct. 28, 2019, DE 10 2019 130 115.7 filed on Nov. 7, 2019, DE 10 2020 107 831.5 filed on Mar. 22, 2020, and DE 10 2020 003 532.9 filed on Apr. 5, 2020, the disclosures of which are incorporated by reference in the present patent application.

TECHNICAL FIELD

The disclosure relates, inter alia, to a method and a device for generating acoustically equivalent electrical and digital signals by means of sensors based on quantum mechanical effects as microphones or pickups for musical instruments and other technical and medical instruments. The present disclosure thus relates in particular to the detection of magnetic flux densities B, electric flux densities D, pressures P, motion velocities v, position coordinates, distances, electric currents, forces on atomic nuclei afflicted with a magnetic moment, accelerations a, gravitational field strengths g, mechanical and electromagnetic oscillations, rotational velocities $\omega$, temperatures $\vartheta$, intensities of ionizing radiations by means of sensors based on quantum mechanical effects. The mechanical vibrations can be used, for example, in musical instruments to produce tones. The evaluation of amplitude and frequency of mechanical vibrations can also be used for quality control of motors or other regularly moving components. Further applications are the use as seismograph or for medical examinations.

INTRODUCTION

Generic methods to convert positions, movements, accelerations, rotational speeds or vibrations into electrically or digitally equivalent signals are pressure-based sensors, thermoelastic or magnetic induction-based methods. The latter is particularly common for electric (electric) guitars and basses. According to the prior art, it is known, for example, that electric guitars or electric basses are equipped with pick-ups in order to convert the vibrations of a struck string into acoustic signals. This uses the induction of voltages by means of temporal field changes in a coil according to Faraday's law. The determination of vibrations by geophones also uses a coupling of earth vibrations to a coil in which a free-moving magnet is located.

A fundamental disadvantage of these methods is that the induction voltage is determined by the temporal change of the magnetic field, in particular by the change of the magnetic flux B, thus representing a differential filter with a corresponding noise amplification. Likewise, the induction of the coil in the measuring system represents a low-pass filter and leads to non-linear transmissions of mechanically composed oscillations of different frequencies. Pressure-based sensors have similar disadvantages. Conventional magnetic sensors also have the disadvantage of low sensitivity or strong temperature dependence, or both. For example, Hall sensor elements have a high internal resistance, which limits the measurement speed. Consequently, the transfer of mechanical vibrations into acoustically equivalent electrical or digital signals is only possible to a limited extent with the present technology. The disclosure is further directed to a housing comprising a sensor system and/or quantum technological system. The sensor system comprises a sensor element having a paramagnetic center (NV1) in the material of a sensor element. All sub-devices of the sensor system are preferably non-ferromagnetic. This relates in particular to the lead frame for mounting the sensor system within an open cavity housing. The paramagnetic center (NV1) is preferably an NV center in a diamond crystal serving as the sensing element, in which case diamond is at least in part the sensing element material. The use of other centers, such as the ST1 center or the SiV center or the GeV center is conceivable. The disclosure is also directed to a corresponding sensor system and/or quantum technological system, wherein the optical transmitter (PL1) of the sensor system is chopped, i.e. pulse modulated. By a special measure all residues of the chopper frequency spectrum are removed from the spectrum of the sensor output signal (out). In particular, a special type of noise reduction is claimed. As used herein, pulse modulation refers to various modulation techniques such as pulse amplitude modulation (PAM), pulse code modulation (PCM), pulse frequency modulation (PFM), pulse width modulation (PWM), pulse pause modulation (PPM), pulse phase modulation (PPM), and pulse position modulation (PPM). Reference is made to hyperlink https://de.wikipedia.org/wiki/Pulsmodulation.

The features described in the following and the features of the claims can typically be combined with each other, even if such combinations are not combined with each other in the claims of the first application, since in part due to lack of space only preferred and/or exemplary combinations were reflected in the claims and the description. The prerequisite for such a combination, which may not be expressly described herein, is that the combination is useful and functional and can be tested by the skilled person, if necessary. The disclosure expressly includes such combinations.

Recently, many publications have been made on the use of NV centers as quantum dots for quantum sensing, quantum computing and quantum cryptography.

Sensors based on quantum mechanical effects are preferably based on paramagnetic spin states and generate no or an extremely low magnetic field themselves. They allow magnetic fields of up to several hundred kHz to be determined independently of frequency. Compared to magnetic field measurement methods based on induction, the measurement system does not affect the oscillating system to be measured and thus allows an uninfluenced measurement of the system to be measured. Due to the measurement principle based on quantum mechanical effects, the detection principle is largely insensitive to temperature.

FIG. 1 shows a prior art quantum dot-based measurement system schematically as a highly simplified block diagram. In the prior art, a pump radiation source (PL1) with a pump radiation wavelength ($\lambda_{pmp}$) emits pump radiation (LB) into a first transmission path (I1) as a function of a transmission signal (S5). For the intensity i1 of the pump radiation (LB) emitted into the first transmission path (I1), we find the equation I in linear approximation:

$$I1 = h0 + hRa + h1*(s5w + s5g + hRb)$$

Here h0 describes an offset value that is specific to the pump radiation source (PL1). hRa describes a noise that is independent of intensity. h1 describes a proportionality factor that applies to the pump radiation source (PL1) at the selected operating point with a linear approximation. s5w represents the instantaneous value of the alternating component (S5w) of the transmission signal (S5). s5g represents the instantaneous value of the DC component (S5g) of the transmission signal (S5). hRb represents the co-amplified input noise of the pump radiation source (PL1). Thus, in the prior art, the pump radiation source (PL1) is modulated with the transmission signal (S5).

Only a first portion a1 of the pump radiation (LB), which is located in the first transmission path (I1), reaches the sensor element with the paramagnetic center (NV1) or the paramagnetic centers (NV1). Preferably, the sensor element is one or more diamonds and the paramagnetic center (NV1) in this case is then preferably one or more NV centers.

The pump radiation (LB) from the first transmission path (I1) thus irradiates the paramagnetic center or centers (NV1) of the sensor element with pump radiation (LB). The paramagnetic center or centers (NV1) convert a second portion a2 of the received pump radiation (LB) into a fluorescence radiation (FL) having an intensity i2.

$$i2 = a1*a2*[h0 + hRa + h1*(s5w + s5g + hRb)]$$

The paramagnetic center (NV1) or centers (NV1) thus radiate the fluorescence radiation (FL) into a second transmission path (I2) with intensity i2. The sensor element also reflects or transmits a third portion a3 of the pump radiation (LB) into the second transmission path (I2).

$$i2 = a1*a2*[h0 + hRa + h1*(s5w + s5g + hRb)] + a1*a3* \\ [h0 + hRa + h1*(s5w + s5g + hRb)]$$

An optical filter (F1), which is assumed to be ideal here, transmits the fluorescence radiation (FL) and absorbs or reflects the pump radiation (LB) so that only a fourth fraction a4 of the fluorescence radiation (FL) reaches the radiation receiver (PD).

$$i2' = a4*a1*a2*[h0 + hRa + h1*(s5w + s5g + hRb)]$$

At the end of the second transmission path (I2), the radiation receiver (PD) receives this portion of the fluorescence radiation (FL) with intensity i2' and converts it into a receiver output signal (S0) with value (s0).

$$s0 = d0 + dRa + d1*(i2' + dRb)$$

$$s0 = d0 + dRa + d1*(a4*a1*a2*[h0 + hRa + h1*(s5w + s5g + hRb)] + dRb)$$

Here, d0 describes an offset value specific to the radiation receiver (PD). dRa describes a noise of the radiation receiver (PD) that is independent of the intensity. d1 describes a proportionality factor that applies to the radiation receiver (PD) at the selected operating point with linear approximation. dRb stands for the co-amplified input noise of the radiation receiver (PD). Multiplying out results in:

$$s0 = d0 + dRa + d1*a4*a1*a2*h0 + d1*a4*a1*a2*hRa + \\ d1*a4*a1*a2*h1*s5w + d1*a4*a1*a2*h1*s5g + \\ d1*a4*a1*a2*h1*hRb + d1*a4*a1*a2*dRb$$

In the prior art, multiplication is then performed with the instantaneous value (s5w) of the alternating component (S5w) of the transmission signal (S5) to the filter input signal (S3):

$$s3 = d0*s5w + dRa*s5w + \\ d1*a4*a1*a2*h0*s5w + d1*a4*a1*a2*hRa*s5w + \\ d1*a4*a1*a2*h1*s5w*s5w + d1*a4*a1*a2*h1*s5g*s5w + \\ d1*a4*a1*a2*h1*hRb*s5w + d1*a4*a1*a2*dRb*s5w$$

We now use a linear loop filter (TP) with the filter function F[X1]. Let X1 and X1 be the two values of any two signals. Let x be any real factor. For the purposes of this disclosure, a filter with filter function F[X1] is a linear filter if (Equation XIII) holds:

$$F[X1 + X2] = F[X1] + F[X2]$$

$$F[x*X1] = x*F[X1]$$

This filter input signal (S3) is then filtered in a low-pass filter as a loop filter (TP) in the prior art.

This loop filter (TP) is a linear filter with filter function F[s3] according to Equation XIII, thus the value (s3) of the filter input signal (S3) is to be the input variable of the filter function F[ ].

The structure of the loop filter (TP) is typically chosen so that at least approximately:

$$F[s5w] = 0$$

$$F[s5w*s5w] = 1$$

$$F[1] = 1$$

For the filter output signal (S4) we then obtain:

$$s4 = d0*F[s5w] + F[dRa*s5w] + \\ d1*a4*a1*a2*h0*F[s5w] + d1*a4*a1*a2*F[hRa*s5w] + \\ d1*a4*a1*a2*h1*F[s5w*s5w] + d1*a4*a1*a2*h1*s5g*F[s5w] + \\ d1*a4*a1*a2*h1*F[hRb*s5w] + d1*a4*a1*a2*F[dRb*s5w]$$

With F[s5w]=0 and F[s5w*s5f]=1 we then find:

$$s4 = d1*a4*a1*a2*h1 + F[dRa*s5w] + d1*a4*a1*a2*F[hRa*s5w] + \\ d1*a4*a1*a2*h1*F[hRb*s5w] + d1*a4*a1*a2*F[dRb*s5w]$$

As can be easily seen, the noise is reduced by mixing higher-frequency noise components down with the transmission signal (S5). Since the noise levels of these noise components are smaller with respect to 1/f smoking, which is dominant at low frequencies, there is an improvement in the noise performance. However, the noise, especially the white noise, does not disappear.

The instantaneous value (s0) of the receiver output signal (S0) is multiplied by the instantaneous value (s5) of the transmission signal (S5) and the resulting value of the filter input signal is then filtered in a loop filter (TP).

This problem is significantly reduced by the apparatus and method disclosed herein. Complete elimination of noise is not known to be possible for physical reasons.

Furthermore, there are no known methods in the prior art for producing diamonds with a high density of NV centers, which are necessary to obtain a good measurement signal.

Moreover, no methods for enhancing contrast (KT) are known in the prior art.

BACKGROUND

The healing of crystal damage and the change in appearance of diamonds is already known from U.S. Pat. No. 4,124,690 A, without disclosing the production of red diamonds.

A process for reducing the colour of diamonds is known from EP 0 014 528 B1. This is a process for reducing the colour of type 1b diamonds, which according to EP 0 014 528 B1 is characterised by the fact that the diamond is subjected to irradiation with such an energy current and that at least 1018 lattice gaps per $cm^3$ are produced in the diamond. According to the technical teaching of EP 0 014 528 B1, the irradiated diamond is then heat treated at a temperature of 1600° C. to 2200° C. under a pressure at which the diamond is crystallographically stable at the applied temperature.

From EP 0 275 063 A2 a method for generating a high NV center density in diamond is known, in which the diamond is irradiated with electrons of high energy and then annealed at a temperature between 500° C. and a pressure lower than 1 Torr.

A method for producing a red diamond is known from EP 0 615 954 A1. The method of EP 0 615 954 A1 comprises the steps:
1. Preparation of a synthetic diamond crystal containing at least $1\times10^{17}$ and less than $4\times10^{18}$ atoms/$cm^3$ of type Ib nitrogen and less than $1\times10^{18}$ atoms/$cm^3$ of boron;
2. irradiating the diamond crystal with an electron beam at an energy of 1 to 10 MeV in a density range of $2\times10^{15}$ to $5\times10^{16}$ electrons/$cm^2$ or with a neutron beam in a density range of $2\times10^{15}$ to $8\times10^{17}$/$cm^2$ and
3. Annealing the diamond crystal irradiated with the electron beam or the neutron beam in a vacuum atmosphere or an inert gas atmosphere of not more than $10^{-1}$ Torr at a temperature of at least 600° C. and less than 800° C. for at least 3 hours.

Irradiation with the electron beam or neutron beam causes radiation damage in the diamond, which cannot be removed even with subsequent annealing. Therefore, diamonds treated in this way are typically slightly cloudy.

According to the technical teachings of EP 0 615 954 A1, a red diamond thus produced has an absorption coefficient for type Ib nitrogen at 500 nm wavelength of at least 0.1 $cm^{-1}$ and less than 0.2 $cm^{-1}$ and an NV center-caused absorption coefficient at 570 nm which is at least 0m05 $cm^{-1}$ and less than 1 $cm^{-1}$. The absorption coefficient of the GR1 center, the H2 center, the H3 center and the H4 center in the visible region are typically less than 0.2 $cm^{-1}$ in a red diamond fabricated according to the technical teachings of EP 0 615 954 A1.

From RU 2 145 365 C1 a process is known for refining diamonds by exposing them to electron beams and annealing them for a period of time ranging from 30 minutes to several hours before the diamonds acquire specific shades of color. According to RU 2 145 365 C1, the process of RU 2 145 365 C1 is characterized in that the diamonds are subjected to a treatment with electron beams with an integrated electron flow in the range of $5\times10^{15}$-$5\times10^{18}cm^{-2}$ and in ⁻ that the annealing is carried out either at atmospheric pressure or at atmospheric pressure or in vacuum or in an atmosphere of inert gases at 300-1900° C. Also in the technical teaching of RU 2 145 365 C1, the irradiation—annealing sequence is preferably repeated several times in order to prevent agglomeration of radiation damage into agglomerations which can no longer be dissolved.

From EP 0 316 856 B1, purple diamonds are known having absorption coefficients of 0.2-2 $cm^{-1}$ of Ib type nitrogen at 500 nm and of 0.3-10 $cm^{-1}$ of NV center at 570 nm, said diamonds having an absorption coefficient of less than 0.2 $cm^{-1}$ of GR1, H2, H3 and H4 centers in the visible region. In the method according to the technical teachings of EP 0 316 856 B1 for producing purple diamonds, an artificial synthetic diamond crystal of Ib type having an Ib nitrogen content of the crystal in the range of $8\times10^{17}$ to $1.4\times10^{19}$ atoms/$cm^3$ is used, the crystal being subjected to electron irradiation of $5\times10^{16}$-$2\times10^{18}$ electrons/$cm^2$ at 2-4 MeV and an annealing process at a temperature of 800-1100° C. According to the technical teachings of EP 0 316 856 B1, the process is characterized by the fact that the annealing process is carried out in a vacuum of less than 1.33 Pa ($10^{-2}$ Torr) for more than 25 hours, i.e. for a very long time. It is also known from EP 0 316 856 B1 that, if necessary, further irradiations with electrons and further annealing steps can follow after annealing by means of an annealing step.

A method for forming color centers in diamond is known from RU 2015 132 335 A. The method of RU 2015 132 335 A comprises irradiating the diamonds. According to the technical teachings of RU 2015 132 335 A, the diamonds should have a uniform volume distribution of A aggregates with a concentration of at least $10^{18}$ $cm.^{-3}$ According to the RU 2015 132 335 A, the ionizing radiation used for irradiation should have an energy of at least 1 MeV at a dose of 100-120 ppm/$cm^2$ per A unit. According to RU 2015 132 335 A, the technical teaching of RU 2015 132 335 A is characterized in that the irradiation is carried out with an intermediate annealing at a temperature of 850-900 K repeatedly until the desired concentration of color centers is reached, followed by an annealing of the diamond in an inert medium at a temperature of 1200-2000 K for 0.5-2 hours. The intermediate annealing already improves the healing of the radiation damage, but cannot prevent the damage from agglomerating and the diamond from becoming cloudy.

From EP 1 645 664 A1, a process for the production of fancy red diamonds with stable coloring centers that absorb in the range of wavelengths from 400 to 640 nm is known. The process of EP 1 645 664 A1 is based on irradiating the diamonds with an electron current and hardening at a temperature of at least 1100° C. in a vacuum. According to EP 1 645 664 A1, the process of EP 1 645 664 A1 is characterized by the fact that natural diamonds of type Ia are used and that in the crystal lattice of these natural diamonds isolated nitrogen atoms are formed in the substitutional position of depletion type C. The process of EP 1 645 664 A1 is based on the irradiation of diamonds with an electron current and hardening at a temperature of at least 1100° C. in a vacuum. This happens according to the technical teaching of EP 1 645 664 A1 by a high-temperature processing in a high-pressure apparatus at a temperature higher than 2150° C. and at a stabilized pressure of 6.0-7.0 Gpa, which is carried out before irradiation by a high-energy electron current with a dose of $5\times10^{15}$-$5\times10^{18}$ $cm^{-2}$ at 2-4 MV, using diamonds containing depletion type A, or by a high-energy electron current with a dose of more than $10^{19}$ $cm^2$ using natural diamonds with a high nitrogen content containing more than 800 ppm nitrogen admixture as depletion type A and B1 nitrogen admixture as depletion type A and B1.

U.S. Pat. No. 8,986,646 B2 discloses a method for generating NV centers in CVD diamond material. According to the technical teaching of U.S. Pat. No. 8,986,646 B2, the method of U.S. Pat. No. 8,986,646 B2 comprises irradiating the diamond material and then annealing the diamond material. According to the technical teaching of U.S. Pat. No. 8,986,646 B2, the diamond material that is irradiated is single crystal diamond material grown by a CVD process and containing single substitution nitrogen atoms ($N_sO$). The diamond material according to U.S. Pat. No. 8,986,646 B2 has an absorption spectrum with an integrated total absorption in the visible range from 350 nm to 750 nm, in which at least 10% of the integrated absorption is due to absorption by $N_sO$. Irradiation is performed to produce isolated vacancies V in the CVD diamond material. According to U.S. Pat. No. 8,986,646 B2, the concentration of the isolated vacancies in the irradiated diamond material after irradiation is at least 0.05 ppm and at most 1 ppm, both to provide sufficient vacancies for the formation of the NV centers and to avoid agglomeration of the vacancies into larger complexes. The technical teaching of U.S. Pat. No. 8,986,646 B2 provides for subsequent annealing of the irradiated diamond material to form NV centers from at least some of the individual substitutional nitrogen defects ($N_s0$) and the introduced isolated vacancies. According to the technical teachings of U.S. Pat. No. 8,986,646 B2, the treated CVD diamond material after the irradiation and annealing steps (i) and (ii) has the following properties: $[V^0$ GR1]<0.3 ppm, [V] ND1<0.3 ppm, $[N_sO]$<1.5 ppm, [V chains]<20 cm$^{-1}$ at 250 nm, [NV]≥$10^{-12}$ cm$^{-3}$. The technical teachings of U.S. Pat. No. 8,986,646 B2 provide for an annealing temperature of 1600° C.

U.S. Pat. No. 8,961,920 B1 discloses a method for changing the color of a diamond. The method of U.S. Pat. No. 8,961,920 B1 starts with identifying a nitrogen content of a type IaB diamond, the diamond initially having a first color. This is followed, according to the technical teachings of U.S. Pat. No. 8,961,920 B1, by processing the diamond in a high pressure/high temperature ("HPHT") press under diamond stable conditions to change the color of the diamond from the first color to a second color comprising yellow. Then, according to the technical teaching of U.S. Pat. No. 8,961,920 B1, irradiating the diamond with electrons having an energy between about 1 MeV and about 20 MeV is performed to change the color of the diamond from the second color to a third color, which is bluish-greenish. Finally, in accordance with the technical teachings of U.S. Pat. No. 8,961,920 B1, annealing of the diamond is then performed at a temperature of less than 1100° C. and under vacuum or a pressure of not more than about 500 kPa to change the color of the diamond from the third color to a fourth color which is red, pink or purple. Irradiation with the electron beam causes radiation damage to the diamond, which cannot be removed even with subsequent annealing. Therefore, diamonds treated in this way are typically slightly cloudy.

U.S. Pat. No. 8,168,413 B2 discloses a process for producing luminescent diamond particles, which comprise irradiating diamond particles with an ion beam. According to the technical teachings of U.S. Pat. No. 8,168,413 B2 the diamond particles have a diameter of 1 nm to 1 mm and 5 ppm to 1000 ppm color centers. According to the technical teachings of U.S. Pat. No. 8,168,413 B2, the ion beam has a kinetic energy of 1 keV to 900 MeV. According to the technical teaching of U.S. Pat. No. 8,168,413 B2, the irradiation is followed by heating the irradiated diamond particles in a non-oxidizing atmosphere to a temperature between 600 and 1000° C. and oxidizing the surface of the luminescent diamond particles. The irradiation with the electron beam causes radiation damage in the diamond, which cannot be removed even with subsequent annealing. Therefore, diamonds treated in this way are typically slightly cloudy.

A method of changing the color of a diamond is known from EP 1 097 107 B1. According to the technical teaching of EP 1 097 107 B1, the method comprises subjecting the diamond to irradiation with an energy suitable to cause photonuclear transmutation of selected atoms to other atoms. According to the technical teachings of EP 1 097 107 B1, this energy is selected to excite a giant dipole resonance (GDR) in the diamond. According to the technical teaching of EP 1 097 107 B1, the irradiation is such that either: (1) transmutations of carbon atoms to boron atoms are caused, imparting a blue color to the diamond, or (2) in the case of a nitrogenous yellow diamond, that transmutations of nitrogen atoms to carbon atoms are caused, reducing the yellow color of the diamond. Further, according to the technical teachings of EP 1 097 107 B1, the method of EP 1 097 107 B1 comprises reducing radiation damage in the diamond by cooling the diamond to restore the diamond crystal lattice, the color change due to the transmutation according to EP 1 097 107 B1 being unaffected. A red color was not reported here in EP 1 097 107 B1.

JPH 0 536 399 B2 describes a process for the blue coloring of diamonds by means of an electron beam and water-cooling during irradiation.

From U.S. Pat. No. 5,637,878 A, a method for coloring jewelry diamonds is known in which the jewelry diamond blanks are irradiated with an electron beam. The method of U.S. Pat. No. 5,637,878 A for electron beam irradiation of gemstones for color enhancement comprises the steps:
1. Placing the gemstones in a vibratory medium that has been provided with a coolant;
2. Circulating a coolant through the coolant device;
3. Initiating an oscillating motion along a horizontal y-axis in the oscillating means;
4. Aiming an oscillating electron beam generated by an electron beam source having a power of about 10 kW to about 500 kW at the gemstones, wherein the oscillating electron beam travels along a z-axis;
5. Maintaining coolant circulation through the coolant until the gems have cooled to ambient temperature; and
6. Removing the evenly colored gemstones.

The technical teachings of U.S. Pat. No. 5,637,878 A further disclose a preferred electron energy of 3 MeV to 5 MeV.

A diamond modification method is known from CN 107 840 331 A, which according to CN 107 840 331 A is characterized in that the method of CN 107 840 331 A comprises treating the diamond with a radiation beam comprising protons, wherein the energy difference between the highest energy and the lowest energy of the protons comprises at least 5 MeV. According to the technical teaching of CN 107 840 331 A, the radiation source used is cosmic radiation at an altitude of at least 20 km.

From US 2009 0 110 626 A1 an annealing process is known, in which the diamond is very quickly brought to a high temperature of approx. 2200° C. under high pressure.

From U.S. Pat. No. 7,604,846 B2 a recoloring of diamonds by means of ion bombardment and subsequent annealing is known, which exhibits the problems of the prior art already discussed.

The processes for the artificial production of red diamonds have in common that, as a rule, an irradiation with ionizing radiation takes place and then, in a subsequent step, an attempt is made to repair the radiation damage in the diamond blank by means of a heat treatment, which may also take place under high pressure. This procedure has the massive disadvantage that flaws form in the diamond crystal during the high-energy irradiation. These tend to cluster together to form larger complexes, which can then no longer be dissolved with the subsequent heat treatment.

It is true that, as described above, attempts have been made to prevent this agglomeration of the defects into larger complexes by cyclic repeated irradiation and subsequent healing. However, this can only be done with partial success.

These clusters of flaws lead to a clouding of the jewelry diamonds and thus to a deficiency with regard to the so-called "clarity" of the jewelry diamonds. Such stones are called "cloudy" and their value is diminished due to the reduced optical brilliance. From the paper M. Capelli, A. H. Heffernan, T. Ohshima, H. Abe, J. Jeske, A. Hope, A. D. Greentree, P. Reineck, B. C. Gibson, Increased nitrogen-vacancy center creation yield in diamond through electron beam irradiation at high temperature, Carbon (2018), doi: https://doi.org/10.1016/j.carbon.2018.11.051, an increase in NV center yield is known but not yet sufficient.

From CAPELLI, Marco, et al. "Increased nitrogen-vacancy center creation yield in diamond through electron beam irradiation at high temperature", Carbon, 2019, 143. yr., pp. 714-719 a procedure for insitu healing of radiation damage of an electron irradiation with 2 MeV electrons at high temperature is known. FIG. 6 of Capelli's paper shows a maximum final NV center concentration of 50 ppm* (maximum) 4% conversion rate 2 ppm for an initial nitrogen concentration 50 ppm. The maximum conversion rate according to FIG. 6 of Capelli's writing is 4% at about 0.8 ppm NV content. For 200 ppm initial nitrogen content, FIG. 6 of Capelli's writing discloses a conversion rate of 0.5%, corresponding to about 1 ppm NV center density. Thus, Capelli's writing does not disclose a concentration >2%. Even with the assumption of 4% conversion rate for 200 ppm not supported by Capelli's writing, no concentration >8 ppm can be inferred from the technical teachings of Capelli's writing.

Microwave-free magnetometry with nitrogen-vacancy centers in diamond is known from ARNE WICKENBROCK ET AL, "Microwave-free magnetometry with nitrogen-vacancy centers in diamond," ARXIV.org, CORNELL UNIVERSITY LIBRARY, 201 OLIN LIBRARY CORNELL UNIVERSITY ITHACA, NY 14853, Jun. 9, 2016 (2016-06-09), XP080965843, DOI: 10.1063/1.4960171. The paper by Wickenbrock gives <200 ppm as the initial concentration of nitrogen atoms in diamond before electron irradiation. With a conversion degree of 0.5% based on the value for an initial NV center density of 200 ppm from FIG. 6 of Capelli's writing, this gives a maximum concentration of NV center concentration in the diamond of Wickenbrock's writing of 1 ppm. The best conversion rate of Capelli's writing is 4% with an initial nitrogen content of 25 ppm. Even if this much too optimistic conversion rate of 4%, based on the value for an initial NV center density of 25 ppm from FIG. 6 of Capelli's paper, were also effective at 200 ppm—which it is not—it would still result in a maximum concentration of 8 ppm, the production of which, however, is no longer covered by the prior art. According to FIG. 6 of Capelli's paper, however, only a concentration of NV centers in the diamond of <3 ppm can be expected under these conditions.

From WO 2019 108 781 A1 a stationary solid state spin sensor with magnetic angle is known. WO 2019 108 781 A1 leaves open how the NV centers are generated. In section

[0098] WO 2019 108 781 A1, the authors of WO 2019 108 781 A1 write, "Because the magic-angle-spinning magnetic field mitigates dipolar coupling between the color center defects and unwanted paramagnetic impurities that create small magnetic fields localized around each color center defect, the solid-state host 1310 can be doped at a higher doping density than in conventional solid-state spin sensors. For example, the density of the color center defects in the solid-state host 1310 may range from about $1.76 \text{ c } 10^{14} \text{ cm}^{-3}$ to about $1.76 \text{ c } 10^{19} \text{ cm}^{-3}$ (1 ppb to 100 ppm). This higher doping density enables more sensitive measurements and finer spatial resolution for imaging magnetic fields and other physical quantities." Unfortunately, however, WO 2019 108 781 A1 leaves completely open how such diamonds can be produced or where they can be obtained.

US 2015 0 090 033 A1 discloses a gyroscope based on nitrogen defect centers in diamond. US 2015 0 090 033 A1 writes in its section [0049] "The NV-center concentration after this process is estimated to be on the order of 10 ppm". I.e. the technical teaching of the US 2015 0 090 033 A1 explains thus that thus the process presented there typically a NV-center-density of 10 ppm can be reached, but just not more. Quite correctly, US 2015 0 090 033 A1 states in the following section: "Diamonds with NV center vacancy concentrations of between approximately 10 ppm and approximately 200 ppm are preferred". The same applies to section [0080] "The preferred number of vacancy centers in the diamond lattice is between approximately 10 ppm and 200 ppm." It is undoubtedly desirable to achieve the highest possible NV center concentration. However, the technical teaching of US 2015 0 090 033 A1 precisely leaves completely open how to achieve a NV center density of more than 10 ppm in the diamond. Therefore, the technical teaching US 2015 0 090 033 A1 only discloses a method for producing NV centers with a typical NV center density of 10 ppm and unfortunately does not disclose a method for producing NV centers with a typical NV center density of more than 10 ppm. Thus, with respect to NV center concentration >10 ppm, it can only be reworked if NV diamonds from other sources are used. US 2015 0 090 033 A1 does not disclose such a source of diamonds with NV center densities greater than 10 ppm or a method of producing them.

US 2017 0 328 956 A1 discloses a wireless network-based battery management system.

None of the writings disclose a method of fabricating diamonds with a concentration of nitrogen void centers (NV centers) with a density greater than 10 ppm let alone 20 ppm.

Thus, there is a desire in the art to produce high NV center concentrations without a pathway for achieving NV center concentrations >10 ppm being disclosed. There is a significant lack of relevant literature.

From the paper Gurudev Dutt, Liang Jiang, Jeronimo R. Maze, A. S. Zibrov "Quantum Register Based on Individual Electronic and Nuclear Spin Qubits in Diamond", Science, Vol. 316, 1312-1316, 01.06.2007, DOI: 10.1126/science.1139831 a method for coupling the nuclear spin of $C^{13}$ nuclei with the electron spins of the electron configuration of NV centers is known.

From the paper Thiago P. Mayer Alegre, Antonio C. Torrezan de Souza, Gilberto Medeiros-Ribeiro, "Microstrip resonator for microwaves with controllable polarization", arXiv:0708.0777v2 [cond-mat.other] 11.10.2007 a cross-shaped electrically conductive microwave resonator is known. In this regard, reference is made to their FIG. 2. One application of the cross-shaped microwave resonator named by the authors in the first section of the paper is the driving of paramagnetic centers by means of optically detected magnetic resonance (OMDR). A dedicated named application is quantum information processing (QIP). The substrate of the electrically conductive microwave resonator is a PCB (=printed circuit board). The dimensions of the resonator are 5.5 cm, which is in the order of magnitude of the wavelength of the microwave radiation to be coupled in. The microwave resonator is powered by voltage control. The two beams of the resonator cross are electrically connected. Selective driving of individual paramagnetic centers (NV1) while not driving other paramagnetic centers (NV1) is not possible with the technical teachings of the paper Thiago P. Mayer Alegre, Antonio C. Torrezan de Souza, Gilberto Medeiros-Ribeiro, "Microstrip resonator for microwaves with controllable polarization", arXiv:0708.0777v2 [cond-mat.other] 11.10.2007.

From the paper Benjamin Smeltzer, Jean McIntyre, Lilian Childress "Robust control of individual nuclear spins in diamond", Phys. Rev. A 80, 050302(R)—25 Nov. 2009 a method for accessing individual nuclear $^{13}C$-spins using NV cents in diamond is known.

From the paper Petr Siyushev, Milos Nesladek, Emilie Bourgeois, Michal Gulka, Jaroslav Hruby, Takashi Yamamoto, Michael Trupke, Tokuyuki Teraji, Junichi Isoya, Fedor Jelezko, "Photoelectrical imaging and coherent spin-state readout of single nitrogen-vacancy centers in diamond" Science 15 Feb. 2019, Vol. 363, Issue 6428, pp. 728-731, DOI: 10.1126/science.aav2789 electronic readout of spin states of NV centers is known.

From the paper Timothy J. Proctor, Erika Andersson, Viv Kendon "Universal quantum computation by the unitary control of ancilla qubits and using a fixed ancilla-register interaction", Phys. Rev. A 88, 042330—24 Oct. 2013 a method for using so-called ancilla quantum bits to entangle a first nuclear spin with a second nuclear spin using ancilla bits is known.

WO 2016 083 140 A1 discloses a method for measuring the magnetic field with a ramp method and with control of the quantum bit by means of a microwave. From U.S. Pat. No. 9,910,105 B2, the measurement of magnetic fields with Zeeman splitting and microwave driving is known. Also known from U.S. Pat. No. 9,541,610 B2 is a magnetic field sensor using microwaves for quantum dot control. From U.S. Pat. No. 9,551,763 B1 a magnetic field sensor with a 4-sided antenna is known, which also uses microwaves. From U.S. Pat. No. 10,408,889 B2, a controller for a magnetic field sensor for controlling microwaves is known. Also known from U.S. Pat. No. 10,120,039B2 is a magnetic field sensor with microwave control. From U.S. Pat. No. 10,168,393 B2 a magnetic field sensor with microwave control with the aid of a bias magnet is known. Also known from U.S. Pat. No. 10,241,158 B2 is a magnetic field sensor with microwave control. From U.S. Pat. Nos. 10,345,396 B2, 10,359,479 B2, 8,547,090 B2, 9,557,391 B2, 9,829,545 B2, 9,910,104 B2 and 10,408,890 B2 magnetic field sensors with radio wave drive are known. From U.S. Pat. No. 9,222,887 B2, a magnetic field sensor with nanoparticles and a microwave drive is known. Also known from U.S. Pat. No. 9,632,045 B2 and U.S. Pat. No. 9,658,301 B2 are magnetic field sensors with microwave drive. From U.S. Pat. No. 9,664,767 B2, a method for manipulating NV center spins with Walsh reconstruction based on microwave actuation is known. From U.S. Pat. No. 10,007,885 B1 a measurement using entanglement and pertubation pulses is known. From WO 2018 169 997 A1 a magnetic field measurement using an AFM tip is known.

U.S. Pat. No. 10,006,973 B2 discloses a magnetic field sensor comprising two photodetectors. According to its technical teachings, the device of U.S. Pat. No. 10,006,973 B2 includes a diamond assembly having a diamond with one or more nitrogen vacancies, a light emitting diode configured to emit light toward the diamond, a first photosensor configured to detect a first portion of the light emitted from the light emitting diode, a second photosensor configured to detect a second portion of the light emitted from the light emitting diode, and a processor operatively coupled to the first photosensor and a second photosensor. The first portion of the light does not travel through the diamond according to the technical teachings of U.S. Pat. No. 10,006,973 B2, whereas the second portion of the light does travel through the diamond according to the technical teachings of U.S. Pat. No. 10,006,973 B2. In U.S. Pat. No. 10,006,973 B2, the processor is configured to compare a first signal received from the first photosensor with a second signal received from the second photosensor and to determine, based on the comparison of the first signal and the second signal, the strength of a magnetic field applied to the diamond. Similar constructions are known from U.S. Pat. Nos. 9,720,055 B1, 9,817,081 B2, and 9,823,314 B2, which use three optical sensors.

U.S. Pat. No. 10,012,704 B2 discloses a magnetic field sensing device using a resistive inductive conductor loop. The technical teachings of U.S. Pat. No. 10,012,704 B2 disclose a diamond nitrogen vacancy sensor comprising a diamond having one or more nitrogen vacancies, a loop of conductive material positioned adjacent a portion of the diamond, and a resistor coupled to a first end of the loop and a second end of the loop, the loop and resistor forming a low pass filter for the DNV sensor. The resistor may be modified by a control device or controller.

From U.S. Pat. No. 8,947,080 B2 a magnetic field sensor is known which detects the Zeeman shift.

From U.S. Pat. No. 9,599,562 B2, a nanoparticle-diamond-metal compound is known which comprises a diamond nanoparticle having a nitrogen vacancy center and a metallic nanostructure. In this case, the diamond nanoparticle has a predetermined radius and is preferably at least partially directly bonded to a layer of the metallic nanostructure. The nitrogen vacancy center is disposed in the technical teachings of U.S. Pat. No. 9,599,562 B2 at a distance based at least in part on the predetermined radius of the diamond nanoparticle.

A method for measuring a drillhole is known from U.S. Pat. No. 9,638,821 B2.

None of the above fonts allow the use of a microwave-free and radio-wave-free sensor system that does not require alignment of the diamond crystal.

SUMMARY

The combination of features of the literature cited in this document with features of the patent literature and non-patent literature cited in this document is an explicit part of the disclosure and, to the extent permitted in the respective legal system of the later nationalizing state of this international application, part of the claiming.

The disclosure is therefore based on the task of creating a solution that does not have the above disadvantages of the state of the art and has other advantages. This paper discloses several measures that add up to a significant improvement.

This task is solved by a device according to the independent claims. Further examples of the disclosure and adjacent subject matter are the subject of the subsidiary and subordinate claims.

The disclosure includes all essential components of a quantum sensing system based on one or more NV centers or one or more groups of NV centers, and methods of making and operating the same.

For the detection of object positions and/or position changes, for example of mechanical oscillations of an oscillating system (MS), for example, the method presented herein proposes to couple the object, for example the mechanically oscillating system (MS), with a magnetic field in the form of the magnetic flux density B or an electric field in the form of the electric field strength E and to determine the instantaneous value of the magnetic flux density B or of a temporally changing electric flux density D, respectively, by means of a sensor based on quantum mechanical effects.

According to the disclosure, it was recognized in particular that such quantum mechanical sensor systems, which are preferably based on the measurement of the fluorescence radiation (FL) of paramagnetic centers (NV1), are typically also suitable for the measurement of an electric field with an electric field strength E, which changes in particular with time, if the source of the electric field strength E is moved with respect to the paramagnetic centers (NV1) of the sensor system. Such a movement results in a rotation and distortion of the four-dimensional electromagnetic field strength tensor $F_{ij}$ in four-dimensional Minkow ski space, which transforms the electric field strength E into a magnetic flux density B and thus makes it detectable for such sensor systems based on the detection of the magnetic flux density B.

Preferably, diamonds with a preferably at least locally very high density of paramagnetic centers (NV1) in the form of NV centers are used as the sensor element or parts of the sensor element in order to ensure a high signal u noise ratio and to exploit quantum mechanical coupling between these paramagnetic centers (NV1). Such HD-NV diamonds with a high density of paramagnetic centers (NV1), in particular NV centers, are discussed below. For example, the diffusion constant for impurity atoms in diamond is close to zero. Thus, these sensor systems with sensor elements comprising diamond have the advantage that no aging phenomena are to be expected for the paramagnetic centers (NV1). The high hardness of diamond ensures the possibility of the high mechanical load without having to fear damage to the sensor element due to abrasion, etc. Thus, the diamond sensor element can be brought into direct contact with materials subject to mechanical wear. For example, direct permanent contact with a high pressure, hot salt water/gas/oil/sand mixture, such as occurs in boreholes, is possible. A high density of paramagnetic centers (NV1), in this case NV centers, typically imparts a red to deep red or black color to a concerned diamond particularly suitable as a sensing element. For example, if such a HD-NV diamond is illuminated with green light as pump radiation (LB), the diamond glows red due to the fluorescence radiation (FL) of the paramagnetic NV centers (NV1). Such a diamond of such a sensor system can be made with a brilliant cut as a jewelry stone. For musical instruments such as electric guitars, the sensor system structure is preferably designed such that only the diamond that glows red in operation is attached in a highly visible manner to evoke a corresponding emotional, positive experience in an observer. The use of decorative diamonds as sensor elements is part of the present disclosure.

The disclosure therefore firstly comprises a method of producing diamond or a diamond having an at least locally high concentration of NV centers for subsequent use as a sensor element in the sensor systems to be produced. This method is thus of great importance. The term "local" in this context is intended to denote a volume of space as a reference volume within the diamond that is larger than half the pump radiation wavelength ($\lambda_{pmp}$) of the pump radiation (LB) to the third power, since otherwise an arbitrary concentration could already be achieved with a single NV center. Such diamonds are referred to herein and in the following as HD-NV diamonds. The sensing element is a very essential part of the sensing system and thus virtually its foundation. The method first comprises the step of providing the diamond as a diamond blank or diamonds as diamond blanks. The diamonds may be a single diamond as well as a plurality of diamonds. The diamonds may be large or small. The diamonds may also be in powder form or granular form. The diamonds may also be nanocrystalline.

From M. Capelli, A. H. Heffernan, T. Ohshima, H. Abe, J. Jeske, A. Hope, A. D. Greentree, P. Reineck, B. C. Gibson, Increased nitrogen-vacancy center creation yield in diamond through electron beam irradiation at high temperature, Carbon (2018), doi: https://doi.org/10.1016/j.carbon.2018.11.051, it is known that NV center yield in CVD diamond can be increased by a factor of 2 by heating during electron irradiation with 2 MeV electrons at 710° C.

The technical teaching of DE 10 2019 117 423.6, which is still unpublished at the time of the application, describes a method for further increasing the yield of NV centers, which describes one way of producing the HD-NV diamonds. These diamonds in particular those with a NV center density of more than 10 ppm per unit volume are hereinafter referred to as HD-NV diamonds. It has been shown that a content of more than 20 ppm is better. The content can be determined, for example, by means of EPR (electromagnetic parametric resonance) measurement. Again, we refer the reader to M. Capelli, A. H. Heffernan, T. Ohshima, H. Abe, J. Jeske, A. Hope, A. D. Greentree, P. Reineck, B. C. Gibson, Increased nitrogen-vacancy center creation yield in diamond through electron beam irradiation at high temperature, Carbon (2018), doi: https://doi.org/10.1016/j.carbon.2018.11.051.

Such diamonds can be used to construct a sensor system with a sensor element, in which the sensor element comprises a substrate (D) or can be the same as this substrate (D). A volume of space may be selected in the substrate (D), the substrate (D) comprising in this volume of space a group (NVC) of paramagnetic centers (NV1) comprising at least two paramagnetic centers (NV1). The sensor system comprises first means (G, PL1), explained in more detail later, for exciting a fluorescence radiation (FL) of said group (NVC) of paramagnetic centers (NV1). The fluorescence radiation (FL) thereby has a fluorescence wavelength ($\lambda_{fl}$). The sensor system further comprises second means (G, F1, PD, M1, TP) for detecting and evaluating the fluorescence radiation (FL). The outer dimensions of the selected volume of space shall not exceed two times the fluorescence wavelength ($\lambda_{fl}$) when assessing whether a HD-NV diamond is used. The sensor system generates and/or maintains one or more measured values by means of the first and second means (G, PL1, F1, PD, M1, TP) in dependence on the fluorescence radiation (FL) of this group (NVC) of paramagnetic centers (NV1). The fluorescence radiation (FL) depends on a physical parameter. These can be, among others, the magnetic flux density B, the electric flux density D, the acceleration a, the gravitational field strength g, the rotational speed ω, oscillation frequencies ω, the modulation of electromagnetic radiation, the intensity of ionizing radiation, the temperature $\vartheta$ and the like, as well as their simple and multiple time integrals and derivatives. Thus, the measured value then also depends on the physical parameter.

Therefore, this determined measured value can then be used as the measured value of this physical parameter. The device proposed herein at this point is characterized in that the concentration of the paramagnetic centers (NV1) of this group (NVC) in the volume of space is on average greater than 100 ppm and/or 50 ppm and/or 20 ppm and/or 10 ppm and/or 5 ppm and/or 2 ppm and/or 1 ppm and/or 0.5 ppm and/or 0.2 ppm and/or 0.1 ppm and/or greater than 0.01 ppm and/or greater than 0.001 ppm and/or greater than 0.0001 ppm and/or greater than 0.0001 ppm relative to the number of atoms of the substrate (D) per unit volume in said volume of space. Particularly preferably, it is greater than 10 ppm or better than 20 ppm.

Instead of optical readout via fluorescence radiation (FL), electronic readout via photoelectrons is always possible.

For this purpose of electronic readout of photoelectrons generated by pump radiation (LB) irradiation, the following alternative sensing device is proposed.

Such a sensor system with electronic readout comprises a sensor element, wherein again the sensor element comprises or can be equal to a substrate (D) and wherein in the substrate (D) again the volume of space can be selected and wherein the substrate (D) comprises in this volume of space a group (NVC) of paramagnetic centers (NV1). Again, the sensor system comprises first means (G, PL1) for exciting a photocurrent of the photoelectrons of said group (NVC) of paramagnetic centers (NV1) by means of a pump radiation (LB) having a pump radiation wavelength ($\lambda_{pmp}$). In contrast to the sensor system proposed immediately before, the sensor system comprises second means (G, M1, TP) for detecting and for evaluating the photocurrent of the photoelectrons of this group (NVC) of paramagnetic centers (NV1). Now, the external dimensions of the selected volume of space shall not exceed twice the pump radiation wavelength ($\lambda_{pmp}$). The sensor system generates and/or holds one or more measured values by means of the of the first and second means (G, PL1, M1, TP) as a function of the photocurrent. Again, the photocurrent depends on a physical parameter. These can be, among others, the magnetic flux density B, the electric flux density D, the acceleration a, the gravitational field strength g, the rotational speed $\omega$, oscillation frequencies $\omega$, the modulation of electromagnetic radiation, the intensity of ionizing radiation, the temperature $\vartheta$ and the like, as well as their simple and multiple time integrals and derivatives. Thus, the measured value also depends on the physical parameter. As before, the measured value is preferably used as the measured value of this physical parameter. Again, the device is characterized in that the concentration of the paramagnetic centers (NV1) of this group (NVC) in the volume of space is on average 100 ppm and/or 50 ppm and/or 20 ppm and/or 10 ppm and/or 5 ppm and/or 2 ppm and/or 1 ppm and/or 0.5 ppm and/or 0.2 ppm and/or greater than 0.1 ppm and/or greater than 0.01 ppm and/or greater than 0.001 ppm and/or greater than 0.0001 ppm and/or greater than 0.0001 ppm relative to the number of atoms of the substrate (D) per unit volume in this space volume. Particularly preferably, it is again greater than 10 ppm or better than 20 ppm.

In order for the diamonds to later form NV centers, they should have nitrogen atoms, preferably in the form of P1 centers. More simply, the diamonds should preferably be yellow or yellowish. Thus, the diamonds should preferably have a yellow color prior to irradiation, preferably the color "fancy yellow" or "fancy deep yellow" according to the GIA standard of John M. King "Colored Diamonds, colored reference Chart". Less preferred are diamonds of the GIA classification or "fancy light yellow", as they contain less nitrogen and accordingly result in diamonds with a lower density of NV centers. The stronger the yellowish color the more densely the NV centers are concentrated in the diamonds later. Less preferably, the diamond blank or blanks comprise nitrogen atoms together with hydrogen, as the latter has a compensating effect. However, such diamonds can be used in a pinch. N-doping with sulfur can also lead to an increase in the yield of NV centers.

Preferably, the diamonds used here are synthetic HPHT diamond. HPHT stands for High Pressure High Temperature, which means high pressure and high temperature. For the skilled person it is clear that such diamonds are not metastable, i.e. not produced by plasma deposition (CVD diamond). Such HPHT diamonds contain little hydrogen, which from experience is typically not helpful for the formation of NV centers. The method described herein has the advantage that the diamonds can be polished prior to the NV center generation process. If a defect occurs during this process, this material can be discarded prior to treatment in a cost effective manner. A proposed diamond may therefore have at least one or more ground surfaces, for example an optical surface in the form of a first surface (OGL1) for entry and/or exit of radiation, even before irradiation. It is possible that the diamond material irradiated in an irradiation pass described below is a single diamond as well as a plurality of diamonds. The diamonds may be large or small. The diamonds may be in powder form or granular form, or they may be single diamonds. The diamonds may also be nanocrystalline. The use of synthetic CVD diamonds is also possible. However, CVD diamonds have a larger amount of hydrogen, which hinders the formation of the NV centers. It was possible within the scope of the elaboration of the disclosure to generate such NV centers also in CVD diamonds by means of the proposed irradiation method. In this respect, this variant is also claimed here, although it is not optimal. In this variant, the diamond(s) then comprise nitrogen atoms together with hydrogen. Typically, they then do not have a yellow color, but are often transparent as the hydrogen alters the spectral colors.

The central step in the processing of diamonds is irradiation with high-energy particles. Preferably, high-energy electrons are used. Irradiation with protons, neutrons and helium nuclei is also conceivable and possible.

Due to the high temperature of the diamonds during irradiation, this irradiation preferably does not take place in air or oxygen, as the diamond would then oxidize to $CO_2$. Preferably, the irradiation is carried out in a vacuum with a residual pressure of less than $10^{-6}$ mBar. Instead, however, such irradiations have also been carried out in an inert gas atmosphere, in particular in an agon atmosphere, which is not preferred.

The diamond blanks are thermally coupled to a heat sink via a thermal resistor during irradiation with particles, preferably electrons. The diamond blanks are maintained at the desired process temperature during irradiation by a temperature control device by a controller which is part of the temperature control device. The controller for controlling the temperature of the diamonds during irradiation may be, for example, a PI controller or the like. Preferably, the temperature control device takes into account all energy inputs during irradiation. Preferably, the temperature control device may control one or more thermal energy fluxes into the set of diamond blanks to be processed and/or out of the set of diamond blanks as a function of the targeted and measured average irradiation temperature of the diamond blanks.

The temperature control device thus preferably controls the total energy input into the diamond blanks and, if necessary, the total energy removal in such a way that the one temperature probe placed in the vicinity of the diamond blanks during the irradiation detects an average irradiation temperature of the diamond blanks of greater than 600° C. and/or greater than 700° C. and/or greater than 800° C. and less than 900° C. and/or less than 1000° C. and/or less than 1100° C. and/or less than 1200° C., very preferably between 800° C. and 900° C. Preferably, for this control, the temperature control device comprises a PD, P or more preferably PID controller.

Preferably, the total energy input is not constant. Preferably, the total energy input into the diamond blanks has a temporally equal component and, in contrast to the prior art, a temporally pulsed component with a temporal pulse spacing and a pulse height of the total energy input pulses. It is also possible for the total energy pulses to be a single pulse. The temperature control device may then use the DC component and/or the pulse height of the total energy input pulses of the total energy input and/or the temporal pulse spacing of the total energy input pulses to control the average irradiation temperature detected by the temperature probe. Thus, where applicable, a heater may be provided, for example, to increase the total energy input for the pulse duration of a total energy input pulse, resulting in an increase in temperature and improving the healing of radiation damage. The total energy input is composed of the energy from a possibly active heating device, the thermal energy derived via the thermal bleeder resistor and the more or less permanent beam power of the electron beam during irradiation. The temperature control device must take this into account when setting the average target temperature. Any of the previously mentioned components of the total energy input can be used for the proposed control.

It is useful to cut the diamonds to a known cut, as it then gives the sensor a more refined appearance in the form of a jewelry diamond for use as a sensing element in consumer applications. For example, such a diamond may have one of the following cuts prior to irradiation: Pointed cut, Table cut, Rose cut, Mazarin cut, Brilliant cut, Teardrop cut, Princess cut, Oval cut, Heart cut, Marquise cut, Emerald cut, Asscher cut, Cushion cut, Radiant cut, Old diamond cut, Emerald cut or Baguette cut. In the case of a granule, the diamonds are preferably smaller than 1 mm and/or smaller than 0.5 mm and/or smaller than 0.2 mm and/or smaller than 0.1 mm and/or smaller than 50 µm and/or smaller than 20 µm and/or smaller than 10 µm and/or smaller than 5 µm and/or smaller than 2 µm and/or smaller than 1 µm and/or smaller than 0.5 µm and/or smaller than 0.2 µm and/or smaller than 0.1 µm, whereby the granule is then a powder. The diamonds of such a granulate may also be on average smaller than 1 mm and/or smaller than 0.5 mm and/or smaller than 0.2 mm and/or smaller than 0.1 mm and/or smaller than 50 µm and/or smaller than 20 µm and/or smaller than 10 µm and/or smaller than 5 µm and/or smaller than 2 µm and/or smaller than 1 µm and/or smaller than 0.5 µm and/or smaller than 0.2 µm and/or smaller than 0.1 µm. If a sensor element is to comprise a plurality of diamonds, very small dimensions are useful since the properties of such a diamond powder are generally isotropic, i.e. not directionally dependent, which may be intended in order to obtain a direction-independent sensitivity of the sensor system. To fabricate the sensing element, the diamonds are then mixed with a transparent carrier material (TM) that then solidifies to form the sensing element. We refer here to the as yet unpublished international patent application PCT DE 2020 100 430. Exemplary carrier materials mentioned here include UHU and gelatin and glass, in particular a glass frit. Typically, the carrier material (TM) in the solidified state is transparent to pump radiation (LB) and fluorescence radiation (FL). If, for example, a magnetic flux density B is to be detected by means of the intensity ($I_{fl}$) of the fluorescence radiation (FL) of the paramagnetic centers (NV1), the support material (TM) preferably does not shield the paramagnetic centers (NV1) of the sensor element against the action of this physical quantity to be detected, in this case the magnetic flux B.

Otherwise, it may be desired to use a single crystal, such as a diamond crystal, as the sensing element and precisely align that single crystal to detect particular resonances (e.g., GSLAC) in the sensor system package to make those particular features measurable. In that case, it may be useful to use a larger crystal as a single sensing element.

The preferred method for producing diamonds with high NV center density is, as indicated earlier, irradiating the diamond and/or diamonds with particles of high energy.

Preferably, the irradiation takes place in a quartz vessel in which the diamonds in the form of the diamond blanks are then placed for irradiation. The quartz vessel is preferably open at the top for the particle beam entry. A temperature sensor, for example a thermocouple, is preferably placed in or on the diamonds during the irradiation to provide an actual temperature value for controlling the processing temperature of the diamonds during the irradiation.

Preferably, the diamond(s) is/are irradiated with electrons, as these can completely penetrate the diamonds in a reasonably homogeneous manner if the energy is sufficiently high. Preferably, the energy of the electrons of the electron beam is greater than 500 keV and/or greater than 1 MeV and/or greater than 3 MeV and/or greater than 4 MeV and/or greater than 5 MeV and/or greater than 6 MeV and/or greater than 7 MeV and/or greater than 9 MeV and/or greater than 10 MeV and/or greater than 10 MeV, an energy of 10 MeV being clearly the most preferred at present as the optimum in the apparatus used to elaborate the disclosure. An energy of the particles greater than 20 MeV should be avoided, otherwise radioactive activation of the diamond material may occur. The irradiation dose for this irradiation with electrons is preferably between $5*10^{17}$ $cm^{-2}$ and $2*10^{18}$ $cm^{-2}$, but at least below $10^{19}$ $cm^{-2}$. It is important that, in this case, the temperature of the diamond or diamonds is kept at a temperature greater than 600° C. and/or greater than 700° C. and/or greater than 800° C. and less than 900° C. and/or less than 1000° C. and/or less than 1100° C. and/or less than 1200° C. by temperature control during the irradiation with these electrons. Preferably, however, according to the experiences during the elaboration of the present disclosure, the optimum temperature is between 800° C. and 900° C. With other temperatures, other centers in the diamond are preferably established. In the temperature control, the heating by the first heating energy flow of a typically present external heater and by the second heating energy flow of the typically however neglected heating by the electron beam current must be taken into account. The heating by these heating energy currents is opposed by the cooling energy current of the cooling by heat dissipation into a heat sink. The beam current of the electric current of these electrons of the electron beam is now preferably set or controlled in such a way that the irradiation period for achieving the above irradiation dose is at least 0.05 days and/or at least 0.5 days and/or at least 1 day and/or at least 2 days and/or at least 4 days and/or at least 8 days. In the example, 2 days of irradiation duration was used for very successful experiments. Preferably, because of the cost of such a facility, a pulsed linear accelerator (linac) is used for irradiation with a design pulsed electron beam. The heating energy of the electron beam is determined by the energy of the electrons and the average beam current. The heating energy supplied during irradiation is dissipated into a heat sink via said thermal bleeder resistor. Preferably, the total heating energy supplied is controlled by means of a thermal sensor sensing the temperature of the of the diamond blanks during irradiation and by means of a controller controlling a, preferably the substantial, heating energy flow to establish a desired processing temperature of the diamonds within a target temperature band around the target temperature for the diamond blanks during irradiation. Preferably, the controlled heating energy flow that heats the diamond blanks during irradiation is pulse modulated in whole or in part at least intermittently. I.e. it is supplied in heating pulses. That is, it varies in a pulsed manner over time between a first energy current value supplied to the diamond blanks in a first time period of a temporal pulse period of the pulse modulation and a second energy current value supplied to the diamond blanks in a second time period of the temporal pulse period of the pulse modulation during the irradiation. Preferably, the first energy current value is different from the second energy current value. Preferably, the control is performed by adjusting the heating pulse amplitude, the heating pulse width, the heating pulse spacing or the duty cycle of the pulse modulation of the heating pulses, that is, by a method of pulse modulation. The duty cycle is also referred to as the duty cycle.

With the above described process, depending on the nitrogen and hydrogen content of the diamond blanks prior to irradiation, diamond with a NV center density of more than 500 ppm and/or of more than 200 ppm and/or of more than 100 ppm and/or of more than 50 ppm and/or of more than 20 ppm and/or of more than 10 ppm and/or of more than 5 ppm and/or of more than 2 ppm and/or of more than 1 ppm and/or of more than 0.1 ppm and/or of more than 0.01 ppm and/or of more than 10 ppm$^{-3}$ and/or of more than 10 ppm$^{-4}$ and/or of more than 10 ppm$^{-5}$ and/or of more than 10 ppm$^{-6}$ with respect to the number of carbon atoms per unit volume. Such diamonds are particularly suitable as sensing elements of the proposed devices and for other quantum technological devices. Preferably, during irradiation, the typically LINAC specific unavoidable pulsation of the electron beam and thus its heating energy is stabilized by a control system in order to obtain predictable results. Instead of irradiation with electrons, irradiation with protons or helium nuclei or other particles, e.g. neutrons, can also be performed, which then provide the diamond with NV centers only superficially, if necessary, due to the lower penetration depth, which can be advantageous. Such a diamond then shows traces of irradiation with particles, in particular with electrons and/or protons and/or helium, irrespective of the type of particles used. In one example, preferably the provided diamond or an epitaxial layer of sufficient thickness on at least one surface of the diamond is isotopically pure. Here, "isotopically pure" as used herein means that more than 99.5% of the atoms of the diamond can be assigned to a carbon isotope, preferably the nuclear spin free $^{12}$C isotope. This leads to few interfering nuclear spins of $^{13}$C-atoms. The thickness of an epitaxial layer is sufficient if the paramagnetic centers (NV1) in this layer behave as if the diamond surrounding them were entirely isotopically pure.

Diamonds with a high density of NV centers, as described, are hereinafter referred to as HD-NV diamonds.

Preferably, the high density of the paramagnetic centers (NV1) is realized only in a small volume within the sensor element, for example the diamond, with preferably high intensity ($I_{pmp}$) of the pump radiation (LB), since the non-linearity of the intensity ($I_{fl}$) of the fluorescence radiation (FL) of the paramagnetic centers (NV1), would otherwise lead to a reduction of the contrast (KT).

Finally, it should be mentioned that the irradiation can also take place only locally. If, for example, in a diamond the nitrogen atoms have only been introduced in a thin plane by ion implantation, the electron beam can only irradiate the crystal along spaced axes. A similar situation is possible for other materials and centers if they can be produced by ion implantation followed by electron or particle irradiation. Only at the crossing points between these irradiation axes and the layer of implanted nitrogen atoms, paramagnetic centers (NV1) are formed in the example of NV centers in diamond if the parameters are chosen correctly. In this way, for example, superlattices of groups (NVC) of paramagnetic centers (NVC) can be formed. Each group (NVC) of paramagnetic centers (NV1) in this superlattice may represent a material having a high density of paramagnetic centers (NV1) within the respective group. In the case of groups of NV centers in diamond, the material of the groups of NV centers is thus preferably HD-NV diamond, which preferably has a density of NV centers within the respective group of more than 10 ppm or better more than 20 ppm.

The proposed sensor system now preferably uses the HD NV diamonds thus produced with a respective high density of NV centers, for example in the form of red jewelry diamonds, as sensor elements for the sensor systems presented hereinafter, which detect the intensity ($I_{fl}$) of the fluorescence radiation (FL) of the NV centers when irradiated with green light as pump radiation (LB). Green light is used in the technical teachings of this paper for pumping the paramagnetic centers (NV1), here typically the NV centers in diamond. Instead of the term "green light", the equivalent term "green pump radiation (LB)" is also used in this writing. The pump radiation (LB) has a pump radiation wavelength ($\lambda_{pmp}$) of this "green light". The pump radiation (LB) causes the respective paramagnetic center (NV1) or paramagnetic centers (NV1) or group or groups (NVC) of paramagnetic centers (NV1) to emit fluorescence radiation (FL) having a fluorescence wavelength ($\lambda_{fl}$) upon irradiation with the pump radiation (LB) of the pump radiation wavelength ($\lambda_{pmp}$). Typically, when NV centers in diamond are used as paramagnetic centers (NV1), the fluorescence wavelength ($\lambda_{fl}$) of the fluorescence radiation (FL) of the NV centers is such that they appear red. It has been shown that, in connection with NV centers in diamond as paramagnetic centers, light having a pump radiation wavelength ($\lambda_{pmp}$) of the pump radiation (LB) of at most 700 nm and at least 500 nm is in principle particularly suitable as pump radiation (LB), i.e. as "green light". In connection with the use of other materials for the sensor element and correspondingly other paramagnetic centers, completely different wavelength ranges of the pump radiation wavelength ($\lambda_{pmp}$) of the pump radiation (LB) can perform the same functions in the sensor system then modified in this way. Therefore, the NV centers herein represent only one example of one example of such a paramagnetic center (NV1). In this respect, "green light" or "green pump radiation (LB)" shall be understood herein as a function definition, where the function shall be understood as equivalent to the function in the system using NV centers in diamond as paramagnetic centers (NV1) in a sensor element. In particular, when using a NV center as a paramagnetic center (NV1), the "green light" or "green pump radiation" should have a pump radiation wavelength ($\lambda_{pmp}$) in a wavelength range from 400 nm to 700 nm wavelength and/or more preferably 450 nm to 650 nm and/or more preferably 500 nm to 550 nm and/or more preferably 515 nm to 540 nm. In this regard, a wavelength of 532 nm is clearly preferred as the pump radiation wavelength ($\lambda_{pmp}$). Light or electromagnetic pump radiation (LB) used in the use of paramagnetic centers (NV1) other than NV centers in diamond to perform the same functions is also referred to herein as "green light" or "green pump radiation". In this respect, such examples are encompassed by claims in which "green light" or "green pump radiation" is referred to, even if to a human such radiation does not appear to be colored green. Thus, the proposed sensor system is also applicable to other suitable paramagnetic centers, such as ST 1 center, SiV center, GeV center, TR1 center etc., applicable. However, the NV center in diamond is particularly suitable and particularly good to be fabricated, e.g. as described above, and in high density with high fabrication yield.

Suitably, the pump radiation (LB) of the pump radiation source (PL1), preferably a laser, is pulsed in dependence on a pulsed alternating component (S5w) of a transmission signal (S5). The pulsed alternating component (S5w) of a transmission signal (S5) is used as a measurement signal (MES), i.e. as a reference signal for a look-in amplifier, in order to amplify with low noise the modulation of the intensity ($I_{fl}$) of the fluorescence radiation (FL) converted into modulated electric currents, in particular photoelectron currents or voltages, for example of a receiver output signal (S0).

According to the disclosure, it was recognized that the pulsed pulse modulation of the pump radiation (LB) and thus the pulsed pulse modulation of the alternating component (S5w) of the transmission signal (S5) should preferably not have a 50% duty cycle. (See FIG. 91) The alternating component (S5w) of the transmission signal (S5) has an amplitude (S5$w_A$) of the alternating component (S5w) of the transmission signal (S5). At the beginning of a transmission signal period ($T_P$), the value of the transmission signal (S5) is at the value of the direct component (S5g) of the transmission signal (S5) minus the value of the amplitude (S5$w_A$) of the alternating component (S5w). The value of the transmission signal (S5) then increases to the value of the sum of the value of the amplitude (S5$w_A$) of the alternating component (S5w) of the transmission signal (S5) plus the value of the direct component (S5g) of the transmission signal (S5). For a transmission signal plateau time ($T_{S5pmpp}$), the value of the transmission signal (S5) then remains substantially at this value level, in order to then drop with a transmission signal decay time ($T_{S5pmpd}$) to the value from the difference value of the direct component (S5g) of the transmission signal (S5) minus the value of the amplitude (S5$w_A$) of the alternating component (S5w) of the transmission signal (S5). The value of the transmission signal (S5) then remains substantially at this value until the end of the transmission signal period ($T_P$), when the value of the transmission signal (S5) increases again with a transmission signal rise time ($T_{S5pmpr}$) to the value of the sum of the amplitude (S5$w_A$) of the alternating component (S5w) of the transmission signal (S5) plus the value of the direct component (S5g) of the transmission signal (S5). Preferably, the maximum value of the pulses of the alternating component (S5w) of the transmission signal (S5) in terms of the sum of the amplitude (S5$w_A$) of the alternating component (S5w) of the transmission signal (S5) plus the value of the direct component (S5g) of the transmission signal (S5) is maximized to achieve a maximum intensity ($I_{pmp}$) of the pump radiation (LB) at the times when the pump radiation source (PL1) emits pump radiation (LB). The purpose of this is that the contrast (KT) (see FIG. 28) does not depend linearly on the intensity ($I_{pmp}$) of the pump radiation (LB) reaching the paramagnetic centers (NV1) and increases towards large intensities ($I_{pmp}$) of pump radiation (LB). This is known for single NV centers in diamond, i.e., not for HD-NV diamonds as described here, for example, from the paper Staacke, R., John, R., Wunderlich, R., Horsthemke, L., Knolle, W., Laube, C., Glösekötter, P., Burchard, B., Abel, B., Meijer, J. (2020), "Isotropic Scalar Quantum Sensing of Magnetic Fields for Industrial Application," Adv. Quantum Technol. doi:10.1002/qute.202000037. We refer in particular to FIGS. 3b and 3d of that paper. By having a high density of paramagnetic centers (NV1), such as by having a high density of NV centers as in an HD-NV diamond as described in that paper, the contrast (KT) can be increased beyond that shown in that paper, which is new compared to the prior art.

The duty cycle of the transmission signal (S5) and thus of the modulated transmission signal (S5w) is defined here as the transmission signal pulse duration ($T_{S5pmp}$) divided by the transmission signal period ($T_P$). The transmission signal pulse duration ($T_{S5pmp}$) plus the transmission signal complementary time ($T_{S5c}$) are equal to the transmission signal period ($T_P$).

Preferably, the alternating component (S5w) of the transmission signal (S5) and thus the transmission signal (S5) is pulse-modulated with a duty cycle of the alternating component (S5w) of the transmission signal (S5) of less than 50% and/or preferably less than 40% and/or preferably less than 30% and/or preferably less than 20% and/or preferably less than 10%. Preferably, therefore, the pulse is an ultrashort pulse with as high an amplitude as possible.

Accordingly, preferably the modulated transmission signal (S5w) is pulse-modulated with a duty cycle smaller than 50% and/or preferably smaller than 40% and/or preferably smaller than 30% and/or preferably smaller than 20% and/or preferably smaller than 10%. Preferably, therefore, the pulse is an ultrashort pulse. This ultrashort pulse is preferably converted, with the greatest possible amplification, into a corresponding short intensity pulse of the intensity ($I_{pmp}$) of the pump radiation (LB), which is as intense as possible.

Since the pump radiation source (PL1) is driven by the transmission signal (S5), it typically reproduces essentially the transmission signal (S5) delayed by a transmission delay ($\Delta t_{Ipmp}$). For the calculation of many applications, this transmission delay ($\Delta t_{Ipmp}$) can be assumed to be 0 s for simplification.

In this case, the pump radiation pulse duration ($T_{Ipmp}$) is defined here in such a way that the intensity pulse of the intensity ($I_{pmp}$) of the pump radiation (LB) has a pump radiation intensity maximum ($I_{pmpmax}$) and that the pump radiation pulse duration ($T_{Ipmp}$) of an intensity pulse of the pump radiation (LB) starts at the first time of exceeding 50% of the intensity value of the pump radiation intensity maximum ($I_{pmpmax}$) minus the possibly existing bias value ($I_{pmpoff}$) of the intensity ($I_{pmp}$) of the pump radiation (LB), by the instantaneous intensity ($I_{pmp}$) of the intensity pulse of the pump radiation (LB) minus the possibly existing bias value ($I_{pmpoff}$) of the intensity ($I_{pmp}$) of the pump radiation (LB) and in that the pump radiation pulse duration ($T_{Ipmp}$) of an intensity pulse of the pump radiation (LB) ends with the second time point of falling below 50% of the intensity value of the pump radiation intensity maximum ($I_{pmpmax}$) minus the possibly existing bias value ($I_{pmpoff}$) of the intensity ($I_{pmp}$) of the pump radiation (LB) by the bias value ($I_{pmpoff}$) of the intensity pulse of the pump radiation (LB) minus the possibly existing bias value ($I_{pmpoff}$) of the pump radiation (LB).

The pump radiation rise time ($T_{Ipmpr}$) of the intensity ($I_{pmp}$) of the pump radiation (LB) is defined here in such a way that the pump radiation rise time ($T_{Ipmpr}$) of an intensity pulse of the pump radiation (LB) starts with the first time of exceeding 10% of the intensity value of the pump radiation intensity maximum ($I_{pmpmax}$) minus the possibly existing bias value ($I_{pmpoff}$) of the intensity ($I_{pmp}$) of the pump radiation (LB), by the instantaneous intensity ($I_{pmp}$) of the intensity pulse of the pump radiation (LB) minus the possibly existing bias value ($I_{pmpoff}$) of the intensity ($I_{pmp}$) of the pump radiation (LB) and that the pump radiation rise time ($T_{Ipmpr}$) of an intensity pulse of the pump radiation (LB) ends with the third time of exceeding 90% of the intensity value of the pump radiation intensity maximum ($I_{pmp}$) minus the possibly existing bias value ($I_{pmpoff}$) of the intensity ($I_{pmp}$) of the pump radiation (LB) minus the possibly existing bias value ($I_{pmpoff}$) of the intensity ($I_{pmp}$) of the pump radiation (LB) by the instantaneous intensity ($I_{pmp}$) of the intensity pulse of the pump radiation (LB) minus the possibly existing bias value ($I_{pmpoff}$) of the intensity ($I_{pmp}$) of the pump radiation (LB).

The pump radiation decay time ($T_{Ipmpd}$) of the intensity ($I_{pmp}$) of the pump radiation (LB) is defined here in such a way that the pump radiation decay time ($T_{Ipmpd}$) of an intensity pulse of the pump radiation (LB) begins with the first time of falling below 90% of the intensity value of the pump radiation intensity maximum ($I_{pmpmax}$) minus the possibly existing bias value ($I_{pmpoff}$) of the intensity ($I_{pmp}$) of the pump radiation (LB) by the instantaneous intensity ($I_{pmp}$) of the intensity pulse of the pump radiation (LB) minus the possibly existing bias value ($I_{pmpoff}$) of the intensity ($I_{pmp}$) of the pump radiation (LB) and that the pump radiation decay time ($T_{Ipmpd}$) of an intensity pulse of the pump radiation (LB) ends with the third time of falling below 10% of the intensity value of the pump radiation intensity maximum ($I_{pmpmax}$) minus the possibly existing bias value ($I_{pmpoff}$) of the intensity ($I_{pmp}$) of the pump radiation (LB) by the instantaneous intensity ($I_{pmp}$) of the intensity pulse of the pump radiation (LB) minus the possibly existing bias value ($I_{pmpoff}$) of the intensity ($I_{pmp}$) of the pump radiation (LB).

For the calculation of many applications, the transmit delay ($\Delta t_{Ipmp}$) can be assumed to be 0 s and/or the pump radiation decay time ($T_{Ipmpd}$) can be assumed to be 0 s and/or the transmission signal decay time ($T_{S5pmpd}$) can be assumed to be 0 s and/or the pump radiation rise time ($T_{S5pmpr}$) can be assumed to be 0 s for simplicity. The pump radiation pulse duration ($T_{Ipmp}$) is then equal to the transmission signal pulse duration ($T_{S5pmp}$). The pump radiation pulse duration ($T_{Ipmp}$) and the transmission signal pulse duration ($T_{S5pmp}$) are then equal to the first times (T1) at which the transmission signal (S5) is active and the pump radiation source (PL1) emits pump radiation (LB). Under these simplifications, the transmission signal complementary time ($T_{S5c}$) and the pump radiation complementary time ($T_{Ic}$) are equal to the second times (T2) at which the transmission signal (S5) is not active and the pump radiation source (PL1) does not emit pump radiation (LB).

Thus, the first times (T1) and the second times (T2) in FIGS. 6, 11, 13, 19, 23 and 26 are only a simplification for better understanding. The levels of FIGS. 6, 11, 13, 19, 23 and 26 are thus only exemplary and serve only for a better understanding.

To maximize the contrast (KT), the temporal duration of the pump radiation fall time ($T_{Ipmpd}$) and/or the pump radiation rise time ($T_{Ipmpr}$) should each be no more than 25%, preferably no more than 10%, preferably no more than 5%, preferably no more than 2% of the temporal duration of an intensity pulse of the pump radiation (LB), i.e. the pump radiation pulse duration ($T_{Ipmp}$).

Thus, in order to maximize the contrast (KT), the temporal duration of the transmission signal fall time ($T_{S5pmpd}$) and/or the transmission signal rise time ($T_{S5pmpr}$) should each be not more than 25%, preferably not more than 10%, preferably not more than 5%, preferably not more than 2% of the temporal transmission signal pulse duration ($T_{S5pmp}$).

In order to achieve such short rise and fall times, various writings are known from the prior art, which are mentioned here only by way of enumeration and whose technical teachings can be used here.

A driver circuit for an LED is known from DE 10 2009 060 873 A1. A driver circuit for light-emitting optoelectronic components is known from DE 10 2016 116 368 A1 (see FIG. 1 of DE 10 2016 116 368 A1), in which the charging circuit (reference signs 2, 3, 4, 5, 9, 10, 11, 12, 13, 14 of DE 10 2016 116 368 A1) charges a capacitor (reference signs 18-21 of DE 10 2016 116 368 A1) via a series resistor (reference sign 3 of DE 10 2016 116 368 A1). The light-emitting optoelectronic components (reference signs 22 to 25 of DE 10 2016 116 368 A1) are connected together with their cathodes to form a first star point. A drive switch (reference character 26 of DE 10 2016 116 368 A1) connects this star point to the reference potential (reference character GND of DE 10 2016 116 368 A1) when one or more of the light-emitting optoelectronic components is to emit light. The buffer capacitor (reference sign 9 of DE 10 2016 116 368 A1) serves to quickly charge the actual energy reserves (reference signs 18 to 21 of DE 10 2016 116 368 A1).

U.S. Pat. No. 10,193,304 B2 discloses a driver circuit in which the capacitors are charged in such a way that the current remains below the response threshold of the lasers.

From EP 3 301 473 A1, a drive circuit for a single LED suitable for emitting short pulses is known.

DE 10 2016 116 369 A1 discloses an LED driver circuit in which each LED has its own drive switch.

DE 10 2008 021 588 A1 describes a laser drive circuit in which several drive switches are connected in parallel so that they can generate pulses with a time delay and cool down between the pulses, while the other drive switches can generate the other pulses.

From DE 10 2017 121 713 A1, trigger switches are known which comprise subunits in which each subunit has its own capacitor for providing the switching energy.

Control devices for a gas laser are known from DE 19 914 362 A1 and DE 19 514 062 A1.

From U.S. Pat. No. 9,185,762 B2 (DE 10 2014 105 482 A1), a circuit for reducing the turn-off time of a laser diode is known.

From DE 10 2017 100 879 A1, a circuit for rapidly switching a single laser diode on and off is known.

From DE 10 2018 106 860 A1, the direct connection between a laser die of a single laser and the die of an integrated drive switch is known. The control switch is connected between the supply voltage and the anode of the laser diode.

From DE 10 2016 116 875 A1, a driver circuit (e.g. FIG. 12 of DE 10 2016 116 875 A1) with a common drive switch (reference sign S3 of DE 10 2016 116 875 A1) for a plurality of lasers (reference signs D1, D7 of DE 10 2016 116 875 A1) is known, in which the common drive switch (reference sign S3 of DE 10 2016 116 875 A1) is connected to the cathodes of the lasers and can connect them to the reference potential. In this case, the energy for the laser pulse comes from a common storage capacitance (reference sign C of DE 10 2016 116 875 A1). The lasers are selected via separate switches (reference sign S2 of DE 10 2016 116 875 A1).

DE 10 2006 036 167 B4 discloses a laser driver circuit in which the resonances of the parasitic inductors and the capacitors are tuned to support predetermined characteristics of the light pulses to be generated.

U.S. Pat. No. 6,697,402 B2 discloses a laser driver with laser current detection via a shunt resistor between the cathode terminal and the reference potential.

A single driver circuit is known from U.S. Pat. No. 6,697,402 B2. A coil is used as an energy storage device.

From DE 10 2018 106 861 A1, the driving of a laser diode with an H-bridge is known.

From DE 19 546 563 C2 a driver circuit is known in which the charging circuit is disconnected by an inductance from the laser diode for the short time of the light pulse emission when the drive transistor initiates the light emission.

Preferably, in order to avoid thermal overload of the pump radiation source (PL1), for example a semiconductor laser, the pump radiation pulse period ($T_{Ipmp}$) should be less than 50% of the transmission signal period ($T_p$) of the alternating component (S5w) of the transmission signal (S5).

Thus, the transmission signal pulse period ($T_{S5pmp}$) should preferably be less than 50% of the transmission signal period ($T_p$) of the alternating component (S5w) of the transmission signal (S5).

Since, to a first approximation, the alternating component of the intensity ($I_{pmp}$) of the pump radiation (LB) of the pump radiation source (PL1) is likely to be proportional to the alternating component (S5w) of the transmission signal (S5), it can be assumed for the purposes of this paper, that the above conditions for the alternating component (S5w) of the transmission signal (S5) also apply to the time characteristic of the intensity ($I_{pmp}$) of the pump radiation (LB) if, during a measurement, the time characteristic of the electric current and/or of the electric voltage of the alternating component (S5w) of the transmission signal (S5) satisfies the same 10%, 90% and 50% conditions with respect to pulse duration, rise time and fall time respectively.

It was further recognized in accordance with the disclosure that, in contrast to the prior art, microwave radiation is not necessary for operation of the sensor systems proposed herein in order for the paramagnetic centers (NV1) thus excited to a high level to drop to an intermediate level. Rather, it is sufficient if the sensing element, for example the diamond crystal of a HD NV diamond, has a sufficiently high density of paramagnetic centers (NV1), for example NV centers in diamond. If the average distances between paramagnetic centers (NV1) excited with pump radiation (LB), that is, for example, between the NV centers, are small enough, they couple and enhance the dependence of the intensity ($I_{fl}$) of their fluorescence radiation (FL) on the magnetic flux density B or other physical parameters affecting the fluorescence radiation (FL) at the location of the paramagnetic centers (NV1). Preferably, an exemplary diamond crystal in the form of a HD-NV diamond has a NV center density of more than 0.01 ppm based on the number of carbon atoms per unit volume of the diamond crystal. Of course, lower concentrations of paramagnetic centers (NV1), here exemplarily of NV centers, such as of more than 0.01 ppm and/or of more than $10^{-3}$ ppm and/or of more than $10^{-4}$ ppm and/or of more than $10^{-5}$ ppm and/or of more than $10^{-6}$ ppm relative to the atoms of the substrate (D) in the sensor element per unit volume can also be used. However, the intensity ($I_{fl}$) of the fluorescence radiation (FL) then attenuates more and more as the concentration of NV centers in the diamond crystal decreases, so that more and more stringent requirements have to be imposed on the electronic signal post-processing. The said density of paramagnetic centers (NV1) need not be achieved everywhere in the sensing element, i.e., the exemplary diamond. It has been recognized in the course of the disclosure that it is rather preferably sufficient, indeed advantageous, if this density is exceeded only locally and the intensity ($I_{pmp}$) of the pump radiation (LB) is preferably maximized only there in this region of high NV center density, as the region of high density of paramagnetic centers (NV1). Thus, preferably more than 100, more preferably more than 1000, more preferably more than $10^4$, more preferably more than $10^5$, more preferably more than $10^6$, more preferably more than $10^7$ paramagnetic centers (NV1) within a sensor element are used in parallel and preferably coupled to each other for the operation of the sensor system. Due to the high density of the paramagnetic centers (NV1) in the substrate (D) within the sensor element, for example the NV centers of a HD-NV diamond, the spins of the electron configurations of the excited NV centers, i.e. the paramagnetic centers (NV1), influence each other, so that collective effects, similar to but not identical to those in a ferromagnet, occur. By spontaneous emission, some of the paramagnetic centers (NV1) then always spontaneously assume an energetically lower intermediate state after a transition time $t_d$ coming from the excited state, which in the prior art is typically only achieved by using microwave radiation.

It has thus been recognized, as previously described, in accordance with the disclosure, that the high density of paramagnetic centers (NV1)—when HD-NV diamond is used, due to a high density of NV centers—eliminates and thus saves the need for device parts for generating and introducing the microwave radiation. Nonetheless, the use of microwave antennas and transmitters is useful when additional modulation of fluorescence radiation (FL) from the paramagnetic center (NV1) or paramagnetic centers or a group or groups (NVC) of paramagnetic centers (NV1) is desired or when lower density paramagnetic center (NV1) diamonds are to be used. By omitting microwave radiation, such sensor systems as those presented here only become useful for use in biological and, in particular, medical applications. Otherwise, radiation exposure of the surrounding tissue by the microwave radiation occurs, which massively limits the use of sensors with microwave excitation of the excited paramagnetic centers to an intermediate level for such purposes.

Preferably, the sensor element is provided with an anti-reflective coating and/or matching layer (ASv) for radiation of the pump radiation wavelength ($\lambda_{pmp}$) of the pump radiation (LB) of the pump radiation source (PL1). In the case of a HD-NV diamond as sensor element, preferably the first surface (OFL1) of the diamond which is irradiated with the pump radiation (LB) is provided with an anti-reflective coating or a matching layer (ASv) and/or a functionally equivalent microstructuring and/or coating of equivalent effect.

The shape of the sensor element can thus be selected more or less freely. Large sensor element areas are also possible.

The core of the proposed sensor system is a sensor element with an at least locally high density of paramagnetic centers (NV1), for example an HD-NV diamond. Among other things, this sensor element substantially distinguishes the proposals presented herein from the prior art. In a proposed sensing system, a pump radiation source (PL1) is provided and adapted to emit pump radiation (LB) that can excite the selected paramagnetic center (NV1) to emit fluorescent radiation (FL). In the case of NV centers in diamond or in diamonds, a laser diode of Osram type PLT5 520B is suitable, for example, as a pump radiation source (PL1) with 520 nm pump radiation wavelength ($\lambda_{pmp}$). The pump radiation (LB) of the pump radiation source (PL1) should have a pump radiation wavelength in a wavelength range of 400 nm to 700 nm wavelength and/or better 450 nm to 650 nm and/or better 500 nm to 550 nm and/or better 515 nm to 540 nm when NV centers are used. Pump radiation of this feature is referred to herein as "green" pump radiation (LB). Clearly, a wavelength of 532 nm is preferred as the pump radiation wavelength ($\lambda_{pmp}$) of the pump radiation (LB) when using NV centers. 520 nm has also been successfully used. For cost reasons, the pump radiation source (PL1) is preferably a light emitting diode or a laser, which are also collectively referred to hereinafter as LEDs for simplicity. It is conceivable to use other light emitting devices, for example organic light emitting diodes (OLEDs) or electroluminescent devices, as pump radiation sources (PL1). However, the use of LEDs as pump radiation sources (PL1) is clearly more advantageous at present.

The paramagnetic center (NV1) in the material of the sensor element emits said fluorescence radiation (FL) when irradiated with said pump radiation (LB), which is typically green in the case of NV centers as paramagnetic centers (NV1). The fluorescence radiation (FL) is typically red in the case of using NV centers as paramagnetic centers (NV1). Typically, in the negatively charged state NV⁻, the NV center emits⁻ fluorescence radiation (FL) with a fluorescence radiation wavelength ($\lambda_{fl}$) of 637 nm. In the non-negatively charged state, NV centers do not fluoresce. The location of the Fermi level at the site of the paramagnetic center in question (NV1) here of an NV center, determines the preferred charge state of the paramagnetic center, here of the NV center. By embedding the paramagnetic center (NV1) in an electric field generated, for example, by a line (LH), the preferred charge state of the paramagnetic center, for example, of an NV center, can be predetermined. Thus, it is possible to modulate the intensity ($I_{fl}$) of the fluorescent radiation (FL) of a paramagnetic center, for example an NV center, by selectively bringing the paramagnetic center (NV1) into a fluorescent state, for example the N⁻ state, or into another non-fluorescent state. In a fluorescent state, the paramagnetic center (NV1) in question emits fluorescent radiation of the fluorescent radiation wavelength ($\lambda_{fl}$) when irradiated with pump radiation (LB) of the pump radiation wavelength ($\lambda_{pmp}$). In a non-fluorescent state, the respective paramagnetic center (NV1) does NOT emit fluorescence radiation of the fluorescence radiation wavelength ($\lambda_{fl}$) when irradiated with pump radiation (LB) of the pump radiation wavelength ($\lambda_{pmp}$).

This fluorescence radiation (FL) of the one or more paramagnetic centers (NV1) or of the group of the groups (NVC) of paramagnetic centers (NV1) is detected by the radiation receiver (PD). The radiation receiver (PD) is, for example, a photodiode which is preferably furthermore sensitive to radiation at a compensation radiation wavelength ($\lambda_{ks}$), explained later, of a compensation radiation source (PLK), also explained later, or preferably furthermore sensitive to the compensation fluorescence wavelength ($\lambda_{kfl}$), explained later, of the compensation fluorescence radiation (KFL), also explained later, of one or more reference paramagnetic centers (NV1) or of a group or groups (NVC), also explained later, of paramagnetic reference centers (NV2).

The radiation receiver (PD), for example said photodiode, is sensitive to radiation of the fluorescence radiation wavelength ($\lambda_{fl}$) of the fluorescence radiation (FL). As a photodiode, as a radiation receiver (PD), for example a PIN photodiode of the type BPW 34 FA of the company Osram was used in the elaboration of the disclosure. In the case of the use of NV centers, the radiation receiver (PD) is thus preferably sensitive to radiation having a fluorescence radiation wavelength ($\lambda_{fl}$) of 637 nm. For example, by using an upstream optical filter (F1), preferably the combination of the optical filter (F1) and the radiation receiver (PD) is not sensitive to radiation having the pump radiation wavelength ($\lambda_{pmp}$) transmitted or reflected by the sensing element, for example. In the case of NV centers in diamond as paramagnetic centers (NV1), for example, this would optimally be a pump radiation wavelength ($\lambda_{pmp}$) of 532 nm for which the radiation receiver (PD) in combination with the first filter (F1) would then not be sensitive.

The pump radiation source (PL1) generates the pump radiation (LB) depending on the current value of a transmission signal (S5). The sensor system is thereby preferably designed in such a way that the pump radiation (LB) is at least partially irradiating the paramagnetic center or centers (NV1). As described above, optical functional elements such as optical waveguides, reflectors, lenses, prisms, free air gaps, vacuum gaps, apertures, mirrors, beam sections, gratings, etc. may be used for this purpose, which optically couple the pump radiation source (PL1) to the paramagnetic center or centers (NV1) of the sensor element. Similarly, the sensor system is preferably designed such that the fluorescent radiation (FL) at least partially irradiates the radiation receiver (PD). This can also be ensured by means of said optical functional elements mentioned in this writing, which optically couple the paramagnetic center(s) (NV1) of the sensor element to the radiation receiver (PD).

The radiation receiver (PD) generates, as a function of the intensity value of the intensity of the total irradiation and thus, inter alia, as a function of the intensity value of the intensity ($I_{fl}$) of the fluorescence radiation (FL) incident thereon, a receiver output signal (S0) whose instantaneous value (s0) depends on the instantaneous value of the intensity of the total incident radiation and thus on the instantaneous value of the intensity ($I_{fl}$) of the fluorescence radiation (FL). An evaluation circuit converts the sequence of instantaneous values (s0) of the receiver output signal (S0) into a measured value for the amplitude and/or intensity ($I_{fl}$) of the fluorescent radiation (FL). This measured value is output or provided for use as an instantaneous value (s4) of the sensor output signal (out). Since the intensity ($I_{fl}$) of the fluorescence radiation (FL) of the paramagnetic centers (NV1) depends on physical parameters such as, for example, the magnetic flux density B at the location of these paramagnetic centers (NV1), it is thus possible to construct, for example, a simple magnetometer with high spatial and/or temporal resolution as an example of a sensor system for detecting a physical parameter by means of a paramagnetic center (NV1) whose sensor element has little noise and which has a high sensitivity. Further physical parameters in addition to the magnetic flux density B, which could possibly be measured in this way by means of the intensity ($I_{fl}$) of the fluorescence radiation (FL) of the paramagnetic center (NV1), would be, for example, electric flux density D, acceleration a, gravitational field strength g, pressure P, temperature $\vartheta$, rotational speed $\omega$, oscillation frequency of mechanical parts (beams), position, intensity of ionising radiation, etc., which could be measured in this way by means of the intensity (I) of the fluorescence radiation (FL) of the paramagnetic center (NV1).

More specific examples of the implementation of such a sensor system are provided below. Preferably, such a sensor system uses one or more HD NV diamonds with a high density of NV centers as described above. For example, the sensor system may use a single, single-crystal diamond with a high density of NV centers, or may use a powder or granule of nanodiamonds or diamonds with NV centers in a transparent material, these examples representing extreme cases of a wide range of examples between these extremes. We refer here to the as yet unpublished international patent application PCT DE 2020 100 430. Also, the NV centers can be used as single, isolated NV centers or used in such high density that two or preferably more NV centers couple together and collective effects become possible. The use of HD NV diamonds of high NV center density is preferred here. Alternatively, such a sensor system may comprise one or more crystals of other material having a high density of suitable alternative paramagnetic centers. For example, the sensor system may use a single, single crystal having a high density of paramagnetic centers (NV1) or use a granule or powder of, for example, nanocrystals or crystals having a high density of paramagnetic centers (NV1) in a transparent material, these examples again representing the two extreme cases of said wide range of examples.

As an alternative method, in addition to pumping the paramagnetic center or centers (NV1) with pump radiation (LB) from a pump radiation source (PL1), a sensor element and/or a local portion of the sensor element having the paramagnetic center or centers (NV1) is simultaneously irradiated with microwaves to selectively drive the spin transition. It is conceivable, in the case of a plurality of paramagnetic centers (NV1) within the sensor element, to irradiate a single paramagnetic center (NV1) or only a first subset of the paramagnetic centers (NV1) with the pump radiation (LB) and not to irradiate at least one paramagnetic center (NV1) of the paramagnetic centers of the sensor element or a second subset of the paramagnetic centers (NV1) of the sensor element with pump radiation (LB). By this, the fluorescence radiation (FL) then originates only from the paramagnetic centers (NV1) irradiated with pump radiation (LB). Since the areas of the sensor element that are irradiated with pump radiation (LB) and the areas of the sensor element that are not irradiated with pump radiation (LB) are known, a spatial resolution of the determination of the value of the physical parameters whose value is to be determined is thus achieved. The frequency of the superimposed microwave radiation and the strength of the magnetic flux density B to be measured can thus be correlated with local resolution. This can also be done in the same way for the determination of measured values of other physical quantities influencing the paramagnetic center (NV1) or the paramagnetic centers (NV1) or the group or groups (NVC) of paramagnetic centers (NV1), such as, for example, pressure P, temperature $\vartheta$, acceleration a, gravitational field strength g, rotational speed $\omega$ and intensity of irradiation with ionizing radiation and their time integrals and derivatives. As a measurand for the magnetic flux density B and/or that of the electric flux density D and/or other the paramagnetic center(s) (NV1) or the group or groups (NVC) of paramagnetic centers (NV1) influencing physical values, such as i.e. pressure P, temperature $\vartheta$, acceleration a, gravitational field strength g, rotational speed $\omega$ and intensity of the irradiation with ionising radiation and their time integrals and derivatives, the changes in the intensity ($I_{fl}$) of the fluorescence radiation (FL) of the paramagnetic center (NV1) or of the paramagnetic centers (NV1) or of the group or groups (NVC) of paramagnetic centers (NV1), are in turn preferably used or the amount of generated and extracted photoelectrons of the paramagnetic center (NV1) or the paramagnetic centers (NV1) or the group or groups (NVC) of paramagnetic centers (NV1), or both is used. Although in this paper the intensity ($I_{fl}$) of the fluorescence radiation (FL) is generally taken as the basis of the measured value, in principle an extraction and detection of the photoelectrons in the form of a photocurrent of the photoelectrons of the paramagnetic center (NV1) or the paramagnetic centers (NV1) or the group or groups (NVC) of paramagnetic centers (NV1) and the use of my of these photoelectrons as the basis for the determination of the measured value directly from the sensor element is always included in the description and claiming.

The performance of a quantum mechanical sensor system can be massively limited by an unfavourable housing. In particular, for example, a housing with ferromagnetic subcomponents can cause distortions or shielding of magnetic fields and thus limit the usefulness of the sensor system. Also, an unfavorable housing can decisively increase the production costs of such a sensor device.

The proposal therefore further comprises a particularly suitable housing for the low-cost production of sensor systems with a paramagnetic center (NV1) in the material of a sensor element and/or in the material of a quantum technological device element which is part of the sensor system and/or quantum technological system. The proposed housing, which has already been processed to form the sensor system, typically comprises such a sensor system with a paramagnetic center (NV1) after the housing has been opened. Preferably, it is a sensor system as described above with one or more HD NV diamonds with a high density of NV centers as described above as the sensor element.

The proposed package may further comprise first means as first optical functional elements, for example a reflector (RE), for directing the pump radiation (LB) of the pump radiation source (PL1) to the paramagnetic center (NV1) and thus optically coupling the pump radiation source (PL1), for example an LED, to the paramagnetic center (NV1). As explained above, first optical functional elements such as optical waveguides, reflectors, lenses, prisms, open air gaps, vacuum gaps, apertures, mirrors, beam parts, gratings, etc. may be used for the optical coupling, some of which may also be manufactured as housing parts. Preferred is the use of the housing cover (DE) for this purpose.

The proposed package may further comprise second means as second optical functional elements, for example a reflector (RE), for directing the fluorescent radiation (FL) of the one or more paramagnetic centers (NV1) to the radiation receiver (PD) and thus coupling the radiation receiver (PD), for example a photodiode, to the one or more paramagnetic centers (NV1). As explained above, second optical functional elements such as optical waveguides, reflectors, lenses, prisms, open air gaps, vacuum gaps, apertures, mirrors, beam parts, gratings, etc. may be used for the optical coupling, some of which may also be manufactured as housing parts. Preferably, the housing cover (DE) is also used for this purpose.

Preferably, an optical filter (F1) is located in this beam path between the parametric center or centers (NV1) and the radiation receiver (PD), which does not attenuate or only insignificantly attenuates the fluorescence radiation (FL) with respect to the application and thus transmits it, and which sufficiently attenuates the pump radiation (LB) with respect to the application and thus absorbs or reflects it and precisely does not transmit it. As a result, only the radiation, the fluorescence radiation (FL), with fluorescence radiation wavelength ($\lambda_{fl}$) can reach the radiation receiver (PD) and radiation with pump radiation wavelength ($\lambda_{pmp}$), the pump radiation (LB), cannot reach the radiation receiver (PD).

Preferably but not necessarily, these immediately before mentioned first means and/or second means are part of the housing itself. For example, the inner side of a cover (DE) of the housing can be formed as a mirroring reflector (RE) for directing the pump radiation (LB) and/or the fluorescence radiation (FL), for example by means of polishing and/or single-layer or multi-layer optionally also structured coating. Better is a mirroring of surfaces of the housing, especially of parts of the housing cover (DE). Especially favourable and preferred is an additional focussing curvature of the inner side of the cover (DE).

An exemplary example of such a sensor system is described, for example, in German patent application DE 10 2018 127 394 A1, the publication date of which is after the claimed priority dates of this application document. However, the sensor system can also be explicitly embodied in a different way than described in the German patent application DE 10 2018 127 394 A1. The proposed housing is therefore, in general, a proposed low-cost housing for sensor systems comprising a paramagnetic center (NV1) as a functional element, without the specific measurement task playing a role here with respect to the housing. Importantly, the physical parameter to be sensed can reach the paramagnetic center(s) (NV) or group(s) (NVC) of paramagnetic centers (NV1) within the housing. This should be taken into account when selecting the materials of the enclosure and its construction. For example, if a magnetic flux density B is to be detected, it is preferable to make the housing from non-magnetic materials, firstly so as not to distort or modify the physical quantity to be detected and secondly so as not to cause a shielding effect. The same applies to other materials used, such as fastening means and materials.

Preferably, all subdevices of the housing and of the sensor system are designed to be non-ferromagnetic in order to minimize the influence of the paramagnetic center (NV1). By "non-ferromagnetic" is meant herein a permeability number $\mu_r$ lower than 100. Preferably, all components of the housing and the sensor system and/or the quantum technological system are diamagnetic, by which is understood herein a permeability number of the materials with $\mu_r<1$ (typically would be $1-7*10^{-6} \ldots 1-2*10^{-4}$), and/or paramagnetic, by which is understood herein a permeability number of the materials with $\mu_r>1$ (typically would be $1+1*10^{-8} \ldots 1+4*10^{-4}$). However, for the purposes of the present disclosure, materials having a permeability number $\mu_r<100$ are also considered to be non-ferromagnetic. Thus, paramagnetic and diamagnetic substances are not ferromagnetic for the purposes of the present disclosure. Most preferably, all lead frame surfaces (LF1 to LF6) of the housing are made non-ferromagnetic.

Thus, in the housing that houses the paramagnetic center (NV1) in the material of a sensor element, all sub-devices of the sensor system are preferably non-ferromagnetic.

If necessary, it may be useful to provide a magnetic shield (MAS) of soft magnetic material between the radiation receiver (PD1) and the evaluation circuit, i.e. the integrated circuit (IC), when using an integrated circuit (IC). Such shielding (MAS) may also be provided to magnetically shield the paramagnetic center (NV1) or centers (NV1) or the group or groups of paramagnetic centers (NV1) from the integrated circuit (IC) and/or other potentially current-carrying device parts. Such a package with such shielding (MAS) is considered to be made of non-ferromagnetic materials for the purposes of this disclosure, as it exhibits this property after the shielding (MAS) is removed.

The housing with the functionalized paramagnetic center (NV1) in the material of a sensor element is thus preferably designed in such a way that all sub-devices of the sensor system including the housing, with the exception of a soft magnetic shield (MAS), are made of a soft magnetic material and/or, with the exception of parts of a magnetic circuit, are not made of a ferromagnetic material, but preferably of a paramagnetic and/or diamagnetic material. For the purposes of the present disclosure, a soft magnetic material is understood to be, in accordance with DIN EN 60404-1: 2017-08, a material with a coercive field strength $<=1\ 000$ A/m. Even smaller coercive field strengths are preferred.

For simplicity, the term sensing element is used herein as a synonym for a sensing element and/or a quantum technology device element.

A very cost-effective method of manufacturing a sensor system is proposed herein, comprising the following steps, even in a different order:

Providing an open cavity housing with connections and with a cavity (CAV) having a mounting opening (MO) for insertion of system components;

Insert the pump radiation source (PL1) into the cavity (CAV) of the open cavity housing through the mounting hole (MO);

Inserting an integrated circuit (IC) comprising the evaluation circuit into the cavity (CAV) of the open cavity housing using the mounting opening (MO), wherein the integrated circuit (IC) preferably comprises the radiation receiver (PD1);

Unless the integrated circuit (IC) comprises the radiation receiver (PD1), the method also prefers inserting the radiation receiver (PD1) into the cavity (CAV) of the open cavity housing through the mounting opening (MO) in a typically separate step;

Electrical connection of integrated circuit (IC), terminals of the open cavity housing, pump radiation source (PL1) and possibly separate radiation receiver (PD1), in particular by means of bond connections (BD1 to BD4);

Incorporating a sensor element with one or more paramagnetic centers (NV1) or one or more groups (NVC) of paramagnetic centers (NV1) in the material of the sensor element, for example a sensor element with one or more diamonds with one or more NV centers and/or one or more groups of NV centers, preferably one or more HD-NV diamonds with an at least locally high density of NV centers, via the mounting opening (MO) into the cavity (CAV) of the open cavity housing;

fixing the sensor element by means of an attachment and fixing means (Ge), preferably the attachment and fixing means (GE) being shaped and/or selected and/or mounted in such a way that the pumping radiation (LB)

can reach the paramagnetic center (NV1) or centers (NV1) or the group or groups (NVC) of paramagnetic centers (NV1) and that the fluorescence radiation (FL) of the paramagnetic center (NV1) or paramagnetic centers (NV1) or group or groups (NVC) of paramagnetic centers (NV1) can reach the radiation receiver (PD1);

producing first means for directing the pump radiation (LB) and/or second means for directing the fluorescence radiation (FL), these means preferably, but not necessarily, being part of the housing, and, if appropriate, fixing the first means and/or the second means to the housing or housing parts if the respective means is not part of the housing or a housing part of the housing and/or can be produced as such;

Closing the housing, in particular the mounting opening (MO), with a cover (DE), which is considered a housing part in this writing.

A first method is presented for testing a housing having a sensor system at least partially fabricated in the housing, in accordance with the foregoing and subsequent proposals. The test method is preferably performed before closing the mounting opening (MO). The mounting opening (MO) is used here for supplying the test signals. In particular, the idea is to use the mounting opening (MO) for feeding a well-controlled, preferably calibrated and adjustable test pump radiation (TLB) corresponding to pump radiation (LB) and extracting a well-controlled, preferably calibrated and adjustable test radiation (TFL) corresponding to fluorescence radiation (FL) out of the housing and to measure the electrical and/or physical response of device components of the sensor system in the housing. For example, such a test method comprises the steps of:

Irradiation of the open housing through the mounting opening (MO) with pump radiation (LB);

Measurement of the fluorescence radiation (FL) emitted by the housing via the open mounting opening (MO), wherein this measurement can be carried out by the sensor system itself and/or a measuring device outside the housing preferably via the mounting opening (MO) or another measurement path. Preferably, the intensity ($I_{fl}$) of the fluorescence radiation (FL) is detected as a function of the intensity ($I_{pmp}$) of the pump radiation (LB) and/or as a function of the value of one or more physical parameters, which may be, for example, the value of the magnetic flux density B and/or the temperature and/or a pressure, etc;

Evaluating the measured value or values of the fluorescence radiation (FL), in particular preferably the measured value of the intensity ($I_{fl}$) of the fluorescence radiation (FL), by comparing the measured value or values of the fluorescence radiation (FL) at one or more measurement parameter configurations, each corresponding to one or more predetermined intensity values ($I_{pmp}$) of the pump radiation (LB) and/or one or more predetermined values of the influencing physical parameters or a combination thereof, with at least one threshold value associated with the respective measurement parameter configuration. Preferably, the housing is discarded or reworked with the sensor system if this comparison does not correspond to an expected value.

A second method is further proposed for testing a housing comprising a sensor system according to the preceding proposal. The second proposed test method is also preferably performed before closing the mounting opening (MO). The basic idea is the same as for the first test procedure presented previously. This second test procedure comprises the steps of:

Operate pump radiation source (PL1) in the sensor system inside the housing with an open housing with open mounting hole (MO) without housing cover (DE);

Measurement of the pump radiation (LB) typically emitted via the mounting opening (MO) of the open housing through the paramagnetic center or centers (NV1) by the pump radiation source (PL1), wherein, for example, one or more measured values for the intensity ($I_{pmp}$) and/or, if applicable, the intensity distribution of the pump radiation (LB) are determined;

Evaluating the measured value or values of the pump radiation (LB), in particular preferably the measured value of the intensity ($I_{pmp}$) of the pump radiation (LB), by comparing the measured value or values of the pump radiation (LB) at one or more measurement parameter configurations, each corresponding to one or more predetermined values of the physical parameters (e.g. operating voltage or temperature) influencing the pump radiation source (PL1) or a combination thereof, with at least one threshold value associated with the respective measurement parameter configuration. Preferably, the housing with the sensor system and/or the sensor system is discarded or reworked if this comparison does not correspond to an expected value.

A third proposed method for testing a housing comprising a sensor system according to the preceding proposal is proposed. The third proposed test method is also preferably performed before closing the mounting opening (MO) of the housing. The basic idea is the same as for the first and second test procedures presented previously. This third test procedure comprises the steps of:

Operate pump radiation source (PL1) in the sensor system with an open housing with an open mounting hole (MO);

Direction of the pump radiation (LB) emitted by the pump radiation source (PL1) by means of optical functional components, for example a test mirror, to the radiation receiver (PD1);

Measurement of the fluorescence radiation (FL) emitted by the housing preferably via the mounting opening (MO), wherein this measurement can be carried out by the sensor system itself and/or a measuring device outside the housing preferably via the mounting opening (MO) or another measurement path. Preferably, the intensity ($I_{fl}$) of the fluorescence radiation (FL) is detected as a function of the intensity ($I_{pmp}$) of the pump radiation (LB) and/or as a function of the value of one or more physical parameters, which may be, for example, the value of the magnetic flux density B and/or the temperature and/or a pressure, etc;

Evaluating the measured value or values of the fluorescence radiation (FL), in particular preferably the measured value of the intensity ($I_{fl}$) of the fluorescence radiation (FL), by comparing the measured value or values of the fluorescence radiation (FL) at one or more measurement parameter configurations, each corresponding to one or more predetermined intensity values ($I_{pmp}$) of the pump radiation (LB) and/or one or more predetermined values of the influencing physical parameters or a combination thereof, with at least one threshold value associated with the respective measurement parameter configuration. Preferably, the housing with the sensor system and/or the sensor system is discarded or reworked if this comparison does not correspond to an expected value.

The first method, the second method and the third method may be combined.

Two things are now proposed for the realization of a current sensor, both of which should preferably be fulfilled in addition to that described above:

As a first step, a sensor system and/or quantum technological system—also referred to in this paper only simplified as sensor system—is proposed, in which the sensor system is accommodated in a housing and in which the sensor system comprises one or more paramagnetic centers (NV1) or one or more groups (NVC) of paramagnetic centers (NV1) in the material of a sensor element and/or quantum technological device element which is part of the sensor system. The sensor system of the current sensor comprises said pump radiation source (PL1) for pump radiation (LB), which is preferably an LED. As described above, the pump radiation (LB) causes the paramagnetic center or centers (NV1) or the group or groups (NVC) of paramagnetic centers (NV1) to emit fluorescence radiation (FL). Furthermore, the components of the housing and/or the sensor system described further above may also be present. In contrast to the above description, the housing now additionally comprises at least one line through which the electric current to be detected and measured flows. Preferably, this line is galvanically isolated from the other device parts of the sensor system. The only exception may be the sensor element with the paramagnetic center (NV1). If an NV center in diamond is used, the diamond may be in direct electrical high resistance contact and mechanical contact with the conductor and one or more NV centers of the diamond may be optically coupled to the rest of the sensor system. Here, it can be exploited that diamond is generally electrically insulating. The magnetic field of the conduction in the form of the generated magnetic flux density B at the location of the paramagnetic center(s) (NV1) or group(s) (NVC) of the paramagnetic centers (NV1) influences the intensity ($I_{fl}$) of the fluorescence radiation (FL) of the paramagnetic center(s) (NV1) or of the paramagnetic centers or of the group or groups (NVC) of the paramagnetic centers (NV1) in the material of a sensor element and/or of the quantum technological device element. In this case, it can then be exploited that the magnetic flux density B around a current-carrying conductor decreases with 1/r, where r is the distance of the paramagnetic center (NV1) or the plurality of paramagnetic centers (NV1) or the group or groups (NVC) of paramagnetic centers (NV1) from the current-carrying conductor (LTG, LH, LV). Preferably, the paramagnetic center(s) (NV1) or the group(s) (NVC) of paramagnetic centers (NV1) are located at a first distance (r) of less than 1 µm, preferably less than 500 nm, preferably less than 200 nm, preferably less than 100 nm, preferably less than 50 nm, preferably less than 20 nm from the exemplary horizontal conductor (LH). In the elaboration of the disclosure, it has been considered that the line (LH) is particularly preferably less than 50 nm away from the paramagnetic center(s) (NV1) or the group(s) (NVC) of paramagnetic centers (NV1). Due to this small distance (r), significant magnetic flux densities B at the location of the paramagnetic center(s) (NV1) or the group(s) (NVC) of paramagnetic centers (NV1) can already be achieved with electrical currents (IH) in the line (LH, LV, LTG) which are very small in magnitude and which influence the fluorescence radiation (FL) of the paramagnetic center(s) (NV1) or group(s) (NVC) of paramagnetic centers (NV1), if necessary, in parallel in time with other possibly relevant physical parameters. This is particularly advantageous if a plurality of lines (LH) are fabricated on the substrate (D), to each of which a paramagnetic center (NV1) from a total set of paramagnetic centers (NV1) or a group (NVC) of paramagnetic centers (NV1) from a total set of a plurality of groups (NVC) of paramagnetic centers (NV1) is assigned. Advantageously, by adjusting the magnetic flux density B by means of different electric currents in the different lines (LH), the contrast (KT) of the respective paramagnetic centers (NV1) associated with the respective lines (LH) or of the respective groups (NVC) of paramagnetic centers (NV1) associated with the respective lines (LH) can then be adjusted differently by the resulting different respective magnetic flux density B at the location of the respective paramagnetic center (NV1) or at the location of the respective group (NVC) of paramagnetic centers. Thus, a method and an apparatus are disclosed herein for differently adjusting the contrast (KT) of different paramagnetic centers (NV1) and/or different groups (NVC) of paramagnetic centers (NV1). Similarly, the plurality of lines (LH) may be provided with an electric potential different from each other with respect to the electric potential of the substrate (D). By such an electric potential of a line (LH), the Fermi level at the location of a paramagnetic center (NV1) associated with this line (LH) and located in the vicinity of the line (LH) or at the location of a group (NVC) of paramagnetic centers (NV1) associated with said line (LH) and located in the vicinity of said line (LH), wherein proximity here refers to the above values for the distance (r) between a line (LH) and the paramagnetic center (NV1) associated with said line or the group (NVC) of paramagnetic centers (NV1) associated with said line (LH). Through this, the charge state of the plurality of paramagnetic centers (NV1) in the vicinity of the plurality of lines (LH) can be set differently in each case by selecting and setting differently the electric potentials of the lines (LH). In the case of NV centers as paramagnetic centers (NV1), in this way, some NV centers can be forced into the fluorescent NV⁻ state and thus light up, while other NV centers can be forced into other states and thus not fluoresce and thus not light up. Since the distance between the lines (LH) and also between the paramagnetic centers (NV1) located in their vicinity is smaller than the pump radiation wavelength ($\lambda_{pmp}$) and smaller than the fluorescence radiation wavelength ($\lambda_{fl}$), a sensor system can be produced in this way whose spatial resolution is smaller than that without such a selection structure. For example, individual paramagnetic centers (NV1) or individual groups (NVC) of paramagnetic centers (NV1) can be activated one after the other by applying a suitable potential to the line (LH) associated with this paramagnetic center (NV1) or this group (NVC) of paramagnetic centers (NV1), i.e. brought into a fluorescent state, with all the other or at least most of the other paramagnetic centers (NV1) or other groups (NVC) of paramagnetic centers (NV1) preferably being simultaneously deactivated, i.e. brought into a non-fluorescent state. In the case of NV centers as paramagnetic centers (NV1), the line associated with an NV center is preferably positively charged with respect to the substrate (D) for the activation of the NV center, so that the NV center located in the vicinity is brought into the negatively charged, fluorescent NV⁻-state, and preferably negatively charged with respect to the substrate (D) for deactivation of the NV center, so that the nearby NV center leaves the negatively charged fluorescent NV⁻ ⁻state and thus no longer fluoresces. This method can also be used to impose a modulation on the intensity ($I_{fl}$) of the fluorescent radiation (FL). The modulations may be specific to the line (LH) in the case of multiple lines and multiple paramagnetic centers (NV1) respectively associated with these lines (LH), so that in the frequency spectrum of the modulation of the intensity ($I_{fl}$) of the fluorescent radiation (FL) these different modulations are reflected. For example, it is conceivable to monofrequency the modulations of the different lines and to select a different line-specific modulation frequency for each line (LH). Thus, the intensity ($I_{fl}$) of the fluorescence radiation (FL) of the paramagnetic centers (NV1) or of the groups (NVC) of paramagnetic centers is modulated in accordance with the line-specific modulation frequency corresponding to the line (LH) which is close to them in each case, so that the spectrum of the intensity ($I_{fl}$) of the fluorescence radiation which reaches the radiation receiver (PD) and thus the spectrum of the receiver output signal (S0) has a superposition of these modulation frequencies which can be separated again by optimum filters, synchronous demodulators, bandpass filters or the like if the spacings of these modulation frequencies in the frequency spectrum are suitably selected. In this way, a spatial resolution below the fluorescence radiation wavelength ($\lambda_{fl}$) and below the pump radiation wavelength ($\lambda_{pmp}$) is possible.

The sensor system determines, for example, a value for the intensity ($I_{fl}$) of the fluorescence radiation (FL) by means of said radiation receiver (PD1) and, for example, said integrated circuit (IC) by means of the evaluation circuit, and provides and/or outputs this value for the intensity ($I_{fl}$) of the fluorescence radiation (FL) in digital and/or analog form, for example as a sensor output signal (out). Since the intensity ($I_{fl}$) of the fluorescence radiation (FL) of a paramagnetic center (NV1) depends on the magnetic flux density B at the location of the paramagnetic center (NV1), a value for the intensity ($I_{fl}$) of the fluorescence radiation (FL) and thus the value of the sensor output signal (out) is a possible measure of the magnetic flux density B at the location of the paramagnetic center and thus of the current value of the electric current through the conductor which causes this magnetic flux density B. Thus it is possible to construct a current measuring system with the aid of a paramagnetic center (NV1) or several paramagnetic centers or a group (NVC) of paramagnetic centers (NV1) or several groups of paramagnetic centers (NV1) without the aid of microwaves.

This paper thus describes a sensor system with one or more paramagnetic centers (NV1) or one or more groups (NVC) of paramagnetic centers (NV1) in a substrate (D), hereinafter also referred to in simplified form as paramagnetic centers (NV1), the sensor system comprising first means (G, PL1, F1, PD, M1, TP) for exciting and detecting and evaluating the fluorescence radiation (FL) of these paramagnetic centers (NV1), and the sensor system generating and/or providing a measured value by means of the first means (G, PL1, F1, PD, M1, TP) as a function of the fluorescence radiation (FL) of these paramagnetic centers (NV1). The sensor system preferably comprises an electrical conductor (LH, LV, LTG). The electrical conductor (LH, LV, LTG) is preferably mechanically connected to the substrate (D) having the paramagnetic centers (D). The electrical conductor (LH, LV, LTG) preferably has an electrical current (IH, IV) flowing through it. The said electric current (IH, IV) now generates a magnetic flux B which affects the fluorescence radiation (FL) of these paramagnetic centers (NV1). Is the shortest distance (r) between the center of gravity of the paramagnetic centers (NV1) and the conductor (LH, LV, LTG) shorter than 1 µm, better less than 500 nm, better less than 200 nm, better less than 100 nm, better less than 50 nm, better less than 20 nm or is the shortest distance (r) between a paramagnetic center (NV1) of the paramagnetic centers (NV1) and the conductor (LH, LV, LTG) is shorter than 1 µm, preferably less than 500 nm, preferably less than 200 nm, preferably less than 100 nm, preferably less than 50 nm, preferably less than 20 nm, the magnetic flux density B acting on the paramagnetic centers (NV1) is very large, which increases the sensitivity of the current measurement.

As already indicated in the explanation of the basic structure of the sensor system, a control and evaluation unit (LIV) is required to operate the sensor system. This control and evaluation unit (LIV) is preferably an integrated circuit. Only parts of the control and evaluation unit (LIV) may also be part of an integrated circuit (IC). In addition to the control and evaluation unit (LIV), the integrated circuit (IC) can comprise further functional elements, such as the radiation receiver (PD), the pump radiation source (PL1)—for example in the form of a pump radiation (LB) radiating center (PZ)—, the compensation radiation source (PLK), the first filter (F1)—for example as a functional element of diffractive or digital optics/photonics—, the paramagnetic center (NV1)—for example as a G-center in silicon or V-center in SiC—, the transmission paths—for example as micro-integrated optical waveguides, a computer system (µC) and optionally further control devices, data bus interfaces, etc. Reference is made here to the application PCT/DE 2020/100 430, which is still unpublished at the time of this application.

Therefore, an integrated circuit (IC) for use with one or more paramagnetic centers (NV1) or a group or groups (NVC) of paramagnetic centers (NV1) in the material of a sensor element is also proposed herein. The integrated circuit (IC) preferably comprises a driver for driving a pump radiation source (PL1), preferably a radiation receiver (PD1), for detecting the fluorescence radiation (FL) of the one or more paramagnetic centers (NV1) and/or the group or groups (NVC) of paramagnetic centers (NV1), an evaluation circuit for generating a sensor output signal (out) which depends on the fluorescence radiation (FL) of the paramagnetic center (NV1) in the material of a sensor element, and preferably on the intensity ($I_{fl}$) of the fluorescence radiation (FL). Here, the sensor element is preferably a diamond crystal. The paramagnetic center(s) (NV1) or group(s) (NVC) of paramagnetic centers (NV1) are preferably an NV center(s) or one or more groups of NV centers in the diamond crystal or in a plurality of diamond crystals. The radiation receiver (PD) need not necessarily be part of the integrated circuit (IC). It may be located outside the integrated circuit.

Preferably, the sensor system and/or the housing of the sensor system comprises a magnetic circuit or parts of such a magnetic circuit, hereinafter also referred to as magnetic circuit elements.

For example, it may be useful to change the magnetic flux B to be measured in the vicinity of the paramagnetic center (NV1) by additional preferably soft magnetic circuit elements in order to change the sensitivity field of the sensor system and/or the quantum technological device with respect to external magnetic fields. In particular, it is possible to deform the sensitivity field so that preferred directions and/or a direction-dependent sensitivity can be obtained. For example, it is possible to achieve such a deformation by means of a means for deforming the magnetic field. Such a means for deforming the magnetic field can be, for example, ferromagnetic device parts which are brought into the vicinity of the paramagnetic centers (NV1) and/or the vicinity of groups (NVC) of such paramagnetic centers (NV1) and then deform the field lines of the magnetic flux B there. For example, it is conceivable to make a slot in a sheet of ferromagnetic material and to place the paramagnetic centers (NV1) or groups of paramagnetic centers (NV1) in the slot. The magnetic flux density B, when arranged perpendicular to the surface normal of the ferromagnetic sheet, is concentrated in the sheet and reduced in the slot so that the intensity ($I_{fl}$) of the fluorescence radiation (FL) of the paramagnetic centers (NV1) is little affected by the magnitude of the magnetic flux B. The magnetic flux density B, when arranged parallel to the surface normal of the ferromagnetic sheet and perpendicular to the direction of the slit, is concentrated in the sheet, and thus, at these orientations, but also concentrated in the slit, so that the intensity ($I_{fl}$) of the fluorescence radiation (FL) of the paramagnetic centers (NV1) is now very strongly influenced by the magnitude of the magnetic flux B. As a result, the dependence of the intensity ($I_{fl}$) of the fluorescence radiation (FL) on the magnitude of the magnetic flux density B now behaves anisotropically and thus then depends on the spatial direction.

Thus, a device for measuring a magnetic flux density B is described here which, firstly, comprises at least one of the other sensor systems described in this paper, which determine a value for the magnetic flux density b by means of detecting and evaluating parameters of the fluorescence radiation (FL) of one or more paramagnetic centers (NV1) and/or of one or more groups (NVC) of paramagnetic centers (NV1), and which, secondly, additionally comprises a ferromagnetic functional element which deforms the field profile of the magnetic flux density B in such a way that the measured value, which is determined by the device for measuring a magnetic flux density B with the aid of the said other sensor systems described in this paper as a function of the magnetic flux density B of this magnetic field deformed by means of the said ferromagnetic function element, depends on the direction of the flux density B acting from outside on the device for measuring a magnetic flux density B.

Dicke receivers are known from radio astronomy. More information can be found on the Internet under the keyword "Dicke receiver". At this point, reference is made to the paper U. Klein, "Radio astronomy:tools, applications and impacts; Course astro 841" Argelander Institute for Astronomy Bonn, 2011 edition. At the time of the international application, the publication can be found at the link:
  https://hera.ph1.uni-koeln.de/ftpspace/simonr/Pablo/Radioastronomy.pdf
Chapter 6.4.2 on page 82 ff. describes the basic construction of a Dicke receiver.

Such a Dicke amplifier is used for the detection of static, constant sources in highly noisy environments. The eliminable noise is the thermal 1/f noise in the measurement channel. In order to detect the source whose amplitude is below the noise level, switching is performed between the noisy input signal of the antenna and the noise signal of an equivalent noise source of the same temperature as the noise background of the received signal. This is done at a sufficiently high frequency. If, for example, the static signal of a stellar object is part of the received signal, this object signal can be raised above the noise background by multiplying the resulting signal with the switching signal.

This principle is now applied to the measurement of the paramagnetic centers (NV1), i.e. preferably the NV centers. A compensating radiation source (PLK), which is preferably designed as a light-emitting diode, called LED for short, or as a laser, serves as a comparative noise source. If properly designed, the noise level is also lowered here compared to the signal level. The compensation radiation (KS) of the compensation radiation source (PLK) has a compensation radiation wavelength ($\lambda_{ks}$).

According to the disclosure, it was thus realized that the fundamental problem of radio astronomy to detect a very small signal in front of a thermally noisy noise background is the same problem that occurs in quantum sensors. Irradiation with pump radiation (LB) leads to a massive reduction of the spin temperature of a paramagnetic center (NV1). In the present disclosure, sensor elements with a high density of paramagnetic centers (NV1), for example comprising HD-NV diamonds, are preferably used. This high density and low spin temperature make the noise of the fluorescence radiation (FL) of the sensing element itself practically disappear. This is not the case with other systems using isolated paramagnetic centers (NV1), e.g. single or few NV centers. Consequently, the system noise originates mainly from the pump radiation source (PL1), the radiation receiver (PD) or the first amplifier stages, which typically have the lowest signal-to-noise ratio. The noise of the pump radiation source (PL1) is thus imposed on the noise of the intensity ($I_{fl}$) of the fluorescence radiation (FL) of the paramagnetic center (NV1).

Unlike radio astronomy, fluorescence radiation (FL) can be modulated. Thus, it does not require the Dicke switch of radio astronomy. In the course of the elaboration of the disclosure, it was recognized that the system is preferably constructed in such a way that a pump radiation source (PL1) emits the pump radiation (LB), which is then directed to the sensor element with the paramagnetic center (NV1) or with a plurality of paramagnetic centers (NV1) with possibly at least locally high density of paramagnetic centers (NV1). A locally high density of paramagnetic centers may be achieved in a group (NVC) of paramagnetic centers having an extension d within the sensor element or within a substrate (D) within the sensor element. The paramagnetic center (NV1) or centers (Nv1) or the group or groups (NVC) of paramagnetic centers (NV1) then emit the fluorescence radiation (FL) as a function of the intensity ($I_{pmp}$) of the pump radiation (LB) and as a function of further physical parameters, for example the actual value of the magnetic flux density B or the electric flux density D or the pressure P or the temperature ϑ or the acceleration a or the gravitational field strength g or the rotational speed ω or time integrals or derivatives of these quantities or frequencies of the fluctuation of these quantities at the location of the respective paramagnetic center (NV1). For example, since the pump radiation (LB) is noisy in the case where a semiconductor laser is used as the pump radiation source (PL1) as a result of the relatively high temperature of the light-emitting PN junction in the laser of the pump radiation source (PL1), this modulation of the pump radiation (LB) with a pump noise signal component of the modulation of the intensity ($I_{pmp}$) of the pump radiation (LB) is also found as a fluorescence noise signal component of the fluorescence radiation (FL). Preferably, the temperature of the pump radiation source (PL1) is detected, for example, by a thermal sensor. A pump radiation source controller then preferably readjusts one of the drive parameters of the pump radiation source (PL1). The actual quantity of the pump radiation source controller is the temperature value determined by the thermal sensor for the temperature of the pump radiation source (PL1). The desired quantity is usually a temperature reference value. Preferably, the controller is a PID controller. The possible controllable drive parameters of the driver stage of the pump radiation source (PL1) are the pulse height, the pulse repetition frequency and the pulse duration.

Thus, it is apparent that it is convenient for the pump radiation source controller to intervene, if necessary, in the signal generator (G) which generates some of these variables. It is also conceivable to provide a heater or a cooling device and a heater, and to readjust the heater and/or the cooling so that the temperature of the pump radiation source remains constant to within a few mK.

It is now the idea according to the disclosure, as in a Dicke receiver, to compare the noisy signal of the intensity ($I_{fl}$) of the fluorescence radiation (FL) with a reference noise source by means of the same, better the identical subsequent signal path. The reference noise source is preferably made equal to the pump radiation source (PL1). In the following, this reference noise source is referred to as compensation radiation source (PLK).

If the compensation radiation source (PLK) is constructed in the same way as the pump radiation source (PL1), it will noise approximately in the same way at the same thermal and electrical operating point. However, compensation with a differently constructed compensating radiation source (PLK) is explicitly less preferred also possible. Preferably, the compensation radiation source (PLK) is selected such that the compensation radiation wavelength ($\lambda_{ks}$) of the compensation radiation (KS) of the compensation radiation source (PLK) is equal or similar to the pump radiation wavelength ($\lambda_{pmp}$) of the pump radiation (LB) of the pump radiation source (PL1). For example, if the pump radiation source (PL1) is green, as in the case of NV centers as paramagnetic centers (NV1), the compensation radiation source (PLK) is preferably also green. Alternatively, but not preferably, the compensation radiation wavelength ($\lambda_{ks}$) is selected so as not to be suitable for exciting the paramagnetic center(s) (NV1) in question or the group(s) (NVC) of paramagnetic centers (NV1). Thus, for this purpose, the compensating radiation wavelength ($\lambda_{ks}$) may be, for example, longer than the fluorescence radiation wavelength ($\lambda_{fl}$)—e.g. of 637 nm for NV centers—in order to reliably prevent such excitation of the fluorescence of the paramagnetic center (NV1) by compensating radiation (KS). In reality, optical attenuation of the compensating radiation (KS) prior to impingement on the radiation receiver (PD) will be necessary to match the intensity of the portion of the compensating radiation (KS) impinging on the radiation receiver (PD) to the intensity, of the portion of the fluorescence radiation (FL) hitting the radiation receiver (PD) for a selected optical operating point with respect to the intensity of the portion of the operating point intensity of the fluorescence radiation (FL) hitting the radiation receiver (PD) at this operating point. The pump radiation wavelength ($\lambda_{pmp}$) is usually chosen to be smaller than the fluorescence radiation wavelength ($\lambda_{fl}$)—e.g. 637 nm for NV centers. This is done, for example, by the pump radiation source (PL1) of the pump radiation (LB) preferably being a green, blue or ultraviolet LED or a corresponding laser. Preferably, the pump radiation wavelength ($\lambda_{pmp}$) is 532 nm as described in the case of NV centers as paramagnetic centers. A laser having a pump radiation wavelength ($\lambda_{pmp}$) of 520 nm as a pump radiation source (PL1) is also described herein. By this, a paramagnetic center (NV1), which is preferably a NV center in diamond, can be excited to a higher energy level. The absorption characteristics of the paramagnetic center(s) (NV1) or group(s) (NVC) of paramagnetic centers (NV1) must be considered.

For example, if we assume that the one or more paramagnetic centers (NV1) are NV centers in diamond, two green lasers with, for example, preferably 532 nm or 520 nm pump radiation wavelength ($\lambda_{pmp}$) may be used. A first laser is then used, for example, as a pump radiation source (PL1). For example, this pump radiation source (PL1) in the form of the first laser may also be a first laser diode of the company Osram of the type PLT5 520B with 520 nm pump radiation wavelength ($\lambda_{pmp}$), which is commercially available. A second laser is then used, for example, as a compensating radiation source (PLK). For example, this compensating radiation source (PLK) in the form of the second laser may also be a second laser diode from Osram of the type PLT5 520B with 520 nm pump radiation wavelength ($\lambda_{pmp}$), which is commercially available.

If only a portion of the light output of the first laser corresponding to the intensity ($I_{pmp}$) of the pump radiation (LB) is converted into intensity ($I_{fl}$) of the fluorescence radiation (FL), it is strongly recommended to reduce the luminous intensity ($I_{ks}$) of the compensation radiation (KS) of the compensation radiation source (PLK). This can be done electrically or, better, optically by means of an absorption filter, for example an aperture or a grey wedge.

In the radiation receiver (PL1), the compensation radiation (KS) and the fluorescence radiation (FL) are then superimposed in an approximately linear summation.

The Dicke switch for switching between the noisy signal and the reference noise source, which is switched over with a so-called chopper signal, is now implemented in such a way that instead the pump radiation source (PL1) is switched on and off with a transmission signal (S5) as chopper signal and the compensation radiation source (PLK) is switched on in a complementary manner with a compensation transmission signal (S7) complementary to the transmission signal (S5). In the simplest case, the compensation radiation source (PLK) is thus always switched on when the pump radiation source (PL1) is switched off and vice versa. Through this, as in the case of the Dicke receiver, switching is performed between the noisy fluorescence signal of the intensity ($I_{fl}$) of the fluorescence radiation (FL) and the reference noise signal in the form of the intensity ($I_{ks}$) of the compensation radiation (KS) of the compensation radiation source (PLK).

It is conceivable to use deviating radiation sources as compensating radiation sources (PLK). This can also have cost reasons. It is conceivable to use light-emitting diodes, hereinafter also referred to as LEDs, instead of lasers for the pump radiation source (PL1) and the compensation radiation source (PLK). It is conceivable that the compensation radiation source (PLK) has a center of gravity wavelength as the compensation radiation wavelength ($\lambda_{ks}$) in the spectrum of its radiation, which is not suitable for exciting the fluorescence radiation (FL) of the paramagnetic centers (NV1). For example, the compensating radiation source (PLK) may be an infrared LED. In the case of one or more NV centers as paramagnetic centers (NV1), the compensation radiation wavelength ($\lambda_{ks}$) is then selected to be in the infrared region. As a result, the compensating radiation (KS) cannot excite the fluorescence radiation (FL) of the NV center(s) or the group(s) (NVC) of NV centers and thus cannot generate fluorescence radiation (FL) of the NV center(s) or the group(s) (NVC) of NV centers.

The transmission signal (S5) is modulated. The instantaneous intensity ($I_{pmp}$) of the pump radiation (LB) emitted by the pump radiation source (PL1) typically depends on the value of the transmission signal (S5).

This can be described by the following equation I:

$$i1 = h0'hRa' + h1*s5w + h1*s5g + hRb*s5w + hRb*s5g$$

i1 stands here for the instantaneous value of the intensity ($I_{pmp}$) of the pump radiation (LB) emitted into the first transmission path (I1) by the pump radiation source (PL1). hRa' represents the noise of the pump radiation source (PL1) at the operating point, which is independent of the value of the transmission signal (S5) and thus independent of the value of the alternating component (S5w) of the transmission signal (S5) and independent of the value of the DC component (S5g) of the transmission signal (S5). hRb represents the noise of the pump radiation source (PL1), which is dependent on the value of the transmission signal (S5) and thus dependent on the value of the alternating component (S5w) of the transmission signal (S5) and dependent on the value of the DC component (S5g) of the transmission signal (S5). h0' is an offset value for the value of the intensity (I) of the pump radiation (LB) emitted into the first transmission path (I1) by the pump radiation source (PL1), which intensity ($I_{pmp}$) is independent of the value of the transmission signal (S5) at the operating point and thus independent of the value of the alternating component (S5w) of the transmission signal (S5) and independent of the value of the direct component (S5g) of the transmission signal (S5). h1 is a proportionality factor for the value of the intensity ($I_{pmp}$) of the pump radiation (LB) emitted into the first transmission path (I1) by the pump radiation source (PL1), which is dependent at the operating point on the value of the transmission signal (S5) and thus dependent on the value of the alternating component (S5w) of the transmission signal (S5) and dependent on the value of the DC component (S5g) of the transmission signal (S5). In the following, we assume that the value (s5) of the transmission signal (S5) thus comprises a constant direct component value (s5g) of the transmission signal (S5) and a transmission signal alternating component value (s5w). The following equation describes this:

$$s5=s5g+s5w$$

This gives us:

$$i1=h0'hRa4h1+hRb+h1*s5g+h1*s5w+hRb*s5w+hRb*s5g$$

We summarize the constant terms h0'+h1+h1*s5g=h0 and hRa'+hRb+hRb*s5g=hRa and obtain:

$$i1=h0+hRa+h1*s5w+hRb*s5w$$

A first portion a1 of this pump radiation (LB) hits the sensor element and the paramagnetic centers (NV1) contained therein. The paramagnetic centers (NV1) convert a second portion a2 of this pump radiation (LB) into fluorescence radiation (FL) with an intensity ifl, which reaches a first optical filter (F1). After interaction with the sensor element, the intensity id of the pump radiation (LB) is reduced to a third fraction a3 which reaches the first optical filter (F1).

The intensity ifi of the radiation in the first transmission path (I1) reaching the first optical filter (F1) is then described in equation II below:

$$ifi=a2*a1*(h0+hRa+h1*s5w+hRb*s5w)+a3*a1*(h0+hRa+h1*s5w+hRb*s5w)$$

For simplicity, we assume here an ideal optical transmission of the fluorescence radiation (FL) through the first optical filter (F1) and an ideal blocking of the optical transmission of the pump radiation (LB) through the first optical filter (F1). The intensity ift of the radiation in the first transmission path (I1) passing the first optical filter (F1) is then described in the following equation III:

$$ift=a2*a1*(h0+hRa+h1*s5w+hRb*s5w)$$

In the ideal case, therefore, only fluorescence radiation (FL) reaches the radiation receiver (PD). This is an approximation that comes close to reality. The intensity ifd of the fluorescence radiation (FL) reaching the radiation receiver (PD) is reduced once again to a fourth fraction a4. This describes equation IV:

$$ifd=a4*a2*a1*(h0+hRa+h1*s5w+hRb*s5w)$$

At the same time, only a fifth portion a5 of the intensity ($I_{ks}$) of the compensation radiation (KS) emitted by the compensation radiation source (PLK) reaches the radiation receiver (PD). This radiation intensity i2 in the second transmission path (I2) depends on the value of the compensation transmission signal (S7). The following equation V describes the radiation intensity i2 emitted by the compensation radiation source (PLK).

$$i2=k0+kRa+k1*s7w+kRb*s7w$$

Here, k0 stands for an offset constant. k1 stands for a proportionality factor. kRa stands for a noise component that is independent of the alternating component s7w of the compensation transmission signal (S7). s7w stands for the value of the alternating component of the compensation transmission signal (S7). While we explicitly assume here in this paper that the noise of the compensation radiation source (PLK) is similar to that of the pump radiation source (PL1), we first take a potential dissimilarity for clarification, since similarity is a stretchable term Equation VI then describes the fraction ik of the intensity ($I_{ks}$) of the compensating radiation (KS) that reaches the radiation receiver (PD).

$$ik=a5*(k0+kRa+k1*s7w+kRb*s7w)$$

The intensity of the total radiation ig reaching the radiation receiver (PD) is now calculated according to equation VII:

$$Ig=ik+ifd=a5*(k0+kRa+k1*s7w+kRb*s7w)+a4*a2*a1*(h0+hRa+h1*s5w+hRb*s5w)$$

The radiation receiver (PD) now generates a receiver output signal (S0) as a function of the intensity ig of the total radiation reaching it. Equation VIII describes this:

$$s0=d0+dRs+d1*ig+dRb*ig$$

Where s0 represents the value of the receiver output signal (S0). d0 represents an offset constant. d1 represents a proportionality factor. dRa represents a noise of the radiation receiver (PD) that does not depend on the value of the total intensity ig of the radiation hitting the radiation receiver (PD). dRb represents a noise of the radiation receiver (PD) that depends on the value of the total intensity ig of the radiation hitting the radiation receiver (PD). Substitution yields equation IX:

$$S0=d0+dRa+d1*a5*(k0+kRa+k1*s7w+kRb*s7w)+d1*a4*a2*a1*(h0+hRa+h1*s5w+hRb*s5w)+dRb*a5*(k0+kRa+k1*s7+kRb*s7w)+dRb*a4*a2*a1*(h0+hRa+h1*s5w+hRb*s5w)$$

We require that the alternating component (s5w) of the transmission signal (S5) has, at least some of the time, a transmission signal period ($T_p$) with a transmission signal period duration ($T_p$), where the integral of the value of the alternating component (s5w) of the value (s5) of the transmission signal (S5) vanishes over this transmission signal period duration ($T_p$). We express this in equation X:

$$\int_0^{T_p} s5w\, dt = 0$$

This periodicity condition will become very important later. We now multiply the value (s5w) of the alternating component (S5$w$) of the transmission signal (S5) by the value (s0) of the receiver output signal (S0) and obtain the value (s3) of the filter input signal (S3). In the sensor system, a first multiplier (M1) preferably performs this multiplication of the value (s0) of the receiver output signal (S0) by the value (s5$w$) of the alternating component (S5$w$) of the transmission signal (S5) to the value (s3) of the filter input signal (S3). This value (s3) of the filter input signal (S3) is described by equation XI:

$$s3=[d0+dRa+d1*a5*(k0+kRa+k1*s7w+kRb*s7w)+\\d1*a4*a2*a1*(h0+hRa+h1*s5w+hRb*s5w)+\\dRb*a5*(k0+kRa+k1*s7w+kRb*s7w)+\\dRb*a4*a2*a1*(h0+hRa+h1*s5w+hRb*s5w)]\\*s5w$$

Multiplying out equation XI gives equation XII:

$$s3=d0*s5w+dRa*s5w+d1*A5*k0*s5w+\\d1*A5*kRa*s5w+d1*A5*k1*s7w*s5w+\\d1*A5*kRb*s7w*s5w+d1*A4*A2*A1*h0*s5w+\\d1*A4*A2*A1*hRa*s5w+\\d1*A4*A2*A1*h1*s5w*s5w+\\d1*A4*A2*A1*hRb*s5w*s5w+\\A5*k0*dRb*s5w+A5*dRb*kRa*s5w+\\A5*k1*dRb*s7w*s5w+A5*dRb*kRb*s7w*s5w+\\dRb*A4*A2*A1*h0*s5w+\\dRb*A4*A2*A1*hRa*s5w+\\dRb*A4*A2*A1*h1*s5w*s5w+\\dRb*A4*A2*A1*hRb*s5w*s5w$$

We now use a linear filter with the filter function F[X1]. Let X1 and X1 be the two values of any two signals. Let x be any real factor. A filter with the filter function F[X1] is a linear filter for the purposes of this disclosure if (Equation XIII) holds:

$$F[X1+X2]=F[X1]+F[X2]$$

$$F[x*X1]=x*F[X1]$$

We now use a loop filter (TP), which is supposed to be a linear filter with filter function F[s3], to filter the filter input signal (S3) to the filter output signal (S4), so the value (s3) of the filter input signal (S3) is supposed to be the variable of the filter function F[s3].

The structure of the loop filter (TP) is chosen such that at least approximately holds (Equations XIVa to XIVc):

$$F[s5w]=0$$

$$F[s5w*s5w]=1$$

$$F[1]=1$$

These conditions typically describe a low-pass filter. We will discuss this structure in more detail later. We assume here that equations XIVa to XIVc apply to the loop filter (TP).

For the value (s4) of the filter output signal (S4) of the loop filter (TP), we then find with a positive gain v of the loop filter (TP9 or an amplifier following the loop filter (TP) (Equation XV):

$$s4=v*d0*F[s5w]+v*F[dRa*s5w]+v*d1*a5*k0*F\\{[s5w]+v*d1*a5*F[kRa*s5w]+v*d1*a5*k1*F\\[s7w*s5w]+v*d1*a5*F[kRb*s7w*s5w]+\\v*d1*a4*a2*a1*h0*F[s5w]+v*d1*a4*a2*a1*F\\[hRa*s5w]+v*d1*a4*a2*a1*h1*F[s5w*s5w]+\\v*d1*a4*a2*a1*F[hRb*s5w*s5w]+v*a5*k0*F\\[dRb*s5w]+v*a5*F[dRb*kRa*s5w]+v*a5*k1*F\\[dRb*s7w*s5w]+v*a5*F[dRb*kRb*s7w*s5w]+\\v*a4*a2*a1*h0*F[dRb*s5w]+v*a4*a2*a1*F\\[dRb*hRa*s5w]+v*a4*a2*a1*h1*F\\[dRb*s5w*s5w]+v*a4*a2*a1*F\\[dRb*hRb*s5w*s5w]}$$

We assume that the multiplication of two noise terms can be neglected and apply Equations XIV (Equation XVI):

$$s4=+v*F[dRa*s5w]+v*d1*a5*F[kRa*s5w]+\\v*d1*a5*k1*F[s7w*s5w]+v*d1*a5*F\\[kRb*s7w*s5w]+v*d1*a4*a2*a1*F[hRa*s5w]+\\v*d1*a4*a2*a1*h1+v*d1*a4*a2*a1*F\\[hRb*s5w*s5w]+v*a5*k0*F[dRb*s5w]+\\v*a5*k1*F[dRb*s7w*s5w]+v*a4*a2*a1*h0*F\\[dRb*s5w]+v*a4*a2*a1*h1*F[dRb*s5w*s5w]$$

We now multiply the value (s4) of the filter output signal (S4) by the value (s5$c$) of the complementary transmission signal (S5$c$) by means of multiplication. Here, let s5$c$=1−S5$w$ hold, where we assume that the maximum value of the value (s5$w$) of the alternating component (S5$w$) of the transmission signal (S5) has an exemplary simplifying magnitude of 1. We further provide the value (s6) of the feedback signal (S6) thus obtained with an offset (b0) to obtain the value (s7) of the compensation transmission signal (S7). The prerequisite is that the L2 norm F[s5$w$*s5$w$]=1 applies:

$$s7=[(1-s5w)*s4+b0]$$

For simplicity, we have assumed here that for the amplitude (s5$w_A$) of the time-value response of the alternating component (S5$w$) of the transmission signal (S5), s5$w_A$=1. Otherwise F[s5$w$*s5$w$]=s5$w_A^2$ would have to be used here.

In our sensor system, a second multiplier (M2) is used for the multiplication. The second multiplier (M2) preferably multiplies the value (s4) of the filter output signal (S4) with the value (s5$c$) of the complementary transmission signal (S5$c$).

Insertion results in:

$$s4=+v*F[dRa*s5w]+v*d1*a5*F[kRa*s5w]+\\v*d1*a5*k1*F[(1-s5w)*s4+b0)*S5]+v*d1*a5*F\\[kRb*((1-s5w)*s4+b0)*s5w]+v*d1*a4*a2*a1*F\\[hRa*s5w]+v*d1*a4*a2*a1*h1+\\v*d1*a4*a2*a1*F[hRb*s5w*s5w]+v*a5*k0*F\\[dRb*s5w]+v*a5*k1*F[dRb*((1-s5w)*s4+b0)\\*s5w]+v*a4*a2*a1*h0*F[dRb*s5w]+\\v*a4*a2*a1*h1*F[dRb*s5w*s5w]$$

Dissolving the parentheses and applying the filter properties of the filter function F[ ] yields:

$$s4=+v*F[dRa*s5w]+v*d1*a5*F[kRa*s5w]+\\v*d1*a5*k1*F[s4*s5w]-v*d1*a5*k1*F\\[S4*s5w*s5w]+v*d1*a5*k1*b0*F[s5w]+\\v*d1*a5*F[kRb*S4*s5w]-v*d1*a5*F\\[kRb*s4*s5w*s5w]+v*d1*a5*F[b0*kRb*s5w]+\\v*d1*a4*a2*a1*F[hRa*s5w]+\\v*d1*a4*a2*a1*h1+v*d1*a4*a2*a1*F\\[hRb*s5w*s5w]+v*a5*k0*F[dRb*s5w]+\\v*a5*k1*F[dRb*s4*s5w]-v*a5*k1*F\\[dRb*s4*s5w*s5w]+v*a5*k1*b0*F[dRb*s5w]+\\v*a4*a2*a1*h0*F[dRb*s5w]+\\v*a4*a2*a1*h1*F[dRb*s5w*s5w]$$

Furthermore, we assume the value (s4) of the filter output signal (S4) to be almost constant in the steady state and can therefore then treat the factor s4 as a constant. We also use F[s5$w$]=0 and F[s5$w$*s5$w$]=1 where we simplifying assume s5$w_A$=1 for the amplitude s5$w_A$ of the alternating component s5$w$ of the transmission signal (S5).

$$s4=+v*F[dRa*s5w]+v*d1*a5*F[kRa*s5w]-\\v*d1*a5*k1*s4+v*d1*a5*s4*F[kRb*s5w]-\\v*d1*a5*s4*F[kRb*s5w*s5w]+v*d1*a5*b0*F\\[kRb*s5w]+v*d1*a4*a2*a1*F[hRa*s5w]+\\v*d1*a4*a2*a1*h1+v*d1*a4*a2*a1*F\\[hRb*s5w*s5w]+v*a5*k0*F[dRb*s5w]+\\v*a5*k1*s4*F[dRb*s5w]-v*a5*k1*S4*F\\[dRb*s5w*s5w]+v*a5*k1*b0*F[dRb*s5w]+\\v*a4*a2*a1*h0*F[dRb*s5w]+\\v*a4*a2*a1*h1*F[dRb*s5w*s5w]$$

We assume that the constant signal component of the product s5w*s5w carries through in the loop filter (TP) and, based on this assumption, use the equations that then apply F[kRb*s5w*s5w]=F[kRb], F[dRb*s5w*s5w]=F[dRb] and F[hRb*s5w*s5w]=F[hRb]:

$$s4=+v*F[dRa*s5w]+v*d1*a5*F[kRa*s5w]-\\v*d1*a5*k1*s4+v*d1*a5*s4*F[kRb*s5w]-\\v*d1*a5*s4*F[kRb]+v*d1*a5*b0*F[kRb*s5w]+\\v*d1*a4*a2*a1*F[hRa*s5w]+\\v*d1*a4*a2*a1*h1+v*d1*a4*a2*a1*F[hRb]+\\v*a5*k0*F[dRb*s5w]+v*a5*k1*s4*F\\{[dRb*s5w]-v*a5*k1*s4*F[dRb]+v*a5*k1*b0*F\\{[dRb*s5w]+v*a4*a2*a1*h0*F[dRb*s5w]\\v*a4*a2*a1*h1*F[dRb]$$

This is equivalent to:

$$s4(1+v*d1*a5*k1-v*d1*a5*F[kRb*s5w]-v*a5*k1*F\\{[dRb*s5w]+v*a5*k1*F[dRb]+v*d1*a5*F[kRb])\\=+v*F[dRa*s5w]+v*d1*a5*F[kRa*s5w]+\\v*d1*a5*B0*F[kRb*s5w]+v*d1*a4*a2*a1*F\\{[hRa*s5w]+v*d1*a4*a2*a1*h1+\\v*d1*a4*a2*a1*F[hRb]+v*a5*k0*F[dRb*s5w]+\\v*a5*k1*b0*F[dRb*s5w]+v*a4*a2*a1*h0*F\\{[dRb*s5w]+v*a4*a2*a1*h1*F[dRb]$$

This is equivalent to:

$$s4(1/(v*d1*a5*\{k1-F[kRb*s5w]-k1/d1*F\\{[dRb*s5w]+k1/d1*F[dRb]+F[kRb]\})+1)=+F\\{[dRa*s5w]/(d1*a5)*1/\{k1-F[kRb*s5w]-k1/d1*F\\{[dRb*s5w]+k1/d1*F\,[dRb]+F[kRb]\}+F\\{[kRa*s5w]/\{k1-F[kRb*s5w]-k1/d1*F\\{[dRb*s5w]+k1/d1*F[dRb]+F[kRb]\}+b0*F\\{[kRb*s5w]/\{k1-F[kRb*s5w]-k1/d1*F\\{[dRb*s5w]+k1/d1*F[dRb]+F[kRb]\}+(a4*a2*a1/\\a5)*F[hRa*s5w]/\{k1-F[kRb*s5w]-k1/d1*F\\{[dRb*s5w]+k1/d1*F[dRb]+F[kRb]\}+(a4*a2*a1/\\a5)*h1/\{k1-F[kRb*s5w]-k1/d1*F[dRb*s5w]+\\k1/d1*F[dRb]+F[kRb]\}+(a4*a2*a1/a5)*F[hRb]/\\\{k1-F[kRb*s5w]-k1/d1*F[dRb*s5w]+k1/d1*F\\{[dRb]+F[kRb]\}+k0/d1*F[dRb*s5w]/\{k1-F\\{[kRb*s5w]-k1/d1*F[dRb*s5w]+k1/d1*F[dRb]+F\\{[kRb]\}+k1/d1*B0*F[dRb*s5w]/\{k1-F\\{[kRb*s5w]-k1/d1*F[dRb*s5w]+k1/d1*F[dRb]+F\\{[kRb]\}+(a4*a2*a1/a5)*h0/d1*F[dRb*s5w]/\{k1-\\F[kRb*s5w]-k1/d1*F[dRb*s5w]+k1/d1*F[dRb]+\\F[kRb]\}+(a4*a2*a1/a5)*h1/d1*F[dRb]/\{k1-F\\{[kRb*s5w]-k1/d1*F[dRb*s5w]+k-/1*F[dRb]+F\\{[kRb]\}$$

For large gain v of the loop filter (TP) or an amplifier following it, if any, and large input gain d1 of the radiation receiver (PD) or the first amplifier following it (V1) and large gain k1 of the driver of the compensating radiation source (PLK), we obtain:

$$s4=+F[dRa*s5w]/(k1*d1*a5)+F[kRa*s5w]/k1+b0*F\\{[kRb*s5w]/k1+(a4*a2*a1/a5)*F[hRa*s5w]/k1+\\(a4*a2*a1/a5)*h1/k1+(a4*a2*a1/a5)*F[hRb]/\\k1+k0/d1*F[dRb*s5w]/k1+k1/d1*b0*F\\{[dRb*s5w]/k1+(a4*a2*a1/a5)*h0/d1*F\\{[dRb*s5w]/k1+(A4*A2*A1/A5)*h1/d1*F[dRb]/\\k1$$

For the case of an identical compensating radiation source (PLK) and pump radiation source (PL1) we obtain with kRa=hRa and kRb=hRb and h1=k1 and h0=k0 and with the choice b0=−(a4*a2*a1/a5):

$$s4=+(a4*a2*a1/a5)+1/(k1*d1)*1/a5*F[dRa*s5w]+\\(1+a4*a2*a1/a5)/k1*F[hRa*s5w]+(1+\\a4*a2*a1/a5)*h0/(d1*k1)*F[dRb*s5w]+\\(a4*a2*a1/a5)/d1*(F[dRb]-F[dRb*s5w])$$

Thus, for large gain v and large input gain d1 and large gain k1 and h1=k1 we obtain:

$$s4=(a4*a2*a1/a5)$$

The device is thus able to push the noise level to a minimum, in contrast to the measurement systems for the fluorescence radiation (FL) of paramagnetic centers (NV1) used in the prior art. THIS IS A SIGNIFICANT DIFFERENCE FROM THE PRIOR ART. As shown in the introduction, this is not the case with the combination of multiplier and simple low-pass as loop filter (TP) without feedback. The use of a reference noise source in the form of a compensating radiation source (PLK) and the additional amplifiers significantly improve the noise performance.

From the equation s4=(a4*a2*a1/a5) it follows that the value (s4) of the filter output signal (S4) can be used as a measure of the reciprocal of the fifth component a5 of the intensity ($I_{ks}$) of the compensating radiation (KS) emitted by the compensating radiation source (PLK) and reaching the radiation receiver (PD) when the components a4, a2 and a1 are kept constant. Furthermore, the value (s4) of the filter output signal (S4) can be used as a measure of the second fraction a2 of the pump radiation (LB) that the paramagnetic centers (NV1) convert into fluorescence radiation (FL) with an intensity ifl ($I_{fl}$) when the fractions a1, a4 and a5 are kept constant. Moreover, the value (s4) of the filter output signal (S4) may be used as a measure of the first fraction a1 of the pump radiation (LB) hitting the sensing element and the paramagnetic centers (NV1) therein when the fractions a4, a2 and a5 are kept constant. Finally, the value (s4) of the filter output signal (S4) can be used as a measure of the fourth component a4 describing the intensity component ifl of the fluorescence radiation (FL) reaching the radiation receiver (PD) when the components a1, a2 and a5 are kept constant.

Typically, the second component a2 is of particular interest since, for example, in the case of using an NV center in diamond as a paramagnetic center (NV1), it depends on the magnetic flux density B at the location of the paramagnetic center (NV1) or another physical parameter. Thus, the instantaneous value (s4) of the filter output signal (S4) is then a measure of the instantaneous value of the magnetic flux density B at the location of the paramagnetic center (NV1) or another parameter affecting the fluorescence radiation (FL) when the components a1, a4 and a5 are kept constant. Thus, the filter output signal (S4) may possibly already be used as the sensor output signal (out) of the sensor system. The value of the sensor output signal (out) is then a measure of the intensity ($I_{fl}$) of the fluorescence radiation (FL) of the one or more paramagnetic centers (NV1) or the group or groups (NVC) of paramagnetic centers (NV1), and thus a measure of the value of the physical parameters at the location of the one or more paramagnetic centers (NV1) or the group or groups (NVC) of paramagnetic centers (NV1). These physical parameters can be the magnetic flux density B, the electric flux density D, the pressure, the temperature, the irradiation intensity with ionizing radiation, the acceleration a, a motion velocity v, the gravitational field strength g, the rotational velocity ω etc. and their temporal integrals and temporal derivatives and spatial gradients etc. and further quantities derived from these.

Thus, for noise suppression, a second large gain k1 is required upstream of the compensating radiation source (PLK) or in the compensating radiation source (PLK) and a gain d1 is required between the radiation receiver (PD) and the multiplier (M1) in a first amplifier (V1) or in the radiation receiver (PD), which amplifies the receiver output signal (S0) to the reduced receiver output signal (S1) and which may be part of the radiation receiver (PD).

In contrast to the prior art, it is thus not only required that the output of the loop filter (TP) shows a large gain v, but also that the driver of the compensating radiation source (PLK), for example a second matching circuit (OF2), also shows a large gain k1. Only their combination reliably suppresses both the noise of the pump radiation source (PL1) and the noise of the compensating radiation source (OLK), which in itself is very surprising and is not described anywhere in the prior art.

Only when the factors k1, d1 and v are large, the noise is fully suppressed. Incidentally, the gain h1 of the driver of the pump radiation source (PL1), for example a first matching circuit (OF1) should be approximately equal to the gain k1 of the second matching circuit (OF2). This can be easily achieved in integrated circuits by a so-called "matching" design of the drivers of the compensating radiation source (PLK) and the driver of the pump radiation source (PL1). Reference is made here to the relevant literature, for example for information to WO 2001 073 617 A2, on the design of mating circuits in integrated circuits.

The noise-optimized sensor system thus comprises a radiation receiver (PD) and a controller (M1, TP, M2, OF). In this preferred example, the radiation receiver (PD) then generates a receiver output signal (S0) that is typically substantially derived from the sum of the intensities of the overlapping compensation radiation (KS) of the compensation radiation source (PLK) and the fluorescence radiation (FL) of the one or more paramagnetic centers (NV1) or of the group or groups (NVC) of paramagnetic centers (NV1) as well as a signal component, for example the alternating component (S5w) of the transmission signal (S5) or a signal derived therefrom, which is typically advantageous.

The sensor system is preferably designed in such a way that the compensating radiation (KS) of one of the compensating radiation sources (PLK) irradiates the radiation receiver (PD) in a summing manner superimposed on the fluorescence radiation (FL), so that the total irradiation intensity of the radiation receiver (PD), on which the receiver output signal (S0) depends, is preferably at least partially composed of the sum of the intensity ($I_{fl}$) of the fluorescence radiation (FL) and the intensity ($I_{ks}$) of the compensation radiation (KS). Again, this can be ensured by means of third means, which are typically optical functional elements, optically coupling said compensating radiation source (PLK) to said radiation receiver (PD). Such optical functional elements used as third means may be, for example, optical waveguides, reflectors, lenses, prisms, free air paths, vacuum paths, apertures, mirrors, beam sections, gratings, etc., optically coupling said compensating radiation source (PL1) to said radiation receiver (PD). Preferably, these third means are also housing parts. For example, they may again be reflectors or diffusers incorporated in the inner surface of a housing cover (DE) of an open-cavity housing (German: nach oben offenes Gehäuse für mikrotechnische Geräte).

In our example, the controller (M1, TP, S&H, M2, OF) consists of the first multiplier (M1), the loop filter (TP), the hold circuit (S&H), the second multiplier (M2) and an offset circuit (OF) which adds the constant B0 to the output signal of the second multiplier (M2), the control signal (S6). The first multiplier (M1) multiplies the receiver output signal (S0) by the transmission signal (S5) to form the filter input signal (S3). The loop filter (TP) filters the filter input signal (S3) with a filter function (F[S3]). A holding circuit (S&H) preferably samples the output of the loop filter (TP) in phase synchronism with the transmission signal period ($T_p$) to produce the filter output signal (S4). The sampling is preferably performed at such times that the condition F[S5]=0 is fulfilled at these sampling times.

It has been found that sampling the filter output signal (S4), in particular by means of the said holding circuit (S&H), while determining a sequence of samples, and using the sequence of samples as the sensor output signal (out) are particularly advantageous, since this method is capable of almost completely removing the traces of the chopper signal in the form of the transmission signal (S5) in the spectrum of the sensor output signal (out).

The holding circuit (S&H) passes this sample on as a filter output signal (S4) to the second multiplier (M2). The second multiplier (M2) multiplies the filter output signal (S4) by the complementary transmission signal (1-S5) to the feedback signal (S6). The offset circuit (OF) adds a constant B0 to the feedback signal (S6) to form the compensation transmission signal (S7). In some applications, the feedback signal (S6) is used directly as the compensation transmission signal (S7).

The controller (M1, TP, S&H, M2, OF), then generates a compensation transmission signal (S7) depending on the receiver output signal (S0). The compensation radiation source (PLK), which is for example an infrared LED or a "green" LED or a "green" laser, generates the compensation radiation (KS) in dependence on the compensation transmission signal (S7). The controller (M1, TP, M2, OF) preferably generates the compensation transmission signal (S7) in dependence on the transmission signal (S5) in such a way that the receiver output signal (S0), apart from control errors and system noise and possibly a constant DC component, preferably has substantially no signal components of the transmission signal (S5) any more. This can be done, for example, in such a way that the controller comprises a first multiplier (M1), a loop filter (TP), in particular implemented as a low-pass filter, and a second multiplier (M2). The first multiplier (M1) multiplies the receiver output signal (S0) or a signal derived therefrom, e.g. a filtered or amplified signal or a signal supplemented by further signal components (e.g. S1), with the transmission signal (S5) or a signal derived therefrom (e.g. S5') to form a filter input signal (S3). In principle, a scalar product is formed here between the transmission signal (S5) and the receiver output signal (S0) or the respective derived signals. The result of this scalar product formation is the filter output signal (S4). It has been recognized in the elaboration of the disclosure that a low-pass filter as a loop filter (TP) can realize only an indefinite integral. Therefore, with a low-pass filter as a loop filter (TP), compliance with Equation X and Equations XIVa to XIVc is not possible. If the transmission signal (S5) has a transmission signal period ($T_p$) for which equation X holds, then an integration of the transmission signal (S5) that stops at times t with $0 < t < T_p$ results in a value F[S5]≠0. This is then noticeable in the energy spectrum of the filter output signal (S4) and thus in that of the sensor output signal (out) with a massive penetration of the chopper frequency, i.e. the frequency of the transmission signal (S5) on the filter output signal (S4) or the sensor output signal (out).

In order to have the first loop filter (TP) perform a specific integration instead of an indefinite integration without integration limits, it is therefore useful if, after the loop filter (TP), which is preferably a low-pass filter, a hold circuit (S&H) is provided or a functionally equivalent sub-device (in the case of digital implementation, for example, a latch or a register, etc.) is provided, which can be used to store the filter output signal (S4) in the case of a periodic transmission signal (S5) at the respective transmission signal period end of the transmission signal period ($T_p$) of the transmission signal (S5), that is to say at the time $T_p$, and passes on only this value to the second multiplier (M2) until the next transmission signal period end of the transmission signal (S5) at t=Tp. Here, arbitrarily t at the beginning of the transmission signal period ($T_p$) of the transmission signal (S5) is assumed to be t=0 for simplicity. This holding circuit (S&H) is absolutely necessary in practice for a very good resolution. It represents a further difference to the state of the art. The authors of this paper are not aware of any prior art evaluation of the intensity ($I_{fl}$) of a fluorescence radiation (FL) that employs a holding circuit (S&H) to suppress the frequency of the transmission signal (S5) in the filter output signal (S4).

The loop filter (TP), which is for example a low-pass filter, filters the filter input signal (S3) to the filter output signal (S4). The second multiplier (M2) multiplies the value (s4) of the filter output signal (S4) by the value (s5c) of the preferably complementary transmission signal (S5c). The complementary transmission signal (S5c) is preferably formed according to the formula s5c=s5g−s5w or according to the formula s5c=s5w−s5$w_A$. Here, s5$w_A$—stands for value of the amplitude of the alternating component (S5w) of the transmission signal (S5). The second multiplier (M2) thus forms the feedback signal (S6) and/or directly the compensation transmission signal (S7). If necessary, a second matching circuit (OF2), which may be part of the second multiplier (M2), adds an offset B0 as a constant value to the feedback signal (S6) and thus forms the compensation transmission signal (S7). Provided that further circuit parts such as said hold circuit (S&H) (sample & hold circuit) are inserted between the filter output signal (S4) and the input of the second multiplier (M2), the claims are to be understood as expressly including such constructions. Provided that the feedback signal (S6) is used, a second matching circuit (OF2) forms the compensation transmission signal (S7) from the feedback signal (S6). The filter output signal (S4) is then typically used as the sensor output signal (out). Its value is a measure of the intensity ($I_{fl}$) of the fluorescence radiation (FL) and thus a measure of the physical quantity to be detected, for example the magnetic flux density B at the location of the paramagnetic center (NV1) or another physical quantity which influences the fluorescence radiation (FL) of the paramagnetic center (NV11).

Dicke Quantum Measurement System

Thus, a quantum sensor system for detecting a relative value of a physical parameter with a sensor element and with evaluation means (G, PD, V1, M1, TP) is proposed here. The sensor element comprises as a quantum dot a paramagnetic center (NV1) influenced by the physical parameter, or a plurality of paramagnetic centers (NV1) influenced by the physical parameter, or a group (NVC) of paramagnetic centers (NV1) influenced by the physical parameter, or a plurality of groups (NVC) of paramagnetic centers (NV1) influenced by the physical parameter. As before, the quantum dot is irradiated with pump radiation (LB) with pump radiation wavelength ($\lambda_{pmp}$). Basically, two methods of evaluation open up.

In the first method, evaluation means (V1) detect a first photocurrent of the quantum dot of the sensing element. This can be done, for example, by a quantum bit construction according to FIGS. 78, 79 and 81. The evaluation means then generate a receiver output signal (S0) depending on the value of this first photocurrent.

In the second method, evaluation means (PD) detect a fluorescence radiation (FL) of the quantum dot of the sensor element. Preferably, the intensity ($I_{fl}$) of a fluorescence radiation (FL) of the quantum dot of the sensor element is detected by evaluation means (PD). The respective evaluation means (PD) then typically generate a receiver output signal (S0) as a function of the fluorescence radiation (FL). Preferably, the respective evaluation means (PD) typically generate the receiver output signal (S0) as a function of the intensity ($I_{fl}$) of the fluorescence radiation (FL).

In contrast to the prior art, the sensor system proposed in this example additionally comprises a reference element, wherein the reference element comprises as a reference quantum dot one or more paramagnetic reference centers (NV2) which are influenced by the physical parameter, or one or more groups (NVC2) of paramagnetic reference centers (NV2), influenced by the physical parameter, or a group (NVC2) of paramagnetic reference centers (NV2) influenced by the physical parameter, or a plurality of groups (NVC2) of paramagnetic reference centers (NV2) influenced by the physical parameter.

The reference quantum dot is irradiated with compensation radiation (KS). Now, preferably, the same evaluation means (PD, V1) that detect the evaluated quantity of the quantum dot. detect the evaluated quantity of the reference quantum dot.

When applying the first method, evaluation means (V1) now accordingly detect a second photocurrent of the reference quantum dot of the reference element in addition to the first photocurrent and generate the receiver output signal (S0) as a function of the first photocurrent and now, in deviation from the prior art, additionally also as a simultaneous function of the second photocurrent.

In the application of the second method, evaluation means (PD) now accordingly detect, in addition to the intensity ($I_{fl}$) of the fluorescence radiation (FL), furthermore an intensity (I) of a compensation fluorescence radiation (KFL) of the reference quantum dot of the reference element and a receiver output signal (S0) formed from the values of these two intensities, which typically overlap to form a total intensity, typically overlapping to a total intensity, a receiver output signal (S0), in dependence on the intensity ($I_{fl}$) of the fluorescence radiation (FL) and now additionally beyond the state of the art also in simultaneous dependence on the intensity (I) of a compensation fluorescence radiation (KFL) of the reference quantum centers. Evaluation means (M1, TP) then generate from the receiver output signal (S0) a measured value in the form of the value of a sensor output signal (out) for the difference between the value of the physical parameter at the location of the quantum dot and the value of the physical parameter at the location of the reference quantum dot, which is used or can be used as a measured value for this measured value. In this configuration, the reference quantum dot serves as a reference noise source for the noise of the quantum dot. A chopper signal, typically the transmission signal (S5) in this case, is used to switch back and forth between these two noise sources, namely the quantum dot and the reference quantum dot. In contrast to the Dicke receiver, however, this is not done by means of a so-called Dicke switch, but by temporal modulation of the intensity ($I_{pmp}$) of the pump radiation (LB) and temporally complementary modulation of the compensating radiation (KS), this modulation depending on the said transmission signal (S5) as a chopper signal. Instead of this modulation of the pump radiation source (PL1) and the compensation radiation source (PLK), a continuous operation of the pump radiation source (PL1) and the compensation radiation source (PLK) with evaluation of the fluorescence radiation (FL) and the compensation fluorescence radiation (KFL) is also conceivable, in which case, for example, the fluorescence radiation (FL) of the quantum dot and the compensation fluorescence radiation (KFL) of the reference quantum dot are alternately directed onto the radiation receiver (PD) by means of an oscillating mirror which is linked to the transmission signal (S5) as a control signal of the oscillating mirror. If the method of extracting the photocurrents is provided, continuous operation of the pump radiation source (PL1) and the compensation radiation source (PLK) with evaluation of the photocurrents of the quantum dot and of the reference quantum dot is also possible, in which case switching back and forth between the photocurrent of the quantum dot and the photocurrent of the reference quantum dot is performed with the aid of a switch controlled by the transmission signal (S5).

Measurement with a Non Periodic Transmission Signal (S5)

It is possible to use a non-periodic transmission signal (S5). In this case, a trigger circuit (TRIG) is required which analyzes the transmission signal (S5) and actuates the hold circuit (S&H) by means of a synchronization signal (Sync) whenever the condition F[S5]=0 is fulfilled. For example, it is conceivable to use pseudo-random sequences as transmission signal (S5) by means of feedback shift registers. These are then not monofrequency. They have a non-zero frequency bandwidth and can be used for spreading. A spreading code of infinite length can then also be used as the transmission signal (S5). However, the use of excessively long spreading codes for modulating the transmission signal (S5) leads to long latency times and typically becomes contra productive from an application-determined spreading code length.

Measurement of the Phase Delay of the Fluorescence Radiation (FL) Compared to the Pump Radiation (LB)

During the elaboration of the disclosure, it was realized that not only the intensity ($I_{fl}$) of the fluorescence radiation (FL) depends on external physical parameters, such as the magnetic flux density B, but also the phase delay. If the magnetic flux density B at the location of a paramagnetic center (NV1) is lower, the phase delay between the time course of the intensity ($I_{fl}$) of the fluorescence radiation (FL) and the leading time course of the intensity ($I_{pmp}$) of the pump radiation (LB) is also shorter in time. If the magnetic flux density B at the location of a paramagnetic center (NV1) is greater, the phase delay between the time course of the intensity ($I_{fl}$) of the fluorescence radiation (FL) and the leading time course of the intensity ($I_{pmp}$) of the pump radiation (LB) is also longer in time.

The sensor system proposed herein for exemplary analysis of this phase delay between the fluorescence radiation (FL) and the pump radiation (LB) uses a second analysis signal path for analysis of the receiver output signal (S0).

For this purpose, the sensor system expanded to phase measurement comprises a further transmission signal (S5'). This further transmission signal (S5') is also referred to in the following as orthogonal reference signal (S5'), since it is only used for the analysis and compensation. Preferably, the further transmission signal (S5') is different from the transmission signal (S5). Preferably, the transmission signal (S5) is periodic. Equally preferably, the further transmission signal (S5') is preferably periodic. However, it is also conceivable, for example, to use non-periodic signals as described above. For example, the transmission signal (S5) may also be a random signal based on a first random process. Similarly, the second further transmission signal (S5') may be a second random signal that is based on a second random process that is, for example, completely independent of the first random process. Also, the first transmission signal (S5) may be based on a first spreading code and the second transmission signal (S5') may be based on a second spreading code which is preferably independent of the first spreading code. Preferably, at certain points in time F[S5, S5]=0 or at least F[S5w, S5w]=0 are valid. Preferably, the trigger signal (STR) actuates the hold circuit (S&H) at such points in time.

First, for the sake of completeness, we describe again the first analysis path, which corresponds to the sensor systems explained so far.

As previously described, the first multiplier (M1) and the loop filter (TP) form an exemplary scalar product unit that forms the scalar product between the transmission signal (S5) and the receiver output signal (S0), which signals may be replaced by signals that have been or may be derived from these signals (S0, S5) by, for example, filtering or phase shifting or other signal modification methods. This means that this scalar product unit forms a scalar product in a very specific way. Thus, in the mathematical sense, in the extreme cases, signals can be orthogonal or parallel=synchronous to each other with respect to this scalar product. Thus, in the sense of this paper, one signal is orthogonal to the other if it is orthogonal to the other signal with respect to the scalar product used, i.e., the filter output signal (S4) would result in 0. In the previously described sections, the scalar product of the receiver output signal (S0) and the transmission signal (S5) is given by the formula:

$$<S0,S5>=F[S0*S5]=S4$$

Here "<S0;S5>" stands for the scalar product. The filter function F[S0*S5] here preferably also includes the function of the holding circuit, so that the scalar product here for high frequencies of the product S0*S5 corresponds to a certain integral and thus to an L2 product.

For the purposes of this paper, any signal X1 is orthogonal to another arbitrary signal X2 if holds:

$$<X1,X2>=0$$

In terms of the system used in our sensor system, this means that the following must apply:

$$F[X1*X2]=0$$

Particularly preferably, therefore, the further transmission signal (S5') or the alternating component (S5w) of the transmission signal (S5) is selected such that the further transmission signal (S5') is orthogonal to the transmission signal (S5) or to the alternating component (S5w) of the transmission signal (S5). For example, if the transmission signal (S5) is a square wave signal having a duty cycle of 50%, the further transmission signal (S5') may be a square wave signal having a 50% duty cycle shifted with respect thereto by a quarter period $T_p$. The transmission signal (S5) and the further transmission signal (S5') then represent something similar to sine and cosine. The controller preferably generates the compensation transmission signal (S7) as a function of the receiver output signal (S0), the transmission signal (S5), specifically preferably the alternating component (S5w) of the transmission signal (S5) in particular, and the further transmission signal (S5'), specifically preferably the alternating component (S5w') of the further transmission signal (S5') in particular, in such a way that the receiver output signal (S0) does not contain any signal components of the transmission signal (S5) except for control errors and system noise and possibly a constant DC component and at the same time no signal components of the further transmission signal (S5'), in particular of the orthogonal reference signal (S5').

For the formation of the scalar product, said second scalar product unit is preferably used, which is preferably constructed equal to the first scalar product unit. An additional first multiplier (M1') multiplies the further transmission signal (S5') with the receiver output signal (S0) or a signal derived therefrom (e.g. with the reduced receiver output signal S1) and thus forms the further filter input signal (S3') for the further filter, which is preferably a further loop filter (TP'). This further filter generates from the further filter input signal (S3') the further filter output signal (S4'), which can be used as a further sensor output signal (out'). The sensor output signal (out') then, for example, in relation to the further sensor output signal (out') may indicate the phase shift as arctan of this ratio or in the form of a fluorescence phase shift time (ΔTFL) if, for example, the further transmission signal (S5') corresponds to a transmission signal (S5) phase shifted by 90°. For example, it is conceivable to form the arctan value of the ratio to each pair of values of the filter output signal (S4) and the further filter output signal (S4') when the transmission signal (S5) is monofrequency. In this way, it is then possible to form a phase signal which indicates the temporal course of the phase angle. Since this phase angle depends on the magnetic flux density B at the location of the paramagnetic center or centers (NV1) in the sensor element, the values of the phase signal can be used as measures of the time course of the magnetic flux density B at the location of the paramagnetic center or centers (NV1) and thus for measuring the magnetic flux density. Instead of or with the magnetic flux density B, other values of other physical parameters affecting the phase shift of the fluorescence radiation (FL) with respect to the pump radiation (LB) in the form of the fluorescence phase shift time (ΔTFL) may also be recorded. Such physical parameters can be, for example, the pressure P, the temperature ϑ, the acceleration a, the gravitational acceleration g and the electric field strength E. By determining two paramaters, namely a value for the intensity ($I_{fl}$) of the fluorescence radiation (FL) and a value for the fluorescence phase shift time (ΔTFL), this two-dimensional measurement value system can be mapped by a simple linear mapping comprising, for example, a simple matrix multiplication to two of the determinable physical parameters, for example the magnetic flux density B and the electric flux density D, whereby these can be determined. This makes it possible to determine the values of these two physical parameters. However, it is a prerequisite that the other physical parameters are approximately constant and thus do not influence the measurement.

Measurement by Means of Complementary Analysis Signal with 180° Phase Shift

If the transmission signal (S5) is, for example, a PWM signal with a 50% duty cycle, i.e. a square-wave signal, and if the transmission signal (S5) amplitude-modulates the pump radiation (LB), then in this variant, for example, the further transmission signal (S5') is preferably a transmission signal (S5) which is phase-shifted by 180° with respect to the transmission signal (S5), i.e. preferably inverted-complementary. The further sensor output signal (out') then indicates the intensity ($I_{fl}$) of the afterglow of the fluorescence radiation (FL) after the pump radiation (LB) has been switched off. Such a construction has the advantage that a first optical filter (F1) is then no longer necessary and that this filter can then be saved. The compensation control via the compensation transmitter (PLK) always keeps the radiation receiver (PD) at the same optical operating point. For this design, a compensation transmitter (PLK) with a large compensation radiation wavelength ($\lambda_{ks}$), which is larger than the fluorescence radiation wavelength ($\lambda_{fl}$), is preferably used. This has the advantage that no fluorescence radiation (FL) is caused by the compensation radiation (KS) since the long wavelength compensation radiation (KS) cannot then excite the paramagnetic centers (NV1) to emit fluorescence radiation (FL), but is very well received by the radiation receiver (PD). This has the disadvantage that the compensation transmitter (PLK) is then no longer a reference noise source. The controller thus forms an additional sensor output signal (out') depending on the further transmission signal (S5').

Positioning the Optical Filter (F1)

In a further variant, the sensor system and/or quantum technological system, generally also referred to in this writing only simplified as sensor system, comprises a first filter (F1) with special properties. For better clarity, it should be mentioned again that the sensor system comprises at least again a sensor element and/or quantum technological device element and a paramagnetic center (NV1) in the material of this sensor element and/or quantum technological device element and further in this variant a pump radiation source (PL1), a radiation receiver (PD) and said first filter (F1). The pump radiation (LB) has a pump radiation wavelength ($\lambda_{pmp}$). The pump radiation (LB) causes the paramagnetic center (NV1) to emit fluorescence radiation (FL) having a fluorescence radiation wavelength ($\lambda_{fl}$) when absorbed by the paramagnetic center (NV1) under excitation of the paramagnetic center (NV1). The radiation receiver (PD) is preferably sensitive to the fluorescence radiation wavelength ($\lambda_{fl}$) of the fluorescence radiation (FL)—e.g. 637 nm for NV centers. The pump radiation source (PL1) generates the pump radiation (LB). Preferably, the sensor system is thereby designed such that the pump radiation (LB) is incident on the paramagnetic center (NV1). Again, as previously described, said optical functional elements may be used. Similarly, preferably, the sensor system is configured such that the fluorescence radiation (FL) irradiates the radiation receiver (PD). Again, as previously described, said optical functional elements may be utilized.

The first filter (F1) is configured to be substantially transparent to radiation having the fluorescence radiation wavelength ($\lambda_{fl}$) of the fluorescence radiation (FL)—e.g. 637 nm for NV centers—and thus to the fluorescence radiation (FL). Preferably, the first filter (F1) is configured to be substantially non-transparent to radiation at the pump radiation wavelength ($\lambda_{pmp}$) of the pump radiation (LB) and thus to the pump radiation (LB). The first filter (F1) is then substantially transparent to the fluorescence radiation (FL) if the functionality of the sensor system for the intended purpose is achieved, i.e. the errors generated by the unavoidable attenuation in this wavelength range are sufficiently small. The filter (F1) is then substantially non-transparent to the pump radiation (LB) when the operability of the system for the intended purpose is achieved, i.e. the errors generated by the unavoidable transparency in this wavelength range are sufficiently small.

The sensor system in this variant (but also in some of those discussed above), in which the radiation receiver (PD) is part of the integrated circuit (IC), is preferably designed in such a way that radiation received by the radiation receiver (PD) must first pass through the first filter (F1). Particularly preferably, the first filter (F1) is a metal-optical filter which is preferably part of the integrated circuit and is preferably placed in the metallization stack of the integrated circuit (IC) above the photodiode which can be used, for example, as the radiation receiver (PD). Reference is made here by way of example to the writings U.S. Pat. No. 9,958,320 B2, (hyperlink https://worldwide.espacenet.com/patent/search?q=pn%3DUS2006044429&called_by=European Register" \t "_blank", US 2006 0 044 429 A1, US 2010 0 176 280 A1, WO 2009 106 316 A2, US 2008 0 170 143 A1 and EP 2 521 179 B1 is made in this connection as examples of microintegrated wave-optical filters and functional elements. Reference is made to the books B. Kress, P. Meyrueis, "Digital Diffractive Optics" J. Wiley & Sons, London, 2000 and B. Kress, P. Meyrueis, "Applied Digital Diffractive Optics", J. Wiley & Sons, London, 2009 and B. E. A. Saleh, M. C. Teich "Fundamentals of Photonics" Wiley-VCH, Weinheim, 2nd edition, 2008 is referred. The basic principle of a metal optical filter in a micro-integrated optical system is the fabrication of more or less regular structures of different dielectric constant and/or conductivity on the order of the respective wavelength or smaller, so that constructive and destructive interference results in the intended effects. The technical teachings of these documents in combination with the technical teachings of this international application form an integral part of this disclosure to the extent that, upon subsequent nationalization of this application, the respective national law of the country in which the nationalization occurs so permits.

Thus, a sensor element having one or more paramagnetic centers and/or one or more groups of paramagnetic centers (NV1) is described herein, wherein the sensor element comprises at least one wave-optic functional element. At least one of the wave-optical functional elements is thereby a grating and/or a photonic crystal. Preferably, the sensor element comprises a substrate (D) in which at least part of the paramagnetic centers (NV1) and/or one or more groups of paramagnetic centers (NV1) are located. Preferably, the wave-optical functional element is fixedly connected to the substrate (D) and attached to the surface thereof. Preferably, the substrate (D) or a part of the substrate (D) is designed as a wave-optical resonator for the pump radiation wavelength ($\lambda_{pmp}$) and/or the fluorescence radiation wavelength ($\lambda_{fl}$).

It has been shown that the influence of a magnetic flux density on the intensity ($I_{fl}$) of the fluorescence radiation (FL) of a paramagnetic center (NV1), in this case an NV center, is particularly strong when the intensity ($I_{pmp}$) of the pump radiation (LB) is maximized. In that case, several paramagnetic centers (NV1) couple with each other if their density is high enough, as for example in a HD-NV diamond. Therefore, instead of the immediately before mentioned construction where the sensing element is placed on the radiation receiver (PD) as part of an integrated circuit (IC), it is particularly convenient to place the sensing element as close as possible to the pump radiation source (PL1) so that a maximum intensity ($I_{pmp}$) of the pump radiation (LB) is achieved for illuminating the paramagnetic centers (NV1) with pump radiation (LB).

Preferably, the sensor element is not irradiated in transmission. It has been shown that it is particularly advantageous if the sensor element has a first surface (OFL1) via which the pump radiation (LB) enters the sensor element and if the fluorescence radiation (FL) which leaves the sensor element again via this first surface (OFL1) is used for the further measurement, since its fluorescence radiation intensity ($I_{fl}$) and its contrast (KT) are considerably higher. Such a design reduces absorption of fluorescence radiation (FL) and attenuation of intensity ($I_{pmp}$) of pump radiation (LB) inside the sensor element, maximizing sensitivity to flux density B of magnetic fields.

Superstructures of Paramagnetic Centers (NV Centers)

It is not necessary that the sensor element is homogeneously interspersed with paramagnetic centers (NV1). Rather, it is sufficient if the sensor element has a locally increased density of paramagnetic centers (NV1). Preferably, said preferably very high density of paramagnetic centers (NV1) is achieved in these regions within the sensor element. For example, it may be sufficient if a very high density of NV centers, when used as paramagnetic centers (NV1), is achieved only at or near the surface (OFL1) of an HD-NV diamond used as a sensor element.

The paramagnetic centers (NV1) may in particular be arranged in groups (NVC) within the sensor element. The groups of paramagnetic centers typically have a center of gravity derived from the coordinates of the individual paramagnetic centers. The groups (NVC) of paramagnetic centers (NV1) may be arranged in a one-, two-, or three-dimensional grid within the sensor element. Such a grid may be a translational and/or rotational grid. In the case of a translational grating, it typically comprises a unit cell. Depending on the direction of the unit cell of the grating, the grating of the groups (NVC) of paramagnetic centers shows a grating spacing from group (NVC) to group (NVC). However, the lattice spacing may be modulated over the course of the lattice. Preferably, the lattice spacing of the clusters is an integer multiple of an integer fraction of the fluorescence radiation wavelength ($\lambda_{fl}$)—e.g. 637 nm for NV centers—or the pump radiation wavelength ($\lambda_{pmp}$).

If the sensor element is located in an optical resonator or if the sensor element itself is an optical resonator, a standing optical wave occurs within the sensor element. In this way, the interaction between the paramagnetic centers (NV1) and the pump radiation (LB) or the fluorescence radiation (FL) can be controlled. Such an interaction can be, for example, an absorption.

The sensor element is preferably a diamond and the paramagnetic center(s) (NV1) is preferably one or more NV centers in this diamond as a crystal. Preferably, the concentration of NV centers in the diamond at least in a localized region, for example a group (NVC) of NV centers, is on average preferably greater than 0.1 ppm and/or greater than 0.01 ppm and/or greater than 0.001 ppm and/or greater than 0.0001 ppm and/or greater than 0.0001 ppm based on the number of carbon atoms in the diamond per unit volume. Therefore, higher concentrations are better.

Alignment of the Sensor Elements

In another example, the sensing element and/or the quantum technological device element comprises one or more crystals each having a crystal axis. Preferably, the crystal is one or more diamonds. Suitable crystals have one or more paramagnetic centers (NV1) and/or one or more groups (NVC) of paramagnetic centers (NV1) in the crystals. Preferably, the one or more paramagnetic centers (NV1) are one or more NV centers in diamond.

Preferably, nitrogen vacancy (NV) centers in diamond are used as paramagnetic centers (NV1) with diamond as one material of the sensing element to detect magnetic flux densities B or temporally changing electric flux densities D. Preferably, the change in intensity ($I_{fl}$) of the red fluorescence radiation (FL) of the NV paramagnetic centers is used as a signal in the case of magnetic flux densities B or changing electric flux densities D not aligned with the NV axis of the NV centers. Non-aligned magnetic flux densities B lead to mixing of spin states m_s=0, m_s=1, and m_s=−1 in the ground and excited states. The average photon yield of the sensor system when excited by a suitable pump radiation source (PL1) with a pump radiation wavelength ($\lambda_{pmp}$) between 300-700 nm, preferably 500-600 nm to a state with m_s=0 is higher than when excited in m_s=1 or m_s=−1. If the paramagnetic NV centers (NV1) are additionally exposed to microwave radiation, additional superimposed microwave radiation can directly drive the transition between m_s=0, m_s=1, and m_s=−1 at a tuned magnetic flux density B.

The paramagnetic center (NV1) is oriented with respect to one of the following respective crystal axes of the crystal in a first direction, the respective crystal axes being the crystal axes [100], [010], [001], [111] of the crystal and equivalents thereof (such as [−100], [−1, −1, −1], etc.). The paramagnetic center (NV1), when excited by the pump radiation (LB), emits a fluorescence radiation (FL) modulated as a function of a magnetic field having a magnetic flux density B or a magnetic field strength H and/or a time-varying electric flux density D, which have a second direction. The second direction preferably deviates from the first direction. The second direction preferably deviates from the first direction in such a way that the GSLAC extremum at a total magnetic flux density B at the location of the paramagnetic center at 102.4 mT deviates from the normalized 1 value of the intensity ($I_{fl}$) of the fluorescence radiation (FL) by not more than 2% and/or not more than 1% and/or not more than 0.5%. Thus, at the core of the description provided herein is a quantum technological device comprising a sensing element comprising a crystal having a crystal axis. The sensor system preferably comprises means, for example in the form of a pump radiation source (PL1) for pump radiation (LB), such as an LED or a laser, or means, for example in the form of an optical window, for exciting the paramagnetic center (NV1) by means of pump radiation (LB).

According to the proposal, it has now been recognized that for a sensor device for the detection of the magnitude of the magnetic flux density B independent of the spatial orientation, the second direction should preferably deviate from the first direction, since the fluorescence intensity of the intensity ($I_{fl}$) of the fluorescence radiation (FL) then decreases in a strictly monotonically falling manner with increasing magnitude of the magnetic flux density B at the location of the paramagnetic center (NV1) in the crystal from a certain minimum flux density of about 10 mT. This is not the case if, as is common in the prior art, the crystals are aligned in order to be able to use microwave radiation. FIG. 2a of the paper by A. Wickenbrock et. Al. "Microwave-free magnetometry with nitrogen-vacancy centers in diamond" Appl. Opt. Phys. Lett, 109, 053505 (2016), Feb. 8, 2016 shows the fluorescence curve of the intensity ($I_{fl}$) of the fluorescence radiation (FL) of a single NV center.

In FIG. 2a of the paper by A. Wickenbrock et. Al. "Microwave-free magnetometry with nitrogen-vacancy centers in diamond" Appl. Opt. Phys. Lett, 109, 053505 (2016), Feb. 8, 2016 the first direction and the second direction agree.

By the directional detuning or de-calibration between the first and second directions proposed here in deviation from the prior art, a bad quantum number is taken as a basis, which leads to a mixing of the quantum states and thus to a decrease in the intensity ($I_{fl}$) of the fluorescence radiation (FL) as the magnetic flux density B increases. Therefore, an additional magnetic flux density B is preferably applied as the magnetic flux density B to be measured, the vector of which having the second direction does not point in the direction of said first direction of the crystal axis.

FIG. 27 shows the intensity ($I_{fl}$) of the fluorescence radiation (FL) when the two directions are tilted with respect to each other. A first advantage is that the resulting dependence is a function of the magnetic flux density B and is thus reversible. In the prior art, the crystals are always aligned, so that the dependence in the case of alignment of the FIG. 2a of the paper by A. Wickenbrock et. Al. "Microwave-free magnetometry with nitrogen-vacancy centers in diamond" Appl. Opt. Phys. Lett, 109, 053505 (2016), Feb. 8, 2016 corresponds because the first and second directions coincide. The graph of FIG. 2a of the paper by A. Wickenbrock et. Al. "Microwave-free magnetometry with nitrogen-vacancy centers in diamond" Appl. Phys. Lett, 109, 053505 (2016). Phys. Lett, 109, 053505 (2016), Feb. 8, 2016 is not a function and thus not reversible. This is used in the prior art disclosures to be able to manipulate the spins in the resonance points using microwave irradiation. Thus, the disadvantage of the method proposed herein as opposed to the methods and devices of the prior art is that such microwave manipulation is then not possible when using this tilting of the directions. Thus, expensive and complex crystal alignment is required in the prior art technical teachings.

However, this disadvantage is outweighed by the fact that assembly methods such as those proposed in the as yet unpublished applications PCT/DE 2020/100 430, DE 10 2019 114 032.3, DE 10 2019 121 028.3 und DE 10 2019 121 029.1 can then be used. The disclosure content of the German patent applications PCT/DE 2020/100 430, DE 10 2019 114 032.3 und DE 10 2019 121 028.3 und DE 10 2019 121 029.1, which are still unpublished at the time of filing this disclosure, is fully part of this disclosure. To the extent that, upon subsequent nationalization of this application, this is permitted under the legal system of the relevant state in which the nationalization takes place.

Also, the housing disclosed in the disclosure provided herein may be used.

The housing proposed is a housing such as that in German patent application DE 10 2019 120 076.8, as yet unpublished at the date of filing of the present disclosure. The disclosure content of the German patent application DE 10 2019 120 076.8, which is still unpublished at the time of filing this disclosure, is fully part of this disclosure to the extent that, upon subsequent nationalization of this application, this is permissible in the legal system of the respective state in which the nationalization takes place.

By this directional detuning or de-calibration in the form that the second direction deviates from the first direction in such a way that the GSLAC extremum (see FIG. 2a of the paper by A. Wickenbrock et. Al. "Microwave-free magnetometry with nitrogen-vacancy centers in diamond" Appl. Opt. Phys. Lett, 109, 053505 (2016), Feb. 8, 2016) at a total magnetic flux density B at the paramagnetic center location at 102.4 mT by no more than 2% and/or no more than 1% and/or no more than 0.5% from the normalized 1 value of the intensity ($I_{fl}$) of the fluorescence radiation (FL) (see FIG. 2a of the paper by A. Wickenbrock et. Al. "Microwave-free magnetometry with nitrogen-vacancy centers in diamond" Appl. Phys. Lett, 109, 053505 (2016), Feb. 8, 2016). Phys. Lett, 109, 053505 (2016), Feb. 8, 2016 and DE 10 2018 127 394 A1), a bad quantum number is used as a basis, which leads to a mixing of the quantum states and thus to a decrease of the intensity ($I_{fl}$) of the fluorescence radiation (FL) with increasing magnitude of the magnetic flux density B above a certain minimum flux density (about 10 mT for NV centers). This requires a high density of NV centers in the pump radiation (LB) irradiated region of the sensing element, such as in a HD-NV diamond. An additional magnetic field is applied, whose magnetic flux density vector does not point in the direction of the first direction of the crystal axis, but in a deviating second direction. The behavior of the intensity ($I_{fl}$) of the fluorescence radiation (FL) of FIG. 2a of the paper by A. Wickenbrock et. Al. "Microwave-free magnetometry with nitrogen-vacancy centers in diamond" Appl. Phys. Lett, 109, 053505 (2016), Feb. 8, 2016 as a function of the magnetic flux density B can thus only be observed when the crystals are aligned. In particular, the results shown in FIG. 2a of the paper by A.

Wickenbrock et. Al. "Microwave-free magnetometry with nitrogen-vacancy centers in diamond" Appl. Opt. Phys. Lett, 109, 053505 (2016), Feb. 8, 2016 visible resonance points (peaks) are only visible when the magnetic field direction is aligned with the crystal axis. This makes production of microwave-based quantum sensing systems very complicated and expensive.

FIG. 27 shows the resulting curve when the alignment is decalibrated (i.e. a different first and second direction). Only then an arbitrary orientation of the magnetic field is possible. As can easily be seen in FIG. 27, the dependence between the magnetic flux density B and the intensity ($I_{fl}$) of the fluorescence radiation (FL) is greatest in an optimum operating point range. By means of an additional permanent magnet and/or a current-carrying electric coil, a magnetic bias field of, for example, 20 mT bias flux density $B_0$ can be superimposed on the field to be measured, whereby the sensitivity of the intensity ($I_{fl}$) of the fluorescence radiation (FL) to changes in the magnetic flux density B is maximized.

A non-alignment of the first direction with respect to the second direction can be recognized by the fact that no resonances (such as GSLAC) occur. Of course, one can always align the magnetic field so that these resonances occur. However, if a device is intended and suitable for measuring magnetic fields where the first and second directions do not coincide, it is within the scope of the corresponding claims, provided that the other features thereof apply, even if it exhibits said resonances for a particular magnetic field direction.

In principle, when diamond is used as a sensor element or as a sensor element part, all forms of diamond with a content of paramagnetic centers (NV1), in particular with a content of NV centers as paramagnetic centers (NV1), are possible, since an alignment of the paramagnetic centers (V1), in particular of the NV centers to the vector of a magnetic flux density B is not necessary. In another aspect, this distinguishes the sensor systems presented herein from the previous diamond-based sensor systems, which require precise alignment of the diamond crystals.

By avoiding the resonance cases of FIG. 2b of the paper A. Wickenbrock et. Al. "Microwave-free magnetometry with nitrogen-vacancy centers in diamond" Appl. Opt. Phys. Lett, 109, 053505 (2016), Feb. 8, 2016 thus results in the strictly monotonically decreasing curve of FIG. 27, which is then also section-wise bijective and thus calibratable. Only then it will be possible to produce a measuring system in a mass production.

As before, preferably the sensor element comprises a diamagnetic material, wherein the diamagnetic material preferably comprises one or more diamond crystals, and wherein the one or more paramagnetic centers (NV1) preferably comprise one or more NV centers. However, the use of centers other than paramagnetic centers (NV1) is also conceivable. For example, SiV centers, GeV centers, TR1 centers, ST1 centers, etc. would be conceivable in diamond. Provided that silicon is used instead of diamond as a material of a substrate (D) of the sensor element, for example, the use of G centers is conceivable. If silicon carbide (SiC) is used instead of diamond as a material of a substrate (D) of the sensor element, the use of V centers is conceivable, for example.

Quite generally, therefore, the use of a color center or defect or substitution center in a crystal as a paramagnetic center (NV1) is claimed for measuring magnetic flux densities B or possibly other physical parameters such as acceleration a, gravitational field strength g, electric flux density D, rotational speed ω, intensity of irradiation with ionizing radiation, etc., and their time integrals and derivatives, the crystal axis of the color center being rotated with respect to the vector of the magnetic flux density B, in contrast to the prior art.

Position Sensing

Furthermore, the present disclosure comprises the use of a sensor system as previously described for determining the position and/or the change in position and/or acceleration and/or rotation of a measurement object (O). This may also involve deformations of surfaces and/or density variations. The measurement object (O) generates and/or modifies and/or modulates a magnetic field in the form of the magnetic flux density B of this field. This modulation is detected by the proposed sensor system. The proposed sensor system generates or provides at least one sensor output signal (out). This providing can be done, for example, in a memory or register of the integrated circuit or as a digital or analog output signal of the integrated circuit. The value of this sensor output signal (out) depends on the value of the magnetic field—more precisely the magnetic flux B or another physical parameter influencing the fluorescence radiation (FL)—at the location of the paramagnetic center (NV1) or the paramagnetic centers (NV1) or the group or groups (NVC) of paramagnetic centers (NV1), which is generated and/or modified and/or modulated by the measured object (O).

In important applications, such as the measurement of the position of device parts in operating elements, machines, robots, electric motors or internal combustion engines, the generation and/or modification and/or modulation of the magnetic field in the form of the magnetic flux density B can be periodic. Thereby, the periodicity can be due to an electrical and/or mechanical oscillation and/or a mechanical movement along a closed path.

Thus, in the proposed method, an alternating magnetic flux density B or an electric field strength E generated by a mechanically oscillating system is sensed by a sensor system preferably stationary with respect to the alternating magnetic flux density B or the electric field E, as proposed in various variants herein.

The disclosure also includes a control element, the change in position of which, for the purpose of operating a device, results in the change of a magnetic flux density B at the location of one or more paramagnetic centers (NV1) of the sensor system. A permanent magnet attached to a lever, may cause such a change in magnetic flux density B at the location of the paramagnetic center (NV1) when operated, for example, when the position of the lever is changed, which may be detected by the proposed sensor system and output via the sensor output signal (out).

The sensor systems proposed in this paper can be used to determine the position of a measurement object (O) and/or a quantity derived from the position of the measurement object (O), in particular the velocity and/or acceleration and/or vibration and/or rotation, of the measurement object (O). It is also possible to use them for measuring the magnetization of the measurement object (O), wherein the magnetization of the measurement object (O) can be caused by a current flow in the measurement object (O) or by ferromagnetic properties of the measurement object (O) or of parts of the measurement object (O). Also, with the sensor systems proposed herein, it is possible to determine a quantity derived from the magnetization of a measurement object (O) and/or a magnetization direction of the object relative to the sensor system and/or a quantity derived from the magnetization direction of the measurement object (O). In this context, the measurement object (O) generates, for example, a magnetic flux density B and/or modifies and/or modulates the magnetic flux density B at the location of the paramagnetic centers (NV1) of the sensor system. This generation and/or modification and/or modulation of the magnetic field is detected by the sensor system and kept ready or output as a measured value. For this purpose, the sensor system preferably generates or preferably provides at least one sensor output signal (out). The value of the sensor output signal (out) then depends on the value of the magnetic flux B at the location of the paramagnetic center (NV1) and/or at the location of the paramagnetic centers (NV1) in the sensor system, this magnetic flux B being generated and/or modified and/or modulated by the measured object (O).

In the proposed method, an alternating magnetic field in the form of the value of the magnetic flux density B or an alternating electric field in the form of the electric flux density D generated, for example, by a mechanically oscillating system can be sensed by a sensor system having one or more paramagnetic centers (NV1), for example, stationary with respect to the alternating magnetic field or alternating electric field.

Preferably, the alternating field component of the magnetic flux density B or the alternating field component of the electric flux density D present at the location of the paramagnetic center(s) (NV1) of the sensor system is determined by means of a change of state of electric spins of the electron configurations of the paramagnetic center(s) (NV1). Here, the change of spin states of the paramagnetic center(s) (NV1) is detected by means of the intensity $(I_{fl})$ of the fluorescence radiation (FL) of the paramagnetic center(s) (NV1) in different wavelengths, or by means of the different number of photoelectrons that can be extracted from the sensing element, or by means of the different magnitude of electric photocurrents, or by both methods.

Analogous to the determination of a magnetic flux density B and a changing electric flux density D, an electrostatic field, more precisely its electric flux density D, can also be measured by one or more moving paramagnetic centers (NV1), that the flux density B of the electric flux density D transformed by the movement of the paramagnetic center or centers (NV1) is detected and converted into an intensity value of the intensity $(I_{fl})$ of its fluorescence radiation (FL), which can be detected by a radiation receiver (PD) and converted by an evaluation circuit (V1, M1, TP) into a sensor output signal (out), the value of which then depends on the mean electric flux density D at the mean location of the paramagnetic center (NV1) during the detection period. For example, the sensing element with the one or more paramagnetic centers (NV1) may be attached to a vibrating mechanical device, such as a vibrating string or a vibrating beam, for example a vibrating quartz. If the oscillation frequency of this mechanical device is known, this results in mixed frequencies which can be found at characteristic positions in the spectrum of the sensor output signal (out) and can be filtered out, for example, by means of a bandpass filter and a subsequent synchronous demodulator. Particularly preferred for such a measurement is a device such as that of FIG. 15, for example, in which the signal of the intensity $(I_{fl})$ of the fluorescence radiation (FL) of one or more paramagnetic centers (NV1) of a sensor element is compared with the intensity $(I_{fl})$ of the fluorescence radiation (FL) of one or more paramagnetic reference centers (NV2). If the shielding (AS) is omitted in the device, the same values of the intensity $(I_{KFL})$ of the compensation fluorescence radiation (KLF) of the paramagnetic reference centers (NV2) and the intensity $(I_{fl})$ of the fluorescence radiation (FL) of the paramagnetic centers (NV1) should be detected in both measurement channels via the paramagnetic center(s) (NV1) and via the paramagnetic reference center(s) (NV2). For example, if the sensing element with the paramagnetic center(s) (NV1) is placed on a mechanically vibrating component, such as a beam or a string or vibrating quartz, this results in an additional mixed frequency based solely on the transformation of the magnetic flux density B and the electric field E. If the magnetic flux density B and the electric flux density D are to be separated, a device such as that shown in FIG. 25 is recommended in this case, which then supplies as the sensor output signal (out) a value which depends primarily on the magnetic flux density B, while in the case of a strong electrostatic flux density D the value of the additional sensor signal (out') then depends essentially on the value of the electrostatic flux density D. Since the paramagnetic centers (NV1) and the paramagnetic reference centers (NV2) show a time delay $(t_d)$, this delay $(t_d)$ still has to be corrected out of the result by matrix multiplication. The values of this matrix are device specific and should be determined type specific or better device specific before using the device for measurements. A prerequisite for detecting the electric flux density D is that the electric flux density D is not constant and thus the law of induction comes into play. According to the proposal, this can be achieved by a linear and/or preferably oscillating movement of the field source and/or the paramagnetic center(s) (NV1) and/or the paramagnetic reference center(s) (NV2). For this purpose, for example, the sensor element can be connected to the paramagnetic center or centers (NV1) or the group or groups (NVC) of paramagnetic centers (NV1) and/or to the paramagnetic reference center or centers (NV2) and/or the group or groups (NVC2) of paramagnetic reference centers (NV2), for example by gluing a sensor element to the surface of the typically piezoelectric oscillating element, for example an oscillating quartz (Q1, Q2), so that the oscillating element, for example the oscillating quartz (Q1, Q2) is provided with one or more paramagnetic centers (NV1) or with one or more groups (NVC) of paramagnetic centers (NVC). From the paper J. Cal, F. Jelezko, M. B. Plenio, "Signal transduction and conversion with color centers in diamond and piezo-elements" arXiv:1404.6393v2 [quant-ph] 30 Oct. 2017, coupling of piezoelectric substrates with single paramagnetic centers (NV1) is known. From U.S. Pat. No. 7,812,692 B2, the combination of a polycrystalline diamond film with a piezoelectric micromechanical transducer is known. Using the microwave-free methodology presented herein based on sensor elements with a high density of paramagnetic centers (NV1), for example based on HD-NV diamonds, the design of such systems can be massively simplified. The oscillating element of the oscillating crystal then forms the mechanical oscillating element (MS). The fluorescence radiation (FL) of the paramagnetic center(s) (NV1) or of the group or groups (NVC) of paramagnetic centers (NV1) depends in states of the oscillating element of the oscillating quartz crystal with a velocity of approximately 0 m/s and a maximum acceleration essentially, for example, on the magnitude of the magnetic flux density (B) at the location of the paramagnetic centers (NV1) and in states of the oscillating element of the oscillating quartz crystal with a maximum velocity and a vanishing acceleration additionally, for example, on the magnitude of the electric field strength E at the location of the paramagnetic centers (NV1). Thus, in this paper, a piezoelectric, in particular piezoelectrically driven oscillating element, for example of an oscillating crystal, is disclosed comprising at least one paramagnetic center (NV1). Preferably, the piezoelectric vibrating element comprises one or more paramagnetic centers (NV1) and/or one or more groups (NVC) of paramagnetic centers. Preferably, the piezoelectric vibrating element comprises a HD-NV diamond or a device region comprising HD-NV diamond. Corresponding to this device is a method of operating a quantum technological device comprising the step of providing a sensing element, wherein the sensing element comprises a crystal having a crystal axis, and wherein the crystal comprises one or more paramagnetic centers (NV1) in the crystal. Further, the proposed method comprises irradiating the one or more paramagnetic centers (NV1) with pump radiation (LB) having a pump radiation wavelength ($\lambda_{pmp}$) and emitting fluorescent radiation (FL) in response to the pump radiation (LB) and in response to the value of a total magnetic flux density B at the location of the one or more paramagnetic centers (NV1). In the case of paramagnetic centers (NV1) moving relative to an electromagnetic field, portions of the electric field with electric field strength E are transformed into a magnetic field with a resulting magnetic flux density B. Thus, when the device moves relative to the field source, the corresponding device is also able to detect electrostatic fields or more complex electromagnetic fields.

For simplification, everything written before and later essentially refers to the case of stationary coordinate systems with a coordinate origin in the paramagnetic center or centers (NV1). Moving, rotating and/or accelerated cases are also claimed. However, the claiming just also comprises the detection of electrostatic fields by using a Lorenz transformation. As a further step, the method comprises detecting at least a portion of the fluorescent radiation (FL) and determining a value of the intensity ($I_{fl}$) of the fluorescent radiation (FL). A particular feature of the proposed method is that the one or more paramagnetic centers (NV1) or the group or groups (NVC) of paramagnetic centers (NV1) are aligned with respect to one of the following respective crystal axes in a first direction, the respective crystal axes being crystal axes [100], [010], [001], [111] of the crystal and equivalents thereof (such as e.g. [−100], [−1, −1, −1] etc.), and that the magnetic flux density vector B points in a second direction and that this second direction is different from the first direction. As before, the crystal or sensing element is preferably a diamond crystal having one or more NV centers (NV1) as paramagnetic centers (NV1).

Particular advantages result if the pump radiation source (PL1), the sensor element (e.g. a diamond), the first filter (F1) and the radiation receiver (PD) form a preferably common microsystem unit. This unit can be miniaturized and placed, for example, underneath a particularly mechanically vibrating system, for example as a pickup. Reference is made to the housing presented here in this context.

Preferably, in the detection of mechanical vibrations by a stationary sensor system according to the sensor systems proposed herein, a ferromagnetic material is used as the mechanically vibrating system, for example a ferromagnetic string, for example the string of an electric guitar or an electric bass is used.

Position, Velocity and Acceleration and Rotation Sensing

The position, a movement of a measurement object (O), its acceleration or rotation, or another method may, for example, cause a modulation of the magnetic flux density B at the location of the paramagnetic center or centers (NV1) by the measurement object (O) in question, which can then be detected by means of the methods and devices described herein. The paramagnetic centers may also be located at the target (O), for example a guitar string, and measured there by the sensor system.

In very general terms, therefore, the proposed method comprises generating a first modulation signal by means of a mechanical system with which the magnetic flux density B at the location of the paramagnetic center or centers (NV1) or group or groups of paramagnetic centers (NV1) is modulated. The mechanical cause may be in the position, movement, rotation or acceleration of a target (O) interacting with the magnetic flux density B at the location of the paramagnetic centers (NV1). However, the mechanical cause may also be in the position, the movement of the rotation or the acceleration of the sensing element with the paramagnetic centers (NV1) interacting with the magnetic flux density B at the location of the paramagnetic centers (NV1).

This is equivalent in result to generating the modulated optical signal by means of a modulated fluorescence radiation (FL) of the paramagnetic center or centers (NV1), the modulation of the modulated fluorescence radiation (FL) depending on the modulation of the magnetic flux density B at the location of the paramagnetic centers (NV1).

In this case, the paramagnetic center or centers (NV1) exhibit a change, dependent on the change in magnetic flux density B, in a fluorescent radiation (FL) emitted by them and/or a change, dependent on the change in magnetic flux density B, in the quantity of photoelectrons they generate after irradiation of the diamagnetic material with pump radiation (LB) in the form of green visual light, it being possible for this irradiation with pump radiation (LB) to take place with or without superimposed microwave radiation. The photoelectrons generating the paramagnetic center or centers (NV1) can be sucked towards contacts by electric fields in the material of the crystal of the sensor element. Preferably, these are ohmic contacts to the relevant material of the sensor element. For example, in the case of a diamond, the contacts may be titanium contacts.

Preferably, the fluorescence radiation (FL) of the paramagnetic centers (NV1) or an amount of photoelectrons generated by paramagnetic centers (NV1) in a diamond having an at least local NV center concentration of at least 0.0001 ppm, and/or of at least 0.001 ppm and/or preferably of at least 0.01 ppm and/or preferably of at least 0.1 ppm, and/or preferably of at least 1 ppm, and/or preferably of at least 10 ppm, and/or preferably of at least 20 ppm, and/or preferably of at least 50 ppm, and/or preferably of at least 100 ppm, and/or preferably of at least 200 ppm, and/or preferably of at least 500 ppm, and/or preferably of at least 1000 ppm, and/or preferably of at least 2000 ppm, and/or preferably of at least 5000 ppm relative to the amount of diamond carbon atoms produced. Concentrations of 10 ppm and 20 ppm have been used in the preparation of this international application and its priority-establishing prior applications. Preferably, the concentration can be determined by means of an EPR measurement. In this regard, we refer to M. Capelli, A. H. Heffernan, T. Ohshima, H. Abe, J. Jeske, A. Hope, A. D. Greentree, P. Reineck, B. C. Gibson, Increased nitrogen-vacancy center creation yield in diamond through electron beam irradiation at high temperature, Carbon (2018), doi: https://doi.org/10.1016/j.carbon.2018.11.051

For the generation of the fluorescence radiation (FL) of the paramagnetic centers (NV1) resp. of the photoelectrons of the paramagnetic centers (NV1), modulated pump radiation (LB) of a pump radiation source (PL1) amplitude-modulated by means of an alternating component (S5w) of a transmission signal (S5), in particular a pulsed laser or a pulsed LED, with a lower modulation frequency of the alternating component (S5w) of the transmission signal (S5)

of at least 1 kHz and/or at least 10 kHz and/or at least 100 kHz and/or at least 1 MHz and/or at least 10 MHz is preferably used.

The paramagnetic centers (NV1) then typically emit modulated fluorescence radiation (FL), which depends on the modulated pump radiation (LB) from the pump radiation source (PL1) as modulated pump radiation (LB).

The modulated fluorescence radiation (FL) from the paramagnetic centers (NV1) is then preferably detected by a light-sensitive electronic component, in particular a photodiode, as a radiation receiver (PD) and/or via photoelectrons and converted into a modulated receiver output signal (S0).

Preferably, the modulated receiver output signal (S0) is then converted by means of a synchronous demodulator and/or a lock-in amplifier and/or by means of another device which forms a level signal by means of scalar product formation between, on the one hand, the alternating component (S5w) of the transmission signal (S5) or a signal (S5, S5c) derived from the alternating component (S5w) of the transmission signal (S5) and, on the other hand, the receiver output signal (S0) or a signal derived therefrom (e.g. S1), and the use of the filter output signal (S4) or a signal derived therefrom as sensor signal (out).

In one variant, the generation of an orthogonal reference signal (S5') from the alternating component (S5w) of the transmission signal (S5) is carried out, inter alia, by phase shifting.

It is possible that the alternating component (S5w) of the transmission signal (S5) has a non-zero spectral frequency component with a lower frequency range cut-off frequency of less than 1 kHz and/or better less than 100 Hz and/or better less than 10 Hz and/or better less than 1 Hz and with an upper frequency range cut-off frequency of better greater than 1 MHz and/or better greater than 10 MHz and/or better greater than 100 MHz and/or better greater than 1 GHz and/or better greater than 10 GHz.

In the experiments during the elaboration of the disclosure, 10 kHz was mostly used.

Sensor System with Spatially Separated Sensor Element and Musical Instrument

A further example arises from the use of an optical fiber (LWL) or other light carrying structure to operate the sensing element with the one or more paramagnetic centers (NV1), for example a diamond with NV centers, spatially separated from the pump radiation source (PL1), the radiation receiver (PD), and the evaluation circuit (V1, M1, TP, G). Discussed herein as an exemplary device for a class of possible devices is a musical instrument. For example, an HD-NV diamond in the form of a red diamond may be visibly attached to an acoustic resonator, for example the body of an electric guitar, while the pump radiation source (PL1) and the radiation receiver (PD) and at least part of the evaluation circuit (V1, M1, TP, G) are located within the body of the guitar or below the fingerboard of the guitar spatially separated from the sensing element. Only a small hole for attaching the optical fiber is necessary to optically couple the sensor element with the pump radiation source (PL1) and with the radiation receiver (PD) and thus to operate the sensor system. This opens up new design possibilities in the appearance of a guitar or other stringed instruments such as harps, stringed instruments, pianos and other musical instruments, etc.

Preferably, the coupling of a plurality of sensor elements, for example a plurality of diamonds with NV centers, to a pump radiation source (PL1) is performed. The pump radiation source (PL1) may be located outside the musical instrument or the device in question, and may be coupled to the musical instrument or the device in question by means of an optical fiber (LWL). Likewise, it is possible to use a radiation receiver (PD) for receiving the fluorescence radiation (FL) from the paramagnetic centers (NV1) of a plurality of sensor elements having paramagnetic centers (NV1) that are spatially separated from each other, preferably a plurality of diamonds having NV centers. The reception of the fluorescence radiation (FL) by the radiation receiver(s) (PD) can thus take place outside the musical instrument or the device in question.

A preferred variant is to couple the pump radiation (LB) of the pump radiation source (PL1) with the sensor element and the fluorescence radiation (FL) of the paramagnetic centers (NV1) of the sensor element with the radiation receiver (PD) via a common optical waveguide (LWL), for example an optical fiber. Instead of coupling via a single optical waveguide (LWL), it is also conceivable to couple the pump radiation (LB) of the pump radiation source (PL1) to the sensor element by means of a first optical waveguide (LWL1)), for example a first glass fiber, which is optimized to the pump radiation wavelength ($\lambda_{pmp}$) of the pump radiation (LB) of the pump radiation source (PL1), and to couple the fluorescence radiation (FL) of the paramagnetic centers (NV1) of the sensor element with the radiation receiver (PD) via a second optical waveguide (LWL2), for example a second optical fiber, which is optimized to the fluorescence radiation wavelength ($\lambda_{fl}$) of the fluorescence radiation (FL) of the paramagnetic centers (NV1).

Preferably, the excitation by pump radiation (LB) and the detection of the fluorescence radiation (FL) by the radiation receiver (PD) are performed via a photonic optical waveguide separating both an excitation and a fluorescence branch, for example via a wave coupler.

Microphones and Musical Instruments with a Quantum Technological Pickup

Thus, the proposals provided herein may also relate to a ferromagnetically coated string as an exemplary mechanically vibrating system (MS) for stringed instruments, the vibrations of which are detected with a first modulation of a first modulation frequency by a sensor system proposed herein. The vibrating system may also relate to a magnetic diaphragm or a ferromagnetic diaphragm in a magnetic circuit with excitation by a permanent magnet, or other mechanically movable or vibrating device parts coupled to a mechanically vibrating system via air or other medium. For example, a magnetic membrane or ferromagnetic membrane in a magnetic circuit when used in conjunction with one or more of the sensor systems disclosed herein may constitute a microphone and may be so used.

Thus, within the scope of the present disclosure, a method for converting acoustic or other mechanical vibrations and/or position information and/or position change information of, for example, a ferromagnetic measurement object into optical signals and/or digital electrical signals and/or analog electrical signals is proposed, comprising, inter alia, the following steps:

A first step is to generate a magnetic flux density B modulated with a first modulation signal, which may also be constant. The cause of this modulation with a first modulation signal a first modulation spectrum of first modulation frequencies may also be a mechanical oscillation with a first oscillation spectrum of first oscillation frequencies, wherein the first modulation spectrum of the first modulation frequencies typically depends on the first oscillation spectrum of first oscillation frequencies. The oscillation spectrum may have a DC component. A second step is detecting this magnetic flux density B modulated with the first modulation spectrum at first modulation frequencies by means of a device based on paramagnetic centers (NV1) in a diamagnetic material and converting the detected value of the modulated magnetic flux density B into an optical signal and/or an electrical, for example digital signal, in particular a receiver output signal (S0) or a sensor output signal (out), and/or an analog electrical signal, in particular into an analog and/or digital sensor output signal (out) by means of this device.

For example, in a musical instrument, such as a guitar as an example of a mechanical vibrating system, the generation of a second flux density component $B_m$ of the magnetic flux density B modulated with the first modulation signal may be performed by means of a first field source (MG1) of an electric and/or magnetic field coupled to the mechanical system.

Preferably, the generation of a further, first flux density component $B_0$ of the magnetic flux density B, which is superimposed in a summing manner on the second flux density component $B_0$ of the magnetic flux density B modulated with the first modulation signal, takes place by means of a second source (MG2) of an electric and/or magnetic field which is not coupled to the mechanical system. Preferably, this second magnetic field source (MG2) brings the sensor system into the optimum operating point region of FIG. 28, the magnetic flux density B of the operating point typically corresponding to the first flux density component $B_0$. Preferably, the second magnetic field source (MQ2) is a permanent magnet or an electrically energized compensation coil (LC). Preferably, the first flux density component $B_0$ is generated by means of a permanent magnet and/or an electrically energized compensation coil (LC). The electrically energized compensation coil (LC) may be a single lead. Preferably, the compensation coil (LC) is energized with an electric current by a controller (RG) which depends on the sensor output signal (out) and/or the filter output signal (S4) and is generated by a controller (RG) in dependence on the value of the deviation of the detected magnetic flux density B from an operating point value, for example the value of the first flux density component ($B_0$), determined by the device. Preferably, the paramagnetic center (NV1) or centers (NV1) are placed so close to this line, which may also be a straight line, that they are located in the magnetic near field of the line decreasing with 1/r, where r stands for the distance between the respective paramagnetic center (NV1) and a conductor which may form the compensation coil (LC). Thus, adjusting the operating point to use the paramagnetic center or centers (NV1) by using a second field source (MG2) in combination with a first source (MG1) is a very essential step to optimize the sensitivity. This adjustment can be made as, already described by permanent magnets and/or electromagnets, for example energized coils (L1 to L7, LC) and/or lines.

Another variation of the device comprises a pump radiation source (PL1), for example a laser and/or an LED, and a diamagnetic material (MPZ) as a sensing element, and a radiation receiver (PD). Furthermore, this exemplary device comprises a mechanical system (MS) and a first field source (MQ1). The diamagnetic material (MPZ) again comprises one or more paramagnetic centers (NV1). The pump radiation source (PL1) emits pump radiation (LB) suitable for the one or more paramagnetic centers (NV1), with a pump radiation wavelength ($\lambda_{pmp}$) suitable for exciting the one or more paramagnetic centers (NV1). The one or more paramagnetic centers (NV1) are irradiated by the pump radiation (LB) and therefore emit fluorescence radiation (FL) having a fluorescence radiation wavelength ($\lambda_{fl}$). The first field source (MQ1) is preferably mechanically coupled to the mechanical system (MS). For example, the first field source (MG1) may be the ferromagnetic material of a guitar string or a rotor of an electric machine, or another vibratory device element made of ferromagnetic material of any other mechanical device, and optionally a permanently magnetic device. More generally, by a first field source (MG1) is meant an unrestricted source of a modification of the magnetic flux density B at the location of the paramagnetic center or centers (NV1). Here, the mechanical system (MS) allows and/or causes movement and/or acceleration and/or rotation of the first field source (MQ1) relative to the diamagnetic material (MPZ) in the sensing element. The radiation receiver (PD) detects the fluorescence radiation (FL), and typically the intensity ($I_{fl}$) of the fluorescence radiation (FL), and converts the detected intensity value of the intensity ($I_{fl}$) of the fluorescence radiation (FL) into a receiver output signal (S0), which may in particular be digital and/or analog. It can also be a memory value in a signal processing device, which is kept ready for retrieval and/or further use by device parts, users or devices accessing externally, for example via a data bus.

The device preferably comprises a first filter (F1), wherein the first filter (F1) substantially prevents pump radiation (LB) from reaching the radiation receiver (PD). The first filter (F1) substantially does not prevent fluorescence radiation (FL) from reaching the radiation receiver (PD). Essentially, in the context of the first filter (F1) as used herein, this means that the small attenuation of the fluorescence radiation (FL) that typically occurs nevertheless does not affect the functionality of the respective device. Preferably, when NV centers are used as paramagnetic centers (NV1), the pump radiation (LB) has a pump radiation wavelength ($\lambda_{pmp}$) between 500-600 nm. As preferred, the pump radiation is a green pump radiation in the sense of the function of this radiation in this paper. Specific reference is made to the other comments on this point in this writing. Preferably, the diamagnetic material (MPZ) comprising the sensing element is diamond and the paramagnetic center(s) are NV centers in said diamond material.

Preferably, the paramagnetic center(s) (NV1) is/are one or more NV centers in one or more diamonds and the diamond(s) is/are a diamond with an at least local content of NV centers in a range of 0.1 ppm to 500 ppm and possibly beyond, i.e. a HD-NV diamond as defined herein.

Preferably, in particular, the one or more paramagnetic centers (NV1) is one or more NV centers in one or more diamonds and the one or more diamonds is an artificially produced diamond using a high-pressure, high-temperature process.

In some applications, the movement of the first field source (MQ1) relative to the sensing element comprising the diamagnetic material (MPZ) is periodic. For example, this is true of said exemplary steel side of said exemplary guitar (GT). Analogously, this can also be understood as a periodic movement of the first field source (MQ1) relative to the sensor element with the diamagnetic material (MPZ), based on a mechanical vibration and/or a rotation of at least one device part of the mechanical system (MS), for example said string of said exemplary guitar (GT). It is then a movement of the first field source (MQ1) relative to the sensor element comprising the diamagnetic material (MPZ), which is periodic and which is based on a mechanical vibration and/or rotation of at least one device part of the mechanical system (MS). In this context, this device part and/or the mechanical system (MS) is, for example, a vibrating side of a musical instrument or a rotating and/or vibrating sample of a measuring device (for example, a rotational position sensor) or a rotating and/or vibrating wheel or gear or a rotating and/or vibrating circular disc or a rotating and/or vibrating rotor or other device part of an engine, in particular an electric motor or an internal combustion engine or a turbine or a rocket engine, or another rotating and/or vibrating device part of an engine, in particular of an electric motor or of an internal combustion engine or of a turbine or of a rocket engine, or a rotating and/or vibrating device part of a vehicle or a rotating and/or vibrating device part of a machine or the rotating and/or vibrating measuring disc of an angle measuring device and/or a vibrating diaphragm and/or a vibrating building part and/or a vibrating earth part. Thus, the disclosure also relates to microphones, seismometers, geophones, tachometers, rotor position sensors for engines and their control devices, vibration measuring devices, etc. A translational motion, as used herein, is a rotation with an infinite radius.

Monitoring of Mechanical Systems in Extreme Environments

In yet another example, a sensor system such as that proposed herein may be used for quality control of mechanical systems such as transmission units or engines.

A particular advantage here is the spatial separation of the sensor element, for example diamond, by means of one or more optical waveguides and the electronic evaluation and irradiation unit. This allows the sensor element for detecting the magnetic flux density B to be used in environments which are not applicable to electronic components, such as at higher than extreme temperatures or a high ionizing radiation level. Also, the sensor elements can be used to detect the magnetic flux density B or other physical parameters affecting the intensity ($I_{fl}$) of the fluorescence radiation (FL). This can also be done, for example, in boreholes, in particular also under high pressure and/or high temperature and/or in environments with corrosive and/or abrasive fluids, such as hot salt water/oil/sand/gas mixtures at great depths, e.g. As part of a borehole probe.

As a further example of the microphone variant, a sensor system according to the proposal can be used to detect sudden pressure differences, for example to trigger airbag systems.

Another example is to use a proposed sensor system for monitoring medical parameters. If the sensor element is attached to an optical waveguide, the sensor element with the paramagnetic centers (NV1) can be brought via the vessels into the vicinity of the organ to be measured, for example the heart or the brain, and can detect bioelectric signals there or detect radiation radiating in there, in particular ionising radiation such as neutrons, electrons and positrons, elementary particles, ions, alpha radiation, gamma and X-ray photons, and can be used if necessary can be used for dose measurement, for example within a living body, thus for example in medicine. Also, a sensor system according to the proposal can be used to control a pacemaker.

A wide application lies in the use of a proposed sensor system in the microphone variant as a hearing aid. The low weight and the direct conversion of the acoustic signals into digital signals result in a low-noise recording.

Since diamond is biocompatible in use, as is the material of most optical waveguides (LWL1, LWL2), and the sensor element can be operated separately from the detection unit comprising the pump radiation source (PL1), the radiation receiver (PD) and the evaluation circuit (G, V1, M1, TP), the sensor element can be used as an at least temporarily invasive implant in the inner ear or at other locations of the body, for example with the aid of one or more optical waveguides (LWL1, LWL2).

Sensor System with Compensation Coil (LC)

The special feature of the variant of the sensor system presented here is that the sensor system can comprise means, in particular a controller (RG) and/or in particular a compensation coil (LC) and/or a permanent magnet, for maximizing the change in the intensity ($I_{fl}$) of the fluorescence radiation (FL) in the event of a change in the magnetic flux density B at the location of the paramagnetic center or centers (NV1) with respect to the respective application. I.e. by subtraction or addition of a quasi-static component of the magnetic flux B, the total magnetic flux density B at the location of the paramagnetic center is shifted towards an operating point which has an optimized distance from the point of maximum sensitivity (see FIG. 28b). This takes advantage of the fact that the paramagnetic centers (in the case of FIG. 28b, these are NV centers in diamond) couple when the local NV center density is sufficiently high, such as in a HD-NV diamond, and thus produce collective effects of groups of paramagnetic centers. These lead to the modulation of sensitivity even when the first and second directions are decalibrated.

If this operating point adjustment $B_0$ of the magnetic flux density B is carried out by means of a compensation coil (LC), it is useful to energize it with an electric current which is derived from the measured value of the magnetic flux density B, i.e. the filter output signal (S4) of the filter, for example of the loop filter (TP), in such a way in that the magnetic field of the compensation coil (LC) compensates for such a change in the magnetic flux density B at the location of the paramagnetic centers (NV1) and/or at the location of the groups (NVC) of paramagnetic centers (NV1) by means of a current supply to the compensation coil (LC) by a controller (RG) whose actual value signal depends on the filter output signal (S4) or a functionally equivalent signal. A controller (RG) preferably derives the corresponding operating point control signal (S9) from the filter output signal (S4). This stabilizes the magnetic operating point setting of a magnetic operating point flux density in the form of a bias flux density ($B_0$). Preferably, the controller (RG) has a low-pass characteristic or, more preferably, an integrating characteristic. Preferably, the control by the controller (RG) is performed with a first time constant $\tau_1$, while the compensation control by means of the loop filter (TP) is performed with a second time constant $\tau_2$. That is, a first sensor output signal (out) reflects the short-term changes of an alternating magnetic flux density field while a second sensor output signal (out") reflects the long-term changes or the current quasi-static operating point of the sensor system. To make this possible, preferably the first time constant ti is larger than the second time constant $\tau_2$ ($\tau_1 > \tau_2$). The controller is preferably a PI controller or another suitable controller. However, the use of other controllers is possible.

Number of Coupled NV Centers

As previously described, the coupling of the paramagnetic centers (NV1), in particular of the NV centers, leads to a sensitivity of the intensity ($I_{fl}$) of the fluorescence radiation (FL) of the paramagnetic centers (NV1) to a change in the magnetic flux density B at the location of the paramagnetic center or centers (NV1), even when the crystal alignment is decalibrated. It is therefore important that at least two, preferably at least 4, preferably at least 8, preferably at least 20, preferably at least 40, preferably at least 100, preferably at least 200, preferably at least 400, preferably at least 1000 paramagnetic centers (NV1) are coupled together to achieve this effect. Accordingly, it is useful if the previously described methods comprise one or more additional steps for coupling at least two, preferably at least 4, preferably at least 4, preferably at least 8, preferably at least 20, preferably at least 40, preferably at least 100, preferably at least 200, preferably at least 400, preferably at least 1000 paramagnetic centers (NV1). The device is thereby preferably operated at a temperature >−40° C. and/or >−0° C. and/or >20° C. in order to avoid cooling devices.

Such coupling of very many NV centers is very easy in HD-NV diamonds with a high density of NV centers.

This coupling may also be achieved via optical functional elements of the integrated circuit (IC), for example optical waveguides fabricated in micro-optics on or in the integrated circuit (IC), and/or via optical functional elements of the package.

Nonlinearity of Contrast (KT)

Contrast (KT) is understood here as maximum intensity ($I_{fl}$) of fluorescence radiation (FL) at magnetic flux density B of this maximum intensity ($I_{fl}$) of fluorescence radiation (FL) divided by limit value of intensity ($I_{fl}$) of fluorescence radiation (FL) towards large magnetic flux densities B (See FIG. 28).

The contrast (KT) depends non-linearly on the intensity ($I_{pmp}$) of the pump radiation (LB). To achieve maximum contrast (KT), the following measures are therefore important and useful:

i. Maximizing the pump radiation power of the pump radiation source (PL1), ii. Maximizing the rate of increase of the pump radiation power of the pump radiation source (PL1) when the pump radiation source (PL1) is switched on, in order to avoid low, non-zero pump radiation intensities ($I_{pmp}$) of the pump radiation (LB), iii. Maximizing the rate of decay of the pump radiation power of the pump radiation source (PL1) when the pump radiation source (PL1) is switched off, in order to avoid low, non-zero pump radiation intensities ($I_{pmp}$) of the pump radiation (LB), iv. Minimizing the irradiated sensor element volume by focusing the pump radiation (LB) by means of collimator optics preferably to a focal point in the size of less than 100 better less than 50, better less than 20, better less than 10, better less than 5, better less than two better less than one, better less than half a pump radiation wavelength ($\lambda_{pmp}$) of the pump radiation (LB), v. Minimizing the irradiated sensor element volume by minimizing the thickness of the volume of the sensor element filled with paramagnetic centers (NV1) or groups (NVC) of paramagnetic centers (NV1) to less than two, preferably less than one, preferably half a pump radiation wavelength ($\lambda_{pmp}$) of the pump radiation (LB) as the thickness of such a volume, vi. Maximization of the density of paramagnetic centers (NV1) in the irradiated sensor element volume e.g. by using HD-NV diamonds, vii. Maximization of the coupling of the pump radiation power ($I_{pmp}$) of the pump radiation (LB) of the pump radiation source (PL1) preferably by favorable selection of the angle of incidence with respect to the surface (OFL1) of the sensor element, in particular the surface (OFL1) of a diamond in the case of the use of a diamond as sensor element, and if necessary by anti-reflection measures and/or characteristic impedance adjustments and if necessary by taking into account interference due to reflections within the sensor element.

The pump radiation sources (PL1) are preferably operated pulse-modulated, i.e. pulsed. As limiting operating parameters of the pump radiation source (PL1), a maximum average power and a maximum operating voltage are generally specified, the exceeding of which leads to various damages to the pump radiation source (PL1). In order to achieve a maximum pump radiation power of the pump radiation (LB) during the irradiation of the paramagnetic centers (NV1), it was recognized that, in order to further maximize the contrast (KT), it is useful to operate the pump radiation source (PL1) pulsed with maximum operating voltage for a short time and, for this purpose, to increase the interval between the pulses to such an extent that the maximum average power of the pump radiation source (PL1) is again undershot. Thus it was recognized that, in contrast to the figures in this paper, a deviation from a 50% duty cycle of the alternating component (S5w) of the transmission signal (S5) in favor of more radiation-intensive and shorter pump radiation pulses of the pump radiation source (PL1) is useful and helpful.

Furthermore, it has been recognized that in order to optimize the pump radiation coupling of the pump radiation (LB) into the material of the sensing element, for example into an HD-NV diamond, it is favorable to perform an optical adjustment to further maximize the contrast (KT). This optical matching may comprise a manipulation of the polarization of the pump radiation (LB), for example by a $\lambda_{pmp}/4$ plate, but also the angle of incidence ($\theta_e$) of the pump radiation (LB) relative to the normal vector ($N_1$) of the surface (OFL1, OFL2) of the sensor element, but also an anti-reflective coating or matching layer (ASv, ASr) of the surface (OFL1, OFL2) of the sensor element, for example the surface (OFL1, OFL2) of an HD-NV diamond. Such an anti-reflective coating or matching layer (ASv, ASr) in terms of the present disclosure may also comprise a structuring of the surface (OFL1, OFL2) with structures smaller than the pump radiation wavelength ($\lambda_{pmp}$), which may lead to a local change of the effective average refractive index of the surface (OFL1, OFL2) of the HD-NV diamond and thus may be used for such matching.

It is also useful if, in the case of reflections of the pump radiation (LB) within the sensor element, constructive interference is achieved in particular by means of a resonator in the region of the highest density of the paramagnetic centers (NV1). If the sensor element is, for example, a HD-NV diamond in the form of a flat platelet, into the upper side of which the pump radiation (LB) of the pump radiation source (PL1) is incident, for example perpendicularly, via its first surface (OFL1), and if the first surface (OFL1) of the upper side is plane-parallel to the second surface (OFL2) of the lower side, viewed optically, it is particularly advantageous if the thickness of the platelet is chosen such that the platelet of the Fabry-Pérrot interferometer thus formed has a maximum transmission of the first surface (OFL1) for radiation of the pump radiation wavelength ($\lambda_{pmp}$), since then the entire pump radiation power or at least a maximum of the pump radiation power penetrates into the platelet. The paramagnetic centers (NV1), in the case of an HD-NV diamond these are NV centers, are preferably arranged in a thin preferably layered group (NVC) of paramagnetic centers in the plane of the maximum pump radiation amplitude within the resonator thus formed in the form of the Fabry-Pérrot resonator exemplified herein. If the sensor element platelet, here an exemplary diamond platelet, has a greater thickness, there may also be, for example, a plurality of planes of maximum pump radiation intensity ($I_{pmp}$) of the pump radiation (LB) in this irradiation situation of a perpendicular incidence of the pump radiation (LB) on the first surface (OFL1) of the sensor element platelet within the Fabry-Pérot resonator of the sensor element platelet. The paramagnetic centers (NV1), in the case of a HD-NV diamond these are NV centers, are then preferably arranged in several thin, preferably layered groups (NVC) (clusters) of paramagnetic centers (NV1) and preferably on an extension d of such groups (NVC) of paramagnetic centers (NVC) in this plane of maximum pump radiation amplitude within the Fabry-Pérrot resonator. In order to double or better multiply the utilized pump radiation power ($I_{pmp}$) of the pump radiation source (PL1), it is useful to mirror the second surface (OFL2) on the bottom side of the sensing element platelet to induce total reflection. Due to the antireflective layer or front matching layer (ASv) of the first surface (OFL1) at the upper side of the sensor element wafer, the coupling of the pump radiation (LB) from the pump radiation source (PL1) is optimized with respect to the losses. Since the fluorescence radiation (FL) must also be coupled out, the transmission of the Fabry-Pérrot interferometer must be constructed in such a way that this can leave the sensor element platelet, i.e. for example the HD-NV diamond platelet, again at a predetermined angle with good transmission.

For minimizing the rise and fall times of the intensity ($I_{pmp}$) of the pump radiation (LB) of switched laser diodes for further maximization of the contrast (KT), special reference is made here to the reduction of parasitic inductances and capacitances, the increase of the operating voltage and the controlled, fast regulation of the diode current of the diode laser serving as pump radiation light source (PL1) when driving the pump radiation source (PL1).

Preferably, to further maximize the contrast (KT), the high density of paramagnetic centers (NV1) is generated only in a thin layer below the first surface (OFL1) of the sensing element, for example in a thin layer in a HD-NV diamond, while the remaining volume preferably has no paramagnetic centers (NV1) or only a few paramagnetic centers (NV1).

To further maximize the contrast (KT), the same first surface (OFL1) of the sensor element, for example of an HD-NV diamond, is preferably used for the exit of the fluorescence radiation (FL), via which the pump radiation (LB) also entered the sensor element (i.e., for example, into the HD-NV diamond).

Sensor System with Holding Circuit

The previously explained holding circuit (S&H) can in itself lead to a considerable improvement.

Furthermore, the proposal presented herein therefore comprises an integrated circuit (IC) for use with a paramagnetic center (NV1) in the material of a sensor element having a driver for driving a pump radiation source (PL1) for pump radiation (LB) and having a receiver (PD1), for detecting fluorescence radiation (FL) of the paramagnetic center (NV1) and/or of the paramagnetic centers (NV1) or of the group or groups (NVC) of paramagnetic centers (NV1), and having a drive and evaluation unit (LIV) for generating a sensor output signal (out) which depends on the fluorescence radiation (FL) of the paramagnetic center (NV1) in the material of a sensor element. In this regard, the sensor element is preferably a diamond crystal. The paramagnetic center(s) (NV1) are preferably one or more NV centers and/or one or more groups of NV centers in one or more diamond crystals.

The radiation receiver (PD) is preferably provided and adapted to substantially not detect the pump radiation (LB) in the sense of said selectivity. The integrated circuit (IC) further preferably comprises a drive and evaluation unit (LIV) (M1, TP, M2, G) for generating a sensor output signal (out) which depends on the fluorescence radiation (FL) of the paramagnetic center (NV1) in the material of a sensor element and/or quantum technological device element. The integrated circuit (IC) now preferably additionally comprises said holding circuit (S&H). The holding circuit (S&H) thereby has an input and an output. The holding circuit (S&H) is thereby preferably inserted in the signal path between the radiation receiver (PD) and the sensor output signal (out). Preferably, a holding circuit (S&H) is inserted in the signal path between the first multiplier (M1) and the loop filter (TP), which may also be implemented as an integrator, and/or after the loop filter (TP) and/or integrator. The holding circuit (S&H) thereby keeps its output signal substantially constant at its output in first time periods, thus virtually freezing it. In second time periods, which are different from the first time periods, the holding circuit (S&H) changes its output signal at its output as a function of the signal at its input in such a way that it then has an output signal whose output value is linearly dependent, substantially preferably in the form of a linear mapping, on the input value at the input of the holding circuit. It is thus quasi-transparent in these second time periods.

Preferably, the sensing element and/or quantum technological device element is a diamond crystal, wherein preferably the paramagnetic center (NV1) is a NV center and/or a ST1 center in the diamond crystal.

Regulation of the Radiation Source (H)

Previously, the intensity ($I_{pmp}$) of the pump radiation (LB) of the pump radiation source (PL1) was kept constant and the intensity ($I_{ks}$) of the compensating radiation (KS) of the compensating radiation source (PLK), which was modulated in a complementary manner to the pump radiation (LB), was readjusted in such a way that the receiver output signal (S0) of the radiation receiver (PD) no longer had any components of the transmission signal (S5) except for signal noise and a control error.

In contrast to this, the intensity ($I_{ks}$) of the compensation radiation (KS) of the compensation radiation source (PLK) is now kept constant and the intensity ($I_{pmp}$) of the pump radiation (LB) of the pump radiation source (PL1), which is modulated in a complementary manner to the compensation radiation (KS), is readjusted in such a way that the receiver output signal (S0) of the radiation receiver (PD) no longer has any components of the compensation transmission signal (S7) except for signal noise and a control error and possibly a DC component.

In the method for operating a sensor system and/or quantum technological system presented herein before, the sensor system and/or quantum technological system comprises one or more paramagnetic centers (NV1) or one or more groups (NVC) of paramagnetic centers (NV1) in the material of a sensor element and/or quantum technological device element which is part of the sensor system and/or quantum technological system. The method comprises as a step the modulated emission of a modulated compensation radiation (KS) by the compensation transmitter (PLK), this modulation of the intensity ($I_{ks}$) of the compensation radiation (KS) of the compensation transmitter (PLK) being modulated by means of a compensation emission signal (S7) controlling the compensation transmitter (PLK). Thus, this method now controls by means of the transmission signal (S5) and not by means of the compensation transmission signal (S7), in contrast to the previously presented method. The compensation transmission signal (S7) is thus operated quasi-statically unchanged in this method. However, both basic methods can be combined, in which case a rule must be specified in which way the compensation transmission signal (S7) and/or the transmission signal (S5) are to be controlled. In the example now discussed in this section, the transmission signal (S5) is controlled instead of the compensation transmission signal (S7). These control methods can be mixed. Controlling the transmission signal is useful when the intensity ($I_{fl}$) of the fluorescent radiation (FL) is high, while controlling the intensity ($I_{ks}$) of the compensation radiation (KS) is typically useful when the intensity ($I_{fl}$) of the fluorescent radiation (FL) is low. Switching between these both control modes is typically performed as a function of the intensity ($I_{fl}$) of the fluorescence radiation (FL) and the intensity ($I_{ks}$) of the compensation radiation (KS). Therefore, the method discussed herein in this section comprises generating a modulated fluorescence radiation (FL) by means of one or more paramagnetic centers (NV1) or by means of one or more groups (NVC) of paramagnetic centers (NV1) in a material of a sensor element and/or quantum technological device element, which depends on a modulated pump radiation (LB) and possibly on further parameters, in particular on the magnetic flux density B. A superimposed, in particular summing superimposed, reception of the modulated fluorescence radiation (FL) and the compensation radiation (KS) and the generation of a receiver output signal (S0) as a function of this superimposition in the radiation receiver (SD) now also take place here. In an analogous manner, a correlation of the receiver output signal (S0) with the compensation transmission signal (S7) is now performed, in particular with the aid of a synchronous demodulator (M1, TP), to form a filter output signal (S4). There now preferably follows the sampling of the filter output signal (S4), in particular by means of a hold circuit (S&H), with determination of a sequence of samples. Hereby, the traces of the compensation transmission signal (S7) in the sensor output signal (out) are erased or massively suppressed. This is followed by the use of the sequence of the sampled values cleaned in this way as the sensor output signal (out). Now a complex feedback signal (S8) modulated with the compensation transmission signal (S7) is generated with the aid of this sensor output signal (out) and the transmission signal (S5) is formed from the feedback signal (S8), in particular by offset addition and/or power amplification. Then a pump radiation source (PL1) is controlled by means of the transmission signal (S5) formed in this way, and the pump radiation source (PL1) for pump radiation (LB), in particular by an LED or by a laser, emits a pump radiation (LB) which is modulated in a manner complementary to the compensation transmission signal (S7) and whose intensity ($I_{pmp}$) is controlled as a function of the transmission signal (S5).

Preferably, the correlation is performed with the steps of multiplying the receiver output signal (S0) by the compensation transmission signal (S7) to form the filter input signal (S3) and filtering and/or integrating the filter input signal (S3) with a loop filter (TP) and/or integrator to form the filter output signal (S4), wherein in particular the filter output signal (S4) may be multiplied by a factor −1.

Preferably, the complex feedback signal (S8) is formed by multiplying the filter output signal (S4) by the compensation transmission signal (S7) to form the complex feedback signal (S8).

The amplification, the frequency responses of the components in the signal path and the signs within the respective transfer functions of the signal processing components, i.e. the device parts, of the control loop are selected in such a way that stability is achieved.

Applications

In important applications, such as the measurement of the position of device parts in operating elements, machines, robots, electric motors or internal combustion engines, the generation and/or modification and/or modulation of the magnetic field in the form of the magnetic flux density B can be periodic. Thereby, the periodicity can be due to an electrical and/or mechanical oscillation and/or a mechanical movement along a closed path.

In this description, the term sensor system also includes systems that exploit quantum properties in general. This relates in particular to systems which carry out modifications to quantum states of the paramagnetic centers and/or evaluate and/or detect and output. These systems are part of the technical teachings disclosed herein.

The principles and features set forth in this disclosure may be combined to the extent that the result is useful.

The detection and recording of acoustic mechanical vibrations can be performed achromatically without affecting the mechanical vibrations. In addition, the sensors show no signs of aging, can be used in harsh environments such as air with high concentrations of salt water, ionizing radiation or high temperature. The sensors can be miniaturized to a volume of 10 μm$^3$ and the sensor is separated from the electrical evaluation unit by a light guide so that it can be used for medical purposes, for example.

A housing, as proposed here, and the sensor built on top of it enables, at least in some realizations, the compact design and the combination of conventional circuit technology with quantum sensor technology. However, the advantages are not limited to this.

BRIEF DESCRIPTION OF THE DRAWINGS

The features and further advantages of the present disclosure will become clear below with reference to the description of examples in connection with the figures. Thereby, purely schematically:

FIG. 50 shows a basic process sequence for manufacturing a sensor system.

FIG. 51 shows the exemplary sequence of FIG. 50a once again with various additional steps.

FIG. 69 shows exemplary steps for the assembly process of FIGS. 58 to 68.

FIG. 70 shows an exemplary assembly of several flat coils, as they are preferably used in the integrated circuit (IC), for example as its sub-device for generating magnetic fields with multipole moments and/or for modifying the direction of the magnetic flux B at the location of the paramagnetic center (NV1).

FIG. 80 shows a block diagram of an exemplary quantum sensor system with an exemplary schematically indicated three-bit quantum register.

(string) with stationary field sources (MQ1, MQ2) of the magnetic field and mechanically vibrating device parts of the magnetic circuit.

Figure 85:
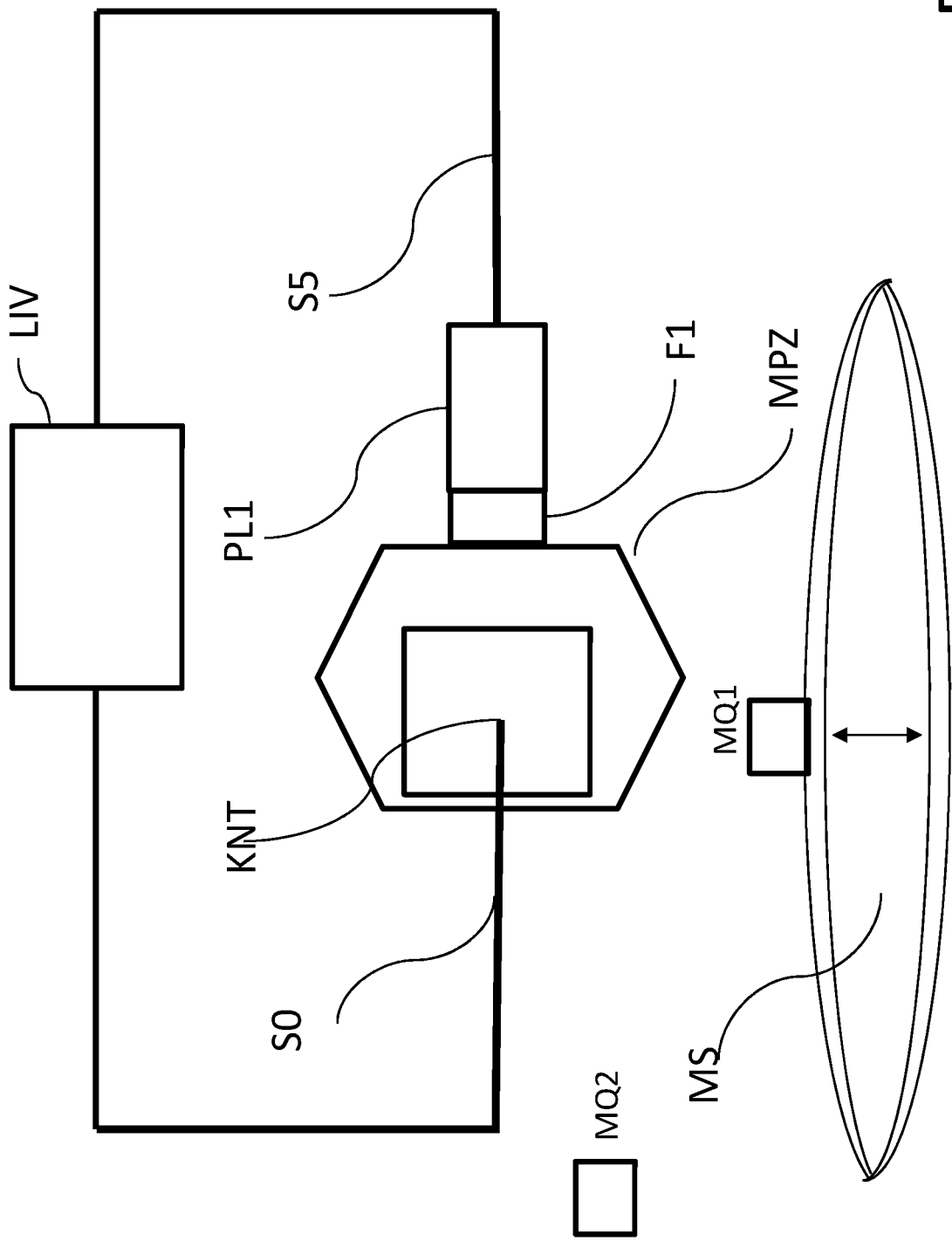

FIG. 85 shows the design of an exemplary sensor system with direct reading of the photoelectrons via a contact (KNT).

Figure 86:
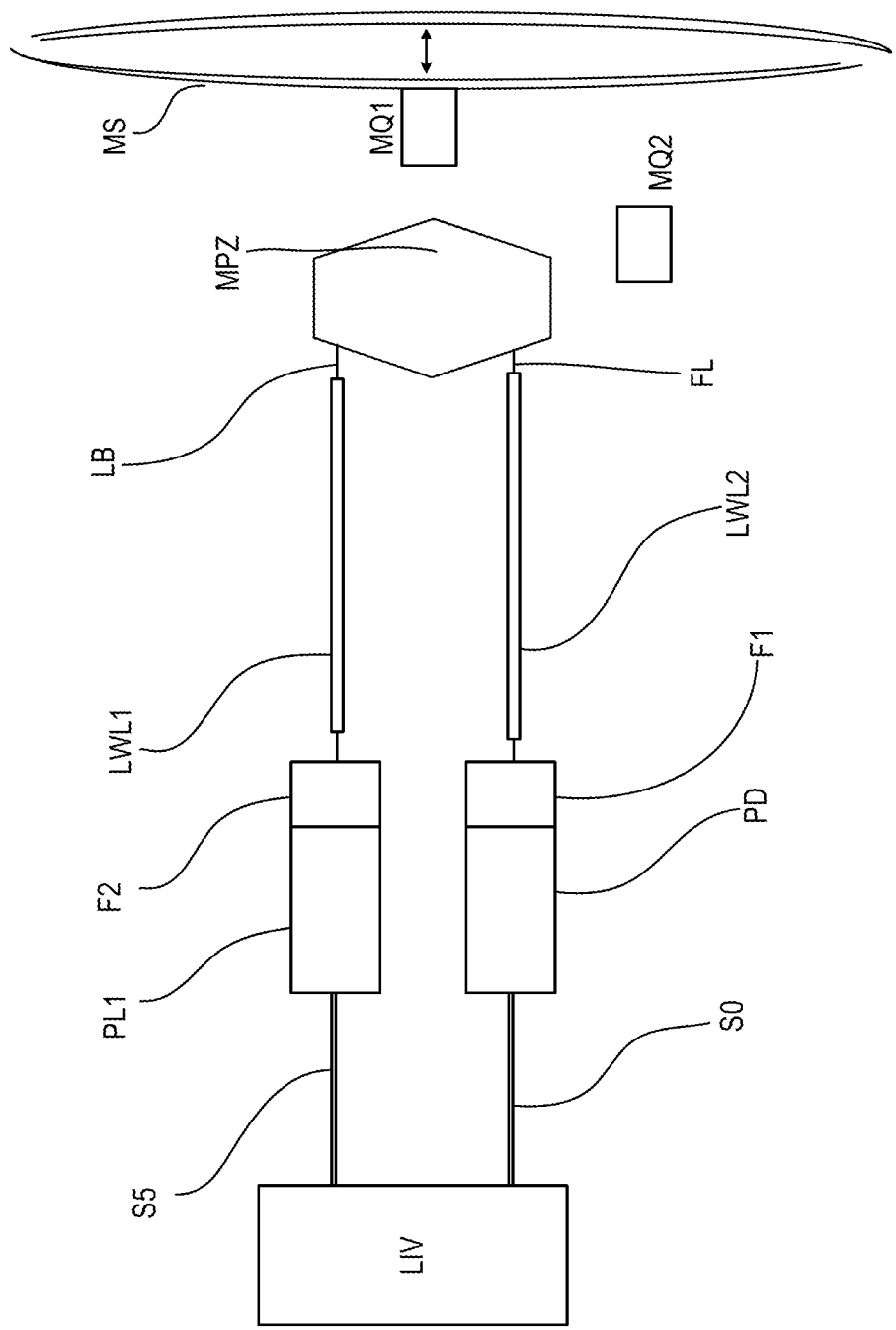

FIG. 86 shows the sensor system in which the sensor element with the diamagnetic material (MPZ) and the paramagnetic center or centers (NV1) contained therein is separated from the pump radiation source (PL1) and the light-sensitive radiation receiver (PD), as well as the evaluation circuit (LIV) by a first optical waveguide (LWL1) and a second optical waveguide (LWL2). FIG. 86 shows the material (MPZ) with paramagnetic centers (NV1) separated by a first optical fiber (LWL1) from the pump radiation source (PL1) with the optional second filter (F2) and separated by a second optical fiber (LWL2) from the radiation receiver (PD) with a first filter (F1).

Figure 87:
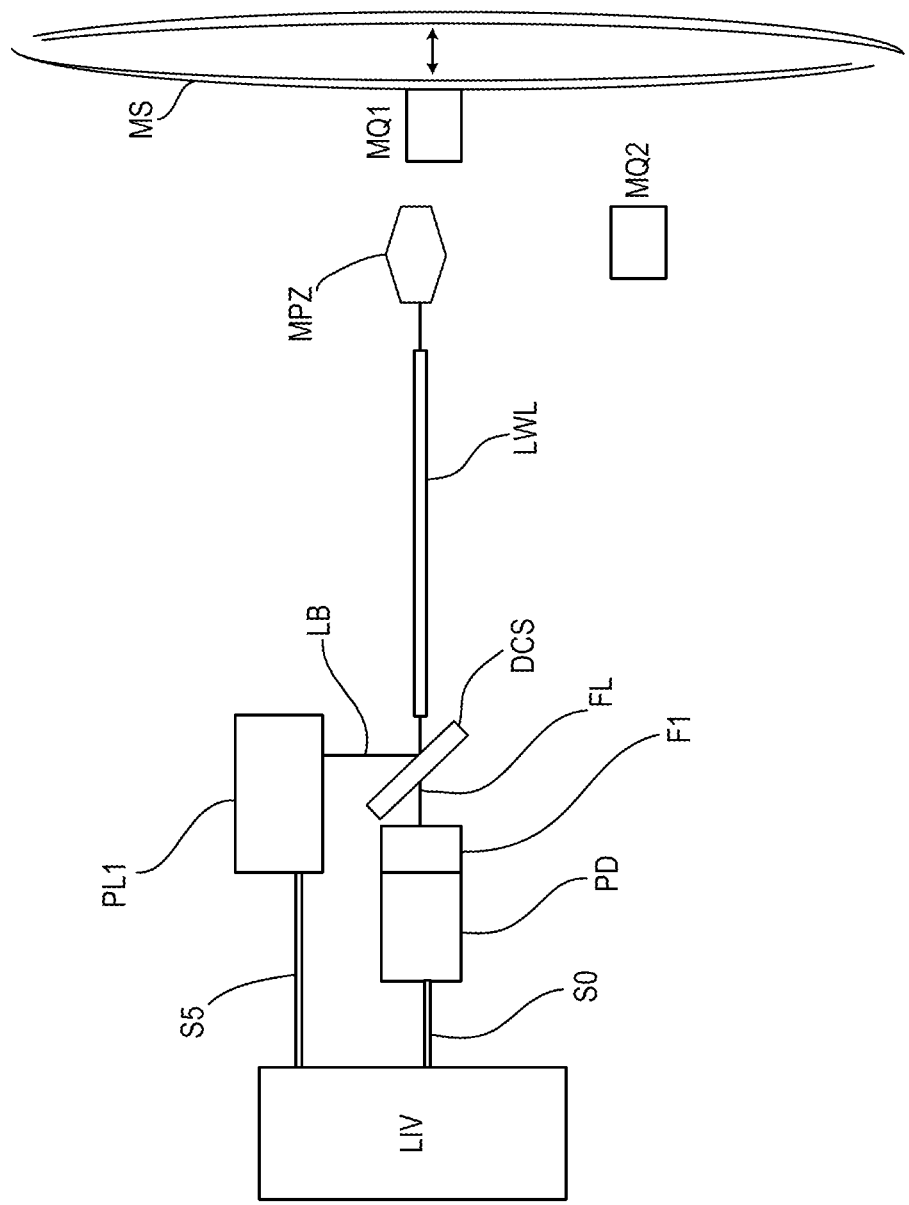

FIG. 87 shows a proposed sensor system in which the sensor element with the diamagnetic material (MPZ) is separated from the radiation source (PL1) and the light-sensitive radiation receiver (PD) by a common optical waveguide (LWL2) with the paramagnetic center or centers (NV1).

Figure 88:
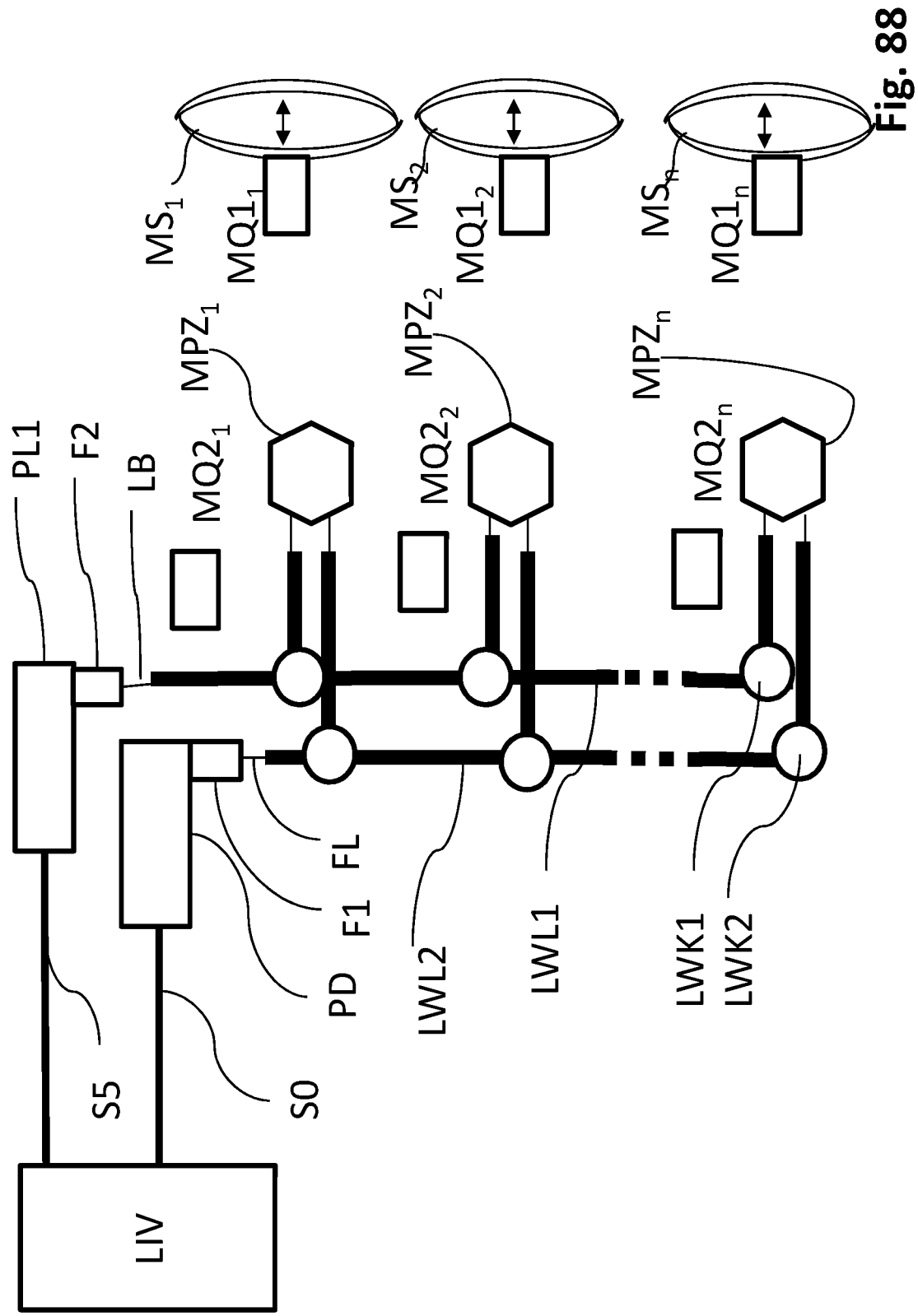

FIG. 88 shows an example of a sensor system with several measuring systems and an electronic evaluation unit (LIV). FIG. 88 shows the design according to the proposed method with a number n of oscillating subsystems (MS1, MS2 . . . MSn) of a mechanical oscillating system (MS) with n first field sources for magnetic or electrostatic fields (MG11, MG12, . . . , MG1n) coupled correspondingly to the respective subsystem of the n subsystems (MS1 to MSn) and n sensor elements with a respective diamagnetic material (MPZ1, MPZ2, . . . , MPZn) with respective paramagnetic centers (NV1).

Figure 89:
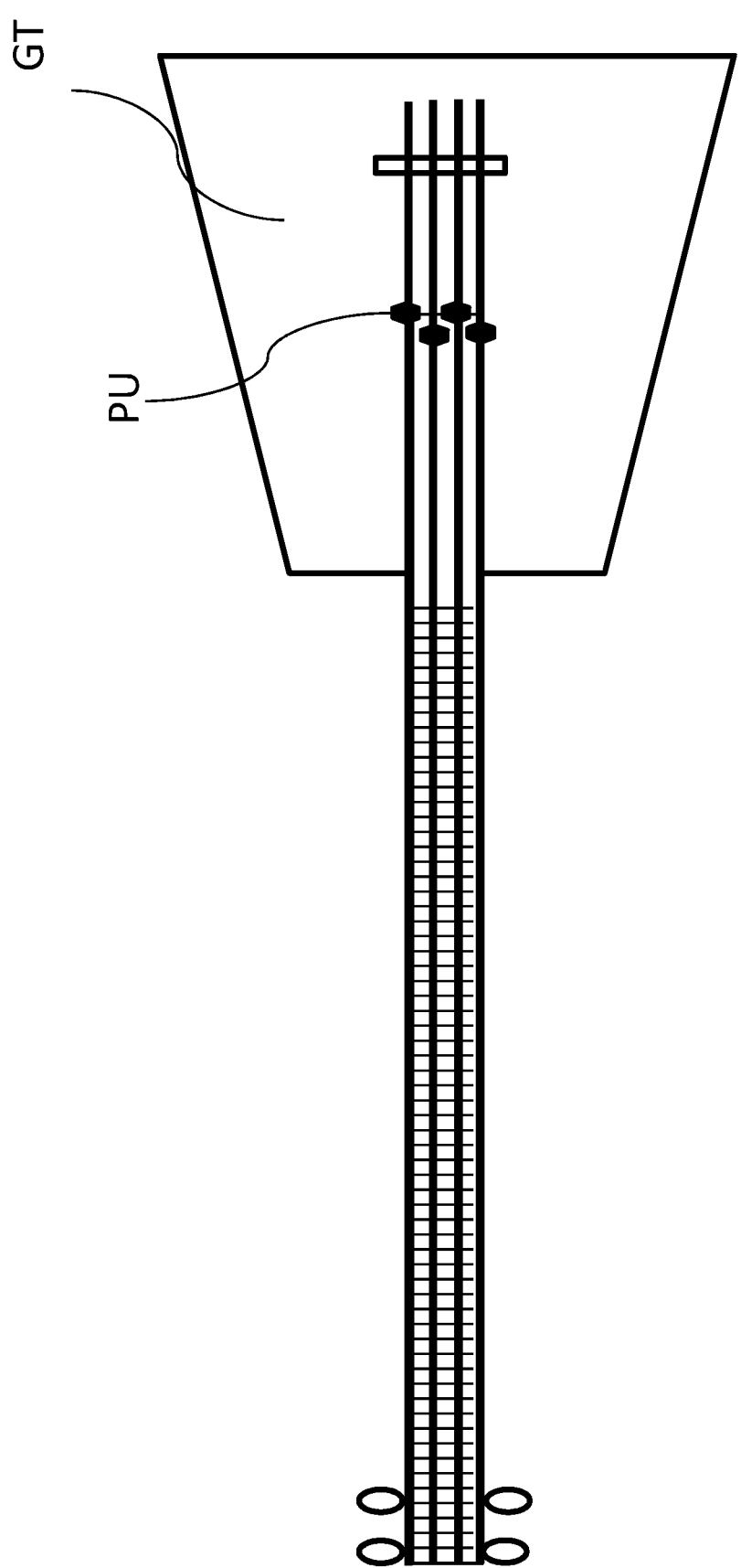

FIG. 89 shows the structure of a pickup (PU) of a guitar (GT) according to the proposal. FIG. 89 shows an exemplary electric guitar (GT) as an application of a sensor system according to the proposal.

Figure 90:
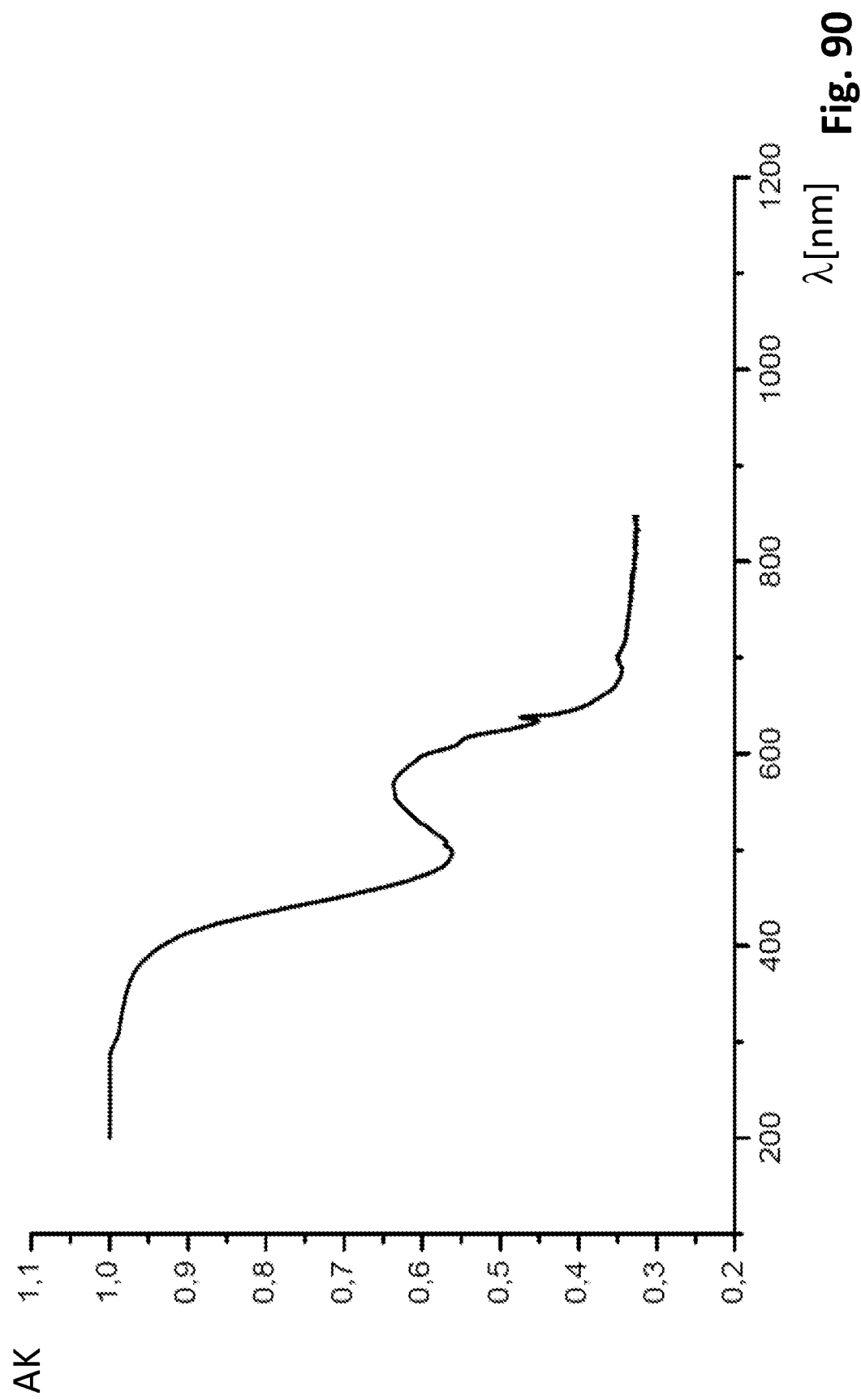

FIG. 90 shows the absorption spectrum of a diamond according to the disclosure recorded at room temperature.

Figure 91:
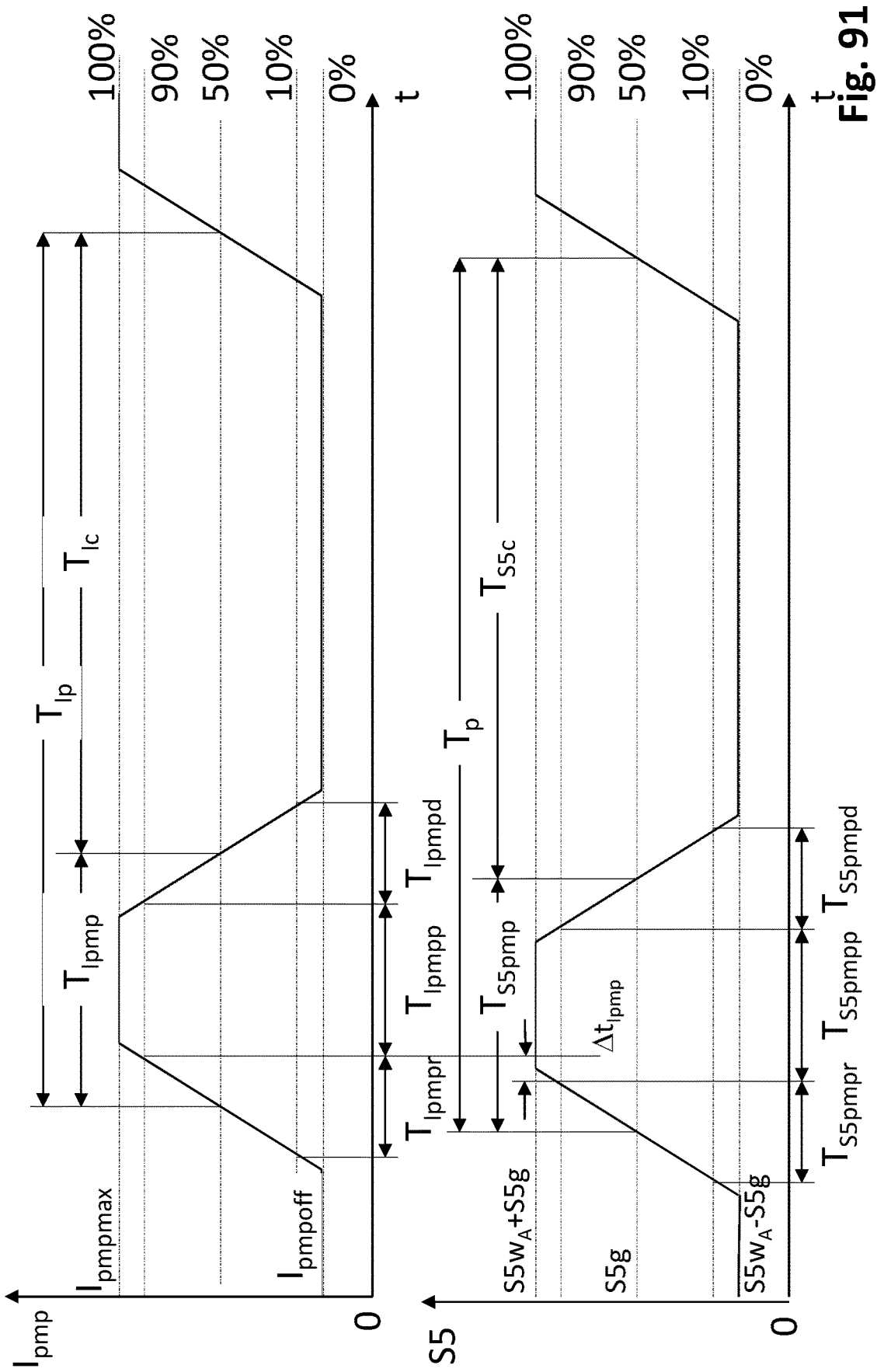

FIG. 91 illustrates the definition of times.

Figure 92:
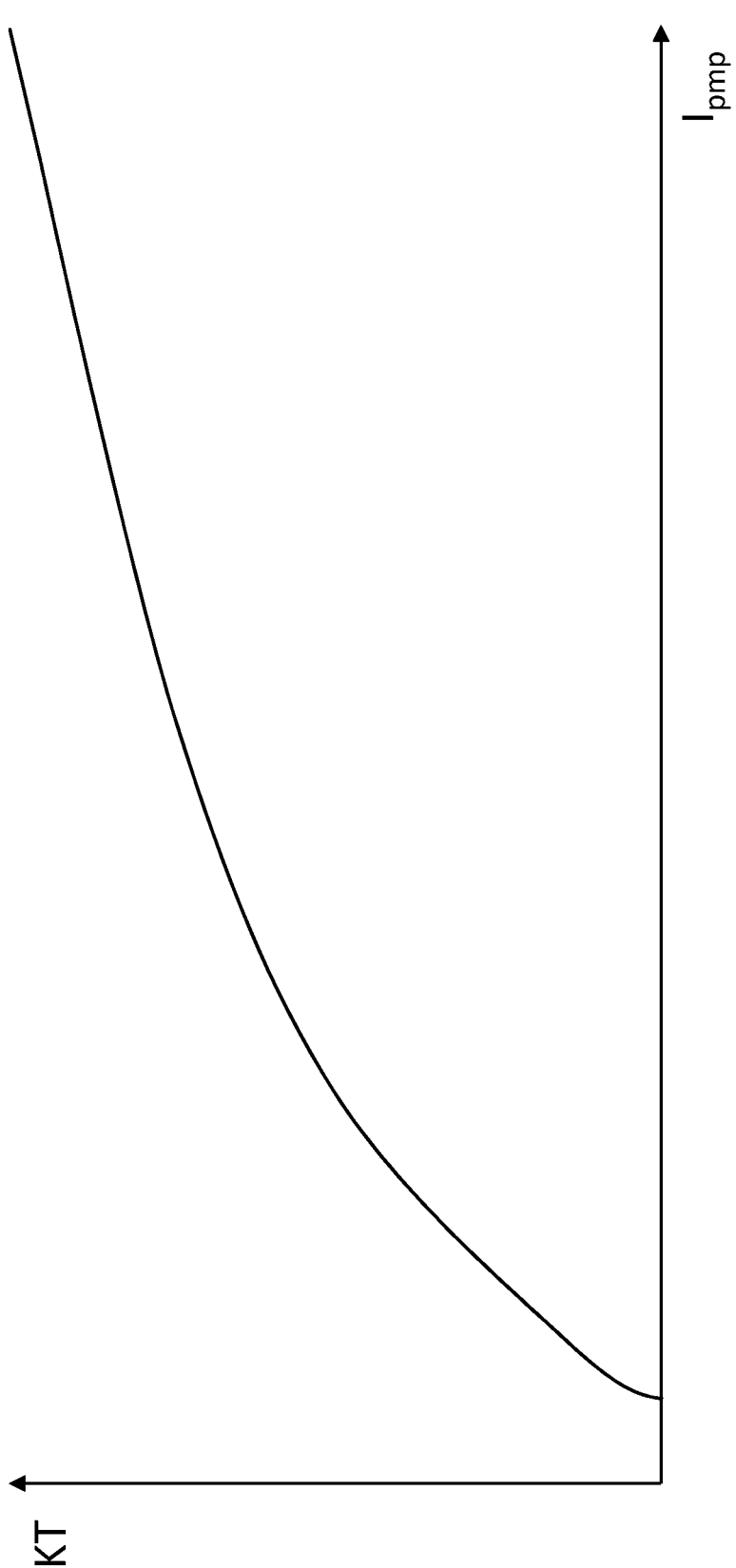
Figure 93:
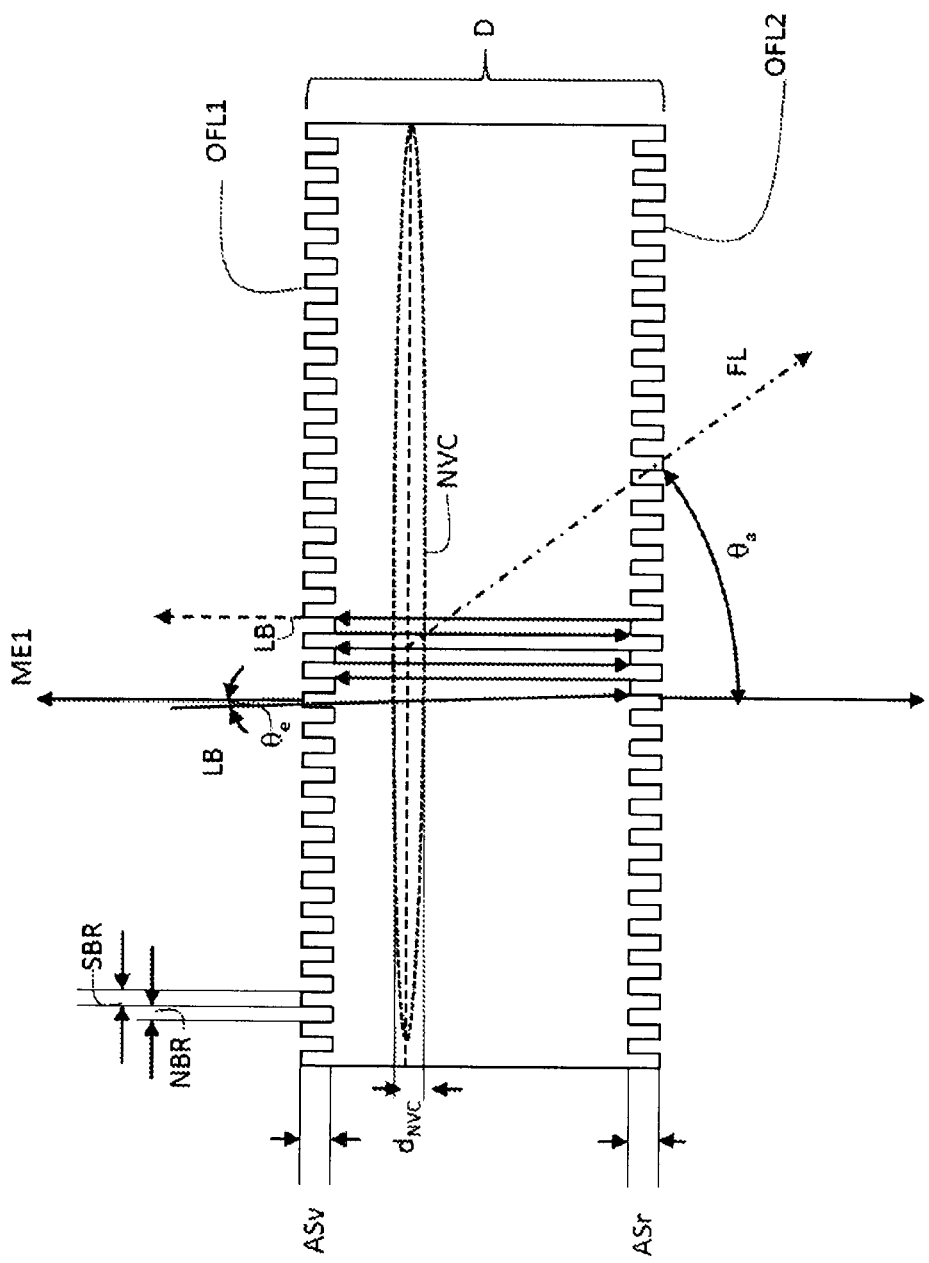

FIG. 92 shows the typical course of the contrast (KT) as a function of the intensity ($I_{pmp}$) of the pump radiation (LB) using the example of this dependence when irradiating NV centers as paramagnetic centers (NV1) with "green" pump radiation (LB);

FIG. 93 shows a substrate (D) where the fluorescence radiation (FL) is taken from a second surface (OFL2).

Figure 94:
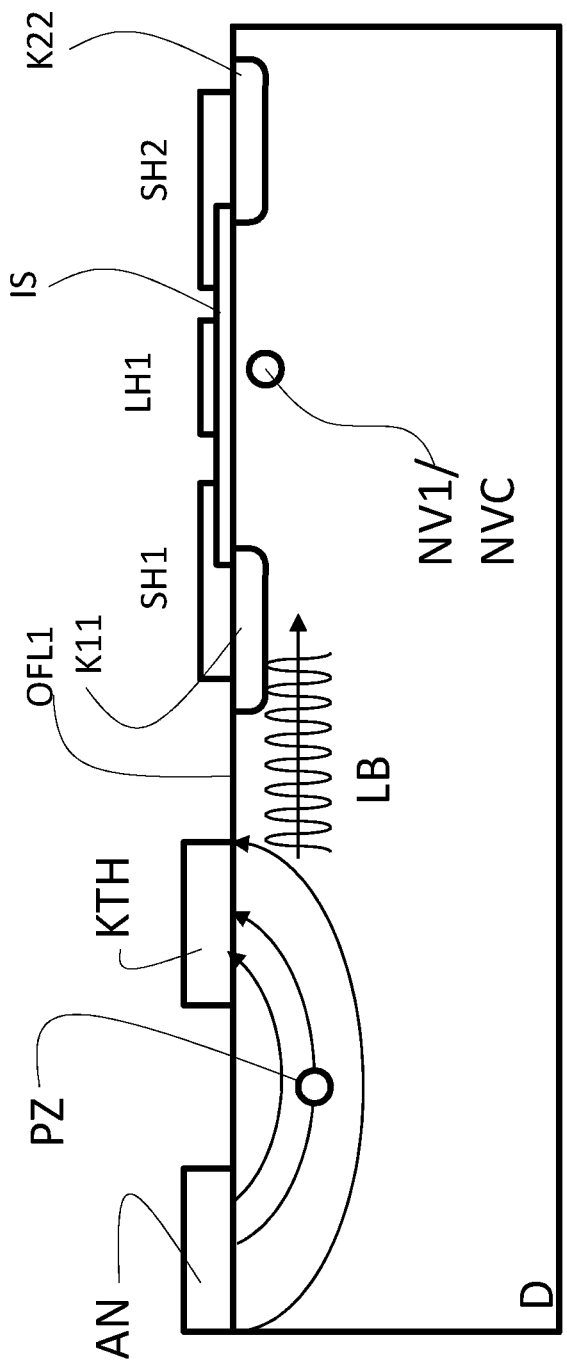

FIG. 94 shows the combination of one or more paramagnetic centers (NV1) or a group or groups (NV1) of paramagnetic centers in a semiconductor material of a semiconducting substrate (D), for example of silicon or silicon carbide, with a MOS transistor in this material, the screen lines constituting the source and drain contacts, while the line forms the gate and is insulated from the material of the substrate (D) by the gate oxide. The pump radiation (LB) is generated by a center (PZ).

Figure 95:
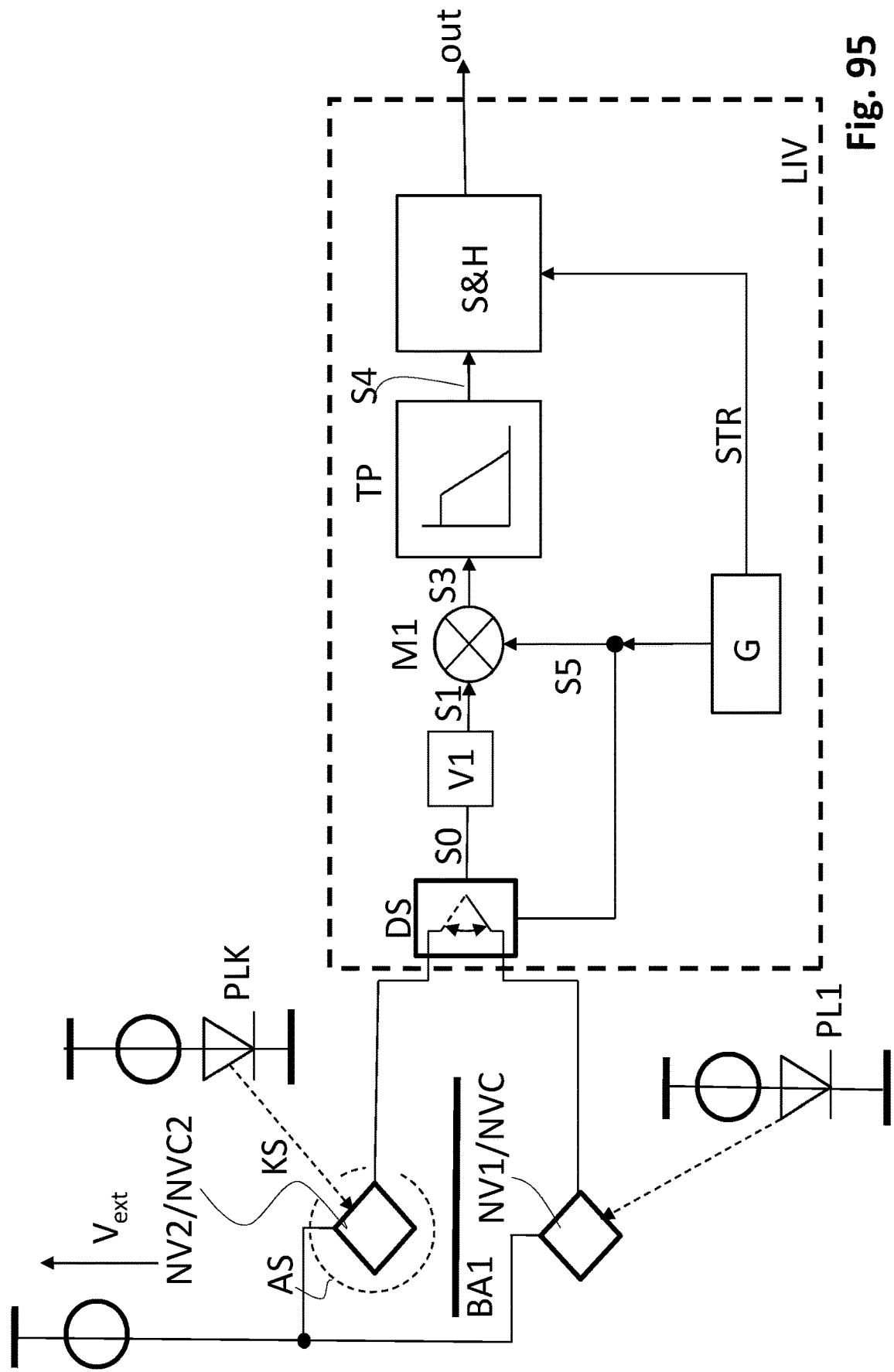

FIG. 95 shows a Dicke amplifier with a reference noise source based on one or more paramagnetic centers (NV1) or a group or groups (NV1) of paramagnetic centers (NV1).

Figure 96:
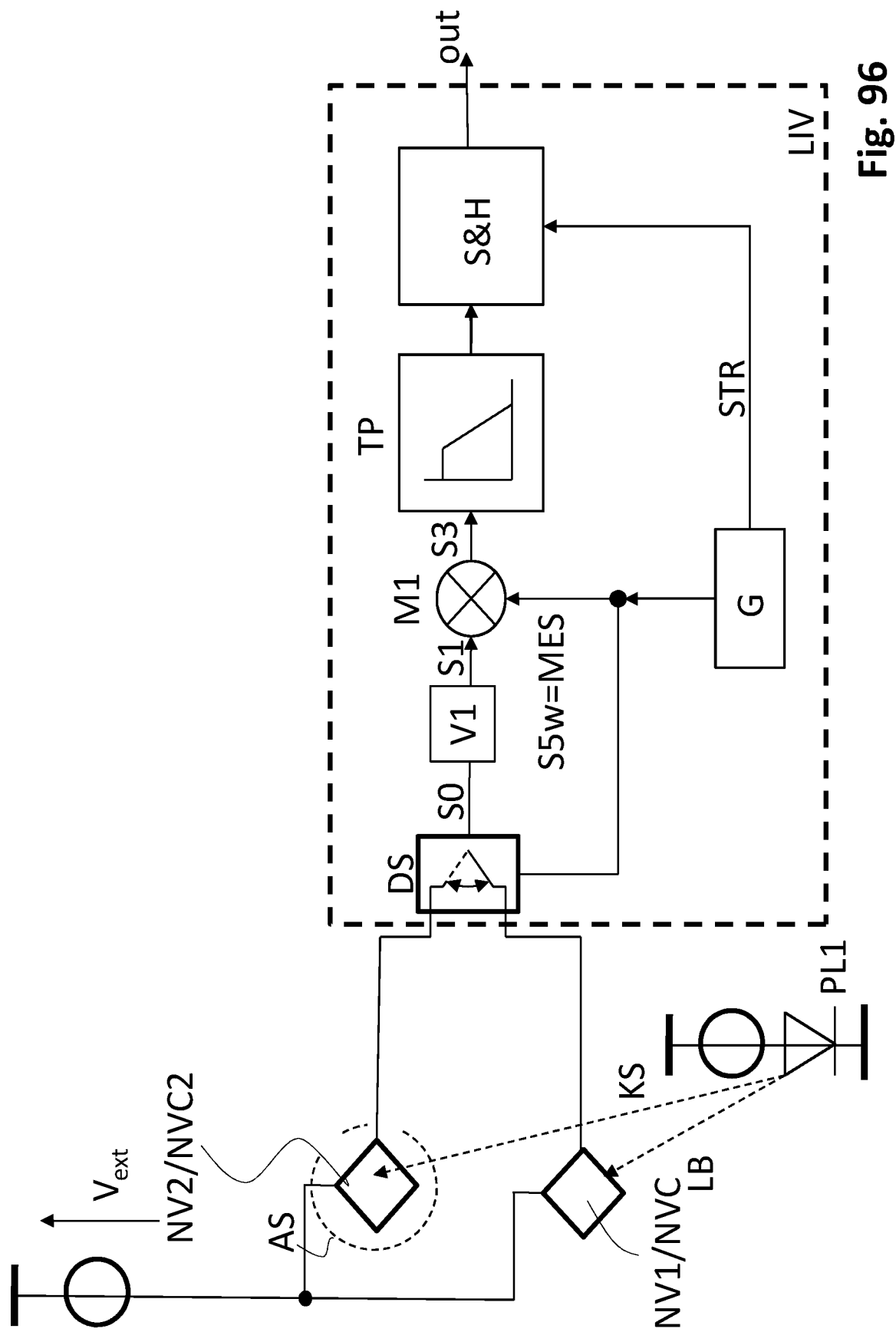

FIG. 96 shows the system of FIG. 95 with a single pump radiation source (PL1) irradiating the reference element and the sensor element together.

Figure 97:
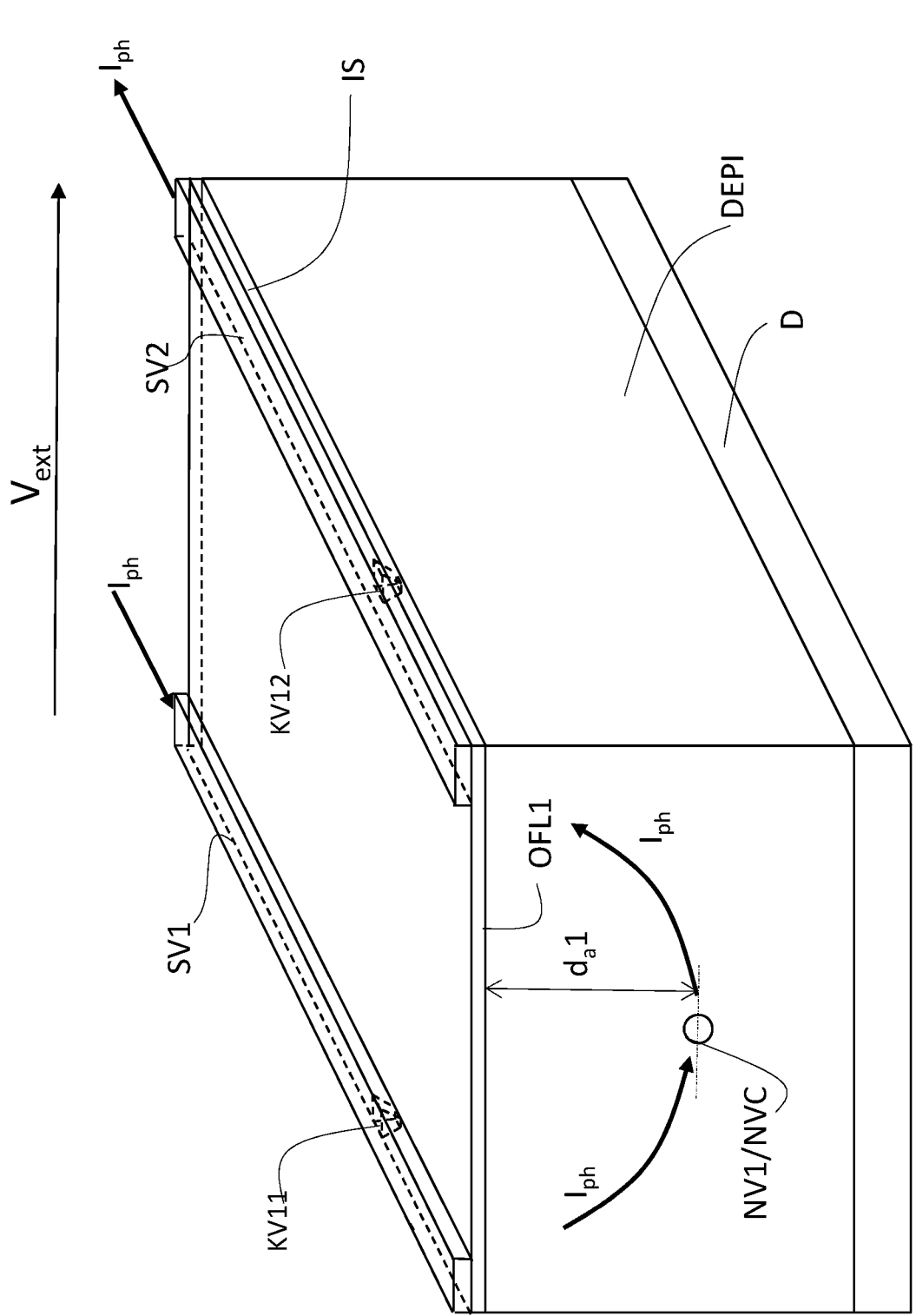

FIG. 97 shows a structure of a substrate (D) for a sensor element for reading the photocurrent of one or more paramagnetic centers (NV1) or a group or groups (NVC) of paramagnetic centers (NV1).

Figure 98:
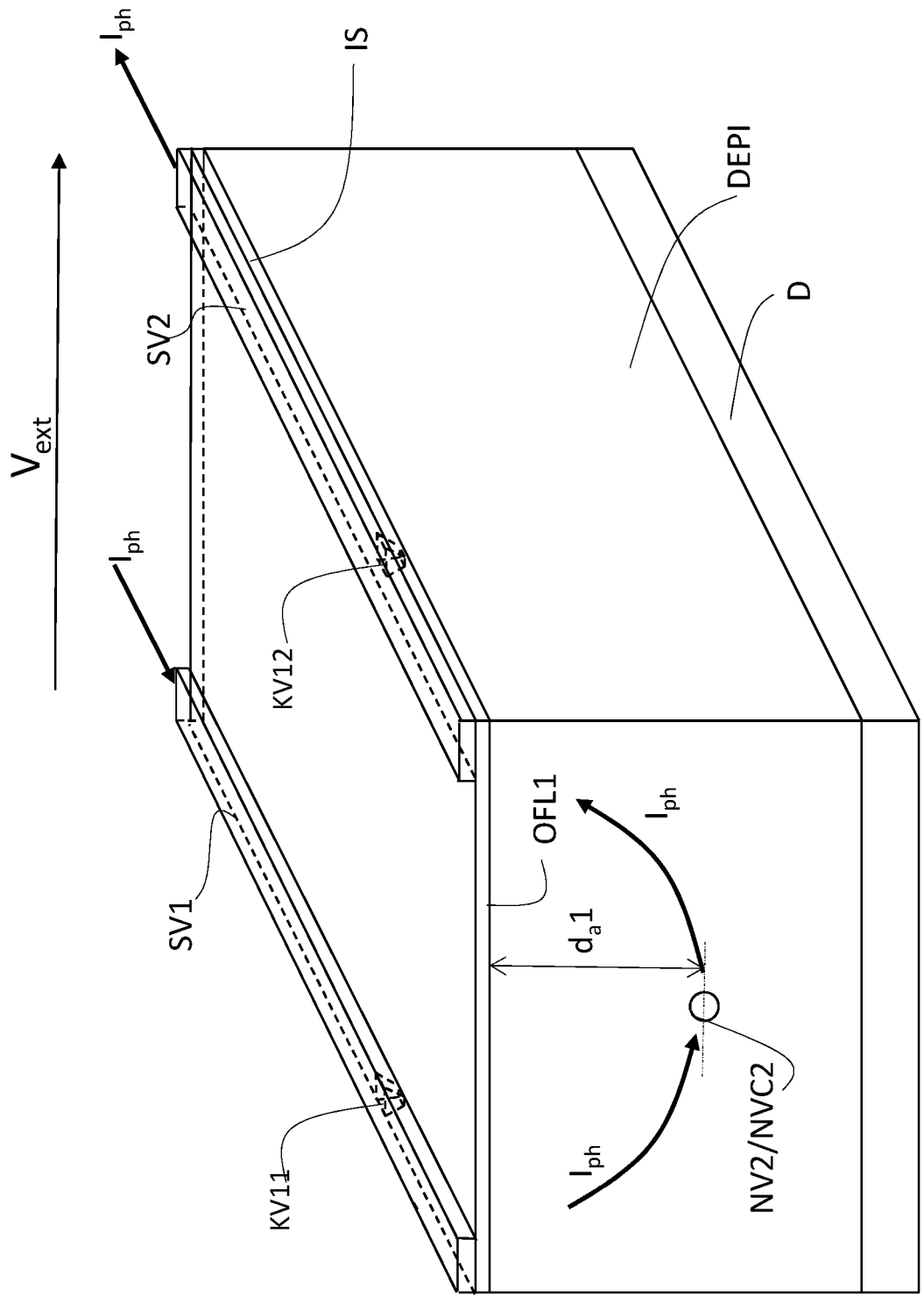

FIG. 98 shows a structure of a substrate (D) for a reference element for reading the photocurrent of one or more paramagnetic reference centers (NV2) or a group or groups (NVC2) of paramagnetic reference centers (NV2).

Figure 99:
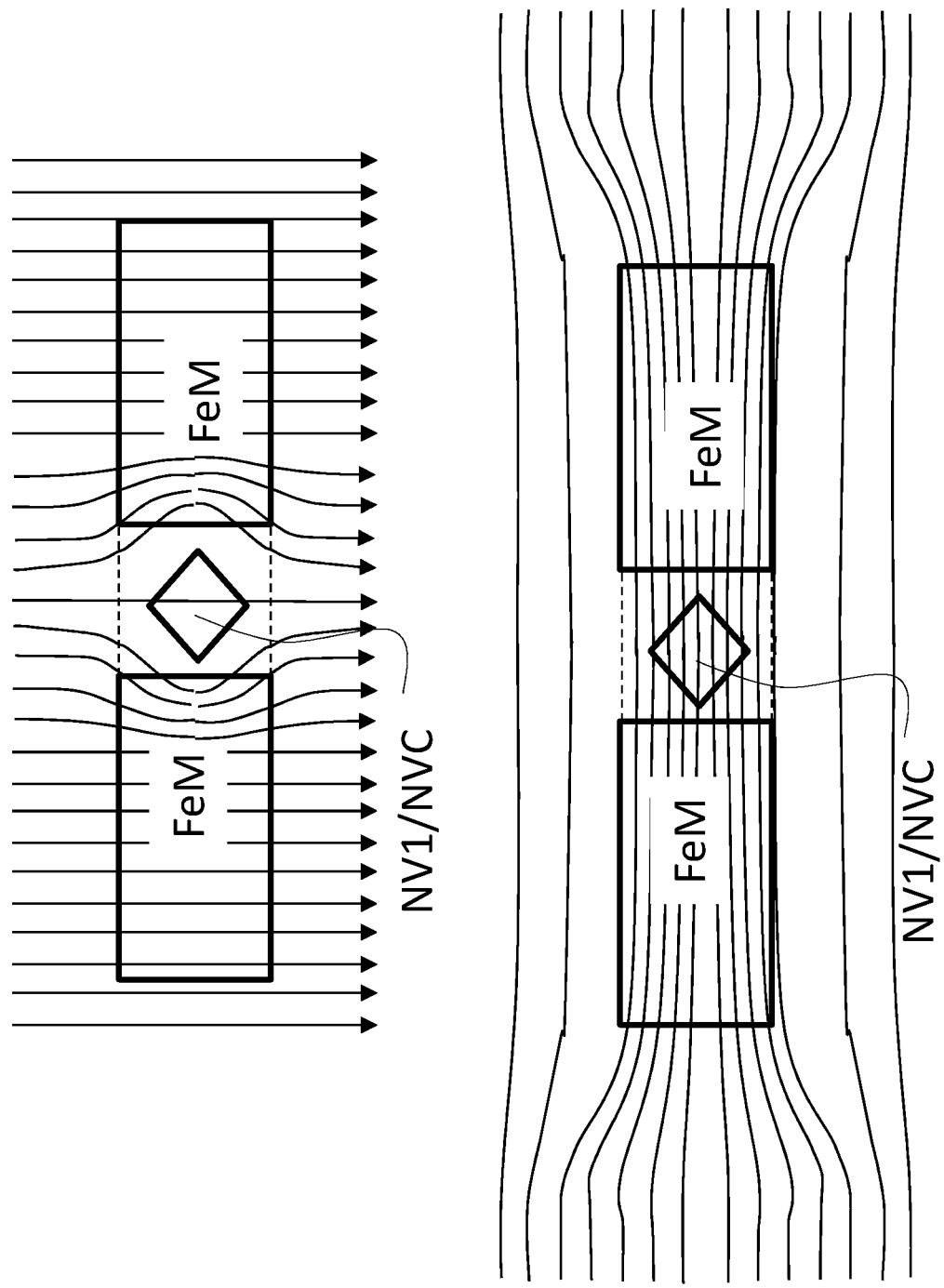

FIG. 99 shows a method for generating a directional dependence of the photocurrent or the intensity ($I_{fl}$) of the fluorescence radiation on the direction of the magnetic flux density B.

DETAILED DESCRIPTION

The figures show selected examples in a schematic and simplified manner. They serve the purpose of clarification. The features of the description and the figures can be combined with each other as far as reasonable. The stress results from the respective valid set of claims.

FIG. 1

Figure 1:
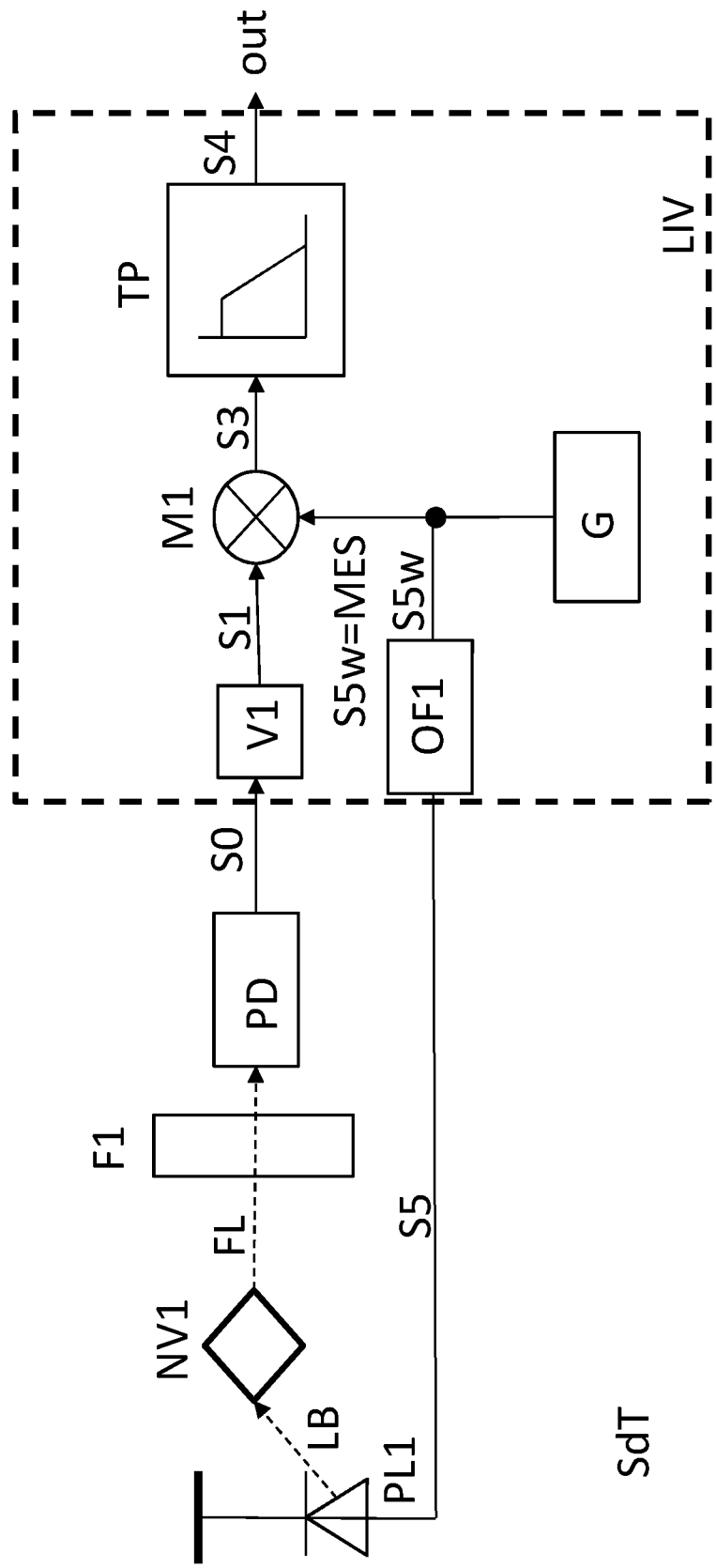
FIG. 1 shows an evaluation circuit according to the state of the art (SdT).

FIG. 1 shows a schematically simplified evaluation circuit according to the state of the art (SdT). A pump radiation source (PL1) irradiates the diamond sensor element with the NV center as paramagnetic center (NV1) with pump radiation (LB). This pump radiation (LB) causes the paramagnetic center (NV1) to emit fluorescence radiation (FL). The intensity ($I_{pmp}$) of the pump radiation (LB) from the pump radiation source (PL1) is modulated. This modulation of the intensity ($I_{pmp}$) of the pump radiation (LB) of the pump radiation source (PL1) depends on a transmission signal (S5). Preferably, the intensity ($I_{pmp}$) of the pump radiation (LB) of the pump radiation source (PL1) is substantially proportional to the value (s5) of the transmission signal (S5) in a certain operating range. The transmission signal (S5) preferably has a DC component (S5g) and an alternating component (S5w) (S5=S5g+S5w). A signal generator (G) generates the alternating component (S5w) of the transmission signal (S5). If necessary, a first matching circuit (OF1) adds a DC component (S5g) of the transmission signal (S5) to the alternating component (S5w) of the transmission signal (S5) to form the transmission signal (S5). If necessary, the first matching circuit (OF1) amplifies the sum of the DC component (S5g) and the alternating component (S5w) to form the transmission signal (S5). The first matching circuit (OF1) thus preferably performs a linear mapping of the alternating component (S5w) of the transmission signal (S5) onto the transmission signal (S5).

In reality, the modulation of the intensity ($I_{pmp}$) of the pump radiation (LB) of the pump radiation source (PL1) is distorted compared to the modulation of the transmission signal (S5), in particular due to delay times, parasitic electrical components, etc.

The fluorescence radiation (FL) radiates into a radiation receiver (PD). The radiation receiver (PD) converts the intensity ($I_{fl}$) of the fluorescence radiation (FL) into a receiver output signal (S0). The instantaneous value (s0) of the receiver output signal (S0) depends on the intensity ($I_{fl}$) of the fluorescence radiation (FL). Preferably, the value (s0) of the receiver output signal (S0) is substantially proportional to the intensity ($I_{fl}$) of the fluorescent radiation (FL) in a certain operating range. A first amplifier (V1) amplifies the receiver output signal (S0) to the reduced receiver output signal (S1). The first amplifier (V1) preferably has a frequency response such that it preferably passes and amplifies substantially only the alternating component (S5w) of the transmission signal (S5), which has a frequency different from 0 Hz, and signal components with possibly occurring allowed mixed signal frequencies, which occur when mixing the frequencies of the transmission signal (S5) with expected frequencies of the modulation of a physical quantity modulating the intensity ($I_{fl}$) of the fluorescence radiation (FL). The first amplifier (V1) can also be understood as part of the radiation receiver (PD), which is why it is generally not drawn separately in the following figures.

A first multiplier (M1) mixes the reduced receiver output signal (S1) with the alternating component (S5w) of the transmission signal (S5) to form the filter input signal (S3). A loop filter (TP) preferably allows only the DC component of the filter input signal (S3) and a useful frequency range around 0 Hz to pass. Preferably, the loop filter (TP) substantially does not pass the frequency of the alternating component (S5w) of the transmission signal (S5). Typically, the loop filter (TP) comprises an amplifier. The filter output signal (S4) of the loop filter (TP) is used as the sensor output signal (out). Since the intensity ($I_{fl}$) of the fluorescence radiation (FL) of the paramagnetic center (NV1) depends on the value of the physical parameter, for example the magnetic flux density B and/or the temperature and/or the pressure, at the location of the paramagnetic center (NV1), the value of the amplitude of the modulation of the intensity ($I_{fl}$) of the fluorescence radiation (FL) with the modulation of the alternating component (S5w) of the transmission signal (S5) also depends on the value of this physical parameter. As a result, the value of the amplitude of the modulation of the value of the receiver output signal (S0) with the modulation of the alternating component (S5W) of the transmission signal (S5) then also depends on the value of this physical parameter. As a consequence, the value of the DC component of the filter input signal (S3) depends on the value of this physical parameter. Consequently, the value of the filter output signal (S4) and thus the value of the sensor output signal (out) also depends on the value of this physical parameter, which makes it possible to use the system as a sensor system, since the value of the sensor output signal (out) can be used as a measured value for the value of this physical parameter if other influencing parameters are kept constant or are modulated only in a predetermined manner.

FIG. 2

Figure 2:
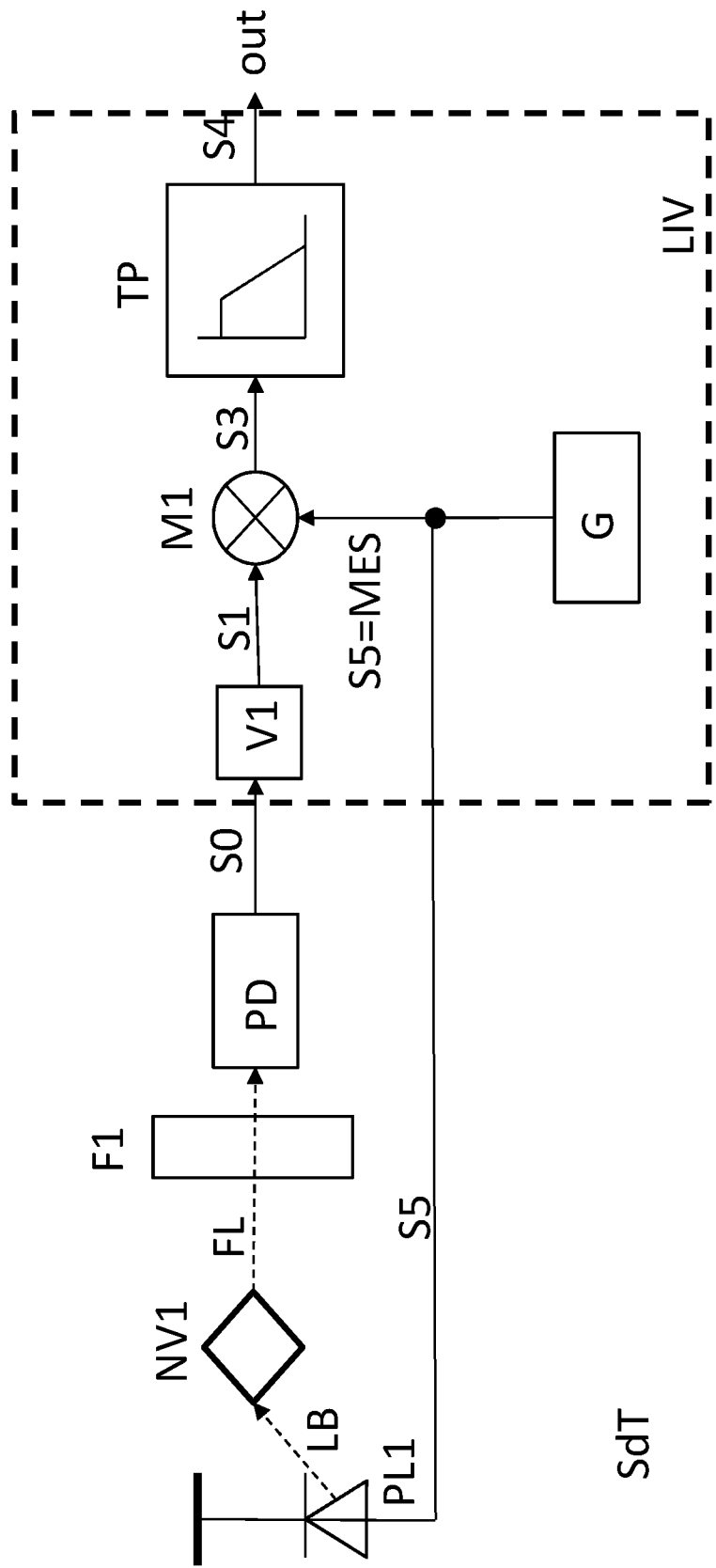
FIG. 2 shows an evaluation circuit according to the state of the art (SdT) and corresponds as far as possible to FIG. 1 with the difference that the sensor system does not comprise a first matching circuit (OF1) and the signal generator (G) directly generates the transmission signal.

FIG. 2 from the prior art corresponds to a large extent to FIG. 1 with the difference that the sensor system does not comprise a first matching circuit (OF1) and the signal generator (G) directly generates the transmission signal (S5). This design is functional if the design-related interpretation of the levels of the transmission signal (S5) by the multiplier (M1) is such that only the alternating signal component (S5w) of the transmission signal (S5) is taken into account. In the following, therefore, the representation of the matching circuit (OF1) is omitted at various points for the sake of clarity.

FIG. 3

Figure 3:
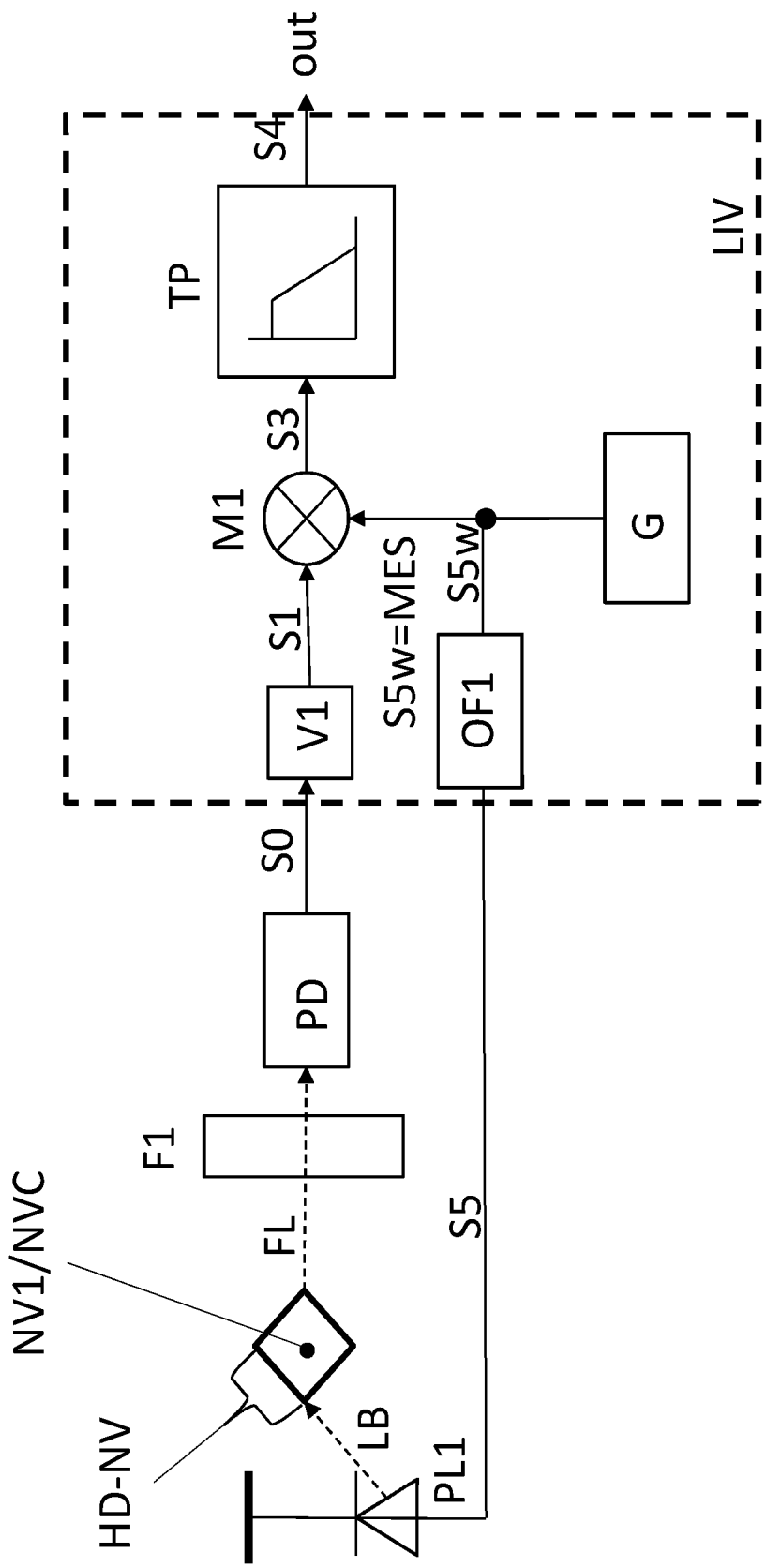
FIG. 3 shows the sensor system of FIG. 1 with the difference that now a sensor element is used which has a high density of paramagnetic centers (NV1) at least locally in a part of the sensor element.

FIG. 3 shows the sensor system of FIG. 1 with the difference that now a sensor element is used which has a high density of paramagnetic centers (NV1) at least locally in a part of the sensor element. Preferably, this part is a substrate (D) with an at least local density of more than 10 ppm, preferably more than 20 ppm of paramagnetic centers (NV1) relative to the number of atoms in the volume of space considered. Preferably, the substrate (D) comprises one or more groups (NVC) of paramagnetic centers (NV1), preferably exceeding within the respective group (NVC) the density of paramagnetic centers (NV1) of more than 10 ppm, preferably more than 20 ppm. Also, the whole substrate (D) may have a density of paramagnetic centers (NV1) of more than 10 ppm, preferably more than 20 ppm of paramagnetic centers (NV1). In the case of NV centers in diamond as substrate (D), it is preferably a HD-NV diamond (HD-NV).

FIG. 4

Figure 4:
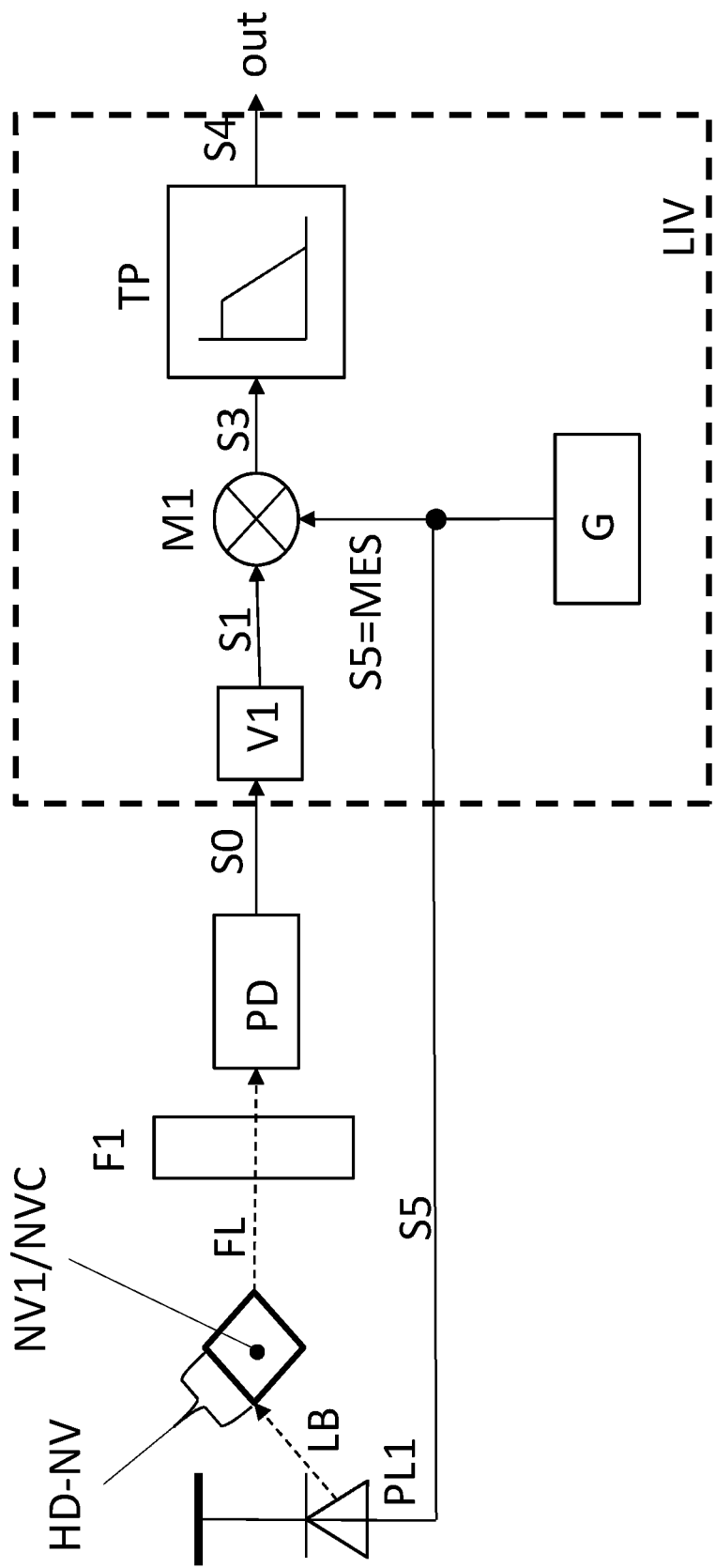
FIG. 4 shows the sensor system of FIG. 2 with the difference that now a sensor element is used which has a high density of paramagnetic centers (NV1) at least locally in a part of the sensor element.

FIG. 4 shows the sensor system of FIG. 2 with the difference that now a sensor element is used which has a high density of paramagnetic centers (NV1) at least locally in a part of the sensor element. Preferably, this part is a substrate (D) with an at least local density of more than 10 ppm, preferably more than 20 ppm of paramagnetic centers (NV1) relative to the number of atoms in the volume of space considered. Preferably, the substrate (D) comprises one or more groups (NVC) of paramagnetic centers (NV1), preferably exceeding within the respective group (NVC) the density of paramagnetic centers (NV1) of more than 10 ppm, preferably more than 20 ppm. Also, the whole substrate (D) may have a density of paramagnetic centers (NV1) of more than 10 ppm, preferably more than 20 ppm of paramagnetic centers (NV1). In the case of NV centers in diamond as substrate (D), it is preferably a HD-NV diamond (HD-NV).

FIG. 5

Figure 5:
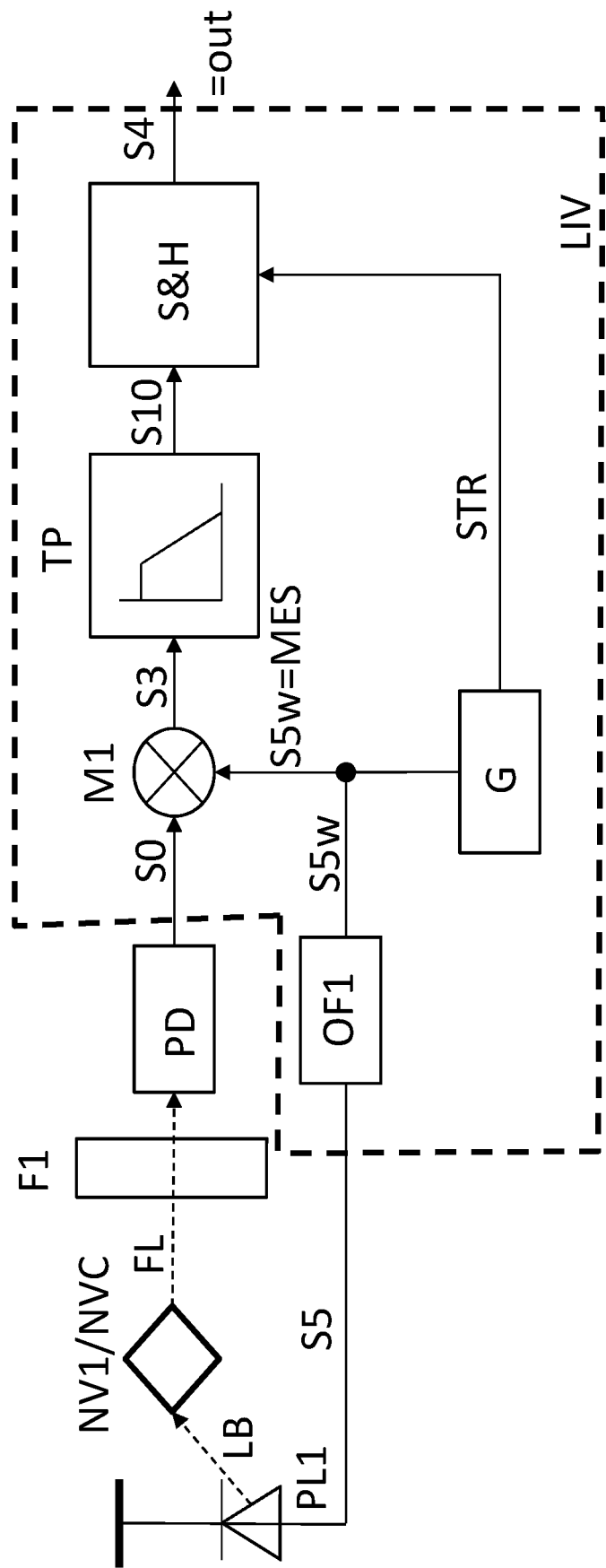
FIG. 5 shows a basic sensor system claimed here, which is then further refined in subsequent figures.

FIG. 5 shows a basic sensor system claimed here, which is then further refined in the following figures. The pump radiation source (PL1) emits pump radiation (LB) with a pump radiation wavelength ($\lambda_{pmp}$) as a function of a transmission signal (S5), which is composed of a DC component (S5g) and an alternating component (S5w). A signal generator (G) generates the alternating component (S5w) of the transmission signal (S5). If necessary, a first matching circuit (OF1) adds a DC component (S5g) of the transmission signal (S5) to the alternating component (S5w) of the transmission signal (S5) to form the actual transmission signal (S5). If necessary, the first matching circuit (OF1) amplifies the sum of the DC component (S5g) and the alternating component (S5w) to form the transmission signal (S5).

Pump radiation (LB) from the pump radiation source (PL1) impinges on the paramagnetic center (NV1) within the sensor element. The paramagnetic center (NV1) is caused to emit fluorescence radiation (FL) depending on the intensity ($I_{fl}$) of the pump radiation (LB) and the magnitude of the magnetic field B at the location of the paramagnetic center (NV1). In this regard, the fluorescence radiation (FL) typically has a fluorescence radiation wavelength ($\lambda_{fl}$)—e.g. 637 nm for NV centers—which typically differs from the pump radiation wavelength ($\lambda_{pmp}$) of the pump radiation (LB). Preferably, the paramagnetic center (NV1) is a NV center in diamond. A sensor element may be such a diamond. However, it may also be a plurality of diamonds and/or diamond powders and/or nano-diamonds. Preferably, the sensor element comprises a plurality of paramagnetic centers (NV1). Preferably, the paramagnetic centers (NV1) are present in a particularly high density, for example in one or more HD-NV diamonds.

A first filter (F1) is preferably transparent for radiation with the fluorescence radiation wavelength ($\lambda_{fl}$) of the fluorescence radiation (FL)—e.g. 637 nm for NV centers—to the extent that its absorption effect related to the fluorescence radiation (FL) can be neglected with respect to the technical effect to be achieved.

A first filter (F1) is preferably non-transparent for radiation having the pump radiation wavelength ($\lambda_{pmp}$) of the pump radiation (LB) to the extent that its transmission effect with respect to the pump radiation (LB) can be neglected with respect to the technical effect to be achieved.

Thus, essentially only the fluorescence radiation (FL) of the paramagnetic center(s) (NV1) reaches the radiation receiver (PD1). The radiation receiver (PD1) converts the amplitude modulation of the intensity ($I_{fl}$) of the fluorescence radiation (FL) into a receiver output signal (S0) modulated according to the modulation of the intensity ($I_{fl}$) of the fluorescence radiation (FL). A first multiplier (M1) preferably mixes by multiplication the receiver output signal (S0) with the alternating component (S5w) of the transmission signal (S5) or with a signal derived from the transmission signal (S5) or from the alternating component (S5w) of the transmission signal (S5), for example by delay, to form the filter input signal (S3). A filter, which is preferably a loop filter (TP) and/or integrator, now filters the filter input signal (S3) only indirectly to a filter output signal (S4). The loop filter (TP) filters the filter input signal (S3) to the holding circuit input signal (S10). In contrast to FIG. 1, a holding circuit (S&H) is now provided whose input is the holding circuit input signal (S10) and whose output is the filter output signal (S4) and which is controlled by the trigger signal (STR).

The signal generator (G) generates the alternating component (S5w) of the transmission signal (S5). The transmission signal (S5) can be, for example, a PWM signal with 50% duty cycle. Preferably, the duty cycle is smaller. When lasers or LEDs are used as pump radiation sources, the transmission signal (S5) typically has a DC signal component (S5g), but this can also be 0. The transmission signal (S5) has a transmission signal period ($T_p$). Preferably at the end of the transmission signal period ($T_p$) preferably before the occurrence of an edge of the transmission signal (S5), the signal generator (G) generates a trigger signal (STR). The trigger signal (STR) preferably has a first signal state and a second signal state. The trigger signal (STR) is in the first signal state, the inactive signal state of the trigger signal (STR), during a transmission signal period ($T_p$). Only at the end of the transmission signal period ($T_p$) of the transmission signal (S5) the signal generator (G) briefly puts the trigger signal (STR) into the second signal state, the active signal state of the trigger signal (STR).

The hold circuit (S&H) stores the value of the hold circuit input signal (S10) last present in the second, active signal state of the trigger signal (STR) during the phase of the trigger signal (STR) in the first, inactive signal state for the duration of the subsequently present first, inactive signal state of the trigger signal (STR). Only with the transition of the trigger signal (STR) from the first, inactive signal state to the second, active signal state of the trigger signal (STR) the holding circuit (S&H) typically becomes transparent again and the filter output signal (S4) and thus the sensor output signal (out) then typically follow the holding circuit input signal (S10) in this phase of a trigger signal (STR) located in the second, active signal state. As the trigger signal (STR) transitions from the second, active signal state to the first, inactive signal state, the holding circuit (S&H) freezes the level of the filter output signal (S4) and thus the sensor output signal (out) until a transition from the first, inactive signal state to the second, active signal state of the trigger signal (STR) occurs again. This massively suppresses the chopper frequency, i.e. the frequency of the alternating component (S5w) of the transmission signal (S5). This suppression can be up to 60 dB. Without this holding circuit (S&H), a 10th-order filter would thus be required as a loop filter (TP) and/or integrator to achieve the same effect. The use of holding circuits (S&H) in connection with the measurement of parametric centers (NV1) is not known in the prior art. The suppression is stronger the shorter the time duration of the phase of the second signal state of the trigger signal (STR) relative to the transmission signal period ($T_p$). Preferably, the phase of the second signal state of the trigger signal (STR) is located at or near the end of a transmission signal period ($T_p$). This timing of the phase of the second signal state of the trigger signal (STR) at the end or almost at the end of a transmission signal period ($T_p$) has the advantage that an unavoidable low-pass characteristic of the pump radiation source (PL1), the paramagnetic center (NV1) and the radiation receiver (PD) and possibly other elements located in the signal path have a smaller effect towards the end of a transmission signal period. If the loop filter (TP) is an integrator, the holding circuit ensures that the indefinite integral formed by the integrator from the filter input signal (S3) becomes a definite integral, whereby if the phase of the second signal state of the trigger signal (STR) is placed at the end or almost at the end of a transmission signal period ($T_p$), the integration then runs approximately from 0 to $2\pi$ over a transmission signal period ($T_p$). It can be easily calculated, for example, that the integral of $\sin(\omega) \cos(\omega)$ only disappears if integration is only ever carried out over a whole period. The error that otherwise occurs leads to a massively reduced signal-to-noise ratio and a loss of up to 60 dB accuracy.

FIG. 6

Figure 6:
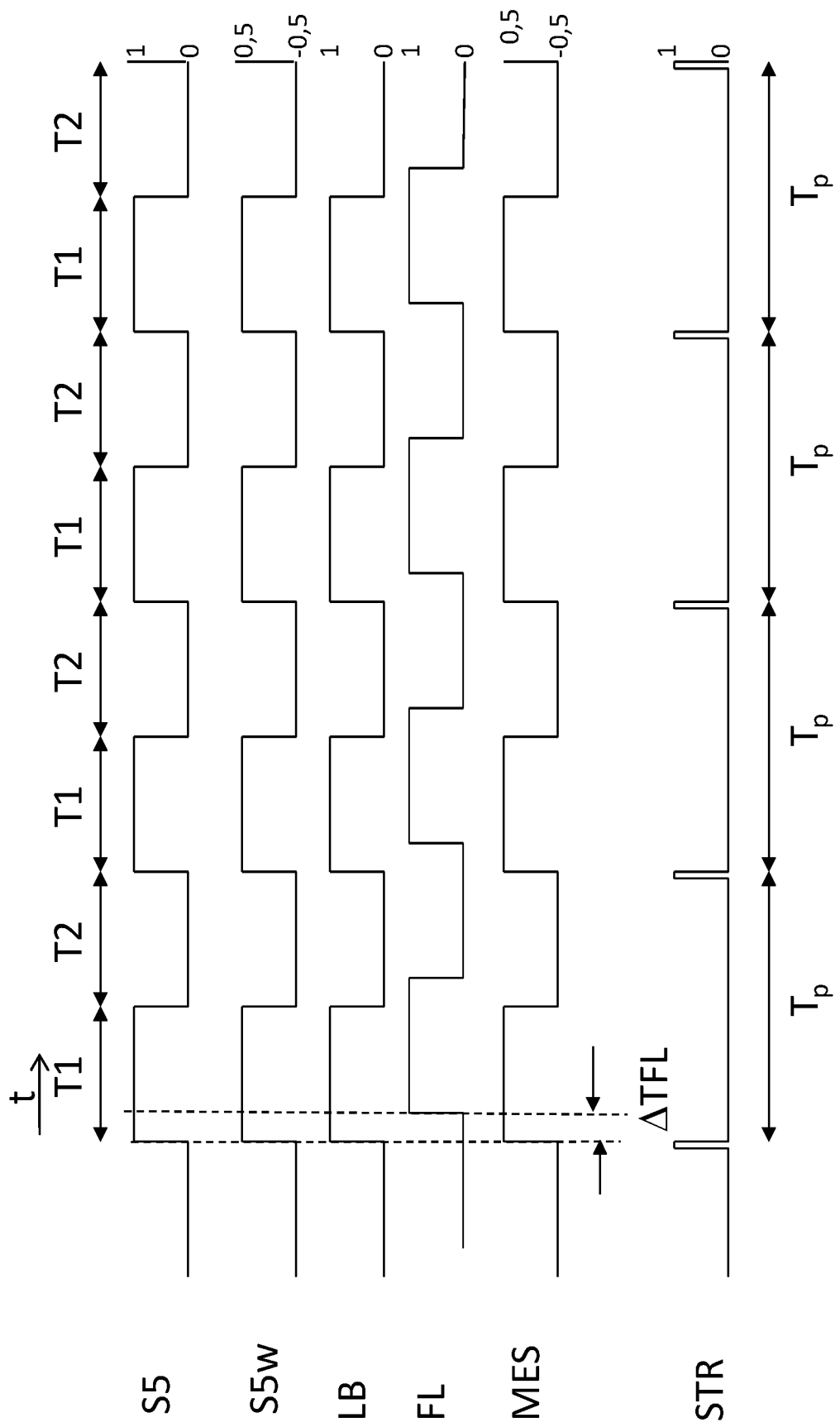
FIG. 6 shows by means of the measurement signal (MES) when the receiver output signal (S0) of the radiation receiver (PD1) is evaluated in relation to the activity of the pump radiation source (PL).

FIG. 6 shows when the receiver output signal (S0) of the radiation receiver (PD1) is evaluated in relation to the activity of the pump radiation source (PL). Here, a level of 0.5 of the exemplary measurement signal (MES) should mean that the receiver output signal (S0) of the radiation receiver (PD1) is positively incoming, and a level of −0.5 of the exemplary measurement signal (MES) should mean that the receiver output signal (S0) of the radiation receiver (PD1) is negatively incoming. The measurement signal (MES) drawn in FIG. 5a is for explanatory purposes only. In the realization of the proposal, the technical realization may deviate, if necessary, without deviating in terms of content with regard to the technical effect.

In the example of FIG. 5, the pump radiation source (PL) is active at first times (T1) when the transmission signal (S5) is active (=1) and then emits pump radiation (LB). Here, a value of 1 shall mean that pump radiation (LB) is emitted by the pump radiation source (PL1). A value of 0 means that no pump radiation (LB) is emitted by the pump radiation source (PL1). This is illustrated by an exemplary logical value of 1 in FIG. 6 for the intensity ($I_{pmp}$) of the pump radiation (LB).

In the example of FIG. 5, the pump radiation source (PL) is not active at second times (T2) and does not emit any pump radiation (LB). This is illustrated by an exemplary logical value of 0 in FIG. 6 for the intensity ($I_{pmp}$) of the pump radiation (LB).

The pump radiation (LB) at least partially irradiates the paramagnetic center (NV1) of the sensor element. Therefore, the paramagnetic center (NV1) emits fluorescence radiation (FL). This occurs with a time delay of the fluorescence phase shift time ($\Delta$TFL). For a NV center in diamond as a paramagnetic center (NV1) in a sensing element, this delay is in the form of the fluorescence phase shift time ($\Delta$TFL) in the order of 1 ns. Therefore, the signal of intensity ($I_{fl}$) of fluorescence radiation (FL, FL1) is phase shifted in time with respect to the signal of pump radiation (LB) by a fluorescence phase shift time ($\Delta$TFL). The fluorescence phase shift time ($\Delta$TFL), like the fluorescence radiation (FL) per se, typically depends on the magnetic flux density B and possibly other physical parameters, such as pressure P, temperature $\vartheta$, acceleration a, gravitational field strength g, electric field strength E, irradiation with ionizing radiation, etc. The sensor systems presented here therefore determine as values of their sensor output signals (out) measured values which correspond to the values of these physical parameters if the dependencies on other parameters are reduced, e.g. by shielding.

In the example of FIG. 6, the paramagnetic center (NV1) is thus active at the first times (T1), shifted in time by the fluorescence phase shift time (ΔTFL), and only then emits the fluorescence radiation (FL), with the pump radiation source (PL1) being active at the first times. This is exemplified by an arbitrary logical value of 1 in FIG. 6 for the intensity ($I_{fl}$) of the fluorescent radiation (FL).

In the example of FIG. 6, the paramagnetic center (NV1) is thus not active at the second times (T2) shiftedΔ by the fluorescence phase shift time (TFL) and then does not emit any fluorescence radiation (FL). This is exemplified by an arbitrary logical value of 0 in FIG. 6 for the intensity ($I_{fl}$) of the fluorescence radiation (FL).

In the example of FIGS. 4 to 6, the evaluation of the receiver output signal (S0) of the radiation receiver (PD) takes place at the first times (T1). The measurement signal (MES) serving for clarification has the arbitrary value 0.5 at these first times (T1). Therefore, in measurement systems with this time scheme of FIG. 6, a separation of the signal of the pump radiation (LB) from the signal of the fluorescence radiation (FL) can only be achieved by a first filter (F1) or by a filter effect of the sensor element with the paramagnetic centers (NV1).

FIG. 6 shows an exemplary trigger signal (STR), which is always shifted from the first, inactive signal state, here exemplarily marked with the level 0, to the second, active signal state, here exemplarily marked with the level 1, at the end of the transmission signal period ($T_p$).

The signals are simplified for clarification and only schematically drawn with exemplary levels.

FIG. 7

Figure 7:
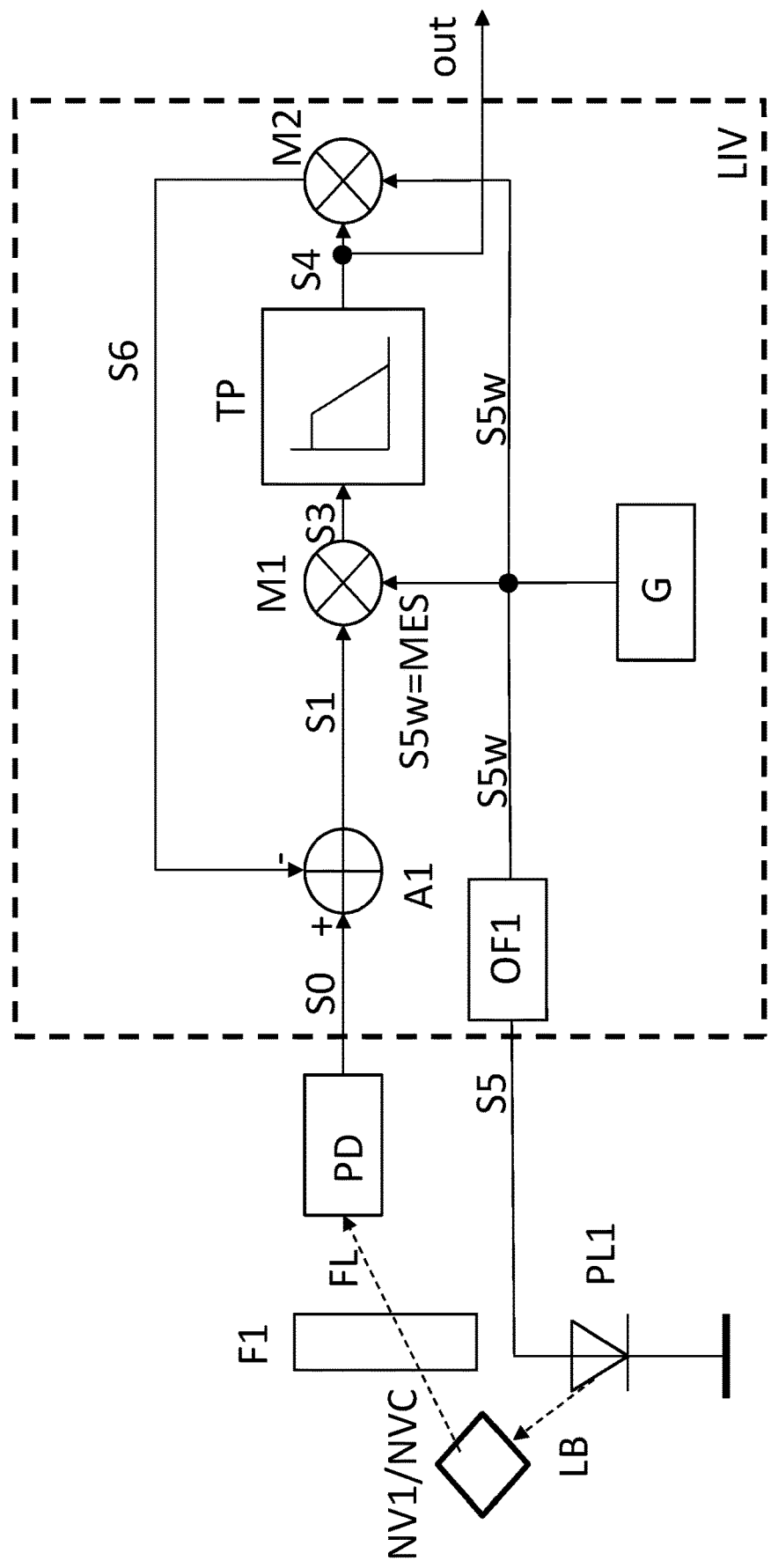
FIG. 7 shows an exemplary simple system for an exemplary partial function of an integrated circuit (IC) for the operation of the presented sensor systems, whereby the compensation and feedback in the control loop is carried out electronically via a first adder (A1).

FIG. 7 shows an exemplary simple system for an exemplary partial function of an integrated circuit (IC) for operating the sensor systems presented. A signal generator (G) again generates the alternating component (S5w) of the transmission signal (S5). The first matching circuit (OF1) generates the transmission signal (S5) from the alternating component (S5w) of the transmission signal (S5) preferably by linear mapping. If necessary, the first matching circuit (OF1) adds a DC component (S5g) of the transmission signal (S5) to the alternating component (S5W) of the transmission signal (S5) to form the actual transmission signal (S5). If necessary, the first matching circuit (OF1) amplifies the sum of the DC component (S5g) and the alternating component (S5w) to form the transmission signal (S5).

The pump radiation source (PL1) converts the transmission signal (S5) into a modulated pump radiation (LB), which impinges directly or indirectly as described above on the sensor element with the paramagnetic center (NV).

There, this reflected pump radiation (LB) excites the paramagnetic centers (NV1) in the material of the sensor element to emit a fluorescence radiation (FL). The first filter (F1) allows radiation with the fluorescence radiation wavelength ($\lambda_{fl}$) of the fluorescence radiation (FL)—e.g. 637 nm for NV centers—to pass, while it does not allow the modulated pump radiation (LB) to pass due to its pump radiation wavelength ($\lambda_{pmp}$). The fluorescence radiation (FL) is correlated modulated to the pump radiation (LB) due to the path of action. The modulated fluorescence radiation (FL) is received by the radiation receiver (PD) after passing the first filter (F1) and is converted into a modulated receiver output signal (S0). If necessary, the radiation receiver (PD) comprises further amplifiers and filters. A first adder (A1) subtracts a feedback signal (S6) from the receiver output signal (S0). This results in the reduced receiver output signal (S1). This reduced receiver output signal (S1) is further processed in a synchronous demodulator. For this purpose, a first multiplier (M1) multiplies the reduced receiver output signal (S1) by the alternating component (S5w) of the transmission signal (S5), thus forming the filter input signal (S3). In a loop filter (TP) following in the signal path, the DC component of the filter input signal (S3) is passed. In this way, the loop filter (TP) forms the filter output signal (S4) as the output signal of the loop filter (TP). Formally, the first multiplier (M1) and the loop filter (TP) form a scalar product as a signal of the reduced receiver output signal (S1) and the transmission signal (S5). The value of the filter output signal (S4) then indicates how much of the transmission signal (S5) is proportionally present in the reduced receiver output signal (S1). This filter output signal (S4) can be compared with a Fourier coefficient in its function. A second multiplier (M2) multiplies the filter output signal (S4) by the transmission signal (S5) to form the feedback signal (S6). If the gain v of the loop filter (TP) is very large, the reduced receiver output signal (S1) typically no longer contains any portion of the alternating component (S5w) of the transmission signal (S5), except for a control error and possibly a DC component in the case of stability. The value of the filter output signal (S4) is then a measure of the intensity ($I_{fl}$) of the fluorescence radiation (FL) reaching the radiation receiver (PD). This receiver output signal (S4) is then preferably output as a sensor output signal (out) via one of the lead frame surfaces of the housing by means of a bond wire.

FIG. 8

Figure 8:
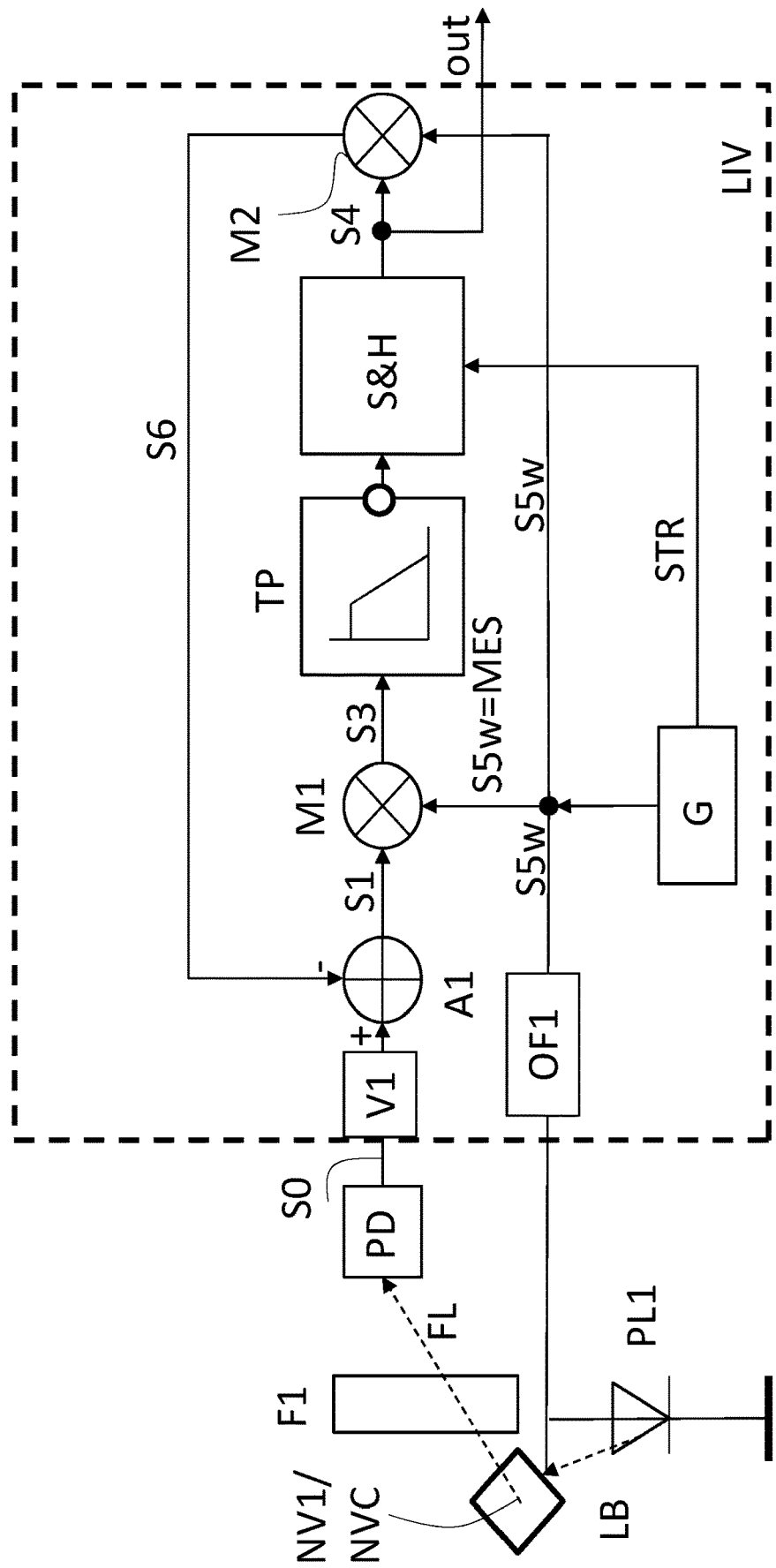
FIG. 8 corresponds to FIG. 7 and is supplemented by the holding circuit (S&H) and the trigger signal (STR), which is generated by the signal generator (G) preferably in phase synchronism with the transmission signal (S5) preferably at the end of the signal period ($T_p$).

FIG. 8 corresponds to FIG. 7. In FIG. 8, the hold circuit (S&H) and the trigger signal (STR) are added. FIG. 8 also corresponds to FIG. 5. FIG. 5 is supplemented by the second multiplier (M2). The second multiplier (M2) mixes the sensor output signal (out) with the alternating component (S5w) of the transmission signal (S5) to form the feedback signal (S6). The feedback signal is preferably formed complementary to the transmission signal (S5). This can be done by adding multiplication with a suitable sign and with a large gain v and a suitable offset in the loop filter (TP), which for simplicity is not drawn, but is symbolized only by the circle at the output of the loop filter (TP). The feedback signal (S6) is subtracted from the receiver output signal (S0) in the first adder (A1). The first adder (A1) thus forms the reduced receiver output signal (S1), which is now used as the input signal for the first multiplier (M1) instead of the receiver output signal (S0) in FIGS. 4 and 5. The complementary design of the feedback by means of the feedback signal (S6) preferably results in substantially a DC signal as reduced receiver output signal (S1) in the steady state of the control. The disturbances due to the said low-pass properties of the pump radiation source (PL1), the radiation receiver (PD) and the paramagnetic center can initially be neglected in this consideration.

Preferably, the signal generator (G) then sets the trigger signal (STR) to a second, active signal state such that the condition F[S5w]=0 is satisfied. For example, if the alternating component (S5w) of the transmission signal (S5) is a PWM signal having a 50% duty cycle and having a PWM period of a transmission signal period ($T_p$) of the alternating component (S5w) of the transmission signal (S5), the signal generator (G) sets the trigger signal (STR) preferably shortly before the end of the transmission signal period ($T_p$) preferably for a duration of, for example, 2% of the temporal duration of the transmission signal period ($T_p$) into the second, active signal state and otherwise into the first, inactive signal state.

The hold circuit (S&H) stores the value of the hold circuit input signal (S10) that was last present in the second, active signal state of the trigger signal (STR) during the phase of the trigger signal (STR) that is in the first, inactive signal state for the duration of the subsequently present first, inactive signal state of the trigger signal (STR). Only with the transition of the trigger signal (STR) from the first, inactive signal state to the second, active signal state of the trigger signal (STR) does the holding circuit (S&H) typically become transparent again and the filter output signal (S4) and thus the sensor output signal (out) then typically follow the holding circuit input signal (S10) in this phase of a trigger signal (STR) located in the second, active signal state. With the transition of the trigger signal (STR) from the second, active signal state to the first, inactive signal state, the holding circuit (S&H) freezes the level of the filter output signal (S4) and thus of the sensor output signal (out) until a transition from the first, inactive signal state to the second, active signal state of the trigger signal (STR) occurs again.

FIG. 9

Figure 9:
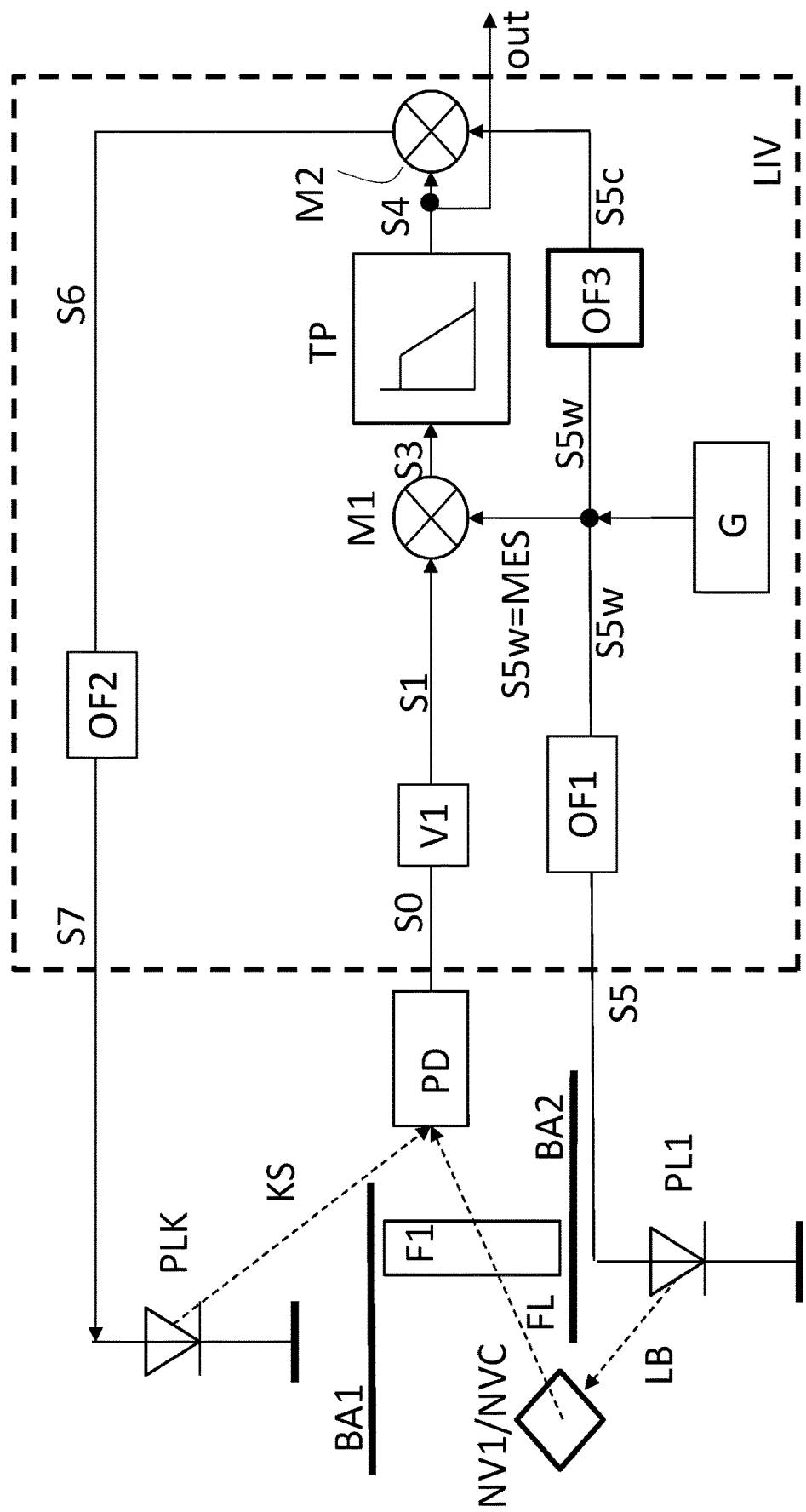
FIG. 9 shows the system of FIG. 8 with the difference that the feedback signal (S6) is now not fed back electrically via a first adder (A1), but via a reference noise source (PLK, KS) in order to implement a Dicke amplifier.

FIG. 9 shows the system of FIG. 8 with the difference that the feedback signal (S6) is now not fed back electrically via a first adder (A1), but via a reference noise source in order to implement a Dicke amplifier. Here, a compensation radiation source (PLK) which emits a compensation radiation (KS) having a compensation radiation wavelength ($\lambda_{ks}$) acts as a reference noise source. The compensating radiation (KS) typically irradiates the radiation receiver (PD) in a summing superimposed manner with the fluorescence radiation (FL) of the paramagnetic center (NV1) or paramagnetic centers (NV1) or the group or groups (NVC) of paramagnetic centers (NV1) of the sensor element.

For the feedback, the level and offset of the feedback signal (S6) is suitably adjusted by a second matching circuit (OF2), typically by a linear mapping ($s7=\alpha1*s6+s7_0$). Here, s7 is the current value of the formed compensation transmission signal (S7), $\alpha1$ is a real constant, and $s7_0$ is a real fixed and/or adjustable offset value. This results in the compensation transmission signal (S7) as an output signal of the second matching circuit (OF2). It is proposed here to use this compensation transmission signal (S7) to operate the compensation radiation source (PLK) as the reference noise source of the Dicke amplifier. The compensation radiation source (PLK) then radiates its compensation radiation (KS) into the radiation receiver (PD) via a third, preferably known transmission path (I3), preferably superimposed and summing to the fluorescence radiation (FL) of the paramagnetic centers (NV1). In order to reproduce the subtraction of the feedback signal (S6) of FIG. 8, it is now provided that the alternating component (S7w) of the compensation transmission signal (S7) corresponding to the alternating component (S5w) of the transmission signal (S5) is multiplied by a negative factor. This can be achieved, for example, by making the output of the loop filter (TP) inverting amplifying. Thus, it is explicitly not important at which point this inversion is executed in the control loop, but only that it takes place at all in order to achieve stability in the control loop. In this context, this formation of the complementary character can also be done by modifying the signal mixed with the filter output signal (S4) in the second multiplexer (M2). For example, if we assume that the value (s5w) of the alternating component (S5w) of the transmission signal (S5) varies between 0.5 and -0.5, an alternating component (S5c) of the transmission signal (S5) complementary to the alternating component (S5w) of the transmission signal (S5) can be generated by multiplication by -1 by a third matching circuit (OF3). Preferably, the equation s5w+s5c=0 then applies to the value (s5w) of the alternating component (S5w) of the transmission signal (S5) and to the value (s5c) of the complementary transmission signal (S5c), where here "substantially means" that the sum may deviate from the value 0 by an amount of up to 10%, preferably much less, of the amount of the amplitude of the alternating component (S5w) of the transmission signal (S5). In the elaboration, values of the deviation of less than $10^{-4}$ used.

In addition, it should be ensured that the compensating radiation source (PLK) does not inject any radiation into the radiation and signal path of the pump radiation source (PL1).

Preferably, for this purpose, the device is provided with a first barrier (BA1) which prevents the compensating radiation source (PLK) from irradiating the paramagnetic centers (NV1) in the material of the sensing element and thus from exciting them to emit fluorescent radiation (FL). It is therefore a first barrier (BA1) to electromagnetic radiation and/or light. This is of particular importance if the compensating radiation source (PLK) is designed identically to the pump radiation source (PL1) in order to be able to be a perfect reference noise source.

Preferably, the device is provided with a second barrier (BA2) preventing the pump radiation source (PL1) from directly irradiating the radiation receiver (PD) with pump radiation (LB). Thus, this is also a second barrier (BA2) for electromagnetic radiation and/or light. For control reasons, however, a certain direct irradiation to a very small extent may possibly be desired in order to improve the catch range of the control. In this respect, it is conceivable to permit such basic optical coupling, for example, by means of apertures and/or attenuating filters. However, the basic coupling can also be achieved electronically. In this respect, we refer to U.S. Pat. No. 8,766,154 B2, the technical teaching of which, in combination with the technical teaching presented herein, forms a full part of this disclosure, to the extent that, in the event of subsequent nationalization of this application, this is permissible in the legal system of the relevant state in which the nationalization takes place.

FIG. 10

Figure 10:
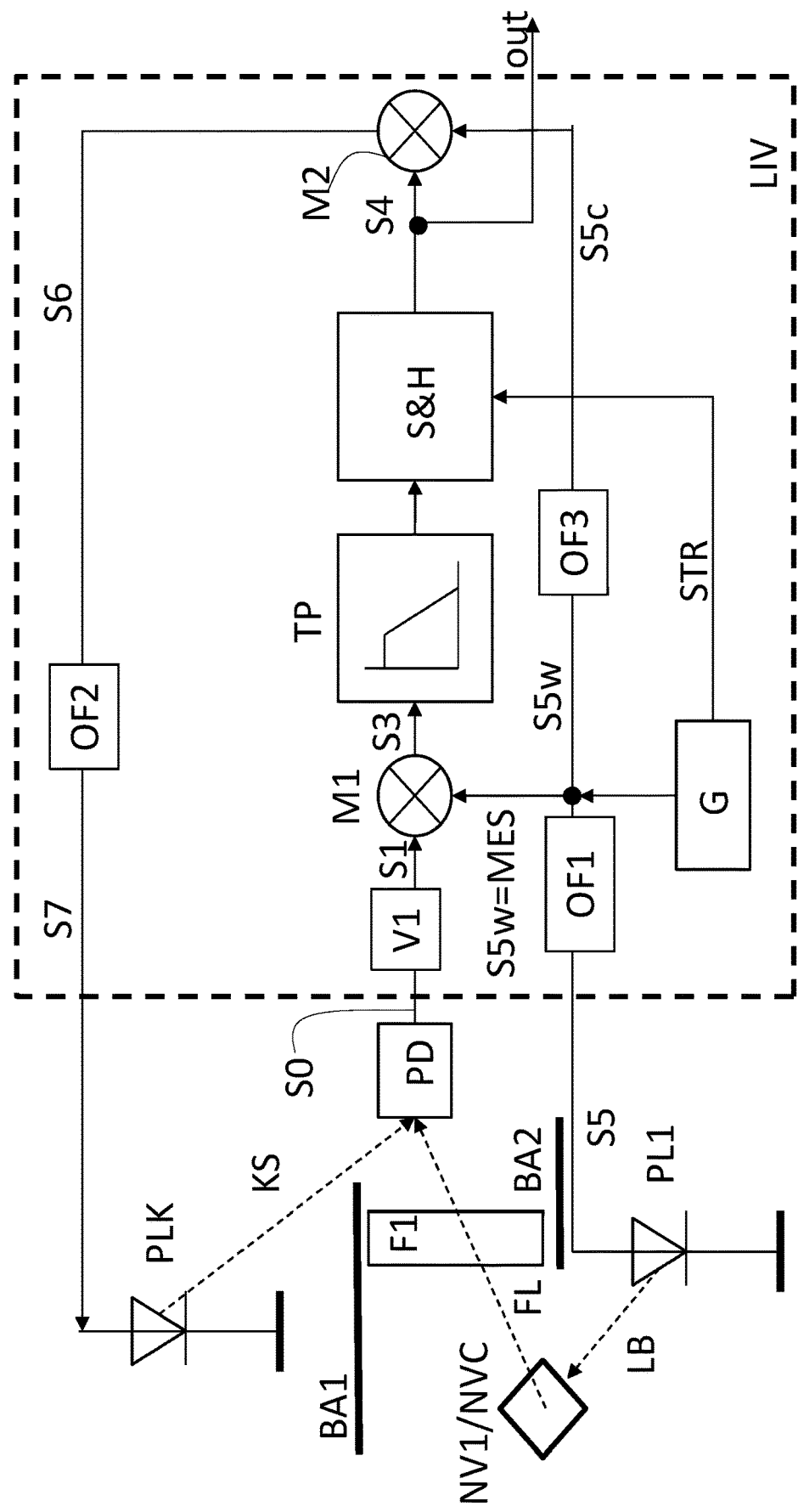
FIG. 10 shows in analogy to the difference between FIG. 7 and FIG. 8 the system of FIG. 9 supplemented by the hold circuit (S&H) and the trigger signal (STR).

In analogy to the difference between FIG. 7 and FIG. 8, FIG. 10 shows the system of FIG. 9 supplemented by the holding circuit (S&H) and the trigger signal (STR). At this point, reference is made to the explanations on the holding circuit (S&H) in the text for FIG. 6, which also apply here.

FIG. 11

Figure 11:
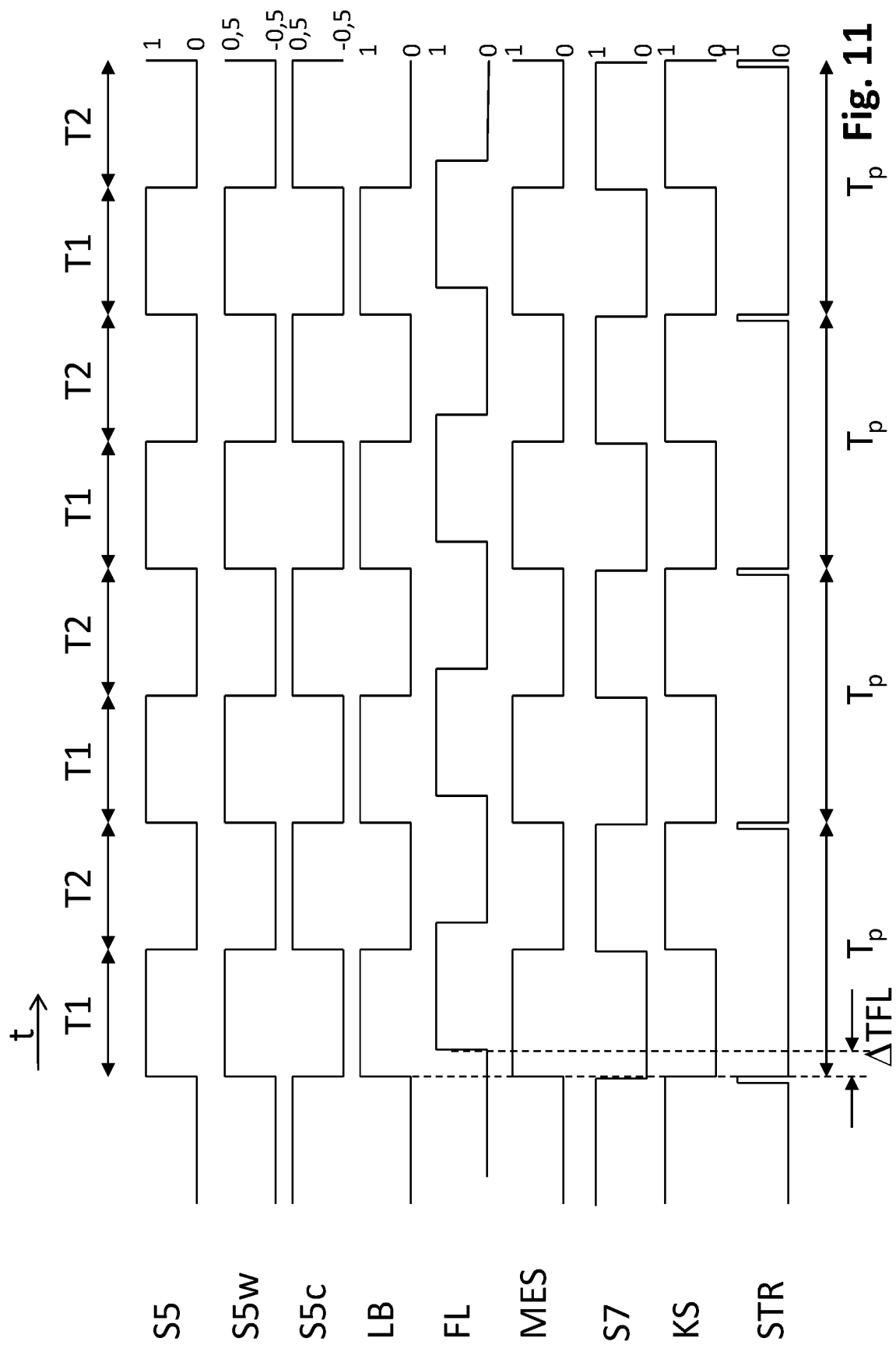
FIG. 11 shows an exemplary signal diagram matching FIGS. 9 and 10 with exemplary levels for clarification, which are chosen completely arbitrarily. In reality, other levels are likely to occur, depending on the selected gains, offsets, etc.

FIG. 11 shows an exemplary signal diagram matching FIGS. 9 and 10 with exemplary levels for clarification, which are chosen completely arbitrarily. In reality, other levels are likely to occur, which depend on the selected gains, offsets, etc. The signal shapes are also purely exemplary. The signal shapes are also purely exemplary. The signals are simplified for clarification and only drawn schematically.

FIG. 12

Figure 12:
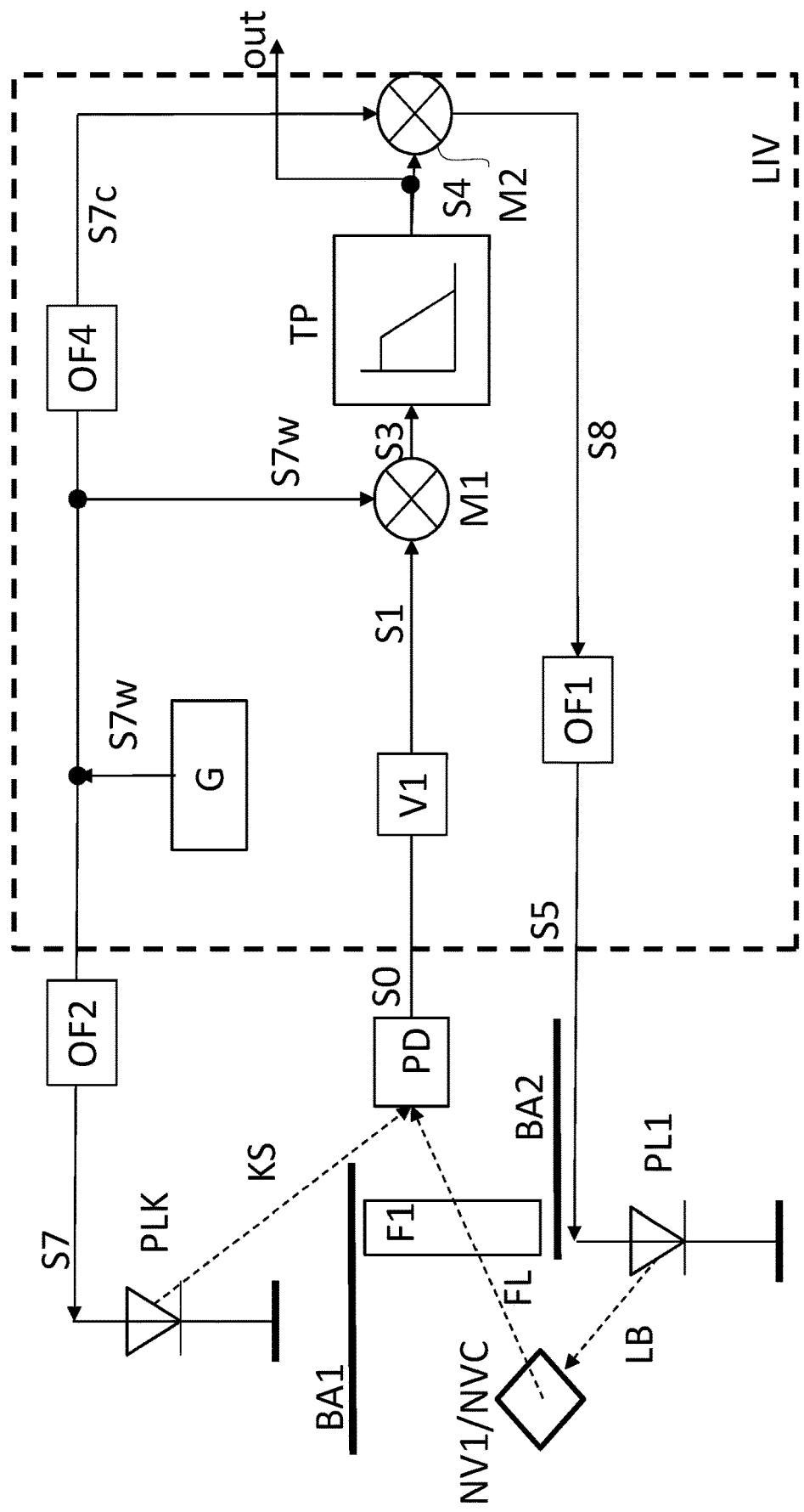
FIG. 12 corresponds essentially to FIG. 11, but in contrast to FIG. 11, the intensity ($I_{ks}$) of the compensating radiation (KS) of the compensating radiation source (PLK) is not controlled and the intensity ($I_{pmp}$) of the pump radiation source (PLK) is kept constant, but the intensity ($I_{pmp}$) of the pump radiation (LB) of the pump radiation source (PL1) is controlled and the intensity ($I_{ks}$) of the compensating radiation source (PLK) is kept constant.

FIG. 12 corresponds essentially to FIG. 9, but in contrast to FIG. 9, the intensity ($I_{ks}$) of the compensating radiation (KS) of the compensating radiation source (PLK) is not controlled and the intensity ($I_{ks}$) of the pump radiation (LB) of the pump radiation source (PLK) is kept constant, but the intensity ($I_{pmp}$) of the pump radiation (LB) of the pump radiation source (PL1) is controlled and the intensity ($I_{ks}$) of the compensating radiation (KS) of the compensating radiation source (PLK) is kept constant.

FIG. 12 illustrates the method of optical compensation using a controlled compensation radiation source (PLK). The sensor system again comprises one or more paramagnetic centers (NV1) or one or more groups (NVC) of paramagnetic centers (NV1) in the material of a sensor element which is part of the sensor system. The sensor system then operates, for example, such that the signal generator (G) generates an alternating component (S7w) of the compensation transmission signal (S7). Preferably, the alternating component (S7w) of the compensation transmission signal (S7) has a compensation end period typically equal to the transmission signal period ($T_p$). A second matching circuit (OF2) provides the alternating component (S7w) of the compensation transmission signal (S7) with a DC component (S7g) of the compensation transmission signal (S7) so that the following applies for the associated instantaneous values: s7=s7w+s7g.

A fourth matching circuit (OF4) preferably generates the complementary alternating component (S7c) of the compensation transmission signal (S7) from the alternating component (S7w) of the compensation transmission signal (S7), so that the following typically and preferably applies for the corresponding instantaneous values: s7w+s7c=0.

By means of this compensation transmission signal (S7) a modulated transmission of a modulated compensation radiation (KS) by the modulated operated compensation radiation source (PLK) takes place.

A modulated fluorescence radiation (FL) is caused by means of a paramagnetic center (NV1) in a material of a sensor element by a modulated pump radiation (LB). The origin of the modulated pump radiation (LB) is described later in this section. In the radiation receiver (PD), a preferably linearly summing superimposed reception of the modulated fluorescence radiation (FL) and the modulated compensation radiation (KS) and the generation of a receiver output signal (S0) takes place which is linearly dependent on the received total intensity of the intensity ($I_{fl}$) of the fluorescence radiation (FL) and the intensity ($I_{ks}$) of the compensation radiation (KS), preferably at least around the operating point. If the control described in the following is steady-state in the absence of interferers, the receiver output signal (S0) preferably no longer contains any modulation in the form of signal components of the receiver output signal (S0) which correlate with the alternating component (S7w) of the compensation transmission signal (S7), apart from any DC components which may be present. A correlation of the receiver output signal (S0) with the modulated compensation transmission signal (S7) is then carried out, in particular with the aid of a synchronous demodulator, and an output signal (out) is formed, in order to detect the component modulated in accordance with the alternating component (S7w) of the compensation transmission signal (S7) in the receiver output signal (S0) and then to compensate it by means of the transmission signal (S5) and, as a consequence, by means of the intensity ($I_{pmp}$) of the pump radiation (LB) and, consequently, of the intensity ($I_{fl}$) of the fluorescence radiation (FL). The proposed alternative method comprises generating a transmission signal (S5) modulated with the compensation transmission signal (S7) by means of the filter output signal (S4) and thus by means of the sensor output signal (out). Thereby, the sensor output signal (out) depends on the intensity of the correlation of the modulation of the fluorescence radiation (FL) with the compensation transmission signal (S7).

The correlation is preferably carried out with the steps
Multiplication of the receiver output signal (S0) by the alternating component (S7w) of the compensation transmission signal (S7) to the filter input signal (S3);
Filtering of the filter input signal (S3) with a loop filter (TP) to the filter output signal (S4);
Multiplication of the filter output signal (S4) by the complementary alternating component (S7c) of the compensation transmission signal (S7) to the feedback signal (S8);
Forming the transmission signal (S5) from the feedback signal (S8);
Control of a pump radiation source (PL1) with the transmission signal (S5);
Transmission of a pump radiation (LB) by the pump radiation source (PL1) as a function of the transmission signal (S5);
Use of the filter output signal (S4) to form the output signal (out), wherein the output signal (out) can be the same as the filter output signal (S4) in the sense of this feature.

If no complementary alternating component (S7c) of the compensation transmission signal (S7) is to be used for the retransformation, but the alternating component (S7w) of the compensation transmission signal (S7), i.e. the fourth matching circuit (OF4) is to be omitted, the loop filter (TP) should form the filter output signal (S4) in such a way that it is multiplied by a factor −1.

The first matching circuit (OF1) forms the transmission signal (S5) from the feedback signal (S8) by a preferably linear mapping analogous to the function of the second matching circuit (OF2) in FIGS. 9 and 10.

The principle of controlling this FIG. 12 via the pump radiation source (PL1) rather than via the compensating radiation source (PLK) can also be applied to the other sensor systems of this paper where control is via the compensating radiation source (PLK). Thus, these are expressly encompassed by the claim and disclosure.

The control principles of FIGS. 9 and 12 can also be combined with each other. Preferably, in the case of a very high intensity ($I_{fl}$) and a high contrast (KT) of the fluorescence radiation (FL), the control of the control loop is performed by controlling the intensity ($I_{pmp}$) of the pump radiation (LB). Conversely, in the case of a low intensity ($I_{fl}$) or a low contrast (KT) of the fluorescence radiation (FL), the control loop is controlled by controlling the intensity ($I_{ks}$) of the compensation radiation (KS) at maximum intensity ($I_{pmp}$) of the pump radiation (LB).

FIG. 13

Figure 13:
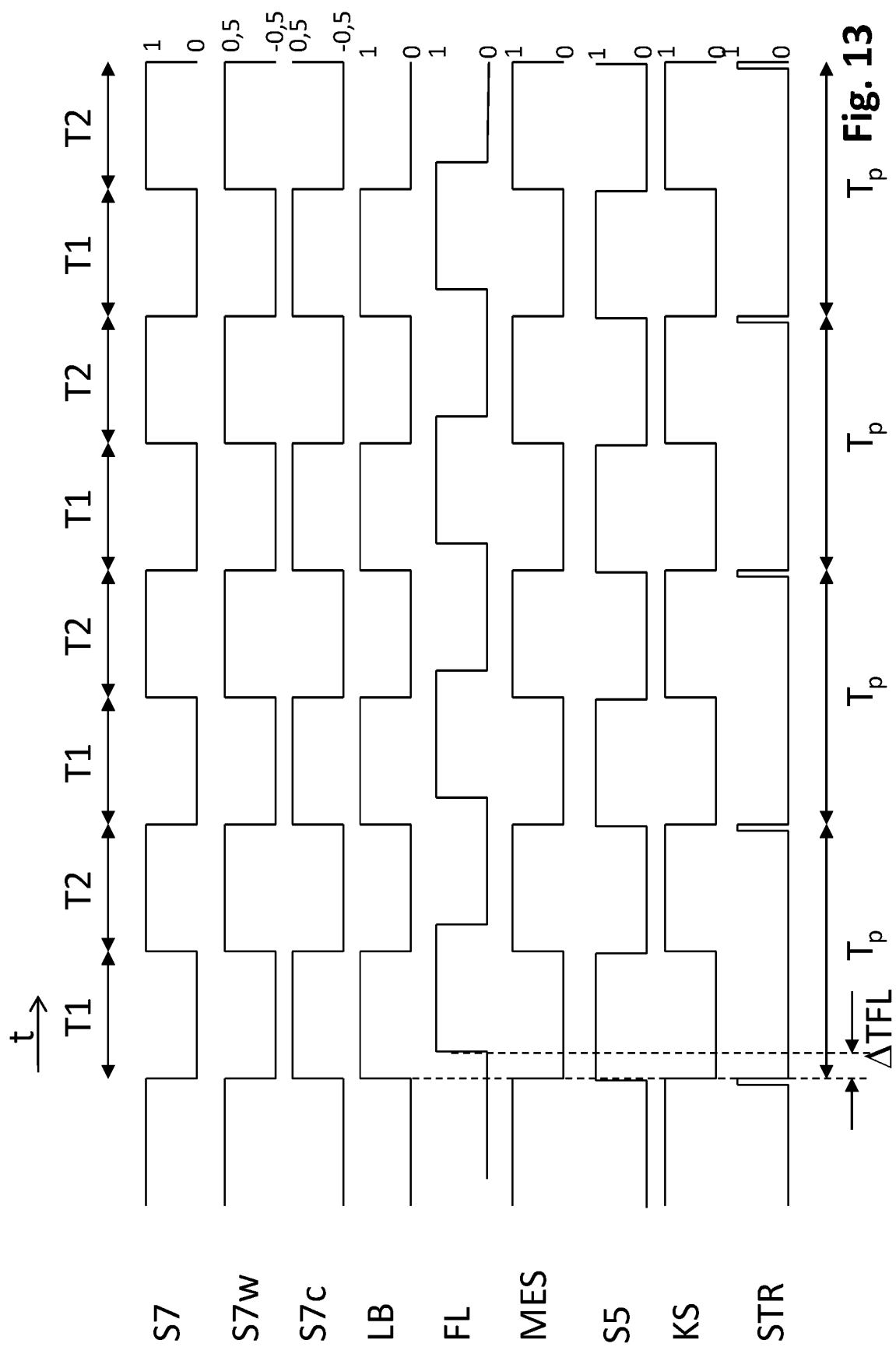
FIG. 13 shows an exemplary signal diagram corresponding to FIG. 12 with exemplary levels for clarification, whereby the levels are chosen completely arbitrarily. In reality, other levels are likely to occur, which depend on the selected amplifications, offsets, etc. The signal level in the signal diagram is not the same as the level in the signal diagram.

FIG. 13 shows an exemplary signal diagram matching FIG. 12 with exemplary levels for clarification, whereby the levels are chosen completely arbitrarily. In reality, other levels are likely to occur, depending on the selected gains, offsets, etc. The signal shapes are also purely exemplary. The signal shapes are also purely exemplary. The signals are simplified for clarification and only drawn schematically.

FIG. 14

Figure 14:
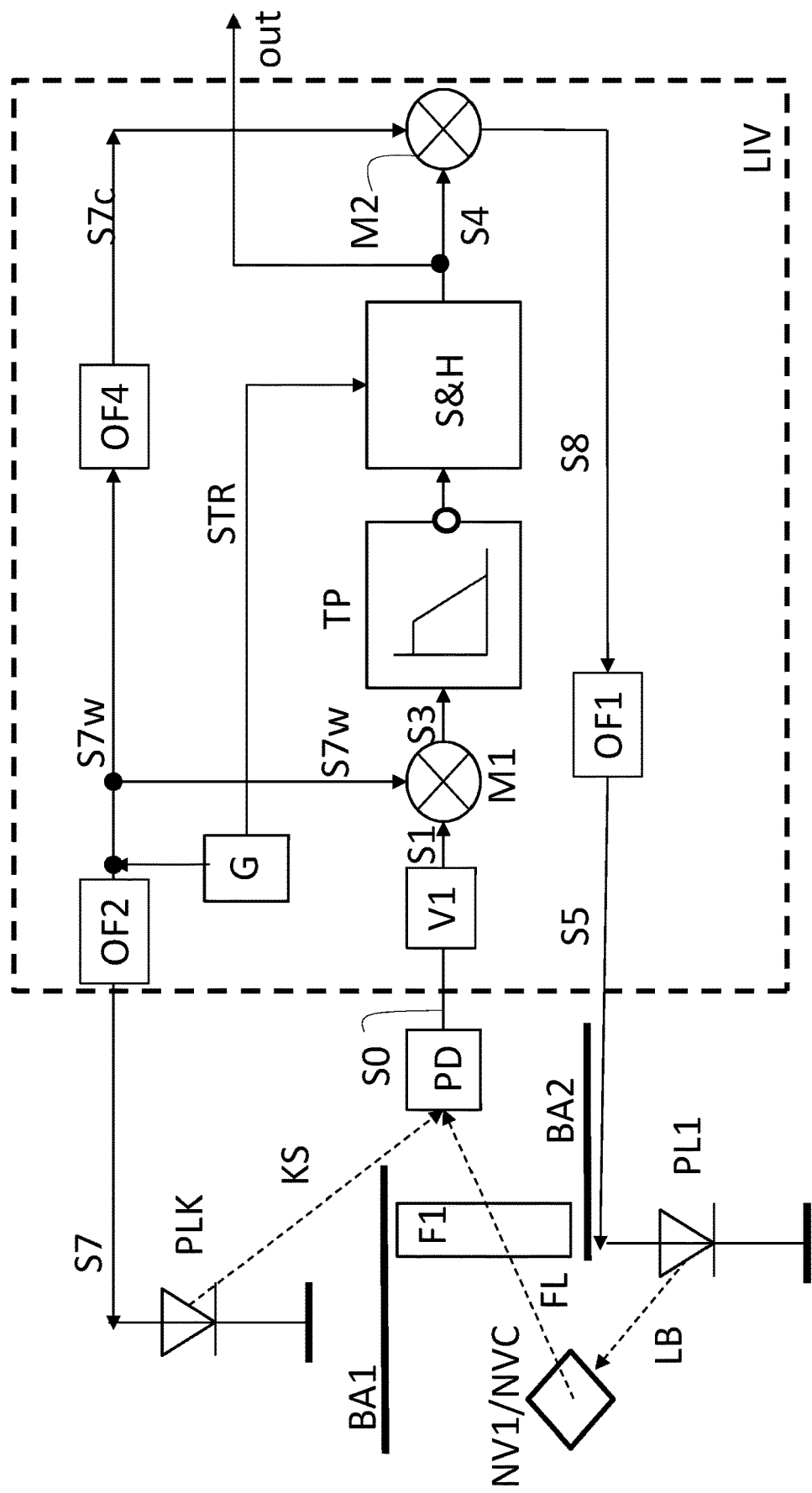
FIG. 14 corresponds to FIG. 10 with the difference analogous to the difference between FIGS. 6 and 7, where again a holding circuit (S&H) is inserted which is controlled by the signal generator (G) by means of a trigger signal (STR).

FIG. 14 corresponds to FIG. 12 with the difference that a holding circuit (S&H) is again inserted, which is controlled by the signal generator (G) by means of a trigger signal (STR).

Reference is made to FIG. 8 and FIG. 10.

FIG. 15

Figure 15:
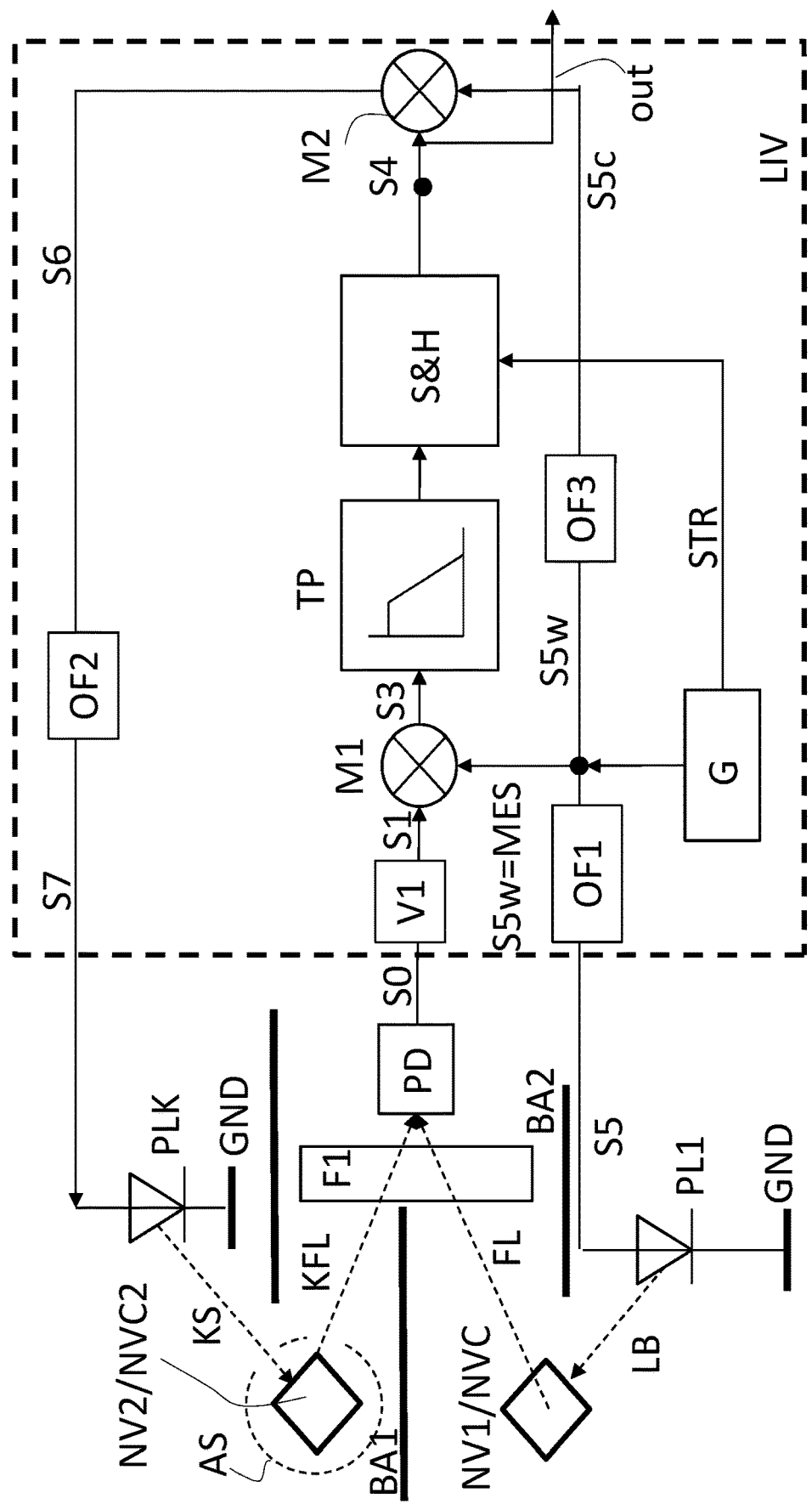
FIG. 15 corresponds to the greatest possible extent to FIG. 10, whereby, in contrast to FIG. 10, the compensation path is now constructed in the same way as the transmission path and whereby the compensation transmitter (PLK) now pumps one or more paramagnetic reference centers (NV2) and/or one group or more groups (NVC2) of paramagnetic reference centers (NV2), which then emit compensation fluorescence radiation (KFL), which then leads to compensation in place of the compensation radiation (KL) by means of irradiation of the radiation receiver (PD) with this compensation fluorescence radiation (KFL) and to a typically summing superimposed reception of this superimposition of the compensation fluorescence radiation (KFL) and the fluorescence radiation (FL) in the radiation receiver (PD), so that a Dicke amplifier system is formed.

FIG. 15 corresponds as far as possible to FIG. 10. In contrast to FIG. 10, the compensation path is now designed differently. In this variant, the compensating radiation source (PKL) is preferably the same as the pump radiation source (PL1) in order to implement a Dicke amplifier. For example, the pump radiation source (PL1) may be an Osram type PLT5 520B laser diode and the compensation radiation emitter (PKL) may also be an Osram type PLT5 520B laser diode. Preferably, the compensation radiation source (PKL) and the pump radiation source (PL1) are thermally coupled. Preferably, therefore, for this purpose, the pump radiation source (PL1) and the compensating radiation source (PLK) are located on the same semiconductor substrate or on a common heat sink or on a common carrier which is a good thermal conductor. Preferably, in case of realization on a common semiconductor substrate, the pump radiation source (PL1) and the compensation radiation source (PLK) have a common reference potential terminal. Preferably, in this variant, the compensating radiation source (PLK) does not directly radiate the compensating radiation (KS) into the radiation receiver (PD) as in FIG. 10. Instead, the compensating radiation (KS) serves as pump radiation for an additional reference sensor element with additional paramagnetic reference centers (NV2). Preferably, the paramagnetic reference centers (NV2) are NV centers in diamond. Preferably, the reference sensor element comprises one or more diamonds having one or more reference NV centers, NV centers, as paramagnetic reference centers (NV2).

In order to be able to detect a magnetic flux B, it is useful if the paramagnetic reference centers (NV2) of the reference sensor element are shielded from the magnetic flux density B by a shield (AS) or functionally equivalent measures or parts of the device. Ultimately, however, this shielding is not necessary if the paramagnetic reference centers (NV2) of the reference sensor element are exposed to a different magnetic flux density B than the paramagnetic centers (NV1) of the sensor element. In any case, the difference in the magnitudes of the magnetic flux density B at the location of the paramagnetic center or centers (NV1) and at the location of the paramagnetic reference center or centers (NV2) is detected and output as a sensor output signal (out).

In the example of FIG. 15, the paramagnetic reference centers (NV2) convert the compensating radiation (KS) of the compensating radiation source (PLK), which has a compensating radiation wavelength ($\lambda_{ks}$), into compensating fluorescence radiation (KFL), the intensity ($I_{kfl}$) of which depends on the intensity of the irradiation of the paramagnetic reference centers (NV2) with compensating radiation (KS). Preferably, the nature of the paramagnetic reference centers (NV2) is equal to the nature of the paramagnetic centers (NV1) in order to approximate an ideal reference noise source in terms of the Dicke principle. Thus, a particularly preferred example is that the paramagnetic centers (NV1) are NV centers in diamond and that the reference paramagnetic centers (NV2) are preferably also NV centers in diamond.

Preferably, at least a local density of the paramagnetic centers (NV1) emitting fluorescence radiation (FL) having a fluorescence radiation wavelength ($\lambda_{fl}$) is at least approximately equal to the density of a local density of the reference paramagnetic centers (NV2) emitting compensation fluorescence radiation (KFL) having a compensation fluorescence wavelength ($\lambda_{kfl}$).

Preferably, the paramagnetic centers (NV1) are NV centers in one or more HD-NV diamonds with a high NV center density.

Preferably, the paramagnetic reference centers (NV2) are NV centers in one or more HD NV diamonds with a high NV center density. The paramagnetic reference centers (NV2) may be arranged in one or more groups (NVC2) of paramagnetic reference centers (NVC2). The region of a group (NVC2) of paramagnetic reference centers (NV2) in the reference element preferably has a very high density of reference centers (NV2). In the case of NV centers as reference centers (NV2) in diamond, the region of the group of reference centers (NV2) is preferably HD-NV diamond as defined herein. The region of a group (NVC2) of paramagnetic reference centers (NV2) preferably has a density of reference centers, for example NV centers, of more than 0.01 ppm and/or of more than $10^{-3}$ ppm and/or of more than $10^{-4}$ ppm and/or of more than $10^{-5}$ ppm and/or of more than $10^{-6}$ ppm relative to the number of atoms of the substrate (D) in the considered volume within the substrate (D), that is, in the case of NV centers in diamond, of carbon atoms per unit volume. Thereby, a density of more than 0.01 ppm and/or even better 0.1 ppm is clearly preferred for use in the reference element.

Figure 71:
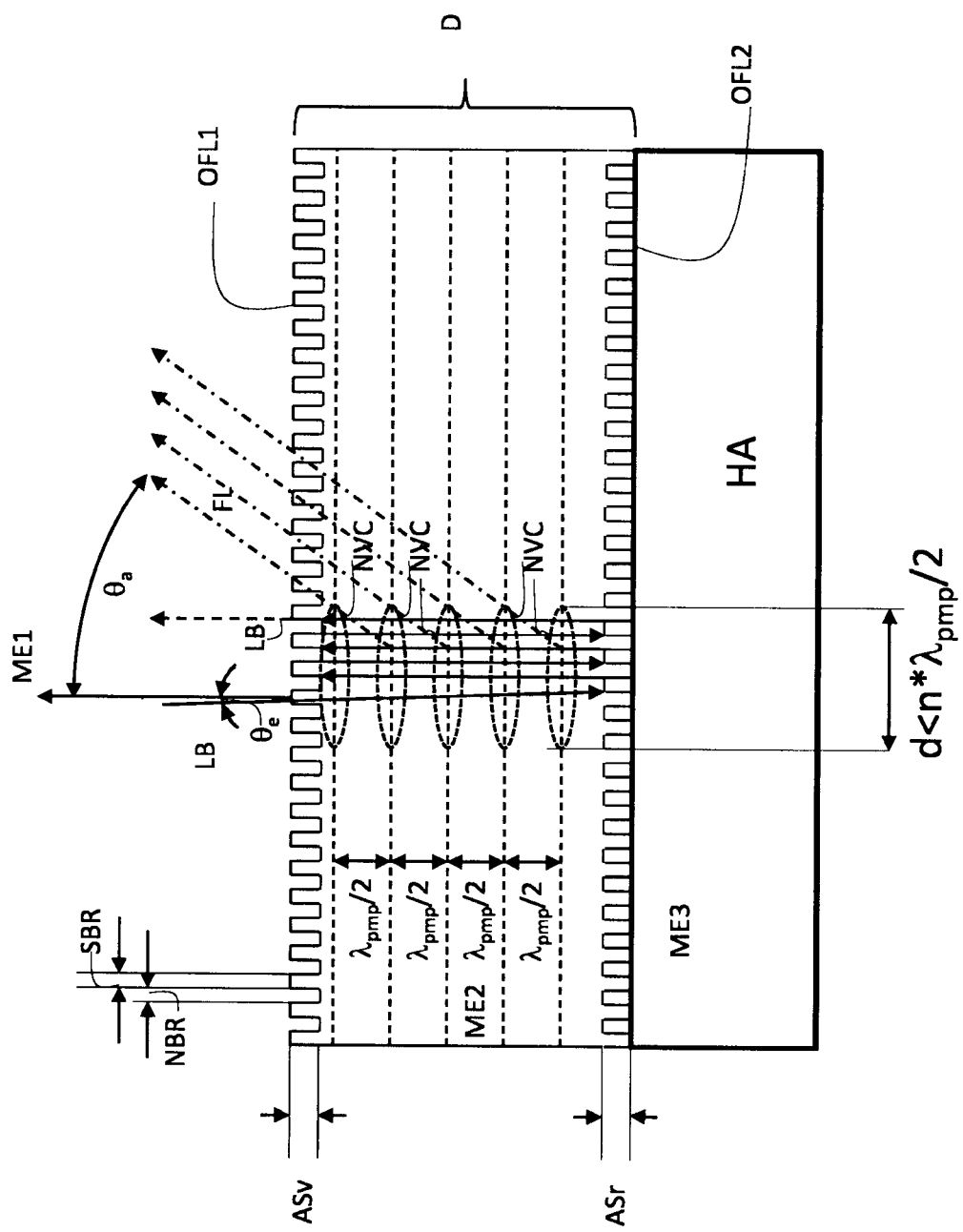
FIG. 71 shows an exemplary sensor element which is optimized with respect to the coupling properties of the pump radiation (LB) and the contrast (KT).

Reference is expressly made here to FIG. 71 together with the associated description, whereby the descriptions there concerning paramagnetic centers (NV1) and groups (NVC) of paramagnetic centers (NV1) can be transferred to paramagnetic reference centers (NV2) and groups (NVC2) of paramagnetic reference centers (NV2) in that in that in FIG. 71 the paramagnetic centers (NV1) are replaced by paramagnetic reference centers (NV2) and the groups (NVC) of paramagnetic centers (NV1) are replaced by groups (NVC2) of paramagnetic reference centers (NV2) and the pump radiation (LB) is replaced by the compensation radiation (KS) and the fluorescence radiation (FL) is replaced by the compensation fluorescence radiation (KFL) and the pump radiation wavelength ($\lambda_{pmp}$) is replaced by the compensation radiation wavelength ($\lambda_{ks}$). These groups (NVC2) of paramagnetic reference centers (NV2) then also have an extension (d) of the group (NVC2) of paramagnetic reference centers (NV2) to which what has been said there also applies and which preferably also have a distance of $\lambda_{ks}/2$ of the compensation radiation wavelength ($\lambda_{ks}$) in the direction of the pointing vector of the compensation radiation (KS).

Preferably, therefore, this extent (d) of a group (NVC2) of paramagnetic reference centers (NV2) perpendicular to the pointing vector of the incident compensating radiation (KS) within a sensor element is less than $n*\lambda_{ks}/2$ of the compensating radiation wavelength ($\lambda_{ks}$) with n as a positive integer. Preferably, $d<\lambda_{ks}/2$ and/or better $d<\lambda_{ks}/4$ and/or better $d<\lambda_{ks}/10$ and/or better $d<\lambda_{ks}/20$ and/or better $d<\lambda_{ks}/40$ and/or better $d<\lambda_{ks}/100$.

In an analogous manner, the region of a group (NVC) of paramagnetic centers (NV1) in the sensor element preferably also has a density of paramagnetic centers, for example NV centers, in the sensor element of more than 0.01 ppm and/or of more than $10^{-3}$ ppm and/or of more than $10^{-4}$ ppm and/or of more than $10^{-5}$ ppm and/or of more than $10^{-6}$ ppm relative to the number of atoms of the substrate (D) in the considered volume within the substrate (D), i.e. in the case of NV centers in diamond of carbon atoms per unit volume. Thereby, a density of more than 0.01 ppm and/or even better 0.1 ppm is clearly preferred for use in the sensing element.

Reference is expressly made here to FIG. 71 together with the associated description. These groups (NVC) of paramagnetic centers (NV1) then also have an extension (d) of the group (NVC) of paramagnetic centers (NV1) to which what is said there applies and which preferably have a distance of $\lambda_{pmp}/2$ of the pump radiation wavelength ($\lambda_{pmp}$) in the direction of the pointing vector of the pump radiation (LB). Preferably, therefore, this extension (d) of a group (NVC) of paramagnetic centers (NV1) perpendicular to the pointing vector of the incident pump radiation (LB) within a sensor element is less than $n*\lambda_{pmp}/2$ of the pump radiation wavelength ($\lambda_{pmp}$) with n as a positive integer. Preferably, d<$\lambda_{pmp}$/2 and/or better d<$\lambda_{pmp}$/4 and/or better d<$\lambda_{pmp}$/10 and/or better d<$\lambda_{pmp}$/20 and/or better d<$\lambda_{pmp}$/40 and/or better d<$\lambda_{pmp}$/100.

Diamond can be graphitized by amorphization through particle bombardment and the like. It is therefore conceivable that the paramagnetic centers (NV1) and the paramagnetic reference centers (NV2) are located in the same diamond crystal and the first barrier (BA1) or other optical barrier is graphite or amorphized diamond or otherwise blackened diamond within this diamond crystal.

Preferably, the compensation radiation wavelength ($\lambda_{ks}$) is equal to the pump radiation wavelength ($\lambda_{pmp}$) when the nature of the reference paramagnetic centers (NV2) is equal to the nature of the paramagnetic centers (NV1). In the case of NV centers, the compensating radiation wavelength ($\lambda_{ks}$) preferably is in a range between 500 nm and 6000 nm. Compensating radiation (KS) with a compensating radiation wavelength ($\lambda_{ks}$) of 520 nm has been successfully applied.

Preferably, the compensation fluorescence radiation wavelength ($\lambda_{kfl}$) of the compensation fluorescence radiation (KFL) of the paramagnetic reference centers (NV2) is equal to the fluorescence radiation wavelength ($\lambda_{fl}$) of the fluorescence radiation (FL) of the paramagnetic centers (NV1)—e.g. 637 nm for NV centers. In case of using NV centers as paramagnetic centers (NV1) and as paramagnetic reference centers (NV2), the compensation fluorescence radiation (KFL) and the fluorescence radiation (FL) are red.

In the exemplary case of FIG. 15, what is written for the pump radiation (LB) in the section "Definition of pump radiation" preferably also applies to the compensating radiation (KS).

The first filter (F1) is preferably not transparent to radiation of the pump radiation wavelength ($\lambda_{pmp}$) of the pump radiation (LB) of the pump radiation source (PL1).

The first filter (F1) in the case of the device FIG. 15 is preferably not transparent to radiation of the compensation radiation wavelength ($\lambda_{ks}$) of the compensation radiation (KS) of the compensation radiation source (PLK).

The first filter (F1) is preferably transparent to radiation of the fluorescence radiation wavelength ($\lambda_{fl}$) of the fluorescence radiation (FL) of the paramagnetic centers (NV1)—e.g. 637 nm for NV centers.

In the case of the device of FIG. 15, the first filter (F1) is preferably transparent to radiation of the compensation fluorescence radiation wavelength ($\lambda_{kfl}$) of the compensation fluorescence radiation (KFL) of the paramagnetic reference centers (NV2).

As a result, the intensity ($I_{kfl}$) of the compensation fluorescence radiation (KFL) of the paramagnetic reference centers (NV2) is superimposed on the intensity ($I_{fl}$) of the fluorescence radiation (FL) of the paramagnetic centers (NV1) in the radiation receiver (PD) to form an overall intensity.

The radiation receiver (PD) converts this total intensity back into a receiver output signal (S0), the value of which depends on the value of the total intensity from the superposition of the intensity ($I_{kfl}$) of the compensation fluorescence radiation (KFL) of the paramagnetic reference centers (NV2) with the intensity ($I_{fl}$) of the fluorescence radiation (FL) of the paramagnetic centers (NV1) in the radiation receiver (PD).

For the rest, reference is made to the preceding and, if applicable, subsequent explanations of the other devices concerning the operating principle of the control and to possible other realizations of the control.

FIG. 16

Figure 16:
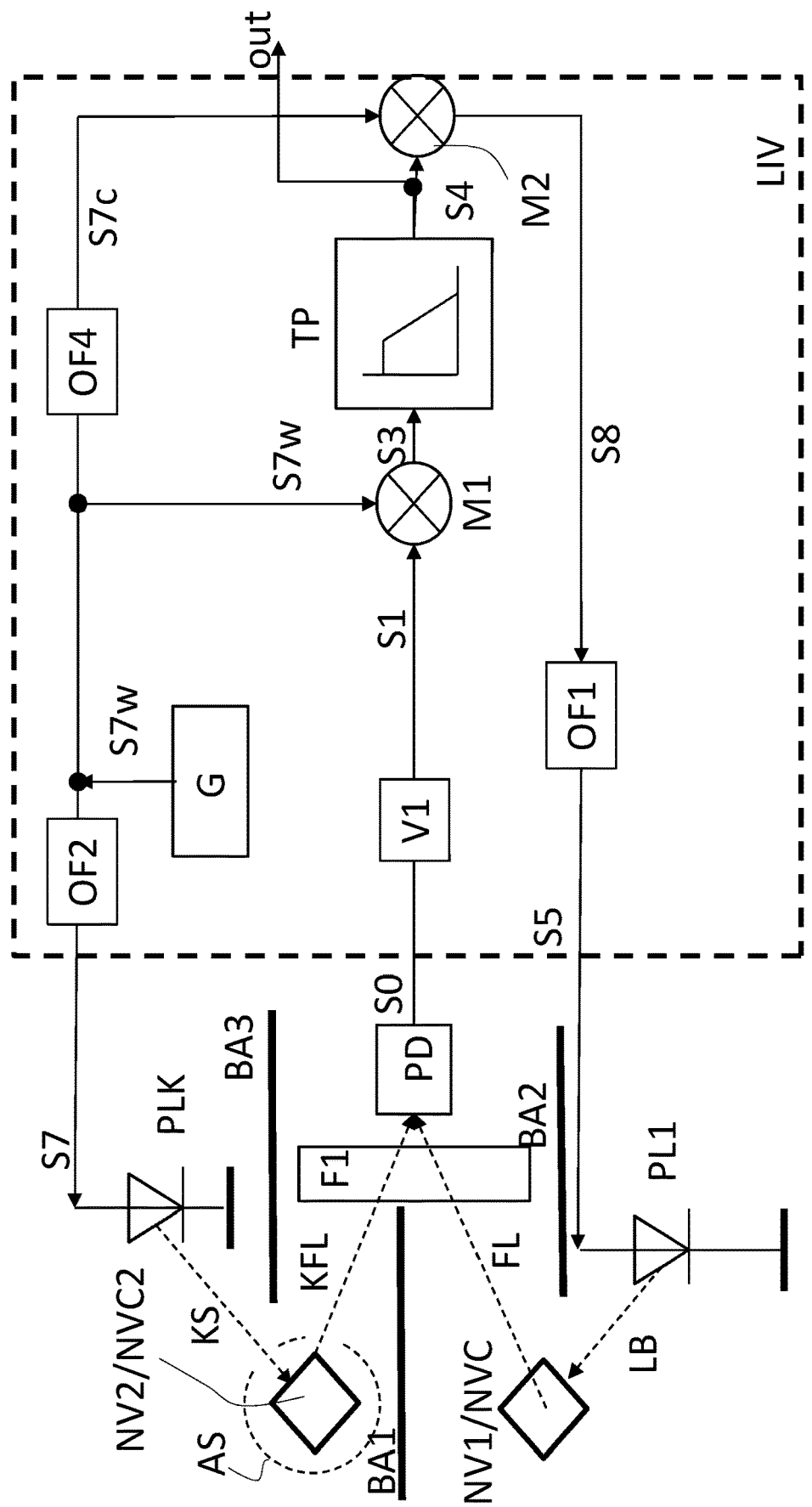
FIG. 16 shows the control of the intensity ($I_{pmp}$) of the pump radiation (LB), the difference between FIG. 15 and FIG. 16 corresponding to the difference between FIG. 10 and FIG. 12, so that while in FIG. 15 the intensity ($I_{ks}$) of the compensating radiation (KS) is controlled, in FIG. 16 the intensity ($I_{pmp}$) of the pump radiation (LB) is controlled.

The difference between FIG. 15 and FIG. 14 corresponds to the difference between FIG. 10 and FIG. 12. While in FIG. 15 the intensity ($I_{ks}$) of the compensating radiation (KS) is controlled, in FIG. 16 the intensity ($I_{pmp}$) of the pump radiation (LB) is controlled. Therefore, reference is made here to the description of FIGS. 10, 12 and 15, since the same principles are applied here.

FIG. 17

Figure 17:
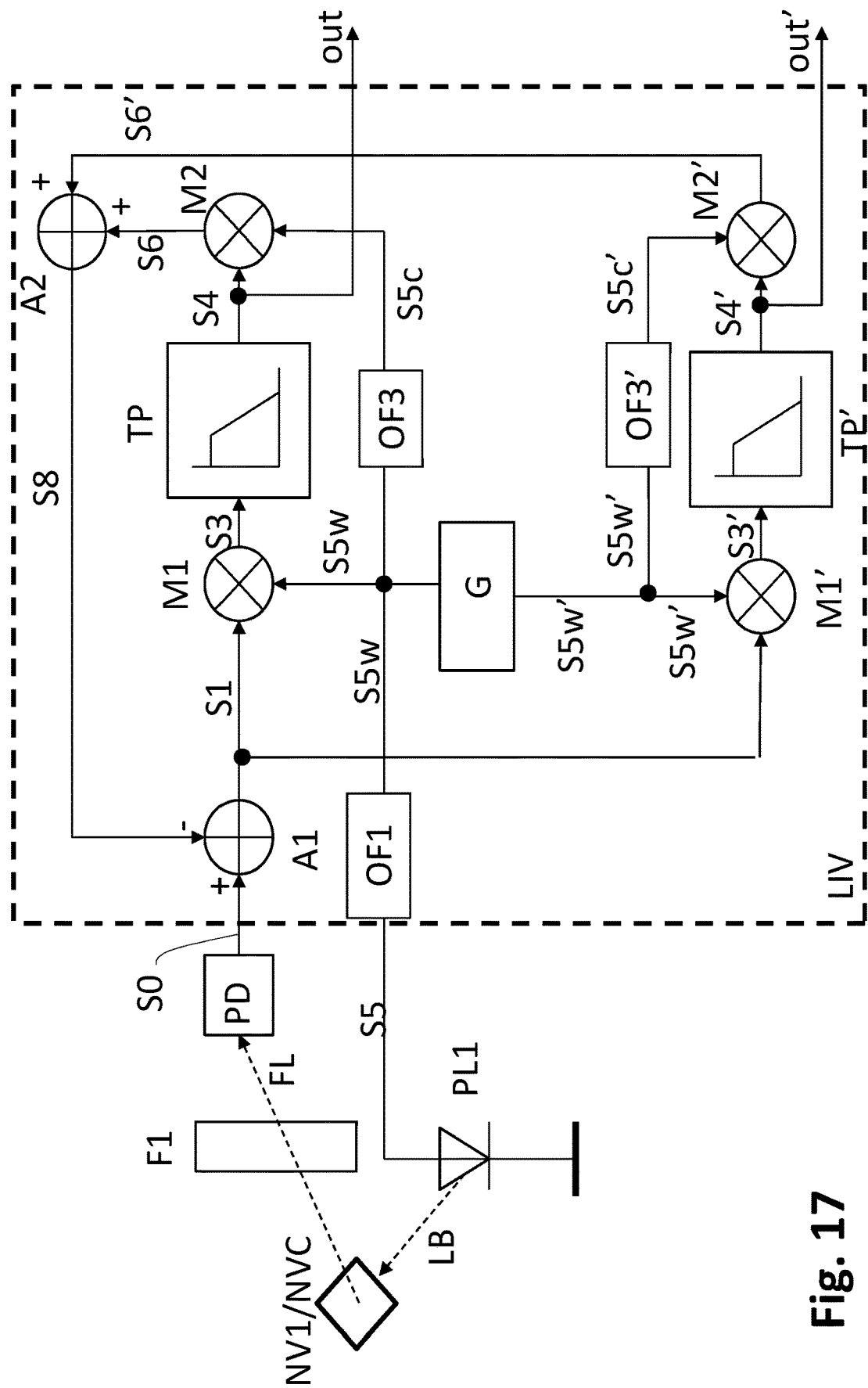
FIG. 17 corresponds to an extended system of FIG. 7, wherein the system of FIG. 17 comprises a second analysis path which can be used, for example, to determine the fluorescence phase shift time (ΔTFL).

FIG. 17 corresponds to an extended system of FIG. 7. FIGS. 9 and 12 can be extended in an analogous manner. FIG. 17 also shows a simple system for an exemplary partial function of an integrated circuit (IC) for measuring the intensity ($I_{fl}$) of the fluorescence radiation (FL) of paramagnetic centers (NV1) in order to determine an influencing physical parameter, such as the magnetic flux density B at the location of the paramagnetic centers (NV1). A signal generator (G) again generates an alternating component (S5w) of the transmission signal (S5). A loop filter (TP) and an additional loop filter (TP') are installed in the system. With respect to any signal X1, the loop filter (TP) and the additional loop filter (TP') preferably have an identical filter characteristic with an identical filter function F[X1]. The loop filter (TP) and the additional loop filter (TP') are linear filters. I.e. for the common filter function F[X1] applies for any real number a and any two signals X1 and X2:

$$F[a*X1]=a*F[X1]$$

$$F[X1+X2]=F[X1]+F[X2]$$

We request the following exemplary conditions:

$$F[1]=1$$

$$F[S5w]\approx 0$$

$$F[S5w*S5w]\approx 1$$

The generator (G) further generates the alternating component (S5w') of an orthogonal reference signal (S5'). For the alternating component (S5w') of the orthogonal reference signal (S5'), the following shall apply by way of example:

$$F[S5w']\approx 0$$

$$F[S5w'*S5w']\approx 0$$

Furthermore, we raise the exemplary requirement that the alternating component (S5w) of the transmission signal (S5) should be orthogonal to the alternating component (S5w') of an orthogonal reference signal (S5') that the generator (G) also generates.

$$F[S5w*S5'w]\approx 0$$

For simplicity, we assume for example that the transmission signal (S5) and the orthogonal reference signal (S5') are periodic with the transmission signal period ($T_p$). An additional first multiplier (M1') multiplies the reduced receiver output signal (S1) by the additional alternating component (S5w') to the additional filter input signal (S3'). The additional loop filter (TP') filters the filter input signal (S3') to the additional filter output signal (S4'). Here, for exemplary simplicity, it is assumed that the additional first multiplier (M1') has the same characteristics as the first multiplier (M1). Further, for exemplary convenience, it is assumed that the additional the additional loop filter (TP') has the same characteristics as the loop filter (TP). A first matching circuit adds again a DC component (S5g) of the transmission signal (S5) to the alternating component (S5w) of the transmission signal (S5) as previously described and, if necessary, performs a further emergency amplification with suitable gain and offset, i.e. by means of a substantially linear mapping.

The pump radiation source (PL1) converts the transmission signal (S5) again into a modulated pump radiation (LB), which impinges directly or as previously described indirectly on the sensor element and thus on the paramagnetic center (NV1) or the paramagnetic centers (NV1) or the group or groups (NVC) of paramagnetic centers (NV1) in the sensor element. There, this pump radiation (LB) excites the paramagnetic center (NV1) or the paramagnetic centers (NV1) or the group (NVC) or the groups (NVC) of paramagnetic centers (NV1) in the material of the sensor element to emit a fluorescence radiation (FL). The first filter (F1) allows radiation with the fluorescence radiation wavelength ($\lambda_{fl}$) of the fluorescence radiation (FL)—e.g. 637 nm for NV centers—to pass, while it substantially does not allow radiation with the pump radiation wavelength ($\lambda_{pmp}$) of the pump radiation (LB) of the pump radiation source (PL1) and thus the modulated pump radiation (LB) to pass. The fluorescence radiation (FL) is correlated, but typically modulated out of phase in a defined manner with respect to the pump radiation (LB). This can now be exploited. The modulated fluorescence radiation (FL) is received by the radiation receiver (PD) after passing the first filter (F1) and is converted into a modulated receiver output signal (S0). If necessary, the radiation receiver (PD) comprises further amplifiers and filters. A first adder (A1) subtracts a complex feedback signal (S8) from the receiver output signal (S0). This results in the reduced receiver output signal (S1). This reduced receiver output signal (S1) is further processed in two independent circuit sections.

First Circuit Part

A first multiplier (M1) multiplies the reduced receiver output signal (S1) by the alternating component (S5w) of the transmission signal (S5) to form the filter input signal (S3). The loop filter (TP) preferably passes substantially the DC component of the filter input signal (S3). This results in the filter output signal (S4) as the output signal of the loop filter (TP). Formally, the first multiplier (M1) and the low-pass filter of the loop filter (TP) form a scalar product of the reduced receiver output signal (S1) and the alternating component (S5w) of the transmission signal (S5). The value of the filter output signal (S4) then indicates how much of the alternating component (S5w) of the transmission signal (S5) is proportionally present in the reduced receiver output signal (S1). This filter output signal (S4) can be compared with a Fourier coefficient in its function. In this example, a third matching circuit (OF3) generates a complementary alternating component (S5c) of the transmission signal (S5) from the alternating component (S5w) of the transmission signal (S5). Reference is made to the alternative examples mentioned above and below, which are functionally equivalent. Ultimately, the point is that the feedback signal (S6) should be modulated in a complementary manner to the transmission signal (S5). A second multiplier (M2) multiplies the filter output signal (S4) by the complementary alternating component (S5c) of the transmission signal (S5) to form the feedback signal (S6). If the gain v of the loop filter (TP) is very large and of the correct sign and of the complementary alternating component (S5c) of the transmission signal (S5) and of the further complementary alternating component (S5c') of the orthogonal transmission signal (S5') are formed in the appropriate manner, the reduced receiver output signal (S1) typically no longer contains any significant components of the transmission signal (S5) except for a control error in the case of stability. For example, if the alternating component (S5w) of the transmission signal (S5) has amplitude (S5$w_a$), the complementary alternating component (S5c) of the transmission signal (S5) may be formed by the equation s5c=s5$w_a$-s5w. For example, if the alternating component (S5w') of the orthogonal transmission signal (S5') has amplitude (S5$w_a$'), the complementary alternating component (S5c') of the orthogonal reference signal (S5') may be formed by the equation s5c'=s5$w_a$'-s5w'.

The value of the filter output signal (S4) is then a measure of the intensity ($I_{fl}$) of the fluorescence radiation (FL) reaching the radiation receiver (PD).

Second Circuit Part

An additional first multiplier (M1') multiplies the reduced receiver output signal (S1) by the alternating component (S5w') of the orthogonal reference signal (S5') to form the additional filter input signal (S3'). The additional loop filter (TP') essentially passes the DC component of the additional filter input signal (S3'). This results in the additional filter output signal (S4') as the output signal of the additional loop filter (TP'). Formally, the additional first multiplier (M1') and the additional low-pass filter of the additional loop filter (TP') form a scalar product of the reduced receiver output signal (S1) and the alternating component (S5w') of the orthogonal reference signal (S5'). Preferably, this is done in formally the same way as in the first circuit part. The value of the additional filter output signal (S4') then indicates how much of the alternating component (S5w') of the orthogonal reference signal (S5') is proportionally present in the reduced receiver output signal (S1). This additional filter output signal (S4') can be compared with another Fourier coefficient in its function. In this example, an additional third matching circuit (OF3') generates an additional complementary alternating component (S5c') of the orthogonal reference signal (S5') from the additional alternating component (S5w') of the orthogonal reference signal (S5'). Reference is made to the alternative examples mentioned preceding and following, which are functionally equivalent. Ultimately, the point is that the additional feedback signal (S6') should be modulated complementary to the additional alternating component (S5w') of the orthogonal reference signal (S5'). An additional second multiplier (M2') multiplies the additional filter output signal (S4') by the additional complementary alternating component (S5c') of the orthogonal reference signal (S5') to form the additional feedback signal (S6'). If the gain v' of the additional loop filter (TP') is very large and of the correct sign, and the complementary transmission signal (S5c) and the further complementary transmission signal (S5c') are formed in the appropriate manner, the reduced receiver output signal (S1) typically no longer contains any portion of the alternating component (S5w') of the orthogonal reference signal (S5') except for a control error at stability. The value of the additional filter output signal (S4) is then a measure of the amplitude of the fluorescence radiation (FL) reaching the radiation receiver (PD) out of phase with respect to the pump radiation (LB) from the pump radiation source (PL1). In this way, the phase angle of the fluorescence radiation (FL) to the pump radiation (LB) or to the transmission signal (S5) can be determined. Experiments have shown that the phase angle in the form of the temporal value of the fluorescence shift time ($\Delta$TFL) of the fluorescence radiation (FL) with respect to the pump radiation (LB) or the transmission signal (S5) depends on the magnetic flux density B at the location of the paramagnetic centers (NV1) and, if necessary, on further physical parameters, such as the electric field strength E, the temperature $\vartheta$, the pressure P, the acceleration a, the rotational speed $\omega$ and, if necessary, the gravitational field strength g, etc., as well as their temporal derivatives and integrals. In this way, the fluorescence phase shift time (ΔTFL) can be determined. The fluorescence phase shift time (ΔTFL) is the delay of the alternating component (FLw) of the intensity ($I_{fl}$) of the fluorescence radiation (FL) with respect to the alternating component (S5w) of the transmission signal (S5).

Thus, this system then implements a method for operating a sensor system and/or quantum-technological system, the sensor system and/or quantum-technological system comprising a paramagnetic center (NV1) or a plurality of paramagnetic centers (NV1), which can also be arranged in one or more groups (NVC) of such paramagnetic centers (NV1), in the material of a sensor element and/or quantum-technological device element which is part of the sensor system and/or quantum-technological system. By means of a transmission signal (S5), a modulated transmission of a modulated pump radiation (LB) is performed in particular by the pump radiation source (PL1). One or more paramagnetic centers (NV1) or one or more groups (NVC) of paramagnetic centers (NV1) in a material of a sensor element and/or quantum technological device element generate a modulated fluorescence radiation (FL) which depends on the modulated pump radiation (LB). As described above, the paramagnetic center(s) or group(s) (NVC) of paramagnetic centers (NV1) is preferably one or more NV centers, optionally arranged in one or more groups (NVC), in a diamond sensing element. As also mentioned, the modulated fluorescence radiation (FL) is typically phase shifted in time with respect to the modulated pump radiation (LB) by a fluorescence phase shift time (ΔTFL). The paramagnetic center(s) (NV1) or the group(s) (NVC) of paramagnetic centers (NV1) in the material of the sensor element and/or quantum technological device element thus afterglow after excitation by the modulated pump radiation (LB) and continue to emit modulated fluorescence radiation (FL) even when no more modulated pump radiation (LB) is applied to the paramagnetic center(s) (NV1) or the group(s) (NVC) of paramagnetic centers (NV1) in the material of the sensor element and/or quantum-technological device element. This afterglow is represented and measurable by the additional sensor output signal (out') herein. Thus, receiving the modulated fluorescence radiation (FL) and generating a receiver output signal (S0) is performed. To determine the afterglow, the determination of the intensity ($I_{fl}$) of the modulated fluorescence radiation (FL) of the paramagnetic center (NV1) in the material of the sensor element takes place at times when the modulated emission of the modulated pump radiation (LB), in particular by the pump radiation source (PL1), does not take place. The corresponding measure is in each case the value of the additional sensor output signal (out')

This afterglow in the form of the temporal fluorescence shift time (ΔTFL) typically depends on the magnetic flux density B and possibly other physical parameters, such as the electric field strength E, the temperature ϑ, the pressure P, the acceleration a, the rotational speed ω and possibly the gravitational field strength g etc., as well as their temporal derivatives and integrals. As a rule, this also applies to the fluorescence radiation (FL) and in particular the intensity ($I_{fl}$) of the fluorescence radiation (FL).

A second adder (A2) sums the feedback signal (S6) and the additional feedback signal (S6') to form the complex feedback signal (S8), thus closing the control loop. The sign and the gain of the loop filters (TP and TP') as well as the rule for forming the complementary transmission signal (S5c) and the further, complementary transmission signal (S5c') in the third matching circuit (OF3) and of the further third matching circuit (OF3') are selected in such a way that stability is established in the control loop and essentially the reduced receiver output signal (S1) no longer contains any components of the complex feedback signal (S8) and of the alternating component (S5w) of the transmission signal (S5) and of the alternating component (S5w') of the orthogonal reference signal (S5') except for system noise and control errors.

FIG. 18

Figure 18:
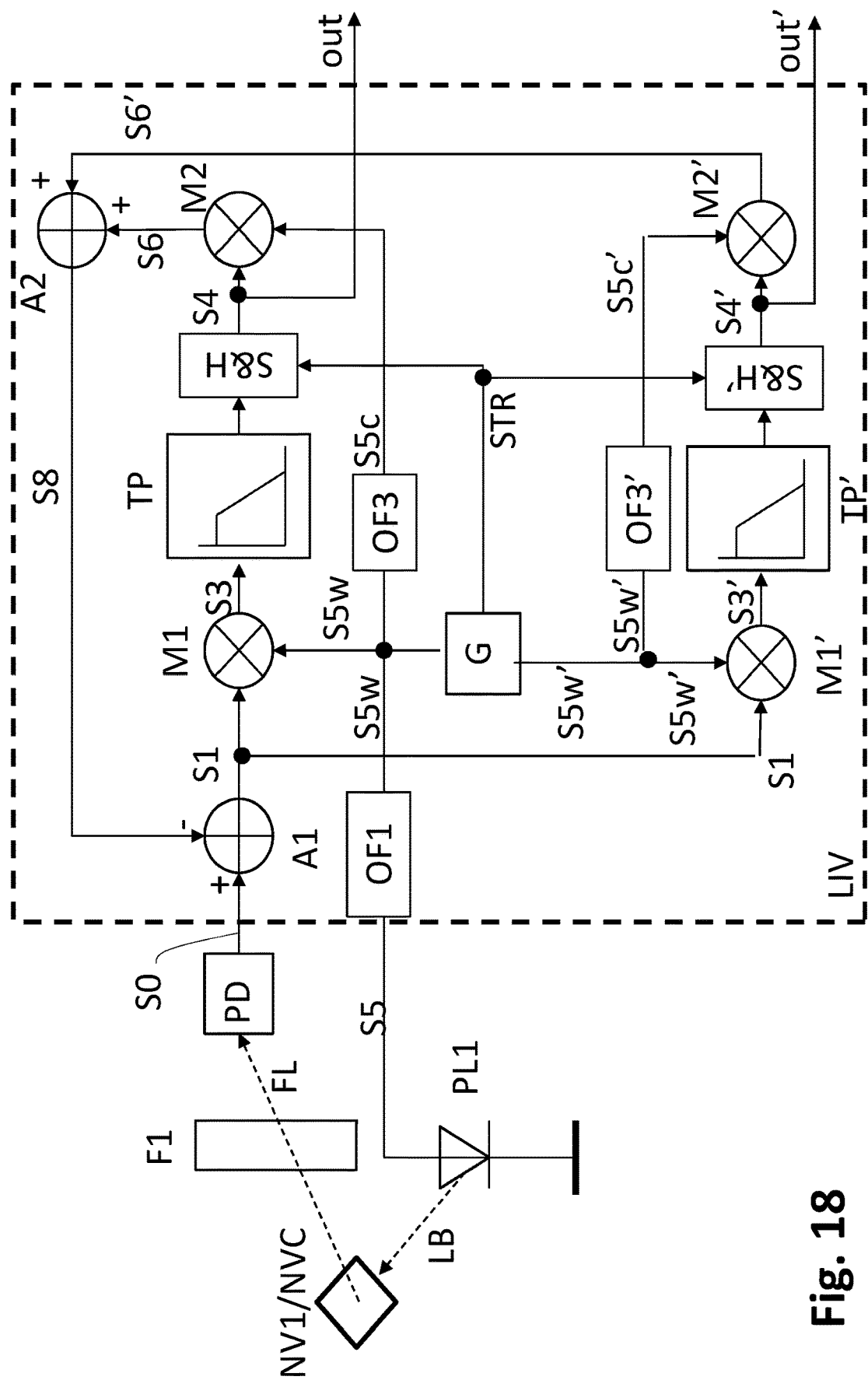
FIG. 18 shows the exemplary sensor system structure of FIG. 17 with one holding circuit in each control branch.

FIG. 18 shows the exemplary sensor system structure of FIG. 17 with one holding circuit (S&H, S&H') in each control branch.

FIG. 19

Figure 19:
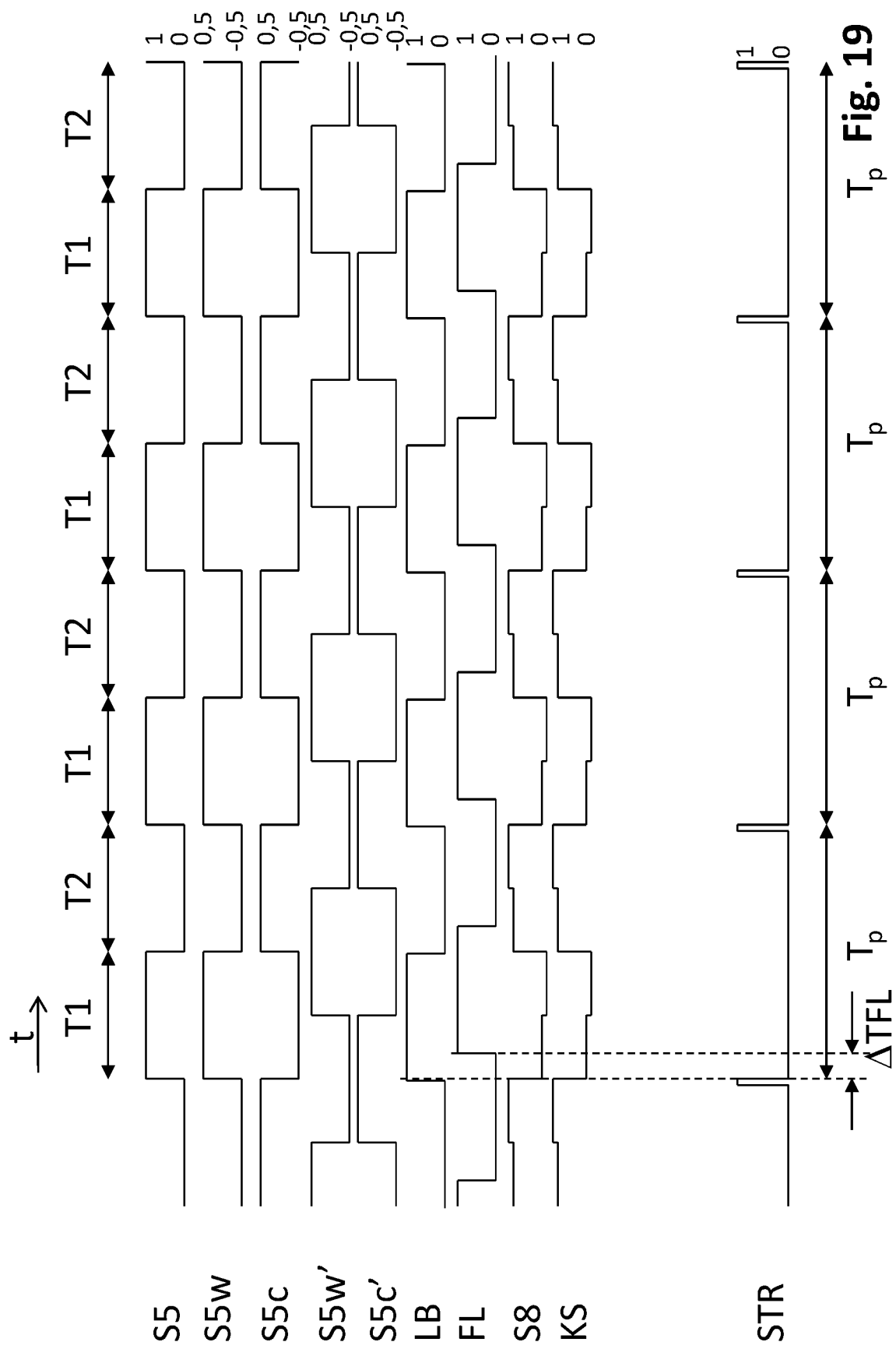
FIG. 19 shows exemplary signal characteristics with exemplary signals for a sensor system corresponding in its structure to FIGS. 17 and 18.

FIG. 19 shows exemplary signal characteristics with exemplary signals for a sensor system corresponding in structure to FIGS. 17 and 18. The alternating component (S5w') of the orthogonal reference signal (S5') is phase-shifted by π/2 relative to the alternating component (S5w) of the transmission signal (S5). The alternating component (S5w) of the transmission signal (S5) is exemplarily PWM modulated with a duty cycle of 50%. The signals are simplified for clarification and only schematically drawn with exemplary levels. Due to the simplification, these may deviate somewhat in detail in reality. A detailed system simulation is therefore recommended.

FIG. 20

Figure 20:
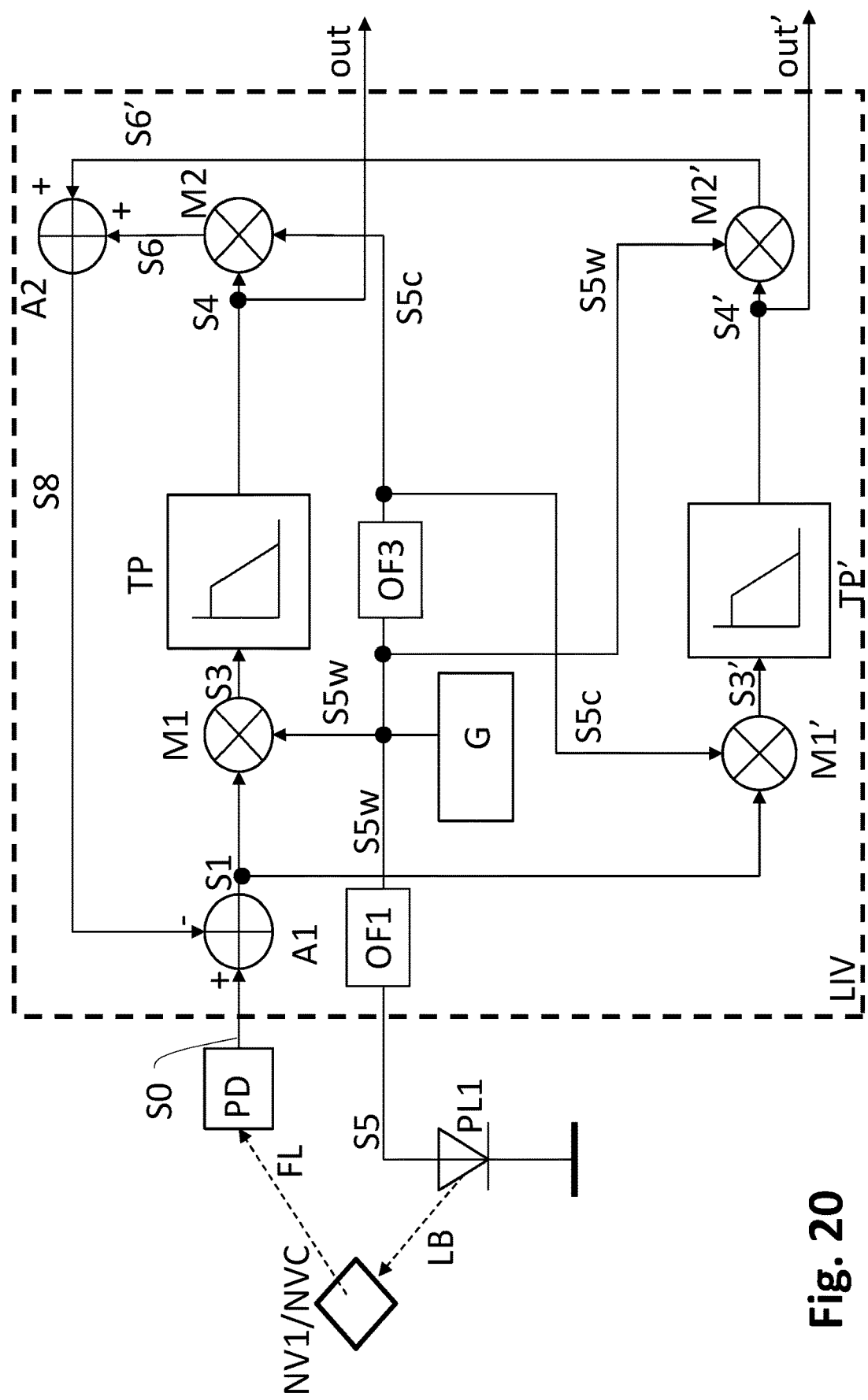
FIG. 20 also corresponds to an extended system of FIG. 7, but now the feedback is not optical, but electrical.

FIG. 20 also corresponds to an extended system of FIG. 7. FIGS. 9 and 12 can be extended in an analogous manner. FIG. 20 also shows a simple system for an exemplary partial function of an integrated circuit (IC) for measuring the intensity ($I_{fl}$) of the fluorescence radiation (FL) of paramagnetic centers (NV1) in order to determine an influencing physical parameter, such as the magnetic flux density B at the location of the paramagnetic centers (NV1). A signal generator (G) again generates an alternating component (S5w) of the transmission signal (S5). A loop filter (TP) and an additional loop filter (TP') are installed in the system. With respect to any signal X1, the loop filter (TP) and the additional loop filter (TP') preferably have an identical filter characteristic with an identical filter function F[X1]. The loop filter (TP) and the additional loop filter (TP') are linear filters. I.e. for the common filter function F[X1] applies for any real number a and any two signals X1 and X2:

$$F[a*X1]=a*F[X1]$$

$$F[X1+X2]=F[X1]+F[X2]$$

We request the following conditions:

$$F[1]=1$$

$$F[S5w]\approx 0$$

$$F[S5w*S5w]\approx 1$$

For simplicity, we assume that the transmission signal (S5) is periodic with the transmission signal period ($T_p$). An additional first multiplier (M1') multiplies the reduced receiver output signal (S1) by the complementary alternating component (S5c) to the additional filter input signal (S3'). The additional loop filter (TP') filters the filter input signal (S3') to the additional filter output signal (S4'). Here, for simplicity, it is assumed that the additional first multiplier (M1') has the same characteristics as the first multiplier (M1). Further, it is assumed that the additional the additional loop filter (TP') has the same characteristics as the loop filter (TP). A first matching circuit (OF1) again adds a DC component (S5g) of the transmission signal (S5) to the alternating component (S5w) of the transmission signal (S5)

as previously described, and performs a further noteworthy amplification (h1) if necessary.

The pump radiation source (PL1) converts the transmission signal (S5) again into a modulated pump radiation (LB), which impinges directly or indirectly as previously described on the sensor element and thus on the paramagnetic centers (NV1) in the sensor element. There, this pump radiation (LB) excites the paramagnetic centers (NV1) in the material of the sensor element to emit a fluorescent radiation (FL). The first filter (F1) allows radiation with the fluorescence wavelength ($\lambda_{fl}$) of the fluorescence radiation (FL)—e.g. 637 nm for NV centers—to pass, while it does not allow radiation with the pump radiation wavelength ($\lambda_{pmp}$) of the pump radiation (LB) of the pump radiation source (PL1) and thus the modulated pump radiation (LB) to pass. The fluorescence radiation (FL) is correlated but typically modulated out of phase with the pump radiation (LB) in a defined manner. This can now be exploited. The modulated fluorescence radiation (FL) is received by the radiation receiver (PD) after passing the first filter (F1) and is converted into a modulated receiver output signal (S0). If necessary, the radiation receiver (PD) comprises further amplifiers and filters. A first adder (A1) subtracts a complex feedback signal (S8) from the receiver output signal (S0). This results in the reduced receiver output signal (S1). This reduced receiver output signal (S1) is further processed in two independent circuit sections.

First Circuit Part

A first multiplier (M1) multiplies the reduced receiver output signal (S1) with the alternating component (S5w) of the transmission signal (S5) to form the filter input signal (S3). The loop filter (TP) typically passes the DC component of the filter input signal (S3). This results in the filter output signal (S4) as the output signal of the loop filter (TP). Formally, the first multiplier (M1) and the low-pass filter of the loop filter (TP) form a scalar product of the reduced receiver output signal (S1) and the alternating component (S5w) of the transmission signal (S5). The value of the filter output signal (S4) then indicates how much of the alternating component (S5w) of the transmission signal (S5) is proportionally present in the reduced receiver output signal (S1). This filter output signal (S4) can be compared with a Fourier coefficient in its function. In this example, a third matching circuit (OF3) generates a complementary alternating component (S5c) of the transmission signal (S5) from the alternating component (S5w) of the transmission signal (S5). Reference is made to the alternative examples mentioned above which are functionally equivalent. Ultimately, the point is that the feedback signal (S6) should be modulated in a complementary manner to the transmission signal (S5). A second multiplier (M2) multiplies the filter output signal (S4) by the complementary alternating component (S5c) of the transmission signal (S5) to form the feedback signal (S6). If the gain of the loop filter (TP) is very large, the reduced receiver output signal (S1) typically no longer contains any significant portions of the transmission signal (S5) except for a DC component and a control error at stability. The value of the filter output signal (S4) is then a measure of the intensity ($I_{fl}$) of the fluorescence radiation (FL) reaching the radiation receiver (PD).

Second Circuit Part

An additional first multiplier (M1') multiplies the reduced receiver output signal (S1) by the complementary alternating component (S5c) of the transmission signal (S5) to form the additional filter input signal (S3'). The additional loop filter (TP') passes the DC component of the additional filter input signal (S3'). This results in the additional filter output signal (S4') as the output signal of the additional loop filter (TP'). Formally, the additional first multiplier (M1') and the additional low-pass filter of the additional loop filter (TP') form a scalar product of the reduced receiver output signal (S1) and complementary alternating component (S5c) of the transmission signal (S5). Preferably, this is done in formally the same way as in the first circuit part. The value of the additional filter output signal (S4') then indicates how much of the complementary alternating component (S5c) of the transmission signal (S5) is proportionally present in the reduced receiver output signal (S1). This additional filter output signal (S4') can be compared to another Fourier coefficient in its function. Reference is made to the alternative examples mentioned above, which are functionally equivalent. An additional second multiplier (M2') multiplies the additional filter output signal (S4') by the alternating component (S5w) of the transmission signal (S5) to form the additional feedback signal (S6'). If the gain of the additional loop filter (TP') is very large, the reduced receiver output signal (S1) typically no longer contains any portion of the complementary alternating component (S5c) of the transmission signal (S5) except for a DC component and a control error at stability. The value of the additional filter output signal (S4) is then a measure of the amplitude of the fluorescence radiation (FL) reaching the radiation receiver (PD) at times when no pump radiation (LB) is emitted by the pump radiation source (PL1). Also in this way, the phase angle of the time course of, for example, the intensity ($I_{fl}$) of the fluorescence radiation (FL) to the time course of the value (s5w) of the alternating component (S5w) of the transmission signal (S5) can be determined as the time course value of the fluorescence shift time ($\Delta TFL$). Experiments have shown that the phase angle of the fluorescence radiation (FL) with respect to the pump radiation (LB) depends on the magnetic flux density B and/or possibly other physical parameters such as pressure P, temperature $\vartheta$, electric field strength E, acceleration a or rotation speed and $\omega$ their time derivatives and integrals at the location of the paramagnetic centers (NV1). In this way, the fluorescence phase shift time ($\Delta TFL$) can be determined. The fluorescence phase shift time ($\Delta TFL$) is the delay of the alternating component (FLw) of the intensity ($I_{fl}$) of the fluorescence radiation (FL) with respect to the alternating component (S5w) of the transmission signal (S5).

The advantage of this arrangement is that, when measuring via the additional sensor output signal (out'), the filter (F1) as well as a corresponding first adhesive (GL1) for attaching the first filter (F1) to the radiation receiver (PD) or the sensor element can be omitted, which further significantly reduces the cost of the system.

Thus, this system then implements a method for operating a sensor system and/or quantum-technological system, the sensor system and/or quantum-technological system comprising one or more paramagnetic centers (NV1) or one or more groups (NVC) of paramagnetic centers (NV1) in the material of a sensor element and/or quantum-technological device element which is part of the sensor system and/or quantum-technological system. By means of a transmission signal (S5), a modulated transmission of a modulated pump radiation (LB) is performed, in particular by the pump radiation source (PL1). One or more paramagnetic centers (NV1) or one or more groups of paramagnetic centers (NV1) in a material of a sensor element and/or quantum technological device element generates a modulated fluorescence radiation (FL) which depends on the modulated pump radiation (LB). As described above, the paramagnetic center(s) (NV1) or group(s) (NVC) of paramagnetic centers (NV1)

are preferably one or more NV centers in a diamond sensor element, optionally arranged in groups. As also mentioned, the modulated fluorescence radiation (FL) is typically phase shifted in time with respect to the modulated pump radiation (LB) by a fluorescence phase shift time (ΔTFL). The one or more paramagnetic centers (NV1) or the group or groups (NVC) of paramagnetic centers (NV1) in the material of the sensor element and/or quantum technological device element thus afterglow after excitation by the modulated pump radiation (LB) and continue to emit modulated fluorescence radiation (FL) even when no more modulated pump radiation (LB) is incident on the one or more paramagnetic centers (NV1) or the group or groups (NVC). the group or groups (NVC) of paramagnetic centers (NV1) in the material of the sensor element and/or quantum technological device element. This afterglow is represented by the additional sensor output signal (out') herein. Thus, receiving the modulated fluorescence radiation (FL) and generating a receiver output signal (S0) is performed. For determining the afterglow, the intensity ($I_{fl}$) of the modulated fluorescence radiation (FL) of the paramagnetic center (NV1) in the material of the sensor element is determined at times when the modulated emission of the modulated pump radiation (LB), in particular by the pump radiation source (PL1), and thus the excitation of the paramagnetic center (NV1) and/or of the paramagnetic centers (NV1) or of the group or groups (NVC) of the paramagnetic centers (NV1) no longer takes place. The corresponding measure for the afterglow of the fluorescence radiation (FL) by the fluorescence phase shift time (ΔTFL) related to the falling edges of the pump radiation (LB) is in each case the value of the additional sensor output signal (out')

A second adder (A2) sums the feedback signal (S6) and the additional feedback signal (S6') to the complex feedback signal (S8), thus closing the control loop. The signs and the gains of the loop filters (TP and TP') and the formation rule for the complementary transmission signal (S5c) are typically selected such that stability is established in the control loop and essentially the reduced receiver output signal (S1) no longer contains components of the complex feedback signal (S8) and the alternating component (S5w) of the transmission signal (S5) and the complementary alternating component (S5c) of the transmission signal (S5) except for system noise and control errors. The gains of the loop filters (TP and TP') and their frequency response and other characteristics are preferably made equal. This can be done, for example, if they are parts of an integrated circuit, by a matching design.

FIG. 21

Figure 21:
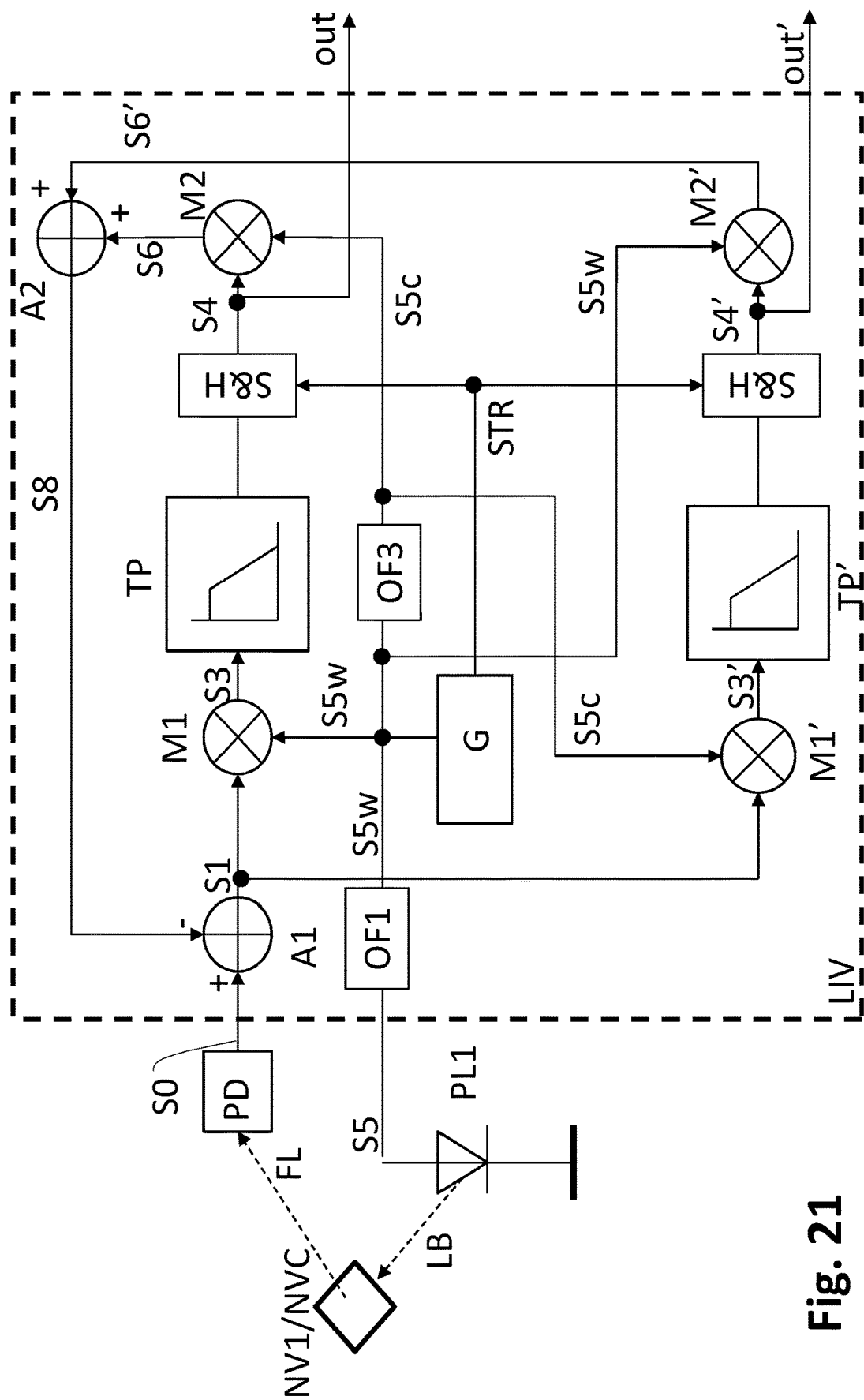
FIG. 21 shows the exemplary sensor system structure of FIG. 20 with one holding circuit in each control branch.

FIG. 21 shows the exemplary sensor system structure of FIG. 20 with one holding circuit in each control branch. Reference is made here to the preceding and following figures with holding circuits (S&H) and their descriptions.

FIG. 22

Figure 22:
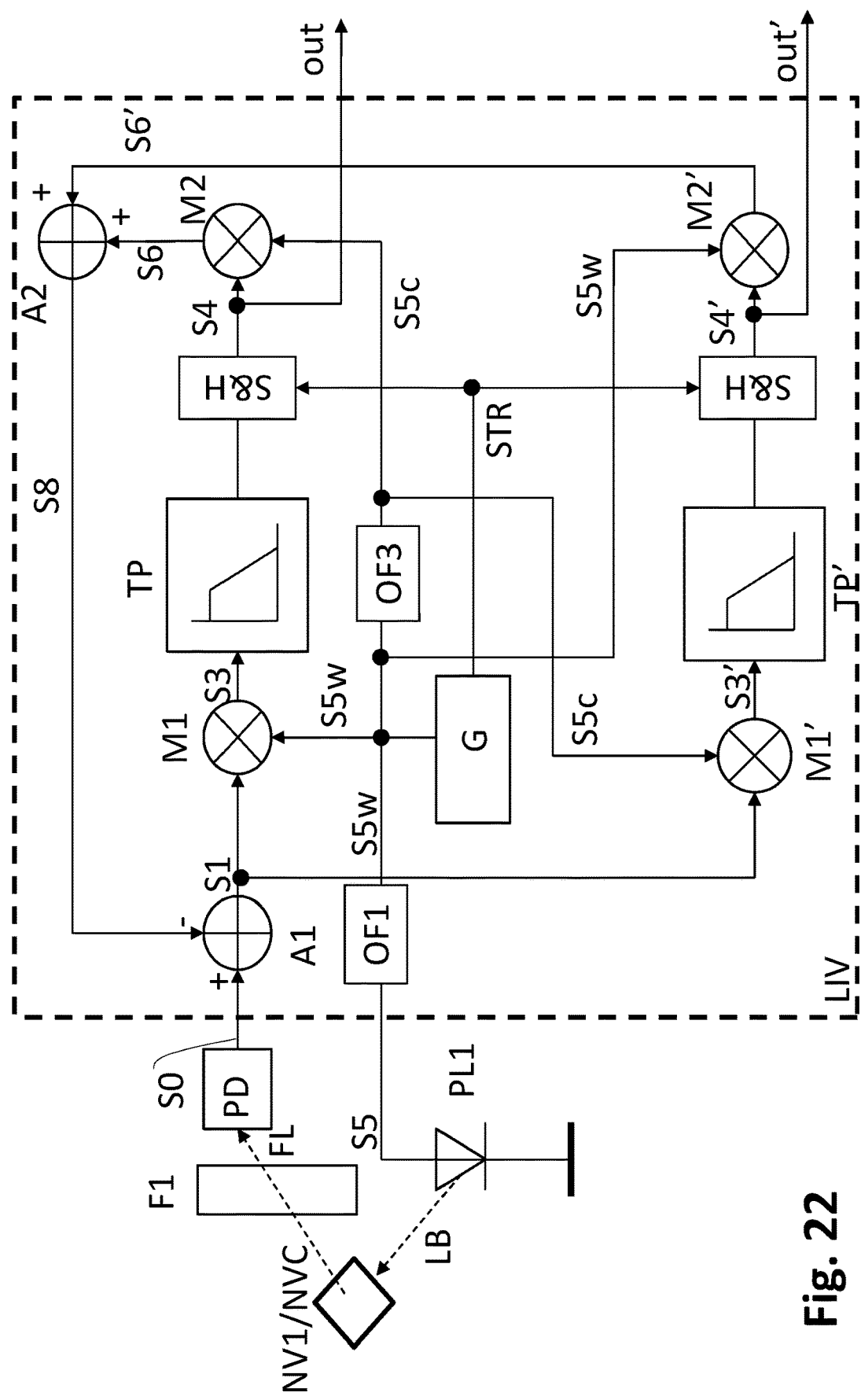
FIG. 22 corresponds to FIG. 21 with a first filter (F1) now being inserted as an example. The first filter (F1) is.

FIG. 22 corresponds to FIG. 21 with a first filter (F1) now being inserted as an example. The first filter (F1) is again preferably transparent for radiation with the fluorescence radiation wavelength ($\lambda_{fl}$) of the fluorescence radiation (FL) of the paramagnetic centers (NV1)—e.g. 637 nm for NV centers—and preferably not transparent for radiation with the pump radiation wavelength ($\lambda_{pmp}$) of the pump radiation (LB) of the pump radiation source (PL1).

FIG. 23

Figure 23:
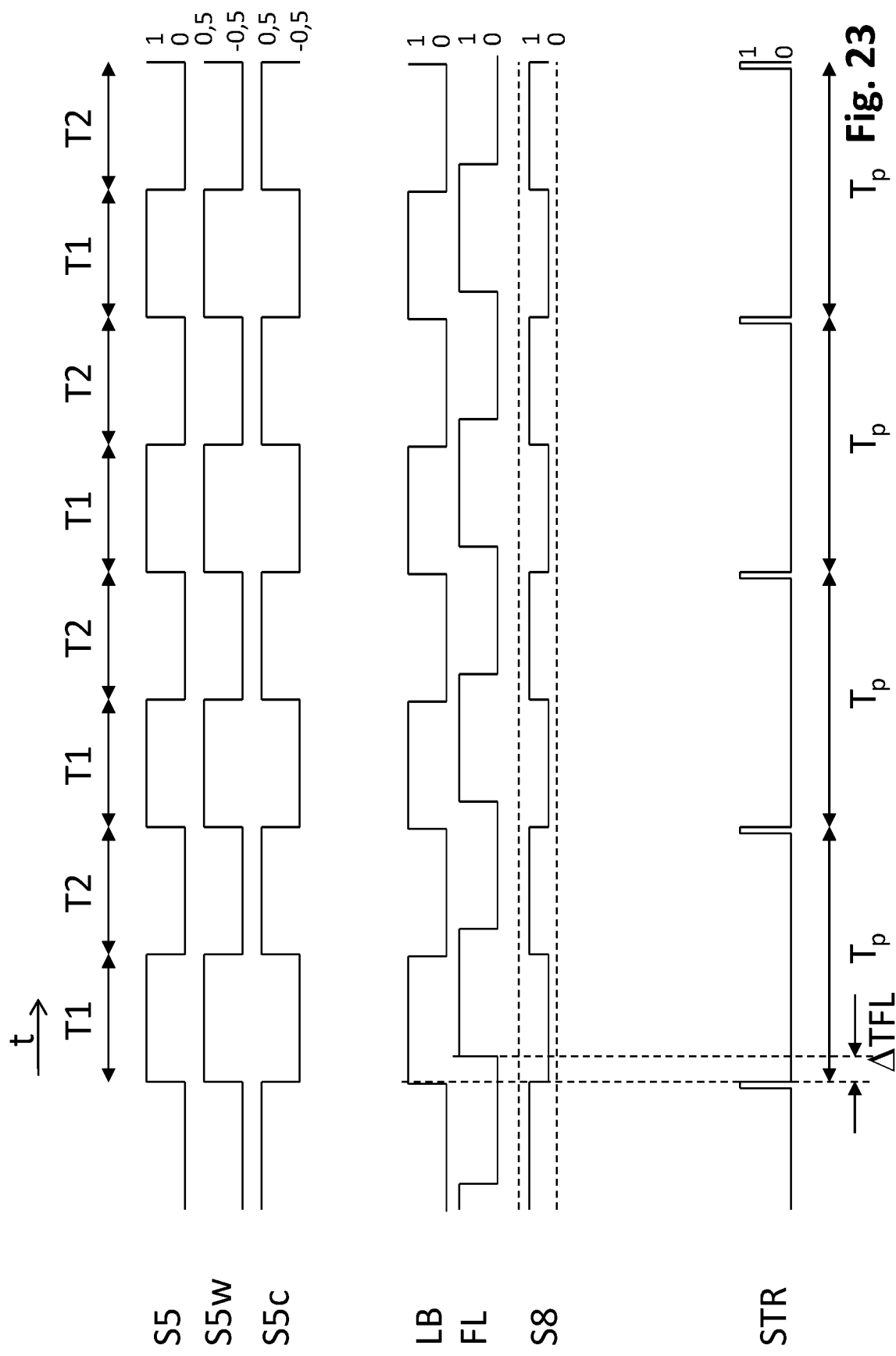
FIG. 23 shows exemplary signals for the sensor systems of FIGS. 20 to 22.

FIG. 23 shows exemplary signals for the sensor systems of FIGS. 20 to 22. The complex feedback signal (S8) does not have the full amplitude. Should the fluorescence phase shift time (ΔTFL) be a quarter of the transmission signal period ($T_p$), it would be a constant value signal. The signals are simplified for clarification and only schematically drawn with exemplary amplitudes.

FIG. 24

Figure 24:
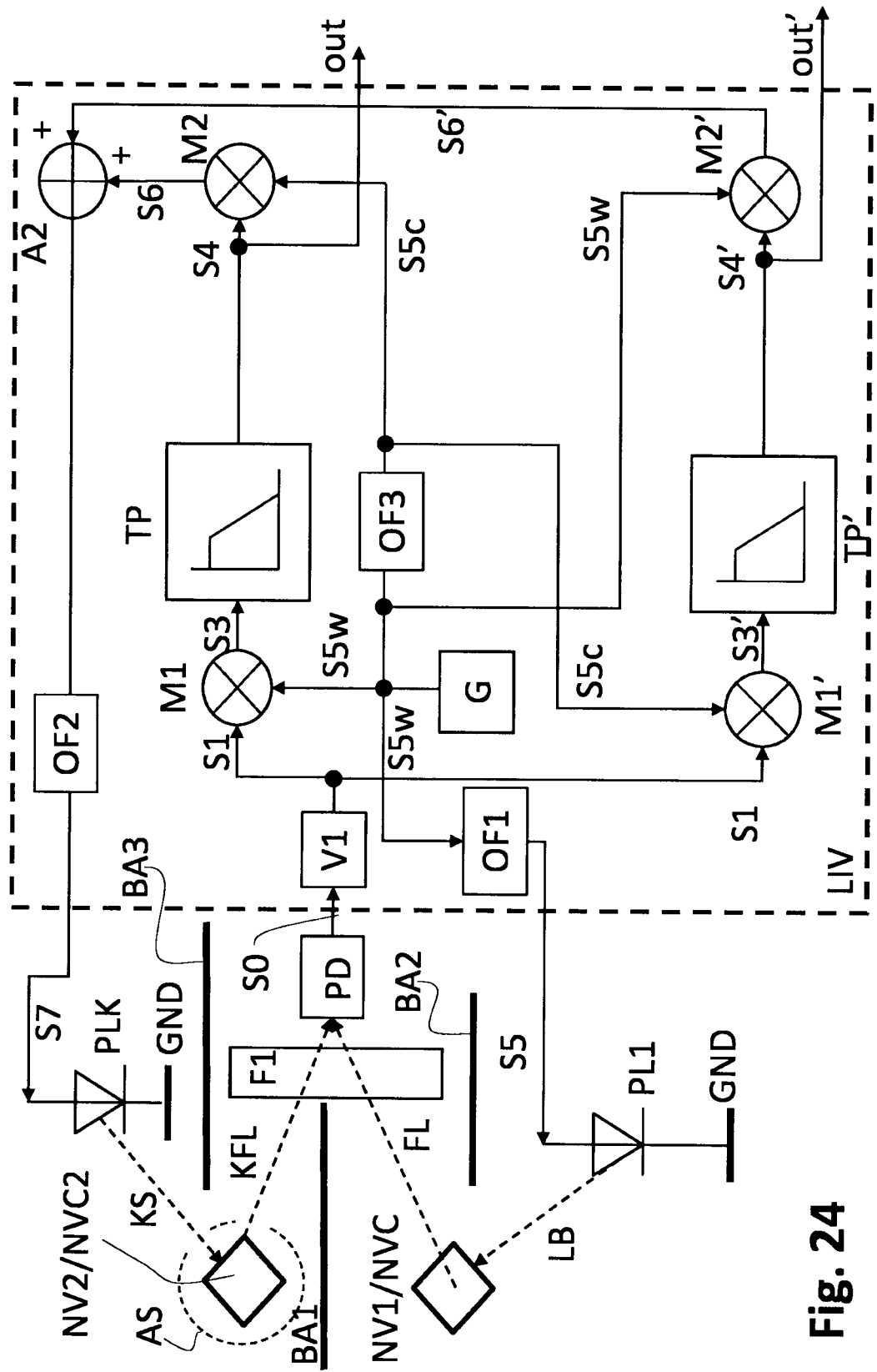
FIG. 24 corresponds to FIG. 20 with the difference that the first filter (F1) is provided and that the compensation path (PLK, KS, NV2, KFL, F1, PD) is designed as an ideal reference noise source.

FIG. 24 corresponds to FIG. 20 with the difference that the first filter (F1) is provided and that the compensation path is designed as an ideal reference noise source for the realization of a Dicke amplifier. In order to have the same noise characteristics as the transmission path via the pump radiation source (PL1, LB, NV1, FL, F1, PD1), the compensation path (PLK, KS, NV2, KFL, F1, PD) is implemented in the same way as the transmission path via the pump radiation source (PL1, LB, NV1, FL, F1, PD1). Preferably, the compensating radiation source (PLK) in the example of FIG. 24 is of the same type as the pump radiation source (PL1). Preferably, the pump radiation source (PL1) and the compensating radiation source (PLK) in the example of FIG. 24 are thermally coupled. Preferably, the pump radiation source (PL1) and the compensating radiation source (PLK) are not only implemented in the same way but also preferably in the same electrical, thermal and optical operating point, inter alia characterized by substantially the same operating current curve, substantially the same operating voltage curve, substantially the same operating temperature and substantially the same design of the downstream optical system, which concerns in particular the back reflection of the emitted light of the pump radiation source (PL1) back into the pump radiation source (PL1) and the back reflection of the emitted light of the compensation radiation source (PLK) back into the compensation radiation source (PLK) and their interaction with each other. Preferably all, less preferably fewer, of the above conditions are met. Preferably, the pump radiation source (PL1) and the compensation radiation source (PLK) in the example of FIG. 24 are part of the same semiconductor substrate (English chip, die). Preferably, the reference sensor element with the paramagnetic reference centers (NV2) in the example of FIG. 24 is fabricated in the same manner as the sensor element with the paramagnetic centers (NV1). Preferably, the density of the paramagnetic reference centers (NV2) irradiated by the compensating radiation (KS) is equal to the density of the paramagnetic centers (NV1) irradiated by the pumping radiation (LB). Preferably, in the example of FIG. 24, at the typical operating point of the sensor system, the intensity ($I_{ks}$) and the intensity density of the compensation radiation (KS) irradiating the paramagnetic reference centers (NV2) is equal to the intensity ($I_{pmp}$) and the intensity density of the pump radiation (LB) irradiating the paramagnetic centers (NV1). Preferably, constructive device parts and optical functional elements are used to adjust them in the same way. In the example of FIG. 24, the first filter (F1) is preferably transparent for the fluorescence radiation (FL) of the paramagnetic centers (NV1) and for the compensation fluorescence radiation (KFL) of the paramagnetic reference centers. In the example of FIG. 24, the first filter (F1) is preferably not transparent for the pump radiation (LB) of the pump radiation source (PL1) and for the compensation radiation (KS) of the compensation radiation source (PLK).

In the example of FIG. 24, a preferably present first barrier (BA1) prevents the crosstalk of the compensating radiation (KS) into the transmission path (PL1, LB, NV1, FL, F1, PD).

In the example of FIG. 24, the preferably present first barrier (BA1) prevents the crosstalk of the pump radiation (LB) into the compensation path (PLK, KS, NV2, KFL, F1, PD). In the example of FIG. 24, the preferably present second barrier (BA2) prevents the direct crosstalk of the pump radiation (LB) into the radiation receiver (PD). The preferably present third barrier (BA3) prevents the direct crosstalk of the compensating radiation (LB) into the radiation receiver (PD) in the example of FIG. 24. Typically, the barriers (BA1, BA2, BA3) are designed to merge into each other.

The intensity ($I_{kfl}$) of the compensating fluorescence radiation (KFL) and the intensity ($I_{fl}$) of the fluorescence radiation (FL) are superimposed in the radiation receiver (PD) to form the total radiation intensity. The radiation receiver (PD) generates the receiver output signal (S0) as a function of this total radiation intensity. A first amplifier (V1) amplifies the receiver output signal (S0) to the reduced receiver output signal (S1). The further processing is analogous to the description of FIG. 20. Instead of the complex feedback signal, the compensation transmission signal (S7) is formed as the value (s7) of the compensation transmission signal (S7) from the sum of the value (s6) of the feedback signal (S6) and the value (s6') of the further feedback signal (S6'), which again controls the compensation radiation source (PLK), preferably as a linear mapping, by means of a second matching circuit (OF2) in the manner already explained. The sensor system of FIG. 24 is able to determine, for example, a change in the magnetic flux density B both by means of the change in the intensity ($I_{fl}$) of the fluorescence radiation (FL) relative to the intensity ($I_{kfl}$) of the compensating fluorescence radiation (KFL), as well as determining a change of the magnetic flux density B by means of the change of the fluorescence phase shift time (ΔTFL) of the fluorescence radiation (FL) relative to the compensation fluorescence phase shift time (ΔKTFL) of the compensation fluorescence radiation (KFL). The fluorescence phase shift time (ΔTFL) of the fluorescence radiation (FL) from the paramagnetic centers (NV1) typically depends on the magnetic field strength and other physical parameters as mentioned elsewhere herein. In particular, it typically also depends on the isotopes in the vicinity of the paramagnetic center(s) or group(s) (NVC) of paramagnetic centers (NV1). Thus, the proposed device enables a completely new measurement device and measurement method for the interaction of nuclear spins, e.g., $^{13}$C-carbon isotopes in otherwise isotopically pure diamonds, with their environment and the physical parameters affecting them. For example, even minute shifts in GSLAC resonance can be detected by the device proposed herein. For example, if the material of the reference element with the reference centers (NV2) is an isotopically pure $^{12}$C diamond, at least in the vicinity of the reference centers (N2), and the material of the sensor element with the paramagnetic centers (NV1) is an isotopically pure $^{12}$C diamond, at least in the vicinity of the paramagnetic centers (N2), to a first approximation, but which is contaminated with $^{13}$C carbon isotopes in the region of the paramagnetic centers (NV1), for example by targeted focused ion implantation, then in the case of NV centers as paramagnetic centers (NV1) and on NV centers as reference centers (NV2), the GSLAC resonance of the paramagnetic centers (NV1) is slightly altered compared to the GSLAC resonance of the paramagnetic reference centers (NV2), which can be detected by the exemplarily proposed system of this FIG. 24. The exemplary proposed system, of FIG. 24 detects the intensity ($I_{fl}$) of the fluorescence radiation (FL) of the paramagnetic centers (NV1) and the intensity ($I_{kfl}$) of the compensation fluorescence radiation (KFL) of the paramagnetic reference centers (NV2) and determines a value for the difference between the intensity ($I_{fl}$) of the fluorescence radiation (FL) of the paramagnetic centers (NV1) and the intensity ($I_{kfl}$) of the compensation fluorescence radiation (KFL) in the form of the sensor output signal (out), which in the example of FIG. 24 corresponds to the sensor output signal (out), while the further sensor output signal (out') of FIG. 24 represents the delay of the temporal course of the intensity ($I_{fl}$) of the fluorescence radiation (FL) of the paramagnetic centers (NV1) with respect to the temporal course of the intensity ($I_{kfl}$) of the compensation fluorescence radiation (KFL), whereby it still comprises an amplitude component which, if necessary, must still be corrected out. still has to be corrected out.

FIG. 25

Figure 25:
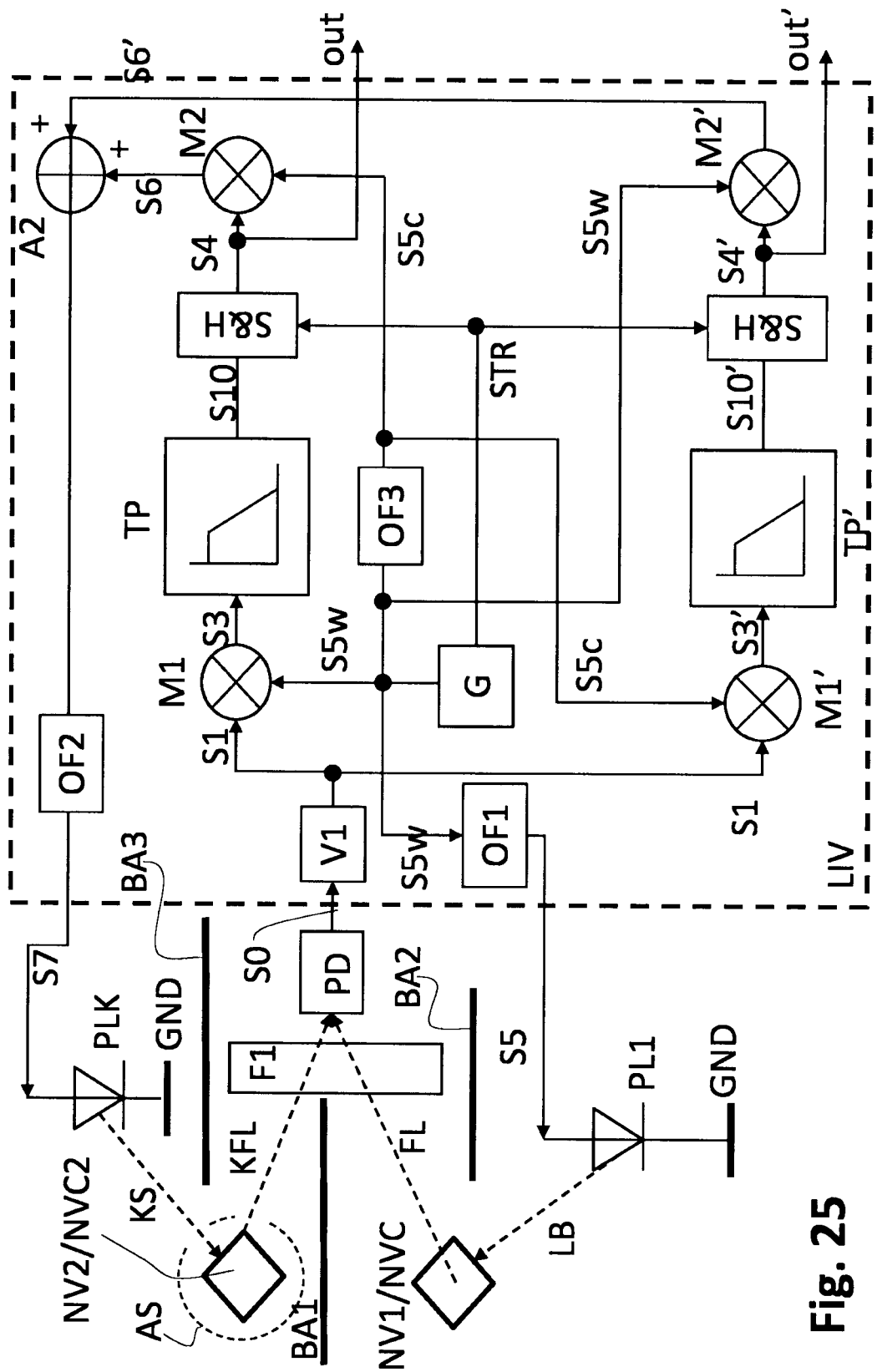
FIG. 25 shows the exemplary sensor system structure of FIG. 24 with one holding circuit in each control branch.

FIG. 25 shows the exemplary sensor system structure of FIG. 24 with one holding circuit in each control branch. Reference is made here to the explanations of the other figures of sensor systems with holding circuits (S&H).

FIG. 26

Figure 26:
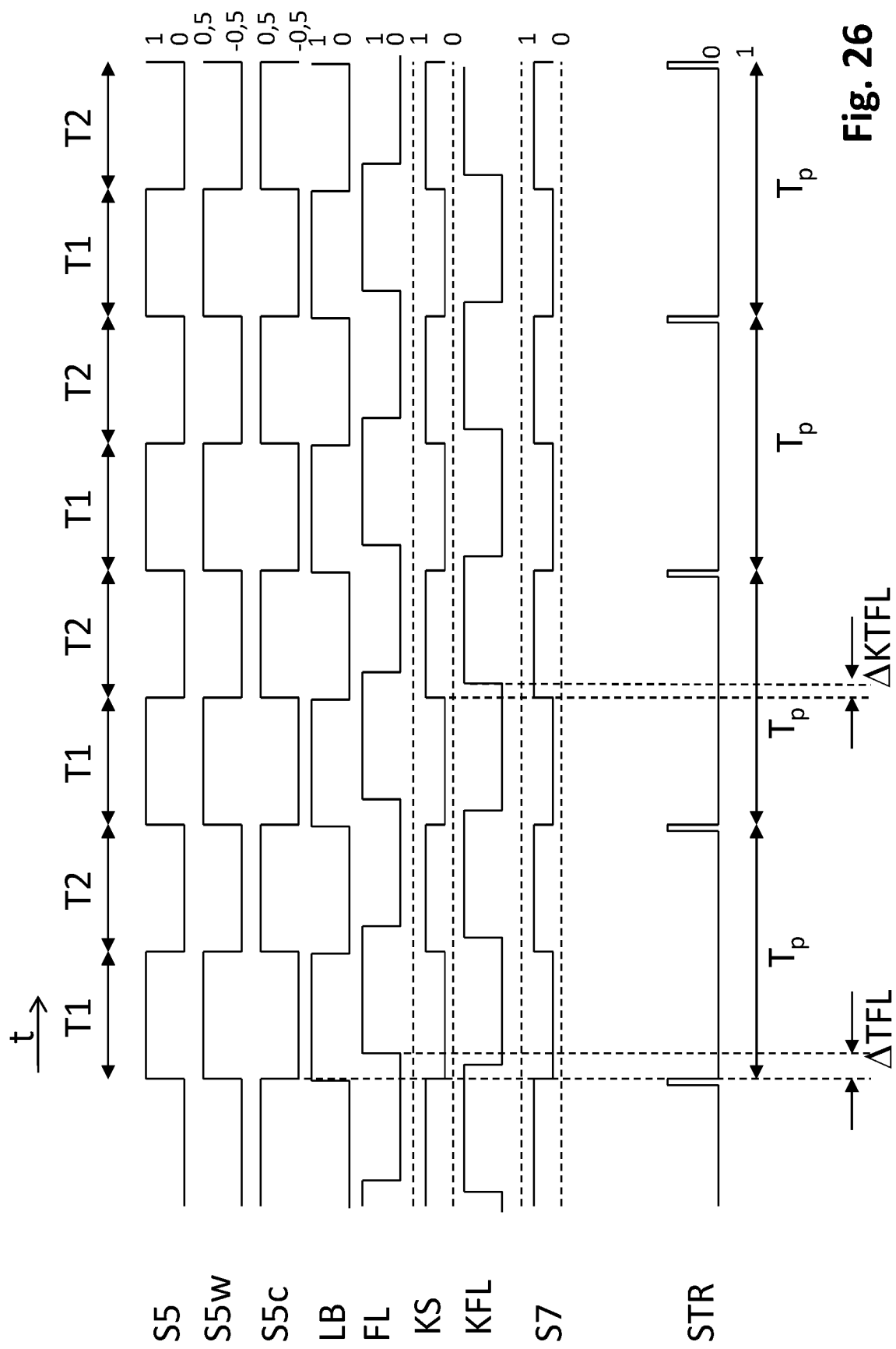
FIG. 26 shows exemplary signals for the sensor systems of FIGS. 24 to 25.

FIG. 26 shows exemplary signals for the sensor systems of FIGS. 24 to 25. The compensation transmission signal (S7) does not have the full amplitude. If the fluorescence phase shift time (ΔTFL) is a quarter of the transmission signal period ($T_p$), it would be a constant value signal. From the sensor output signal (out) and the additional sensor output signal (out') it is possible to conclude on the ratio of the intensity ($I_{kfl}$) of the compensation fluorescence radiation (KFL) of the paramagnetic reference centers (NV2) to the intensity ($I_{fl}$) of the fluorescence radiation (FL) of the paramagnetic centers (NV1) and to conclude on the ratio of the compensation fluorescence phase shift time (ΔKTFL) of the compensation fluorescence radiation (KFL) of the paramagnetic reference centers (NV2) to the fluorescence phase shift time (ΔTFL) of the fluorescence radiation (FL) of the paramagnetic centers (NV1). The signals are simplified for clarity and drawn schematically only. The fluorescence phase shift time (ΔTFL) of the fluorescence radiation (FL) of the paramagnetic centers (NV1) typically depends on the magnetic field strength and other physical parameters as mentioned elsewhere herein. In particular, it typically also depends on the isotopes in the vicinity of the paramagnetic center(s) or group(s) (NVC) of paramagnetic centers (NV1). Thus, the proposed device enables a completely new measurement device and measurement method for the interaction of nuclear spins, e.g., $^{13}$C-carbon isotopes in otherwise isotopically pure diamonds, with their environment and the physical parameters affecting them. For example, even the smallest shifts of the GSLAC resonance become possible. If, for example, the material of the reference element with the reference centers (NV2) is an isotopically pure $^{12}$C diamond at least in the vicinity of the reference centers (N2) and the material of the sensor element with the paramagnetic centers (NV1) is a $^{12}$C diamond which is isotopically pure to a first approximation at least in the vicinity of the paramagnetic centers (N2), but which is contaminated in the region of the paramagnetic centers (NV1) with $^{13}$C carbon isotopes, for example by targeted focused ion implantation, then in the case of NV centers as paramagnetic centers (NV1) and as reference centers (NV2), the GSLAC resonance of the paramagnetic centers (NV1) is altered relative to the GSLAC resonance of the paramagnetic reference centers (NV2), which can be detected by the exemplarily proposed system of FIG. 25. The exemplary proposed system, of FIG. 25 detects the intensity ($I_{fl}$) of the fluorescence radiation (FL) of the paramagnetic centers (NV1) and the intensity ($I_{kfl}$) of the compensation fluorescence radiation (KFL) of the paramagnetic reference centers (NV2) and determines a value for the difference between the intensity ($I_{fl}$) of the fluorescence radiation (FL) of the paramagnetic centers (NV1) and the intensity ($I_{kfl}$) of the compensation fluorescence radiation (KFL) in the form of the sensor output signal (out), which in the example of FIG. 25 corresponds to the sensor output signal (out), while the further sensor output signal (out') of FIG. 25 represents the delay of the temporal course of the intensity ($I_{fl}$) of the fluorescence radiation (FL) of the paramagnetic centers (NV1) with respect to the temporal course of the intensity ($I_{kfl}$) of the compensation fluorescence radiation (KFL), whereby it still comprises an amplitude component which, if necessary, must still be corrected out. still has to be corrected out.

FIG. 27

From the paper by A. Wickenbrock et. Al. "Microwave-free magnetometry with nitrogen-vacancy centers in diamond" Appl. Opt. Phys. Lett, 109, 053505 (2016), Feb. 8, 2016, a representation of the fluorescence intensity ($I_{fl}$) of the fluorescence radiation (FL) of a single NV center as a function of the magnetic flux density B is known in their FIG. 2a. In the relevant representation, the first direction of the NV center axis and the second direction of the magnetic flux density B coincide. In contrast, FIG. 27 of the document presented herein shows the dependence of the intensity ($I_{fl}$) of the fluorescence radiation (FL) on the magnetic flux density B when the first directions are tilted with respect to the second direction—i.e. the axis of the NV center as the first direction with respect to the axis of the magnetic flux density B as the second direction with respect to each other. Preferably, to achieve this, the sensing element comprises, for example, a plurality of randomly aligned HD NV diamonds each having a high density of NV centers. As a consequence, firstly, the spikes of the paramagnetic centers (NV-P1, NV-VM and GSLAC) disappear in the curve of the dependence of the intensity ($I_{fl}$) of the fluorescence radiation (FL) on the magnetic flux density (B) and the dependence of the intensity ($I_{fl}$) of the fluorescence radiation (FL) on the magnitude of the magnetic flux density B is monotonically decreasing above an offset magnitude of the bias flux density ($B_0$) of about 5 mT to 10 mT. Furthermore, due to the high density of NV centers in HD-NV diamonds, for example, the contrast of 4.5% in the publication by A. Wickenbrock et. Al. "Microwave-free magnetometry with nitrogen-vacancy centers in diamond" Appl. Opt. Phys. Lett, 109, 053505 (2016), Feb. 8, 2016 may be increased to up to 50% at high intensity ($I_{pmp}$) of the pump radiation (LB), i.e. intense pump radiation power of the pump radiation (LB), and suitable distribution of the NV centers. Reference is made here to FIG. 71, which shows an exemplary substrate (D) for use as a sensor element or in a sensor element, The device of FIG. 71 shows means and methods for further increasing the contrast. In particular, the paramagnetic centers (NV1) in FIG. 71 are arranged in groups (NVC) of paramagnetic centers (NVC) which, in the case of NV centers in diamond as paramagnetic centers (NV1), preferably represent regions of HD-NV-diamond. These groups (NVC) of paramagnetic centers (NVC) preferably represent areas with a very high density of NV centers and areas in which the NV centers preferentially couple with each other.

By a directional detuning or de-calibration of the FIG. 2a of the publication A. Wickenbrock et. Al. "Microwave-free magnetometry with nitrogen-vacancy centers in diamond" Appl. Phys. Lett, 109, 053505 (2016), Feb. 8, 2016 a bad quantum number is created, which leads to a mixing of quantum states and thus to a decrease of the intensity ($I_{fl}$) of the fluorescence radiation (FL) with increasing magnitude of the magnetic flux density B. An additional magnetic field is applied in the form of an additional magnetic flux density B, which does not point in the direction of the first direction of the crystal axis. The luminescence behavior of FIG. 2a of the paper A. Wickenbrock et. Al. "Microwave-free magnetometry with nitrogen-vacancy centers in diamond" Appl. Opt. Phys. Lett, 109, 053505 (2016), Feb. 8, 2016 as a function of the magnitude of the magnetic flux density B can thus only be observed when the diamond crystals are precisely aligned. A rotation by fractions of a degree makes the resonances disappear. In particular, the resonances shown in FIG. 2a of A. Wickenbrock et. Al. "Microwave-free magnetometry with nitrogen-vacancy centers in diamond" Appl. Opt. Phys. Lett, 109, 053505 (2016), Feb. 8, 2016 discernible resonance points (peaks) are only visible when the magnetic field direction is aligned with the crystal axis.

Figure 27:
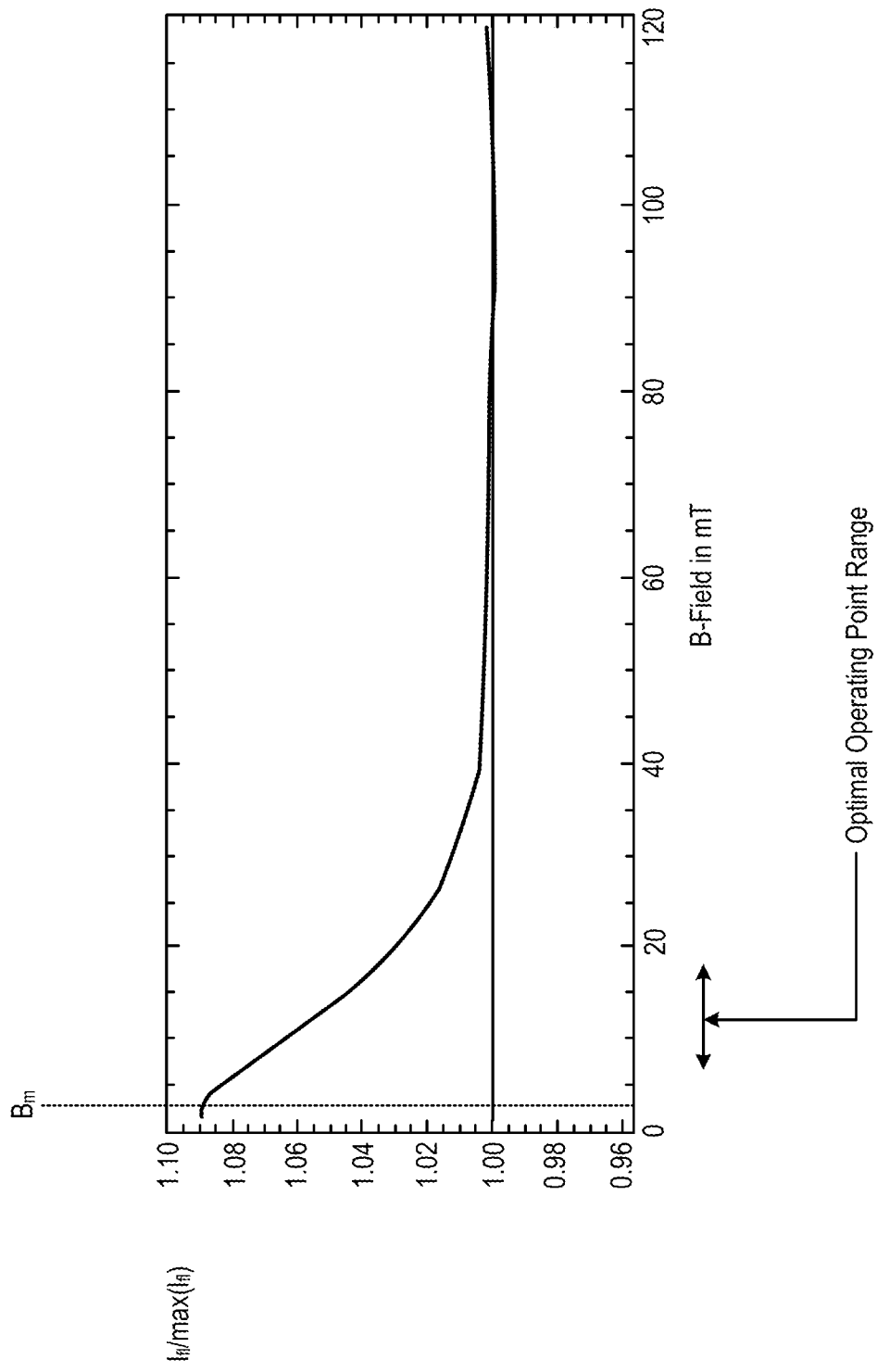
FIG. 27 shows the dependence of the intensity ($I_{fl}$) of the fluorescence radiation (FL) on the magnetic flux density B when the two directions—the axis of the NV center and the axis of the magnetic flux density B—are tilted relative to each other.

FIG. 27 shows the resulting curve when the orientation is decalibrated (i.e. a different first and second direction). Only then is it possible to measure the magnitude of the magnetic flux density B with any orientation of the magnetic field. As can easily be seen in FIG. 27, the dependence between the magnitude of the magnetic flux density B and the intensity ($I_{fl}$) of the fluorescence radiation (FL) is greatest in an optimum operating point range. By means of an additional permanent magnet and/or a current-carrying electrical compensation coil (LC), a magnetic bias flux density ($B_0$) can be superimposed on the magnetic flux density B to be measured, whereby the change in intensity ($I_{fl}$) of the fluorescence radiation (FL) is maximized in the case of changes in the externally acting magnetic flux density B.

By controlling by means of a controller (RG), the magnetic flux density B at the location of the paramagnetic center (NV1) or the paramagnetic centers (NV1) or the group or groups (NVC) of paramagnetic centers (NV1) can be kept above a minimum magnetic flux density ($B_m$) in terms of magnitude and in the vicinity of the optimum magnetic flux density ($B_{opt}$). For this purpose, the controller preferably uses a measured value, for example the value (s4) of the filter output signal (S4), and slowly readjusts the coil current of a compensation coil (LC) as a function of this value (s4) of the filter output signal (S4) as an actual value, for example by means of an operating point control signal (S9). The use of other, e.g. mechanical and/or micromechanical actuators is possible. If the system is adjusted, the instantaneous value of the output signal of the controller (RG), for example the instantaneous value (s9) of the operating point control signal (S9), represents the instantaneous measured value of the magnetic flux density (B).

A non-alignment of the first direction with respect to the second direction can be recognized by the fact that no resonances occur. Of course, it is always possible to align the magnetic field in such a way that these resonances occur. However, if a device is intended and suitable for measuring magnetic fields in which the first and second directions do not coincide, it is also within the scope of the corresponding claims, provided that the other features thereof apply, even if it exhibits said resonances in a certain magnetic field direction.

The avoiding of the resonance cases of FIG. 2a of the paper A. Wickenbrock et. Al. "Microwave-free magnetometry with nitrogen-vacancy centers in diamond" Appl. Opt. Phys. Lett, 109, 053505 (2016), Feb. 8, 2016 result in the strictly monotonically decreasing curve of FIG. 27 for the dependence of the intensity ($I_{fl}$) of the fluorescence radiation (FL) on the magnetic flux density B at the location of the paramagnetic center (NV1) resp. of the paramagnetic centers (NV1) or the group or groups (NVC) of paramagnetic centers (NV1) in terms of magnitude above a minimum flux density ($B_m$), whereas the curve then also being bijective and thus calibratable. Only then will it be possible to produce a robust sensor system cost-effectively in mass production.

FIG. 28

FIG. 28a again shows the resulting course of the intensity ($I_{fl}$) of the fluorescence radiation (FL) of the paramagnetic center (NV1) when the alignment is decalibrated (i.e. a different first and second direction). FIG. 28a corresponds to FIG. 27. Only then is any orientation of the magnetic field possible. As can easily be seen in FIG. 28a, the dependence between the magnetic flux density B and the intensity ($I_{fl}$) of the fluorescence radiation (FL) is greatest in an optimal operating point range. By means of an additional permanent magnet and/or a current-carrying electrical compensation coil (LC), a bias field can be superimposed on the field to be measured, thus maximizing the change in intensity ($I_{fl}$) of the fluorescence radiation (FL).

A non-alignment of the first direction with respect to the second direction can be recognized by the fact that no resonances occur. Of course, it is always possible to align the magnetic field in such a way that these resonances occur. However, if a device is intended and suitable for measuring magnetic fields in which the first and second directions do not coincide, it is also within the scope of the corresponding claims, provided that the other features thereof apply, even if it exhibits said resonances in a certain magnetic field direction.

The avoiding of the resonance cases of FIG. 2a of the paper by A. Wickenbrock et. Al. "Microwave-free magnetometry with nitrogen-vacancy centers in diamond" Appl. Phys. Lett, 109, 053505 (2016), Feb. 8, 2016 thus results in the strictly monotonically decreasing curve of FIG. 28a, which is then also bijective and thus calibratable. Only then it will be possible to produce a measuring system in a mass production.

Differentiation of the curve of FIG. 28a according to the magnetic flux density B gives the curve of FIG. 28b, which shows the sensitivity of the intensity ($I_{fl}$) of the fluorescence radiation (FL) as a function of the magnetic flux density B. The optimum operating point with an optimum magnetic flux density ($B_{opt}$), at which the change in intensity ($I_{fl}$) as a function of the value of the magnetic flux density B becomes maximum, can be clearly seen.

Preferably, the actual operating point of a sensor system in the form of a constant magnetic bias flux $B_0$, which is generated, for example, by a permanent magnet and/or a compensation coil (LC) and is superimposed on an external magnetic flux density B to be measured, is set above a minimum flux density ($B_m$) in order to ensure that the control always responds with the correct sign. The distance between the selected operating point of the magnetic bias flux density ($B_0$) and the minimum flux density ($B_m$) is preferably selected as a function of the respective application in such a way that a jump of the instantaneous system state from the region to the right of the minimum flux density ($B_m$) to a new system state to the left of the minimum flux density ($B_m$) due to a jump of an externally additionally superimposed magnetic flux density B is unlikely.

Figure 28:
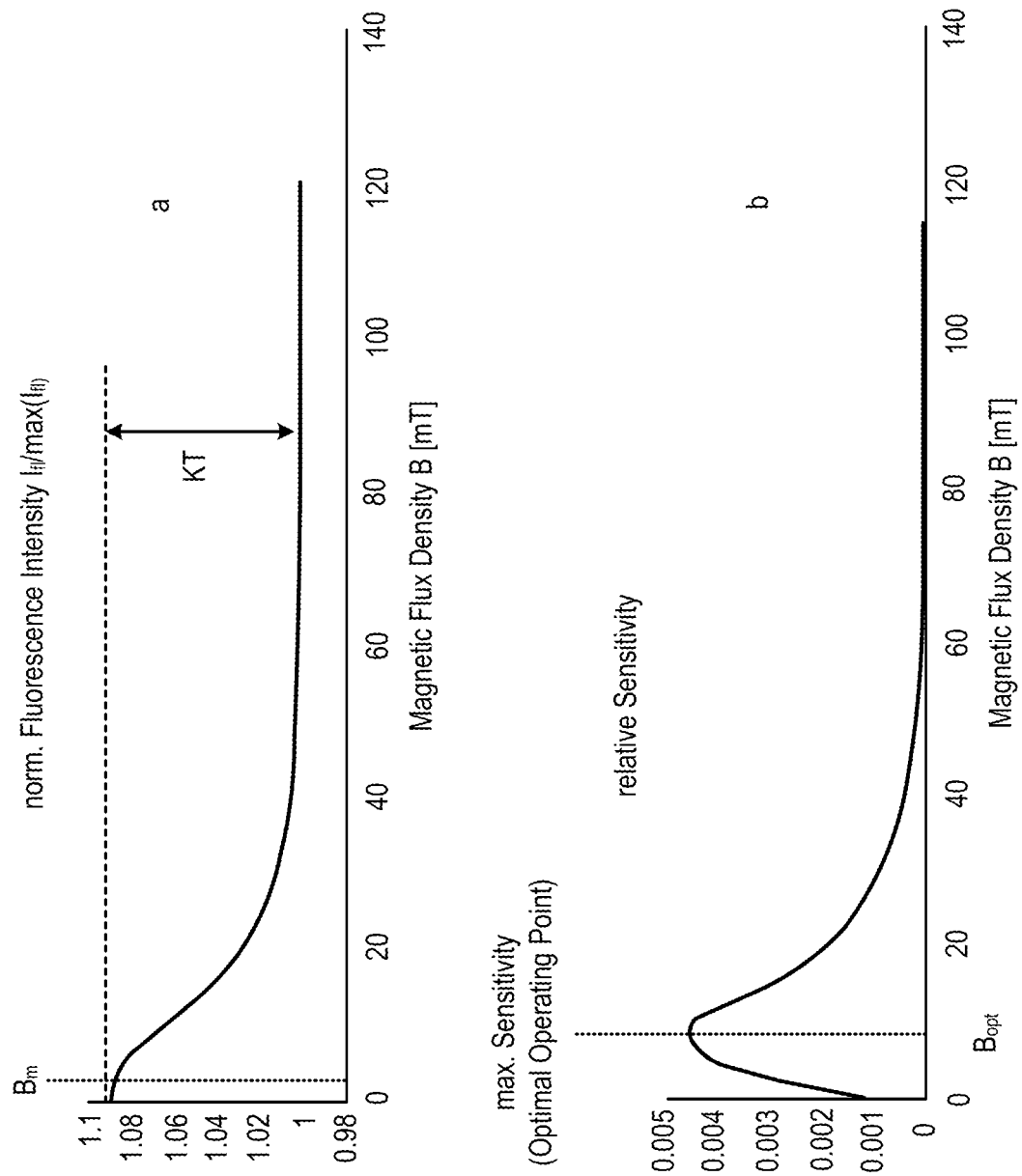
FIG. 28a shows the resulting course of the intensity ($I_{fl}$) of the fluorescence radiation (FL) of the paramagnetic center (NV1) when the alignment is decalibrated.
FIG. 28b shows the derivative of the curve of FIG. 28a with respect to the value of the magnetic flux density B.

As can easily be seen in FIG. 28, the dependence between the magnetic flux density B and the intensity ($I_{fl}$) of the fluorescence radiation (FL) is greatest in the optimum operating point range around an optimum magnetic flux density ($B_{opt}$). By means of an additional permanent magnet and/or a current-carrying electrical compensation coil (LC), a bias field ($B_0$) can be superimposed on the magnetic flux B to be measured, thereby maximizing the sensitivity of the sensor system by optimally adjusting the operating point. Preferably, the value of the magnetic flux density $B_0$ of the magnetic bias field is equal to the value of the optimum magnetic flux density ($B_{opt}$).

FIG. 29

Figure 29:
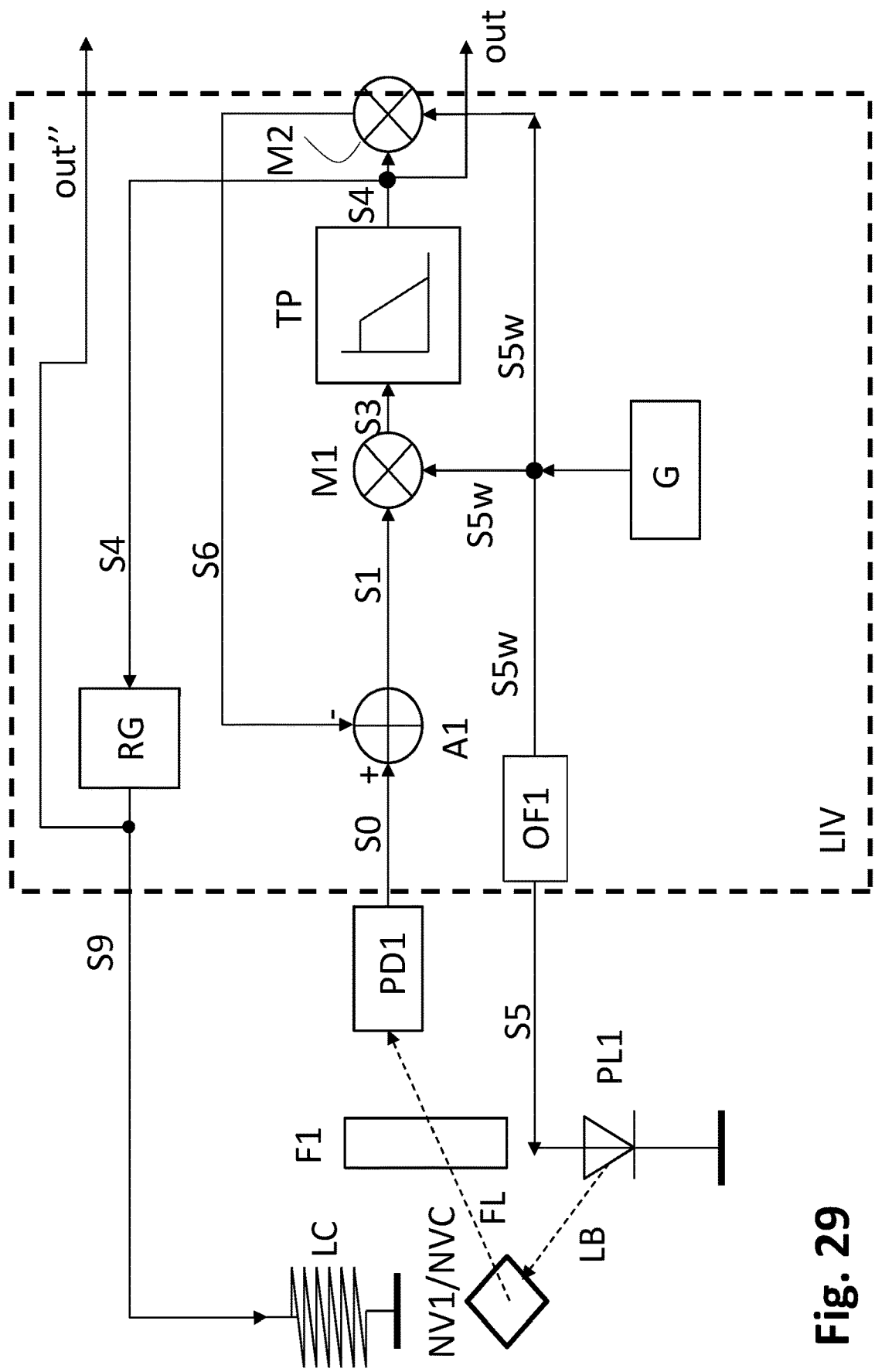
FIG. 29 shows the setting and readjustment of the optimum operating point of a sensor system in the form of a constant magnetic bias flux $B_0$.

FIG. 29 shows the setting of the optimum operating point of a sensor system in the form of a constant magnetic bias flux $B_0$ generated, for example, by a compensation coil (LC) and superimposed on an external magnetic flux density B to be measured. Preferably, the value of the magnetic flux density $B_0$ of the magnetic bias field is equal to the value of the optimal magnetic flux density ($B_{opt}$). A controller (RG) energizes the compensation coil (LC) by means of an operating point control signal (S9). The controller (RG) slowly readjusts the operating point control signal (S9) for energizing a compensation coil (LC), and thus the magnetic flux density B at the location of the paramagnetic center (NV1), based on the filter output signal (S4). Preferably, the set point of the magnetic flux density B is equal to the value of the optimal magnetic flux density ($B_{opt}$) at which the greatest dependence of the intensity ($I_{fl}$) of the fluorescence radiation (FL) on the magnetic flux density B occurs. In doing so, the controller (RG) preferably compares the current value of the filter output signal (S4) as the actual value of the control with a controller-internal or controller-external reference value not shown in FIG. 31, which preferably leads to the setting of the optimum magnetic flux density ($B_{opt}$) or a value of the magnetic flux density B which is close to it. The control by the controller (RG) is preferably performed with a first time constant $\tau_1$, while the compensation control by means of the loop filter (TP) is performed with a second time constant $\tau_2$. That is, a first sensor output signal (out) reflects the short-term changes of an alternating magnetic flux density field while a second sensor output signal (out") reflects the long-term changes or the current quasi-static operating point of the sensor system. For this to be possible, the first time constant $\tau_1$ is preferably greater than the second time constant $\tau_2$. That is, preferably $\tau_1 > \tau_2$. The controller is preferably a PI controller. However, the use of other controllers is possible.

FIG. 29 is essentially the same as FIG. 7 except for the readjustment of the operating point setting by the controller (RG).

The second sensor output signal (out") can now be used to detect a much larger measuring range. The device then corresponds to a fluxgate, for example. We refer here by way of example to U.S. Pat. No. 8,952,680 B2, the technical teachings of which, in combination with the technical teachings presented herein, form a full part of this disclosure, insofar as, in the subsequent nationalization of this application, this is permissible in the legal system of the state concerned in which the nationalization takes place. In the case of using NV centers as paramagnetic centers (NV1), the measurement range without this regulation typically extends from about 10 mT to about 40 mT and possibly a little beyond this range. Compensatory counter-regulation massively increases this measuring range. This is particularly necessary for current sensors with a large current measuring range, especially in flying and floating bodies, vehicles and electric vehicles or in power generation and power distribution systems as well as electrical machines.

FIG. 30

Figure 30:
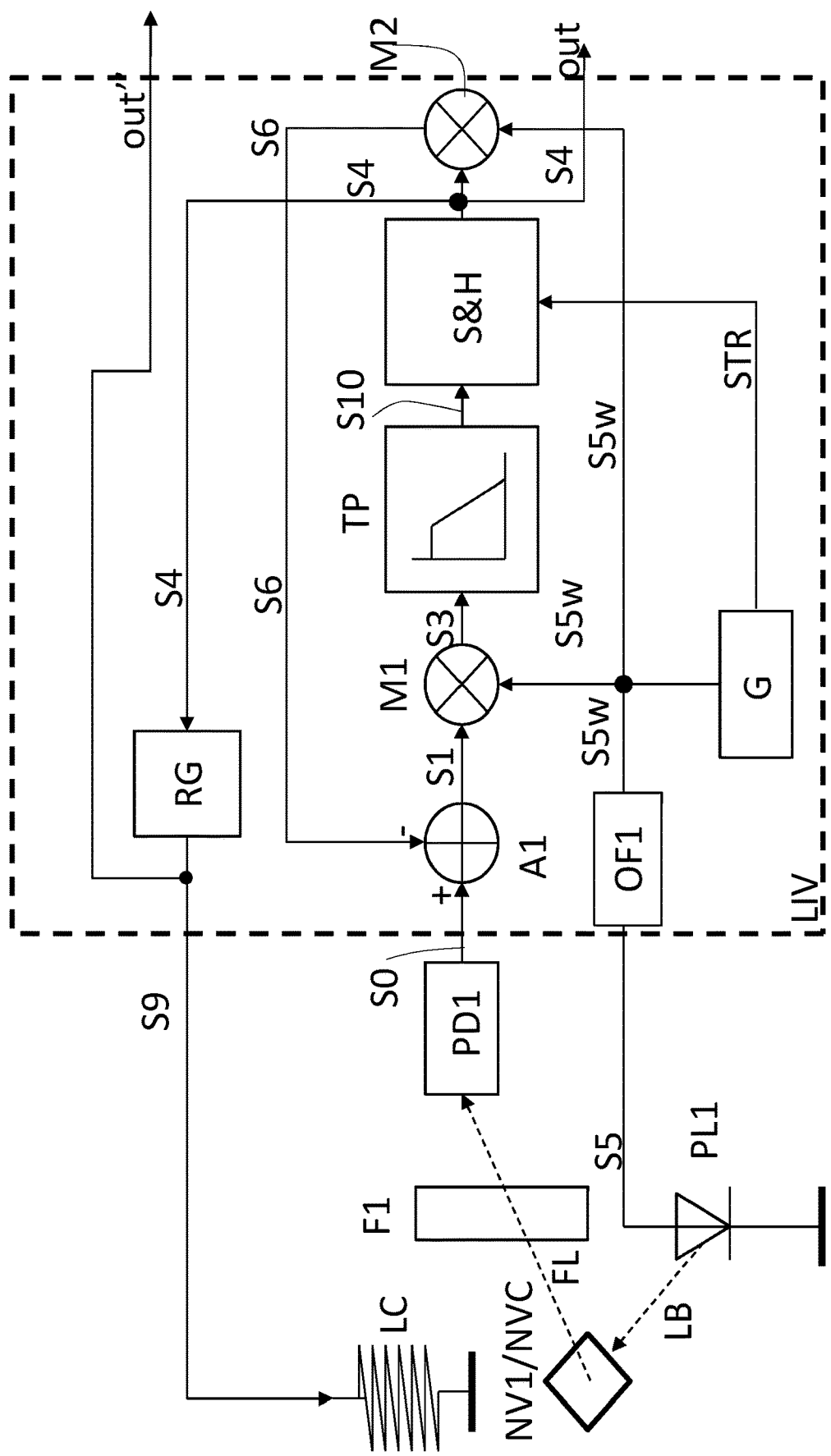
FIG. 30 shows the system of FIG. 29 supplemented by the hold circuit (S&H) and the trigger signal (STR).

Similarly, FIG. 30 shows the system of FIG. 9 supplemented by the holding circuit (S&H) and the trigger signal (STR). Reference is made to the descriptions of FIGS. 5, 8, 10, 14, 15, 18, 21, 22, 25 with regard to the operation of the holding circuit (S&H) and the trigger signal (STR).

FIG. 31

Figure 31:
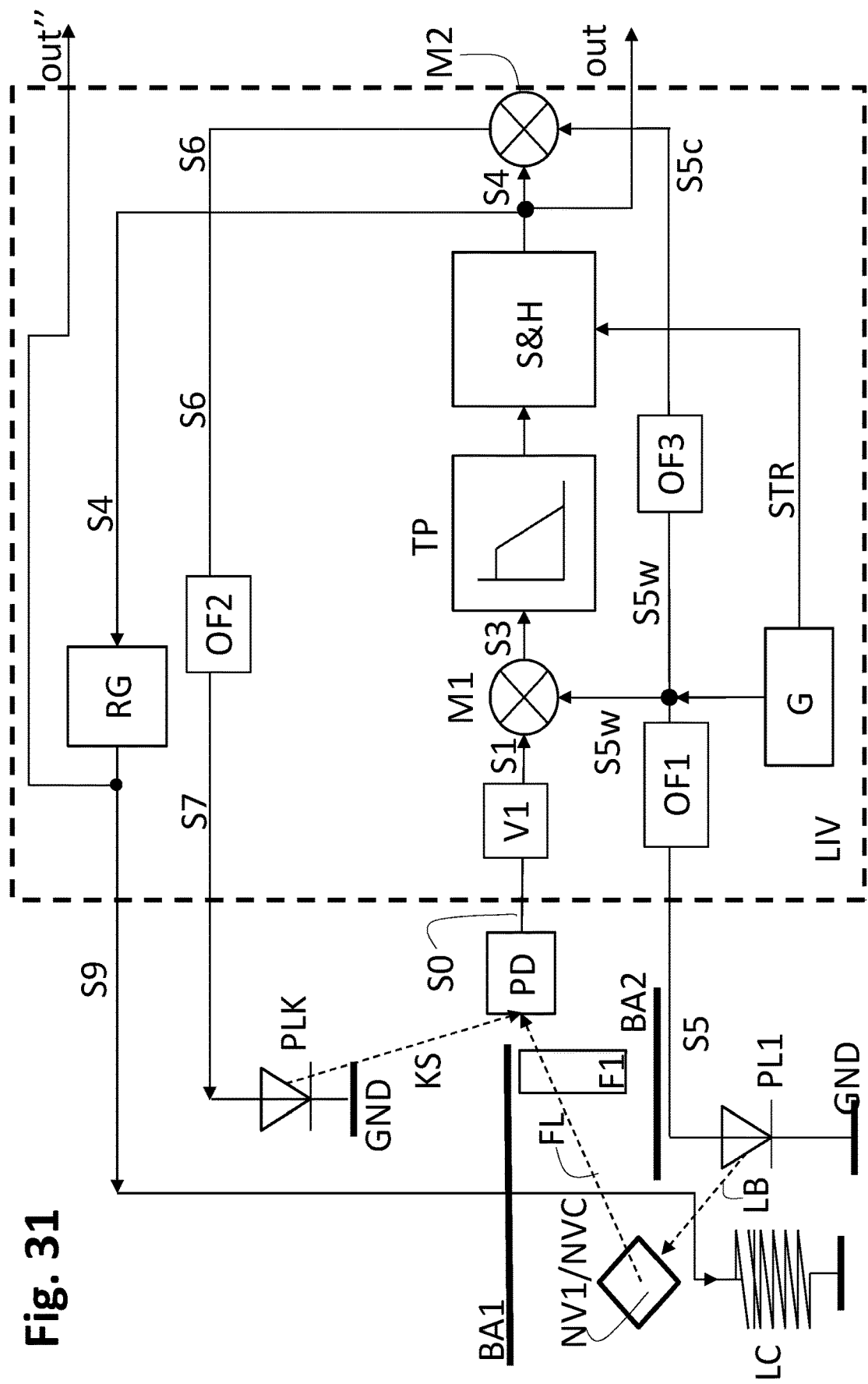
FIG. 31 corresponds largely to FIG. 10 with the difference that the said controller (RG) now readjusts the magnetic operating point of the sensor system in cooperation with a compensation coil (LC).

FIG. 31 largely corresponds to FIG. 10, with the difference that the said controller (RG) now readjusts the magnetic operating point of the sensor system in cooperation with a compensation coil (LC). FIG. 31 shows, like FIG. 29, the adjustment of the optimum magnetic operating point of a sensor system in the form of a constant magnetic bias flux $B_0$, which is generated, for example, by a compensation coil (LC) and superimposed on an external magnetic flux density B to be measured. Said controller (RG) energizes the compensation coil (LC) by means of an operating point control signal (S9). The controller (RG) slowly readjusts the operating point control signal (S9) for energizing a compensation coil (LC), and thus the magnetic flux density B at the location of the paramagnetic center (NV1), based on the filter output signal (S4). In doing so, the controller (RG) preferably compares the actual value of the filter output signal (S4) as the actual value of the control with a controller-internal or controller-external reference value not shown in FIG. 31, which preferably corresponds to the optimum flux density ($B_{opt}$). The closed-loop control by the controller (RG) is preferably again performed with the first time constant $\tau_1$, while the compensation control by means of the loop filter (TP) is performed with the second time constant $\tau_2$. That is, a first sensor output signal (out) reflects the short-term changes of a magnetic flux density alternating field while a second sensor output signal (out") reflects the long-term changes or the current quasi-static operating point of the sensor system. For this to be possible, the first time constant $\tau_1$ is preferably greater than the second time constant $\tau_2$. I.e. the inequality $\tau_1 > \tau_2$ holds. The controller is preferably a PI controller. However, the use of other controllers is possible.

The current through the compensation coil (LC) changes the magnetic flux density B at the location of the paramagnetic centers (NV1) of the sensor element and thus the intensity ($I_{fl}$) of the fluorescence radiation (FL) of the paramagnetic centers (NV1) when irradiated with the pump radiation (LB) with pump radiation wavelength ($\lambda_{pmp}$) of the pump radiation source (PL1). This is used for feedback.

FIG. 31 is essentially the same as FIG. 10 except for the readjustment of the operating point setting.

The second sensor output signal (out") can now be used to detect a much larger measuring range. In case of using NV centers as paramagnetic centers (NV1) without this regulation, the measuring range typically reaches from approx. 10 mT to approx. 40 mT and possibly even a little beyond this range. Compensatory counter-regulation massively increases this measuring range. This is particularly necessary for current sensors with a large current measuring range, especially in flying and floating bodies, vehicles and electric vehicles or in power generation and power distribution systems as well as electrical machines.

FIG. 32

Figure 32:
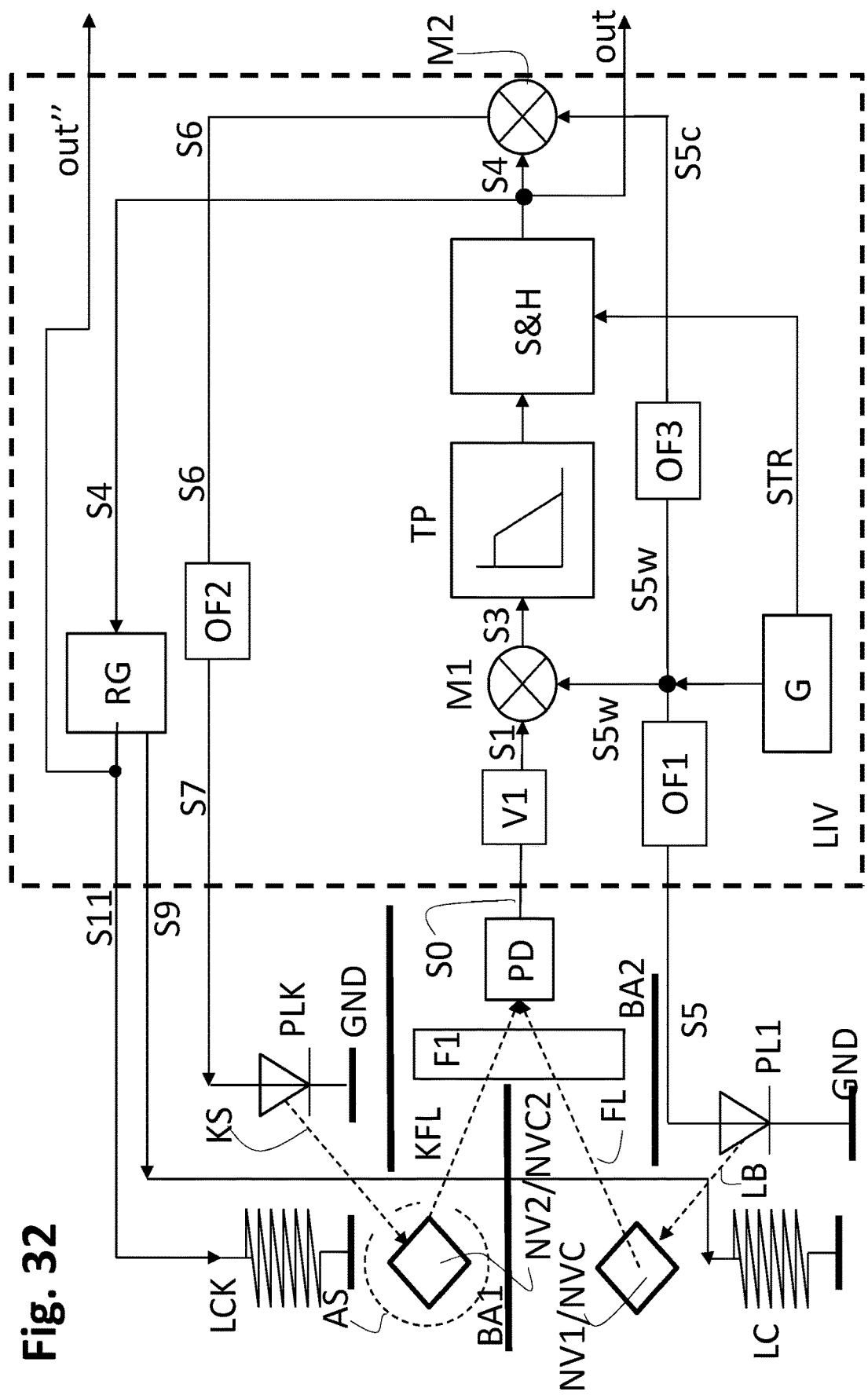
FIG. 32 corresponds to the exemplary combination of FIG. 31 and FIG. 25, whereby the controller (RG) also uses a further compensation coil (LC) for readjusting the magnetic flux density B at the location of the paramagnetic reference center or centers (NV2).

FIG. 32 corresponds to the exemplary combination of FIG. 31 and FIG. 25. In contrast to FIG. 25, the sensor system of FIG. 32 does not only have the controller (RG), which generates an operating point control signal (S9) on the basis of the filter output signal (S4) as an actual value, with which the compensation coil (LC) is energised, with which the bias value $B_0$ for the magnetic operating point of the system is then set.

Figure 72:
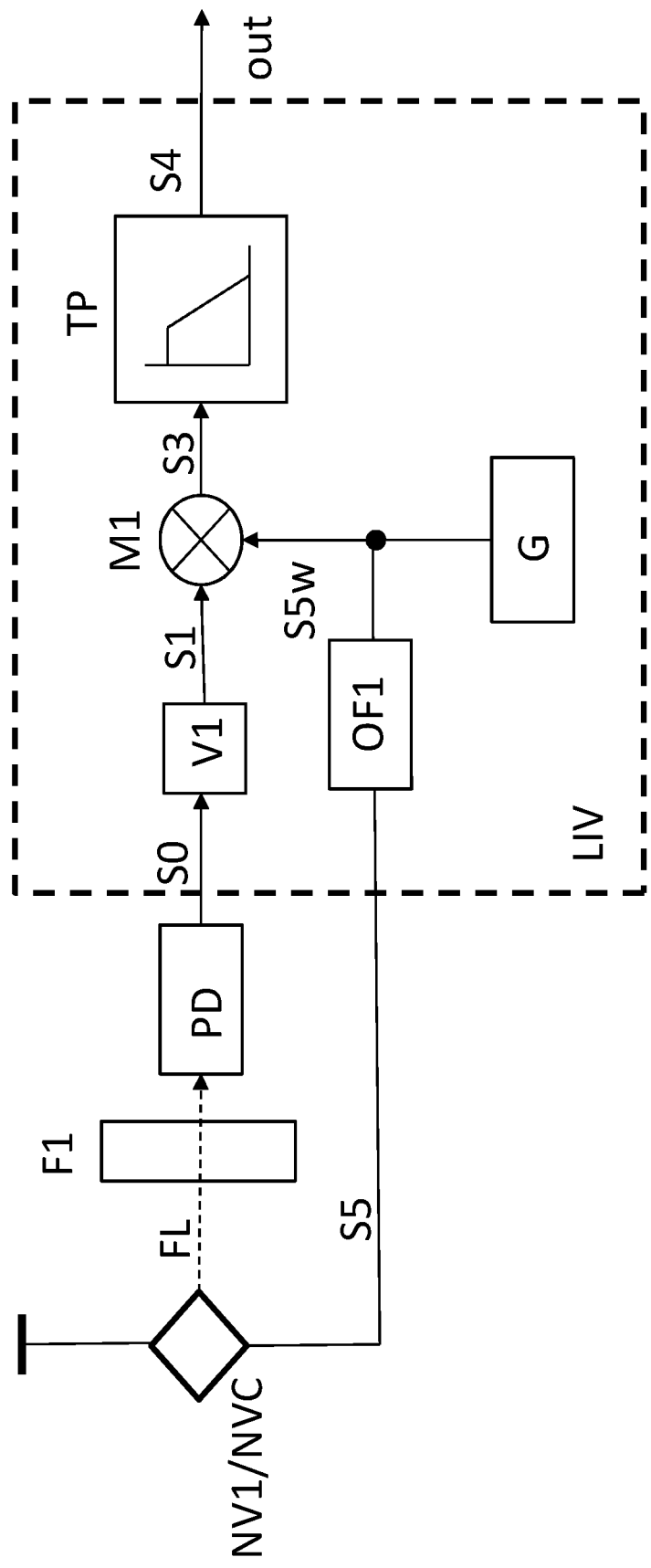
FIG. 72 shows a system of FIG. 1, but now the pump radiation source (PL1) is manufactured in the material of the sensor element.

In addition to the components shown in FIG. 31, the sensor system also has a further operating point control signal (S11) which energises a further compensation coil (LCK). Preferably, the further compensation coil (LCK) is made the same as the compensation coil (LC) and is arranged in the same way opposite the paramagnetic reference centers (NV2) as the compensation coil (LC) is arranged opposite the paramagnetic centers (NV1). Preferably, the further compensation coil (LCK) is energized by the further operating point control signal (S11) in the same manner as the compensation coil (LC) is energized by the operating point control signal (S9). As a result, preferably the paramagnetic reference centers (NV2) are in the same magnetic operating point with the same magnetic bias flux density $B_0$ as the paramagnetic centers (NV1). This extension of the sensor system extends the measuring range of the sensor system of FIG. 15. With the aid of a more complex coil system, as shown in the exemplary FIG. 72 of this paper, the direction of the magnetic flux density can be adjusted in such a way that resonances of paramagnetic centers can be measured. Their location in terms of predeterminable magnetic flux densities B at which they occur is well known. Hereby, a proposed sensor system can calibrate itself, since it can precisely determine the offset value of the permanently applied magnetic field. For example, a rotation of a magnetic field by a few nanorads can be precisely determined by this. For this purpose, the sensor device rotates the magnetic field acting on the paramagnetic center (NV1) or paramagnetic centers (NV1) or on the group or groups (NVC) of paramagnetic centers with the aid of a coil system as shown in FIG. 72, for example by changing the current applied to the pairs of coils of the coil system of FIG. 72, until such a resonance, for example the GSLAC resonance in the case of NV centers as paramagnetic centers, occurs. Provided that the material of a substrate (D) of the sensing element is isotopically pure, this resonance is at a very specific location of the magnetic flux density. As a rule, diamonds, for example, consist mainly of $^{12}C$ isotopes without nuclear spin. However, the $^{13}C$-carbon isotope has a nuclear spin that leads to a splitting of this resonance. By selectively coupling such $^{13}C$-carbon isotopes as nuclear centers with NV centers as paramagnetic centers, gravitational fields and other parameters affecting this coupling can now be measured. Also, of course, physical parameters affecting this splitting such as the magnetic flux density B can be inferred from the distance of the splitting between the peaks.

FIG. 33

Figure 33:
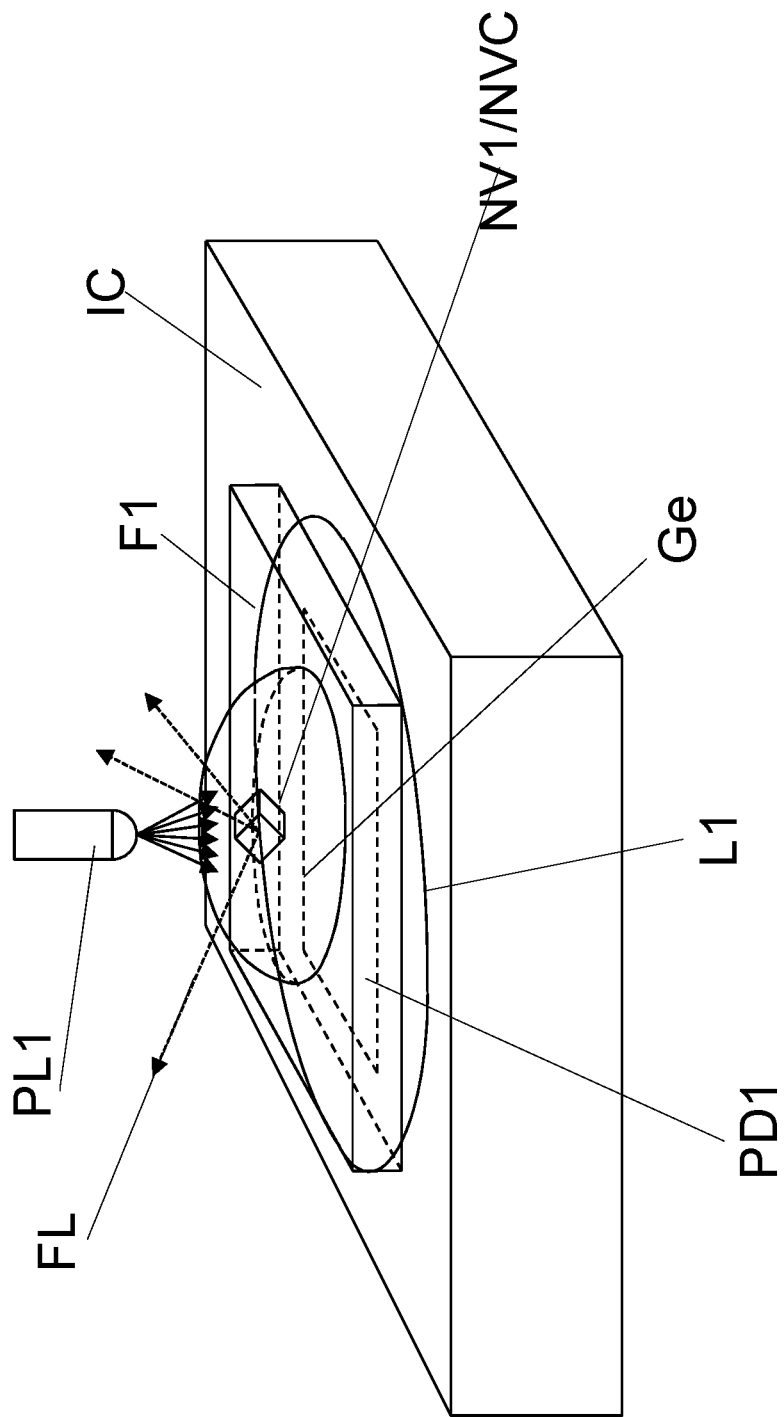
FIG. 33 shows a possible mechanical structure of a proposed compact system.

FIG. 33 shows a possible mechanical arrangement of the main device parts of a proposed system with respect to each other. It comprises an integrated circuit (IC) including, for example, the receiver (PD) and the signal generator (G) and the evaluation circuit (V1, M1, TP). The receiver (PD) may of course be manufactured separately from the integrated circuit (IC). In the following, further components will be described which may also be part of the integrated circuit (IC). In particular, the integrated circuit may comprise the components of the sensor system described above, as far as they can be integrated, or emulate them, for example in the form of a signal processor with a signal processor program. A first filter (F1), which is preferably an optical filter, is arranged above the receiver. In the example shown in FIG. 33, this first filter (F1) is glued, by way of example, to the surface of the integrated microelectronic circuit (IC) by means of an attachment and fixing means (Ge), for example by means of a transparent adhesive. In this case, UHU and gelatine have proved to be suitable as attachment and fixing means (Ge). The bonding by means of the attachment and fixing means (Ge) is thereby preferably transparent for the radiation with the fluorescence radiation wavelength ($\lambda_{fl}$)—e.g. 637 nm in the case of NV centers—of the fluorescence radiation (FL) of the paramagnetic center (NV1) or the paramagnetic centers (NV1) or the group or groups (NVC) of paramagnetic centers (NV1) in the material of a sensor element mounted on the side of the first filter (F1) remote from the radiation receiver (PD) by means of an attachment and fixing means (Ge), for example by means of adhesion.

Again, UHU and gelatine have proved to be suitable as attachment and fixing means (Ge). Preferably, the microelectronic integrated circuit (IC) is a singulated crystal, also called a chip or die. Preferably, the microelectronic integrated circuit (IC) is a CMOS circuit, a bipolar circuit or a BiCMOS circuit. Preferably, the material of the microelectronic circuit (IC) is silicon. If a III/V material is used as the substrate of the microelectronic integrated circuit (IC), a co-integration of a light emitting structure—e.g. an LED or e.g. a laser—as a pump radiation source (PL1) with the microelectronic circuit (IC) and with the radiation receiver (PD) is conceivable. Reference is made at this point to the pending international application PCT/DE 2020/100 430, not yet published at the time of filing of this international application, the technical teaching of which, in combination with the technical teaching presented herein, forms a full part of this disclosure, to the extent that, upon subsequent nationalization of this application, this is permissible in the legal system of the respective state in which the nationalization takes place. Instead of the vertical arrangement, a lateral arrangement is then appropriate. In the case of FIG. 2, we assume for simplicity that the pump radiation source (PL1) is not co-integrated, but is constructed separately. In the example of FIG. 33, the sensor element with the paramagnetic center or centers (NV1) or the group or groups (NVC) of paramagnetic centers (NV1) is mechanically connected to the first filter (F1) by means of an attachment and fixing means (Ge). Preferably, this is solidified gelatin or Uhu adhesive (see also data sheet 63646—UHU ALLESKLEBER Faltschachtel 35 g DE—45015). The pump radiation source (PL1), which is preferably a LED or a laser, irradiates the paramagnetic center (NV1) or the paramagnetic centers (NV1) or the group or groups (NVC) of paramagnetic centers (NV1) in the material of the sensor element with pump radiation (LB). This pump radiation (LB) excites the paramagnetic center (NV1) or the paramagnetic centers (NV1) or the group or groups (NVC) of paramagnetic centers (NV1) in the material of the sensor element to emit a fluorescence radiation (FL). The attachment material (Ge) is preferably substantially transparent to radiation at the pump radiation wavelength ($\lambda_{pmp}$) of the pump radiation (LB) of the pump radiation source (PL1), i.e. the LED or the laser, and substantially transparent to radiation at the fluorescence radiation wavelength ($\lambda_{fl}$) of the fluorescence radiation (FL) of the paramagnetic centers (NV1)—e.g. 637 nm for NV centers—. The first filter (F1) is preferably substantially transparent to radiation at the fluorescence radiation wavelength ($\lambda_{fl}$) of the fluorescence radiation (FL) of the paramagnetic centers (NV1) in the material of the sensor element. The first filter (F1) is preferably substantially non-transparent to radiation having the pump radiation wavelength ($\lambda_{pmp}$) of the pump radiation (LB) of the pump radiation source (PL1), i.e. the LED or the laser. Substantially means here that certain small deviations from the relevant statement are allowed, which do not affect the function of the sensor system in such a way that a function according to the specification is violated, i.e. does not work. Ultimately, the radiation receiver (PD) together with the first filter (F1) forms a radiation receiver that is substantially only sensitive to radiation having the fluorescence radiation wavelength ($\lambda_{fl}$) of the fluorescence radiation (FL) of the paramagnetic center (NV1) or centers (NV1) or of the group or groups (NVC) of paramagnetic centers (NV1) in the material of the sensing element and is substantially not sensitive to the radiation having the pump radiation wavelength ($\lambda_{pmp}$) of the pump radiation (LB) of the pump radiation source (PL1). The integrated circuit (IC) now preferably generates, by means of the transmission signal (S5) generated and modulated by it, a modulation of the pump radiation (LB) of the pump radiation source (PL1) corresponding to the modulation of the alternating component (S5w) of the transmission signal (S5). This pump radiation (LB) modulated with the transmission signal (S5) impinges on the paramagnetic center or centers (NV1) or on the group or groups (NVC) of paramagnetic centers (NV1) in the material of the sensor element. Depending on the magnetic flux B at the location of the paramagnetic centers (NV1) in the material of the sensor element and/or possibly depending on other physical parameters, the fluorescence radiation (FL) of the paramagnetic center (NV1) or the paramagnetic centers (NV1) or the of the group or groups (NVC) of paramagnetic centers (NV1), these then emit a modulated fluorescence radiation (FL) whose modulation depends on the modulation of the incoming pump radiation (LB) and thus on the modulation of the transmission signal (S5).

This modulation of the intensity ($I_{pmp}$) of the pump radiation (LB) thus results in a correlated modulation of the intensity ($I_{fl}$) of the fluorescent radiation (FL). Therefore, the receiver output signal (S0) of the radiation receiver (PD) of the integrated circuit (IC) which is hit by the modulated fluorescence radiation (FL) is also modulated. Since the intensity ($I_{fl}$) of the fluorescent radiation (FL) depends on the value of the magnetic flux B at the location of the paramagnetic center(s) (NV1) or group(s) (NVC) of paramagnetic centers (NV1) in the material of the sensing element and/or on the values of other physical quantities such as, for example, pressure and temperature, the modulation of the receiver output signal (S0) also depends on the magnetic flux B at the location of the paramagnetic center(s) (NV1) or group(s) (NVC) of paramagnetic centers (NV1) or group(s) (NVC) of paramagnetic centers (NV1) in the material of the sensor element and/or the said other physical quantities, for example the magnetic flux B.

Figure 34:
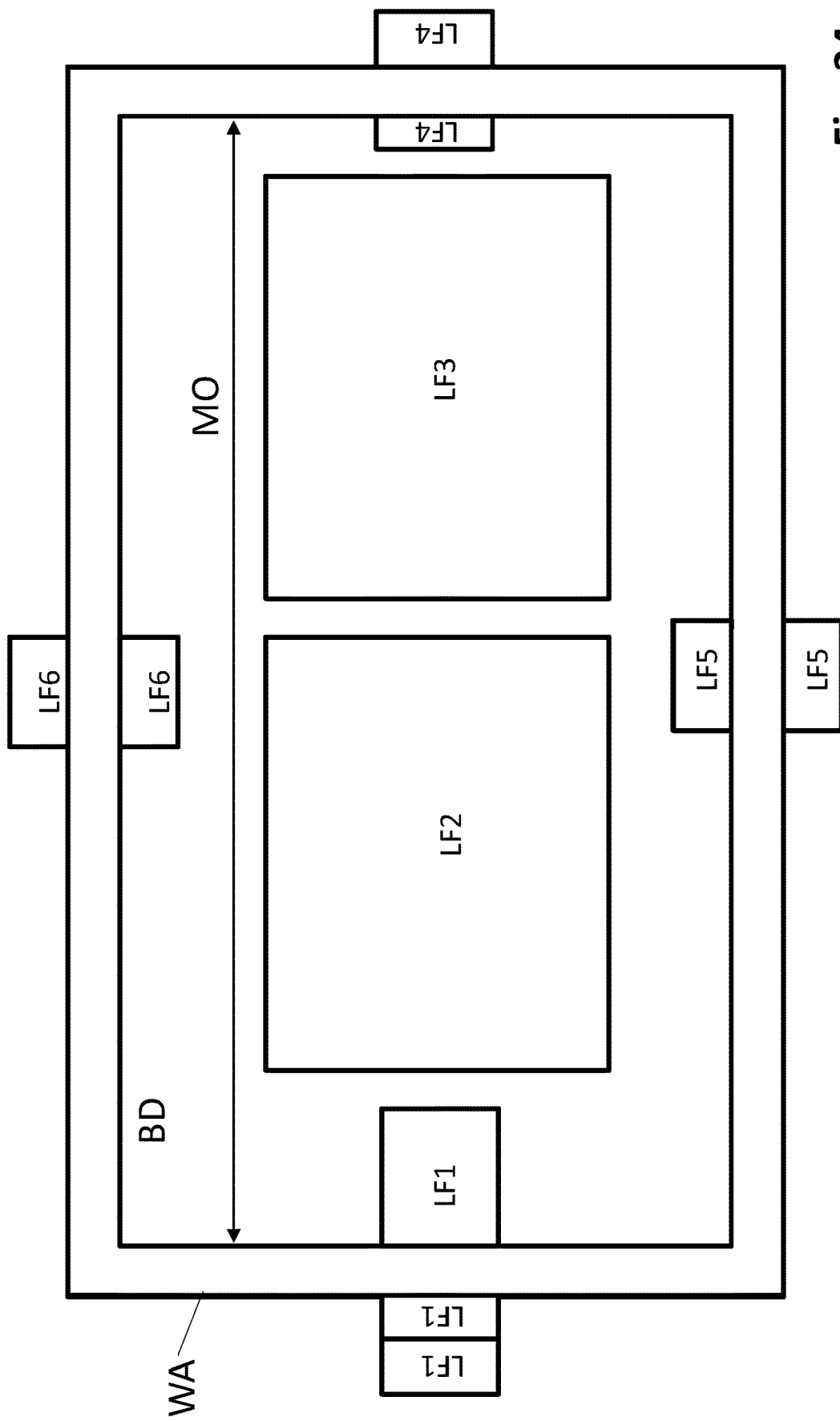
FIG. 34 shows a top view of a suitable, so-called open-cavity housing.

The integrated circuit (IC) can now evaluate this modulation of the receiver output signal (S0) and, depending on the result of this evaluation, actuate actuators or change their activity. For example, the integrated circuit (IC) may comprise a first coil (L1) for use as a compensation coil (LC) and may energize this first coil (L1) differently depending on the result of this evaluation. Reference is made here to FIGS. 29 to 32 and their associated description. With suitable positioning of the sensor element with the paramagnetic center (NV1) or the paramagnetic centers (NV1) or the group or groups (NVC) of paramagnetic centers (NV1) relative to the first coil (L1), the integrated circuit (IC1) can thus detect a change in the magnetic flux density B at the location of the paramagnetic center (NV1) or the paramagnetic centers (NV1) or of the group or groups (NVC) of paramagnetic centers (NV1), for example, by means of a regulator (RG) as part of the integrated circuit (IC). Thus, the integrated circuit (IC) can detect a change in the magnetic flux density B at the location of the paramagnetic center (NV1) or centers (NV1) or the group or groups (NVC) of paramagnetic centers (NV1) as a modulation change of the receiver output signal (S0) and compensate for it via a controller (RG) within the integrated circuit (IC) by changing the current flow to the first coil (L1) in its function as a compensation coil (LC). Preferably, said first coil (L1) is also part of the integrated circuit (IC). It can then be manufactured, for example, as a single-layer or multilayer coil and/or as a flat coil. However, said first coil (L1) may also be manufactured separately. FIG. 34

FIG. 34 shows a top view of a so-called open-cavity housing. The housing comprises a housing bottom (BO). This housing base (BO) is surrounded by a circumferential wall (WA), so that the housing base (BO) together with this wall (WA) forms an upwardly open cavity (CAV) with an upwardly open assembly opening (MO). Components can subsequently be mounted in the cavity (CAV). FIG. 34 is very roughly simplified so that the essential idea of the proposal disclosed herein becomes transparent. In the example of FIG. 34, four exemplary contacts (LF1, LF5, LF6, LF4) are provided. The number of contacts and their shape may vary. Preferably, the final external shape of the assembled and sealed package (FIG. 46), after the cover (DE) has been fitted, corresponds to a standard package, such as a QFN package, when viewed from the outside, so that fully automated assembly machines can be used to assemble the final sealed package onto printed circuit boards. The use of an open cavity package to fabricate a quantum optical device is novel. Preferably, the housing bottom (BO) and the wall (WA) of the open-cavity housing and likewise the lid (DE), which is later attached, are made of thermoset plastic, so that the housing with the components contained therein can be used, for example, in a conventional soldering process for semiconductor components and can be attached to a printed circuit board (PCB). Mounting surfaces (LF2, LF3) are preferably incorporated in the housing base (BO). These are preferably made of metal on the surface. This metal is preferably coated to ensure better adhesion of the bond wires. In the following, these mounting surfaces are referred to as lead frame surfaces.

In the example of FIG. 34, a third lead frame surface (LF3) and a second lead frame surface (LF2) are incorporated into the bottom of the housing (BO). However, their surfaces are preferably exposed within the cavity (CAV) of the open cavity housing. In the example of FIG. 34, the contacts of the housing are worked as such leadframe surfaces (LF1, LF5, LF4, LF6) that penetrate the circumferential wall (WA) to allow electrical contact through the wall (WA). In the example of FIG. 34, a first lead frame surface (LF1) pierces the perimeter wall (WA). In the example of FIG. 34, a fourth lead frame face (LF4) pierces the perimeter wall (WA). In the example of FIG. 34, a fifth lead frame face (LF5) pierces the perimeter wall (WA). In the example of FIG. 34, a sixth lead frame face (LF6) pierces the perimeter wall (WA).

Particularly preferably, the proposed housing has at least three connections, preferably exactly three connections: A positive supply voltage line (Vdd), a reference potential line (GND), hereinafter referred to as ground, and an input-output line as sensor output signal (out). Restriction to these three connections is particularly cost-effective. The integrated circuit (IC) is supplied with electrical energy through the supply voltage line (Vdd) and the reference potential line (GND). The sensor output signal (out) can be digital and/or analog. In the example of the sensor systems of the preceding figures, the output (out) is typically analog. However, analogously, the sensor systems of the preceding figures can also be implemented digitally by inserting analog-to-digital converters and digital-to-analog converters. Preferably, a sensor system also comprises a computer unit, for example a signal processor, which controls the sensor system and establishes communication with the outside world. Such a computer unit preferably also comprises a data interface as sensor output signal (out). Preferably, the input/output of the housing is then a bidirectional single-wire data bus of the data bus interface of the computer system of the sensor system. Particularly suitable are known automotive data buses such as the CAN bus, LIN data bus, DSI3 data bus or PSIS data bus. Other data buses in the sense of this writing can be, for example, an Ethernet data bus, an SPI data bus, sensor data buses in accordance with IEEE P1451, field buses, for example, in accordance with IEC 61158 or IEC 61784, or the KNX data bus for smart home applications, or PWM signaling or other pulse-modulated signaling, or radio interfaces such as, for example, ZigBee, Bluetooth, WLAN, mobile radio interfaces such as GSM, UMTS, etc., to name a few examples. For example, in the case of the LIN data bus and/or the DSI3 data bus, a fourth port may be provided as a continuation of the data bus. Preferably, then, the computer system of the sensor system comprises a first data bus interface connected to a first port of the housing (e.g., LF5) and a second data bus interface connected to a second port of the housing (e.g., LF6) arranged opposite the first port (e.g., LF5). The supply voltage is then preferably connected to a third terminal of the housing (e.g. LF1). The reference potential (GND) is then preferably connected to a fourth terminal of the housing (e.g. LF4). In the case, it is possible to determine the position of the housing with the sensor system in the data bus by means of an auto-addressing method from the prior art and thus to determine a software address which allows each installed sensor system to be addressed with an individual sensor address which can be predetermined by the physical position. As writings for such auto-addressing methods and data bus architectures his here exemplarily the following writings mentioned: EP 1 490 772 B1, DE 10 2017 122 365 B3, the technical teachings of which, in combination with the technical teachings presented herein, form a full part of this disclosure, to the extent that, upon subsequent nationalization of this application, this is permissible in the legal system of the relevant state in which the nationalization takes place.

This is especially desirable for biometric and/or medical applications with a large number of sensors, as it reduces costs.

FIG. 35

Figure 35:
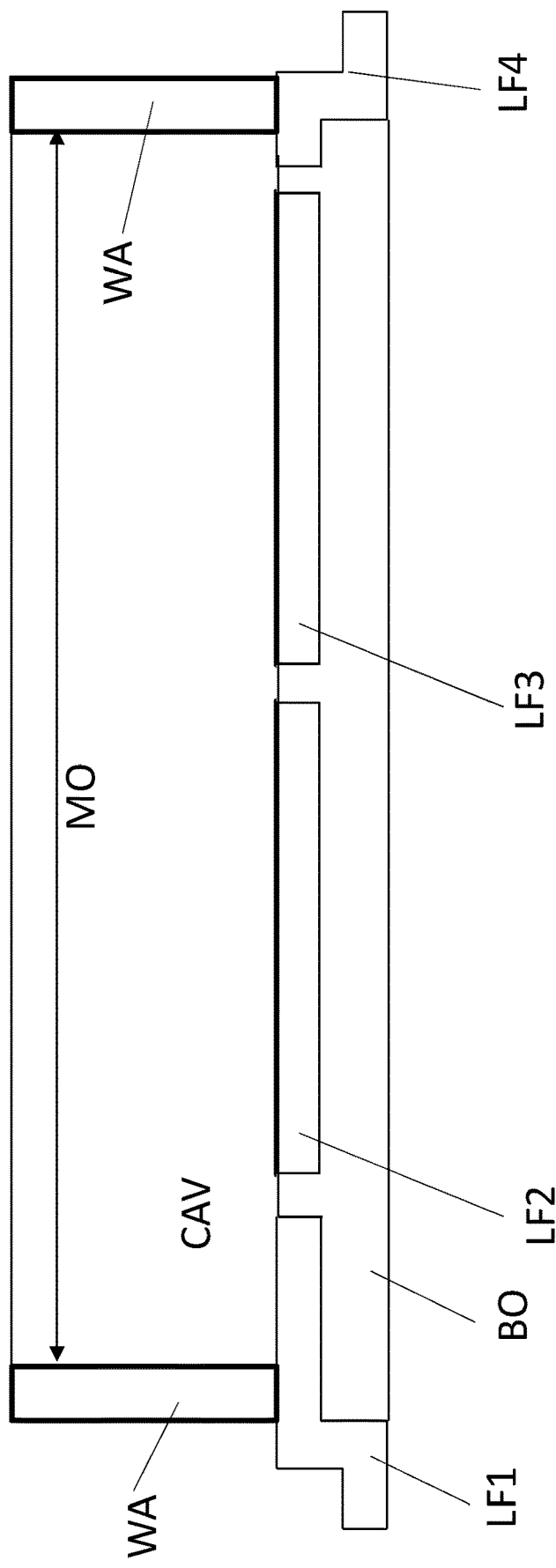
FIG. 35 shows the exemplary housing of FIG. 34 in cross-section.

FIG. 35 shows the exemplary housing of FIG. 34 in cross-section. The cavity (CAV) and the mounting hole (MO) are marked.

FIGS. 36 to 46

FIGS. 36 to 46 describe an exemplary assembly process for a proposed sensor system in a proposed housing. The description is highly simplified in order to keep the drawings clear and to present the basic principle in a reworkable manner. Therefore, the drawings do not disclose the full operating principle of the sensor system as the preceding figures do, but only the methodology of assembling such a sensor system in a suitable housing and this housing. The construction of an actual sensor system can thus only be seen from a joint consideration of FIGS. 36 to 46 with the description and the preceding and possibly subsequent figures together with the description.

FIG. 36

Figure 36:
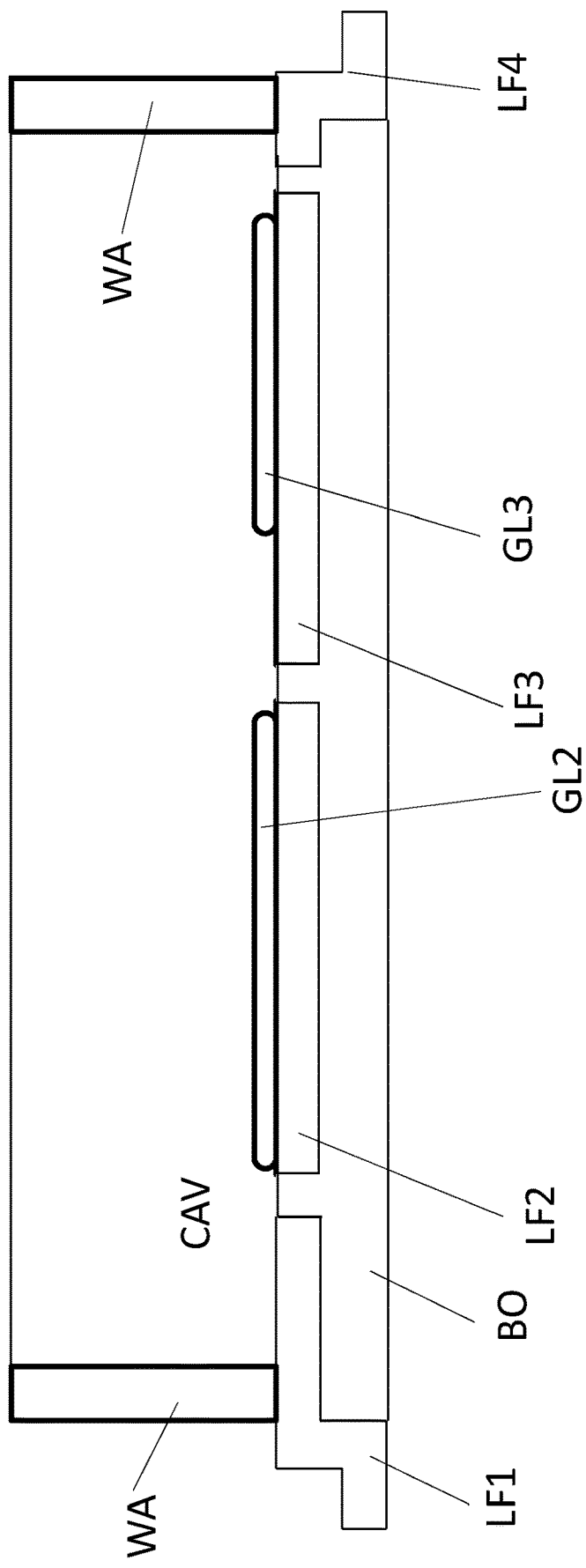
FIGS. 36 to 46 describe an exemplary assembly process for a proposed sensor system in a proposed housing.

In FIG. 36, for example, a third adhesive (GL3) is first applied to the third lead frame area (LF3) using a dispenser. A second adhesive (GL2) is applied to the second lead frame area (LF2) using a dispenser.

FIG. 37

Figure 37:
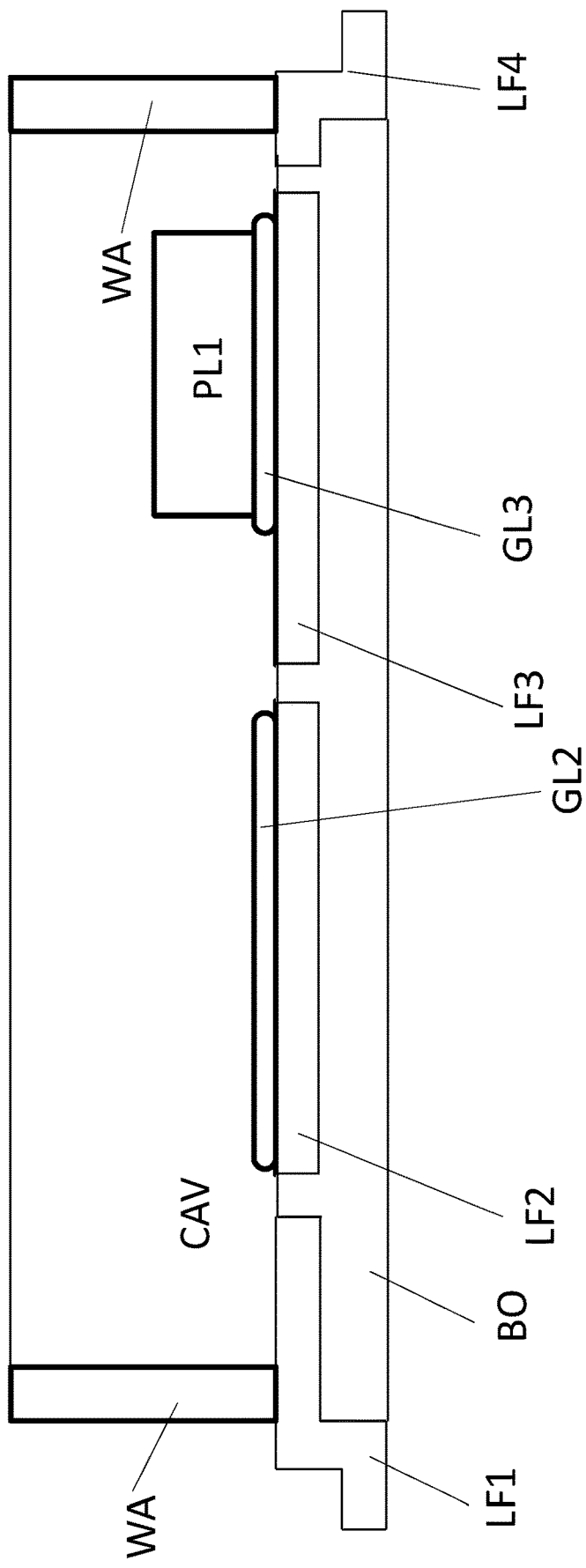

In FIG. 37, the pump radiation source (PL1), for example a green LED (PL1), is placed in the third adhesive (GL3) on the third lead frame surface (LF3) and thus attached to the third lead frame surface (LF3). An LED of the type VLDTG1232R (opening angle +/−9°; 525 nm wavelength)

and a laser diode of the company Osram of the type PLT5 520B were already successfully used as pump radiation source (PL1).

Preferably, the third adhesive (GL3) is electrically conductive. In this case, an electrical and thermal connection is created between the pump radiation source (PL1) and the third lead frame surface (LF3).

FIG. 38

Figure 38:
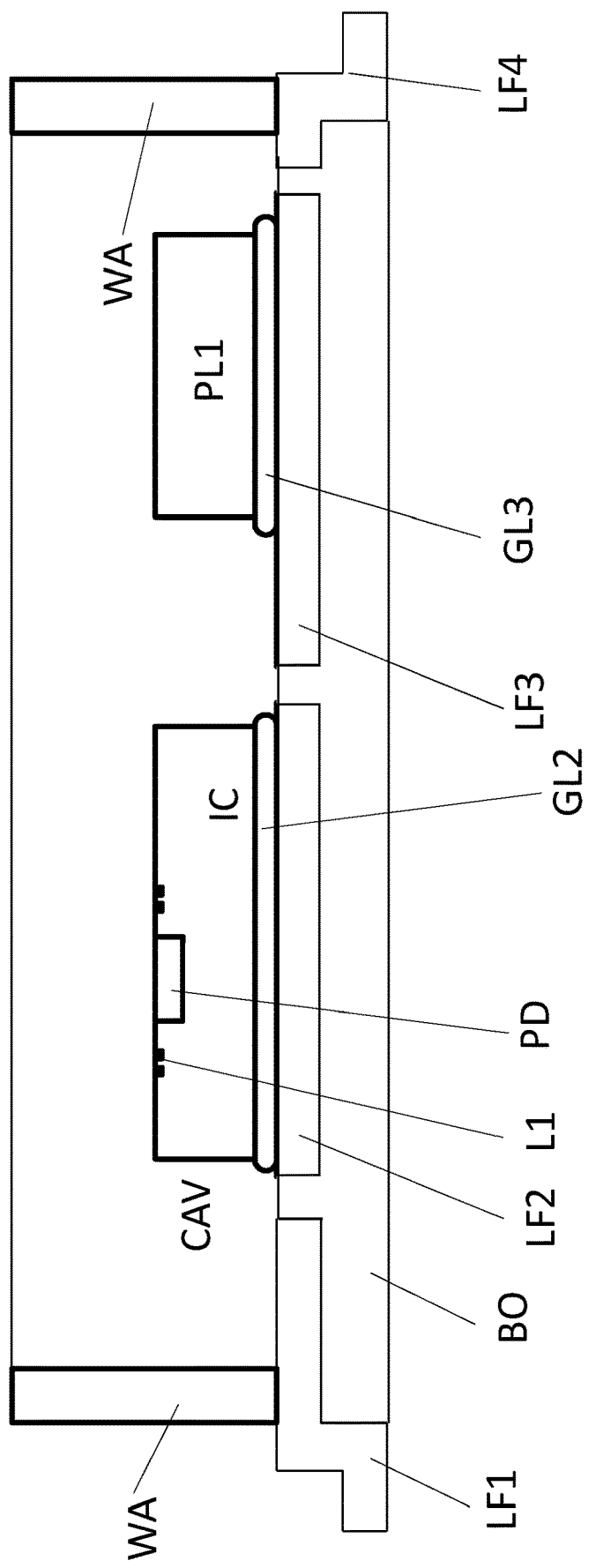

In FIG. 38, an integrated circuit (IC) is placed in the second adhesive (GL2) to attach it to the second lead frame surface (LF2). Preferably, the second adhesive (GL2) is electrically conductive. In that case, an electrical connection is formed between the backside of the integrated circuit (IC) and the wide lead frame area (LF2). In the example, the integrated circuit (IC) comprises the radiation receiver (PD) and the first coil (L1) as a compensation coil (LC) surrounding the radiation receiver (PD) in the example of FIG. 38. Reference is made at this point to the pending international application PCT/DE 2020/100 430, not yet published at the time of filing of this international application, the technical teaching of which, in combination with the technical teaching presented herein, forms an integral part of this disclosure, to the extent that, upon subsequent nationalization of this application, this is permissible in the legal system of the respective state in which the nationalization takes place.

FIG. 39

Figure 39:
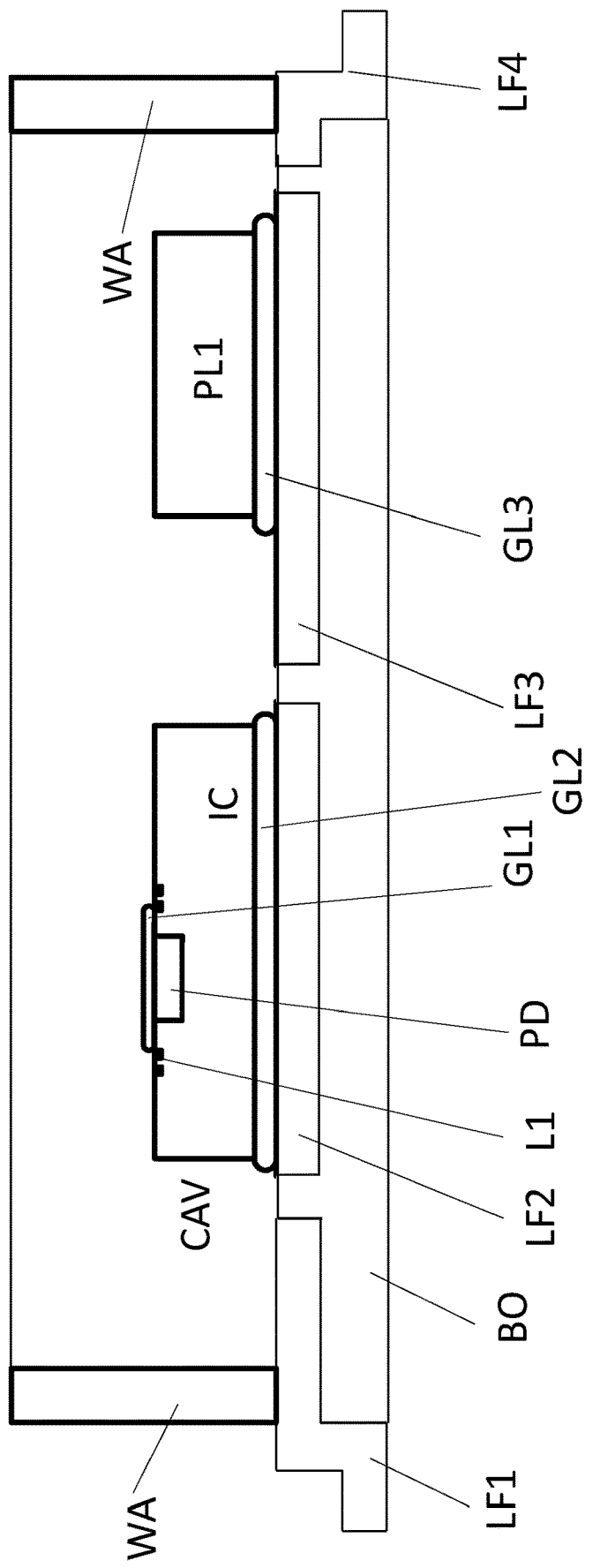

This step is necessary if the first filter (F1) is not already part of the integrated circuit (IC) and is implemented, for example, as a metal-optical filter in the metallization stack of the integrated circuit (IC) and if the need for the first filter (F1) is not rendered obsolete by other measures, such as a measurement of the afterglow of the fluorescence radiation (FL) at times when the pump radiation (LB) is switched off and/or has decayed. In FIG. 39, a first adhesive (GL1) is applied to the surface of the integrated circuit (IC) in the region of the radiation receiver (PD). The first adhesive (GL1) is preferably substantially transparent to fluorescent radiation (FL) from the paramagnetic centers (NV1) in the material of the sensing element. Instead of a first adhesive (GL1), other functionally equivalent attachment methods can of course be used for the first filter (F1) described below in FIG. 40.

FIG. 40

This step is necessary if the first filter (F1) is not already part of the integrated circuit (IC) and is implemented, for example, as a metal-optical filter in the metallization stack of the integrated circuit (IC) and if the need for the first filter (F1) is not rendered obsolete by other measures, such as a measurement of the afterglow of the fluorescence radiation (FL) at times when the pump radiation (LB) is switched off and/or has decayed. The first filter (F1) is thus provided for an optical quantum technological device, namely said sensor system, wherein the quantum technological device comprises one or more paramagnetic centers (NV1) and/or one or more groups (NVC) of paramagnetic centers (NV1), and wherein electromagnetic radiation occurs or is used in the sensor system, and wherein the first filter (F1) is intended for to allow predetermined portions of said radiation to pass and not to allow other portions of said electromagnetic radiation to pass, and wherein said filter is constructed of metallization pieces of the metallization stack of an integrated microelectronic circuit. Here, exemplary reference is made to the writings U.S. Pat. No. 9,958,320 B2, US 2006 0 044 429 A1, US 2010 0 176 280 A1, WO 2009 106 316 A2, US 2008 0 170 143 A1 and EP 2 521 179 B1 is made in this context as examples of microintegrated wave-optical filters and functional elements. The technical teachings of these writings in combination with the technical teachings of this international application form a full part of this disclosure to the extent that, upon subsequent nationalization of this application, the respective national law of the state in which the nationalization occurs so permits. Reference is made to the books B. Kress, P. Meyrueis, "Digital Diffractive Optics" J. Wiley & Sons, London, 2000 and B. Kress, P. Meyrueis, "Applied Digital Diffractive Optics", J. Wiley & Sons, London, 2009 is referred to. The basic principle of a metal optical filter in a microintegrated optical system is the fabrication of more or less regular structures of different dielectric constant and/or conductivity in the order of magnitude of the respective wavelength or smaller, so that the intended effects result from constructive and destructive interference.

Figure 40:
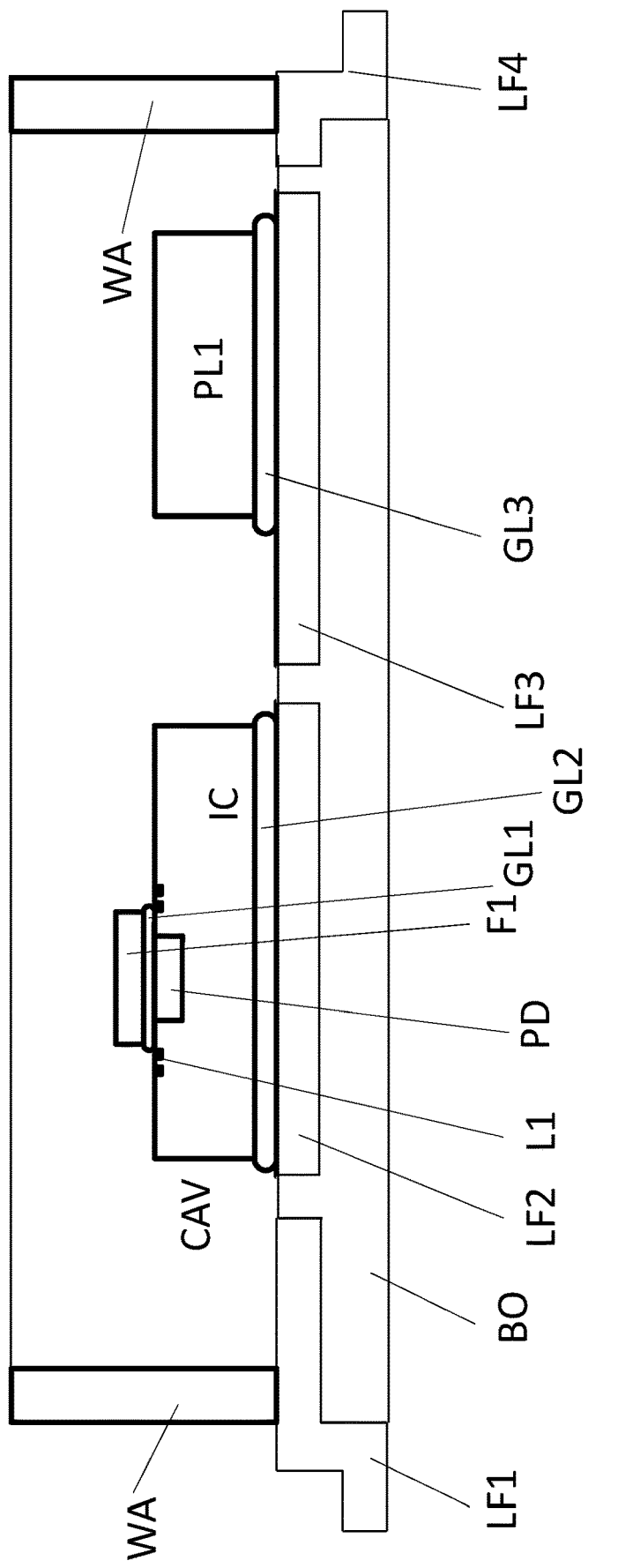

In FIG. 40, the first filter (F1) is placed in the first adhesive (GL1). The first filter (F1) is preferably substantially transparent to the fluorescence radiation (FL) of the paramagnetic centers (NV1) in the material of the sensor element. The first filter (F1) is preferably substantially non-transparent to radiation at the pump radiation wavelength ($\lambda_{pmp}$) of the pump radiation (LB) of the pump radiation source (PL1). The first filter (F1) and the first adhesive (GL1) may be omitted if the radiation receiver (PD) is designed a priori to be substantially sensitive to the fluorescence radiation (FL) of the paramagnetic centers (NV1) in the material of the sensor element and not sensitive to the pump radiation (LB) of the pump radiation source (PL1). In this respect, the common functionality of radiation receiver (PD), first adhesive (GL1) and first filter (F1) can also be considered as a radiation receiver (PD) substantially sensitive to the fluorescence radiation (FL) of the paramagnetic centers (NV1) in the material of the sensor element and not sensitive to the pump radiation (LB) of the pump radiation source (PL1).

FIG. 41

Figure 41:
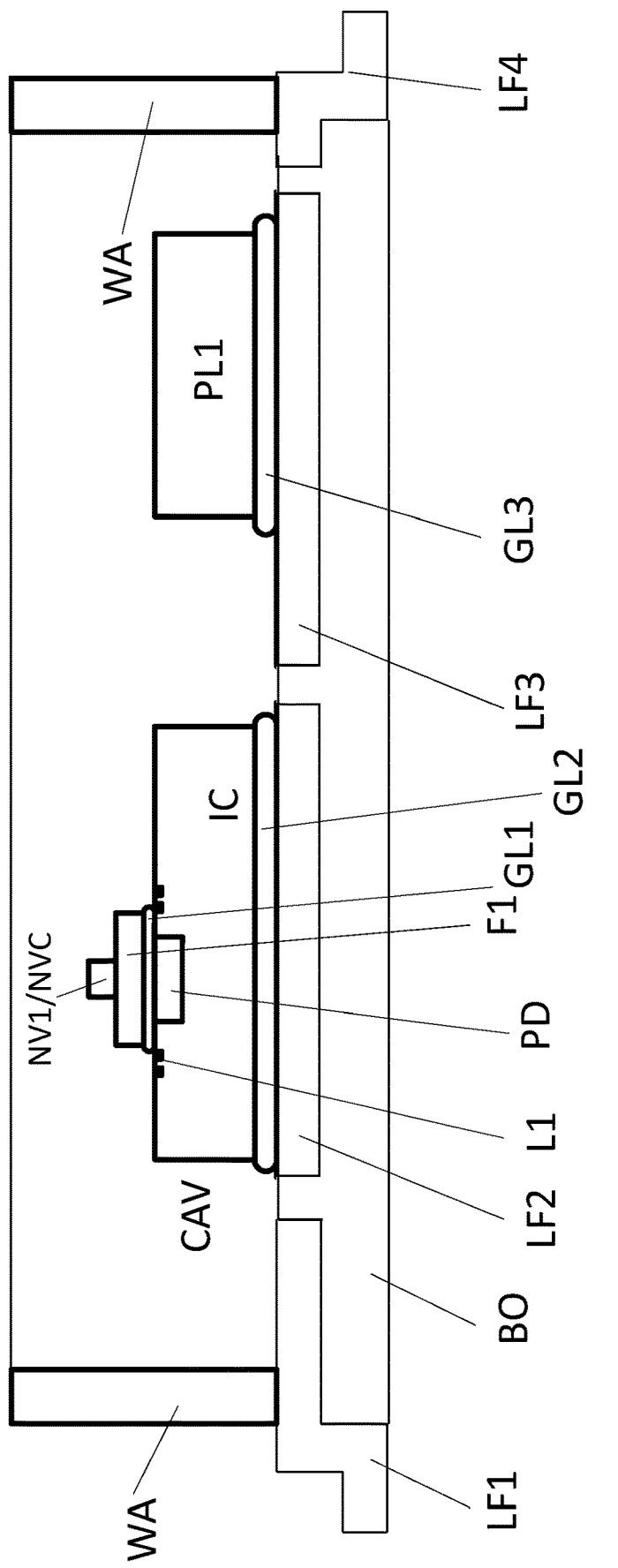

In FIG. 41, the sensor element with the paramagnetic center or centers (NV1) is placed on the first filter (F1). This step can also be carried out together with the following step of FIG. 42. The sensor element comprises the paramagnetic centers (NV1) in the material of the sensor element. Preferably, the sensor element comprises one or more crystals having paramagnetic centers (NV1). Preferably, the one or more crystals are diamond crystals having one or more NV centers. Preferably, the one or more diamonds have a high density of NV centers.

FIG. 42

Figure 42:
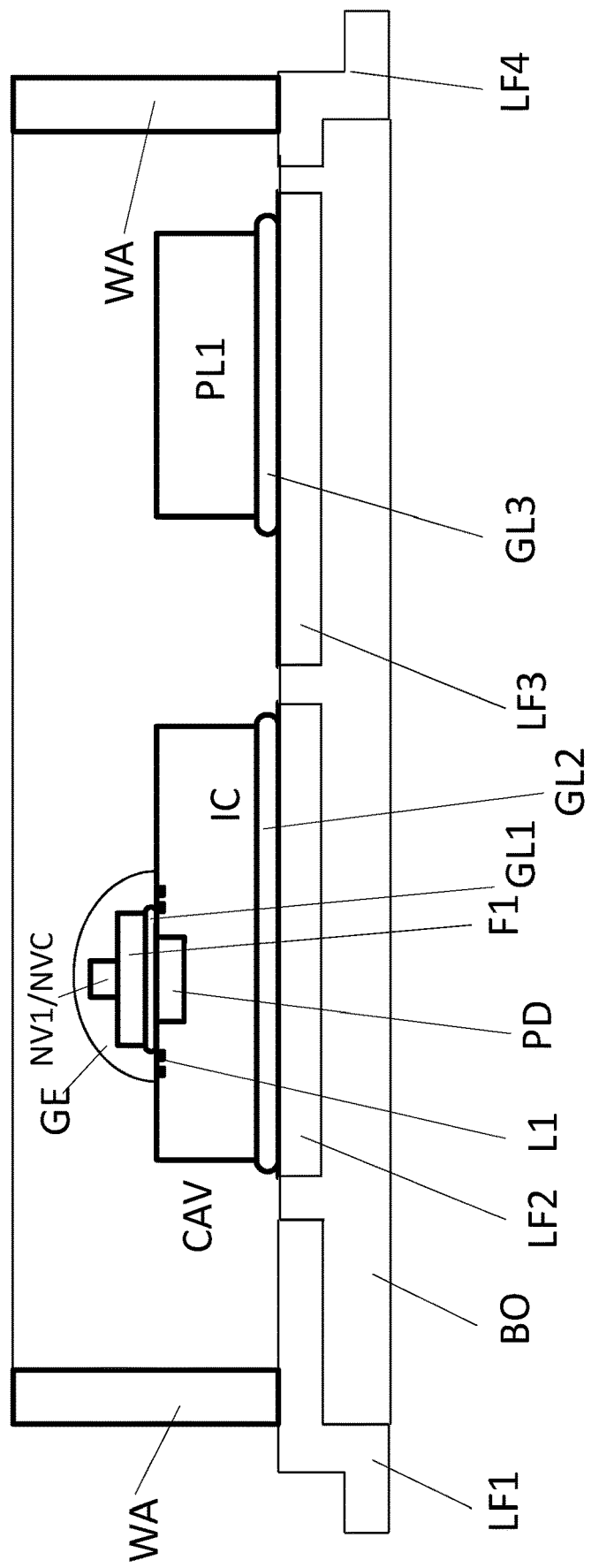

In FIG. 42, the attachment and fixing means (Ge) for fastening the sensor element with the paramagnetic centers (NV1) is introduced in the material of the sensor element on the first filter (F1). Preferably, this is gelatin. UHU has also proven to be effective. Preferably, the gelatin is mixed with the sensor elements and is applied together using a dispenser. In the disclosure provided herein, express reference is made herein to DE 10 2019 114 032.3 and the international patent application PCT/DE 2020/100 430, as yet unpublished at the time of filing of this writing, the disclosure content of which, in combination with the disclosure content of this writing, forms an integral part of this disclosure to the extent permitted by the legal system of the country in which the nationalization of the international application writing provided herein is made.

FIG. 43

Figure 43:
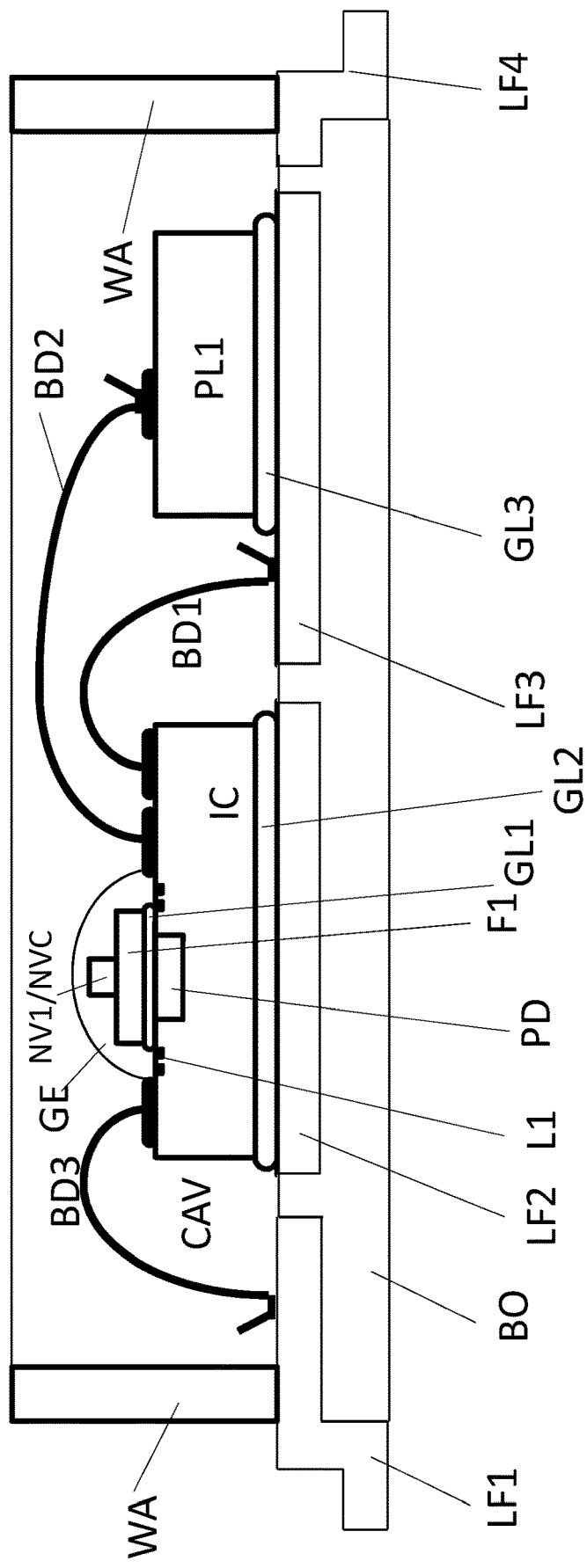

In FIG. 43, further electrical connections are made by bonding wires. Here the first bonding wire (BD1), the second bonding wire (BD2), the third bonding wire (BD3)

are only examples. In reality, the number of bonding wires is significantly higher. The bonding wires drawn here are only for clarification.

FIG. 44

Figure 44:
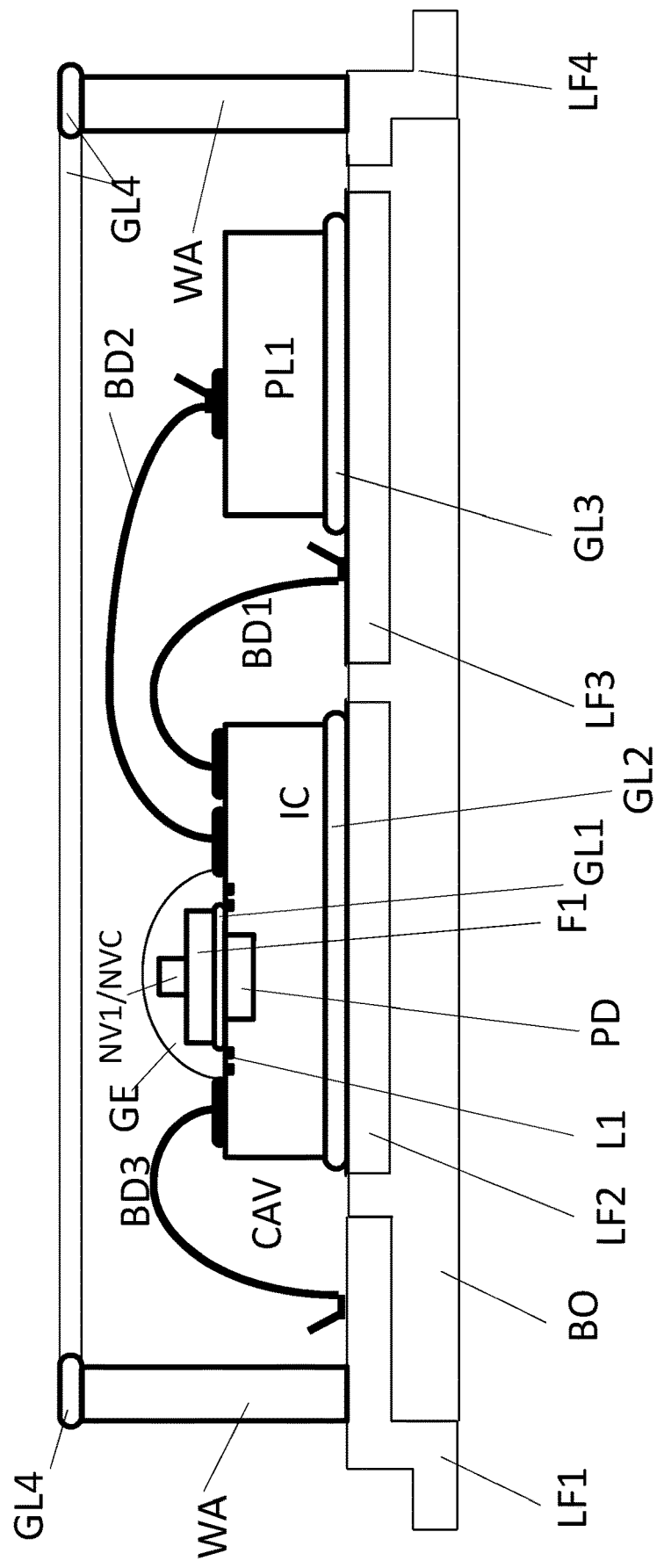

In FIG. 44, a fourth adhesive (GL4) is applied to the upper edges of the walls (WA). Instead of a fourth adhesive (GL4), an equivalent bonding agent or bonding method can also be used. For example, if the walls (WA) are made of a preferably optically non-transparent glass or ceramic or metal, the use of a glass solder is conceivable.

FIG. 45

Figure 45:
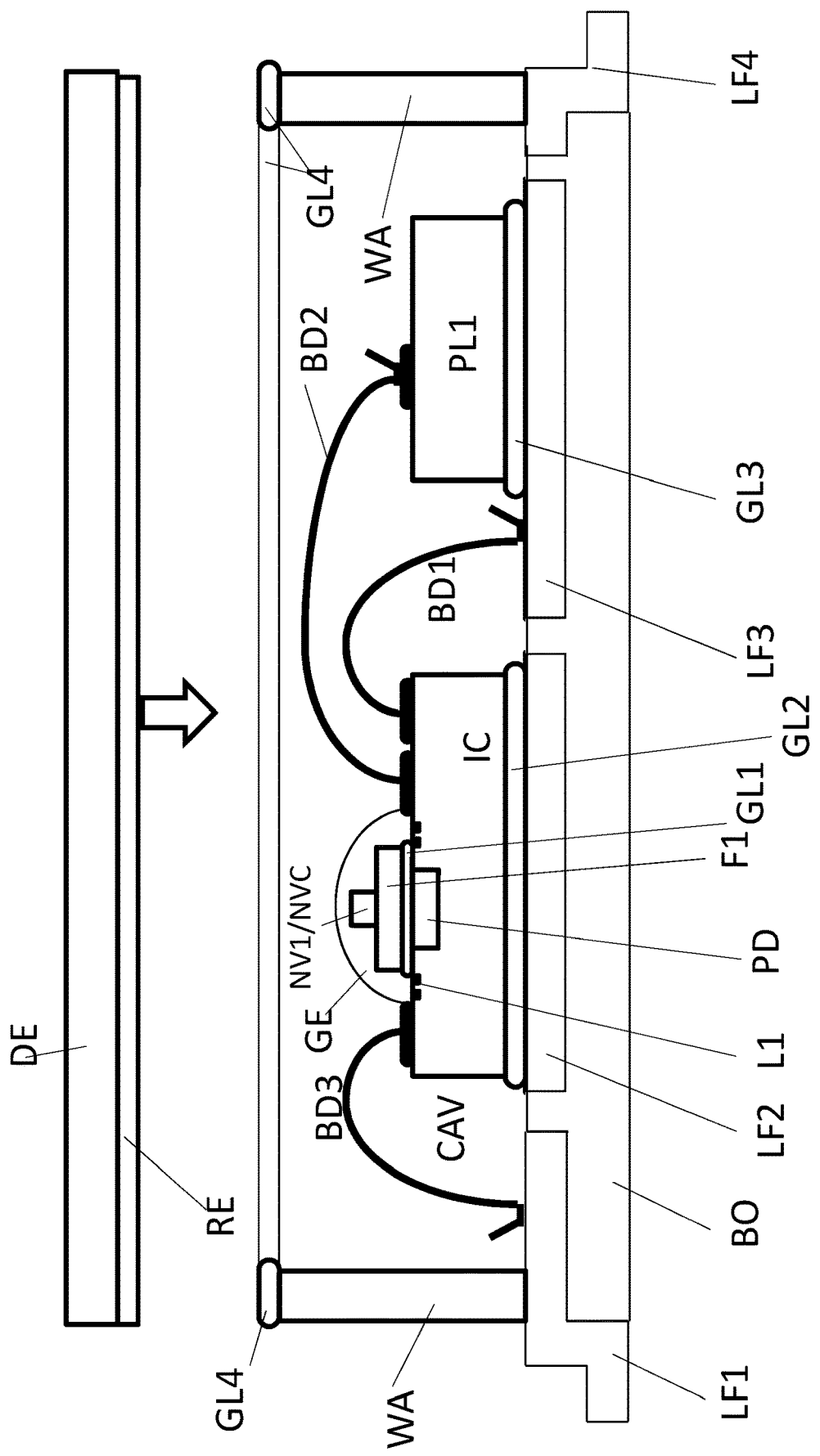

In FIG. 45 the cover (DL) provided with a reflecting material (RE) (for example a coating with titanium oxide or a mirror material) as reflector (RE) is placed on the upper edge of the wall (WA). The reflector (RE) is an exemplary optical functional element for the possible optical coupling of the pump radiation source (PL1), the compensating radiation source (PLK), the radiation receiver (PD), the sensing element with the paramagnetic center or centers, respectively with the group (NC) or the groups (NVC) of paramagnetic centers (NV1) and, if appropriate, the reference element, explained later, with the reference center or centers (NV2) or the group or groups (NVC2) of the reference centers (NV2), wherein, depending on the construction, possibly only a part of these coupling possibilities is used. Preferably, this placing of the lid (DE) takes place in a controlled atmosphere, for example in a protective gas or inert gas and/or in a vacuum and/or in an atmosphere with reduced pressure. This avoids the formation of condensation on the optical functional elements in cold conditions during subsequent operation.

FIG. 46

After the cover (DE) has been fitted and glued or welded or soldered, the reflector (RE) can radiate the pump radiation (LB) of the pump radiation source (PL1) into the sensor element as reflected pump radiation (LB). There, this reflected pump radiation (LB) excites the paramagnetic centers (NV1) in the material of the sensor element to emit the fluorescence radiation (FL). This fluorescent radiation (FL) is received and processed by the radiation receiver (PD), which is exemplarily part of the integrated circuit (IC) here. The reflector (RE) thus serves as an optical functional element of the housing that optically couples the paramagnetic centers (NV1) in the material of the sensor element with the pump radiation source (PL1).

FIG. 47

Figure 46:
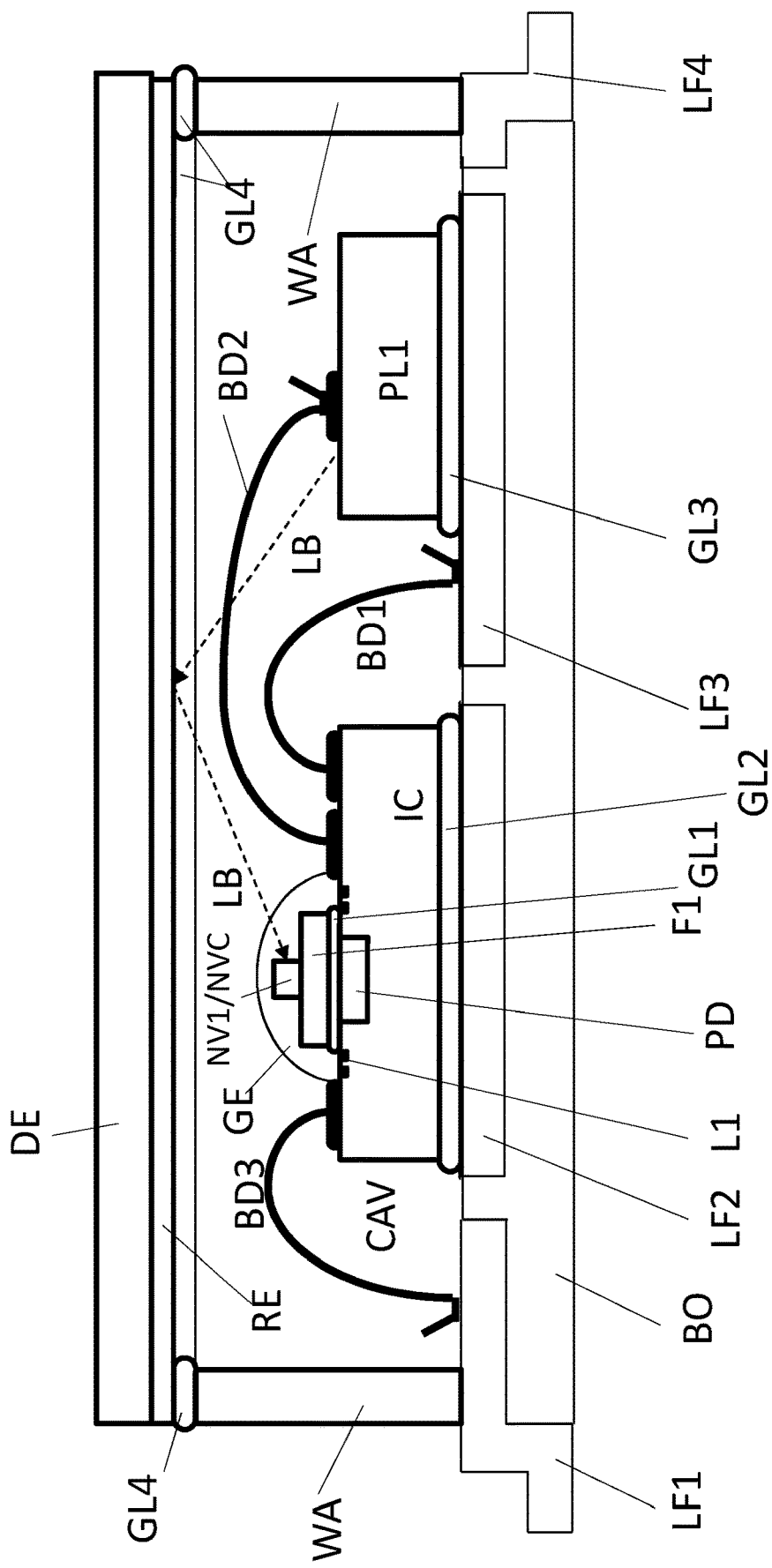
Figure 47:
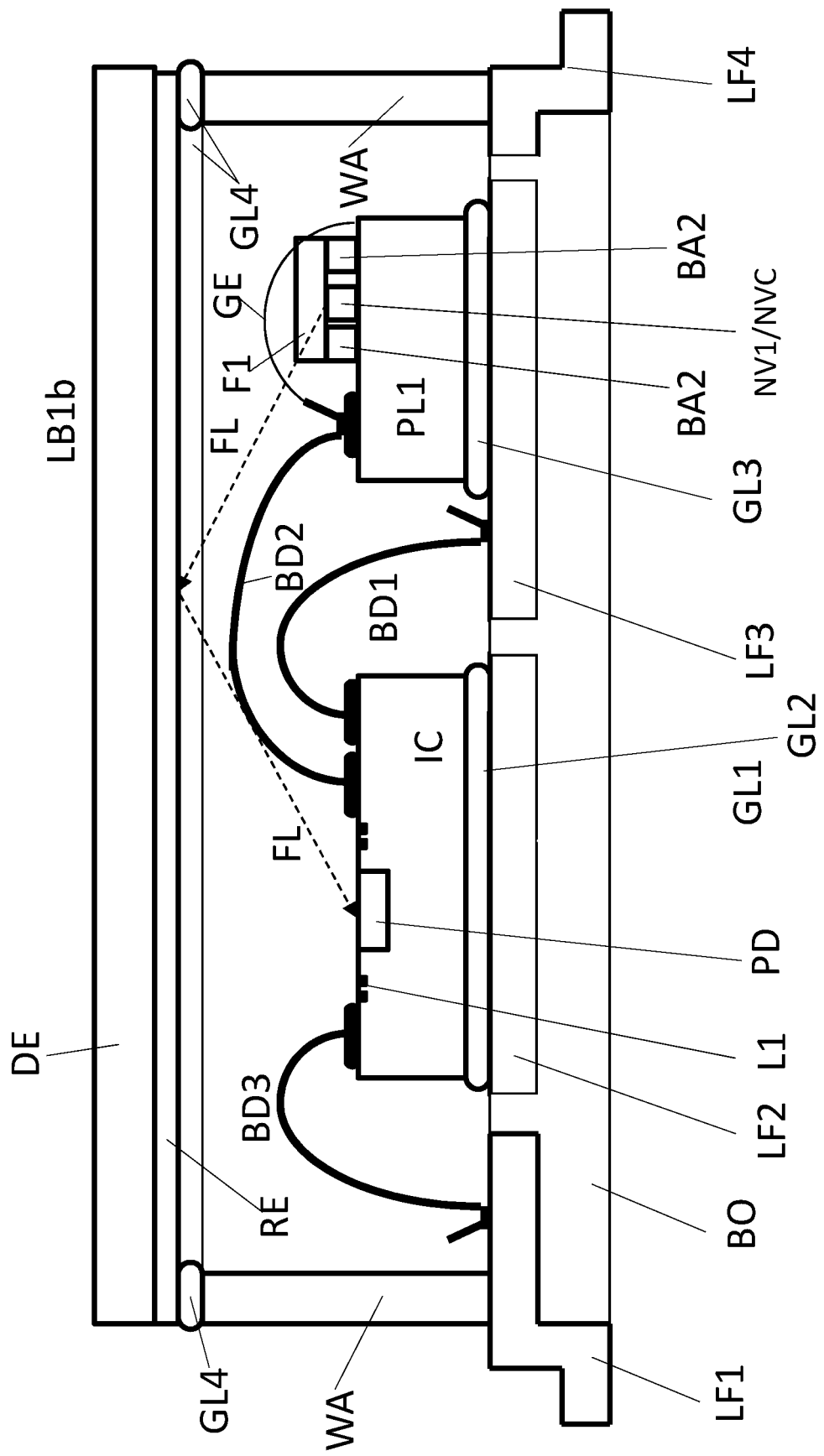
FIG. 47 corresponds as far as possible to FIG. 46 with the difference that the sensor element with the paramagnetic center(s) (NV1) is not fixed directly on the radiation receiver (PD) but on the pump radiation source (PL1) in order to increase the contrast (KT).
Figure 48:
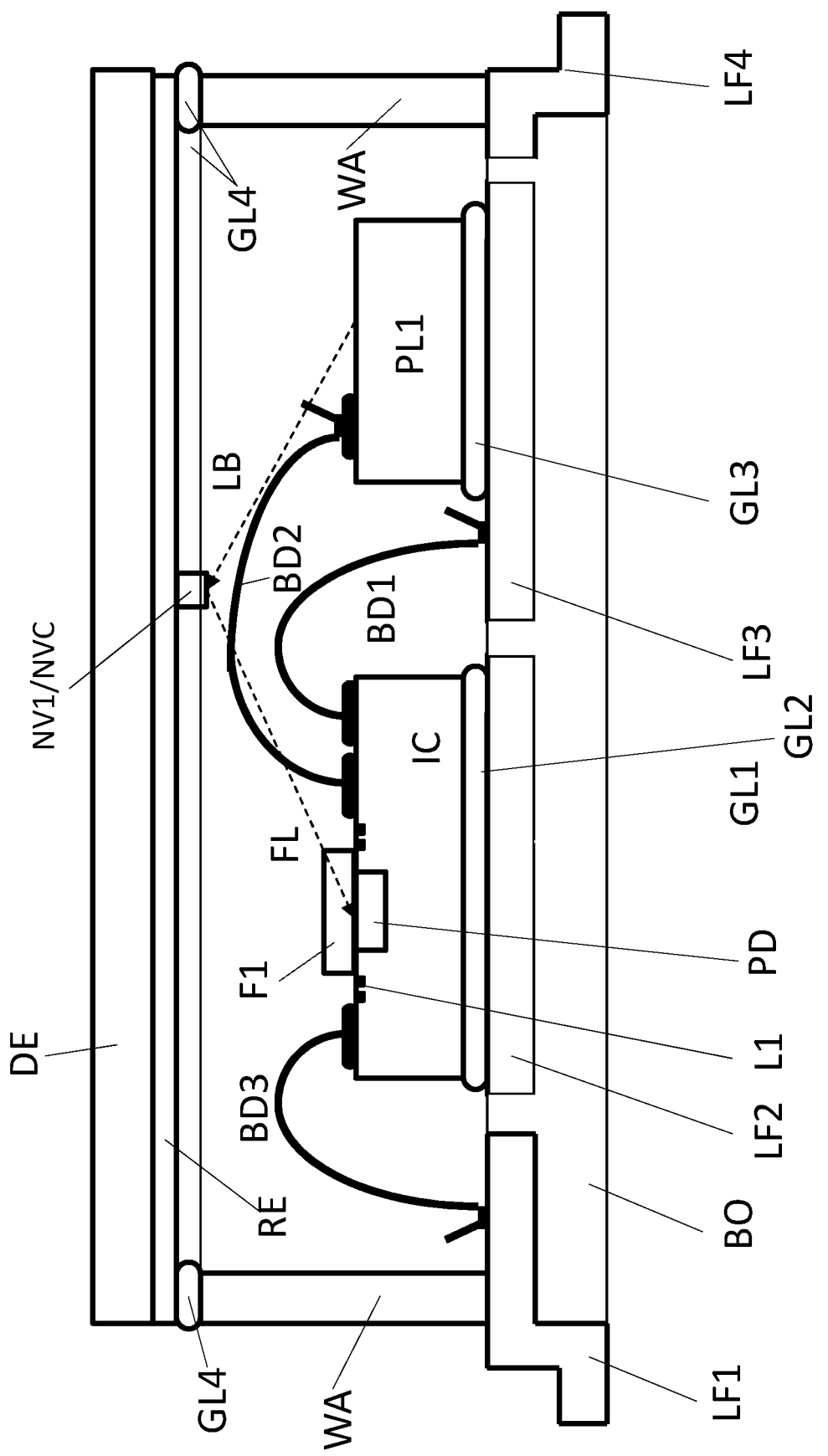
FIG. 48 shows the inside of the housing cover (DE) as a further exemplary alternative placement option for the sensor element with the paramagnetic centers (NV1).

FIG. 47 corresponds largely to FIG. 46 with the difference that the sensor element with the substrate (D) with the paramagnetic center or centers (NV1) or with the group or groups (NVC) of paramagnetic centers (NV1) is not fixed directly on the radiation receiver (PD) but on the pump radiation source (PL1). This has the advantage of increasing the contrast (KT). Preferably, the first filter (F1) is placed and fixed directly on the sensing element comprising the one or more paramagnetic centers (NV1) and/or the group or groups (NVC) of paramagnetic centers (NV1). Preferably, an attachment and fixing means (GE), for example gelatin or Uhu, is again used for fixing the sensor element comprising a substrate (D) with one or more paramagnetic centers (NV1) and/or one or more groups (NVC) of paramagnetic centers (NV1) and the first filter (F1). This results in a light-emitting component comprising the pump radiation source (PL1), which radiates the pump radiation (LB) directly into a substrate (D) of the sensor element having the paramagnetic center or centers (NV1) or having the group or groups (NVC) of paramagnetic centers (NV1), and the sensor element having the paramagnetic center or centers (NV1) or the group or groups (NVC) of paramagnetic centers (NV1), which preferably have a high density at least locally within the sensor element, and the first filter, which preferably is not transparent for radiation with the pump radiation wavelength ($\lambda_{pmp}$) of the pump radiation (LB) of the pump radiation source (PL1) and which preferably is transparent for radiation with the fluorescence radiation wavelength ($\lambda_{fl}$) of the fluorescence radiation (FL)—e.g. 637 nm in the case of NV1. Since the intensity ($I_{fl}$) of the fluorescence radiation (FL) of the paramagnetic centers (NV1) of the sensor element depends on the magnetic flux density B at the location of the paramagnetic centers, this thus results in a light-emitting electronic device, in which the intensity ($I_{fl}$) of the emitted fluorescence radiation (FL) depends on the magnetic flux density B passing through the light-emitting component (F1, NV1, PL1) or on other parameters such as the electric field strength E or the temperature or the acceleration or the rotational speed ω or the gravitational acceleration g. We refer to the writings of G. Balasubramanian, I. Y. Chan, R. Kolesov, M. Al-Hmoud, J. Tisler, C. Shin, C. Kim, A. Wojcik, P. R. Hemmer, A. Krueger, T. Hanke, A. Leitenstorfer, R. Bratschitsch, F. Jeletzko, J. Wrachtrup, "nanoscale imaging magnetometry with diamond spins under ambient conditions", Nature 455, 648 (2008) regarding magnetic field measurement with NV centers and G. Kucsko, P. C. Maurer, N. Y. Yao, M. Kubo, H. J. Noh, P. K. Lo, H. Park, M. D. Lukin, "Nanometre-scale thermometry in a living cell", Nature 500, 54-58 (2013) regarding thermometry with NV centers and F. Dole, H. Fedder, M. W. Doherty, T. Nobauer, F. Rempp, G. Balasubramanian, T. Wolf, F. Reinhard, L. C. L. Hollenberg, F. Jeletzko, J. Wrachtup, "Electric-field sensing using single diamond spins," Nat. Phs. 7, 459-463 (2011) regarding electric-field sensing with NV centers and A. Albrecht, A. Retzker, M. Plenio, "Nanodiamond interferometry meets quantum gravity" arXiv:1403.6038v1 [quant-ph] 24 Mar. 2014 regarding gravitational-field sensing with NV centers.

Preferably, if required, an exit of the pump radiation (LB) is prevented via radiation-impermeable barriers (BA2) on the sides of the sensor element. These can be applied, for example, by means of a dispenser as an opaque adhesive or the like.

FIG. 48

Another alternative placement option for the sensor element with the paramagnetic centers (NV1) is, for example, the inside of the housing cover (DE).

FIG. 49

Figure 49:
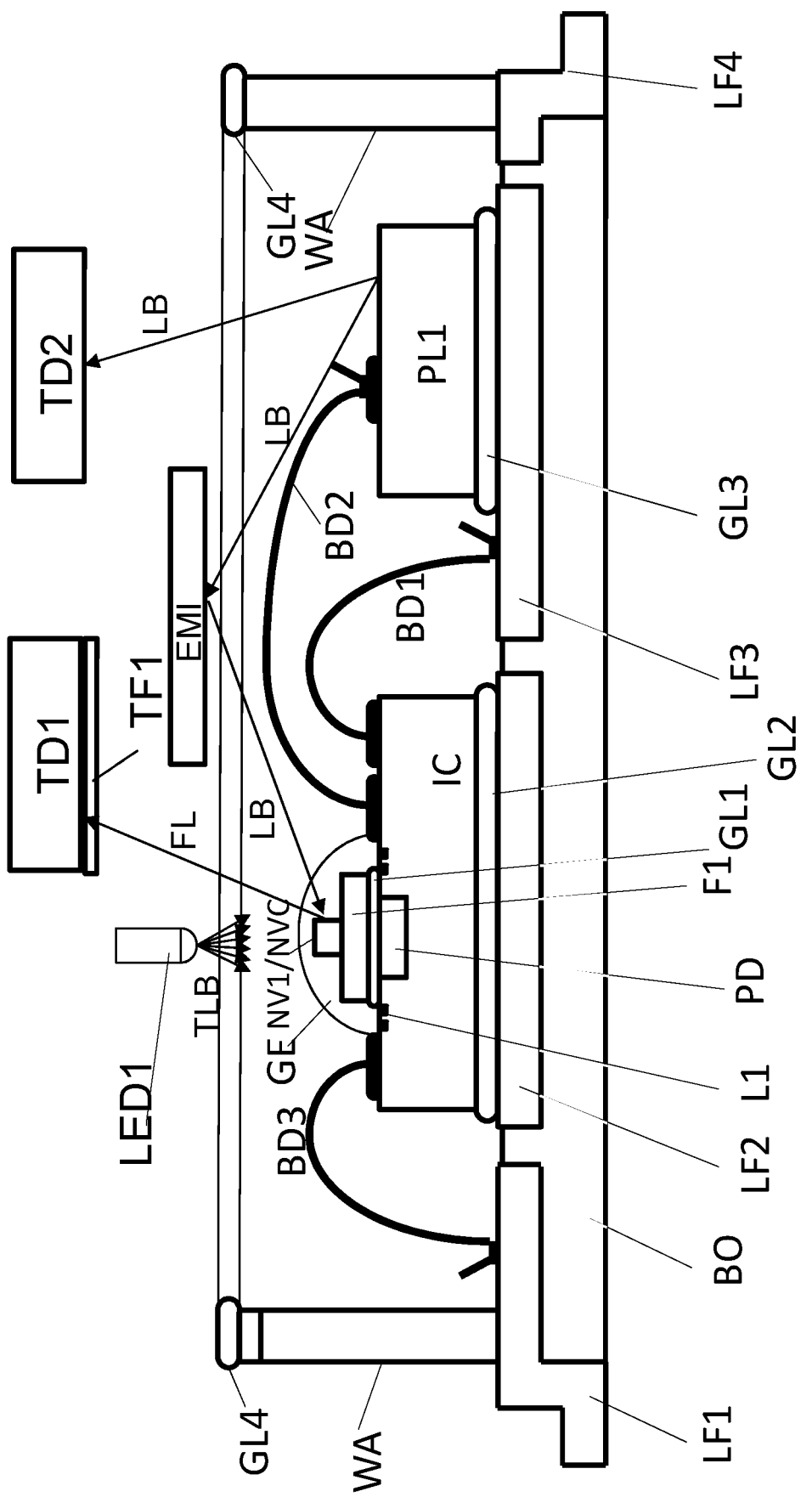
FIG. 49 shows the test of a proposed sensor system.

FIG. 49 shows the test of a proposed sensor system. The test is preferably performed before closing the mounting opening (MO) of the housing with the housing cover (DE). Preferably, the integrated circuit (IC) is put into operation by contacting the housing and applying suitable patterns, i.e. temporal signal patterns for controlling the contacts of the sensor system, e.g. by means of an electrical test system. A first test radiation source (LED1), which is preferably an LED or a laser, emits test pump radiation (TLB) with a test pump radiation wavelength ($\lambda_{tpmp}$) which is typically equal to the pump radiation wavelength ($\lambda_{pmp}$) of the pump radiation source (PL1), and irradiates with it the paramagnetic centers (NV1) in the material of the sensor element. This irradiation with test pump radiation (TLB) of the pump radiation wavelength ($\lambda_{pmp}$) excites the paramagnetic center(s) (NV1) and/or the group(s) (NVC) of paramagnetic centers (NV1) in the material of the sensor element to emit a fluorescence radiation (FL) with the fluorescence radiation wavelength ($\lambda_{fl}$)—for example with a fluorescence radiation wavelength ($\lambda_{fl}$) of $\lambda_{fl}$=637 nm for NV centers. This fluorescence radiation (FL) can be received by a first test receiver (TD1) provided with a test filter (TF1) which is transparent to radiation having the fluorescence radiation wavelength ($\lambda_{fl}$) of the fluorescence radiation (FL)—e.g. 637 nm at NV centers—and which is preferably not transparent to radiation having the pump radiation wavelength ($\lambda_{pmp}$) of the pump radiation (LB) and the test pump radiation (TLB). The intensity ($I_{fl}$) of the fluorescence radiation (FL) is detected by means of the test receiver (TD1) and converted into a measured value. This measured value is compared with a setpoint value by an undrawn test device. If the comparison is negative, the sensor system is faulty.

In another test step, the pump radiation source (PL1) of the sensor system is caused by the integrated circuit (IC) to emit pump radiation (LB) of the pump radiation wavelength ($\lambda_{pmp}$) based on a command from the external test device to the integrated circuit (IC). This emitted pump radiation (LB) partially falls on the paramagnetic centers (NV1) in the material of the sensor element. If necessary, an external mirror (EMI), which is preferably part of the test device, is provided for this purpose. This excites the paramagnetic centers (NV1) in the material of the sensor element to emit fluorescence radiation (FL). This fluorescence radiation (FL) can be detected by the first test receiver (TD1) provided with said test filter (TF1). The intensity ($I_{fl}$) of the fluorescent radiation (FL) is again detected by means of said test receiver (TD1) and converted into a measured value. This measured value is compared with a second set value by a test device which is not drawn. If the comparison is negative, the system is faulty.

The pump radiation (LB) of the pump radiation source (PL1) can be detected by a second test receiver (TD2). The pump radiation (LB) is detected by means of this test receiver (TD2) and converted into a measured value. This measured value is compared with a third setpoint value by a test device which is not drawn. If the comparison is negative, the tested sensor system is faulty. If the system is not faulty, the mounting opening of the housing can be closed. If the tested sensor system is faulty, it is discarded or sent for rework.

FIG. 50

FIG. 50 shows a basic process flow for manufacturing a sensor system. The proposed manufacturing process comprises the following steps, whereby the order of the steps may vary slightly, additional steps may be performed and steps may be combined. A first step is to provide (1) a so-called pre-molded open cavity housing with connectors. This preferably means a pre-molded housing having a cavity (CAV) with a mounting opening (MO) into which the components are mounted. The housing is shown in FIG. 34 in plan view and 35 in sectional view from the side. As a second step, the insertion (2) of a pump radiation source (PL1) takes place. As a third step, the insertion (3) of an integrated circuit (IC) with a radiation receiver (PD1), which is preferably already wavelength sensitive, takes place. That is, it is preferably sensitive to radiation at the fluorescence radiation wavelength ($\lambda_{fl}$)—e.g. 637 nm for NV centers—of the fluorescence radiation (FL) of a paramagnetic center (NV1) of the material of the sensor element and substantially not sensitive to radiation with the pump radiation wavelength ($\lambda_{pmp}$) of the pump radiation (LB) of the pump radiation source (PL1), with which the paramagnetic center (NV1) is caused to emit the fluorescence radiation (FL). The step of electrically connecting (4) the integrated circuit (IC) and the terminals (LF1, LF2, LF4, LF5, LF6) and the pump radiation source (PL1) for the pump radiation (LB) follows. If necessary, further components are placed and connected in the housing. Insertion (5) of a sensor element with a paramagnetic center (NV1) in the material of the sensor element and fastening (6) of the sensor element by means of an attachment and fixing means (Ge) are carried out. These last two steps may also be carried out together. As a further step, the manufacturing (7) of a means for directing the pump radiation (LB) and/or the fluorescent radiation (FL) takes place. This means is, for example, the reflector (RE). The reflector (RE) may also simply be the untreated side of the lid (DE) facing the cavity (CAV). This cover side of the cover (DE) may be coated, may be provided with an optical functional element, may be microstructured and may be provided with a curvature which may be modulated, in order, for example, to optically couple the pump radiation source (PL1) to the paramagnetic center (NV1) or centers (NV1) and/or the group or groups (NVC) of paramagnetic centers (NV1) in the preferably diamagnetic material (MPZ) of a substrate (D) of the sensor element and/or for example optically coupling the paramagnetic center (NV1) or centers (NV1) and/or the group or groups (NVC) of paramagnetic centers (NV1) in the preferably diamagnetic material (MPZ) of a substrate (D) of the sensor element to the radiation receiver (PD). Closing (8) the mounting opening (MO) of the housing with said cover (DE) completes the process in its basic form. In FIG. 50a, the process sequence is shown in its basic form, while in FIG. 50b, steps five and six are carried out together. Variations of this process sequence, e.g. to mount and connect a separate radiation receiver (PD) and/or a compensation radiation source (PLK) are possible.

FIG. 51

In FIG. 51a, the procedure of FIG. 50a is shown again. Between the step of fixing (6) the sensor element by means of an attachment and fixing means (Ge) and the step of producing (7) a means for directing the pump radiation (LB) and/or fluorescent radiation (FL), a step for testing the system function (9) is inserted, in which a measured value is determined. This measured value is compared with a threshold value in a further step (10). If the comparison is positive (p), the known step of producing (7) a means for directing the pump radiation (LB) and/or fluorescence radiation (FL) follows. If the comparison is negative (n), the system is discarded (11) or reworked.

In FIG. 51b, the procedure of FIG. 50a is shown again. Between the step of fixing (6) the sensor element by means of an attachment and fixing means (Ge) and the step of manufacturing (7) a means for directing the pump radiation (LB) and/or fluorescence radiation (FL), there is provided a step (12) of applying the first adhesive (GL1) to the microelectronic integrated circuit (IC) and a step (13) of placing the first filter (F1) in the first adhesive (GL1). These steps are necessary when the receiver is not substantially selective for radiation having the fluorescence wavelength ($\lambda_{fl}$) of the fluorescence radiation (FL) of the paramagnetic center of the material of the sensing element versus radiation having the pump radiation wavelength ($\lambda_{pmp}$) of the pump radiation (LB) of the pump radiation source (PL1).

Further steps are possible. The steps can also be combined with each other, if this makes sense. The sequence can deviate if sensible. It is also possible to perform more than one test step (10).

For example, a test step (9) may test the emission of fluorescent radiation (FL) by the paramagnetic center (NV1) of the material of the sensing element by irradiation with pump radiation (LB).

For example, a test step (9) may test the emission of fluorescent radiation (FL) by the paramagnetic center (NV1) of the material of the sensor element by causing the pump radiation source (LED1) to emit pump radiation (LB), and then preferably the pump radiation (LB) emitted by the pump radiation source (PL1) may also be tested.

In test step (9), for example, the emission of fluorescence radiation (FL) by the paramagnetic center (NV1) of the material of the sensor element can be tested by irradiation with pump radiation (LB) as a function of an externally generated magnetic flux B. This is particularly useful for calibration purposes. The calibration data then determined, if any, may be stored in a memory of the microelectronic circuit (IC). Such a test and calibration are of course particularly useful after the cover (DE) has been placed on the housing.

FIG. 52

Figure 52:
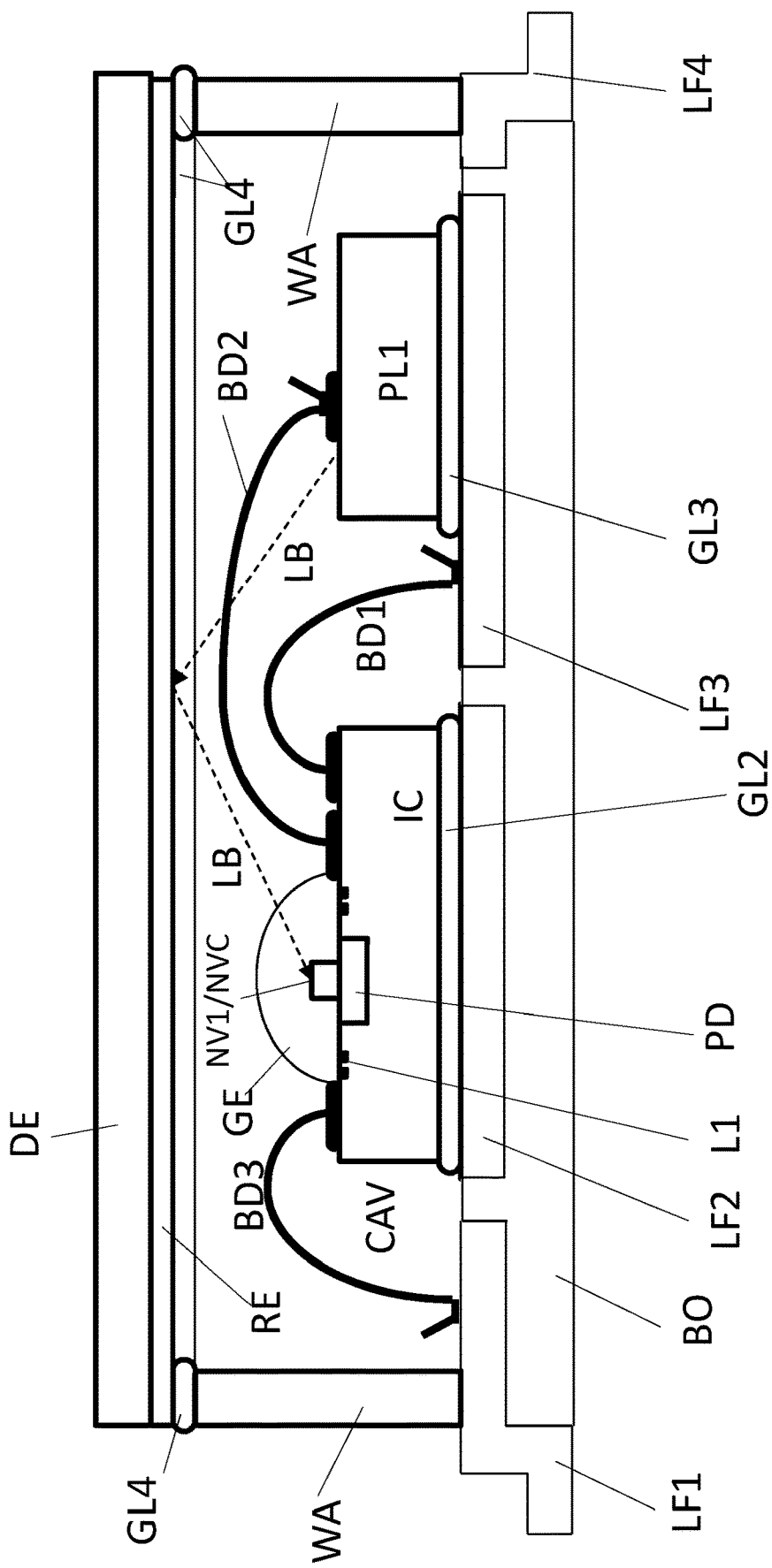
FIG. 52 shows a sensor system according to FIG. 46 without the first filter (F1) and without the first adhesive (GL1), for example for operation with a system according to FIG. 20 to 21 or 25.

FIG. 52 shows a sensor system according to FIG. 46 without the first filter (F1) and without the first adhesive (GL1), for example for operation with a system according to FIG. 20 to 21 or 25.

The system of FIG. 52 is thus a sensor system and/or quantum technological system, wherein the sensor system and/or quantum technological system comprises one or more paramagnetic centers (NV1) in the material of a sensor element and/or quantum technological device element which is part of the sensor system or quantum technological system, and wherein the sensor system and/or quantum technological system comprises a radiation source (PL1) for pump radiation (LB). The pump radiation (LB) emitted by the pump radiation source (PL1) at first times (T1) causes the paramagnetic center(s) (NV1) to emit fluorescence radiation (FL). This is phase shifted by a fluorescence phase shift time (ΔTFL) with respect to the pump radiation (LB). The sensor system and/or quantum technological system therefore comprises means (PD1, A1, M1, TP, M2, A2, G, M1', TP', M2'), for example those of FIG. 12, which detect detect the fluorescence radiation (FL) of the paramagnetic center or centers (NV1) at second times (T2) different from the first times (T1) to infer the phase shift in the form of the value of the fluorescence phase shift time (ΔTFL) and to provide a value in the form of a sensor output signal (out) corresponding to or depending on this value. For example, the pump radiation (LB) may be modulated by a PWM signal as a transmission signal (S5) with an exemplary duty cycle of 50%. The orthogonal reference signal (S5') is then, for example, also preferably a PWM signal with 50% duty cycle, which is preferably phase-shifted by 90° with respect to the transmission signal (S5) or the alternating component (s5w) of the transmission signal (S5) when the levels of the transmission signal (S5) and of the orthogonal reference signal (S5') are applied symmetrically about 0, i.e. jump back and forth between 1 and −1, for example. If the levels are applied at 1 and 0, the orthogonal reference signal (S5') is preferably shifted 180° with respect to the transmission signal (S5), i.e. inverted with respect to the transmission signal (S5). Other orthogonality combinations (e.g. different frequencies) are conceivable. In the case of the level definition with 0 and 1, the operation of LEDs as a pump radiation source (PL1) is particularly advantageous. The additional sensor output signal (out') formed, for example, according to FIG. 17, then represents a value for the fluorescence radiation (FL) of the paramagnetic center s (NV1) at times when no pump radiation (LB) is emitted. These are typically the second times (T2). Since the time course of the afterglow of the paramagnetic centers (NV1) is known and since the phase shift is thus predetermined, this value, which is represented by the additional sensor output signal (out'), then depends on the fluorescence radiation (FL) of the paramagnetic center (NV1) and thus, for example, on the magnetic flux B influencing this fluorescence radiation (FL) of the paramagnetic center (NV1) at the location of the paramagnetic center (NV1). The advantage is that in this way only three components need to be mounted in the housing.

FIG. 53

Figure 53:
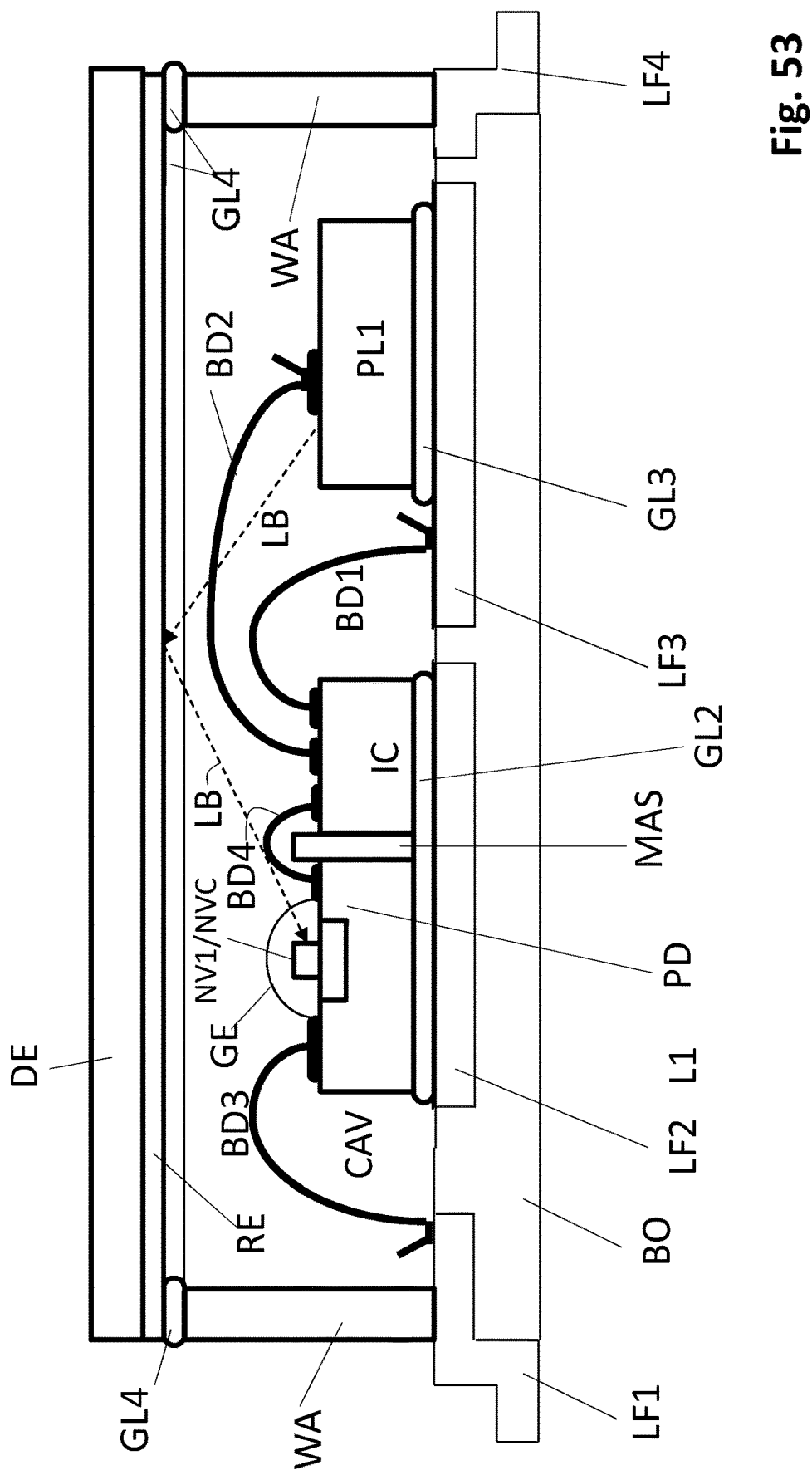
FIG. 53 shows the exemplary housing with the sensor system from FIG. 52 with shielding (MAS) and a separated radiation receiver (PD).

FIG. 53 shows the exemplary housing with the sensor system from FIG. 52 with shielding (MAS) and a separate radiation receiver (PD). The shielding (MAS) is preferably made of electrically conductive and/or soft magnetic material.

FIG. 54

Figure 54:
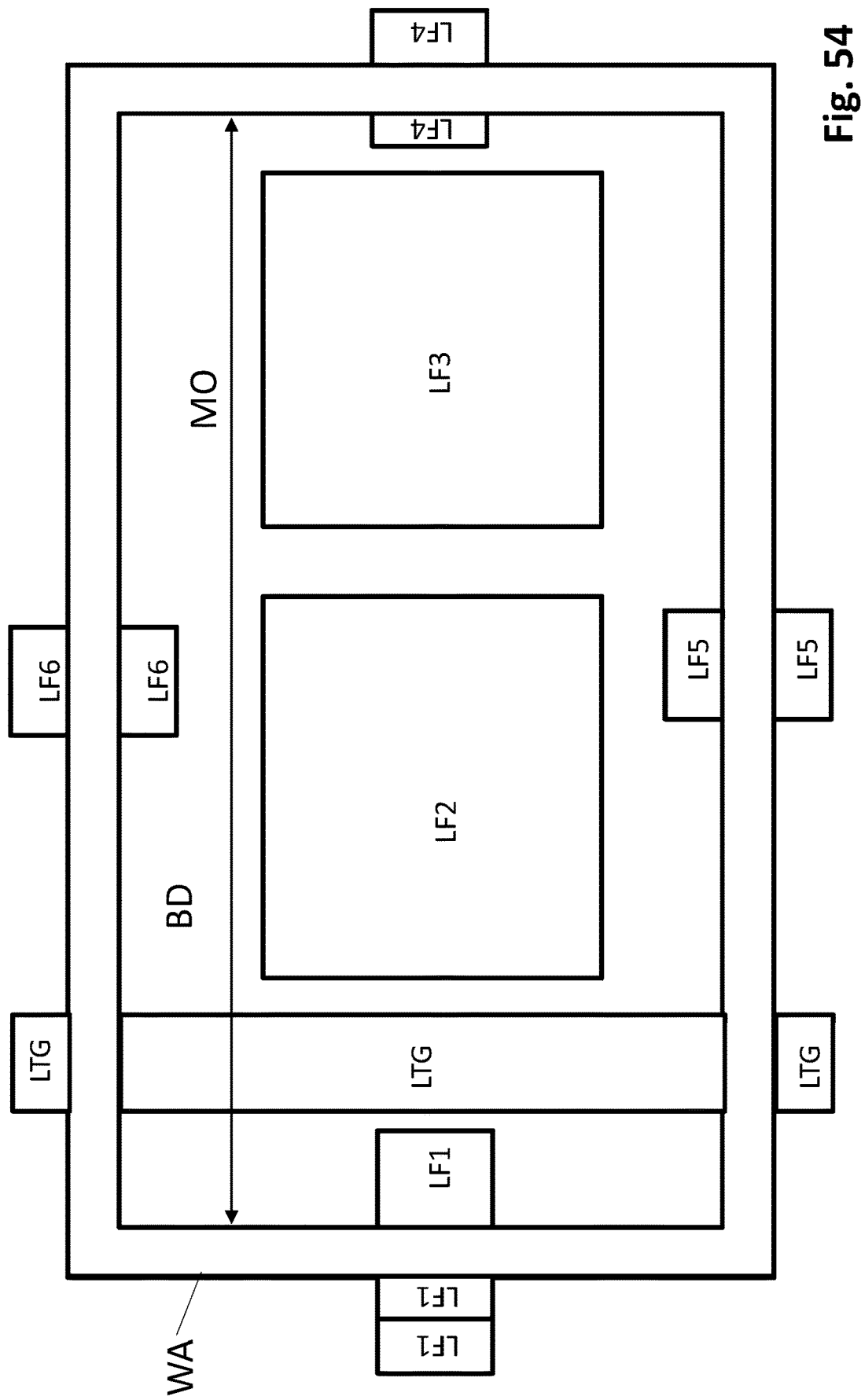
FIG. 54 shows the exemplary housing with the sensor system of FIG. 34 with an additional line (LTG), whose electrical current is to be measured, in the top view before assembly.

FIG. 54 shows the exemplary housing with the sensor system of FIG. 34 with an additional line (LTG) in the top view before assembly. In the example discussed arbitrarily here, the electric current is to be measured by determining a current value for this current in the line (LTG);

FIG. 55

Figure 55:
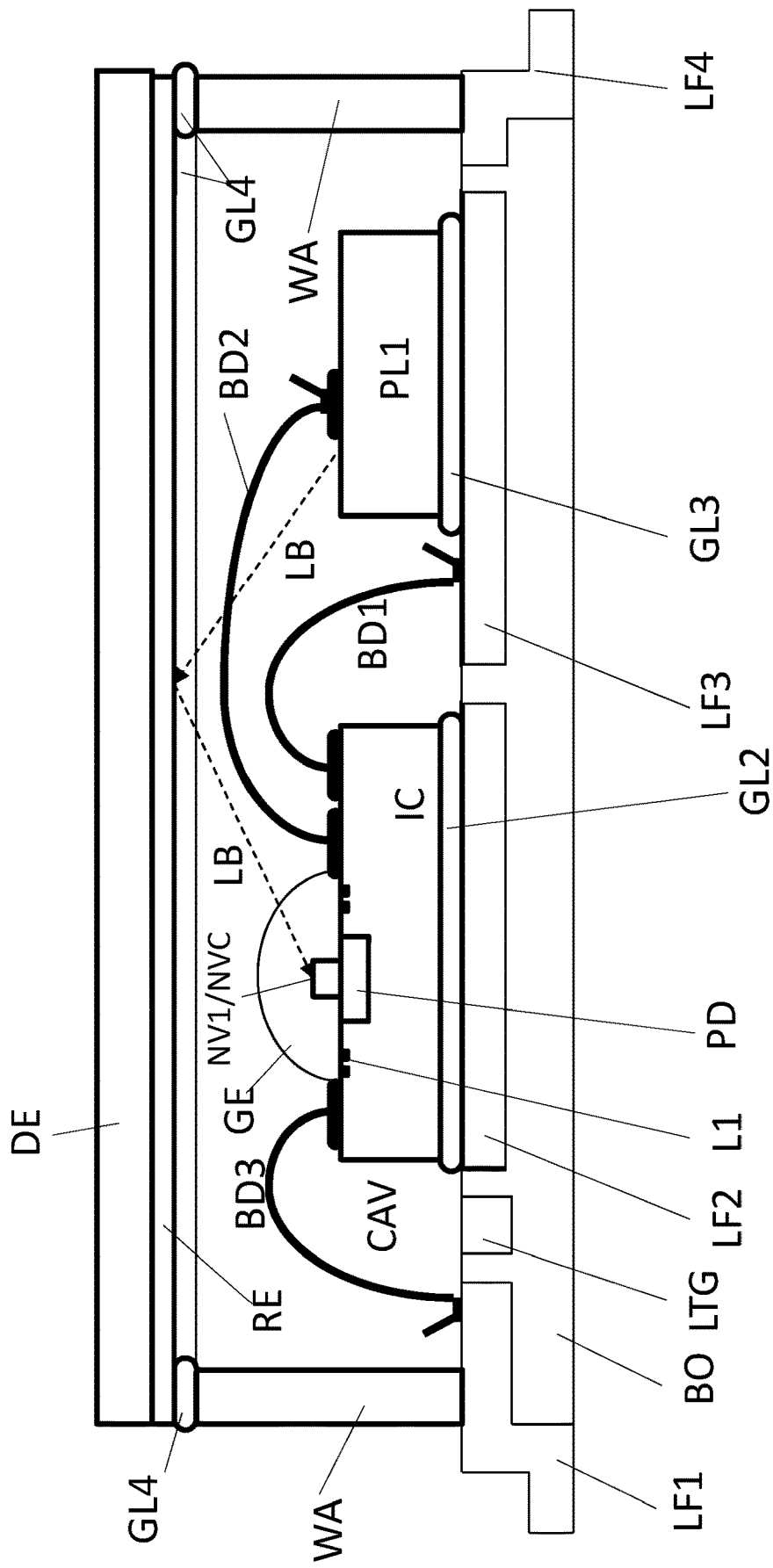
FIG. 55 shows the exemplary housing with the sensor system from FIG. 52 with the additional line (LTG) compared to FIG. 52, whose current is to be measured.

FIG. 55 shows the exemplary housing with the sensor system from FIG. 52 with the additional line (LTG) compared to FIG. 52, whose current is to be measured;

FIG. 56

Figure 56:
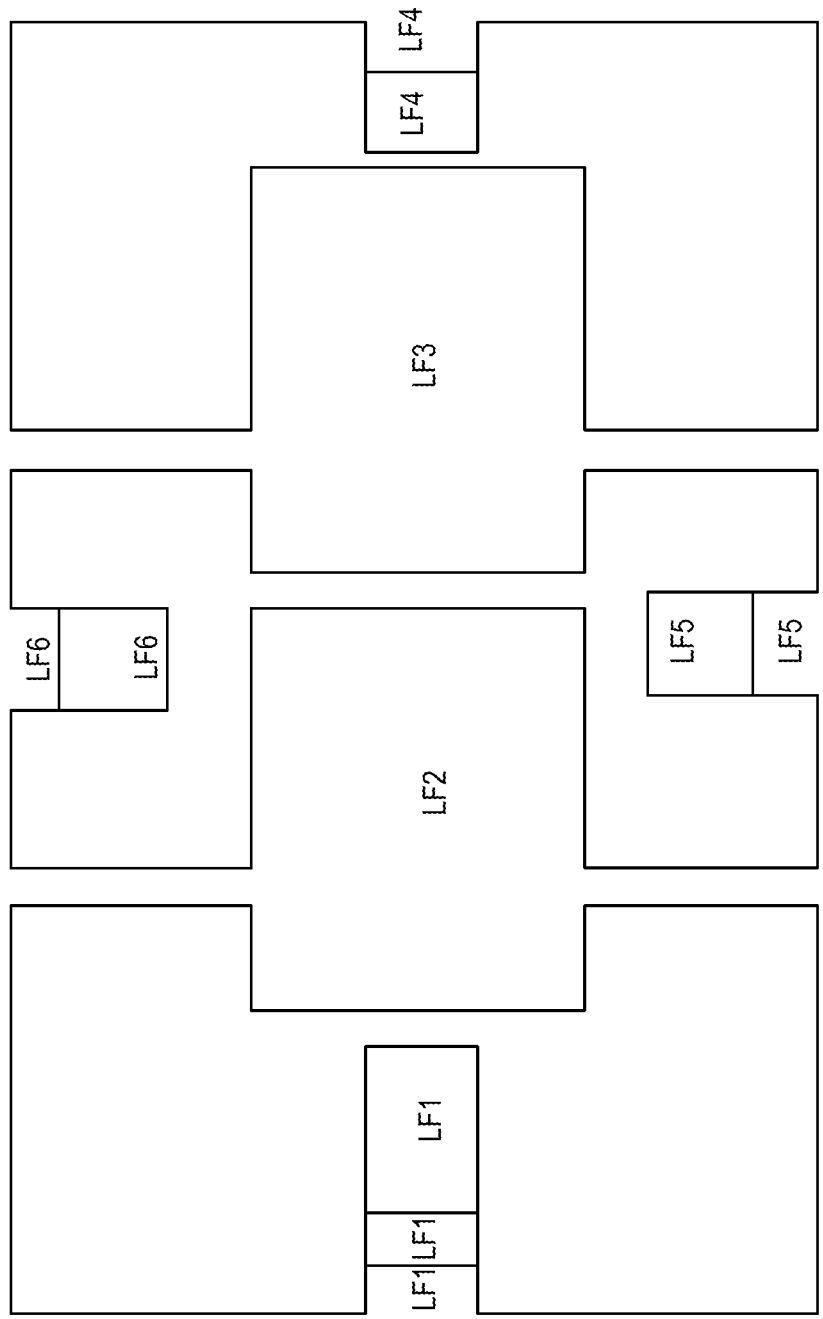
FIG. 56 shows a lead frame from above.

FIG. 56 shows a top view of an exemplary lead frame for the exemplary housings of FIG. 46. Mounting surfaces are preferably incorporated in the lead frame. These are preferably made of metal. This metal is preferably coated in order to ensure better adhesion of the bonding wires. In the following, these mounting surfaces are referred to as lead frame surfaces.

The first lead frame area (LF1), the fifth lead frame area (LF5), the sixth lead frame area (LF6) and the fourth lead frame area (LF4) will later form the contacts.

The second lead frame area (LF2) and the third lead frame area (LF3) are later used for mounting the integrated circuit (IC) and the pump radiation source (PL1) for the pump radiation (LB).

FIG. 57

Figure 57:
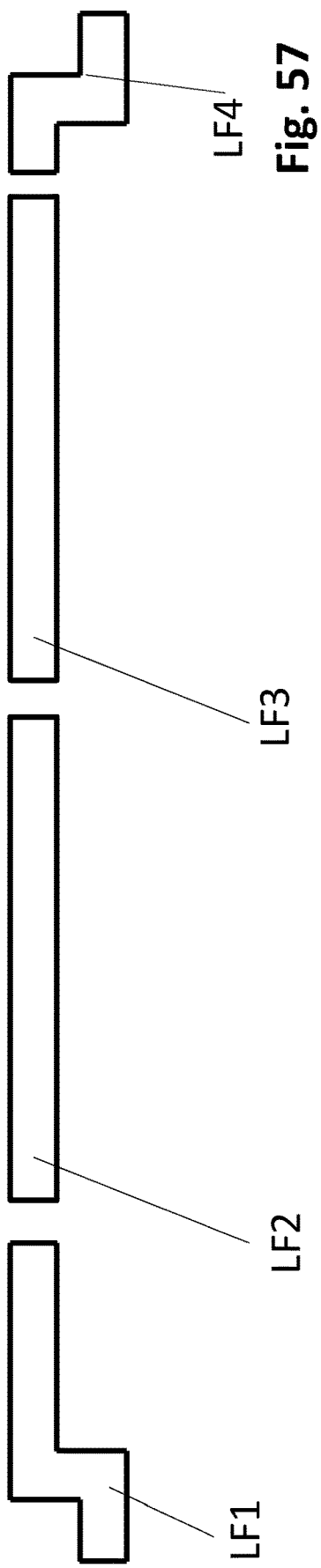
FIG. 57 shows the exemplary leadframe of FIG. 56 in cross-section. The frame of the leadframe is not drawn here and in the following for simplification.

FIG. 57 shows the exemplary lead frame of FIG. 56 in cross-section. The frame of the lead frame is not drawn here and in the following for simplification.

FIGS. 58 to 69

FIGS. 58 to 69 describe an exemplary assembly process for the further proposed system.

FIG. 58

Figure 58:
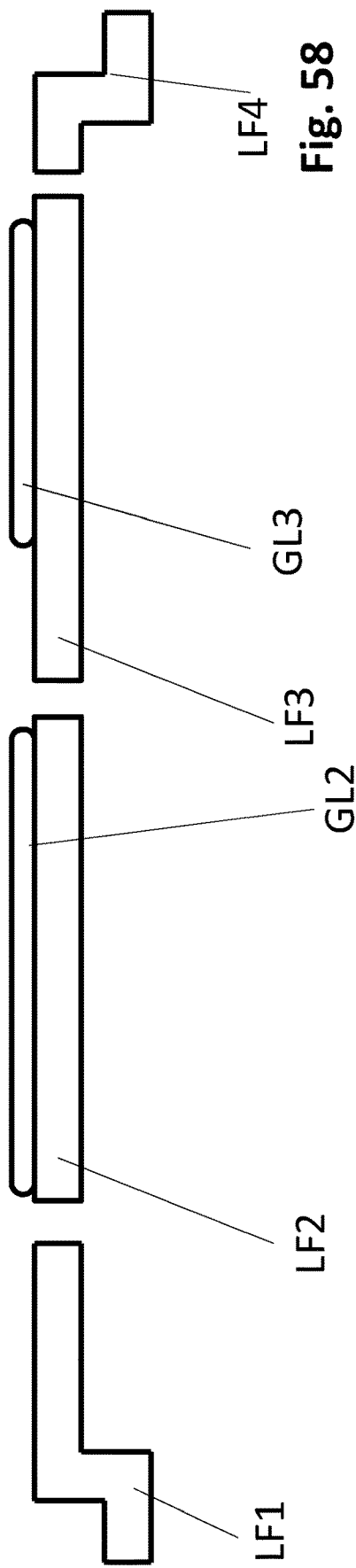
FIGS. 58 to 68 describe an exemplary assembly process for the further proposed system.

In FIG. 58, for example, a third adhesive (GL3) is first applied to the third lead frame area (LF3) using a dispenser. A second adhesive (GL2) is applied to the second lead frame area (LF2) using a dispenser.

FIG. 59

Figure 59:
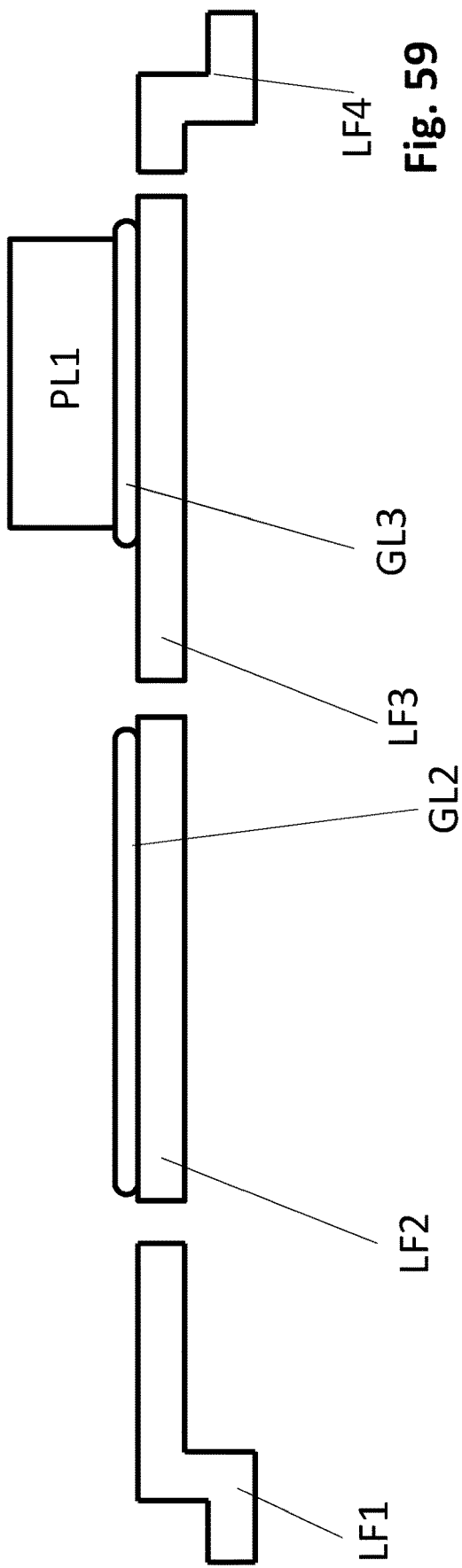

In FIG. 59, the pump radiation source (PL1) is placed in the third adhesive (GL3) on the third lead frame surface (LF3), thereby attaching it to the third lead frame surface (LF3). Preferably, the third adhesive (GL3) is electrically and thermally conductive. In that case, an electrical and thermal connection is formed between the pump radiation source (PL1) and the third lead frame surface (LF3). Preferably, the third lead frame surface (LF3) is a so-called exposed die pad which allows thermal contacting of the third lead frame surface from the underside of the bottom (BO) of the housing and thus allows better heat dissipation and thus temperature control for the pump radiation source (PL1). Preferably, the outer surface of the third lead frame surface (LF3) thus exposed to the outside is thermally coupled to a heat sink, for example by means of soldering or bonding with a thermally conductive adhesive. By this measure, the pump radiation source (PL1) is coupled to this heat sink, for example a heat sink. Preferably, a temperature sensor detects the temperature of the pump radiation source (PL1). Preferably, a controller adjusts the temperature of the pump radiation source (PL1) with the aid of a heating element, which works against the heat sink, as a function of the value of the temperature detected by the temperature sensor in such a way that this is essentially stable apart from control errors. If necessary, a control of the cooling may also be considered. Preferably, the pump radiation source (PL1) is operated in a temperature-stabilized manner.

FIG. 60

Figure 60:
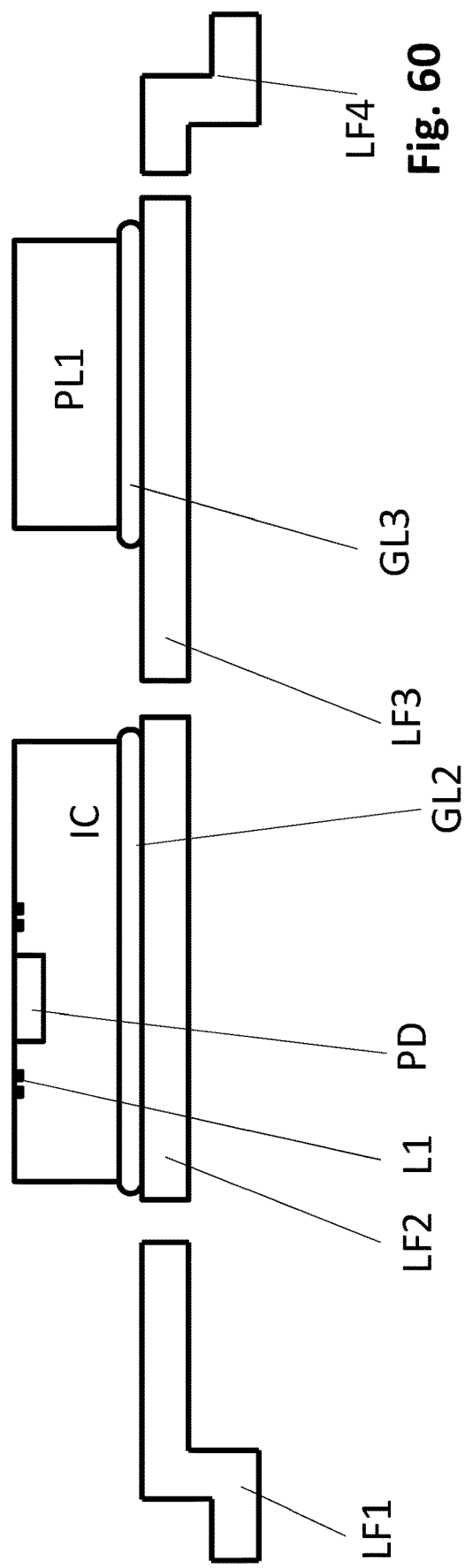

In FIG. 60, an integrated circuit (IC) is placed in the second adhesive (GL2) to attach it to the second lead frame surface (LF2). Preferably, the second adhesive (GL2) is electrically conductive. In that case, an electrical connection is formed between the backside of the integrated circuit (IC) and the wide lead frame area (LF2). In the example, the integrated circuit (IC) comprises the radiation receiver (PD1) and the first coil (L1) surrounding the radiation receiver (PD1) in the example of FIG. 60. However, it may also be a single lead (LH). However, the first coil (L1) may also be fabricated on or in a substrate (D) of the sensor element, for example. It may also be one or more lines, in particular straight lines, on or in the substrate or the sensor element. This first coil (L1) can be used, for example, as a compensation coil (LC). Preferably, it is a flat coil in the metallization stack of the integrated circuit (IC). To the technical teaching of PCT/DE 2020/100 430, which is unpublished as of the filing date of this writing, the technical teaching of which, in combination with the technical teaching of this writing, is fully part of this disclosure to the extent permitted by the legal system of the country in which the nationalization of the international application writing presented herein is made.

FIG. 61

Figure 61:
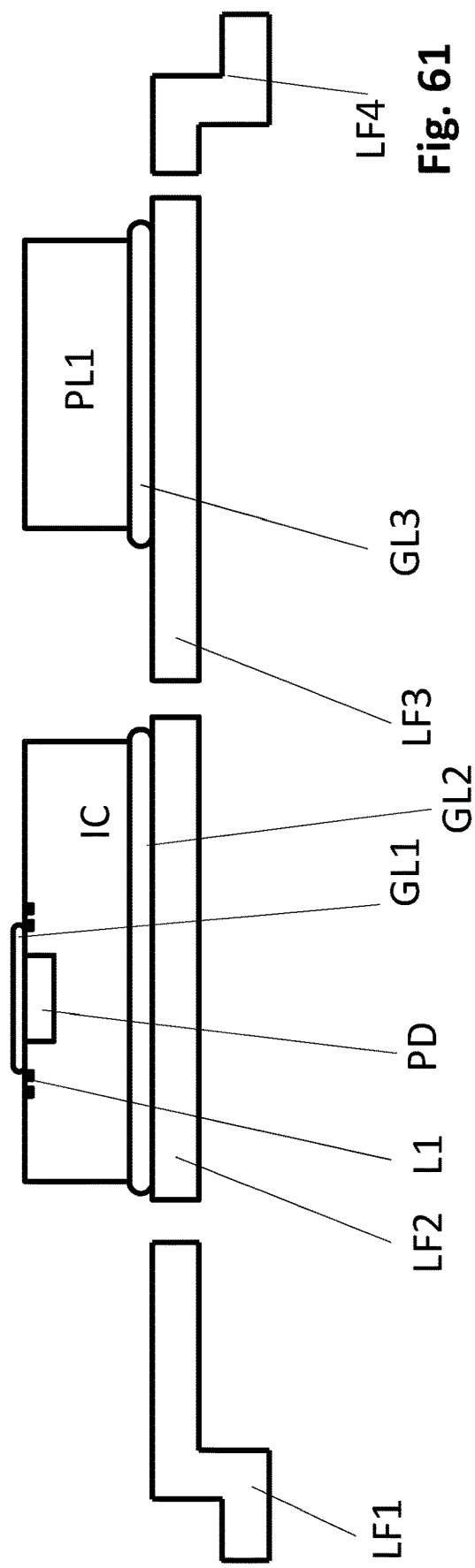

This step is necessary if the first filter (F1) is not already part of the integrated circuit (IC) and implemented, for example, as a metal-optical filter in the metallization stack of the integrated circuit and if the need for the first filter (F1) is not rendered obsolete by other measures, such as a measurement of the afterglow of the fluorescent radiation (FL) at times when the pump radiation (LB) is switched off and/or has decayed. In FIG. 61, a first adhesive (GL1) is applied to the surface of the integrated circuit (IC) in the region of the radiation receiver (PD1). The first adhesive (GL1) is preferably substantially transparent to fluorescent radiation (FL) from the paramagnetic centers (NV1) in the material of the sensing element. Instead of a first adhesive (GL1), other functionally equivalent attachment methods can of course be used for the first filter (F1) described below in FIG. 62.

FIG. 62

Figure 62:
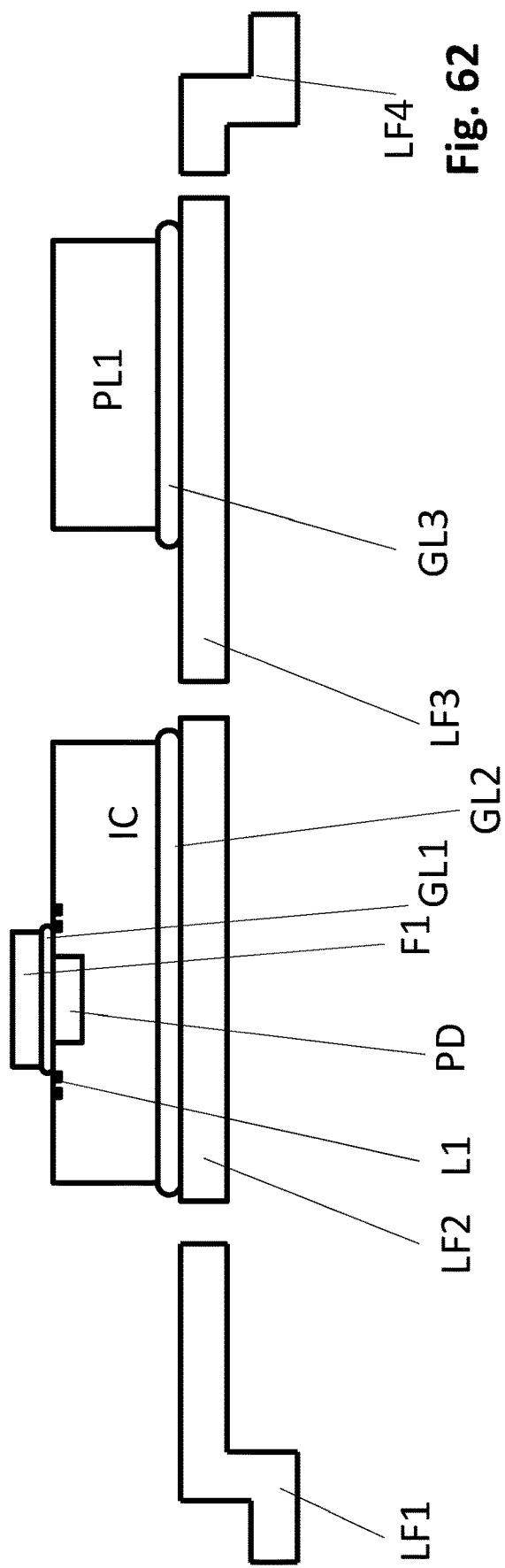

This step is necessary if the first filter (F1) is not already part of the integrated circuit (IC) and implemented, for example, as a metal-optical filter in the metallization stack of the integrated circuit and if the need for the first filter (F1) is not rendered obsolete by other measures, such as a measurement of the afterglow of the fluorescence radiation (FL) for a fluorescence phase shift time (ΔTFL) at times when the pump radiation (LB) is switched off and/or has decayed. In FIG. 62, the first filter (F1) is placed in the first adhesive (GL1). The first filter (F1) is preferably substantially transparent to radiation having the fluorescence radiation wavelength ($\lambda_{fl}$) of the fluorescence radiation (FL) of the paramagnetic centers (NV1) in the material of the sensor element. The first filter (F1) is preferably substantially non-transparent to radiation having the pump radiation wavelength ($\lambda_{pmp}$) of the pump radiation (LB) of the pump radiation source (PL1). The first filter (F1) and the first adhesive (GL1) may be omitted if the radiation receiver (PD1) is designed a priori to be substantially sensitive to radiation having the fluorescence radiation wavelength ($\lambda_{fl}$) of the fluorescence radiation (FL) of the paramagnetic centers (NV1) in the material of the sensor element, and not sensitive to radiation having the pump radiation wavelength ($\lambda_{pmp}$) of the pump radiation (LB) of the pump radiation source (PL1). In this respect, the common functionality of receiver (PD1), first adhesive (GL1) and first filter (F1) can also be considered as a radiation receiver (PD) substantially sensitive to radiation with the fluorescence radiation wavelength ($\lambda_{fl}$) of the fluorescence radiation (FL) of the paramagnetic centers (NV1) in the material of the sensor element and not sensitive to radiation with the pump radiation wavelength ($\lambda_{pmp}$) of the pump radiation (LB) of the pump radiation source (PL1).

FIG. 63

Figure 63:
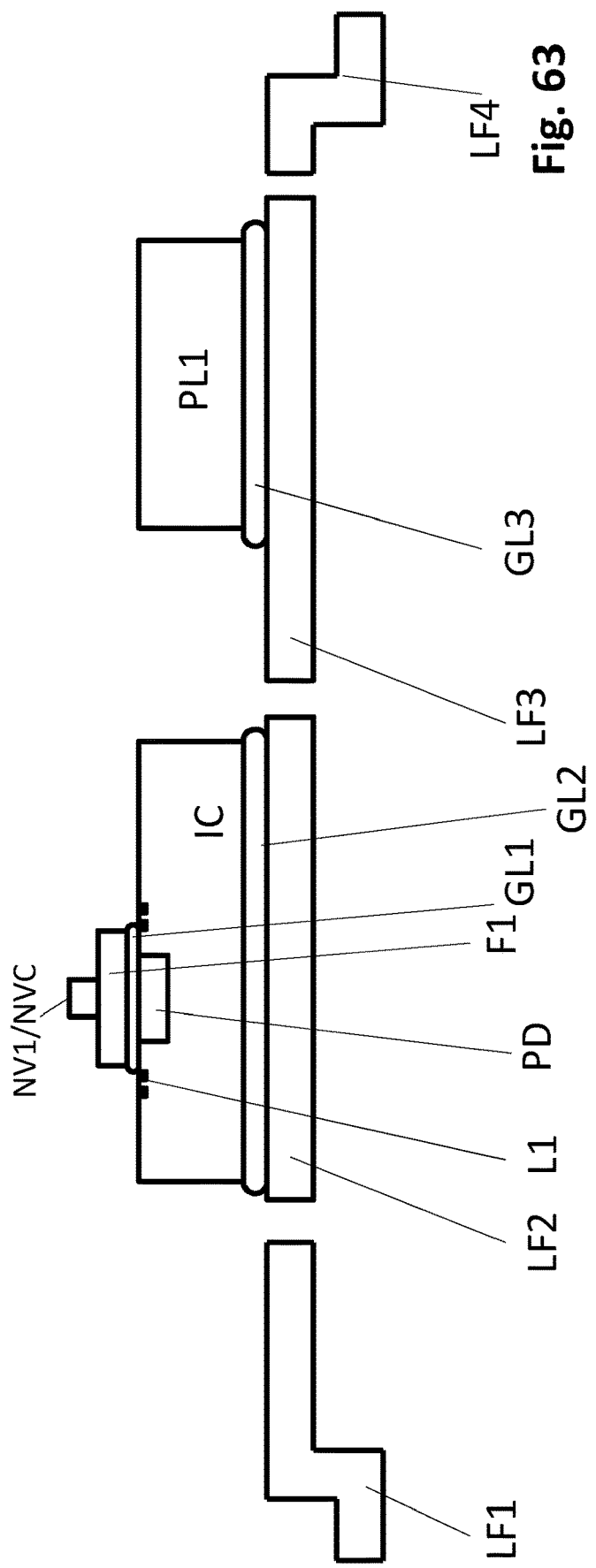

In FIG. 63, the sensor element with the paramagnetic center or centers (NV1) is placed on the first filter (F1). This step can also be performed together with the following step of FIG. 63. The sensor element comprises the paramagnetic center or centers (NV1) in the material of the sensor element.

FIG. 64

Figure 64:
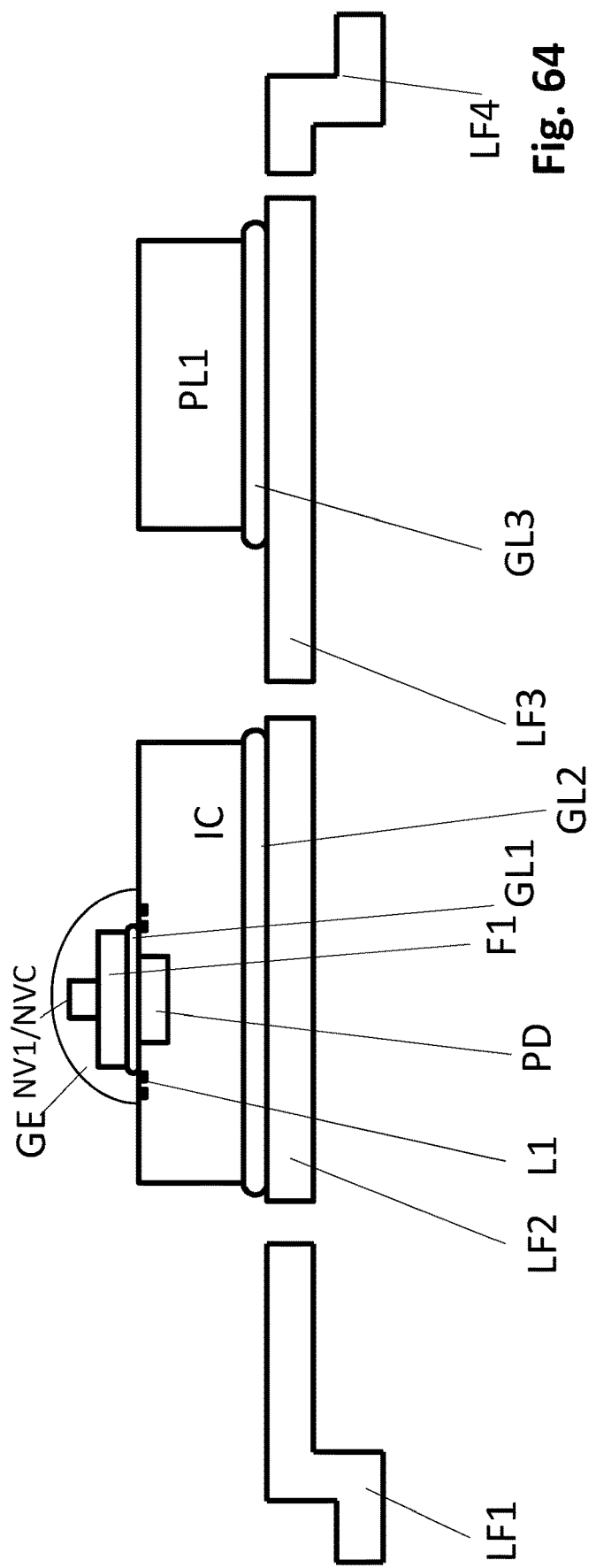

In FIG. 64, the attachment and fixing means (Ge) for fastening the sensor element with the paramagnetic centers (NV1) is introduced in the material of the sensor element on the first filter (F1). Preferably, the material is gelatin. Preferably, the gelatin is mixed with the sensor elements and applied together. In the disclosure provided herein, reference is hereby expressly made to DE 10 2019 114 032.3 and to PCT/DE 2020/100 430, unpublished at the time of filing, the disclosure content of which, in combination with the disclosure content of this writing, forms a full part of this disclosure to the extent permitted by the legal system of the country in which the nationalization of the international application writing provided herein is made.

FIG. 65

Figure 65:
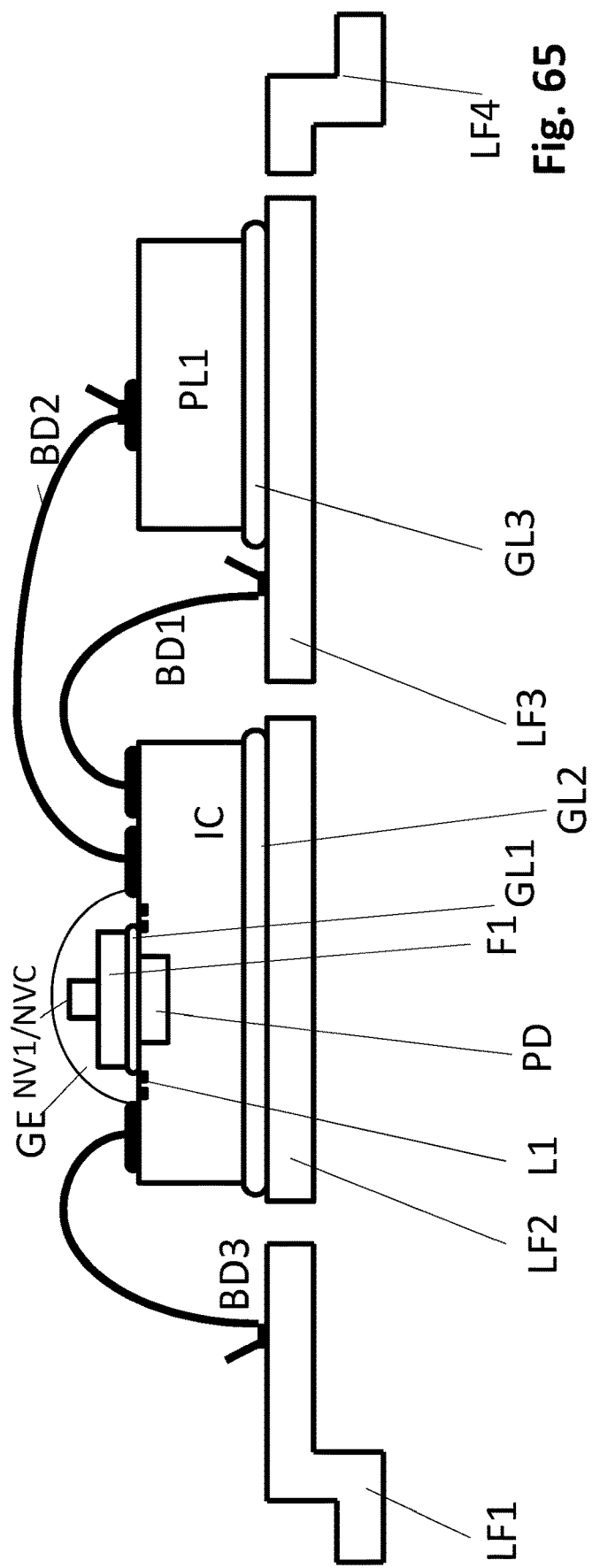

In FIG. 65, further electrical connections are made by bonding wires. Here the first bonding wire (BD1), the second bonding wire (BD2), the third bonding wire (BD3) are only examples.

FIG. 66

Figure 66:
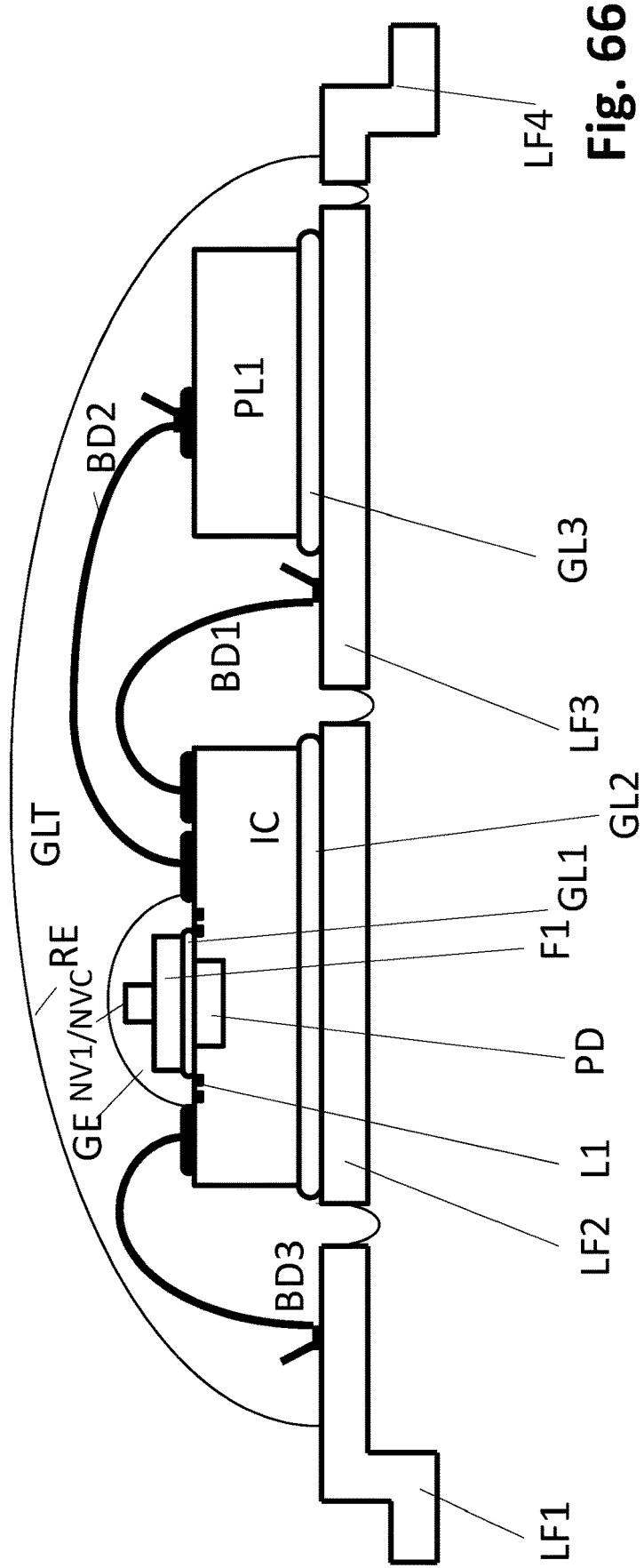

In FIG. 66, a transparent encapsulation aid (GLT) is applied to the sub-assembly manufactured to that extent. Preferably, care is taken to ensure that the surface of this encapsulation aid (GLT) assumes a predetermined quality and shape. Preferably, this is achieved by adjusting the surface tension. Preferably, the encapsulation aid (GLT) is transparent to radiation having the pump radiation wavelength ($\lambda_{pmp}$) of the pump radiation (LB) of the pump radiation source (PL1) and/or to radiation having the fluorescence wavelength ($\lambda_{fl}$) of the fluorescence radiation (FL) of the paramagnetic centers (NV1) of the sensor element.

FIG. 67

Figure 67:
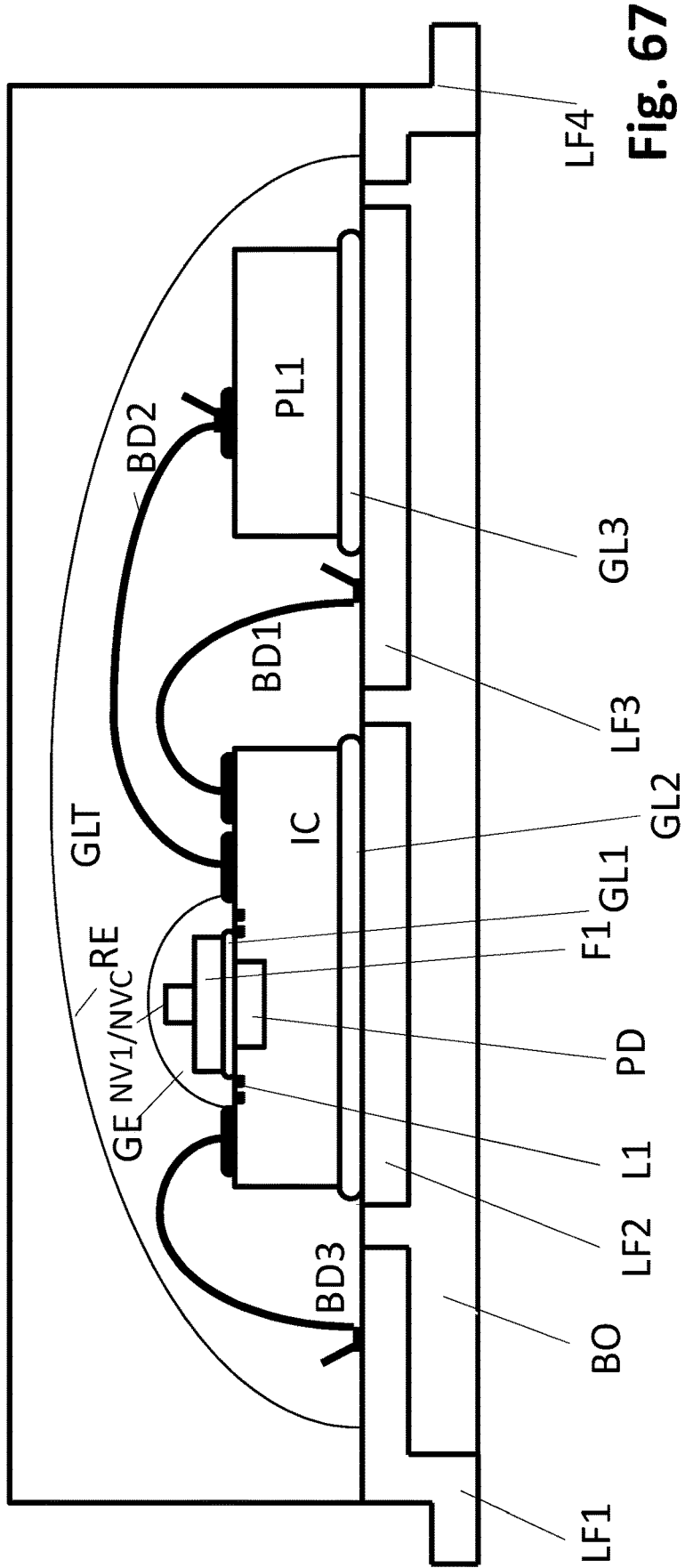
Figure 68:
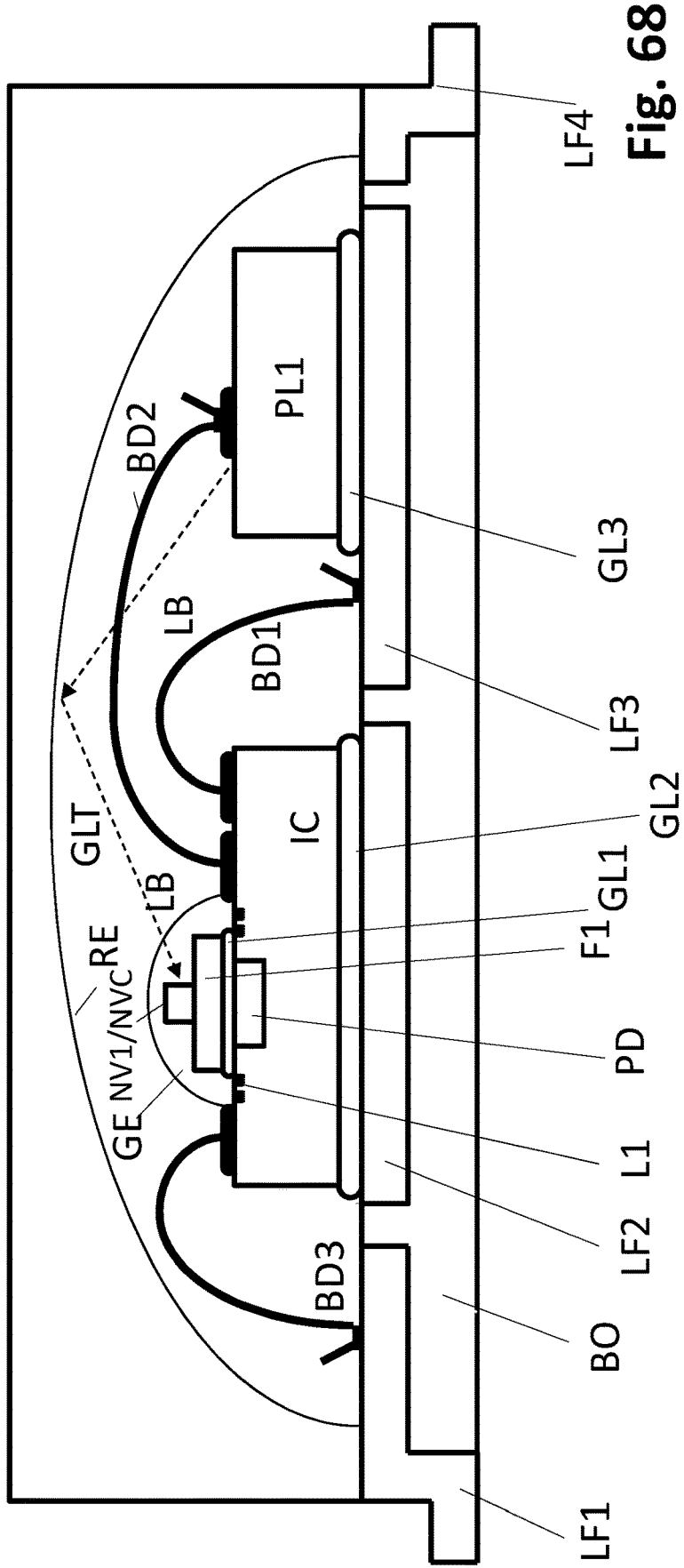

In FIG. 67, the previous partial construction of FIG. 66 is reshaped with an encapsulant, for example thermoset. The encapsulation aid (GLT) then automatically forms the reflector (RE) on the surface. If necessary, it is useful to coat the encapsulation aid (GLT) with an optically reflective layer using a shadow mask before overmoulding with the encapsulant.

FIG. 68

After curing of all substances and residual processing (e.g. deflashing), the system is ready for use. In one example, the pump radiation (LB) emitted by the pump radiation source (PL1) is preferably reflected or scattered at the interface between the encapsulation aid (GLT) and the encapsulant into the one or more paramagnetic centers (NV1) in the preferably diamagnetic material (MPZ) of a substrate (D) in the sensor element. Also, for example, the fluorescent radiation (FL) emitted by the paramagnetic center or centers (NV1) or the group or groups (NVC) of paramagnetic centers (NV1) may be preferentially mirrored or scattered into the radiation detector (PD) at the interface between the encapsulation aid (GLT) and the encapsulant. The interface thus represents, in terms of the present disclosure, an optical functional element that optionally connects the pump radiation source (PL1) of the pump radiation (LB) to the parametric center or centers (NV1) or the group or groups (NVC) of paramagnetic centers (NV1) of the sensing element and, optionally coupling the parametric center or centers (NV1) or the group or groups (NVC) of paramagnetic centers (NV1) to the radiation receiver (PD) by means of the fluorescent radiation (FL) emitted by the latter. This optical functional element can also be used, to couple the compensation radiation source (PLK) by means of the compensation radiation (KS) to the radiation receiver (PD) or to couple the compensation radiation source (PLK) by means of the compensation radiation (KS) to a reference element comprising one or more reference centers (NV2) and/or one or more groups (NVC2) of reference centers (NV2) and to couple the reference center (NV2) or the reference centers (NV2) and/or the group or groups (NVC2) of reference centers (NV2) to the radiation receiver (PD) by means of the compensating fluorescence radiation (KFL).

FIG. 69

FIG. 69 illustrates a further method of manufacturing a sensor system and/or quantum technology system. It comprises the steps providing (14) a lead frame with connectors and mounting (15) a pump radiation source (PL1) on the lead frame and mounting (16) an integrated circuit (IC) with a radiation receiver (PD) on the lead frame and electrically connecting (17) the integrated circuit (IC) and the terminals and the pump radiation source (PL1) and mounting (18) a sensor element and/or quantum technological device element having one or more paramagnetic centers (NV1) in the material of the sensor element and/or quantum technological device element, and attaching (19) the sensor element and/or quantum technological device element by means of an attachment and fixing means (Ge), and covering (20) the sub-assembly with a transparent encapsulation aid (GLT) and potting (21) of the sub-assembly with a potting compound.

The pump radiation source (PL1) is thereby provided to emit the pump radiation (LB). The one or more paramagnetic centers (NV1) in the material of the sensor element and/or quantum technological device element emits the fluorescence radiation (FL) when irradiated with this pump radiation (LB). The encapsulation aid (GLT) is preferably substantially transparent to the pump radiation (LB) and/or to the fluorescence radiation (FL).

The steps of mounting (18) a sensor element and/or quantum technological device element having one or more paramagnetic centers (NV1) in the material of the sensor element and/or quantum technological device element and fixing (19) the sensor element and/or quantum technological device element by means of an attachment and fixing means (Ge) are preferably carried out as one step.

FIG. 70

FIG. 70 shows an exemplary arrangement of several flat coils, as they are preferably used in the integrated circuit (IC) for generating magnetic fields with multipole moments and/or for modifying the direction of the magnetic flux B at the location of the paramagnetic center or centers (NV1) or the group or group (NVC) of paramagnetic centers (NV1), for example as a compensation coil (LC). The illustration shows in a simplified and schematic manner the exemplary arrangement of several coils in a top view. This exemplary combination of flat coils comprises a first coil (L1) designed as a flat coil. This is arranged symmetrically about the center point and therefore does not generate a multipole moment with respect to one or more paramagnetic centers (NV1) and/or one or more groups (NVC) of paramagnetic centers (NVC), the paramagnetic centers (NV1) preferably being NV centers in diamond. In contrast, three pairs of flat coils ([L2, L5], [L3, L6], [L4, L7]) are arranged symmetrically around the center with the paramagnetic center (NV1) in this example as an example. Instead of three pairs, other numbers of pairs can also be used instead of 3, as in this example.

A second flat coil (L2) forms a first coil pair with a fifth flat coil (L5). Preferably, the second flat coil (L2) has the same amount of current flowing through it as the fifth flat coil (L5). Preferably, the signs of the currents in these two coils are different, so that the direction of the magnetic flux B changes at the location of the one or more paramagnetic centers (NV1) and/or the group or groups (NVC) of paramagnetic centers (NV1).

A third flat coil (L3) forms a second coil pair with a sixth flat coil (L6). Preferably, the third flat coil (L3) has the same amount of current flowing through it as the sixth flat coil (L6). Preferably, the signs of the currents in these two coils are different, so that the direction of the magnetic flux B changes at the location of the paramagnetic center or centers (NV1) and/or the group or groups (NVC) of paramagnetic centers (NV1).

A fourth flat coil (L4) forms a third coil pair with a seventh flat coil (L7). Preferably, the fourth flat coil (L4) has the same amount of current flowing through it as the seventh flat coil (L7). Preferably, the signs of the currents in these two coils are different, so that the direction of the magnetic flux B changes at the location of the paramagnetic center or centers (NV1) and/or the group or groups (NVC) of paramagnetic centers (NV1).

FIG. 70a shows the coil arrangement without sensor element with one or more paramagnetic centers (NV1) and/or one or more groups (NVC) of paramagnetic centers (NV1).

FIG. 70b shows the coil arrangement with sensor element having one or more paramagnetic centers (NV1) and/or one or more groups (NVC) of paramagnetic centers (NV1).

This then results in a sensor system and/or quantum technological system, hereinafter also referred to only simplified as sensor system, in which the sensor system comprises a sensor element and/or quantum technological device element and in which the sensor system comprises one or more paramagnetic centers (NV1) or one group or more groups (NVC) of paramagnetic centers (NV1) in the preferably diamagnetic material (MPZ) of a substrate (D) of this sensor element and/or quantum technological device element. The sensor system again comprises a pump radiation source (PL1) for pump radiation (LB). The sensor system comprises a radiation receiver (PD1). The pump radiation (LB) has a pump radiation wavelength ($\lambda_{pmp}$), which is again preferably green in the case of NV centers as paramagnetic centers (NV1) and is preferably in a wavelength range from 500 nm to 600 nm, for example at 520 nm. The pump radiation (LB) causes the paramagnetic center(s) (NV1) or group(s) of paramagnetic centers (NV1) to emit fluorescence radiation (FL) having a fluorescence radiation wavelength ($\lambda_{fl}$) which is preferably in the case of NV centers in diamond as paramagnetic centers (NV1), red and is typically about 637 nm. The radiation receiver (PD) is again sensitive to radiation at a wavelength of the fluorescence radiation wavelength ($\lambda_{pmp}$)—e.g. 637 nm in the case of NV centers. The pump radiation source (PL1) generates the pump radiation (LB). The sensor system is configured such that the pump radiation (LB) is incident on the paramagnetic center (NV1). The sensor system is configured such that the fluorescence radiation (FL) from the paramagnetic center(s) (NV1) or group(s) (NVC) of paramagnetic centers (NV1) irradiates the radiation receiver (PD). The sensor system now further comprises means, in particular said coil arrangement (L1, L2, L3, L4, L5), suitable for causing a change in magnetic flux density B in amplitude and direction at the location of the paramagnetic center or centers (NV1) and/or the group or groups (NVC) of paramagnetic centers (NV1) in the manner. This change in magnetic flux density B in amplitude and direction at the location of the one or more paramagnetic centers (NV1) and/or the group or groups (NVC) of paramagnetic centers (NV1) then influences the intensity ($I_{fl}$) of the fluorescence radiation (FL) of the one or more paramagnetic centers (NV1) and/or the group or groups (NVC) of paramagnetic centers (NV1). For this purpose, an integrated circuit (IC) comprising a first coil (L1) and comprising at least one further pair of coils ([L2, L5], [L3, L6], [L4, L7]) and/or a further coil (L2, L3, L4, L5, L6, L7) is then preferably used. The first coil (L1) and/or the at least one further coil pair ([L2, L5], [L3, L6], [L4, L7]) and/or the further coil (L2, L3, L4, L5, L6, L7) are preferably implemented in the metallization stack of the integrated circuit (IC) or as part of the lead frame or a printed circuit in the vicinity of the package. In this context, the first coil (L1) and/or the at least one further pair of coils ([L2, L5], [L3, L6], [L4, L7]) and/or the further coil (L2, L3, L4, L5, L6, L7) are preferably suitable and provided for influencing, for example by means of the magnetic flux densities B generated by their respective coil current, the generation of fluorescence radiation (FL) of the paramagnetic center (NV1) in the center of the arrangement. Preferably, the coil arrangement surrounds a light-sensitive sub-device of the integrated circuit (IC), for example a radiation receiver (PD), so that the radiation can fall unhindered through the coil arrangement onto the light-sensitive component, the radiation receiver (PD).

FIG. 71

FIG. 71 shows a preferred exemplary example of an exemplary sensor element with diamagnetic material (MPZ) with in this example several groups (NVC) (English: clusters) each with one or more paramagnetic centers (NV1) and/or preferably with one or more groups (NVC) of paramagnetic centers (NV1), whereby preferably each group (NVC) of paramagnetic centers (NV1) and previously preferably each such group comprises a plurality of paramagnetic centers (NV1). The paramagnetic centers (NV1) of such a group (NVC) of paramagnetic centers (NV1) determine the center of gravity of such a group (NVC) of paramagnetic centers (NV1). Preferably, the sensing element comprises a first surface (OFL1) and a second surface (OFL2). For example, the sensing element may be a diamond plate having such a first surface (OF1) and such a second surface (OF2).

Preferably, the first surface (OFL1) and the second surface (OFL2) form an optical resonator. In the example of FIG. 71, the pump radiation (LB) of the pump radiation source (PL1) falls at an exemplary perpendicular angle to the first surface (OF1) as an angle of incidence ($\theta_e$) on this first surface (OF1) of the sensor element. Other angles are conceivable. Preferably, the angle of incidence $\theta_e$ between the surface perpendicular ($N_1$) of the first surface (OFL1) and the pointing vector of the pump radiation (LB) is chosen such that the intensity ($I_{pmp}$) of the pump radiation (LB) becomes maximum at at least one point within the sensor element. That is, the angle of incidence $\theta_e$ is preferably set such that a maximum pump radiation intensity ($I_{pmp}$) of the pump radiation (LB) enters the resonator comprising the first surface (OFL1) and the second surface (OFL2), or in other words the angle of incidence is $\theta_e$ preferably set such that a maximum pump radiation intensity of the pump radiation (LB) of the pump radiation source (PL1) enters a substrate (D) within the sensor element. For example, the first surface (OFL1) and the second surface (OFL2) may be two plane-parallel surfaces of the sensor element. The first surface (OFL1) and the second surface (OFL2) then form a Fabry-Perot resonator. Within the resonator, the intensity ($I_{pmp}$) of the pump radiation (LB) is not equal in magnitude everywhere, in particular as a result of constructive and destructive interference. Within the resonator, the pump radiation (LB) forms a standing wave that has bellies and nodes, i.e., sites of constructive and destructive interference. The intensity ($I_{pmp}$) of this standing wave is essentially zero at the nodes and maximum at the bellies. Preferably, the groups (NVC) of paramagnetic centers (NV1) are placed at the positions of these bellies, i.e. maxima of the magnitude constructive interference of the intensity ($I_{pmp}$) of the pumping radiation (LB) within a substrate (D) of the sensor element. Preferably, no paramagnetic centers (NV1) are placed at the nodes of the standing wave of the pump radiation (LB) within the resonator. This has the advantage that the contrast (KT) (see also FIG. 28), which does not depend linearly on the intensity ($I_{pmp}$) of the pump radiation (LB) and the density of the paramagnetic centers (NV1), is maximized, since preferably only in the regions of maximum intensity ($I_{pmp}$) of the pump radiation (LB) is there an increased density of the paramagnetic centers (NV1), while in the regions of low intensity ($I_{pmp}$) of the pump radiation (LB) there are preferably no or only a few paramagnetic centers (NV1). In the example of FIG. 71, 5 groups (NVC) of paramagnetic centers (NV1) are provided as an example, each having a distance from each other of $\lambda_{pmp}/2$ of the pump radiation wavelength ($\lambda_{pmp}$) in the direction of the pointing vector of the pump radiation (LB). This is because the maxima of the standing wave of the pump radiation (LB) within the resonator of first surface (OFL1) and second surface (OFL2) have a distance of $\lambda_{pmp}/2$ at a perpendicular incidence of the pump radiation (LB) with $\theta_e=0°$. Here, $\lambda_{pmp}$ is the pump radiation wavelength ($\lambda_{pmp}$) of the pump radiation (LB).

Preferably, the extension (d) of a group (NVC) of paramagnetic centers (NV1) perpendicular to the pointing vector of the incident pump radiation (LB) within a sensor element is such that all or substantially all paramagnetic centers (NV1) of such a group (NVC) of paramagnetic centers (NV1) receive a maximum intensity ($I_{pmp}$) of the pump radiation (LB). Preferably, therefore, this extent (d) of a group (NVC) of paramagnetic centers (NV1) perpendicular to the pointing vector of the incident pump radiation (LB) within a sensor element is less than $n*\lambda_{pmp}/2$ of the pump radiation wavelength ($\lambda_{pmp}$) with n as a positive integer. Preferably, $d<\lambda_{pmp}/2$ and/or better $d<\lambda_{pmp}/4$ and/or better $d<\lambda_{pmp}/10$ and/or better $d<\lambda_{pmp}/20$ and/or better $d<\lambda_{pmp}/40$ and/or better $d<\lambda_{pmp}/100$. Preferably, the centroid of the group (NVC) of paramagnetic centers (NV1) is then located as precisely as possible at the location of the maximum intensity ($I_{pmp}$) of the standing wave of the pump radiation (LB) within the sensor element. This has the advantage that the contrast (KT) (see FIG. 28) is maximized, since essentially only areas with a high density of paramagnetic centers (NV1), which are typically said groups (NVC) of paramagnetic centers (NV1), with areas of high intensity ($I_{pmp}$) of the standing wave of the pump radiation (LB) contribute to the fluorescence radiation (FL).

In the example of FIG. 71, the resonator is formed by the first surface (OFL1) of the sensing element and the second surface (OFL2) of the sensing element. Preferably, both the pump radiation (LB) and the fluorescence radiation (FL) form a Gaussian beam within the resonator. In this regard, we refer to J. R. Leger, D. Chen, G. Mowry, "Design and performance of diffractive optics for custom laser resonators", PPLIED OPTICS @Vol. 34, No. 14@ 10 May 1995, p. 2498-2509.

In the example of FIG. 71, the first surface (OFL1) of the sensor element has a front antireflection layer as a front matching layer (ASv) for matching the reflection properties of the first surface (OFL1) to the pump radiation wavelength ($\lambda_{pmp}$) of the pump radiation (LB) and the fluorescence radiation wavelength ($\lambda_{fl}$) of the fluorescence radiation (FL). The front-side matching layer (ASv) may be a vapor-deposited or otherwise deposited layer on the sensor element. However, a structuring of the first surface (OFL1) by ridges and grooves is also suitable as a front-side matching layer (ASv), so that an average refractive index of this front-side matching layer (ASv) results which deviates from the refractive index in the first medium (ME1) above the front-side matching layer (ASv) and from the refractive index in the second medium (ME2) below the front-side matching layer (ASv). By this microstructuring of the first surface (OFL1), the transmission and reflection properties of the first surface (OFL1) can be adjusted by means of diffractive optics such that the contrast (KT) of the intensities ($I_{fl}$) or intensities ($I_{fl}$) of the fluorescence radiation (FL) as a function of the magnetic flux density B at the location of the paramagnetic center (NV1) or centers (NV1) and/or of the group or groups (NVC) of paramagnetic centers and as a function of the intensity ($I_{pmp}$) of the pump radiation (LB) is or are maximized. Such diffractive optics means may include, but are not limited to: Lens mirrors, photonic crystals, gratings and sub-wavelength gratings, holograms, Fresnel lenses, prisms, resonators, Morié structures, lenses with a focal length dependent on the wavelength of the transmitted light, gratings and arrays of several such diffractive optics functional elements, coupling elements between the substrate (D) and a superimposed waveguide (LWL), for example for coupling out pump radiation (LB) from the waveguide (LWL) and for coupling this coupled-out pump radiation (LB) into the preferably diamagnetic material (MPZ) of a substrate (D) of the sensor element, and/or for coupling out the pump radiation (LB) into the substrate (D) of the sensor element. sensor element and/or for coupling out fluorescence radiation (FL) of one or more paramagnetic centers (NV1) and/or one or more groups (NVC) of paramagnetic centers (NV1) from the preferably diamagnetic material (MPZ) of a substrate (D) of the sensor element into the waveguide (LWL). Reference is made to the writings B. Kress, P. Meyrueis, "Digital Diffractive Optics" J. Wiley & Sons, London, 2000 and B. Kress, P. Meyrueis, "Applied Digital Diffractive Optics", J. Wiley & Sons, London, 2009 are referred to in this context.

In the example of FIG. 71, grooves with a width (NBR) of these grooves and bars with a width (SBR) of these bars are used for this microstructuring. Preferably, the width (NBR) of these grooves is smaller than a pump radiation wavelength ($\lambda_{pmp}$) and/or more preferably smaller than a half pump radiation wavelength ($\lambda_{pmp}$) and/or even more preferably smaller than a quarter pump radiation wavelength ($\lambda_{pmp}$). Preferably, the width (SBR) of these bars is smaller than a pump radiation wavelength ($\lambda_{pmp}$) and/or better smaller than a half pump radiation wavelength ($\lambda_{pmp}$) and/or even better smaller than a quarter pump radiation wavelength ($\lambda_{pmp}$).

In the example of FIG. 71, a backside matching layer (ASr) is provided on the second surface (OFL2) of the sensor element for matching the reflectance properties of the second surface (OFL2) to the pump radiation wavelength ($\lambda_{pmp}$) of the pump radiation (LB) and the fluorescence radiation wavelength ($\lambda_{fl}$) of the fluorescence radiation (FL). The backside matching layer (ASr) may be a vapor-deposited or otherwise deposited layer on the sensor element. However, as in the case of the front-side matching layer (ASv), a structuring of the second surface (OFL2) by means of bars and grooves is also suitable as a rear-side matching layer (ASr), so that an average refractive index of this rear-side matching layer (ASr) results which differs from the refractive index in the second medium (ME2) above the rear-side matching layer (ASr) and from the refractive index in the third medium (ME3) below the rear-side matching layer (ASr). By this microstructuring of the second surface (OFL2), the reflection properties of the second surface (OFL2) can be adjusted to maximize the contrast (KT) of the intensity ($I_{fl}$) of the fluorescence radiation (FL) as a function of the magnetic flux density B at the location of the paramagnetic centers (NV1) and as a function of the intensity ($I_{pmp}$) of the pump radiation (LB). In the example of FIG. 71, grooves with a width (NBR) of these grooves and bars with a width (SBR) of these bars are used for this microstructuring. Preferably, the width (NBR) of these grooves is smaller than a pump radiation wavelength ($\lambda_{pmp}$) and/or more preferably smaller than a half pump radiation wavelength ($\lambda_{pmp}$) and/or even more preferably smaller than a quarter pump radiation wavelength ($\lambda_{pmp}$) is used. Preferably, the width (SBR) of these bars is smaller than a pump radiation wavelength ($\lambda_{pmp}$) and/or better smaller than a half pump radiation wavelength ($\lambda_{pmp}$) and/or even better smaller than a quarter pump radiation wavelength ($\lambda_{pmp}$). What has been written about the front matching layer (ASv) with respect to the diffractive optics and the means thereof typically applies in a similar manner to the rear matching layer (ASr). The corresponding means of the diffractive optics can therefore again be, inter alia. be: Lenses, mirrors, photonic crystals, optical filters, gratings and sub-wavelength gratings, holograms, Fresnel lenses, prisms, resonators, Morié structures, lenses with a focal length dependent on the wavelength of the transmitted light, gratings and arrays of several such functional elements of diffractive optics, coupling elements between the substrate (D) and a superimposed waveguide (LWL), for example for coupling out pump radiation (LB) from the waveguide (LWL) and for coupling this coupled-out pump radiation (LB) into the preferably diamagnetic material (MPZ) of a substrate (D) of the sensor element, and/or for coupling out the pump radiation (LB) into the substrate (D) of the sensor element. sensor element and/or for coupling out fluorescence radiation (FL) of one or more paramagnetic centers (NV1) and/or one or more groups (NVC) of paramagnetic centers (NV1) from the preferably diamagnetic material (MPZ) of a substrate (D) of the sensor element into the waveguide (LWL). Reference is made to the writings B. Kress, P. Meyrueis, "Digital Diffractive Optics" J. Wiley & Sons, London, 2000 and B. Kress, P. Meyrueis, "Applied Digital Diffractive Optics", J. Wiley & Sons, London, 2009 are referred to in this context.

The reflectance properties of the front matching layer (ASv) typically differ from the reflectance properties of the back matching layer (ASr).

For example, it may be desired that the second surface (OFL2) reflects all pump radiation (LB) and that the first surface (OFL1) reflects back 95% of the pump radiation (LB) that strikes the first surface (OFL1) in the direction out of the sensor element.

Indeed, the fluorescence radiation (FL) has a fluorescence radiation wavelength ($\lambda_{fl}$) that typically differs from the pump radiation wavelength ($\lambda_{pmp}$) of the pump radiation (LB) and is typically longer wavelength. Therefore, in the example, it preferably emerges $\theta_2$ from the sensor element at a second angle. Therefore, the radiation receiver (PD) should preferably be placed in this direction.

Due to the different reflection properties of the first surface (OFL1) and the second surface (OFL2), different phase jumps typically occur at these surfaces. This is schematically indicated by the different distances between the group (NVC) of paramagnetic centers (NV1) closest to one of these two surfaces and the surface in question (OFL1, OFL2).

A simulation, for example an FDTD simulation, and careful calculations are carried out to determine the optimum arrangement of the groups (NVC) of paramagnetic centers (NV1) and to determine the optimum properties of the front matching layer (ASv) and the rear matching layer (ASr), the parameters of which are essentially determined by the application in question.

In the example of FIG. 71 it is assumed that the sensor element is attached to a holder (HA). If the second surface (OFL2) is designed to be totally reflective for the pump radiation (LB), there is no interaction between the holder (HA) and the pump radiation (LB). In the example of FIG. 71, the pump radiation (LB) is reflected back and forth several times between the first surface (OFL1) and the second surface (OFL2) before it leaves the sensor element via the first surface (OFL2) at an exit angle ($\theta_a$) with respect to the surface normal (N) of the first surface (OFL1) or is absorbed within the sensor element or is converted into fluorescence radiation (FL) within the sensor element by paramagnetic centers (NV1). Of course, it is conceivable to design the device in such a way that the exit of the fluorescence radiation (FL) occurs via the second surface (OFL2) instead of via the first surface (OFL1) at an exit angle ($\theta_a$) to the surface normal ($N_2$) of the second surface (OFL2), in which case the front matching layer (ASv) and the rear matching layer (ASr) must be designed differently.

The influence of interferometric structures is known from James L. Webb, Joshua D. Clement, Luca Troise, Sepehr Ahmadi, Gustav Juhl Johansen, Alexander Hucka and Ulrik L. Andersen, "Nanotesla sensitivity magnetic field sensing using a compact diamond nitrogen-vacancy magnetometer," Appl. Opt. Phys. Lett. 114, 231103 (2019), https://doi.org/10.1063/1.5095241 for the OFDM measurement of single NV centers with microwave. Such control with microwave signals is not known for groups of paramagnetic centers. In particular, this is not known for groups (NVC) of NV centers, which then also typically exhibit the features of HD-NV diamond used here. What is new here, in particular, is the use of regions of high density of paramagnetic centers (NV1), which are spatially limited and placed at predetermined locations in the sensor element, and the simultaneous use of microstructures for matching the jump of the electromagnetic characteristic impedance at the surfaces, as well as the direction-optimized coupling of the pump radiation (LB), which is irradiated with a pointing vector from the direction of an angle of incidence ($\theta_e$) with respect to the surface normal ($N_1$) to a surface (OFL1), and the possibly likewise direction-optimized decoupling of the fluorescence radiation (FL) corresponding to an exit angle ($\theta_a$) of the fluorescence radiation (FL) which leaves the substrate (D) within the sensor element with a pointing vector from the direction of an exit angle ($\theta_a$) with respect to the surface normal ($N_1$, $N_2$) to a surface (OFL1, OFL2). Preferably, methods of thin film technology and/or methods of diffractive optics are used in the fabrication of the matching layer. In this regard, we refer to the books B. Kress, P. Meyrueis, "Digital Diffractive Optics" J. Wiley & Sons, London, 2000 and B. Kress, P. Meyrueis, "Applied Digital Diffractive Optics", J. Wiley & Sons, London, 2009, the technical teachings of which, in combination with the technical teachings of this writing and the technical teachings of the cited writings, form an integral part of this disclosure to the extent permitted by the legal system of the country in which the nationalization of the international application writing provided herein is made. Thus, the structuring of the surfaces (OFL1, OFL2) need not be homogeneous. This structuring of the bar width (SBR) and/or groove width (NBR) and/or bar height or groove depth can be a function of the coordinate on the respective surface (OFL1, OFL2), whereby different surfaces (OFL1, OFL2) can be modulated differently. No structuring of a surface (OFL1, OFL2) is thereby also a form of modulation. It is proposed to bring about an increase in the intensity ($I_{pmp}$) of the pump radiation (FL) at the location or locations of the paramagnetic center (NV1) and/or the group (NVC) and/or the groups (NVC) of the paramagnetic centers (NV1) by this structuring. For example, it is conceivable to design the matching layers (ASv, ASr) as Fresnel lenses and/or arrays of Fresnel lenses, so that, for example, one or more paramagnetic centers (NV1) and/or one group (NVC) or more groups (NVC) of paramagnetic centers (NV1) are located in the focus of preferably each of these Fresnel lenses.

FIG. 72

In the example of FIG. 72, the paramagnetic centers (NV1) which generate the relevant fluorescence radiation (FL) are realized in the same material as the pump radiation source (PL1). From DE 4 322 830 A1, for example, a diode structure made of diamond is known in which H3 centers in diamond can be excited to glow in the green range. Such excitations are also known from B. Burchard "Elektronische und optoelektronische Bauelemente und Bauelementstrukturen auf Diamantbasis", dissertation, Hagen, Germany, October 1994. Such H3 centers as centers (PZ) within the preferably diamagnetic material (MPZ) of a substrate (D) within the sensor element can be used for the excitation of fluorescence radiation (FL) of one or more paramagnetic centers (NV1) and/or one or more groups (NVC) of paramagnetic centers (NV1), in which case the preferably diamagnetic material (MPZ) of the substrate (D), which is preferably common to these, within the sensor element is used as an optical functional element, in this case of an optical waveguide, for the optical coupling of the paramagnetic center(s) (NV1) and/or the group (NVC) or groups (NVC) of paramagnetic centers (NV1) with the center or centers (PZ) or the group or groups (PZC) of centers (PZ) for emission of the pump radiation (LB) as pump radiation sources (PL1).

It is also conceivable to directly influence and/or excite the paramagnetic centers by means of a current flow. Such a current flow can be caused by means of ohmic contacts, i.e. ohmic, or by means of electrodes capacitive or inductive.

Such a procedure then comprises the steps:

Generating an alternating component (S5w) of a transmission signal (S5) by a generator (G);

Generating a current flow in a sensor element with paramagnetic centers (NV1) as a function of the alternating component (S5w) of the transmission signal (S5) or a signal derived therefrom, in particular the transmission signal (S5);

Generating a fluorescence radiation (FL) as a function of the current flow and typically thus as a function of the alternating component (S5w) of the transmission signal (S5) or a signal derived therefrom, in particular the transmission signal (S5), and the magnetic flux density B and/or another physical parameter for example the pressure and/or the temperature, the modulation of the intensity ($I_{fl}$) of the fluorescence radiation (FL) depending on the modulation of the alternating component (S5w) of the transmission signal (S5) or a signal derived therefrom, in particular the transmission signal (S5) and the magnetic flux density B and/or the other physical parameter;

Detecting at least a part of said fluorescence radiation (FL) by a radiation receiver (PD) and generating a receiver output signal (S0) as a function of said fluorescence radiation (FL), said function preferably being a function of the intensity ($I_{fl}$) of the fluorescence radiation (FL).

Correlating the time course of the instantaneous values (s0) of the receiver output signal (S0) with the instantaneous values of a measurement signal (MES), the measurement signal (MES) preferably being the alternating component (S5w) of the transmission signal (S5) or a signal derived therefrom or a signal having a predetermined functional relationship therewith. For example, the functional relationship may be that it is a measurement signal (MES) that is phase shifted with respect to the alternating component (S5w) of the transmission signal (S5) and that this phase shift is adjusted by a control. Such an adjustment of the phase shift is known, for example, from WO 2017 148 772 A1.

In the example of FIG. 72, a first amplifier (V1) amplifies the receiver output signal (S0) to the reduced receiver output signal (S1). The amplifier (V1) may also be part of the radiation receiver (PD). A first multiplier (M1) multiplies the reduced receiver output signal (S1) by the alternating component (S5w) of the transmission signal (S5) to the filter input signal (S3). A loop filter (TP), which is preferably a low pass filter, filters the filter input signal (S3) to the filter output signal (S4), which in the example of FIG. 72 is the sensor output signal (out). Typically, the value of the sensor output signal (out) is then a measure of the value of the magnetic flux density B or another physical quantity which influences the intensity ($I_{fl}$) of the fluorescence radiation (FL) of the paramagnetic centers (NV1).

The first filter (F1) is only necessary if the paramagnetic centers (NV1) are not directly excited by the electric current flow in the sensor element, but via second optical centers. For example, in a diamond serving as a sensor element having NV centers as paramagnetic centers (NV1) and H3 centers as pump radiation sources (PL1), the electric current flow can cause the H3 centers to emit green pump radiation (LB) directly in the preferably diamagnetic material (MPZ) of a substrate (D) within the sensor element. The pump radiation (LB) from the H3 centers serving as pump radiation sources (PL1) impinges on the NV centers serving as paramagnetic centers (NV1), which emit fluorescence radiation (FL) as a function of the magnetic flux density B and possibly other physical parameters. This can then be further processed as described above. The material of the sensing element, in this example diamond, then serves as an optical waveguide and thus optical functional element that couples the pump radiation source (PL1), namely the H3 center in this example, with the one or more paramagnetic centers (NV1) and/or with the one or more groups (NVC) of paramagnetic centers (NV1), in this example with one or more NV centers (NV1) and/or with one or more groups (NVC) of paramagnetic centers (NV1).

FIG. 73

Figure 73:
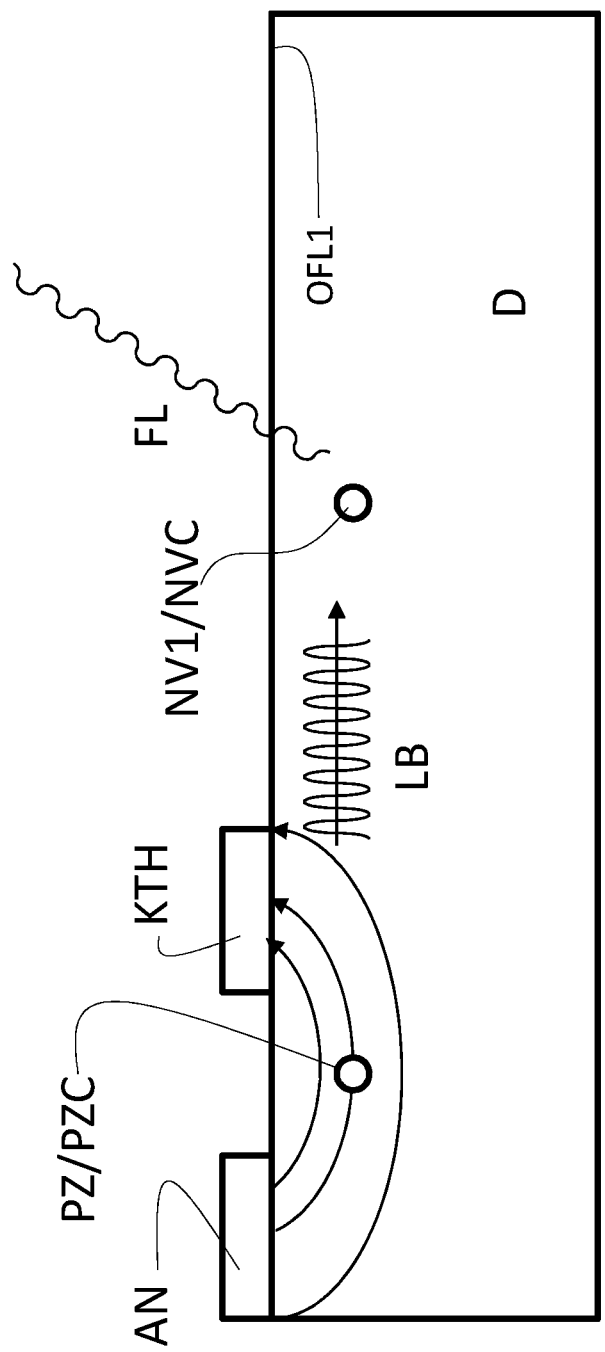
FIG. 73 shows a sensor element, for example for use in systems as in FIG. 72, in which the pump radiation source (PL1) is manufactured in the material of the sensor element.

In the example of FIG. 73, an anode contact (AN) injects an electric current into the diamagnetic material (MPZ) of the sensing element, such as a diamond. To B. Burchard "Elektronische und optoelektronische Bauelemente und Bauelementstrukturen auf Diamantbasis", Dissertation, Hagen 1994 is referred to in this context. A cathode contact (KTH) extracts this electric current again from the sensing element. A center (PZ) located in the current path within the sensor element, serves as a pump radiation source (PL1). For example, this center (PZ) may be H3 center in the exemplary diamond serving as the sensing element The center (PZ) in this example emits green pump radiation (LB) upon current flow in the sensing element, that is, upon current flow in the diamond from the anode contact (AN) to the cathode contact (KTH). This green pump radiation (LB) from the center (PZ), for example said H3 center, can then be used to excite one or more paramagnetic centers (NV1) and/or one or more groups (NVC) of paramagnetic centers (NV1), for example one or more NV centers and/or one or more groups of NV centers in the exemplary diamond, to emit fluorescent radiation (FL). Instead of a single center (PZ), a group (PZC) of centers (PZ) and/or groups (PZC) of centers (PZ) may be used. The centers (PZ) and/or the groups (PZC) of centers (PZ) may form a one- or two- or three-dimensional lattice within the substrate (D), which in turn may be the sensing element or may be part of the sensing element. In the case of a one-dimensional grid, the centers (PZ) may for example be arranged in a circular shape around a common center point, in which center point there is then preferably one or more paramagnetic centers (NV1) or one or more groups (NVC) of paramagnetic centers (NV1). Preferably, in one variant, the arrangement of the centers PZ or of the groups (PZC) of centers (PZ) together with the arrangement of the paramagnetic centers (NV1) and/or the arrangement of the groups (NVC) of paramagnetic centers (NV1) forms a one-two or three-dimensional lattice, the unit cell of the lattice then comprising one or more centers (PZ) and/or one or more groups (PZC) of centers (PZ), on the one hand, and one or more paramagnetic centers (NV1) and/or one or more groups (NVC) of paramagnetic centers. It may be a translational and/or rotational lattice around a common axis or point of symmetry.

Finally, it should be mentioned that the structure of FIG. 73 is suitable to interlace the center (PZ) with the paramagnetic center (NV1). If necessary, the optical path between the center (PZ) and the paramagnetic center (NV1) can be supplemented and, if necessary, modified with optical functional elements such as those already listed in this paper.

FIG. 74

In the course of elaborating the disclosure, it has been recognized that a compensation coil (LC), as for example drawn in FIG. 29, does not necessarily have to have a winding or an arc. Rather, it is the case that a lead may be fabricated, for example, as a microstructured lead (LH, LV), for example, on the first surface (OFL1) of the sensor element. The paramagnetic center (NV1) may be fabricated a few nm below the first surface (OFL1) of the sensor element. As a result, the paramagnetic center (NV1) may be located in the magnetic near field of the line (LH, LV). Preferably, the paramagnetic center(s) (NV1) or the group(s) (NVC) of paramagnetic centers (NV1) are located at a first distance (r) of less than 1 µm, preferably less than 500 nm, preferably less than 200 nm, preferably less than 100 nm, preferably less than 50 nm, preferably less than 20 nm from the exemplary horizontal line (LH). In the elaboration of the disclosure, it has been considered that the line (LH) is particularly preferably less than 50 nm away from the paramagnetic center(s) (NV1) or the group(s) (NVC) of paramagnetic centers (NV1). Due to this small distance, significant magnetic flux densities B can be generated at the location of the paramagnetic center (NV1) or the paramagnetic centers (NV1) or the group (NVC) or the groups (NVC) of paramagnetic centers (NV1) already with very low electric currents (IH) in the line (LH) in terms of magnitude, which influence them in addition to other possibly relevant physical parameters.

Figure 74:
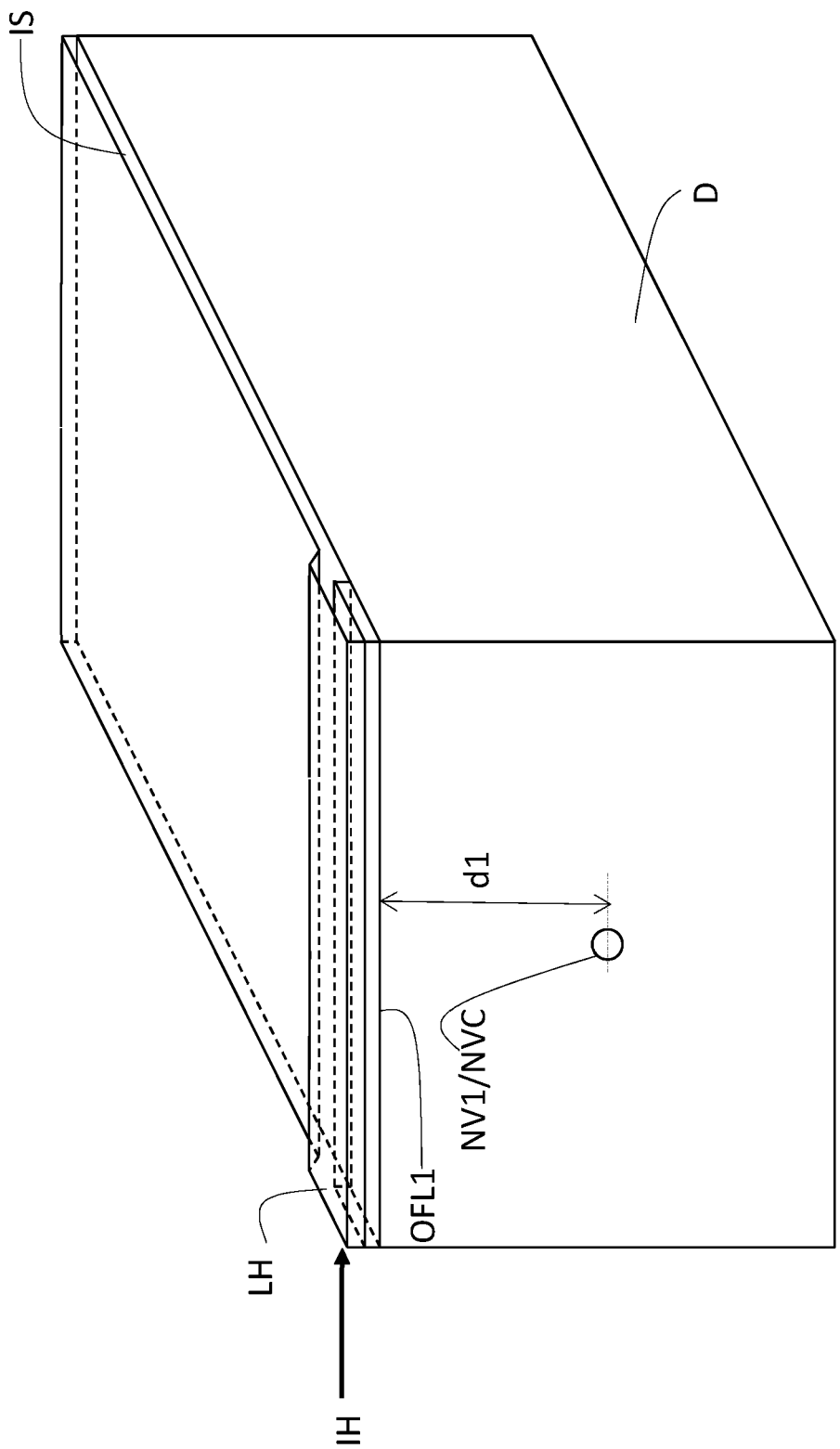
FIG. 74 shows a sensor element with a substrate (D), which in the case of NV centers as paramagnetic centers (NV1) is preferably diamond, with one or more paramagnetic centers (NV1) and/or one or more groups (NVC) of paramagnetic centers (NV1) in the substrate (D), the latter being connected to a lead (LH) which is mounted and fixed on the surface (OFL1) of the substrate (D) and which is preferably electrically insulated from the substrate (D), for example by insulation (IS) interact with the magnetic field of this line (LH) due to a very small first distance (d1), preferably less than 100 nm, when an electric current (IH) flows through the line (LH).

In the example of FIG. 74, a horizontal line (LH) is energized with a horizontal current (IH), the word horizontal being used here in this context to distinguish the current (LH) and the line (LH) from lines (LV) and currents (IV) introduced later. In FIG. 74, the horizontal line (LH) is preferably insulated from the substrate (D) of diamagnetic material (MPZ). Preferably, the paramagnetic center (NV1) or a group (NVC) of paramagnetic centers (NV1) is located directly under the horizontal line (LH) at a first distance ($d_a1$) below the surface (OFL1) of the substrate (D) of preferably diamagnetic material (MPZ)—for example diamond—in which the paramagnetic center (NV1) or the paramagnetic center (NV1) or the group (NVC) or groups (NVC) of paramagnetic centers (NV1) is located. In one example, the first distance ($d_a1$) is preferably chosen to be very small. Preferably, the first spacing ($d_a1$) is smaller than 1 µm, preferably smaller than 500 nm, preferably smaller than 250 nm, preferably smaller than 100 nm, preferably smaller than 50 nm, preferably smaller than 25 nm, optionally smaller than 10 nm. With decreasing distances ($d_a1$) to the surface (OF1L1) the influence of the surface states increases. It has therefore proved useful to keep distances ($d_a1$) smaller than 20 nm as far as possible and, if necessary, in particular in the case of diamonds as substrate (D), to raise the surface (DFL1) again by means of the deposition of an epitaxial layer after the production of the paramagnetic centers (NV1), so that the distance ($d_a1$) again exceeds such a substrate material-specific minimum distance ($d_a1$). The horizontal line (LH) is preferably fabricated on and attached to the surface (OFL1) of the substrate (D) and insulated from the substrate (D) in the manner shown in FIG. 74. In particular, modulations of the horizontal drive current (IH) can be used to manipulate the spin of the paramagnetic center (NV1) or the spins of paramagnetic centers (NV1) of the group (NVC) or groups (NVC) of paramagnetic centers (NV1). Preferably, the horizontal line (LH) is fixedly connected to the substrate (D) and typically forms a unit therewith. Preferably, the horizontal line (LH) is fabricated on the substrate (D) by electron beam lithography or similar high-resolution lithography methods if paramagnetic centers (NV1) located under different horizontal lines (LH) and/or different groups (NVC) of paramagnetic centers (NV1) located there are to couple with each other. If such coupling is not intended, less high-resolution lithography methods may be used. If electrostatic potentials are applied between the substrate (D) and this line (LH, LV) by a driving device (AH) of this line (LH), the optical properties and the fluorescence radiation (LB), in particular the intensity ($I_{fl}$) of the fluorescence radiation (FL) of the paramagnetic center (NV1) or paramagnetic centers (NV1) of the group (NVC) of paramagnetic centers (NV1) below the line (LH) in question can be manipulated and influenced. In this way, for example, when using NV centers in diamond as paramagnetic centers (NV1), individual NV centers can be forced to leave the fluorescent NV⁻ state and thus go dark by locally shifting the Fermi level. With the aid of this construction, it is thus possible, for example, in a one-dimensional lattice of paramagnetic centers (NV1) or in a one-dimensional lattice of groups (NVC) of paramagnetic centers (NV1), to determine the fluorescence radiation (LB) of individual paramagnetic centers (NV1) or the fluorescence radiation (LB) of individual groups (NVC) of paramagnetic centers (NV1) selectively by suitable adjustment of a line-specific electrical potential of the relevant horizontal line (LH) located above the individual paramagnetic center (NV1) or of the respective single group (NVC) of paramagnetic centers (NV1) on the surface of the substrate (D), and thus to achieve a line-like resolution by selective activation and deactivation of the fluorescence radiation (FL) of single paramagnetic centers (NV1) or groups (NVC) of paramagnetic centers (NV1), which permits, for example, the one-dimensional spatially resolved measurement of currents in integrated circuits. Thus, the intensity ($I_{fl}$) of individual paramagnetic centers (NV1) within a plurality of paramagnetic centers (NV1) and/or individual groups (NVC) of paramagnetic centers (NV1) within a plurality of groups (NVC) of paramagnetic centers (NV1) can be determined by means of a modulation of the line-specific electric potential of the relevant horizontal line (LH) located above the individual paramagnetic center (NV1) and/or of the respective single group (NVC) of paramagnetic centers (NV1) on the surface of the substrate (D), selectively with respect to other paramagnetic centers (NV1) and/or groups (NVC) of paramagnetic centers (NV1) in the same substrate (D). Indeed, the other paramagnetic centers (NV1) and/or groups (NVC) of paramagnetic centers (NV1) in the same substrate (D) then may not be modulated. Thus, we propose here a sensor system whose sensor element comprises a substrate (D) comprising one or more first means (LH), and one or more second means (AVH), in order to, for example by means of static potentials of the first means (LH) with respect to the potential of the sensor element (D), to influence the Fermi level at the location of individual paramagnetic centers (NV1) and/or a plurality of paramagnetic centers (NV1) and at the location of one or more groups (NVC) of paramagnetic centers (NV1) in such a way that these individual paramagnetic centers (NV1) and/or a plurality of paramagnetic centers (NV1) and one or more groups (NVC) of paramagnetic centers (NV1) are activated or deactivated, wherein activated at NV centers (NV1) and one or more groups (NVC) of paramagnetic centers (NV1) are activated or deactivated, respectively deactivated, wherein activated in the case of NV centers means that these preferably assume the NV⁻state and fluoresce—i.e. emit fluorescent radiation (FL) on irradiation with pump radiation (LB)—, and wherein deactivated means that these preferably assume a state different from the NV⁻ state or do not fluoresce—i.e.

do NOT emit fluorescent radiation (FL) on irradiation with pump radiation (LB). When the horizontal lines (LH) are arranged in a one-dimensional grid with a corresponding one-dimensional grid of paramagnetic centers (NV1) or of groups (NVC) of paramagnetic centers (NV1) located below them in the preferably diamagnetic material (MPZ) of the substrate (D), a line-by-line high-resolution imaging measurement of, for example, the magnetic flux density B with a resolution below the fluorescence radiation wavelength ($\lambda_{fl}$) of a few nm is thus possible, if individual paramagnetic centers (NV1) and/or groups (NVC) of paramagnetic centers are successively activated one after the other in time by means of selection of the suitable potentials of the horizontal lines (LH) relative to the potential of the substrate (D) and then deactivated again after the magnetic flux density B has been determined, so that the fluorescence radiation (FL) always originates only preferably from a few, preferably only exactly one activated paramagnetic center (NV1) and/or a few groups, preferably only exactly one group (NVC) of activated paramagnetic centers (NV1), so that each of the locations of the paramagnetic centers (NV1) and/or the location of the groups (NVC) of paramagnetic centers after activation, measurement of the magnetic flux density B and deactivation of all the paramagnetic centers (NV1) or groups (NVC) of paramagnetic centers (NV1) has for each of these locations a measured value based on a detected value of the detected fluorescence radiation (FL) at the time of activation of the paramagnetic center or centers (NV1) and/or the group or groups (NVC) of paramagnetic centers of this location. These measured values can then be displayed as an image, for example by means of a computer system (µC). Preferably, the horizontal line (LH) is made of an optically transparent material for this purpose, for example indium tin oxide (English abbreviation: ITO). From the paper Marcel Manheller, Stefan Trellenkamp, Rainer Waser, Silvia Karthäuser, "Reliable fabrication of 3 nm gaps between nanoelectrodes by electron-beam lithography", Nanotechnology, Vol. 23, No. 12, March 2012, DOI: 10.1088/0957-4484/23/12/125302 it is known that the horizontal lines (LH) can be fabricated at a very small distance (e.g. 5 nm and smaller, e.g. 5 nm) from each other. From the paper J. Meijer, B. Burchard, M. Domhan, C. Wittmann, T. Gaebel, I. Popa, F. Jelezko, J. Wrachtrup, "Generation of single color centers by focused nitrogen implantation" Appl. Opt. Phys. Lett. 87, 261909 (2005); https://doi.org/10.1063/1.2103389 highly accurate placement of nitrogen atoms to generate NV centers is known. Measures to increase yields in the fabrication of the NV centers, e.g., sulfur implantation or n-doping of the substrate (D), are disclosed in the paper provided herein. In this respect, a precise, yield-safe placement of the paramagnetic centers (NV1) under the horizontal leads (LH) by means of focused ion implantation is possible without any problems. The locally high-resolution fabrication of the horizontal leads (LH) is possible by means of electron beam lithography. The placement can be done so close to each other that two adjacent paramagnetic centers (NV1), especially within a group (NVC) of paramagnetic centers (NV1) under different horizontal lines (LH1, LH2) can interact with each other and form a quantum register based on the coupling of the electron configurations, which can be controlled via the horizontal lines (LH) by means of microwave signals.

By targeted deterministic and/or focused ion implantation of possibly single or multiple impurity atoms into the material (MPZ) of the substrate (D) of the sensor element, a sufficiently coordinate-true fabrication of single or multiple paramagnetic centers (NV1) and/or one or multiple groups (NVC) of paramagnetic centers (NV1) is possible. Refer to the paper J. Meijer, B. Burchard, M. Domhan, C. Wittmann, T. Gaebel, I. Popa, F. Jelezko, J. Wrachtrup, "Generation of single color centers by focused nitrogen implantation" Appl. Opt. Phys. Lett. 87, 261909 (2005); https://doi.org/10.1063/1.2103389 is referenced here. When using a diamond as substrate (D), n-doping, for example with sulfur, can increase the yield of NV centers. Thus, accurate placement of paramagnetic centers (NV1) and/or groups (NVC) of paramagnetic centers (NV1) in a predictable manner spatially relative to the horizontal line (LH) is possible and thus feasible.

For example, the sensor element may be a diamond on the surface (OF1) of which said lines (LH) are deposited and wherein below the line (LH) there is a group (NVC) of NV centers with such a high density of NV centers below the line (LH) in the vicinity of the magnetic flux density B of the magnetic field generated by the current flow (IH, IV) in the two intersecting lines (LV, LH), that the region of this group of NV centers is to be regarded as a HD-NV diamond in the sense of this paper. That a placement of a group (NVC) of NV centers resp. paramagnetic centers (NV1) in the close range, i.e. particularly preferably closer than 50 nm, i.e. closer than 100 µm and/or better closer than 50 µm and/or better closer than 20 µm and/or better closer than 10 µm and/or better closer than 5 µm and/or better closer than 2 µm and/or better closer than 1 µm and/or better closer than 500 nm and/or better closer than 200 nm and/or better closer than 100 nm and/or better closer than 50 nm and/or better closer than 20 nm and/or better closer than 10 nm and/or better closer than 5 nm and/or better closer than 2 nm, of the magnetic field of a current-carrying conductor (LH), in particular a straight and/or linear conductor, is favorable, has been recognized in the course of the elaboration of the present disclosure. Preferably, the conductor (LH) is made of a material optically transparent at the pump radiation wavelength ($\lambda_{pmp}$) of the pump radiation (LB) and/or of a material optically transparent at the fluorescence radiation wavelength ($\lambda_{fl}$) of the fluorescence radiation (FL). For example, this material of the line (LH) may be indium tin oxide, abbreviated as ITO, or a similar material that is optically transparent and electrically non-conductive. For example, if microwaves are to be used after all, they can be fed in and used via this construction.

FIG. 75

Figure 75:
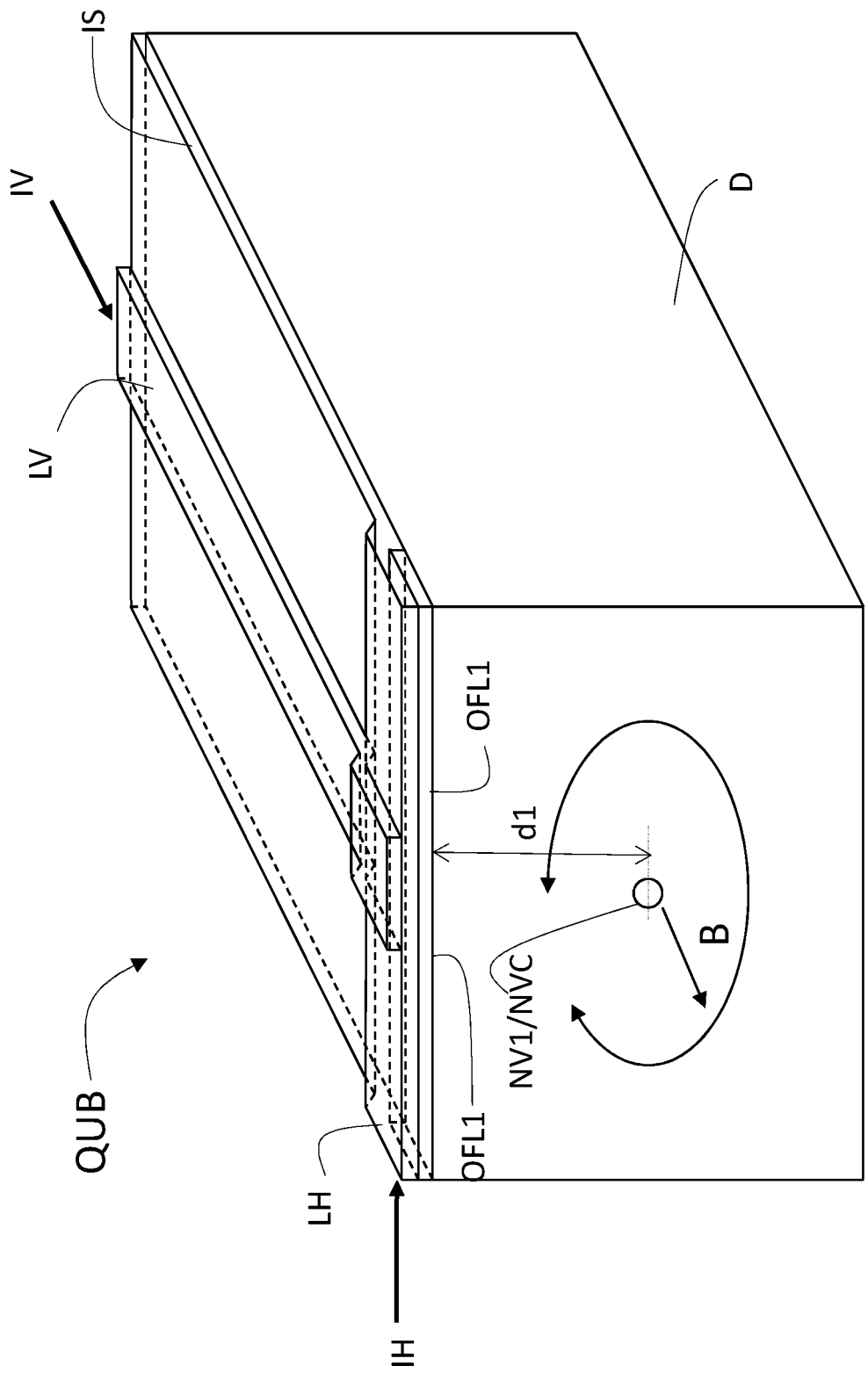
FIG. 75 shows a sensor element with a substrate (D), which in the case of NV centers as paramagnetic centers (NV1) is preferably diamond, with one or more paramagnetic centers (NV1) and/or one or more groups (NVC) of paramagnetic centers (NV1) in the substrate (D), the latter being provided with a horizontal line (LH) which is mounted and fixed on the surface (OFL1) of the substrate (D) and which is preferably electrically insulated from the substrate (D), for example by insulation (IS) and with a vertical line (LV) which is mounted and fixed on the surface (OFL1) of the substrate (D) and which is preferably electrically insulated from the substrate (D) and the vertical line (LV), for example by insulation (IS), interact with the magnetic field of said vertical line (LV) and/or of said horizontal line (LH) by virtue of a very small first spacing (d1), preferably less than 100 nm, when a horizontal electric current (IH) flows through said horizontal line (LH) and/or when a vertical electric current (IV) flows through said vertical line (LV).

In the example of FIG. 75, a horizontal line (LH) is energized with a horizontal current (IH) and a vertical line (LV) is energized with a vertical current (IV), the words horizontal and vertical being used here to distinguish the currents and lines. In FIG. 75, the vertical line (LV) and the horizontal line (LH) are insulated from each other by way of example and preferably from the substrate (D) of diamagnetic material (MPZ). The construction of FIG. 75 thus differs from the construction in Thiago P. Mayer Alegre, Antonio C. Torrezan de Souza, Gilberto Medeiros-Ribeiro, "Microstrip resonator for microwaves with controllable polarization", arXiv:0708.0777v2 [cond-mat.other] 11.10.2007. Preferably, the horizontal line (LH) and the vertical line intersect at a point on the surface (OFL1) of the sensing element, the horizontal line (LH) and the vertical line (LV) preferably being electrically insulated from each other by an insulator (IS). Preferably, the paramagnetic center (NV1) or a group (NVC) of paramagnetic centers (NV1) is located directly below the crossing point of the two lines (LH, LV) at a first distance ($d_a1$) below the surface (OFL1) of the substrate (D) of preferably diamagnetic material (MPZ)—for example diamond—in which the paramagnetic center (NV1) or the group (NVC) of paramagnetic centers (NV1) is located. In one example, the first distance ($d_a1$) is preferably chosen to be very small. Preferably, the first distance ($d_a1$) is smaller than 1 µm, preferably smaller than 500 nm, preferably smaller than 250 nm, preferably smaller than 100 nm, preferably smaller than 50 nm, preferably smaller than 25 nm, optionally smaller than 10 nm. With decreasing distances ($d_a1$) to the surface (OF1L1) the influence of the surface states increases. It has therefore proved useful to keep the distance ($d_a1$) as close as possible to 20 nm and, if necessary, especially in the case of diamonds as substrate (D), to raise the surface (DFL1) again by means of the deposition of an epitaxial layer after the production of the paramagnetic centers (NV1), so that the distance ($d_a1$) again exceeds such a substrate material-specific minimum distance ($d_a1$). The vertical lead (LV) and the horizontal lead (LH) are preferably fabricated on the surface (OFL1) of the substrate (D) in the manner shown in FIG. 75 and insulated from the substrate (D) and preferably from each other. Thus, the construction of FIG. 75 differs from the construction of the paper Thiago P. Mayer Alegre, Antonio C. Torrezan de Souza, Gilberto Medeiros-Ribeiro, "Microstrip resonator for microwaves with controllable polarization", arXiv:0708.0777v2 [cond-mat.other] 11.10.2007 in which a single cross-shaped conductor is used as microwave resonator. This design allows the direction of rotation of the magnetic field, and hence the electric flux density B, to be precisely controlled. In particular, phase modulations of the vertical drive current (IV) in the vertical line (LV) and of the horizontal drive current (IH) are possible for manipulating the spin of the paramagnetic center (NV1) and the spins of paramagnetic centers (NV1) of the group (NVC) of paramagnetic centers (NV1), respectively. Preferably, the vertical line (LV) and the horizontal line (LH) are fixedly connected to the substrate (D) and typically form a single unit. Preferably, the vertical line (LH) and/or the horizontal line (LH) are fabricated on the substrate (D) by electron beam lithography or similar high-resolution lithography methods if paramagnetic centers (NV1) located under different lines (LH, LV) and/or different groups (NVC) of paramagnetic centers (NV1) located there are to couple with each other. If such coupling is not intended, less high-resolution lithography methods may be used. If electrostatic potentials are applied between the substrate (D) and these leads (LH, LV) by a driving device (AH, AV) of these leads (LH, LV), the optical properties and fluorescence emission (LB) of the paramagnetic center (NV1) or paramagnetic centers (NV1) of the group (NVC) of paramagnetic centers (NV1) can be manipulated and influenced. In this way, for example, when using NV centers in diamond as paramagnetic centers (NV1), individual NV centers can be forced to leave the fluorescent NV$^-$ state and thus become dark by locally shifting the Fermi level. With the aid of this construction, it is thus possible, for example, in a one- or two-dimensional lattice of paramagnetic centers (NV1) or in a one- or two-dimensional lattice of groups (NVC) of paramagnetic centers (NV1), to determine the fluorescence radiation (LB) of individual paramagnetic centers (NV1) or the fluorescence radiation (LB) of individual groups (NVC) of paramagnetic centers (NV1) selectively by suitable adjustment of a line-specific electrical potential of the relevant horizontal line (LH) and/or the relevant vertical line (LV) which is located above the individual paramagnetic center (NV1) and/or of the respective single group (NVC) of paramagnetic centers (NV1) on the surface of the substrate (D), and thus to achieve a spatial resolution by selective activation and deactivation of the fluorescence radiation (FL) of single paramagnetic centers (NV1) or of groups (NVC) of paramagnetic centers (NV1), allowing, for example, the spatially resolved measurement of currents in integrated circuits. Thus, we propose here a sensor system whose sensor element comprises a substrate (D) having one or more first means (LH, LV), and one or more second means (AVH, AVV), in order to measure, e.g. by means of static potentials of the first means (LH, LV) with respect to the potential of the sensor element (D), to influence the Fermi level at the location of individual paramagnetic centers (NV1) and/or a plurality of paramagnetic centers (NV1) and at the location of one or more groups (NVC) of paramagnetic centers (NV1) in such a way that these individual paramagnetic centers (NV1) and/or a plurality of paramagnetic centers (NV1) and one or more groups (NVC) of paramagnetic centers (NV1) are activated or deactivated, wherein activated at NV centers (NV1) and one or more groups (NVC) of paramagnetic centers (NV1) are activated or deactivated at NV centers (NV1) and one or more groups (NVC) of paramagnetic centers (NV1) are activated or deactivated, respectively deactivated, wherein activated in the case of NV centers means that they preferably assume the NV$^-$-state and fluoresce, and wherein deactivated means that they preferably assume a state different from the NV$^-$-state or do not fluoresce. When the horizontal and vertical lines (LH, LV) are arranged in a one- or two-dimensional lattice with a corresponding one- or two-dimensional lattice of paramagnetic centers (NV1) or of groups (NVC) of paramagnetic centers (NV1) located below them in the material of the substrate (D), a high-resolution imaging measurement of, for example, the magnetic flux density B with a resolution below the fluorescence radiation wavelength ($\lambda_{fl}$) of a few nm thus becomes possible, if individual paramagnetic centers (NV1) and/or groups (NVC) of paramagnetic centers are successively activated one after the other in time by means of selection of the suitable potentials of the horizontal lines (LH) and/or vertical lines (LV) relative to the potential of the substrate (D) and then deactivated again after the magnetic flux density B has been determined, so that the fluorescence radiation (FL) always originates only preferably from a few, preferably only exactly one activated paramagnetic center (NV1) and/or a few groups, preferably only exactly one group (NVC) of activated paramagnetic centers (NV1), so that each of the locations of the paramagnetic centers (NV1) and/or the location of the groups (NVC) of paramagnetic centers after activation, measurement us of the magnetic flux density B and deactivation of all the paramagnetic centers (NV1) or groups (NVC) of paramagnetic centers (NV1) for each of these locations has a measured value based on a detected value of the detected fluorescence radiation (FL) at the time of activation of the paramagnetic center or centers (NV1) and/or the group or groups (NVC) of paramagnetic centers of this location. These measured values can then be displayed as an image, for example by means of a computer system. Preferably, the vertical line (LV) and/or the horizontal line (LH) are made of an optically transparent material for this purpose, for example indium tin oxide (English abbreviation: ITO). From the paper Marcel Manheller, Stefan Trellenkamp, Rainer Waser, Silvia Karthäuser, "Reliable fabrication of 3 nm gaps between nanoelectrodes by electron-beam lithography", Nanotechnology, Vol. 23, No. 12, March 2012, DOI: 10.1088/0957-4484/23/12/125302, it is known that the vertical leads (LV) and the horizontal leads (LH) can be fabricated at very small gaps (e.g. 5 nm and smaller, e.g. 5 nm) between them. From the paper J. Meijer, B. Burchard, M. Domhan, C. Wittmann, T. Gaebel, I. Popa, F. Jelezko, J. Wrachtrup, "Generation of single color centers by focused nitrogen implantation" Appl. Opt. Phys. Lett. 87, 261909 (2005); https://doi.org/10.1063/1.2103389 highly accurate placement of nitrogen atoms to generate NV centers is known. Measures to increase the yield, e.g., sulfur implantation or n-doping of the substrate (D), are mentioned in the paper provided herein. In this respect, precise placement of the paramagnetic centers (NV1) under the crossing points of the leads (LV, LH) using focused ion implantation is possible without problems. The local high-resolution fabrication of the leads (LH, LV) is possible by electron beam lithography. The placement can be done so close to each other that two adjacent paramagnetic centers (NV1, NV2), especially within a group (NVC) of paramagnetic centers (NV1) under different crossing points of two vertical leads (LV) and one horizontal lead (LH1, LH2) or of a vertical line (LV) and two horizontal lines, and can form a quantum register based on the coupling of the electron configurations, which can be controlled via the lines (LH, LV) by means of microwave signals.

By targeted deterministic and/or focused ion implantation of possibly single or multiple impurity atoms into the material (MPZ) of the substrate (D) of the sensor element, a sufficiently coordinate-true fabrication of single or multiple paramagnetic centers (NV1) and/or one or multiple groups (NVC) of paramagnetic centers (NV1) is possible. Refer to the paper J. Meijer, B. Burchard, M. Domhan, C. Wittmann, T. Gaebel, I. Popa, F. Jelezko, J. Wrachtrup, "Generation of single color centers by focused nitrogen implantation" Appl. Opt. Phys. Lett. 87, 261909 (2005); https://doi.org/10.1063/1.2103389 is referenced here. When using a diamond as substrate (D), n-doping, for example with sulfur, can increase the yield of NV centers. Thus, accurate placement of paramagnetic centers (NV1) and/or groups (NVC) of paramagnetic centers (NV1) in a predictable manner spatially relative to the leads (LH, LV) is possible and thus feasible.

For example, the sensing element may be a diamond on the surface (OF1) of which said lines (LV, LH) are deposited and wherein below the crossing point of the lines (LH, LV), a group (NVC) of NV centers is located in such a high density below the crossing point of the two lines in the downstream region of the magnetic flux density B of the magnetic field generated by the current flow (IH, IV) in the two crossing lines (LV, LH) that the region of this group of NV centers is to be regarded as a HD-NV diamond within the meaning of this paper. That a placement of a group (NVC) of NV centers resp. paramagnetic centers (NV1) in the close range, i.e. particularly preferably closer than 50 nm i.e. closer than 100 µm and/or better closer than 50 µm and/or better closer than 20 µm and/or better closer than 10 µm and/or better closer than 5 µm and/or better closer than 2 µm and/or better closer than 1 µm and/or better closer than 500 nm and/or better closer than 200 nm and/or better closer than 100 nm and/or better closer than 50 nm and/or better closer than 20 nm and/or better closer than 10 nm and/or better closer than 5 nm and/or better closer than 2 nm, of the magnetic field of one or more current-carrying, in particular straight and/or linear conductors (LH, LV) is favorable, has been recognized in the course of the elaboration of the present disclosure. Preferably, the conductors (LH, LV) are made of a material optically transparent at the pump radiation wavelength (LB) and/or of a material optically transparent at the fluorescence radiation wavelength ($\lambda_{fl}$) of the fluorescence radiation (FL). For example, this material of the leads (LV, LH) may be indium tin oxide, called ITO for short, or a similar material that is optically transparent and electrically non-conductive. If the horizontal current (IH) is modulated and the vertical current (IV) is modulated in the same way but out of phase with the horizontal current (IH), preferably +/−90° out of phase, the result in the example of FIG. 75 at the location of the paramagnetic center (NV1) or at the location of the group (NVC) of the paramagnetic centers (NV1) or at the location of the groups (NVC) of paramagnetic centers (NV1), a rotating magnetic flux density B which, depending on the frequency of the electric currents (IH, IV), can strike resonances of the paramagnetic center (NV1) or the group (NVC) of paramagnetic centers (NV1) and make them accessible to NMR analysis. For example, if microwaves are to be used after all, they can be fed in and used via this construction.

FIG. 76

Figure 76:
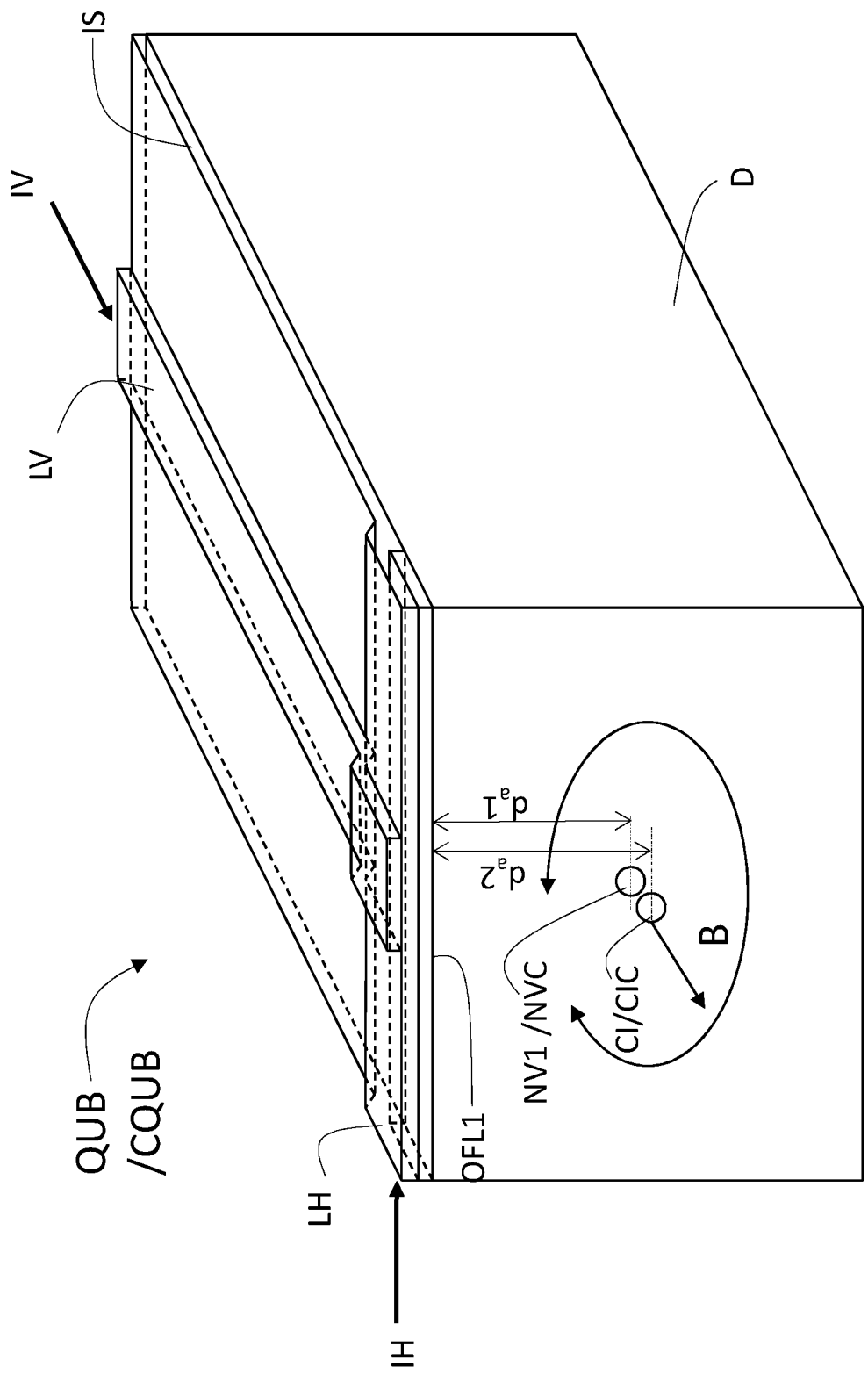
FIG. 76 shows a sensor element with a substrate (D), which in the case of NV centers as paramagnetic centers (NV1) is preferably diamond, with one or more paramagnetic centers (NV1) or one or more groups (NVC) of paramagnetic centers (NV1) in the substrate (D) and simultaneously with one or more nuclear centers (CI) or one or more groups (CIC) of nuclear centers (CI) in the substrate (D), these two being connected to a horizontal line (LH) which is placed and fixed on the surface (OFL1) of the substrate (D) and which is preferably electrically insulated from the substrate (D), for example by an insulation (IS) and with a vertical line (LV) which is mounted and fixed on the surface (OFL1) of the substrate (D) and which is preferably electrically insulated from the substrate (D) and the vertical line (LV), for example by insulation (IS), interact with the magnetic field of said vertical line (LV) and/or of said horizontal line (LH) by virtue of a very small first spacing (d1), preferably less than 100 nm, when a horizontal electric current (IH) flows through said horizontal line (LH) and/or when a vertical electric current (IV) flows through said vertical line (LV).

FIG. 76 corresponds largely to FIG. 75 with the difference that now additionally in the vicinity of the paramagnetic center or centers (NV1) or the group or groups (NVC) of paramagnetic centers (NV1) there are one or more atomic nuclei or one or more groups of atomic nuclei which have, for example, a nuclear spin which has, for example, a magnetic moment and which interact with the paramagnetic center or centers (NV1) or the one or more groups (NVC) of paramagnetic centers (NVC), while the remaining atoms of the material of a substrate (D) of the sensor element preferably have no nuclear spin. For example, the sensing element may be a diamond preferably made of the carbon isotope $C^{12}$ that has no magnetic moment and does not substantially interact with NV centers as paramagnetic centers (NV1). Thus, it is conceivable to make the sensor element isotopically pure, for example, by depositing an isotopically pure epitaxial layer, so that, in a first approximation, there is no interaction, or only an interaction that is insignificant for the intended purpose in a first approximation, between the majority atoms of a material of the substrate (D) of the sensor element and the one or more paramagnetic centers (NV1) or the one or more groups (NVC) of paramagnetic centers (NV1). Now, in the example of a sensor element in the form of a diamond of $^{12}C$ carbon isotopes, individual and/or multiple nuclear centers (CI) and/or one or more groups (CIC) of nuclear centers (CI) can be generated with a nuclear spin by replacing individual ones of the $^{12}C$ carbon isotopes of the atoms of the sensor material of the exemplary diamond with $^{13}C$ carbon isotopes. These $^{13}C$ carbon isotopes can be precisely placed in a localized manner using focused ion implantation. In J. Meijer, B. Burchard, M. Domhan, C. Wittmann, T. Gaebel, I. Popa, F. Jelezko, J. Wrachtrup, "Generation of single color centers by focused nitrogen implantation" Appl. Opt. Phys. Lett. 87, 261909 (2005); https://doi.org/10.1063/1.2103389 is referenced here. This technique can be used in a slightly modified way here. These $^{13}C$ carbon isotopes then form nuclear centers (CI) based on their nuclear spin in the diamond. These nuclear centers (CI) may also be single or multiple groups (CIC) of such nuclear centers (CI). The nuclear center (CI) or the nuclear centers (CI) or the group (CIC) of nuclear centers (CI) or the groups (CIC) of nuclear centers (CI) are located at a second distance ($d_a2$) below the surface (OFL1) of the substrate (D) of the sensing element and may be, as previously described for the paramagnetic center (NV1) or the paramagnetic centers (NV1) and the group or groups (NVC) of paramagnetic centers (NV1), respectively, described in the description of FIG. 75, in an analogous manner by means of the horizontal line (LH) and the vertical line (LV) and coupled to the paramagnetic centers (NV1). The control can also be carried out by means of only one of these lines (LH, LV) with a limited control possibility.

Here, different coupling frequencies are used for the coupling of the paramagnetic centers (NV1) with the nuclear centers (CI) than for the coupling of the paramagnetic centers (NV1) with each other.

In that case, the sensor output signal (out) may depend on the state of one or more nuclear centers (CI) and/or one or more groups (CIC) of nuclear centers (CI). This has the advantage that the nuclear centers (CI) each have a greater mass and respond differently to changes in magnetic flux B or other physical parameters that may be detectable at their location than the paramagnetic centers (NV1) this difference can be used, for example, to build accelerometers, sound sensors, gravimeters and possibly seismometers. For example, the reference paramagnetic center(s) (NV2) in FIG. 32 may be paramagnetic centers (NV1) unaffected by nuclear centers (CI), while the paramagnetic center(s) (NV1) or the group (NVC) or groups (NVC) of paramagnetic centers (NV1) in FIG. 32 may be one or more paramagnetic centers (NV1) or a group (NVC) or groups (NVC) of paramagnetic centers (NV1) influenced by a nuclear center (CI) or a plurality of nuclear centers (CI) or a group (CIC) of nuclear centers (CI) or a plurality of groups (CIC) of nuclear centers (CI). For example, the sensor element of FIG. 32 may be isotopically pure diamond of $^{12}C$-carbon isotopes in which the paramagnetic center (NV1) or the paramagnetic centers (NV1) or the group or groups (NVC) of paramagnetic centers (NV1) are manufactured in the form of NV centers, whereby in the area of influence, i.e. at a distance of a few nm from the paramagnetic center (NV1) or the paramagnetic centers (NVC), i.e. in our example NV centers, a nuclear center (CI) or nuclear centers (CI) or a group (CIC) or groups (CIC) of nuclear centers (CI) in the form of C $^{13}$carbon isotopes are present or placed. For example, the reference sensor element of FIG. 32 can also be an isotopically pure diamond of C $^{12}$carbon isotopes in which the paramagnetic reference center (NV2) and/or the paramagnetic reference centers (NV2) and/or the group or groups of paramagnetic reference centers (NV2) are also manufactured in the form of NV centers, but where now in the area of influence of this paramagnetic reference center (NV2) and/or these paramagnetic reference centers (NV2) or of the group or groups of paramagnetic reference centers (NV2), i.e. in our example NV centers or groups of NV centers, respectively, NO or essentially no nuclear center (CI) or no nuclear centers (CI) or groups (CIC) of nuclear centers (CI) in the form of a few $^{13}C$-carbon isotopes are present or placed, so that such nuclear centers (CI) or groups (CIC) of nuclear centers (CI) do not influence the fluorescence radiation (KFL) of the paramagnetic reference centers (NV2) for the purpose according to the application, or only in a tolerable manner. The placement of the isotopes forming the nuclear centers can be done by means of focused ion implantation of these isotopes, for example from the $^{13}C$-carbon atoms in diamond, analogous to the method of placing individual nitrogen atoms in the formation of NV centers. Refer to the paper J. Meijer, B. Burchard, M. Domhan, C. Wittmann, T. Gaebel, I. Popa, F. Jelezko, J. Wrachtrup, "Generation of single color centers by focused nitrogen implantation" Appl. Opt. Phys. Lett. 87, 261909 (2005); https://doi.org/10.1063/1.2103389 is referred to again in this context. This has the advantage that nuclear states, namely those of the nuclear center(s) (CI) or the group or groups (NVC) of NV centers as paramagnetic centers (NV1)—here in the example of the $^{13}C$ carbon atoms as nuclear centers (CI) in the transmission path in the vicinity of the paramagnetic center(s) (NV1) or the group or groups (NVC) of NV centers as paramagnetic centers (NV1) (see FIG. 32)—can now be measured by means of a simple circuit. In such an example, the device of FIG. 32 is characterized in that the sensor output signal (out) depends on states of the nuclear spin of atoms, namely that of the nuclear center (CI) or centers (CI) or of the group or groups of nuclear centers (CIC) which are located in the area of action of a paramagnetic center (NV1) or of the paramagnetic centers (NV1) or of the group or groups (NVC) of NV centers as paramagnetic centers (NV1).

FIG. 77

Irradiation with pump radiation (LB) produces photoelectrons in the electron configuration of the paramagnetic center(s) (NV1) or group(s) (NVC) of NV centers as paramagnetic centers (NV1), for example, of NV centers in diamond, which can be extracted. In this regard, reference should be made to Petr Siyushev, Milos Nesladek, Emilie Bourgeois, Michal Gulka, Jaroslav Hruby, Takashi Yamamoto, Michael Trupke, Tokuyuki Teraji, Junichi Isoya, Fedor Jelezko, "Photoelectrical imaging and coherent spin-state readout of single nitrogen-vacancy centers in diamond" Science 15 Feb. 2019, Vol. 363, Issue 6428, pp. 728-731, DOI: 10.1126/science.aav2789. These photoelectrons of the paramagnetic centers (NV1) are replenished upon continued irradiation with pump radiation (LB), generating a photocurrent that depends on the magnetic flux density B at the location of the paramagnetic center (NV1) and possibly other physical parameters.

Thus, from G. Balasubramanian, I. Y. Chan, R. Kolesov, M. Al-Hmoud, J. Tisler, C. Shin, C. Kim, A. Wojcik, P. R. Hemmer, A. Krueger, T. Hanke, A. Leitenstorfer, R. Bratsch-itsch, F. Jeletzko, J. Wrachtrup, "nanoscale imaging magnetometry with diamond spins under ambient conditions", Nature 455, 648 (2008) the locally high-resolution magnetic field measurement with NV centers is known. From G. Kucsko, P. C. Maurer, N. Y. Yao, M. Kubo, H. J. Noh, P. K. Lo, H. Park, M. D. Lukin, "Nanometre-scale thermometry in a living cell", Nature 500, 54-58 (2013) thermometry with NV centers is known. From F. Dole, H. Fedder, M. W. Doherty, T. Nobauer, F. Rempp, G. Balasubramanian, T. Wolf, F. Reinhard, L. C. L. Hollenberg, F. Jeletzko, J. Wrachtup, "Electric-field sensing using single diamond spins," Nat. Phs. 7, 459-463 (2011 the measurement of electric fields with NV centers is known. From A. Albrecht, A. Retzker, M. Plenio, "Nanodiamond interferometry meets quantum gravity" arXiv:1403.6038v1 [quant-ph] 24 Mar. 2014 the measurement of gravitational fields with NV centers is known. It follows immediately that there is thus the measurement of rotational motions and of accelerations with NV centers, as well as the possibility of constructing navigation systems with NV centers and paramagnetic centers (NV1). A prerequisite for such systems is the availability of diamonds with a high density of paramagnetic centers (NV1), that is, preferably the availability of HD-NV diamonds. Thus, the measurement of the magnetic flux density B, the electric field strength E, the acceleration g, the rotational speed $\omega_r$ and the temperature $\vartheta$ is known from the prior art and can be performed with the systems presented here.

For this purpose, for example, the device of FIG. 75 can be provided with contacts (KH, KV) which connect one or more leads (LH, LV) ohmically to the material of the sensor element, for example in the substrate (D), i.e. diamond, for example, and thus enable extraction. Thus, a use of this photocurrent instead of fluorescence radiation (FL) becomes possible. In this case, the value of this photocurrent depends on the intensity ($I_{pmp}$) of the pump radiation (LB) and the magnetic flux density B and possibly other physical parameters.

Figure 78:
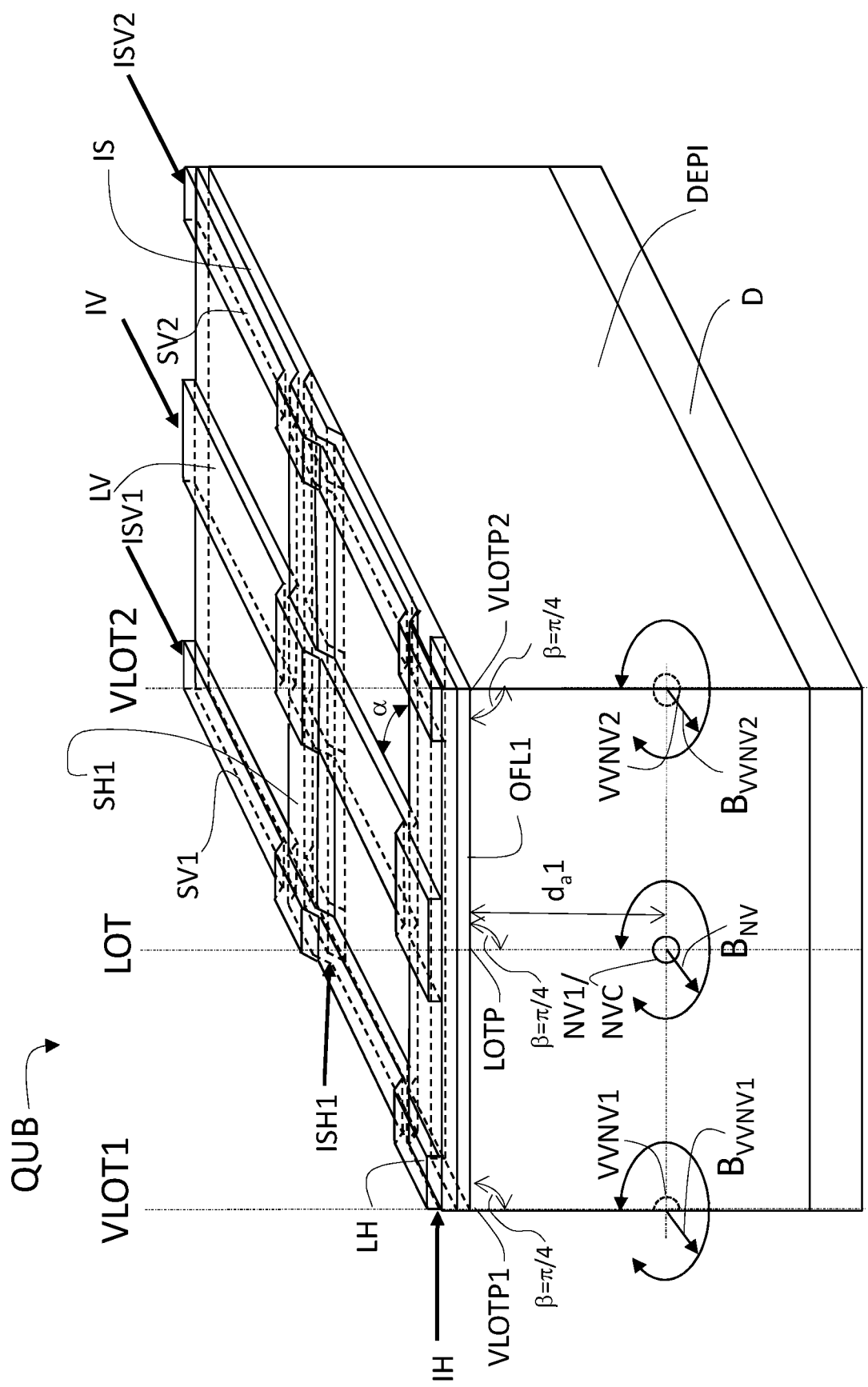
FIG. 78 illustrates an optimal current flow using the example of a quantum bit (QUB) with a first vertical shield line (SV1) and a second vertical shield line (SV2).
Figure 79:
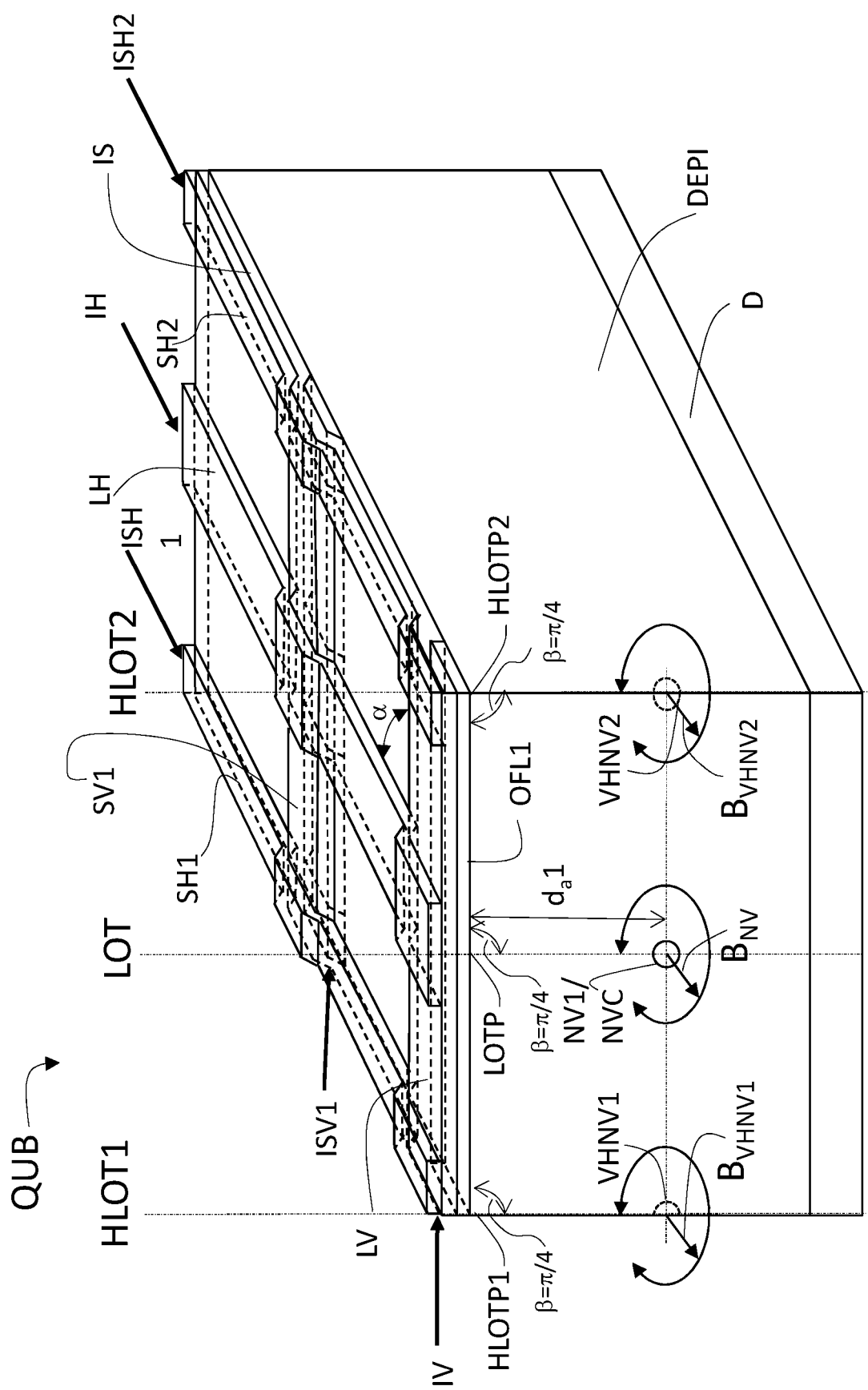
FIG. 79 illustrates an optimal current flow using the example of a quantum bit (QUB) with a first horizontal shield line (SH1) and a second horizontal shield line (SH2).

FIGS. 78 and 79

FIGS. 78 and 79 are used to illustrate an optimum current flow. FIG. 78 will be discussed first. The principle is illustrated using the example of a quantum bit (QUB) with a first vertical shield line (SV1) and a second vertical shield line (SV2). The drawing corresponds essentially to FIG. 76, with the addition of a first vertical shield line (SV1) and a second vertical shield line (SV2) and a first horizontal shield line (SH1). A second horizontal shield line (SH2) may be assumed to lie in front of the quantum dot in the region not shown by the section of the sectional view, in front of the sectional plane. Reference is made here to the following FIG. 79 showing a 90° rotated position of the section plane. Parallel to a first perpendicular line (LOT) through the quantum dot with the paramagnetic center (NV1) or the group or groups (NVC) of paramagnetic centers (NV1), a first further perpendicular line (VLOT1) and a second further perpendicular line (VLOT2) can be drawn through the respective crossing points of the corresponding vertical shielding lines (SV1, SV2) with the horizontal line (LH). A first virtual vertical quantum dot (VVNV1) and a second virtual vertical quantum dot (VVNV2) can then be defined at the distance ($d_a1$) of the quantum dot with the paramagnetic center (NV1) or group or groups (NVC) of paramagnetic centers (NV1) from the surface (OFL1). The first vertical electric shielding current (ISV1) through the first vertical shielding line (SV1) and the second vertical electric shielding current (ISV2) through the second vertical shielding line (SV2) and the first horizontal electric shielding current (ISH1) through the first horizontal shielding line (SH1) and the second horizontal electrical shielding current (ISH2) through the second horizontal shielding line (SH2), which is not drawn in, as well as the horizontal current (IH) through the horizontal line (IH) and the vertical current (IV) through the vertical line, together give six parameters which can be freely selected. Now, the flux density ($B_N v$) of a circularly polarized electromagnetic wave field for manipulating the quantum dot having the paramagnetic center (NV1) or the group or groups (NVC) of paramagnetic centers (NV1) at the location of the quantum dot having the paramagnetic center (NV1) or the group or groups (NVC) of paramagnetic centers (NV1) can be specified and required, that the first virtual horizontal magnetic flux density ($B_{VHNV1}$) at the location of the first virtual horizontal quantum dot (VHNV1) and the second virtual horizontal magnetic flux density ($B_{VHNV2}$) at the location of the second virtual horizontal quantum dot (VHNV2) and the first virtual vertical magnetic flux density ($B_{VVNV}$) at the location of the first virtual vertical quantum dot (VVNV1) and the second virtual vertical magnetic flux density ($B_{VVNV2}$) at the location of the second virtual vertical quantum dot (VVNV2) disappear. The first virtual horizontal quantum dot (VHNV1) and the second virtual horizontal quantum dot (VHNV2) are not drawn in the figure because the figure represents a cross-section and for visibility the sectional plane must be rotated 90° about the LOT axis. FIG. 79 represents this section. FIG. 79 illustrates an optimal current flow using the example of a quantum bit (QUB) with a first horizontal shield line (SH1) and a second horizontal shield line (SH2). This balanced energization can minimize the unintended response of quantum dots. The crossing angle ($\alpha_k$) is preferably a right angle of 90°.

FIG. 80

Figure 80:
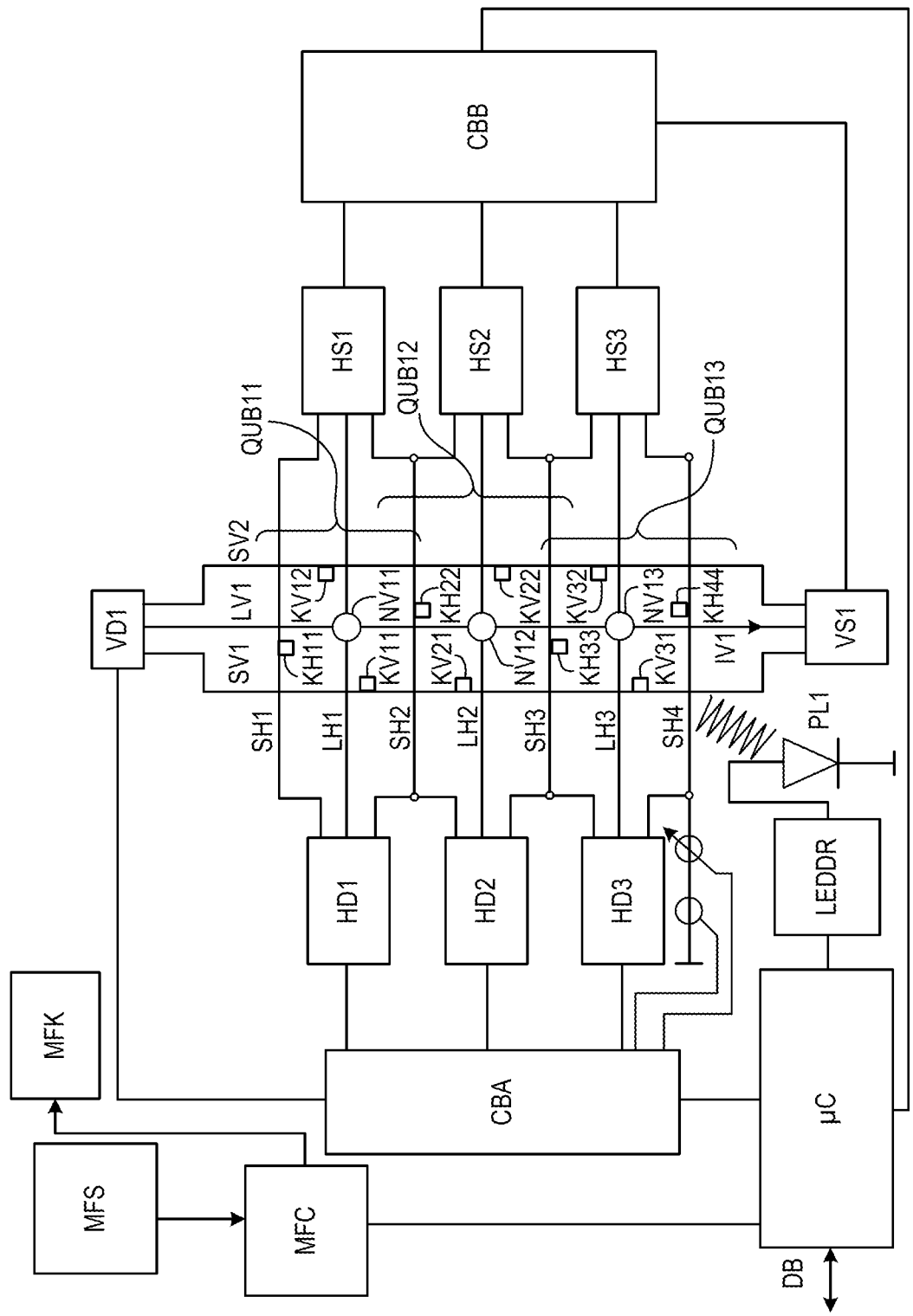
FIG. 80 shows a control system for a plurality of parametric centers (NV1) or a plurality of groups (NVC) of paramagnetic centers (NV1).

FIG. 80 shows the block diagram of an exemplary quantum sensor system with an exemplary schematically indicated three-bit quantum register with a first quantum bit (QUB11) and a second quantum bit (QUB12) and a third quantum bit (QUB13), which are to correspond here exemplarily in each case to a quantum bit (QUB) of FIG. 78 and FIG. 79.

The nuclear of the exemplary control device of FIG. 80 is a control device (µC) which is preferably a control computer (µC) or a signal processor or a finite state machine or the like. Preferably, the overall device comprises a magnetic field controller (MFC) which preferably receives its operating parameters from said control device (µC) and preferably returns operating status data to said control device (µC). Preferably, the magnetic field control (MFC) is a controller whose task is to compensate for an external magnetic field by active counter-control, for example by means of a common compensation coil (LC) for the entire device. Preferably, the magnetic field controller (MFC) uses for this purpose a magnetic field sensor (MFS) which preferably detects the magnetic flux B in the device preferably in the vicinity of the quantum points of the paramagnetic centers (NV1) or the groups (NVC) of paramagnetic centers (NV1). Preferably, the magnetic field sensor (MFS) itself is also a quantum sensor. Reference is made here to the applications DE 10 2018 127 394.0, DE 10 2019 130 114.9, DE 10 2019 120 076.8 and DE 10 2019 121 137.9. By means of a magnetic field control device (MFK), the magnetic field control (MFC) readjusts the magnetic flux density B. Preferably, a quantum sensor is used since it has the higher accuracy to sufficiently stabilize the magnetic flux density B of the magnetic field.

The control device preferably drives, via a control unit A (CBA), the horizontal driver stages (HD1, HD2, HD3) and vertical driver stages (VD1), which preferably energize the horizontal lines (LH1, LH2, LH3) and vertical lines (LV1) with the respective horizontal currents and vertical currents and generate the correct frequencies and temporal burst durations for spin driving the spins of the paramagnetic centers (NV1) or of the groups of paramagnetic centers (NVC). If there are nuclear centers (CI) in the substrate (D) in the vicinity of the paramagnetic centers (NV1), the nuclear centers (CI), as well as the pairings of paramagnetic center (NV1) and nuclear center (CI), can also be addressed in this way. The control device then also preferably controls, via a control unit A (CBA), the horizontal driver stages (HD1, HD2, HD3) and vertical driver stages (VD1), which preferably energize the horizontal lines (LH1, LH2, LH3) and vertical lines (LV1) with the respective horizontal currents and vertical currents and determine the correct frequencies and temporal burst durations for the spin actuation of the spins of the paramagnetic centers (NV1) and/or of the groups of paramagnetic centers (NVC) when coupled to the nuclear pins of a nuclear center (CI) or multiple nuclear centers (CI) or a group or groups (CIC) of nuclear centers (CI). In consequence, the respective paramagnetic centers (NV1) may be entangled with the respective nuclear centers (CI) in this manner. If the paramagnetic centers (NV1) of two adjacent quantum bits (QUB11, QUB12, QUB13) are placed close enough to each other, they can also be entangled with each other. In this case, the control device equally preferably drives the horizontal driver stages (HD1, HD2, HD3) and vertical driver stages (VD1) via the control unit A (CBA), which preferably drives the horizontal lines (LH1, LH2, LH3) and vertical lines (LV1) with the respective horizontal currents and vertical currents, and the correct frequencies and temporal burst durations for spin-driving the spins of the paramagnetic centers (NV1) to be coupled and the groups of paramagnetic centers (NV2) to be coupled, respectively. of the groups of paramagnetic centers (NVC).

The control unit A (CBA) sets the frequency and the pulse duration of the first horizontal shield current (ISH1) for the first horizontal shield line (SH1) in the first horizontal driver stage (HD1) according to the specifications of the control device (µC).

The control unit A (CBA) sets the frequency and the pulse duration of the first horizontal current (IH1) for the first horizontal line (LH1) in the first horizontal driver stage (HD1) according to the specifications of the control device (µC).

The control unit A (CBA) sets the frequency and the pulse duration of the second horizontal shielding current (ISH2) for the second horizontal shielding line (SH2) in the first horizontal driver stage (HD1) and that in the second horizontal driver stage (HD2) according to the specifications of the control device (µC).

The control unit A (CBA) sets the frequency and the pulse duration of the second horizontal current (IH2) for the second horizontal line (LH2) in the second horizontal driver stage (HD2) according to the specifications of the control device (µC).

The control unit A (CBA) sets the frequency and the pulse duration of the third horizontal shielding current (ISH3) for the third horizontal shielding line (SH3) in the second horizontal driver stage (HD2) and that in the third horizontal driver stage (HD3) in accordance with the specifications of the control device (µC).

The control unit A (CBA) sets the frequency and pulse duration of the third horizontal current (IH3) for the third horizontal line (LH3) in the third horizontal driver stage (HD3) according to the specifications of the control device (µC).

The control unit A (CBA) sets the frequency and pulse duration of the fourth horizontal shield current (ISH4) for the fourth horizontal shield line (SH4) in the third horizontal driver stage (HD2) and in the fourth horizontal driver stage (HD4), which is only indicated for lack of space, according to the specifications of the control device (µC).

The control unit A (CBA) sets the frequency and the pulse duration of the first vertical shield current (ISV1) for the first vertical shield line (SV1) in the first vertical driver stage (HV1) according to the specifications of the control device (µC).

The control unit A (CBA) sets the frequency and the pulse duration of the first vertical current (IV1) for the first vertical line (LV1) in the first vertical driver stage (VD1) according to the specifications of the control device (µC).

Synchronized by control unit A (CBA), these driver stages (VD1, HD1, HD2, HD3, HD4) feed their current into the lines (SV1, LV1, SV2, SH1, LH1, SH2, LH2, SH3, LH3, SH4) in a fixed phase ratio with respect to a common synchronization time.

Previously, a control unit B (CBB) configures a first horizontal receiver stage (HS1) in such a way that it extracts the currents fed by the first horizontal driver stage (HD1) on the other side of the lines. Instead of a configurable first horizontal receiver stage (HS1), the first horizontal line (LH1) can also be provided with a suitable terminating resistor, for example to ground.

Beforehand, the control unit B (CBB) configures a second horizontal receiver stage (HS2) in such a way that it extracts the currents fed in by the second horizontal driver stage (HD2) on the other side of the lines. Instead of a configurable second horizontal receiver stage (HS2), the first horizontal line (LH2) can also be provided with a suitable terminating resistor, for example to ground.

Prior to this, the control unit B (CBB) configures a third horizontal receiver stage (HS3) in such a way that it withdraws the currents fed in by the third horizontal driver stage (HD3) on the other side of the lines. Instead of a configurable third horizontal receiver stage (HS1), the third horizontal line (LH3) can also be provided with a suitable terminating resistor, for example to ground.

Beforehand, the control unit B (CBB) configures a first vertical receiver stage (VS1) in such a way as to extract the currents injected by the first vertical driver stage (VD1) on the other side of the lines. Instead of a configurable first vertical receiver stage (VS1), the first vertical line (Lv1) can also be provided with a suitable terminating resistor, for example to ground.

Preferably, the first horizontal shield line (SH1), the first horizontal line (LH1), and the second horizontal shield line (SH2) form a tri-plate line that is as free as possible from interruptions. The control unit B (CBB) preferably configures the first horizontal receiver stage (HS1) during the generation of the circularly polarized magnetic field at the location of the first quantum dot (NV11) in such a way that the tri-plate line comprising the first horizontal shield line (SH1), the first horizontal line (LH1) and the second horizontal shield line (SH2) is terminated by the first horizontal receiver stage (HS1) with the characteristic impedance of the tri-plate line to avoid back reflections. For example, if the photocurrent of the first quantum dot (NV11) is to be read out through the horizontal lines, the control unit B (CBB) configures the first horizontal receiver stage (HS1) so that the terminating resistance is as high as possible. The first horizontal driver stage (HD1) then applies the extraction voltage (Next) between the first horizontal shield line (SH1) and the second horizontal shield line (SH2) and detects the value of the flowing photocurrent of the first quantum dot (NV11), and typically passes on the value thus determined to the control device (µC), which processes the value and, if necessary, provides the result of this further processing, for example via a data bus (DB).

Preferably, the second horizontal shield line (SH2), the second horizontal line (LH2), and the third horizontal shield line (SH3) form a tri-plate line that is as free as possible from interruptions. The control unit B (CBB) preferably configures the second horizontal receiver stage (HS2) during the generation of the circularly polarized magnetic field at the location of the second quantum dot (NV12) in such a way that the tri-plate line comprising the second horizontal shield line (SH2), the second horizontal line (LH2) and the third horizontal shield line (SH3) is terminated by the second horizontal receiver stage (HS2) with the characteristic impedance of the tri-plate line to avoid back reflections. For example, if the photocurrent of the second quantum dot (NV12) is to be read out through the horizontal lines, the control unit B (CBB) configures the second horizontal receiver stage (HS2) so that the terminating resistance is as high as possible. The second horizontal driver stage (HD2) then applies the extraction voltage (Next) between the second horizontal shield line (SH2) and the third horizontal shield line (SH3) and detects the value of the flowing photocurrent of the second quantum dot (NV11), and typically passes on the value thus determined to the control device (µC), which processes the value and, if necessary, provides the result of this further processing, for example via a data bus (DB).

Preferably, the third horizontal shield line (SH3), the third horizontal line (LH3), and the fourth horizontal shield line (SH4) form a tri-plate line that is as free as possible from interfering points. The control unit B (CBB) preferably configures the third horizontal receiver stage (HS3) during the generation of the circularly polarized magnetic field at the location of the third quantum dot (NV13) in such a manner that the tri-plate line comprising third horizontal shield line (SH3), third horizontal line (LH2) and fourth horizontal shield line (SH4) is terminated by the third horizontal receiver stage (HS3) with the characteristic impedance of the triplate line in order to avoid back reflections. For example, if the photocurrent of the third quantum dot (NV11) is to be read out through the horizontal lines, the control unit B (CBB) configures the third horizontal receiver stage (HS3) so that the terminating resistance is as high as possible. The third horizontal driver stage (HD3) then applies the extraction voltage (Next) between the third horizontal shield line (SH3) and the fourth horizontal shield line (SH4) and detects the value of the flowing photocurrent of the third quantum dot (NV13), and typically passes the value thus determined to the control device (µC) which processes the value and, if necessary, provides the result of this further processing, for example via a data bus (DB).

Preferably, the first vertical shield line (SV1), the first vertical line (LV1), and the second vertical shield line (SV2) form a tri-plate line that is as free of interruptions as possible. The control unit B (CBB) preferably configures the first vertical receiver stage (VS1) during the generation of the circularly polarized magnetic field at the location of one or more of the quantum dots (NV11, NV12, NV13) preferably in such a way, that the triplate line of first vertical shield line (SV1), first vertical line (LV1) and second vertical shield line (SV2) is terminated by the first vertical receiver stage (VS1) with the characteristic impedance of the triplate line in order to avoid back reflections. For example, if the photocurrent of one or more of the quantum dots (NV11, NV12, NV13) is to be read out via the vertical lines, the control unit B (CBB) configures the first vertical receiver stage (VS1) so that the terminating resistance is as high as possible. The first vertical driver stage (VD1) then applies the extraction voltage (Next) between the first vertical screen line (SV1) and the second vertical screen line (SV2) and detects the value of the flowing photocurrent of the active quantum dots of the quantum dots (NV11, NV12, NV13) and typically passes on the value thus determined to the control device (µC), which processes the value and, if necessary, makes the result of this further processing available, for example via a data bus (DB).

Furthermore, the exemplary system of FIG. 80 comprises a pump radiation source (PL1) for pump radiation (LB) with the pump radiation wavelength ($\lambda_{pmp}$). By means of a light source driver (LEDDR) and the pump radiation source (PL1), the control device (µC) can irradiate the paramagnetic centers (NV1) or groups (NVC) of paramagnetic centers (NV1) of the quantum dots (NV11, NV12, NV13) with pump radiation (LB) of the pump radiation wavelength ($\lambda_{pmp}$). During this irradiation with pump radiation (LB) of the pump radiation wavelength ($\lambda_{pmp}$), photoelectrons are generated in the paramagnetic centers (NV1) or groups (NVC) of the quantum dots (NV11, NV12, NV13) as a function of the local value of the magnetic flux density B and/or as a function of the local value of the already mentioned further parameters such as pressure P, temperature $\vartheta$, acceleration a, gravitational field strength g, electric flux density D, intensity of the irradiation with ionizing radiation, etc., or their integrals and/or time derivatives, which can be extracted by the first horizontal receiver stage (HS1) and/or the second horizontal receiver stage (HS2) and/or the third horizontal receiver stage (HS3) and/or the first vertical receiver stage (VS1) by applying an extraction field as a respective photocurrent of a quantum bit (QUB11, QUB12, QUB13), for example via the connected shield lines. In the following, we describe by way of example how, for example, the photocurrent of the paramagnetic center(s) (NV1) or the group(s) (NVC) of paramagnetic centers (NV1) of the first quantum bit (QUB11) can be generated and extracted. The control unit (µC) causes the pump radiation source (PL1) to emit pump radiation (LB) having the pump radiation wavelength ($\lambda_{pmp}$), which is preferentially incident on the paramagnetic center(s) (NV1) or the group or groups (NVC) of paramagnetic centers (NV1) of the first quantum bit (QUB11) and the second quantum bit (QUB12) and the third quantum bit (QUB13). As an example, we assume for explanatory purposes that the substrate (D) is diamond and that the paramagnetic centers (NV1) are NV centers. Thus, the fluorescent state of the NV centers is the NV⁻ state. A first selection possibility now arises in that the control device (µC), by means of the control unit A (CBA) and by means of the first horizontal driver stage (HD1), places the first horizontal line (LH1) at a positive potential with respect to the substrate (D) of the quantum bits (QUB11, QUB12, QUB13). The control device (µC), by means of the control unit A (CBA) and by means of the first vertical driver stage (VD1), causes the first vertical line (LV1) to be at a positive potential with respect to the substrate (D) of the quantum bits (QUB11, QUB12, QUB13). Thus, the N state becomes the preferred state of the paramagnetic center(s) (NV1) or group(s) of paramagnetic centers (NV1) of the first quantum bit (QUB11). The control device (µC) causes, by means of the control unit A (CBA) and by means of the second horizontal driver stage (HD2), the second horizontal line (LH2) to be at a strongly negative potential with respect to the substrate (D) of the quantum bits (QUB11, QUB12, QUB13). The control device (µC) causes, by means of the control unit A (CBA) and by means of the third horizontal driving stage (HD3), the third horizontal line (LH3) to be at a strongly negative potential with respect to the substrate (D) of the quantum bits (QUB11, QUB12, QUB13). In this way, the second horizontal line (LH2) and the third horizontal line (LH3) are brought to a strongly negative potential with respect to the substrate (D). Hereby, the paramagnetic centers (NV1) or the groups (NVC) of paramagnetic centers (NV1) of the second quantum bit (QUB12) and the third quantum bit (QUB13) preferentially leave the NV⁻-state. Thus, the production of photoelectrons by the paramagnetic centers (NV1) or the groups (NVC) of paramagnetic centers (NV1) of the second quantum bit (QUB12) and the third quantum bit (QUB13) is hindered or, if necessary, completely prevented. To prevent the photoelectrons of the paramagnetic center (NV1) or the paramagnetic center(s) (NV1) or of the group or groups (NVC) of paramagnetic centers (NV1) of the first quantum bit (QUB11), the control device (µC) causes, for example, the first vertical receiver stage (VS1) to apply, between the first vertical screening line (SV1) and the second vertical screening line (SV2), an extraction voltage other than 0V, as a result of which a photocurrent in the form of the extracted photoelectrons of the paramagnetic center (NV1) or of the paramagnetic centers (NV1) begins to flow. of the paramagnetic center(s) (NV1) or group(s) (NVC) of paramagnetic centers (NV1) of the first quantum bit (QUB11) via the first horizontal shield line (SV1) and the second horizontal shield line (SV2). The magnitude value of this photocurrent typically depends on the magnetic flux density B at the location of the paramagnetic center(s) (NV1) or group(s) (NVC) of paramagnetic centers (NV1) of the first quantum bit (QUB11) and/or on other physical parameters, such as electric flux density D, acceleration a, gravitational field strength g, rotational speed ω, intensity of an irradiation with ionizing radiation, etc. The paramagnetic centers (NV1) or the groups (NVC) of paramagnetic centers (NV1) of the second quantum bit (QUB12) and the third quantum bit (QUB13) do not contribute significantly to this photocurrent, since the preferred state of these paramagnetic centers (NV1) or groups (NVC) of paramagnetic centers (NV1) or groups (NVC) of paramagnetic centers (NV1) does not depend on the photocurrent. groups (NVC) of paramagnetic centers (NV1) of the second quantum bit (QUB12) and the third quantum bit (QUB13), respectively, is not the NV⁻-state since the second horizontal line (LH2) and the third horizontal line (LH3) are negatively charged. The first vertical receiver stage (VS1) is preferably provided with means, for example a current measuring device, for detecting the photocurrent and for converting the value of the photocurrent into a receiver output signal (S0), which can then be further processed into a sensor output signal (out) in the sensor devices as illustrated herein. The control unit (μC) can emulate the sensor systems presented here, for example, and transmit the value (s0) of the sensor output signal to a higher-level unit via a data bus (DB).

FIG. 81

Figure 81:
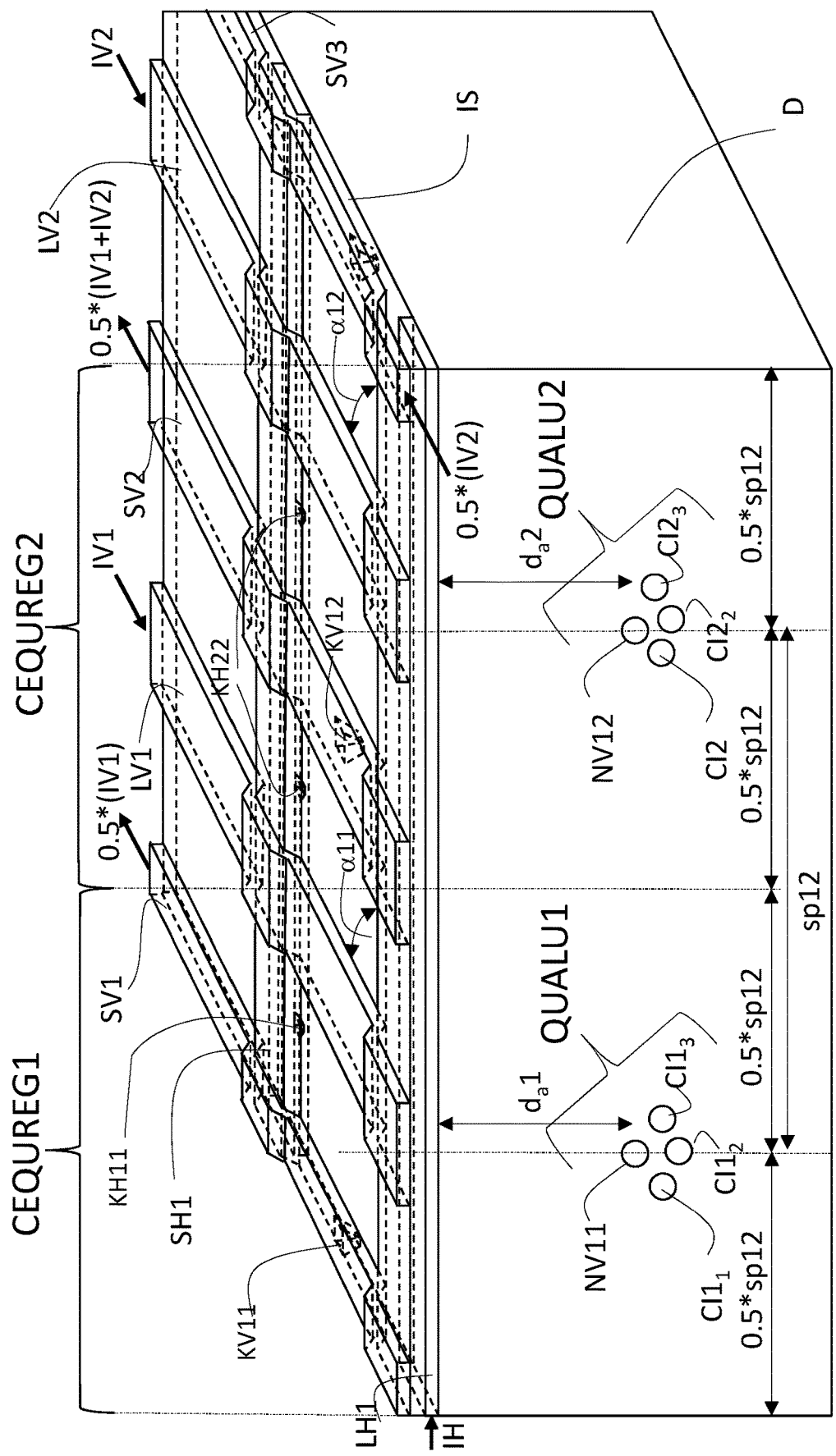
FIG. 81 shows a substrate with two paramagnetic centers (NV11, NV12) spaced apart from each other.
Figure 82:
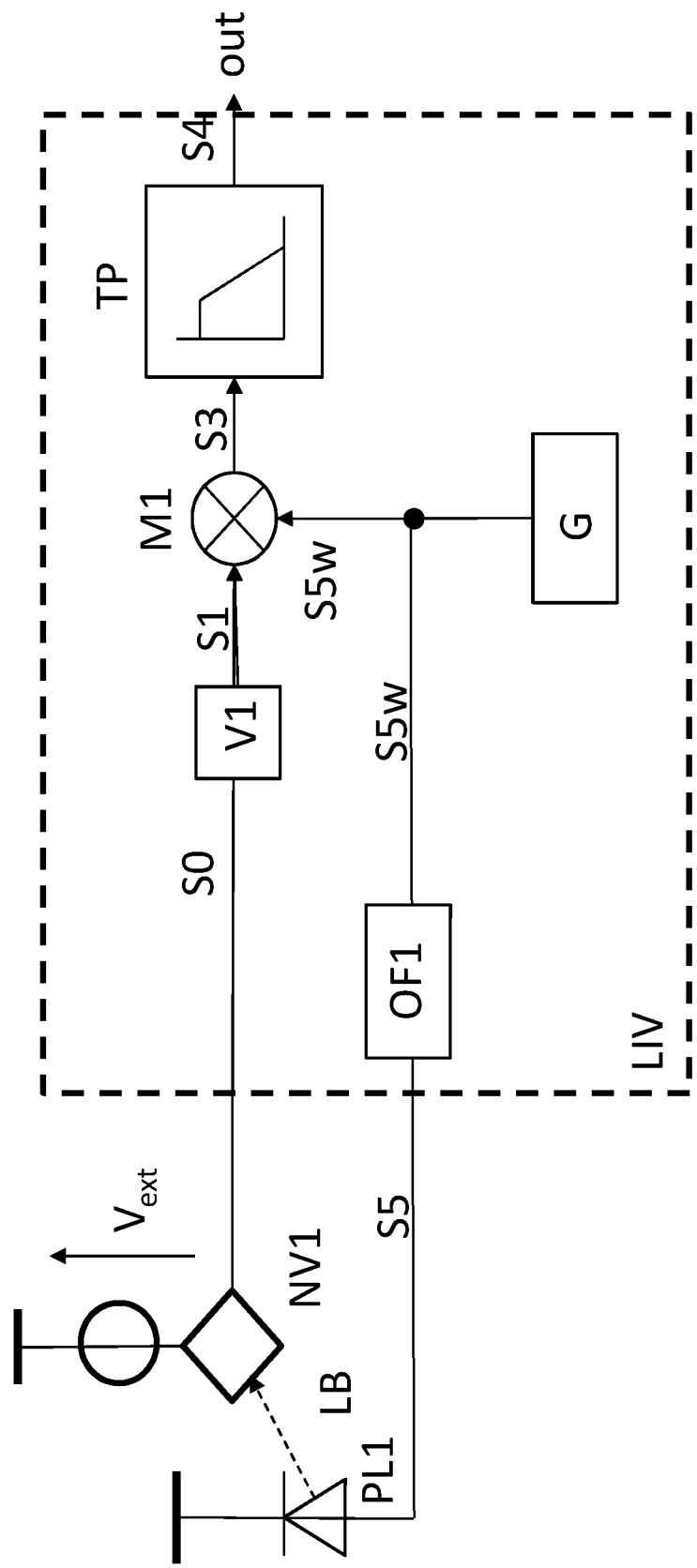
FIG. 82 shows the system of FIG. 1 adapted to a direct reading of the photoelectrons of the paramagnetic centers (NV1) and/or of the group or groups (NVC) of paramagnetic centers (NV1)

FIG. 82 shows an exemplary two-bit quantum register with a common first horizontal line (LH1), exemplary three vertical shield lines (SV1, SV2, SV3) and one horizontal shield line (SH1) and two quantum dots (NV11, NV12) each with one paramagnetic center (NV1) or several paramagnetic centers (NV1) or one group or several groups (NVC) of paramagnetic centers (NV1). When the two quantum dots (NV11, NV12) are sufficiently close, they form an exemplary quantum register with a second vertical shield line (SV2) and with a first vertical shield line (SV1) and with a third vertical shield line (SV3). In this respect, the roles of the horizontal and vertical functional parts are reversed here with respect to the preceding FIG. 81.

A homogeneous quantum register (QUREG) or in short only quantum register (QUREG) comprises only quantum dots (NV11, NV12) of one quantum dot type. Such a quantum register preferably comprises a first quantum bit (QUB11) and at least one second quantum bit (QUB12). A chain of such quantum registers (QUB) is the essential part of the quantum bus (QUBUS) explained below, which allows the transport of dependencies. According to the proposal, the property of homogeneity of the quantum register (QUREG) is expressed such that the first quantum dot type of the first quantum dot (NV11) of the first quantum bit (QUB11) of the quantum register (QUREG) is equal to the second quantum dot type of the second quantum dot (NV12) of the second quantum bit (QUB12) of the quantum register (QUREG). For example, the first quantum dot type may be an NV center in diamond as a substrate and the second quantum dot type may also be an NV center in the same substrate.

Typically, the substrate (D) is common to the first quantum bit (QUB11) of the quantum register (QUREG) and the second quantum bit (QUB12) of the quantum register (QUREG). Hereinafter, for clarity, the quantum dot (NV1) of the first quantum bit (QUB11) of the quantum register (QUREG) is called the first quantum dot (NV11) and the quantum dot (NV1) of the second quantum bit (QUB12) of the quantum register (QUREG) is called the second quantum dot (NV12). The first quantum dot (NV11) comprises one or more paramagnetic centers (NV1) or a group or groups (NVC) of paramagnetic centers (NV1). The second quantum dot (NV12) comprises one or more paramagnetic centers (NV1) or a group or groups (NVC) of paramagnetic centers (NV1). Similarly, for clarity, hereinafter the horizontal line (LH) of the first quantum bit (QUB11) of the quantum register (QUREG) will be referred to as the first horizontal line (LH1) and the horizontal line (LH) of the second quantum bit (QUB12) of the quantum register (QUREG) will be referred to as the second horizontal line (LH2). Similarly, the vertical line (LV) of the first quantum bit (QUB1) is hereinafter referred to as the first vertical line (LV1), and the vertical line (LV) of the second quantum bit (QUB2) is hereinafter referred to as the second vertical line (LV2). It is useful if, for example, the first horizontal line (LH1) is identical to the second horizontal line (LH2). Alternatively, it is useful if, for example, the first vertical line (LV1) is identical to the second vertical line (LV2).

The quantum register (QUREG) should be built small enough to fulfill its intended function, that the magnetic field of the second quantum dot (NV12) of the second quantum bit (QUB12) of the quantum register (QUREG) influences the behavior of the first quantum dot (NV11) of the first quantum bit (QUB11) of the quantum register (QUREG) at least temporarily and/or that the magnetic field of the first quantum dot (NV11) of the first quantum bit (QUB11) influences the behavior of the second quantum dot (NV12) of the second quantum bit (QUB12) at least temporarily.

Preferably, for this purpose the spatial distance (sp12) between the first quantum dot (NV11) of the first quantum bit (QUB11) of the quantum register (QUREG) and the second quantum dot (NV12) of the second quantum bit (QUB12) of the quantum register (QUREG) is so small, that the magnetic field of the second quantum dot (NV12) of the second quantum bit (QUB12) of the quantum register (QUREG) influences the behavior of the first quantum dot (NV11) of the first quantum bit (QUB11) of the quantum register (QUREG) at least temporarily, and/or in that the magnetic field of the first quantum dot (NV12) of the first quantum bit (QUB11) of the quantum register (QUREG) influences the behavior of the second quantum dot (NV12) of the second quantum bit (QUB12) of the quantum register (QUREG) at least at times. Preferably, for this purpose the second distance (sp12) between the first quantum dot (NV11) of the first quantum bit (QUB11) of the quantum register (QUREG) and the second quantum dot (NV12) of the second quantum bit (QUB12) of the quantum register (QUREG) is less than 50 nm and/or less than 30 nm and/or less than 20 nm and/or less than 10 nm and/or less than 10 nm and/or less than 5 nm and/or less than 2 nm, and/or the second distance (sp12) between the first quantum dot (NV11) of the first quantum bit (QUB11) of the quantum register (QUREG) and the second quantum dot (NV12) of the second quantum bit (QUB12) of the quantum register (QUREG) is between 30 nm and 2 nm and/or less than 10 nm and/or less than 5 nm and/or less than 2 nm.

Such a quantum register can be concatenated. The two-bit quantum register described above was lined up along the horizontal line (LH) common to the two quantum bits (QUB11, QUB12). Instead of horizontal stringing, vertical stringing along the vertical line is equally conceivable. The horizontal and the vertical line then exchange the function. A two-dimensional alignment is also conceivable, which corresponds to a combination of these possibilities.

Instead of a two-bit quantum register (QUREG), the stringing together of n quantum bits (QUB11 to QUB1n) is also conceivable. As an example, a three-bit quantum register is described here, which is continued along the horizontal line (LH) as an example. For the following quantum bits (QUB14 to QUB1n) the same applies. The quantum register can of course be extended in the other direction by m quantum bits (QUB0 to QUB(m−1)). To simplify the description, the text presented here is restricted to positive values of the indices from 1 to n. Therefore, the principles described below for a three-bit quantum register can be applied to a quantum register with more than three quantum bits. Therefore, these principles are no longer elaborated for a multi-bit quantum register, as they are readily apparent to those skilled in the art from the following description of a three-bit quantum register. Such multi-bit quantum registers are explicitly included in the claim.

A three-bit quantum register is then a quantum register as previously described with at least a third quantum bit (QUB13) according to the previous description. Preferably, the first quantum dot type of the first quantum dot (NV11) of the first quantum bit (QUB11) and the second quantum dot type of the second quantum dot (NV12) of the second quantum bit (QUB12) are then equal to the third quantum dot type of the third quantum dot (NV13) of the third quantum bit (QUB13).

Preferably, in such an exemplary three-bit quantum register, the substrate (D) is common to the first quantum bit (QUB11) and the second quantum bit (QUB12) and the third quantum bit (QUB13). The quantum dot (NV1) of the third quantum bit (QUB13) is hereinafter referred to as the third quantum dot (NV13). Preferably, the horizontal line (LH) of the third quantum bit (QUB13) is said first horizontal line (LH1) and thus in common with the horizontal line (LH) of the second quantum bit (QUB12) and the horizontal line (LH) of the first quantum bit (QUB11). The vertical line (LV) of the third quantum bit (QUB13) will be referred to as the third vertical line (LV3) in the following. Instead of this stringing of the quantum bits along the first horizontal line (LH1), other strings are conceivable, as already mentioned.

In order to now enable a transport of dependencies of quantum information, it is useful if the magnetic field of the second quantum dot (NV12) of the second quantum bit (QUB12) can at least temporarily influence the behavior of the third quantum dot (NV13) of the third quantum bit (QUB13) and/or if the magnetic field of the third quantum dot (NV13) of the third quantum bit (QUB13) can at least temporarily influence the behavior of the second quantum dot (NV12) of the second quantum bit (QUB12). This gives rise to what is referred to below as a quantum bus and serves to transport dependencies of the quantum information of the quantum dots of the quantum bus (QUBUS) thus created.

To enable these dependencies, it is useful if the spatial distance (sp23) between the third quantum dot (NV13) of the third quantum bit (QUB13) and the second quantum dot (NV12) of the second quantum bit (QUB12) is so small, that the magnetic field of the second quantum dot (NV12) of the second quantum bit (QUB12) can influence the behavior of the third quantum dot (NV13) of the third quantum bit (QUB13) at least temporarily, and/or that the magnetic field of the third quantum dot (NV13) of the third quantum bit (QUB13) can influence the behavior of the second quantum dot (NV12) of the second quantum bit (QUB12) at least temporarily.

To achieve this coupling, it is again useful, if the spatial distance (sp23) between the third quantum dot (NV13) of the third quantum bit (QUB13) and the second quantum dot (NV12) of the second quantum bit (QUB12) is less than 50 nm and/or less than 30 nm and/or less than 20 nm and/or less than 10 nm and/or less than 10 nm and/or less than 5 nm and/or less than 2 nm and/or if the spatial distance (sp23) between the third quantum dot (NV13) of the third quantum bit (QUB13) and the second quantum dot (NV12) of the second quantum bit (QUB12) is between 30 nm and 2 nm and/or less than 10 nm and/or less than 5 nm and/or less than 2 nm, is.

As explained above, the quantum bits (QUB) of the quantum register (QUREG) are preferably arranged in a one-dimensional lattice. An arrangement in a two-dimensional lattice is possible, but not so advantageous, since then the current equations can no longer be solved unambiguously without further ado.

Preferably, the quantum bits (QUB) of the quantum register (QUREG) are thus arranged in a one- or two-dimensional lattice of elementary cells of arrays of one or more quantum dots (NV1) with a second spacing (sp12) as a lattice constant for the distance between the respective elementary cells.

The additional shield lines (SV1, SV2, SV3, SH1) enable the injection of additional currents to improve the selection of quantum dots during the execution of the operations by energizing the vertical lines (LV1, LV2) and the horizontal line (LH1). Now, in addition to explaining the selection process, a first horizontal screening line (SH1) is drawn parallel to the first horizontal line (LH1). As this is a cross-sectional view, the corresponding second horizontal shield line (SH2) which is on the other side of the first horizontal line (LH1), also parallel to it, is not drawn. By contacts (KV11, KH11, KV12, KH12, KV13) the shielding lines in this example are electrically connected with the substrate (D). If an extraction field is now applied between two parallel shielding lines by applying an extraction voltage between them, a measurable current flow occurs when the quantum dots (NV1, NV2) are irradiated with pump radiation (LB) and when the paramagnetic centers (NV1) of these quantum dots (NV11, NV12) are in the correct quantum state, which is significantly influenced by the potentials of the first horizontal line (LH1), the first vertical line (LV1) and the second vertical line (LV2). More can be found in Petr Siyushev, Milos Nesladek, Emilie Bourgeois, Michal Gulka, Jaroslav Hruby, Takashi Yamamoto, Michael Trupke, Tokuyuki Teraji, Junichi Isoya, Fedor Jelezko, "Photoelectrical imaging and coherent spin-state readout of single nitrogen-vacancy centers in diamond", Science 363, 728-731 (2019) 15 Feb. 2019.

In FIG. 81, the paramagnetic centers (NV1) of the quantum dots (NV11, NV12) are each part of several core-electron quantum registers. This means that the paramagnetic centers (NV1) or groups (NVC) of paramagnetic centers (NV1) of the quantum dots (NV11, NV12) in the example of FIG. 81 can each be coupled, i.e. entangled, with one or more nuclear centers (CI) or one or more groups (CIC) of nuclear centers (CI). The signals required for this purpose are also supplied here via the first horizontal line (LH) and via the vertical lines (LV1, LV2, LV3). Since the entanglement range of the paramagnetic centers (NV1) is generally larger than that of the nuclear centers (CI), two nuclear centers (CI) of different core-electron quantum registers (CEQUREG1, CEQUREG2), for example, can be entangled with each other using the paramagnetic centers (NV1) as ancilla quantum bits. In this context, reference is made to the German patent application DE 10 2020 101 784.7 with a same priority as the application presented herein, which has not yet been published at the time of filing this paper. The first quantum dot (NV11) of the first quantum ALU (QUALU1) can interact with a first nuclear quantum dot ($CI1_1$) of the first quantum ALU (QUALU1) in the example of FIG. 81, when the first vertical line (LV1) and the first horizontal line (LH1) are energized with a first vertical current (IV1) and a first horizontal current (IH1), modulated at a first electron-nuclear radio wave resonant frequency ($f_{RWEC1\_1}$) for the first quantum ALU (QUALU1) or a first nuclear-electron microwave resonant frequency ($f_{MWCE1\_1}$) for the first quantum ALU (QUALU1). This first electron-nuclear radio wave resonant frequency ($f_{RWEC1\_1}$) for the first quantum ALU (QUALU1) and this first nuclear electron-microwave resonant frequency ($f_{MWCE1\_1}$) for the first quantum ALU (QUALU1) are preferably measured once in an initialization step by an OMDR measurement. The measured values are stored in a memory of the control computer (μC), which the latter retrieves when the corresponding core-electron quantum register (CEQUREG1, CEQUREG1) is to be driven. The control computer (μC) then sets the frequencies accordingly.

The first quantum dot (NV11) of the first quantum ALU (QUALU1) can interact with a second nuclear quantum dot (CI1$_2$) of the first quantum ALU (QUALU1) in the example of FIG. 81 when the first vertical line (LV1) and the first horizontal line (LH1) are energized with a first vertical current (IV1) and a first horizontal current (IH1), modulated at a second electron-nuclear radio wave resonant frequency ($f_{RWEC2\_1}$) for the first quantum ALU (QUALU1) or at a second nuclear-electron microwave resonant frequency ($f_{MWCE2\_1}$) for the first quantum ALU (QUALU1). This second electron-nuclear radio wave resonance frequency ($f_{RWEC2\_1}$) for the first quantum ALU (QUALU1) and this second nuclear electron-microwave resonance frequency ($f_{MWCE2\_1}$) for the first quantum ALU (QUALU1) are preferably measured once in said initialization step by another OMDR measurement. The measured values are stored in a memory of the control computer (μC), which the latter retrieves when the corresponding core-electron quantum register (CEQUREG) is to be driven. The control computer (μC) then sets the frequencies accordingly.

Figure 83:
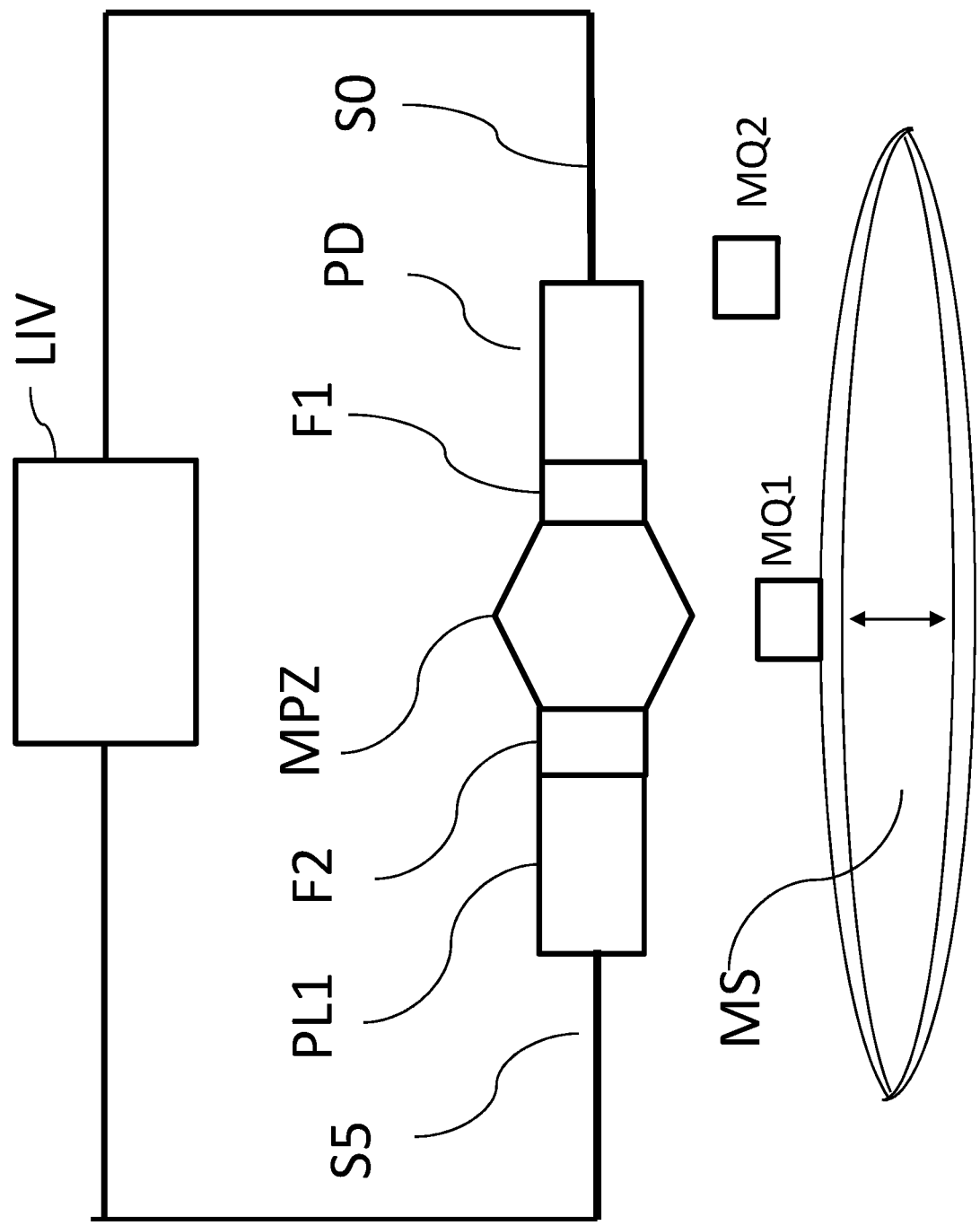
FIG. 83 shows the exemplary structure of the vibration sensor system according to the proposed method with a magnetic field coupled to a vibrating mechanical system (MS) (string), which is detected by the sensor system (pickup).

The first quantum dot (NV11) of the first quantum ALU (QUALU1) can interact with a third nuclear quantum dot (CI1$_3$) of the first quantum ALU (QUALU1) in the example of FIG. 83 when the first vertical line (LV1) and the first horizontal line (LH1) are energized with a first vertical current (IV1) and a first horizontal current (IH1), modulated at a third electron-nuclear radio wave resonant frequency ($f_{RWEC3\_1}$) for the first quantum ALU (QUALU1) or a third nuclear electron-microwave resonant frequency ($f_{MWCE3\_1}$) for the first quantum ALU (QUALU1). This third electron-nuclear radio wave resonant frequency ($f_{RWEC3\_1}$) for the first quantum ALU (QUALU1) and this third nuclear electron-microwave resonant frequency ($f_{MWCE3\_1}$) for the first quantum ALU (QUALU1) are preferably measured once in said initialization step by another OMDR measurement. The measured values are stored in a memory of the control computer (μC), which the latter retrieves when the corresponding core-electron quantum register (CEQUREG) is to be driven. The control computer (μC) then sets the frequencies accordingly.

The second quantum dot (NV12) of the second quantum ALU (QUALU2) can interact Example of FIG. 83 with a first nuclear quantum dot (CI2$_1$) of the second quantum ALU (QUALU2) when the second vertical line (LV2) and the first horizontal line (LH1) are energized with a second vertical current (IV2) and a first horizontal current (IH1), modulated at a first electron-nuclear radio wave resonant frequency ($f_{RWEC1\_2}$) for the second quantum ALU (QUALU2) or at a first nuclear-electron microwave resonant frequency ($f_{MWCE1\_2}$) for the second quantum ALU (QUALU2). This first electron-nuclear radio wave resonant frequency ($f_{RWEC1\_2}$) for the second quantum ALU (QUALU2) and this first nuclear electron-microwave resonant frequency ($f_{MWCE1\_2}$) for the second quantum ALU (QUALU2) are preferably measured once in an initialization step by an OMDR measurement. The measured values are stored in a memory of the control computer (μC), which the control computer (μC) retrieves when the corresponding core-electron quantum register (CEQUREG) is to be driven. The control computer (μC) then sets the frequencies accordingly.

The second quantum dot (NV12) of the second quantum ALU (QUALU2) can interact with a second nuclear quantum dot (CI2$_2$) of the second quantum ALU (QUALU2) in the example of FIG. 83 when the second vertical line (LV2) and the first horizontal line (LH1) are energized with a second vertical current (IV2) and a first horizontal current (IH1), modulated at a second electron-nuclear radio wave resonant frequency ($f_{RWEC2\_2}$) for the second quantum ALU (QUALU2) or at a second nuclear-electron microwave resonant frequency ($f_{MWCE2\_2}$) for the second quantum ALU (QUALU2). This second electron-nuclear radio wave resonant frequency ($f_{RWEC2\_2}$) for the second quantum ALU (QUALU2) and this second nuclear electron-microwave resonant frequency ($f_{MWCE2\_2}$) for the second quantum ALU (QUALU2) are preferably measured once in said initialization step by another OMDR measurement. The measured values are stored in a memory of the control computer (μC), which the latter retrieves when the corresponding core-electron quantum register (CEQUREG) is to be driven. The control computer (μC) then sets the frequencies accordingly.

The second quantum dot (NV12) of the second quantum ALU (QUALU2) can interact with a third nuclear quantum dot (CI2$_3$) of the second quantum ALU (QUALU2) in the example of FIG. 20 when the second vertical line (LV2) and the first horizontal line (LH1) are energized with a second vertical current (IV2) and a first horizontal current (IH1), modulated at a third electron-nuclear radio wave resonant frequency ($f_{RWEC3\_2}$) for the second quantum ALU (QUALU2) or at a third nuclear electron-microwave resonant frequency ($f_{MWCE3\_2}$) for the second quantum ALU (QUALU2). This third electron-nuclear radio wave resonant frequency ($f_{RWEC3\_2}$) for the second quantum ALU (QUALU2) and this third nuclear electron-microwave resonant frequency ($f_{MWCE3\_2}$) for the second quantum ALU (QUALU2) are preferably measured once in said initialization step by another OMDR measurement. The measured values are stored in a memory of the control computer (μC), which the latter retrieves when the corresponding core-electron quantum register (CEQUREG) is to be driven. The control computer (μC) then sets the frequencies accordingly.

Since the coupling range of the quantum dots (NV11, NV12) is larger, they can be coupled together. In the example of FIG. 81, the second quantum dot (NV12) of the second quantum ALU (QUALU2) can interact with the first quantum dot (NV1) of the first quantum ALU (QUALU1) when the first vertical line (LV1) and the second vertical line (LV2) and the first horizontal line (LH1) are energized with a first vertical current (IV1) and a second vertical current (IV2) and a first horizontal current (IH1), modulated at an electron1-electron2 microwave resonant frequency ($f_{MWEE1\_2}$) for coupling the first quantum dot (NV1) of the first quantum ALU (QUALU1) to the second quantum dot (NV2) of the second quantum ALU (QUALU2). This electron1-electron2—microwave resonant frequency ($f_{MWEE1\_2}$) for the coupling of the first quantum dot (NV1) of the first quantum ALU (QUALU1) is preferably measured once in said initialization step by another OMDR measurement. The measured values are stored in a memory of the control computer (µC), which the latter retrieves when the corresponding electron-electron quantum register (QUREG) comprising the first quantum dot (NV1) and the second quantum dot (NV2) is to be driven. The control computer (µC) then sets the frequencies accordingly.

By entangling the nuclear centers with each other or the paramagnetic centers (NV1) with each other or the paramagnetic centers (NV1) with the nuclear centers (CI), completely new parameters can be made accessible for measurement, since the photocurrent and/or the fluorescence radiation of the paramagnetic centers (NV1) depend on these parameters in a completely new way and sensitivity.

FIG. 82

FIG. 82 corresponds to FIG. 4 with the difference that now instead of the fluorescence radiation (FL) of the paramagnetic centers (NV1) of the sensor element, the photocurrent which is generated by the paramagnetic center or centers (NV1) upon irradiation with pump radiation (LB) as a function of the intensity ($I_{pmp}$) of the pump radiation (LB) and as a function of the magnetic flux density B and possibly as a function of further physical parameters, is transmitted via contacts to the substrate (D) with the paramagnetic center or centers (NV1) or the group or groups of paramagnetic centers (NV1) is detected and evaluated. Thus, in contrast to FIG. 4, the substrate (D) of the sensing element is now directly connected to the first amplifier (V1) via the receiver output signal (S0), the first amplifier (V1) extracting the photocurrent generated by the paramagnetic centers (V1). The evaluation and control methods explained in various places in this paper can be combined with this way of reading the paramagnetic centers (NV1). For simplicity, they are not further explained here. Reference is made here to FIGS. 78, 79 and 81.

FIG. 83

FIG. 83 shows an exemplary structure of another proposed sensor system. It comprises a transmission signal (S5) and a pump radiation source (PL1). This pump radiation source (PL1) preferably generates an excitation which is optimal for one or more paramagnetic centers (NV1) in a diamagnetic material (MPZ) of a sensor element, in particular as a function of the transmission signal (S5), without destroying, recharging or placing in a metastable state the paramagnetic center or centers (NV1) or the group or groups (NVC) of NV centers as paramagnetic centers (NV1). Preferably, in the case of NV centers as paramagnetic centers (NV1), the pump radiation (LB) has a pump radiation wavelength ($\lambda_{pmp}$) between 500-600 nm to excite the NV centers in the diamond or diamonds as material (MPS) of the sensor element. Alternatively, a second filter (F2) can be used to filter out the optimal wavelengths for excitation from a broader electromagnetic spectrum of the pump radiation source (PL1). Preferably, the pump radiation (LB) is then directed to the diamagnetic material (MPZ) within the sensing element, which moreover may be or comprise the diamagnetic material (MPZ), with the paramagnetic center(s) (NV1) and/or one or more groups (NVC) of NV centers contained therein as the paramagnetic centers (NV1). Preferably, the sensing element is an HD NV diamond having a high NV center density. Preferably, the diamond is a diamond artificially produced by means of high pressure and high temperature with a content of NV centers in a range of 0.1 ppm to 500 ppm. High-pressure, high-temperature diamonds are also called HPHT diamonds. In another example, for example, a polycrystalline diamond configuration having one or more NV centers as paramagnetic centers (NV1) and/or one or more groups (NVC) of NV centers as paramagnetic centers (NV1) may also be used. Furthermore, any collection of small diamond-containing material, for example nanocrystalline diamond powders or diamond granules, each embedded in an optically transparent support material such as glass or plastic, and preferably all or part of which are HD-NV diamonds, can be used. It is a prerequisite that the amount of paramagnetic centers (NV1) is present in a sufficient form so that a fluorescence radiation (FL) with sufficient intensity ($I_{fl}$) of the fluorescence radiation (FL) is generated, for example, for detecting the vibrations of a mechanical system capable of vibrating and/or for detecting, for example, the position of a movable mechanical system. The advantage of using granules or nanocrystalline powder is the stochastic distribution of the orientations of the crystals, which leads to the sensitivity curve of FIG. 28. The mechanical and/or electromechanical oscillations can concern very high frequencies, since the possible sampling rate is very high for detection with paramagnetic centers (NV1). The fluorescence radiation (FL) is preferably separated from the pump radiation (LB) by means of a first filter (F1) and converted into an electrical receiver output signal (S0) in a radiation receiver (PD) adapted to the fluorescence radiation wavelength ($\lambda_{fl}$) of the fluorescence radiation (FL). The arrangement of the pump radiation source (PL1) and the radiation receiver (PD) with respect to the sensor element comprising the material (MPZ) with the paramagnetic center(s) (NV1) is thereby preferably selected in such a way that an optimal coupling of the pump radiation (LB) into the paramagnetic center(s) (NV1) or the flu (NVC) or groups (NVC) of paramagnetic centers (NV1) can take place. An arrangement with pump radiation source (PL1) and radiation receiver (PD) on one side and the sensing element with the material (MPZ) with the paramagnetic center or centers (NV1) on the other side may also be used. Preferably, the arrangement is such that an optimal illumination of the sensor element comprising the material (MPZ) with the one or more paramagnetic centers (NV1) is achieved by a high intensity ($I_{pmp}$) of the pump radiation (LB) and an optimal detection of the fluorescence radiation (FL) while maintaining a high variation of a field due to the oscillating system (MQ1+MS). Optionally, a second stationary field source (MQ2) may be used to enhance the sensitivity of the sensing system to changes in the fluorescence radiation (FL), for example by a magnetic bias flux density ($B_0$), and to set an operating point close to the magnetic flux density ($B_{opt}$) with the maximum dependence of the intensity ($I_{fl}$) of the fluorescence radiation (FL) on the magnetic flux density (B). Preferably, in the sensor element as the material with paramagnetic centers (NV1), diamond with NV centers is used, and the magnetic system operating point in the form of the magnetic flux density B is set in the form of the average sum of the magnetic flux density B of the $_1$first field source (MQ1) and the magnetic flux density B of the $_2$second field source (MQ2) in a range of 0.1 mT-50 mT. The receiver output signal (S0) that the radiation receiver (PD) generates in response to the fluorescence radiation (FL) is fed to the drive and evaluation unit (LIV). Preferably, the control and evaluation unit (LIV) comprises a device as presented herein.

FIG. 84

Figure 84:
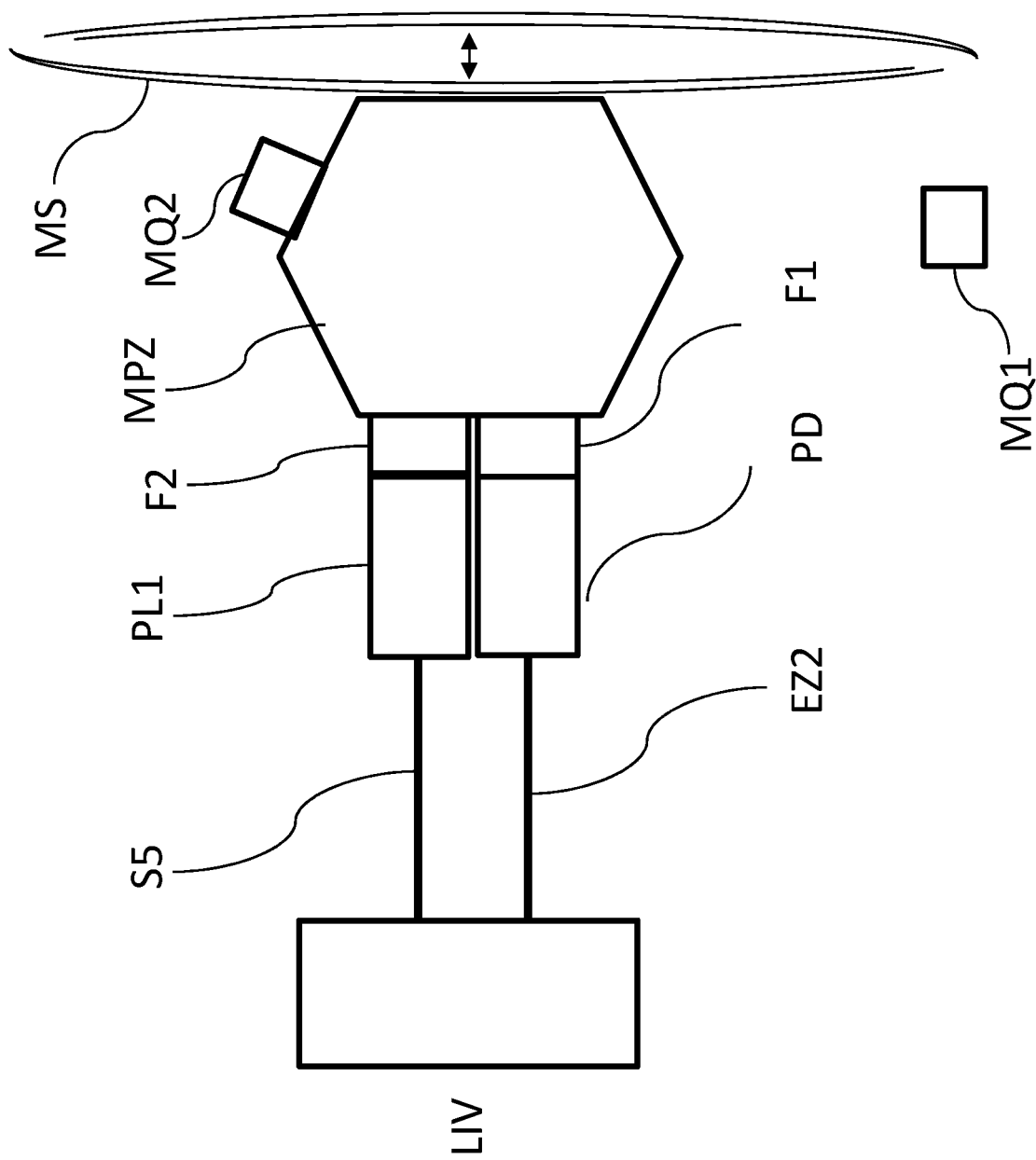
FIG. 84 shows the design of an exemplary sensor system (pickup) coupled to a mechanically vibrating system (MS)

FIG. 84 describes an alternative structure of an exemplary sensor system with electronic instead of optical readout, in which the sensor unit consisting of the sensor element with the material (MPZ) with the paramagnetic center or centers (NV1), the pump radiation source (PL1) and first filter (F1) and radiation receiver (PD) with optional second filter (F2) is coupled to the vibrating mechanical system (MS), for example a vibrating string of a musical instrument. Preferably, a first stationary field source (MQ1) for an electronic or magnetic field is combined with a second field source (MQ2), located in the same reference system as the sensing element, for a further superimposed electric or magnetic field to optimize a fluorescence radiation (FL) in relation to the vibrating mechanical system (MS). The evaluation of the receiver output signal (S0) of the radiation receiver (PD) is preferably achieved in the simplest case again via a lock-in amplifier.

In the exemplary case of FIG. 84, the stationary first field source (MQ1) excites the oscillating mechanical system (MS), which may be ferromagnetic, for example, with an electric field strength H. In the exemplary case of FIG. 84, the second field source (MQ2) then adjusts the bias field with bias flux density $B_0$ such that the magnetic operating point of the sensing element is at the flux density $(B_{opt})$ of the optimum magnetic operating point of the sensing element with the paramagnetic centers (NV1) and/or the group (NVC) of paramagnetic centers (NV1) and/or groups (NVC) of paramagnetic centers (See FIG. 28). The characteristic of the intensity $(I_{fl})$ of the fluorescence radiation (FL) as a function of the magnetic flux density B shown in FIGS. 27 and 28 also exists in an analogous similar manner for the dependence of the intensity $(I_{fl})$ of the fluorescence radiation (FL) caused by the paramagnetic center (NV1) and/or the paramagnetic centers (NV1) and/or the group (NVC) of paramagnetic centers (NV1) and/or the groups (NVC) of paramagnetic centers (NV1) on the magnetic flux density B. For this reason, FIGS. 27 and 28 have not been duplicated.

In the exemplary case of electrostatic fields, the first field source (MQ1) and the second field source (MQ2) would then be combinations of a respective electrode and a respective voltage source, wherein by means of a second voltage source and a second electrode forming the second field source (MQ2) in this exemplary case, the sensor element is applied to a second potential with respect to a reference potential, e.g. ground, and wherein by means of a first voltage source and a first electrode, which together form the first field source (MQ1), the exemplary mechanical vibrating element (MS) is applied to a first potential with respect to a reference potential, e.g. ground. Preferably, the mechanical vibrating element (MS) in this case is electrically conductive. An oscillation of the mechanical oscillating element (MS) then generates a modulated electric field strength E, the modulated magnetic excitation H of which is then measurable, for example, as a modulated magnetic flux B through the paramagnetic center(s) (NV1) and/or the group(s) (NVC) of paramagnetic centers (NV1) by means of a modulation of their fluorescence radiation (FL) and/or a modulation of their photoelectron current.

FIG. 85

FIG. 85 shows an example of an application of a proposed method in which the photosensitive radiation receiver (PD) is replaced by a conductive layer applied with a contact (KNT) on the material with paramagnetic centers (NV1) of the sensor element and is capable of sucking, collecting and determining the photoelectrons of the paramagnetic center(s) (NV1) or the group(s) (NVC) of paramagnetic centers (NV1). Particular advantages arise when the layer has an ohmic resistance to a diamagnetic material (MPZ) with a high sheet resistance, preferably diamond with NV centers. If the material has a low resistance, a pn structure or a metal with a Schottky junction is preferably used to insulate the layer from the material. Preferably, thin diamond films or small diamond structures are used to minimize shielding by charged defect centers. In order to generate photoelectrons by a double excitation, the intensity $(I_{pmp})$ of the pump radiation (LB) in a pulsed beam of the pump radiation (LB) is preferably achieved by reducing the pulse lengths of the pump radiation pulses while keeping the intensity $(I_{pmp})$ of the pump radiation (LB) constant and, at the same time, increasing the amplitude of the intensity $(I_{pmp})$ of the pump radiation pulses as much as possible.

FIG. 86

FIG. 86 shows the material (MPZ) with paramagnetic centers (NV1) separated by a first optical waveguide (LW1) from the pump radiation source (PL1) with the optional second filter (F2) and separated by a second optical waveguide (LW2) from the radiation receiver (PD) with a first filter (F1). Preferably, the respective optical fibers (LW1, LW2) are selected to show an optimal transmission performance for the respective different tasks and wavelengths, for the pump radiation (LB) of the pump radiation source (PL1) at a pump radiation wavelength $\lambda_{pmp}$ and for the fluorescence radiation (FL) of the paramagnetic center(s) (NV1) at the fluorescence radiation wavelength $\lambda_{fl}$.

FIG. 87

FIG. 87 corresponds to the set-up of FIG. 83 with only one common optical fibre (LWL). Preferred in this setup is an optical fiber with a large transmission power in a wavelength range that includes the pump radiation (LB) and the fluorescence radiation (FL). Preferably, in this setup, a dichroic mirror (DCS) is used to enable the coupling out of the fluorescence radiation (FL) and the coupling in of the pump radiation (LB) into the common optical fiber (LWL).

FIG. 88

FIG. 88 shows the example according to the method according to the disclosure with a number n of oscillating subsystems $(MS_1, MS_2 \ldots MS_n)$ of a mechanical oscillatory system (MS) with n first field sources for magnetic or electrostatic fields $(MG1_1, MG1_2, \ldots, MG1_n)$ coupled correspondingly to the respective subsystem of the n subsystems $(MS_1$ to $MS_n)$ and n sensor elements with a respective diamagnetic material $(MPZ_1, MPZ_2, \ldots, MPZ_n)$ with respective paramagnetic centers (NV1). The n sensor elements with the paramagnetic centers (NV1) and/or groups (NVC) of paramagnetic centers are coupled by means of a first optical waveguide (LWL1) to a pump radiation source (PL1) for generating the pump radiation (LB) and coupled by means of a second optical waveguide (LWL2) for reading out the fluorescence radiation (FL). First wave couplers (LWK1) respectively couple pump radiation (LB) out of the first optical waveguide (LWL1) and guide this respectively coupled-out pump radiation via a respective optical waveguide branch piece of the first optical waveguide (LWL1) to a respective sensor element of the n sensor elements assigned to this respective first wave coupler (LWK1). Via a respective optical waveguide branch piece of the second optical waveguide (LWL) and a second respective wave coupler (LWK2) associated with this respective optical waveguide branch piece of the second optical waveguide (LWL), the fluorescence radiation (FL) of the respective sensor element of the n sensor elements associated with this respective optical waveguide branch piece of the second optical waveguide (LWL) is detected and fed into the second optical waveguide (LWL2), where it is superimposed in a typically summing manner with the fluorescence radiation (FL) of the fluorescence radiation (FL), detected in an analogous manner, of the other sensor elements and is fed to the radiation receiver (PD) essentially jointly via the first filter (F1).

The radiation source (PL1) and the radiation receiver (PD) are controlled or read out by a control and readout unit (LIV) as described, for example, in FIG. 85. Preferably, in order to achieve an optimal control of the respective sensor elements, electrostatic and/or magnetic second fields from typically n additional second field sources ($MQ2_1$, $MQ2_2$, ... $MG2_n$) are superimposed in addition to the alternating first fields generated by the oscillating mechanical subsystems ($MS_1$, $MS_2$, ... $MS_n$). In this case, the magnetic flux density B is preferably tuned in each case in such a way that the sensor system permits optimum reading of the signals of the acoustic and/or other mechanical oscillations of the mechanically oscillating system (MS) or of the mechanically oscillating subsystems ($MS_1$, $MS_2$, ... $MS_n$).

FIG. 89

FIG. 89 shows an exemplary electric guitar (GT) as an application of a device according to the proposal. Preferably, the sensor element with the paramagnetic centers (NV1) is placed underneath the strings of the electric guitar (GT). Preferably, the material of the sensor elements with the paramagnetic centers (NV1) is HD-NV diamond with a high content of NV centers. Preferably, the diamond is cut as a gemstone, for example a brilliant, and typically exhibits a bright, deep red color during operation due to the high NV center content. Preferably, the diamond in question is recessed in a raised manner into the guitar-body. Preferably, one or more, for example two, light guides (LWL, LWL1, LWL2) for introducing the pump radiation (LB) into the sensor elements and reading out the fluorescence radiation (FL) are guided through the body of the electric guitar (GT) in a cavity, for example below the sensor elements concerned, as here the diamond concerned. Preferably, the pump radiation source(s) (PL1) and the light-sensitive radiation receiver(s) (PD) are located in this cavity. For example, a sensor system concept according to one of the preceding examples is conceivable. Preferably, the acoustically equivalent sensor output signals (S0) or signals derived therefrom are preferably mixed together into a signal via a 6 mm jack socket on the upper side of the body of the electric guitar (GT) and made available for further signal processing and, if necessary, conditioning. In an optional design, the acoustically equivalent information of these sensor output signals or information derived from them can be transmitted wirelessly via an electromagnetic wave according to common standards (WLAN, Bluetooth). Such an electric guitar is just one example of an application of the concepts presented herein. The principles presented here are generally also transferable to the other use cases in an analogous manner and are included in the description and claim.

FIG. 90 shows the absorption spectrum of a proposed diamond recorded at room temperature. The absorption is shown in an arbitrary unit related to a freely chosen reference transmission as a function of the wavelength in nm.

The core idea presented here with regard to the production of HD-NV diamonds and jewelry diamonds is to prevent the clustering of flaws from the outset during in situ irradiation.

A first measure is the use of n-doped diamond. This n-doping can be achieved, for example, by doping the diamond with sulfur. A similar effect of n-doping is achieved when the diamond blank(s) comprise nitrogen atoms in the form of P1 centers. This typically manifests itself in a yellow color of the diamond blanks. It has been shown that the intensity of the yellow color should be rather weak. However, a coloring of the diamond blanks before irradiation according to the GIA standard "fancy yellow" is already much too strong and leads to practically black stones, whereby the blackness is the result of a too extreme red coloring.

For example, the GIA Rules for Determining the Coloration of Jewelry Diamonds can be found on the Internet at https://www.gia.edu/fancy-color-diamond-quality-factor at the time this patent application was filed.

Preferably, the yellow diamond blanks have the GIA shade "fancy" or better "fancy light" or even better "light" or even better "very light". The degree of subsequent reddening then decreases when using diamond blanks with a yellow coloration corresponding to the GIA shade "fancy" to diamond blanks with a yellow coloration corresponding to the GIA shade "very light". In this case, the yellow diamond blanks have the GIA shade "fancy" after the staining process has been carried out, so that they appear practically black. They are then only suitable for sensor elements in devices in which the fluorescence radiation (FL) evaluated by the device leaves the sensor element via the same surface (OFL1) via which the pump radiation (LB) is also irradiated into the sensor element. When using diamond blanks with a yellow coloration corresponding to the GIA shade "very light" or perhaps even the GIA shade "faint", the red coloration becomes very slight or possibly even disappears. Low red colorations appear more pink to pink.

The nitrogen in the P1 centers of the yellow diamonds serves as a donor, causing n-doping of the diamonds. As mentioned above, other donors, such as sulfur, can also be used for support.

It has been recognized in accordance with the disclosure that n-doping leads to a shift in the Fermi level within the diamond crystal. This shift of the Fermi level leads to an ionization of the defects created by the irradiation, which are then negatively charged. As a result, the formed defects repel each other during the implantation process and arrange themselves in more or less similar distances to each other, if at the same time it is ensured that the defects can move during their formation.

For this reason, the diamond blank is heated with electrons during irradiation. On the one hand, this increases the degree of ionization of the donors and thus the amount of available electrons in the conduction band and, on the other hand, the mobility of the defects.

It is known from diamonds that graphitisation phenomena occur on their surfaces from a temperature of approx. 750° C. onwards.

To prevent oxidation of the diamond, the irradiation facility and the process chamber must be evacuated during heating and irradiation. However, at the electron energies used, irradiation in a process chamber filled with inert gas is also conceivable.

Due to the heating and the n-doping, firstly the defects in the respective diamond crystal arrange themselves at a distance from each other and secondly the formation of agglomerations is prevented, which would result in turbidity of the diamond, and thirdly a large quantity of NV centers is formed, which fluoresce red and thus, when irradiated with pump radiation (LB) (e.g. daylight), emit fluorescence radiation (FL) with the fluorescence radiation wavelength $\lambda_{fl}$ and emphasize the possibly red color of the diamond when used as a jewelry diamond.

Doping the diamond with hydrogen has the opposite effect. This is deposited in the defects, whereby their negative charge is neutralized. Only when all hydrogen is bound (e.g. as H3 center) a red color can develop. CVD diamond substrates are therefore less suitable. Although the process also works for these substrates, it is not as efficient as when using HPHT diamonds grown under high pressure and temperature. HPHT diamonds with nitrogen atoms and with the lowest possible hydrogen content are therefore preferred as diamond blanks.

If CVD diamond, i.e. a metastably produced diamond, is to be used, which typically has an increased proportion of hydrogen incorporated as a result of the deposition process, it is suggested that the incorporated hydrogen be neutralized in its effect before or during the process proposed here, e.g. by irradiation with particles and temperature treatment.

Thus, the proposed method for producing one or more red jewelry diamonds comprises the steps of:

Step 1: Provision of the diamond blank(s). Four different rules may be given here for the characteristics of the diamond blank:
  (a) that the diamond blank or blanks comprise nitrogen atoms in the form of P1 centers, and/or
  b) that the diamond blank or blanks have a yellow colour and/or
  c) that the diamond blank or blanks are n-doped and/or
  d) that the diamond blank or blanks comprise nitrogen atoms together with hydrogen, wherein at least one of the three preceding rules a to c should be satisfied here.

Step 2: Irradiation of the diamond blank(s) with electrons. The energy of the electrons should preferably be above 2 MeV in order to cause sufficient defects in the diamond and to penetrate the diamond safely. The energy of the electrons should preferably be below 20 MeV in order to avoid secondary radioactivity. It has been shown that an electron energy of 10 MeV is particularly suitable. The energy of the electrons should thus be greater than 500 keV and/or better than 1 MeV and/or better than 3 MeV and/or better than 4 MeV and/or better than 5 MeV and/or better than 6 MeV and/or better than 7 MeV and/or better than 8 MeV and/or better than 9 MeV and/or better than 10 MeV, an energy of 10 MeV being preferred. The irradiation dose should preferably be between $5*10^{17}$ cm$^{-2}$ and $2*10^{18}$ cm$^{-2}$, but at least less than $10^{19}$ cm$^{-2}$ to avoid graphitization. The decisive difference with respect to the prior art, in addition to the n-doping of the diamond crystal, is that during the irradiation the temperature of the diamond or diamonds is at an irradiation temperature greater than 600° C. and/or better greater than 700° C. and/or greater than 800° C. and less than 900° C. and/or less well less than 1000° C. and/or less well less than 1100° C. and/or less well less than 1200° C., thus preferably between 800° C. and 900° C. This supports the diffusion apart of the negatively charged defects and increases the electron density in the conduction band. The beam current of the electric current of these electrons used to irradiate the diamond blanks is preferably adjusted so that the irradiation time to achieve the above irradiation dose is at least 0.05 days and/or preferably at least 0.5 days and/or preferably at least 1 day and/or preferably at least 2 days and/or preferably at least 4 days and/or preferably at least 8 days. Since economy is also an important factor, it has been found in experiments that an economically preferred irradiation duration is 2 days.

The diamond blanks are thermally coupled to a heat sink via a thermal resistor during irradiation. During irradiation, the diamond blanks are kept at the desired process temperature by a temperature control device which is part of the temperature control device. In doing so, the temperature control device takes into account all energy inputs. Preferably, the temperature control device can control one or more heat fluxes into and/or out of the set of diamond blanks to be processed as a function of the average irradiation temperature of the diamond blanks.

The temperature control device controls the total energy input by controlling at least one energy flow into the diamond blanks heating the diamond blanks during the irradiation and, if necessary, the total energy dissipation in such a way that the one temperature probe placed in the vicinity of the diamond blanks during the irradiation detects an average irradiation temperature of the diamond blanks of greater than 600° C. and/or greater than 700° C. and/or greater than 800° C. and less than 900° C. and/or less than 1000° C. and/or less than 1100° C. and/or less than 1200° C., preferably between 800° C. and 900° C. Preferably, for this control, the temperature control device comprises a PI, P or better PID controller or another suitable controller.

Preferably, the total energy input is not constant. Preferably, the total energy input to the diamond blanks has a temporally equal portion and a temporally pulsed portion with a temporal pulse spacing and a pulse height of the total energy input pulses. It may also be only a single heating energy pulse. The temperature control device may then use the DC component and/or the pulse height of the total energy input pulses of the total energy input and/or the temporal pulse spacing of the total energy input pulses to control the average irradiation temperature detected by the temperature probe. Thus, where applicable, a heater may be provided, for example, to increase the total energy input for the pulse duration of a total energy input pulse, resulting in an increase in temperature and improving the healing of radiation damage. The total energy input is composed of the energy from a possibly active heating device, the thermal energy derived via the thermal bleeder resistor and the more or less permanent beam power of the electron beam during irradiation. The temperature control device must take this into account when setting the average target temperature.

In addition to natural diamonds, synthetic HPHT diamonds can also preferably be used as diamond blanks. The use of synthetic CVD diamond is also conceivable, but not preferred.

A further advantage of the method compared to methods which provide for annealing of the irradiated diamonds after irradiation at high pressure is that the diamond blanks can already be provided with their final cut before irradiation. Thus, a diamond blank used according to the proposal preferably has at least one polished surface prior to irradiation.

In order to avoid damage to the polished surfaces of the diamond blank by oxidation at high process temperature, the irradiation with electrons takes place in a vacuum with a residual pressure of less than $10^{-4}$ mBar and/or better $10^{-5}$ mBar and/or better of less than 10 mBar$^{-6}$ and/or better of less than 10 mBar$^{-7}$ and/or better of less than $10^{-8}$ mBar and/or better of less than $10^{-9}$ mBar and/or better of less than $10^{-10}$ mBar. Based on economic considerations and on experiments, it has been determined in the course of the elaboration of the disclosure that a residual pressure of less than $10^{-6}$ mBar is perfectly sufficient. Irradiation in an inert gas atmosphere, in particular in an agon atmosphere, is an alternative, less preferred option.

For example, a diamond blank may have one of the following cuts prior to irradiation: Pointed cut, Table cut, Rose cut, Mazarin cut, Brilliant cut, Teardrop cut, Princess cut, Oval cut, Heart cut, Marquise cut, Emerald cut, Asscher cut, Cushion cut, Radiant cut, Old diamond cut, Emerald cut, Baguette cut. This cut is not changed by irradiation. The high process temperature during irradiation prevents damage to the optical surfaces. The diamonds can be cut after or before irradiation. A cut before irradiation is typically possible but not mandatory.

A suitable diamond blank preferably has a size larger than 0.1 ct and/or better larger than 0.2 ct and/or better larger than 0.5 ct and/or better larger than 1 ct and/or better larger than 1.5 ct and/or better larger than 2 ct. However, irradiation and treatment of diamond granules and dusts, e.g. diamond in the form of nano-diamonds is also possible in the previously presented manner for manufacturing red diamonds and/or for manufacturing HD-NV diamonds.

The one or more diamond blanks are, during irradiation, in a temperature-controlled process chamber at said process chamber temperature or in a temperature-controlled vessel at a process chamber temperature within the process chamber, which is preferably evacuated. The process chamber temperature preferably deviates, not more than 200° C. and/or better not more than 100° C. and/or better not more than 50° C. and/or better not more than 20° C. and/or better not more than 10° C. from the irradiation temperature. The heating power of the electron beam itself also plays a role here. Since the properties of the electron beam vary from facility to facility, it is strongly recommended that a DoE (Design of Experiment) be performed to determine the optimum process parameters for the pairing of irradiation facility and diamond blanks. Preferably, the diamond blanks are stored in a quartz vessel during the preferably pulsed irradiation with the typically pulsed electron beam of, for example, a Linac, where they are brought to the process temperature and maintained at this process temperature during the irradiation.

Jewelry Diamond

A diamond produced by the method described above, in particular a red jewelry diamond, differs from the artificial red jewelry diamonds known in the prior art by its brilliance, clarity and color, which, if the diamond blanks are suitably preselected, has in particular no green or blue color admixtures. Colors such as "pink" and "orange" are possible.

The diamond then usually corresponds to the Gia color "fancy red", which makes it particularly distinctive.

Moreover, it exhibits some peculiarities in its absorption spectrum which are clear traces of the application of the processes previously described. First of all, such a jewelry diamond is a diamond single crystal colored by a coloring process, and specifically colored red. The jewelry diamond thus appears red to a human observer when illuminated with white light. For example, the GIA Rules for Determining the Coloration of Jewelry Diamonds can be found on the Internet at https://www.gia.edu/fancy-color-diamond-quality-factor at the time this patent application was filed.

A very simple representation of diamond colors can be found, for example, at https://www.ninasjewellery.com.au/fancy-coloured-diamonds. The GIA standard is described, for example, in the publication by John M. King "GIA Colored Diamonds, Color Reference Charts", Gemological Institute of America, 2006. This publication can be obtained from the ordering information ISBN-10: 0873110536, ISBN-13: 978-0873110532. For purposes of this disclosure, all of the hues described on page 13 of this writing cited herein depict red jewelry diamonds.

In order to distinguish a diamond produced by the above methods, which is an HD-NV diamond, from prior art diamonds, the light absorption at five different wavelengths of light is considered.

A first absorption coefficient ($\alpha_1$) of the jewelry diamond or of the diamond is determined upon transillumination with light having a wavelength of 437 nm in at least one transillumination direction possible for the respective jewelry diamond at room temperature. The wavelength of 437 nm is chosen to be approximately in the middle of the absorption edge of the jewelry diamond, which rises to shorter wavelengths until total absorption, and to differentiate the jewelry diamond well from artificially colored red jewelry diamonds of the prior art. Some of the other coloring methods show an insufficient absorption at exactly this wavelength, which leads to a blue-green admixture in the absorption color.

A second absorption coefficient ($\alpha_2$) of the jewelry diamond or of the diamond is determined upon transillumination with light having a wavelength of 500 nm in at least this transillumination direction possible for the jewelry diamond in question at room temperature. The wavelength of 500 nm is selected so that it lies at the foot of an absorption peak, if present, of an H3 center in the jewelry diamond in question.

A third absorption coefficient ($\alpha_3$) of the jewelry diamond or of the diamond is determined upon transillumination with light having a wavelength of 570 nm in at least this transillumination direction possible for the respective jewelry diamond at room temperature. The wavelength of 570 nm is chosen to be at the foot of an absorption peak, if any, of an $NV^0$-center in the jewelry diamond in question. Typically, it is the maximum of the strongly broadened NV absorption range.

A fourth absorption coefficient ($\alpha_4$) of the jewelry diamond or the diamond is determined when irradiated with light having a wavelength of 800 nm in at least this irradiation direction possible for the respective jewelry diamond at room temperature. The wavelength of 800 nm is chosen to be above the GR1 center. After irradiation, some diamonds of the prior art show a strictly monotonically increasing absorption towards longer wavelengths due to unhealed radiation damage.

A fifth absorption coefficient ($\alpha_5$) of the jewelry diamond or of the diamond is determined when irradiated with light having a wavelength between 200 nm and 400 nm in at least this possible irradiation direction at room temperature. The wavelength range from 200 nm to 400 nm is selected such that here a red diamond colored by means of the method presented herein is not transparent or is only insignificantly transparent.

Now, these five absorption coefficients are typically in certain ratios to each other in a jewelry diamond or diamond, in particular HD-NV diamond, which has been produced by means of one of the methods disclosed herein. Since only a limited number of jewelry diamonds or diamonds have been colored red up to the time of the application, it cannot be ruled out that there may be exceptions to this rule, since a statistical uncertainty that can only be eliminated with an infinite number of samples always exists. Such jewelry diamonds can also be used as sensor elements, in particular with an appropriate cut. Quite generally, such diamonds can also be used as sensor elements without a gemstone cut, for example provided only with one or two polished surfaces (OFL1, OFL2). HD-NV diamonds and/or diamonds with other color centers, preferably high density, used as sensor elements can therefore also have these or similar spectral optical properties.

In the diamonds produced at the time of the preparation of the application, the fifth absorption coefficient ($\alpha_5$) was larger than the first absorption coefficient ($\alpha_1$), the first absorption coefficient ($\alpha_1$) was larger than the third absorption coefficient ($\alpha_3$), the third absorption coefficient ($\alpha_3$) was larger than the second absorption coefficient ($\alpha_2$), and the second absorption coefficient ($\alpha_2$) was larger than the fourth absorption coefficient ($\alpha_4$). Moreover, the difference of the third absorption coefficient ($\alpha_3$) minus the second absorption coefficient ($\alpha_2$) was smaller than the difference of the second absorption coefficient ($\alpha_2$) minus the fourth absorption coefficient ($\alpha_4$).

Preferably, the diamond blank of the red colored jewelry diamond was produced by a crystal growing process. In particular, it is preferably an HPHT diamond.

Such a jewelry diamond preferably has one of the following cuts: pointed cut, table cut, rose cut, Mazarin cut, brilliant cut, teardrop cut, princess cut, oval cut, heart cut, marquise cut, emerald cut, asscher cut, cushion cut, radiant cut, old diamond cut, emerald cut, or baguette cut.

Due to the irradiation under temperature, the jewelry diamond according to the disclosure is clearer and less cloudy than artificially colored red jewelry diamonds of the prior art. Such a jewelry diamond therefore typically exhibits a quality grade of SI1 or better VS2 or better VS1 or better VVS2 or better VVS1 or better "internally flawless" or better "flawless" when using a suitably high quality diamond blank.

Information on the quality grade can be found, for example, at the web link https://www.koenigjewellery.com/diamanten/die-welt-der-diamanten/gia-die-4-c-s/. The best quality grade according to the GIA standard is the "flawless" quality. The worst quality grade according to the GIA standard is quality grade $I_3$.

The color of the red diamond typically resulting from the application of the disclosed process can vary from a light hint of color to a deep, almost black colored stone, depending on the intensity. The determining factor is the strength of the yellowish coloration of the diamond blank. The color can be associated with a RAL color. When illuminated with white light against a white background, a proposed jewelry diamond appears to the human observer in a color corresponding to RAL 3020 and/or RAL3024 and/or RAL 3026 and/or another RAL color 3XXX, where XXX stands for a three-digit number between 000 and 999.

The GIA has made an effort to systematize the coloring of diamonds. Therefore, reference is again made here to the John M. King paper "GIA Colored Diamonds, Color Reference Charts", Gemological Institute of America, 2006, ISBN-10: 0873110536, ISBN-13: 978-0873110532. A proposed jewelry diamond, after undergoing the proposed procedure, exhibits the red color "fancy-red" or the red color "fancy-deep" or the red color "fancy-vivid" or the red color "fancy-dark" or the red color "fancy-intense" or the red color "fancy light" or the red color "light" according to GIA standards. In summary, the jewelry diamond when completely recolored shows a red color according to the pictures of diamonds on page 13 of John M. King's paper "GIA Colored Diamonds, Color Reference Charts", Gemological Institute of America, 2006, ISBN-10: 0873110536, ISBN-13: 978-0873110532. If the yellow color centers are not completely recolored, the jewelry diamond may also exhibit orange tones. A jewelry diamond according to the disclosure may then exhibit the orange-pink color "fancy-red" or the orange-pink color "fancy-deep" or the orange-pink color "fancy-vivid" or the orange-pink color "fancy-dark" or the orange-pink color "fancy-intense" or the orange-pink color "fancy light" or the orange-pink color "light" according to the GIA standard. Alternatively, this can be summarized so that if yellow color centers remain, the jewelry diamond shows an orange-pink color according to the images of diamonds on page 12 of John M. King's paper "GIA Colored Diamonds, Color Reference Charts," Gemological Institute of America, 2006, ISBN-10: 0873110536, ISBN-13: 978-0873110532. Other colors are possible.

In the proposed method for coloring the diamond blanks, large amounts of NV centers are fabricated in the material of the jewelry diamond, causing the jewelry diamond to fluoresce with a color in the range of 637 nm+/−10 nm when illuminated with white light against a white background, which enhances the impression of brilliance of the jewelry diamond.

Preferably, the jewelry diamond exhibits fluorescence with a color temperature less than 1000 K, which corresponds to a deep red. If a yellow color of the diamond blank is not completely converted to a red hue, the jewelry diamond may also exhibit a color having a color temperature less than 2000 K. Thus, when irradiated with white light in at least one irradiation direction, the jewelry diamond has a color temperature lower than 1000 K.

The jewelry diamond, if it is to fluoresce, preferably has a density of NV centers greater than 0.01 ppm and/or greater than $10^{-3}$ ppm and/or greater than $10^{-4}$ ppm and/or greater than $10^{-5}$ ppm and/or greater than $10^{-6}$ ppm based on the number of carbon atoms per unit volume. If fluorescence is to be avoided, the jewelry diamond preferably has a density of NV centers that is less than 10 ppm and/or less than 2 ppm and/or less than 1 ppm and/or less than 0.5 ppm and/or less than 0.2 ppm and/or of than 0.1 ppm and/or of than 0.05 ppm and/or less than 0.02 ppm and/or less than 0.01 ppm and/or less than 0.005 ppm and/or less than 0,002 ppm and/or less than 0.001 ppm and/or less than $5*10^{-4}$ ppm and/or less than $2*10^{-4}$ ppm and/or less than $10^{-5}$ ppm and/or less than $5*10^{-5}$ ppm and/or less than $2*10^{-5}$ ppm and/or less than $10^{-6}$ ppm and/or less than $5*10^{-6}$ ppm and/or less than $2*10^{-6}$ ppm and/or less than $10^{-7}$ ppm based on the number of carbon atoms per unit volume.

By its nature, the jewelry diamond according to the disclosure typically exhibits traces of irradiation with particles, in particular with electrons and/or protons.

In order to carry out the previously described process for the red coloring of a jewelry diamond, an appropriate apparatus is necessary. It preferably comprises an electron accelerator delivering electrons with an energy between 2 MeV and 10 MeV into a process chamber, and a vacuum system suitable and intended to evacuate the process chamber and, in contrast to the prior art, additionally a heating device. This heating device is preferably adapted and intended to heat the process chamber and/or a vessel within the process chamber to a process temperature. The device further preferably comprises a temperature sensor suitable and intended to detect the temperature of the process chamber and/or the temperature of the vessel and/or the temperature of one or more diamond blanks within the vessel or within the process chamber as a temperature measurement value. A controller suitable and intended to control the heating device in dependence on the sensed temperature reading is preferably also part of the device. Typically, the device comprises electron optical device parts such as magnetic lenses, Wien filters, apertures and deflection units. Typically, the deflection units are used to allow the electron beam to travel across the diamond blanks during irradiation. (to scan) This causes the electrons to be essentially homogeneously distributed over the diamond blanks in the process chamber.

The disclosure thus also includes the use of the method described above for producing one or more red decorative diamonds, which can typically also be used as sensor elements, by means of a device as described previously. With regard to the color red, reference is made to the preceding explanations.

In this respect, the term "jewelry diamond" in this paper is also to be understood as a synonym for the word "sensor element".

FIG. 91

FIG. 91 illustrates the definition of times.

FIG. 92

FIG. 92 shows the non-linearity of the dependence of the contrast (KT) (see also FIG. 28) on the intensity ($I_{pmp}$) of the pump radiation (LB) reaching the paramagnetic center (NV1) or the paramagnetic centers (NV1) or the group (NVC) of paramagnetic centers (NV1) or the groups (NVC) of paramagnetic centers (NV1). The contrast increases to large intensities ($I_{pmp}$) of the pump radiation (LB). This is for single NV centers in diamond, i.e., not for HD-NV diamonds as described here, from the paper Staacke, R., John, R., Wunderlich, R., Horsthemke, L., Knolle, W., Laube, C., Glösekotter, P., Burchard, B., Abel, B. and Meijer, J. (2020), "Isotropic Scalar Quantum Sensing of Magnetic Fields for Industrial Application," Adv. Quantum Technol. doi:10.1002/qute.202000037, whose publication date is after the priority date of the priority-granting writings of this paper, is known. We refer in particular to FIGS. 3b and 3d of that writing. By having a high density of paramagnetic centers, such as by having a high density of NV centers as in a HD-NV diamond as described in that writing, the contrast (KT) can be increased beyond that shown in that writing, in particular to 25% and even 30% and even 40% and more, which is new compared to the prior art. Theoretically, values of contrast (KT) of 50% and more can be achieved. In this context, we refer to the paper L. Horsthemke, C. Bischoff, P. Glösekotter, B. Burchard, R. Staacke, J. Meijer "Highly Sensitive Compact Room Temperature Quantum Scalar Magnetometer" SMSI 2020, Pages 47-48, DOI 10.5162/SMSI2020/A1.4, ISBN 978-3-9819376-2-6, whose publication date is after the priority date of the priority-giving papers of this paper.

With increasing pump radiation intensity density ($I_{pmp}$), the contrast (KT) increases approximately root-like as a function of the density of the intensity ($I_{pmp}$) of the pump radiation (LB). In this paper, intensity ($I_{pmp}$, $I_{fl}$, $I_{kfl}$, $I_{ks}$) is understood as the power (energy/unit time) applied to a specimen. If the density of paramagnetic centers (NV1) in the sensing element is high, the higher pump radiation intensity density ($I_{pmp}$) increases the density of excited paramagnetic centers (NV1) and thus the probability of coupling paramagnetic centers (NV1) to each other and thus the probability of collective effects of the thus coupled, possibly large number of coupled paramagnetic centers (NV1). In the case of NV centers (NV1), the use of a HD-NV diamond and a high maximum intensity ($I_{pmpmax}$) of pump radiation (LB) increases the density of excited NV centers (NV1) and thus the contrast (KT). Thus, the method of fabricating such diamonds is a nuclear component of the proposal presented here. In order for the contrast (KT) to be high even in the medium, the time in which the intensity ($I_{pmp}$) of the pump radiation (LB) is different from the offset value ($I_{pmpoff}$) of the pump radiation intensity ($I_{pmp}$) and at the same time from the maximum value ($I_{pmpmax}$) of the pump radiation intensity ($I_{pmp}$) should be minimized. For the same reason, the spatial region within the sensor element where the intensity ($I_{pmp}$) of the pump radiation (LB) is different from the offset value ($I_{pmpoff}$) of the pump radiation intensity ($I_{pmp}$) and simultaneously from the maximum value ($I_{pmpmax}$) of the pump radiation intensity ($I_{pmp}$) should be spatially minimized. This can be done by focusing the pump radiation (LB), for example, by optical functional elements, such as lenses and/or curved mirrors and/or reflecting surfaces and/or photonic crystals, etc. Furthermore, the paramagnetic centers (NV1), i.e. in the example of a NV-HD diamond, should only occur in significant quantity and density in such spatial regions within the sensor element in which essentially a pump radiation intensity ($I_{pmp}$) of the pump radiation (LB) in the vicinity of the maximum pump radiation intensity ($I_{pmpmax}$) is achieved. Explicit reference is made here to the remarks on the Fabry-Perot interferometer and optical resonators in connection with FIG. 71. Preferably, such a range is fulfilled by the condition $I_{pmp}>50\%*I_{pmpmax}$ and/or better $I_{pmp}>75\%*I_{pmpmax}$ and/or better $I_{pmp}>90\%*I_{pmpmax}$ and/or better $I_{pmp}>95\%*I_{pmpmax}$ and/or better $I_{pmp}>98\%*I_{pmpmax}$ being satisfied at least at times.

For the design of the sensor element, a multiphysics simulation based on an FDTD simulation is explicitly recommended. The complex optical relationships (see FIG. 71) must be taken into account. The FDTD method is a finite difference time domain simulation, which is the English name for finite difference method in the time domain. The method is also called the Yee method. It is a mathematical method for the direct integration of time-dependent differential equations, which is mainly used to calculate the solutions of Maxwell's equations as in this case.

FIG. 93

FIG. 93 shows a simplified structure of a substrate (D) for measurement in transmission radiation. In contrast to FIG. 71, the fluorescence radiation (FL) now does not emerge from the substrate (D) via the first surface (OFL) via which the pump radiation (LB) enters the substrate (D). Rather, the fluorescence radiation (FL) now emerges via a second surface (OFL2). Now, in order to avoid the absorption and attenuation of the contrast (KT), it was recognized in the course of the preparation of the paper presented herein that the thickness ($d_{NVC}$) of the group (NVC) of parametric centers (NV1) must be limited for the transmission configuration of FIG. 93. Preferably, the thickness ($d_{NVC}$) of the group (NVC) of parametric centers (NV1) is not greater than 10000 times the pump radiation wavelength ($\lambda_{pmp}$) and/or better not greater than 5000 times the pump radiation wavelength ($\lambda_{pmp}$) and/or better not greater than 2000 times the pump radiation wavelength ($\lambda_{pmp}$) and/or better not greater than 1000 times the pump radiation wavelength ($\lambda_{pmp}$) and/or better not greater than 500 times the pump radiation wavelength ($\lambda_{pmp}$) and/or better not greater than 200 times the pump radiation wavelength ($\lambda_{pmp}$) and/or better not greater than 100 times the pump radiation wavelength ($\lambda_{pmp}$) and/or better not greater than 100 times the pump radiation wavelength ($\lambda_{pmp}$) and/or better not greater than 50 times the pump radiation wavelength ($\lambda_{pmp}$) and/or better not greater than 20 times the pump radiation wavelength ($\lambda_{pmp}$) and/or better not greater than 10 times the pump radiation wavelength ($\lambda_{pmp}$) and/or better not greater than 5 times the pump radiation wavelength ($\lambda_{pmp}$) and/or better not greater than 2 times the pump radiation wavelength ($\lambda_{pmp}$) and/or better not greater than 1 times the pump radiation wavelength ($\lambda_{pmp}$). A good contrast was obtained with a thickness ($d_{NVC}$) of the group (NVC) of parametric centers (NV1) not greater than 50 times the pump radiation wavelength ($\lambda_{pmp}$). In all other respects, reference is made to the comments on FIG. 71.

FIG. 94

FIG. 94 is based on FIG. 73, but in contrast to FIG. 73, the reading of the paramagnetic center(s) (NV1) or group(s) (NVC) of paramagnetic centers (NV1) is not done by the fluorescence radiation (FL), but by the value of the photocurrent. In the example of FIG. 94, a horizontal line (LH), a first horizontal shield line (SH1) and a second horizontal shield line (SH2) control this process. A center (PZ) again serves as a pump radiation source (PL1). The center (PZ) is pumped by a current flow between a cathode contact (KTH) and an anode contact (AN), so that the center PZ emits pump radiation (LB) having a pump radiation wavelength ($\lambda_{pmp}$). Thus, the center (PZ) serves here as an exemplary pump radiation source (PL1). The substrate (D) here serves as an optical functional element and couples this pump radiation to the paramagnetic center(s) (NV1) or group(s) (NVC) of paramagnetic centers (NV1). In the case of NV centers in diamond as paramagnetic centers (NV1) in the substrate (D), the horizontal line (LH) may be positively charged with respect to the substrate (D). The electric field of the horizontal line (LH) then causes the preferred state of the NV center to be the NV state. The NV center then generates photoelectrons. These can then be drawn off by the first horizontal screen line (SH1) and the second horizontal screen line (SH2) when a suitable voltage is applied between them. A photocurrent then flows in the first horizontal screen line (SH1) and the second horizontal screen line (SH2), which may depend on the magnetic flux density B or other physical parameters such as electric flux density D, temperature ϑ, acceleration a, gravitational field strength g, rotational speed ω, intensity of ionizing radiation etc. at the location of the paramagnetic center(s) (NV1) or group(s) (NVC) of paramagnetic centers (NV1). This photocurrent can be detected by a control and evaluation unit (LIV), as exemplarily presented herein, and converted into a measured value for the respective parameter affecting the photocurrent. This measured value of the photocurrent then depends on one or more of these physical parameters and can thus be further used as a measured value for them. As can be easily seen, the structure resembles a MOS transistor. In the case where paramagnetic centers in semiconductor crystals, for example G-centers in silicon or V-centers in SiC are used for the measurement, it is useful if the horizontal line (LH), which is here separated from the substrate (D) by an insulator (IS), is made of the same material, for example polycrystalline silicon in the case of silicon as substrate (D). In this regard, we refer, for example, to the paper C. Beaufils, W. Redjem, E. Rousseau, V. Jacques, A. Yu. Kuznetsov, C. Raynaud, C. Voisin, A. Benali, T. Herzig, S. Pezzagna, J. Meijer, M. Abbarchi, G. Cassabois "Optical properties of an ensemble of G-centers in silicon", Phys. Rev. B 97, 035303 09.01.2018 and the paper S. Castelletto, A. Boretti, "Silicon carbide color centers for quantum applications", J. Phys. Photonics 2 022001, 2020. Preferably, the insulator (IS) is then a gate oxide. Particularly preferably, in such a case of a semiconductor crystal as a substrate (D), the semiconductor crystal then also comprises electronic devices co-integrated with the paramagnetic center (NV1) or paramagnetic centers (NV1) in question or the group or groups (NVC) of paramagnetic centers (NV1) in a single substrate (D). Preferably, the substrate (D) then also comprises the drive and evaluation circuit (LIV) in whole or in part, so that it becomes conceivable to manufacture a single-chip solution entirely from silicon. For the pump radiation source, however, other possibilities can then also be considered. In this context, we refer by way of example to L. W. Snyman, J-L. Polleux, K. A. Ogudo, C. Viana, S. Wahlc, "High Intensity 100 nW 5 GHz Silicon Avalanche LED utilizing carrier energy and momentum engineering", Conference Paper in Proceedings of SPIE—The International Society for Optical Engineering—February 2014, DOI: 10.1117/12.2038195. We also refer to the as yet unpublished application PCT/DE 2020/100 430, which also deals with the complete integration of quantum systems.

FIG. 95

FIG. 95 shows the system of FIG. 5 but now with evaluation of the photocurrent and reference noise source and Dicke switch (DS).

In this example, the pump radiation source (PL1) is operated continuously and not modulated. The pump radiation source (PL1) irradiates the paramagnetic center (NV1) or the paramagnetic centers (NV1) or the group or groups (NVC) of paramagnetic centers (NV1) in the substrate (D) of the sensor element.

In this example, the compensation radiation source (PLK) is operated continuously and not modulated. The compensation radiation source (PLK) irradiates the paramagnetic reference center (NV2) or the paramagnetic reference centers (NV2) or the group or groups (NVC2) of paramagnetic reference centers (NV2) in the substrate (D) of the reference element.

For example, the sensing element may be an arrangement similar to FIG. 78, in which case it need not have, for example, the vertical line (LH) and the horizontal line (LH) and the first horizontal screen line (LH1) of FIG. 78. Thus, only device parts similar to the first vertical shield line (SV1) and the second vertical shield line (SV2) of FIG. 78 need be present together with contacts which are not drawn in FIG. 78 for convenience. At least a first contact then connects the first vertical shield line (SV1) to the substrate (D). At least one second contact then connects the second vertical shield line (SV2) to the substrate (D). Preferably, the first contact and the second contact are placed opposite the quantum dot (NV1/NVC) in such a way that, when an extraction voltage ($V_{ext}$) is applied between the first vertical screen line (SV1) and the second vertical screen line (SV2), the latter generates an electric extraction field around the quantum dot that is as homogeneous as possible, so that the photocurrent is extracted from the quantum dot (NV1/NVC) when the quantum dot (NV1/NVC) is irradiated with pump radiation (LB) and flows via the two screen lines (SV1, SV2). FIG. 97 shows such a proposal for a sensor element.

Also the reference element can be for example an arrangement according to the FIG. 78, whereby this then does not have to have for example the vertical line (LH) and the horizontal line (LH) and the first horizontal screen line (LH1) of the FIG. 78. Thus, again, only device parts similar to the first vertical screen line (SV1) and the second vertical screen line (SV2) of FIG. 78 need be present, together with contacts which are not drawn in FIG. 78 for convenience. At least a first contact then connects the first vertical shield line (SV1) to the substrate (D) of the reference element. At least one second contact then connects the second vertical shield line (SV2) to the substrate (D) of the reference element. Preferably, the first contact and the second contact are placed opposite the reference quantum dot (NV2/NVC2) in such a way that, when an extraction voltage (Next) is applied between the first vertical screen line (SV1) and the second vertical screen line (SV2), the latter generates an extraction electric field around the reference quantum dot which is as homogeneous as possible, so that the photocurrent is extracted from the reference quantum dot (NV2/NVC2) when the reference quantum dot (NV2/NVC2) is irradiated with compensating radiation (KS) and flows via the two screen lines (SV1, SV2). FIG. 98 shows such a proposal for a sensor element.

A Dicke switch (DS) is now used to switch back and forth between the sensor element photocurrent and the reference element photocurrent as a function of the transmission signal (S5). The output of the Dicke switch (DS) is the receiver upstream signal (S0). The first amplifier (V1) amplifies the receiver output signal (S0) to the reduced receiver output signal (S1). Preferably, in this case, the first amplifier (V1) is an amplifier with a current-guided input in order to be able to amplify the respective photocurrent. In a subsequent synchronous demodulator (M1, TP), a receiver output signal (S4) is generated which again corresponds to the value of the difference between the magnitude of the photocurrent of the sensor element and the magnitude of the photocurrent of the reference element. In the example of FIG. 95, a hold circuit (S&H) again samples the filter output signal (S4) in synchronism with the transmission signal period ($T_p$) of the transmission signal (S5) to ensure that the loop filter (TP) forms a definite integral and not an indefinite integral. In the example of FIG. 95, the synchronous demodulator comprises a first mixer (M1) which multiplies the transmission signal (S5) by the reduced receiver output signal (S0) and the loop filter (TP). Preferably, the sensor element and the reference element are implemented in the same way. The reference element may be shielded by a shield (AS) from physical parameters that may affect the photocurrent of the reference element. Such a shielding (AS) may be, for example, the material of a conductor inside which the reference element is located. The value of the sensor output signal (out), which is the output signal of the holding circuit (S&H) in this example, can then be used as a measurement value for such a parameter that affects the photocurrents of the sensor element and the reference element. More precisely, this measurement value represents a measurement value for the difference between the value of such an influencing parameter at the location of the sensor element and the value of the relevant influencing parameter at the location of the reference element. The loop filter (TP) is again implemented to allow a DC signal to pass and to block the transmission signal (S5).

FIG. 96

FIG. 96 is very similar to FIG. 95 except that the pump radiation source (PL1) both irradiates the sensing element and thus excites the quantum dot therein and irradiates the reference element and thus excites the reference quantum dot therein.

FIG. 97

FIG. 97 corresponds to FIG. 78, the function being limited to the extraction of the photocurrent. For this purpose, on the surface (OFL1) of the substrate (D), insulated by an electrical insulation (IS) from the substrate (D), there are a first vertical screen line (SV1) and a second vertical screen line (SV2). The first vertical shield line (SV1) is electrically connected to the substrate (D) through a first contact (KV11). The second vertical shield line (SV2) is electrically connected to the substrate (D) via a second contact (KV12). Contrary to what is drawn in the figure for reasons of comprehension, it is advantageous if the contacts along the respective screen line (SV1, SV2) are elongated and not square as drawn, since then the electric field in the region of the paramagnetic center (NV1) or the paramagnetic centers (NV1) or the group or groups (NVC) of paramagnetic centers (NV1) is more homogeneous. In the example of FIG. 97, when an extraction voltage ($V_{ext}$) is applied, a photocurrent ($I_{ph}$) flows from the first vertical screen line (SV1) via the paramagnetic center (NV1) or centers (NV1) or the group or groups (NVC) of paramagnetic centers (NV1). the group or groups (NVC) of paramagnetic centers (NV1) to the second vertical screen line (SV2) when the paramagnetic center (NV1) or the paramagnetic centers (NV1) or the group or groups (NVC) of paramagnetic centers (NV1) are irradiated with pump radiation (LB) of the pump radiation wavelength ($\lambda_{pmp}$). In the example of FIG. 97, the paramagnetic center (NV1) or the paramagnetic centers (NV1) or the group or groups (NVC) of paramagnetic centers (NV1) are located in an epitaxially applied, preferably isotopically pure epitaxial layer (DEPI). In the case of diamond as substrate (D), this epitaxial layer is preferably made of isotopically pure diamond. A device of FIG. 97 is suitable, for example, as a sensor element in a sensor system according to FIG. 95 or 96.

FIG. 98

FIG. 98 shows the structure of FIG. 97, whereby the paramagnetic center(s) (NV1) or the group(s) (NVC) of paramagnetic centers (NV1) are now replaced by the paramagnetic reference center(s) (NV2) or the group(s) (NVC2) of paramagnetic reference centers (NV2). What has been written about FIG. 97 can thus be transferred one-to-one. A device of FIG. 97 is suitable, for example, as a reference element in a sensor system corresponding to FIG. 95 or 96. Since preferably the reference element is designed in the same way as the sensor element, the difference between FIG. 98 and FIG. 97 is rather theoretical, so that a sensor element can usually be used as a reference element and vice versa.

FIG. 99

FIG. 99 shows a possibility to cause a directional dependence of a sensor element with a direction-independent sensitivity of the intensity ($I_{fl}$) of the fluorescence radiation (FL) by placing the sensor element with the paramagnetic center (NV1) or the paramagnetic centers (NV1) or the group or groups (NVC) of paramagnetic centers (NV1), for example, in a slot in a sheet of ferromagnetic material (FeM). Such a sensing element with a direction-independent sensitivity of the intensity ($I_{fl}$) of the fluorescence radiation (FL) may comprise, for example, a larger number of statistically equally distributed differently oriented diamond crystals of a diamond powder, in a glass or plastic matrix, these diamonds of the diamond powder preferably being HD-NV diamonds. When using a sensor system with a sensor element and a reference element, it is conceivable that one of these elements (sensor element or reference element) interacts with such a ferromagnetic material (FeM), i.e. a functional element of a magnetic circuit, in such a way that a directional dependence results for the sensitivity of the photocurrent or of the fluorescence radiation with respect to the magnetic flux density B.

Feature 1. Sensor System with a sensor element wherein the sensing element comprises or can be equal to a substrate (D), and wherein a volume of space can be selected in the substrate (D), and wherein the substrate (D) comprising in this volume of space a group (NVC) of paramagnetic centers (NV1) comprising at least two paramagnetic centers (NV1), and wherein the sensor system comprising first means (G, PL1) for exciting a fluorescence radiation (FL) of said group (NVC) of paramagnetic centers (NV1), and wherein the fluorescence radiation (FL) has a fluorescence radiation wavelength ($\lambda_{fl}$), and wherein the sensor system comprising second means (G, F1, PD, M1, TP) for detecting and evaluating the fluorescence radiation (FL), and wherein the external dimensions of the selected volume of space do not exceed twice the fluorescence radiation wavelength ($\lambda_{fl}$), and wherein the sensor system generating and/or providing a measured value by means of the first and second means (G, PL1, F1, PD, M1, TP) as a function of the fluorescence radiation (FL) of this group (NVC) of paramagnetic centers (NV1), and wherein the fluorescence radiation (FL) depends on a physical parameter, and wherein thus the measured value depends on the physical parameter, and wherein the measured value is used as the measured value of this physical parameter, characterized, in that the concentration of the paramagnetic centers (NV1) of this group (NVC) in the volume of space is on average greater than 100 ppm and/or 50 ppm and/or 20 ppm and/or 10 ppm relative to the number of atoms of the substrate (D) per unit volume in this volume of space.

Feature 2. Sensor system with a sensor element wherein the sensing element comprises or can be equal to a substrate (D), and wherein a volume of space can be selected in the substrate (D), and wherein the substrate (D) in this volume of space comprises a group (NVC) of paramagnetic centers (NV1), and wherein the sensor system comprises first means (G, PL1) for exciting a photocurrent of the photoelectrons of this group (NVC) of paramagnetic centers (NV1) by means of a pump radiation (LB) having a pump radiation wavelength ($\lambda_{pmp}$), and wherein the sensor system comprises second means (G, M1, TP) for detecting and evaluating the photocurrent of the photoelectrons of this group (NVC) of paramagnetic centers (NV1), and wherein the external dimensions of the selected volume of space do not exceed twice the pump radiation wavelength ($\lambda_{pmp}$), and wherein the sensor system generates and/or provides a measured value by means of the first and second means (G, PL1, M1, TP) in dependence on the photocurrent, and wherein the photocurrent depends on a physical parameter, and wherein thus the measured value depends on the physical parameter, and wherein the measured value is used as the measured value of this physical parameter, characterized, in that the concentration of the paramagnetic centers (NV1) of this group (NVC) in the volume of space is on average 100 ppm and/or 50 ppm and/or 20 ppm and/or 10 ppm relative to the number of atoms of the substrate (D) per unit volume in this volume of space.

Feature 3. Housing with a sensor system, wherein the sensor system comprises a sensor element, and wherein the sensor element comprises one or more paramagnetic centers (NV1) in the material of the sensor element, and wherein the sensor system comprises a pump radiation source (PL1), and wherein the pump radiation source (PL1) is suitable and intended for emitting pump radiation (LB) with a pump radiation wavelength ($\lambda_{pmp}$), and wherein said pump radiation (LB) causes said paramagnetic center or centers (NV1) to emit fluorescent radiation (FL) having a fluorescent radiation wavelength ($\lambda_{fl}$) upon irradiation of said paramagnetic center or centers (NV1) with said pump radiation (LB), and wherein the intensity ($I_{fl}$) of the fluorescence radiation (FL) depends on the intensity ($I_{pmp}$) of the pump radiation (LB) with which the paramagnetic center or centers (NV1) are irradiated and on a value of an external physical parameter and/or a value of the magnetic flux density B at the location of the paramagnetic center or centers (NV1), and wherein the sensor system comprises a radiation receiver (PD), and wherein the sensor system comprises evaluation means (V1, M1, TP, S&H, G, M2, OF2, OF1), and wherein fluorescence radiation (FL) from the paramagnetic center or centers (NV1) irradiates the radiation receiver (PD), and wherein the radiation receiver (PD) and evaluation means (V1, M1, TP, S&H, G, M2, OF2, OF1) determine a measured value which depends on the intensity ($I_{fl}$) of the fluorescence radiation (FL), and wherein the sensor system provides the measured value and/or outputs it as a sensor output signal (out), and wherein the housing comprises a cavity (CAV), and wherein the sensing element having the paramagnetic center(s) (NV1) is located in the cavity (CAV), and wherein the pump radiation source (PL1) is located in the cavity (CAV), and wherein the radiation receiver (PD) is located in the cavity (CAV), and wherein the evaluation means (V1, M1, TP, S&H, G, M2, OF2, OF1) are located in the cavity, and wherein the material of the housing allows the intensity ($I_{fl}$) of the fluorescence radiation (FL) of the paramagnetic center or centers (NV1) to be influenced by external physical parameters such as pressure and/or temperature and/or magnetic flux density B, characterized, in that the housing comprises means (RE),
  which are a housing part or a part of a housing part, and
  which direct the pump radiation (LB) onto the paramagnetic center or centers (NV1) and which thus optically couple the pump radiation source (PL1) to the paramagnetic center or centers (NV1) and/or
  directing the fluorescence radiation (LB) of the paramagnetic center or centers (NV1) onto the radiation receiver (PD) and thus optically coupling the radiation receiver (PL1) to the paramagnetic center or centers (NV1), and in that the means or means (RE) is or are
  a reflecting surface, and/or
  a curved reflecting surface, and/or
  a photonic crystal, and/or
  a beam splitter, and/or
  an optical fibre, and/or
  a grid, and/or
  a metallized surface, and/or
  a dielectric mirror, and/or
  a different optical functional element.

Feature 4. Housing according to feature 3 wherein the sensor system has a computer unit, and wherein the computer unit is housed in the cavity (CAV), and wherein the computer unit controls the evaluation means (V1, M1, TP, S&H, G, M2, OF2, OF1), and wherein the computer unit has a first data bus interface, and wherein the housing has exactly three connections, a first port, a second port and a third port, and wherein the first terminal is the supply voltage terminal (Vdd), and wherein the second terminal is the terminal of the reference potential (GND), and wherein the third port is a data bus line of the first data bus interface of the computer system.

Feature 5. Housing according to feature 3 wherein the sensor system has a computer unit, and wherein the computer unit is housed in the cavity (CAV), and wherein the computer unit controls the evaluation means (V1, M1, TP, S&H, G, M2, OF2, OF1), and wherein the computer unit has a first data bus interface, and wherein the computer unit comprises a second data bus interface, and wherein the housing being rectangular or square in plan view, and wherein the housing has exactly four connections, a first port and a second port and a third port and a fourth port, and wherein the first terminal is the supply voltage terminal (Vdd), and wherein the second terminal is the terminal of the reference potential (GND) and wherein the third port is a data bus line of the first data bus interface of the computer system, and wherein the fourth port is a data bus line of the second data bus interface of the computer system, and wherein the third port is located on a first side of the housing, and wherein the third port is located on a second side of the housing opposite the first side, and wherein the computer unit is provided for and suitable for participating in a method for automatically allocating bus node addresses to the bus subscribers of a data bus having a plurality of bus subscribers and a bus master which allocates the bus node addresses.

Feature 6. Sensor system, wherein the sensor system comprises a sensor element, and wherein the sensing element comprises one or more paramagnetic centers (NV1), and wherein the sensor system comprises a pump radiation source (PL1) and wherein the pump radiation source (PL1) is suitable and intended for emitting pump radiation (LB) with a pump radiation wavelength ($\lambda_{pmp}$), and wherein the pump radiation (LB) causes the paramagnetic center (NV1) or paramagnetic centers (NV1) to emit fluorescent radiation (FL) having a fluorescent radiation wavelength ($\lambda_{fl}$) upon exposure of said paramagnetic center (NV1) with said pump radiation (LB) or upon irradiation of said paramagnetic centers (NV1) with said pump radiation (LB), respectively, and wherein the intensity ($I_{fl}$) of the fluorescence radiation (FL) depends on the intensity ($I_{pmp}$) of the pump radiation (LB) with which the paramagnetic center (NV1) or the paramagnetic centers (NV1) are irradiated and on a value of an external physical parameter and/or a value of the magnetic flux density B at the location of the paramagnetic center (NV1) or at the location of the paramagnetic centers (NV1), and wherein the sensor system comprises a radiation receiver (PD), and wherein the sensor system comprises evaluation means (V1, M1, TP, S&H, G, M2, OF2, OF1), and wherein fluorescence radiation (FL) from the paramagnetic center(s) (NV1) irradiates the radiation receiver (PD), and wherein the sensor system provides the measured value and/or outputs it as a sensor output signal (out), characterized, in that the sensor system has a reference noise source (PLK, NV2), and in that the reference noise source (PLK, NV2) irradiates the radiation receiver (PD) with radiation (KS, KFL), and in that the radiation receiver (PD) and evaluation means (V1, M1, TP, S&H, G, M2, OF2, OF1) determine a measured value which depends on the total intensity of the superposition of the fluorescence radiation (FL) and the radiation (KS, KFL) of the reference noise source (PLK, NV2), and in that the intensity ($I_{kfl}$, $I_{ks}$) of the radiation (KS, KFL) of the reference noise source (PLK, NV2) depends on this measured value in such a way that a reduction in the intensity of the irradiation of the radiation receiver (PD) with fluorescence radiation (FL) results in an increase in the intensity ($I_{kfl}$, $I_{ks}$) of the irradiation with radiation (KS, KFL) of the reference noise source (PLK, NV2).

Feature 7. Sensor system according to feature 6, characterized, in that the reference noise source (PLK, NV2) is essentially equal in construction to the combination of pump radiation source (PL1) and sensor element with the paramagnetic center (NV1) or centers (NV1)

Feature 8. Sensor system according to one or more of features 6 to 7 wherein the radiation receiver (PD) substantially does not receive the pump radiation (LB), and wherein the radiation receiver (PD) receives the fluorescence radiation (FL) from the paramagnetic center (NV1) or centers (NV1).

Feature 9. Sensor system according to one or more of features 6 to 8 wherein the sensor system comprises a first filter (F1), which essentially does not let pass the pump radiation (LB), and which allows the fluorescence radiation (FL) of the paramagnetic center(s) (NV1) to substantially pass through, and wherein the first filter (F1) interacts with the radiation receiver (PD) such that the radiation receiver (PD1) substantially does not receive the pump radiation (LB), and wherein the first filter (F1) interacts with the radiation receiver (PD) so that the radiation receiver (PD) receives the fluorescence radiation (FL) from the paramagnetic center (NV1) or centers (NV1).

Feature 10. Sensor system according to one or more of features 6 to 9 wherein the sensing element comprises a crystal having a crystal axis, and wherein said crystal having said paramagnetic center (NV1) or paramagnetic centers (NV1), wherein the paramagnetic center (NV1) or paramagnetic centers (NV1) is or are aligned with respect to one of the following respective crystal axes in a first direction, and wherein the respective crystal axes are the crystal axes [100], [010], [001], [111] of the crystal and their equivalents (such as [−100], [−1, −1, −1], etc.), and wherein the paramagnetic center (NV1) or paramagnetic centers (NV1) emit fluorescence radiation (FL) when excited by the pump radiation (LB), and wherein the fluorescence radiation (FL) being modulated as a function of a magnetic field having a magnetic flux density B whose vector has a second direction, and wherein the second direction is different from the first direction.

Feature 11. Method of manufacturing a sensor system comprising the steps of providing (1) an open cavity housing with terminals and with a cavity (CAV) and insertion (2) a pump radiation source (PL1) into the cavity (CAV) and insertion (3) of an integrated circuit (IC), possibly comprising a computer unit, with a radiation receiver (PD) into the cavity (CAV), and electrical connection (4) of integrated circuit (IC) and, if applicable, radiation receiver (PD) and terminals and pump radiation source (PL1) and inserting (5) a sensor element with one or more paramagnetic centers (NV1) into the cavity (CAV) and fixing (6) of the sensor element by means of an attachment and fixing means (Ge) in the cavity (CAV), characterized by the steps:

manufacture (7) of means (RE), which are a housing part or a part of a housing part and which direct the pump radiation (LB) onto the paramagnetic center (NV1) and which thus optically couple the pump radiation source (PL1) to the paramagnetic center or centers (NV1) and/or direct the fluorescence radiation (LB) of the paramagnetic center or centers (NV1) onto the radiation receiver (PD) and thus optically couple the radiation receiver (PL1) to the paramagnetic center or centers (NV1), and close (8) the housing with a cover (DE), wherein the pump radiation source (PL1) is provided and adapted to emit pump radiation (LB), and the paramagnetic center (NV1) in the material of the sensor element emitting fluorescent radiation (FL) when irradiated with said pump radiation (LB), and said attachment and fixing means (Ge) being substantially transparent to said pump radiation (LB) and to said fluorescent radiation (FL).

Feature 12. Decorative diamond wherein the decorative diamond is a single crystal and wherein the decorative diamond is colored by a dyeing process, and wherein the decorative diamond appears red to a human observer when illuminated with white light, and wherein said decorative diamond having a first absorption coefficient ($\alpha_1$) when transilluminated with light having a wavelength of 437 nm in at least one possible transillumination direction at room temperature, and wherein said decorative diamond having a second absorption coefficient ($\alpha_2$) when transilluminated with light having a wavelength of 500 nm in at least one possible transillumination direction at room temperature, and wherein said decorative diamond having a third absorption coefficient ($\alpha_3$) when transilluminated with light having a wavelength of 570 nm in at least one possible transillumination direction at room temperature, and wherein said decorative diamond having a fourth absorption coefficient ($\alpha_4$) when transilluminated with light having a wavelength of 800 nm in at least one possible transillumination direction at room temperature, and wherein said decorative diamond having a fifth absorption coefficient ($\alpha_5$) when transilluminated with light having a wavelength between 200 nm and 400 nm in at least one possible transillumination direction at room temperature, characterized, in that the fifth absorption coefficient ($\alpha_5$) is greater than the first absorption coefficient ($\alpha_1$), and in that the first absorption coefficient ($\alpha_1$) is greater than the third absorption coefficient ($\alpha_3$), and in that the third absorption coefficient ($\alpha_3$) is greater than the second absorption coefficient ($\alpha_2$), and in that the second absorption coefficient ($\alpha_2$) is greater than the fourth absorption coefficient ($\alpha_4$), and in that the difference between the third absorption coefficient ($\alpha_3$) minus the second absorption coefficient ($\alpha_2$) is smaller than the difference between the second absorption coefficient ($\alpha_2$) minus the fourth absorption coefficient ($\alpha_4$).

Feature 13. Decorative diamond wherein the decorative diamond is colored by a dyeing process, and wherein the crystal of the decorative diamond is produced by a crystal growing process, and wherein the decorative diamond appears red to a human observer when illuminated with white light, and wherein said decorative diamond having a first absorption coefficient ($\alpha_1$) when transilluminated with light having a wavelength of 437 nm in at least one possible transillumination direction at room temperature, and wherein said decorative diamond having a second absorption coefficient ($\alpha_2$) when transilluminated with light having a wavelength of 500 nm in at least one possible transillumination direction at room temperature, and wherein said decorative diamond having a third absorption coefficient ($\alpha_3$) when transilluminated with light having a wavelength of 570 nm in at least one possible transillumination direction at room temperature, and wherein said decorative diamond having a fourth absorption coefficient ($\alpha_4$) when transilluminated with light having a wavelength of 800 nm in at least one possible transillumination direction at room temperature, and wherein said decorative diamond having a fifth absorption coefficient ($\alpha_5$) when transilluminated with light having a wavelength between 200 nm and 400 nm in at least one possible transillumination direction at room temperature, characterized in that the fifth absorption coefficient ($\alpha_5$) is greater than the first absorption coefficient ($\alpha_1$), and in that the first absorption coefficient ($\alpha_1$) is greater than the third absorption coefficient ($\alpha_3$), and in that the third absorption coefficient ($\alpha_3$) is greater than the second absorption coefficient ($\alpha_2$), and in that the second absorption coefficient ($\alpha_2$) is greater than the fourth absorption coefficient ($\alpha_4$), and in that the difference between the third absorption coefficient ($\alpha_3$) minus the second absorption coefficient ($\alpha_2$) is smaller than the difference between the second absorption coefficient ($\alpha_2$) minus the fourth absorption coefficient ($\alpha_4$).

Feature 14. Decorative diamond according to one or more of features 12 to 13
where the decorative diamond has one of the following cuts:
Pointed stone cut,
Table stone cut,
Rose cut,
Mazarin cut,
Brilliant cut,
Drop cut,
Prince cut,
Oval cut,
Heart cut,
Marquise cut,
Smaragd cut,
Asscher grind,
Cushion cut,
Radiant cut,
Diamond old cut,
Smaragd cut,
Baguette cut.

Feature 15. Decorative diamond according to one or more of features 12 to 14
with a quality grade of SI1 or VS1 or better.

Feature 16. Decorative diamond according to one or more of features 12 to 15
wherein the decorative diamond, when illuminated with white light against a white background, displays to the human observer a colour corresponding to RAL 3020 and/or RAL3024 and/or RAL 3026 and/or another RAL colour 3XXX, where XXX represents a three-digit number between 000 and 999.

Feature 17. Decorative diamond according to one or more of features 12 to 16
where the decorative diamond shows the red color "fancy-red" according to the GIA standard or
where the decorative diamond shows the red color "fancy-deep" according to GIA standard or
where the decorative diamond shows the red color "fancy-vivid" according to the GIA standard or
where the decorative diamond shows the red color "fancy-dark" according to the GIA standard or
where the decorative diamond shows the red color "fancy-intense" according to the GIA standard or
where the decorative diamond shows the red color "fancy light" according to GIA standard or
where the decorative diamond shows the red color "light" according to the GIA standard or
where the decorative diamond shows a red colour according to the images of diamonds on page 13 of John M. King's publication "GIA Colored Diamonds, Color Reference Charts", Gemological Institute of America, 2006, ISBN-10: 0873110536, ISBN-13: 978-0873110532 or
where the decorative diamond shows the orange-pink color "fancy-red" according to the GIA standard or
where the decorative diamond shows the orange-pink color "fancy-deep" according to the GIA standard or
where the decorative diamond shows the orange-pink color "fancy-vivid" according to the GIA standard or
where the decorative diamond shows the orange-pink color "fancy-dark" according to the GIA standard or
where the decorative diamond shows the orange-pink color "fancy-intense" according to the GIA standard or
where the decorative diamond shows the orange-pink color "fancy light" according to the GIA standard or
where the decorative diamond shows the orange-pink color "light" according to the GIA standard or
where the decorative diamond shows an orange-pink color according to the pictures of the diamonds on page 12 of John M. King's paper "GIA Colored Diamonds, Color Reference Charts", Gemological Institute of America, 2006, ISBN-10: 0873110536, ISBN-13: 978-0873110532.

Feature 18. Decorative diamond according to one or more of features 12 to 17,
wherein the decorative diamond fluoresces with a color in the range of 637 nm +/−10 nm when illuminated with white light against a white background.

Feature 19. Decorative diamond according to one or more of features 12 to 18,
wherein the decorative diamond has a fluorescence with a color temperature less than 2000 K and/or less than 1000 K.

Feature 20. Decorative diamond according to one or more of features 12 to 19,
wherein the decorative diamond has a color temperature of less than 1000 K when irradiated with white light in at least one irradiation direction.

Feature 21. Decorative diamond according to one or more of features 12 to 20,
having a density of NV centers of more than 0.01 ppm and/or of more than $10^{-3}$ ppm and/or of more than $10^{-4}$ ppm and/or of more than $10^{-5}$ ppm and/or of more than $10^{-6}$ ppm relative to the number of carbon atoms per unit volume.

Feature 22. Decorative diamond according to one or more of features 12 to 21,
wherein the density of the NV centers is less than 10 ppm and/or of less than 2 ppm and/or of less than 1 ppm and/or of less than 0.5 ppm and/or of less than 0.2 ppm and/or of less than 0.1 ppm and/or of less than 0.05 ppm and/or of less than 0.02 ppm and/or of less than 0.01 ppm and/or of less than 0.005 ppm and/or of less than 0.002 ppm and/or of less than 0.001 ppm and/or less than $5*10^{-4}$ ppm and/or less than $2*10^{-4}$ ppm and/or less than $10^{-5}$ ppm and/or less than $5*10^{-5}$ ppm and/or less than $2*10^{-5}$ ppm and/or less than $10^{-6}$ ppm and/or less than $5*10^{-6}$ ppm and/or less than $2*10^{-6}$ ppm and/or less than $10^{-7}$ ppm based on the number of carbon atoms per unit volume.

Feature 23. Decorative diamond according to one or more of features 12 to 22
wherein the decorative diamond has traces of irradiation with particles, in particular with electrons and/or protons.

Feature 24. A method of producing one or more red jewelry diamonds, in particular according to one or more of features 12 to 23:
provision of the diamond blank(s),
the diamond blank(s) comprising nitrogen atoms in the form of P1 centers and/or
the diamond blank(s) having a yellow colour, and/or
wherein the diamond blank or blanks comprise nitrogen atoms together with hydrogen;
irradiation of the diamond blank(s) with electrons,
wherein the energy of the electrons is greater than 500 keV and/or greater than 1 MeV and/or greater than 3 MeV and/or greater than 4 MeV and/or greater than 5 MeV and/or greater than 6 MeV and/or greater than 7 MeV and/or greater than 8 MeV and/or greater than 9 MeV and/or greater than 10 MeV, an energy of 10 MeV being preferred wherein the irradiation dose is preferably between $5*10^{17}$ cm$^{-2}$ and $2*10^{18}$ cm$^{-2}$, but at least below $10^{19}$ cm$^{-2}$, and wherein the temperature of the diamond or diamonds during irradiation is at an irradiation temperature greater than 600° C. and/or greater than 700° C. and/or greater than 800° C. and less than 900° C. and/or less than 1000° C. and/or less than 1100° C. and/or less than 1200° C., preferably between 800° C. and 900° C., and wherein the beam current of the electric current of these electrons is adjusted such that the irradiation time to achieve the above irradiation dose is at least 0.05 days and/or at least 0.5 days and/or at least 1 day and/or at least 2 days and/or at least 4 days and/or at least 8 days, but preferably 2 days.

Feature 25. A method according to feature 24.
wherein a diamond blank is a synthetic HPHT diamond or where a diamond blank is a synthetic CVD diamond.

Feature 26. A method according to one or more of the preceding features 24 to 25,
where a diamond blank has at least one ground surface prior to irradiation.

Feature 27. A method according to one or more of the preceding features 24 to 26,
wherein the irradiation takes place in a vacuum with a residual pressure of less than $10^{-4}$ mBar and/or of less than $10^{-5}$ mBar and/or of less than $10^{-6}$ mBar nd/or of less than $10^{-7}$ mBar and/or of less than $10^{-8}$ mBar and/or of less than $10^{-9}$ mBar and/or less than $10^{-10}$ mBar wherein a residual pressure of less than $10^{-6}$ mBar is preferred or wherein the irradiation takes place in an inert gas atmosphere, in particular in an agon atmosphere.

Feature 28. A method of one or more of the preceding features 24 to 27,
where a diamond blank has one of the following cuts prior to irradiation.
Pointed stone cut,
Table stone cut,
Rose cut,
Mazarin cut,
Brilliant cut,
Drop cut,
Prince cut,
Oval cut,
Heart cut,
Marquise cut,
Emerald cut,
Asscher cut,
Cushion cut,
Radiant cut,
Diamond old cut,
Emerald cut,
Baguette cut.

Feature 29. A method of one or more of the preceding features 24 to 28,
wherein a diamond blank has a size greater than 0.1 ct and/or greater than 0.2 ct and/or greater than 0.5 ct and/or greater than 1 ct and/or greater than 1.5 ct and/or greater than 2 ct.

Feature 30. A method according to one or more of the preceding features 24 to 29,
wherein the diamond blank or diamond blanks, when irradiated in a temperature controlled process chamber, are at a process chamber temperature or
wherein the diamond blank or blanks are at a process chamber temperature during irradiation in a temperature controlled vessel or
wherein the process chamber temperature is not more than 200° C. and/or not more than 100° C. and/or not more than 50° C. and/or not more than 20° C. and/or not more than 10° C. different from the irradiation temperature.

Feature 31. A method according to one or more of the preceding features 24 to 30,
wherein the diamond blank or diamond blanks are in a quartz vessel during irradiation.

Feature 32. Apparatus for carrying out a process according to one or more of the preceding features 24 to 31, comprising.
an electron accelerator that delivers electrons with an energy between 2 MeV and 10 MeV into a process chamber,
a vacuum system suitable and intended to evacuate the process chamber,
a heating device
wherein the heating device is suitable and intended to heat the process chamber and/or a vessel within the process chamber to a process temperature, and
a temperature sensor suitable and intended to detect the temperature of the process chamber and/or the temperature of the vessel and/or the temperature of one or more diamond blanks within the vessel or within the process chamber as a temperature measurement value, and
a controller suitable and intended to control the heating device as a function of the detected temperature reading.

Feature 33. Use of a method according to one or more of features 24 to 32 for producing one or more red decorative diamonds, in particular a decorative diamond according to one or more of features 12 to 23.

Feature 34. Use of a method according to one or more of features 24 to 32 and an apparatus according to feature 32 for producing one or more red decorative diamonds, in particular a decorative diamond according to one or more of features 12 to 23.

Feature 35. A method of testing a housing according to one or more of features 3 to 5, comprising the steps of
Irradiating the still open housing with pump radiation (LB) before closing it with a cover (DE);
Measurement (9) of the fluorescence radiation (FL) emitted by the paramagnetic center (NV1) of the sensor system in the cavity (CAV) of the housing;
Evaluating (10) the measured fluorescence radiation (FL) by comparing (10) the measured value of the fluorescence radiation (FL) with a threshold value.

Feature 36. A method of testing a housing according to one or more of features 3 to 5, comprising the steps of
Operation of the pump radiation source (PL1) for pump radiation (LB);
Measurement (9) of the pump radiation (LB) emitted by the housing;
Evaluating (10) the measured pump radiation (LB) by comparing (10) the measured value of the pump radiation (LB) with a threshold value.

Feature 37. A method of testing a housing according to one or more of features 3 to 5, comprising the steps of
Operation of the pump radiation source (PL1) for pump radiation (LB);
Measurement (9) of the fluorescence radiation (FL) emitted by the housing;
Evaluating (10) the measured fluorescence radiation (FL) by comparing (10) the measured value of the fluorescence radiation (FL) with a threshold value.

Feature 38. Method of operating a sensor system
wherein the sensor system comprises a sensor element and
wherein the sensing element comprises a plurality of paramagnetic centers (NV1), comprising the steps of
Modulated emission of a modulated pump radiation (LB) as a function of a modulated transmission signal (S5w);
Generating a modulated fluorescence radiation (FL) by means of the paramagnetic center (NV1) which depends on the modulated pump radiation (LB) and at least one further physical parameter;
Receiving the modulated fluorescence radiation (FL) and generating a receiver output signal (S0);
Correlating the receiver output signal (S0) with the modulated transmission signal (S5w) and forming a sensor output signal (out), the sensor output signal (out) depending on the intensity of the correlation of the modulation of the fluorescence radiation (FL) with the modulated transmission signal (S5w);
Use of the value of the sensor output signal (out) as a measured value for the at least one further physical parameter;
characterized in that
in that the density of the paramagnetic centers (NV1) in the sensor element is higher than $10^{-6}$ ppm and/or higher than 0.01 ppm.

Feature 39. A method according to feature 38,
wherein the correlation is done with the steps:
Subtraction of a feedback signal (S6) from the receiver output signal (S0) to the reduced receiver output signal (S1);
Multiplication of the reduced receiver output signal (S1) or a signal derived therefrom with the modulated transmission signal (S5w) to form the filter input signal (S3);
Filtering of the filter input signal (S3) with a loop filter (TP) to the filter output signal (S4);
Generating a complementary transmission signal (S5c) from the modulated transmission signal (S5w) and multiplying the filter output signal (S4) with the complementary transmission signal (S5c) to form the feedback signal (S6), or carrying out a combination of the filter output signal (S4) and the modulated transmission signal (S5) with the same result;
Use of the filter output signal (S4) to form the sensor output signal (out), wherein the sensor output signal (out) can be the same as the filter output signal (S4) in the sense of this feature.

Feature 40. A method according to feature 38,
wherein the correlation is done with the steps:
Multiplying the receiver output signal (S0) or a signal derived therefrom with the modulated transmission signal (S5w) to form the filter input signal (S3);
Filtering of the filter input signal (S3) with a loop filter (TP) to the filter output signal (S4);
Generating a complementary transmission signal (S5c) from the modulated transmission signal (S5w) and multiplying the filter output signal (S4) by the complementary transmission signal (S5c) to form the feedback signal (S6), or carrying out a combination of the filter output signal (S4) and the modulated transmission signal (S5) with the same result;
Driving a reference noise source in the form of a compensation radiation source (PLK) with the feedback signal (S6);
Emitting a compensation radiation (KS) by the compensation radiation source (PLK) as a function of the feedback signal (S6) or a compensation emission signal (S7) derived therefrom;
Irradiating compensating radiation (KS) into the radiation receiver (PD);
Superimposed receiving of the fluorescence radiation (FL) and the compensation radiation in the radiation receiver (PD1);
Using the filter output signal (S4) to form the sensor output signal (out), wherein the sensor output signal (out) can be the same as the filter output signal (S4) in the sense of this feature.

Feature 41. method of operating a sensor system
wherein the sensor system comprises a sensor element and
wherein the sensing element comprises a plurality of paramagnetic centers (NV1), comprising the steps:
Modulated emission of a modulated compensation radiation (KS) as a function of a modulated compensation transmission signal (S7w);
Generation of a modulated fluorescence radiation (FL) by means of the paramagnetic centers (NV1) which depends on a modulated pump radiation (LB) and at least one further physical parameter;
Superimposed reception of the modulated fluorescence radiation (FL) and the compensation radiation (KS) and generation of a receiver output signal (S0);
Correlation the receiver output signal (S0) with the modulated compensation transmission signal (S7w) and generation of a sensor output signal (out),
Usage of the value of the sensor output signal (out) as a measured value for the at least one further physical parameter;
characterized
in that the density of the paramagnetic centers (NV1) in the sensor element is higher than $10^{-6}$ ppm and/or higher than 0.01 ppm.

Feature 42. A method according to feature 41
wherein the correlation is done with the steps
Multiplying the receiver output signal (S0) or a signal derived therefrom with the modulated compensation transmission signal (S7w) to generate the filter input signal (S3);
Filtering of the filter input signal (S3) with a loop filter (TP) to the filter output signal (S4);
Generating a complementary compensation transmission signal (S7c) from the modulated compensation transmission signal (S7w) and multiplying the filter output signal (S4) with the complementary compensation transmission signal (S7c) to generate the complex feedback signal (S8), or carrying out a result equal catenation of the filter output signal (S4) and the modulated transmission signal (S5) with the same result to form the complex feedback signal (S8);
Driving a pump radiation source (PL1) with the complex feedback signal (S8) or a transmission signal (S5) derived therefrom;

Emission of a pump radiation (LB) by the radiation source (PL1) as a function of the complex feedback signal (S8) or a transmission signal (S5) derived therefrom.

Feature 43. Method of operating a sensor system
wherein the sensor system comprises a sensor element and
wherein the sensing element comprises a plurality of paramagnetic centers (NV1), comprising the steps:
Modulated emission of a modulated pump radiation (LB) by means of a modulated transmission signal (S5w);
Generating a modulated fluorescence radiation (FL) by means of the paramagnetic centers (NV1) which depends on the modulated pump radiation (LB) and at least one further physical parameter;
Receiving the modulated fluorescence radiation (FL) and generating a receiver output signal (S0);
characterized by the
Determining a value of the intensity ($I_{fl}$) of the modulated fluorescence radiation (FL) of the paramagnetic centers (NV1) at times when the modulated emission of the modulated pump radiation (LB) does not take place;
Outputting or holding this value as a measure of the at least one further physical parameter;
Use of this value as a measure of the at least one other physical parameter.

Feature 44. Sensor system
wherein the sensor system comprises a sensor element, and
wherein the sensing element comprises a plurality of paramagnetic centers (NV1), and
wherein the sensor system comprises a pump radiation source (PL1) for pump radiation (LB), and
wherein the intensity ($I_{pmp}$) of the pump radiation (LB) is modulated, and
wherein the pump radiation (LB) causes the paramagnetic centers (NV1) to emit fluorescence radiation (FL), and
wherein the fluorescence radiation (FL) is dependent on at least one physical parameter, and
characterized
in that the sensor system comprises means for detecting a fluorescence phase shift time (ΔTFL) between a modulation of the pump radiation (LB) and the corresponding modulation of the fluorescence radiation (FL) in the form of one or more measured values, and
in that the sensor system outputs or provides this one measured value or the plurality of measured values as a measured value or measured values for the at least one physical parameter.

Feature 45. Sensor system
wherein the sensor system comprises a sensor element and
wherein the sensing element comprises one or more paramagnetic centers (NV1), and
wherein the sensor system comprises a housing and
wherein the sensor system comprises a pump radiation source (PL1) and
wherein the pump radiation source (PL1) is suitable and intended for emitting pump radiation (LB) with a pump radiation wavelength ($\lambda_{pmp}$), and
wherein the pump radiation (LB) causes the paramagnetic center (NV1) or the paramagnetic centers (NV1) to emit fluorescence radiation (FL) having a fluorescence radiation wavelength ($\lambda_{fl}$) upon irradiation of this paramagnetic center (NV1) or the paramagnetic centers (NV1) with this pump radiation (LB), and
wherein the housing comprises at least one conductor line
wherein an electric current flows through the line and
wherein this electric current generates a magnetic flux density B and
wherein said magnetic flux density B influences the fluorescence radiation (FL) of the paramagnetic center or centers (NV1) and
wherein the sensor system determines a value for the fluorescence radiation (FL) and
wherein the sensor system provides and/or outputs this value for the fluorescence radiation (FL) in digital and/or analog form as a measured value for the electrical current in the line.

Feature 46. sensor system according to feature 45
wherein the concentration of NV centers in the diamond is greater than 0.01 ppm.

Feature 47. Sensor system,
wherein the sensor system comprises a sensing-element and
wherein the sensing element comprises one or more paramagnetic centers (NV1), and
wherein the sensor system comprises a pump radiation source (PL1) and
wherein the sensor system comprises a radiation receiver (PD) and
wherein the pump radiation source (PL1) emits pump radiation (LB) and
wherein the pump radiation (LB) has a pump radiation wavelength ($\lambda_{pmp}$) and
wherein the pump radiation (LB) causes the paramagnetic center (NV1) or the paramagnetic centers (NV1) to emit fluorescence radiation (FL) having a fluorescence radiation wavelength ($\lambda_{fl}$) upon irradiation of this paramagnetic center (NV1) or the paramagnetic centers (NV1) with this pump radiation (LB), and
wherein the fluorescence radiation (LB) has a fluorescence radiation wavelength ($\lambda_{fl}$), and
wherein the radiation receiver (PD) is sensitive to the fluorescence radiation wavelength ($\lambda_{fl}$), and
wherein the fluorescence radiation (FL) irradiates the radiation receiver (PD) and
wherein the sensing element and/or the quantum technological device element comprises a crystal having a crystal axis, and
wherein said crystal having said paramagnetic center (NV1) or paramagnetic centers (NV1),
wherein said paramagnetic center (NV1) or centers (NV1) being aligned with respect to one of the following respective crystal axes in a first direction, and
wherein the respective crystal axes are the crystal axes [100], [010], [001], [111] of the crystal and their equivalents (such as [−100], [−1, −1, −1], etc.), and
wherein the fluorescence radiation (FL) is modulated in response to a magnetic field having a magnetic flux density B which has a vector in a second direction, and
characterized in that
that the second direction is different from the first direction.

Feature 48. Sensor system according to feature 47,
wherein the crystal is a diamond crystal having a NV center as a paramagnetic center, and
wherein the second direction deviates from the first direction in such a way that the GSLAC extremum at a total magnetic flux density at the location of the paramagnetic center at 102.4 mT deviates by not more than 2% and/or not more than 1% and/or not more than 0.5% from the normalised 1 value of the intensity ($I_{fl}$) of the fluorescence radiation (FL).

Feature 49. Sensor system according to feature 47 and/or 48,
wherein the sensing element comprises a plurality of diamonds of different crystal orientations.

Feature 50. Sensor system,
wherein the sensor system comprises a sensor element and
wherein the sensing element comprises one or more paramagnetic centers (NV1), and
wherein the sensor system comprises a pump radiation source (PL1) and
wherein the sensor system comprises a radiation receiver (PD) and
wherein the pump radiation source (PL1) emits pump radiation (LB) and
wherein the pump radiation (LB) has a pump radiation wavelength ($\lambda_{pmp}$) and
wherein the pump radiation (LB) causing the paramagnetic center (NV1) or the paramagnetic centers (NV1) to emit fluorescence radiation (FL) with a fluorescence radiation wavelength ($\lambda_{fl}$) as a function of the magnetic flux B at the location of this paramagnetic center (NV1) or the paramagnetic centers (NV1), when this paramagnetic center (NV1) or the paramagnetic centers (NV1) are irradiated with this pump radiation (LB), and
wherein the radiation receiver (PD) is sensitive to the fluorescence radiation wavelength ($\lambda_{fl}$), and
wherein the fluorescence radiation (FL) irradiates the radiation receiver (PD) and
wherein the radiation receiver (PD) generates a receiver output signal (S0) in response to the fluorescence radiation (FL), and
wherein the sensor system comprises means, in particular a regulator (RG) and/or in particular a compensation coil (LC) and/or a permanent magnet,
to maximize the change in intensity ($I_{fl}$) of the fluorescent beams (FL) with a change in magnetic flux density B at the location of the paramagnetic center or centers (NV1) with respect to the particular application, or
to set a magnetic operating point in the form of a magnetic bias flux density $B_0$ at the location of the paramagnetic center or centers (NV1).

Feature 51. Use of a sensor system according to any one of the preceding features 6 to 10 and/or 42 to 47 for determining the position of an object,
wherein the object generates and/or modifies and/or modulates a magnetic field in the form of a magnetic flux density B, and
wherein this modulation is detected by the sensor system and
wherein the sensor system generates or provides at least one value, for example in the form of a sensor output signal (out), which depends on the value of the magnetic flux B at the location of the paramagnetic center (NV1) or centers (NV1), which is generated and/or modified and/or modulated by the object.

Feature 52. Use of a sensor system according to feature 51 wherein the generation and/or modification and/or modulation is periodic.

Feature 53. Use according to feature 52
wherein the periodicity is due to electrical and/or mechanical vibration and/or mechanical motion along a closed path.

Feature 54. Device,
wherein the device may in particular be a sensor system according to any one of the preceding features 6 to 10 and/or 44 to 49, and
wherein the device comprises a plurality of paramagnetic centers (NV1), and
wherein the device comprises a pump radiation source (PL1), and
wherein the device comprises a radiation receiver (PD) and
wherein the pump radiation source (PL1) emits pump radiation (LB) and
wherein the pump radiation (LB) has a pump radiation wavelength ($\lambda_{pmp}$) and
wherein said pump radiation (LB) causes said paramagnetic center (NV1) or paramagnetic centers (NV1) to emit fluorescence radiation (FL) having a fluorescence radiation wavelength ($\lambda_{fl}$) upon irradiation of said paramagnetic centers (NV1) with said pump radiation (LB), and
wherein the radiation receiver (PD) is sensitive to the fluorescence radiation wavelength ($\lambda_{fl}$), and
wherein the fluorescence radiation (FL) irradiates the radiation receiver (PD) and
wherein the radiation receiver (PD) generates a receiver output signal (S0) in response to the fluorescence radiation (FL), and
wherein at least two paramagnetic centers (NV1) of the paramagnetic centers (NV1) are coupled to each other, and
wherein the device is operated at a temperature >−40° C. and/or >−0° C. and/or >20° C.

Feature 55. Method according to one or more of the preceding method features
Comprising the step of coupling at least two paramagnetic centers (NV1).

Feature 56. Method of manufacturing a sensor system and/or quantum technological system comprising the steps of
Providing (14) a lead frame with connectors and
Mounting (15) a pump radiation source (PL1) on the lead frame and
Mounting (16) an integrated circuit (IC) with a radiation receiver (PD1) on the lead frame and
Electrically connecting (17) the integrated circuit (IC) and the radiation receiver (PD1) and the pump radiation source (PL1) and the terminals and
Mounting (18) a sensor element with one paramagnetic center (NV1) or with several paramagnetic centers (NV1) and
attaching (19) the sensor element and/or quantum technological device element by means of an attachment and fixing means (Ge), and
Covering (20) the sub-assembly with an encapsulation aid (GLT) and
Potting (21) of the sub-assembly with a potting compound,
wherein Q pump radiation source (PL1) is arranged to emit pump radiation (LB) having a pump radiation wavelength ($\lambda_{pmp}$), and
wherein said paramagnetic center(s) (NV1) emitting fluorescence radiation (FL) having a fluorescence radiation wavelength ($\lambda_{fl}$) when irradiated with said pump radiation (LB),
characterized
in that the encapsulation aid (GLT) is substantially transparent to radiation of the pump radiation wavelength ($\lambda_{pmp}$) of the pump radiation (LB) and to radiation of the fluorescence radiation wavelength ($\lambda_{fl}$) of the fluorescence radiation (FL).

Feature 57. sensor system,
wherein the sensor system comprises a sensor element and
wherein the sensing element comprises one or more paramagnetic centers (NV1), and
wherein the sensor system comprises a pump radiation source (PL1) and
wherein the sensor system comprises a radiation receiver (PD) and
wherein the pump radiation source (PL1) emits pump radiation (LB) and
wherein the pump radiation (LB) has a pump radiation wavelength ($\lambda_{pmp}$) and
wherein the pump radiation (LB) causing the paramagnetic center (NV1) or the paramagnetic centers (NV1) to emit fluorescence radiation (FL) with a fluorescence radiation wavelength ($\lambda_{fl}$) as a function of the magnetic flux B at the location of this paramagnetic center (NV1) or the paramagnetic centers (NV1), when this paramagnetic center (NV1) or the paramagnetic centers (NV1) are irradiated with this pump radiation (LB), and
wherein the radiation receiver (PD) is sensitive to the fluorescence radiation wavelength ($\lambda_{fl}$), and
wherein the fluorescence radiation (FL) irradiates the radiation receiver (PD) and
wherein the radiation receiver (PD) generates a receiver output signal (S0) in response to the fluorescence radiation (FL), and
wherein the sensor system comprising means, in particular a coil arrangement (L1, L2, L3, L4, L5), which is suitable for causing a change in the magnetic flux density B in amplitude and direction at the location of the paramagnetic center (NV1) or at the location of the paramagnetic centers (NV1) in such a way that this change in the magnetic flux density B in amplitude and direction at the location of the paramagnetic center (NV1) or paramagnetic centers (NV1) influences the fluorescence radiation (FL) of the paramagnetic center (NV1) or paramagnetic centers (NV1).

Feature 58. Integrated circuit (IC)
with a first coil (L1) and
with at least one further coil pair ([L2, L5], [L3, L6], [L4, L7]) and/or one further coil (L2, L3, L4, L5, L6, L7) and
characterized
in that the first coil (L1) and the at least one further coil pair ([L2, L5], [L3, L6], [L4, L7]) and/or the further coil (L2, L3, L4, L5, L6, L7) are suitable and provided for influencing the generation of fluorescence radiation (FL) from one paramagnetic center (NV1) or from a plurality of paramagnetic centers (NV1).

Feature 59. Circuit, in particular integrated circuit (IC), for use with one or more paramagnetic centers (NV1),
with a driver for operating a pump radiation source (PL1),
wherein the pump radiation source (PL1) emits pump radiation (LB) at least temporarily;
with a radiation receiver (PD1),
for selective detection of fluorescence radiation (FL) from the paramagnetic center (NV1) or centers (NV1),
wherein the radiation receiver (PD1), is arranged to substantially not detect the pump radiation (LB) in the sense of said selectivity, and
with one evaluation circuit (M1, TP, M2, S&H, G)
to generate a sensor output signal (out),
which depends on the fluorescence radiation (FL) of the paramagnetic center (NV1) or centers (NV1), and
whose value at least temporarily reflects the measured value to be detected,
whereas this value of the sensor output signal (out) depends on the fluorescence radiation (FL) of the paramagnetic center (NV1) or centers (NV1) and possibly on further physical parameters,
characterized by
a holding circuit (S&H),
wherein the holding circuit has an input and an output, and
wherein the holding circuit (S&H) is inserted in the signal path between the receiver output signal (S0) of the radiation receiver (PD1) and the sensor output signal (out), and
wherein the holding circuit (S&H) maintains its output signal at its output substantially constant in first time periods, and
the holding circuit (S&H) changing its output signal at its output in dependence on the signal at its input in second time periods different from the first time periods.

Feature 60. Method of operating a sensor system
wherein the sensor system comprises a sensor element and
wherein the sensing element comprises one or more paramagnetic centers (NV1), and comprising the steps:
Modulated emission of a modulated pump radiation (LB) by means of a modulated transmission signal (S5w);
Generating a modulated fluorescence radiation (FL) by means of the paramagnetic center (NV1) or centers (NV1) which depends on the modulated pump radiation (LB);
Receiving the modulated fluorescence radiation (FL) and generating a modulated receiver output signal (S0) as a function of the modulated fluorescence radiation (FL);
Correlating the modulated receiver output signal (S0) with the modulated transmission signal (S5w) and forming a filter output signal (S4), the filter output signal (S4) depending on the intensity of the correlation of the modulation of the fluorescence radiation (FL) with the modulated transmission signal (S5w);
characterized by the steps:
Sampling the filter output signal (S4), in particular by means of a holding circuit (S&H), while determining a sequence of samples and
Use of the sequence of samples as sensor output signal (out);

Feature 61. Method according to feature 60
wherein the correlation is done with the steps:
Formation of a feedback signal (S6) as a function of the sensor output signal (out) and the modulated transmission signal (S5w),
wherein the feedback signal (S6) has a signal component which is modulated complementarily (S5c) to a signal component of the modulated transmission signal (S5w);
Subtraction of the feedback signal (S6) from the receiver output signal (S0) to the reduced receiver output signal (S1);
Multiplication of the reduced receiver output signal (S1) with the modulated transmission signal (S5w) to the modulated filter input signal (S3);
Filtering of the modulated filter input signal (S3) with a loop filter (TP) to the filter output signal (S4).

Feature 62. A method of feature 61,
wherein the formation of a feedback signal (S6) in dependence on the sensor output signal (out) and the modulated transmission signal (S5w) is effected by multiplying the sensor output signal (out) by the modulated transmission signal (S5w) to form the feedback signal (S6), optionally combined with the multiplication of a suitable sign and optionally combined with the addition of a suitable offset.

Feature 63. A method feature 61 and/or 62
wherein the correlation is done with the steps:
Multiplication of the receiver output signal (S0) with the modulated transmission signal (S5w) to the filter input signal (S3);
Filtering and/or integrating the filter input signal (S3) with a loop filter (TP) to form the filter output signal (S4), the filter output signal possibly being multiplied by a factor −1;
Sampling the filter output signal (S4), in particular by means of a holding circuit (S&H), while determining a sequence of samples and
Using the sequence of samples as a sensor output signal (out);
Multiplication of the sensor output signal (out) with the modulated transmission signal (S5w) to form the feedback signal (S6);
Driving a compensation radiation source (PLK) with the feedback signal (S6) or a compensation transmission signal (S7) derived therefrom;
Emission of a compensation radiation (KS) by the compensation radiation source (PLK) as a function of the feedback signal (S6) or a compensation transmission signal (S7) derived therefrom;
Irradiation of compensating radiation (KS) into the radiation receiver (PD1);
Superimposing, in particular summing superimposed, reception of the fluorescence radiation (FL) and the compensation radiation (KS) in the radiation receiver (PD1) and formation of the receiver output signal (S0) as a function of this superimposition.

Feature 64. Method of operating a sensor system and/or quantum technological system
wherein the sensor system and/or quantum technological system comprises a paramagnetic center (NV1) in the material of a sensor element and/or quantum technological device element that is part of the sensor system and/or quantum technological system,
comprising the steps:
Modulated emission of a modulated compensation radiation (KS) by means of a modulated compensation emission signal (S7w), in particular by a compensation radiation source (PLK);
Generation of a modulated fluorescence radiation (FL) by means of a paramagnetic center (NV1) or by means of a plurality of paramagnetic centers (NV1) in a material of a sensor element, which depends on a modulated pump radiation (LB) and possibly further parameters, in particular the magnetic flux density B;
Superimposing, in particular summing superimposing, reception of the modulated fluorescence radiation (FL) and the compensation radiation (KS) and generation of a received signal (S0) as a function of this superimposition;
Correlation of the received signal (S0) with the modulated compensation transmission signal (S7w) and formation of a filter output signal (S4);
Generating a complex feedback signal (S8) modulated with the modulated compensation transmission signal (S7w) using a sensor output signal (out);
Forming the transmission signal (S5) from the transmit presignal (S8), in particular by offset addition and/or power amplification;
Control of a pump radiation source (PL1) with the transmission signal (S5);
Transmission of a pump radiation (LB) by the pump radiation source (PL1) as a function of the transmission signal (S5);
characterized by the steps:
Sampling the filter output signal (S4), in particular by means of a holding circuit (S&H), while determining a sequence of samples and
Using the sequence of samples as a sensor output signal (out).

Feature 65. A method according to feature 64
wherein the correlation is done with the steps:
Multiplication of the receiver output signal (S0) with the modulated compensation transmission signal (S7w) to the filter input signal (S3);
Filtering and/or integrating the filter input signal (S3) with a loop filter (TP) to form the filter output signal (S4), it being possible in particular for the filter output signal to be multiplied by a factor −1.

Feature 66. A method according to feature 64 and/or 65
wherein the complex feedback signal (S8) is formed by multiplying the filter output signal (S4) by the modulated compensation transmission signal (S7w) or by a compensation transmission signal (S7c) complementary to the modulated compensation transmission signal (S7w) with respect to the transmit bias signal (S8).

Feature 67. A method of operating a sensor system
wherein the sensor system comprises one or more paramagnetic centers (NV1), comprising the steps:
Modulated emission of a modulated pump radiation (LB) by means of a modulated transmission signal (S5w);
generating a modulated fluorescence radiation (FL) by means of the paramagnetic centers (NV1) or by means of the paramagnetic centers (NV1), which depends on the modulated pump radiation (LB) and at least one further physical parameter;
Receiving the modulated fluorescence radiation (FL) and generating a receiver output signal (S0);
characterized by the steps:
determining the intensity ($I_{fl}$) of the modulated fluorescence radiation (FL) of the paramagnetic center (NV1) or centers (NV1) in the form of a filter output signal (S4) at times when the modulated emission of the modulated pump radiation (LB), in particular by the pump radiation source (PL1) for pump radiation (LB), does not take place;
Sampling of the filter output signal (S4), in particular by means of a holding circuit (S&H), with determination of a sequence of samples;
Use of the sequence of samples as sensor output signal (out).

Feature 68. Sensor system
wherein the sensor system comprises a sensor element and
wherein the sensing element comprises one or more paramagnetic centers (NV1), and
wherein the sensor system comprises a pump radiation source (PL1) and wherein the pump radiation (LB) at first times causes the paramagnetic center (NV1) or paramagnetic centers (NV1) to emit fluorescence radiation (FL), and wherein the sensor system comprises means (PD1, A1, M1, TP, S&H, M2, A2, G, M1', TP', S&H', M2') which can be used at second times different from the first times and which at second times detect the fluorescence radiation (FL) of the paramagnetic center(s) (NV1) in the form of an additional filter output signal (S4'), and characterized in that the means (PD1, A1, M1, TP, S&H, M2, A2, G, M1', TP', S&H', M2') at the second times sample the additional filter output signal (S4') in the form of an additional sequence of additional samples, and this additional sequence of additional samples as an additional sensor output signal (out') which depends on the fluorescence radiation (FL) of the paramagnetic center (NV1) at these second times, and in that the sensor system comprises further means (S&H') for sampling, in the signal path between the received signal (S0) and the additional sensor output signal (out'), the respective signal at the point of insertion of these further means (S&H') in order to obtain the additional sequence of additional samples.

Feature 69. Method for the production of diamond or a diamond with a high concentration of NV centers Provision of the diamond(s), wherein the diamond or diamonds, when provided, comprise nitrogen atoms in the form of P1 centers and/or the diamond or diamonds being of a yellow colour when supplied, and/or the diamond(s) being of the GIA colours "fancy yellow" or "fancy deep yellow" or "fancy light yellow" or "fancy intense yellow" when supplied wherein the diamond or diamonds, when provided, comprise nitrogen atoms together with hydrogen;

Irradiation of the diamond(s) with particles, wherein the energy of the particles is greater than 500 keV and/or greater than 1 MeV and/or greater than 3 MeV and/or greater than 4 MeV and/or greater than 5 MeV and/or greater than 6 MeV and/or greater than 7 MeV and/or greater than 9 MeV and/or greater than 10 MeV, an energy of 10 MeV being preferred, and wherein the irradiation dose is preferably between $5*10^{17}$ cm$^{-2}$ and $2*10^{18}$ cm$^{-2}$, but at least below $10^{19}$ cm$^{-2}$, and wherein the temperature of the diamond or diamonds during irradiation is at a temperature greater than 600° C. and/or greater than 700° C. and/or greater than 800° C. and less than 900° C. and/or less than 1000° C. and/or less than 1100° C. and/or less than 1200° C., but particularly preferably between 800° C. and 900° C., and wherein the radiation current of the electric current of said particles is adjusted such that the irradiation time to achieve the above irradiation dose is at least 0.05 days and/or at least 0.5 days and/or at least 1 day and/or at least 2 days and/or at least 4 days and/or at least 8 days, but preferably 2 days.

Feature 70. A method according to feature 69
the particles being electrons and/or less preferably protons.

Feature 71. A method according to feature 69 or 70
wherein the temperature of the diamonds during irradiation is recorded as a temperature value and wherein a heating energy is supplied pulsed or PWM-modulated or otherwise pulse-modulated by means of heating energy pulses, and wherein the temperature of the diamonds is controlled by controlling the heating energy pulse height and/or the sensing factor and/or the temporal heating energy pulse spacing and/or the heating energy pulse width, and whereby this control takes place in dependence on the temperature value.

Feature 72. A method of one or more of features 69 to 71,
wherein a diamond is a synthetic HPHT diamond or where a diamond is a synthetic CVD diamond.

Feature 73. A method of one or more of features 69 to 72,
wherein a diamond has at least one ground surface prior to irradiation.

Feature 74. A method of one or more of features 69 to 73,
wherein the irradiation takes place in a vacuum with a residual pressure of less than $10^{-6}$ mBar and/or
wherein the irradiation takes place in an inert gas atmosphere, in particular in an agon atmosphere.

Feature 75. A method according to one or more of the preceding features 69 to 74,
wherein a diamond has one of the following cuts prior to irradiation:
Pointed cut,
Table stone cut,
Rose cut,
Mazarin cut,
Brilliant cut,
Teardrop cut,
Prince's cut,
Oval cut,
Heart cut,
Marquise cut,
Emerald cut,
Asscher cut,
Cushion cut,
Radiant cut,
Diamond old cut,
Emerald cut,
Baguette cut.

Feature 76. A method of one or more of features 69 to 75,
wherein the diamonds are smaller or on average smaller than 1 mm and/or smaller than 0.5 mm and/or smaller than 0.2 mm and/or smaller than 0.1 mm and/or smaller than 50 µm and/or smaller than 20 µm and/or smaller than 10 µm and/or smaller than 5 µm and/or smaller than 2 µm and/or smaller than 1 µm and/or smaller than 0.5 µm and/or smaller than 0.2 µm and/or smaller than 0.1 µm.

Feature 77. A method of any one or more of features 69 to 76,
the diamond or diamonds being in a quartz vessel during irradiation.

Feature 78. Synthetic diamond, also referred to in this document as HD-NV diamond,
with an at least local NV center density of more than 100 ppm and/or more than 50 ppm and/or of more than 20 ppm and/or more than 10 ppm relative to the number of carbon atoms per unit volume,
where here the term "local" means a reference volume greater than half the pump radiation wavelength ($\lambda_{pmp}$) to the third power.

Feature 79. diamond according to feature 78
wherein the diamond has been produced by a process according to one or more of features 69 to 77.

Feature 80. diamond according to one or more of features 78 to 79
  where the diamond is isotopically pure and
  where isotopically pure means that more than 99.5% of the atoms of the diamond can be assigned to one carbon isotope.

Feature 81. Sensor system according to one or more of the preceding features relating to a sensor system
  wherein the sensing element is a diamond according to one or more of features 78 to 80, and/or
  wherein the sensor system comprises a diamond according to one or more of features 78 to 80.

Feature 82. Sensor system according to one or more of the preceding features relating to a sensor system
  for determination
    the position of the object and/or
    a quantity derived from the position, in particular the velocity and/or acceleration and/or vibration, of an object, and/or
    the magnetization of the object, wherein the magnetization of the object may be caused by a current flow in the object or by ferromagnetic properties of the object or parts of the object, and/or
    a quantity derived from the magnetization of the object and/or
    a magnetization direction of the object relative to the sensor system and/or
    a quantity derived from the magnetization direction of the object.
  wherein the object generates and/or modifies and/or modulates a magnetic field, and
  whereby this generation and/or modification and/or modulation is detected by the sensor system and
  wherein the sensor system generates or provides at least one sensor output signal (out), the value of which depends on the value of the magnetic flux B at the location of the paramagnetic center (NV1) and/or at the location of the paramagnetic centers (NV1), which is generated and/or modified and/or modulated by the object.

Feature 83. Integrated circuit (IC)
  with a first coil (L1) and
  with at least one further coil pair ([L2, L5], [L3, L6], [L4, L7]) and/or one further coil (L2, L3, L4, L5, L6, L7) and
  wherein the first coil (L1) and the at least one further coil pair ([L2, L5], [L3, L6], [L4, L7]) and/or the further coil (L2, L3, L4, L5, L6, L7) are suitable and provided for influencing the generation of fluorescence radiation (FL) from one paramagnetic center (NV1) or from a plurality of paramagnetic centers (NV1),
  wherein the paramagnetic center (NV1) or centers (NV1) is one or more NV centers in a diamond according to one or more of features 78 to 80.

Feature 84. Method of operating a sensor system
  wherein the sensor system comprises one or more paramagnetic centers (NV1), and comprising the steps
  emitting a pump radiation (LB);
  generating a fluorescence radiation (FL) by means of the paramagnetic center (NV1) or by means of the paramagnetic centers (NV1), which depends on the modulated pump radiation (LB) and a further physical parameter;
  receiving the fluorescence radiation (FL) and generating a sensor output signal (out), wherein the sensor output signal (out) depends on the fluorescence radiation (FL),
  wherein the value of the sensor output signal (out) represents a measured value for the value of the further physical parameter and/or the intensity ($I_{fl}$) of the fluorescence radiation (FL)
  characterized
  in that the paramagnetic center (NV1) or paramagnetic centers (NV1) is one or more NV centers in a diamond according to one or more of features 78 to 80.

Feature 85. Quantum technological device comprising
  a sensor element,
  wherein the sensing element comprises a crystal having a crystal axis, and
  wherein said crystal having a paramagnetic center (NV1) in said crystal,
  wherein the quantum technological device comprising the possibility or means of exciting the paramagnetic center (NV1) by means of pump radiation (LB), and
  wherein the paramagnetic center (NV1) is oriented with respect to one of the following respective crystal axes in a first direction, and
  wherein the respective crystal axes are the crystal axes [100], [010], [001], [111] of the crystal and their equivalents (such as [−100], [−1, −1, −1], etc.), and
  wherein the paramagnetic center (NV1) emits fluorescence radiation (FL) when excited by the pump radiation (LB), and
  wherein the fluorescence radiation (FL) is modulated in a second direction as a function of a magnetic field having a magnetic flux density B, and
  wherein the second direction is different from the first direction.

Feature 86. A device according to feature 85
  wherein the quantum technological device is a sensor system, and
  wherein the sensor system has means (PL1, F1, PD, LIV [V1, M1, TP]),
    to influence the pump radiation (LB) and
    to detect fluorescence radiation (FL) and
    to determine a value as a function of the detected fluorescence radiation (FL),
  whereas this value being a measure of the magnetic flux density B at the location of the paramagnetic centers (NV1) or of another physical parameter influencing the fluorescence radiation (FL), and
  whereas the sensor system outputs this value and/or keeps it available for further use and/or processes it for other purposes.

Feature 87. Quantum technological device comprising
  a sensor element,
  wherein the sensing element comprises a crystal having a crystal axis, and
  wherein said crystal having a paramagnetic center (NV1) in said crystal,
  wherein the quantum technological device comprising the possibility or means of exciting the paramagnetic center (NV1) by means of pump radiation (LB), and
  wherein the paramagnetic center (NV1) is oriented with respect to one of the following respective crystal axes in a first direction, and
  wherein the respective crystal axes are the crystal axes [100], [010], [001], [111] of the crystal and their equivalents (such as [−100], [−1, −1, −1], etc.), and
  wherein the paramagnetic center (NV1) generates an electron current when excited by the pump radiation (LB) and wherein the electron current is modulated in a second direction as a function of a magnetic field having a magnetic flux density B, and wherein the second direction is different from the first direction.

Feature 88. Device according to feature 87
wherein the quantum technological device is a sensor system, and
wherein the sensor system has means (PL1, KNT, LIV [V1, M1, TP]),
to influence the pump radiation (LB) and
to suck up and capture the electron current and
to determine a value as a function of the detected electron current,
this value being a measure of the magnetic flux density B at the location of the paramagnetic centers (NV1) or of another physical parameter influencing the electron current, and
whereby the sensor system outputs this value and/or keeps it available for further use and/or processes it for other purposes.

Feature 89. A method of operating a quantum technological device
comprising the steps:
Providing a sensing element,
wherein the sensing element comprises a crystal having a crystal axis and wherein the crystal has a paramagnetic center (NV1) in the crystal;
Irradiating the paramagnetic center (NV1) with pump radiation (LB) with a pump radiation wavelength ($\lambda_{pmp}$);
Emitting fluorescence radiation (FL) as a function of the pump radiation (LB) and as a function of the value of a total magnetic flux density B at the location of the paramagnetic center (NV1) with respect to a coordinate system at rest with coordinate origin in the paramagnetic center (NV1);
Detecting at least a portion of the fluorescence radiation (FL) and determining a value of the fluorescence radiation (FL);
characterized
in that the paramagnetic center (NV1) is oriented with respect to one of the following respective crystal axes in a first direction, the respective crystal axes being the crystal axes [100], [010], [001], [111] of the crystal and their equivalents (such as [−100], [−1, −1, −1] etc.), and
in that the vector of the magnetic flux density B points in a second direction, and
in that this second direction is different from the first direction.

Feature 90. A device according to feature 89
wherein the quantum technological device is a sensor system, and
wherein the sensor system has means (PL1, F1, PD, LIV [V1, M1, TP]),
to influence the pump radiation (LB) and
to detect fluorescence radiation (FL) and
to determine a value as a function of the detected fluorescence radiation (FL),
whereas this value being a measure of the magnetic flux density B at the location of the paramagnetic centers (NV1) or of another physical parameter influencing the fluorescence radiation (FL), and
whereas the sensor system outputs this value and/or keeps it available for further use and/or processes it for other purposes.

Feature 91. Method of operating a quantum technological device
comprising the steps:
Providing a sensing element,
wherein the sensing element comprises a crystal having a crystal axis and wherein the crystal has a paramagnetic center (NV1) in the crystal
Irradiating the paramagnetic center (NV1) with pump radiation (LB) with a pump radiation wavelength ($\lambda_{pmp}$);
Generating an electron current as a function of the pump radiation (LB) and as a function of the value of a total magnetic flux density B at the location of the paramagnetic center (NV1) with respect to a coordinate system at rest with coordinate origin in the paramagnetic center (NV1);
Detecting at least a portion of the electron current and determining a value of the electron current;
characterized
in that the paramagnetic center (NV1) is oriented with respect to one of the following respective crystal axes in a first direction, the respective crystal axes being the crystal axes [100], [010], [001], [111] of the crystal and their equivalents (such as [−100], [−1, −1, −1] etc.), and
in that the vector of the magnetic flux density B points in a second direction, and
in that this second direction is different from the first direction.

Feature 92. A device according to feature 91
wherein the quantum technological device is a sensor system, and
wherein the sensor system has means (PL1, F1, PD, LIV [V1, M1, TP]),
to influence the pump radiation (LB) and
to detect the electron current and
to determine a value as a function of the detected electron current,
whereas this value being a measure of the magnetic flux density B at the location of the paramagnetic centers (NV1) or of another physical parameter influencing the electron current, and
whereas the sensor system outputs this value and/or keeps it available for further use and/or processes it for other purposes.

Feature 93. Procedure
for converting acoustic or other mechanical vibrations and/or position information and/or position change information and/or position change acceleration information into optical signals and/or digital electrical signals and/or analogue electrical signals,
with the steps,
generating a magnetic flux density B modulated with a first modulation signal, which may be constant;
detecting this modulated magnetic flux density B by means of a device based on paramagnetic centers (NV1) in a diamagnetic material, and
converting the detected value of the modulated magnetic flux density B into an optical signal and/or a digital electrical signal and/or an analogue electrical signal having a signal value which depends on the value of the modulated magnetic flux density B.

Feature 94. Device, in particular for measuring the fluorescence radiation (FL) of paramagnetic centers (NV1) and the physical parameters influencing it,
with a pump radiation source (PL1) and
with a diamagnetic material (MPZ) and
with a radiation receiver (PD) and with a mechanical system (MS) and
with a first field source (MQ1),
whereas the diamagnetic material (MPZ) having a paramagnetic center (NV1) and/or a plurality of paramagnetic centers (NV1), and
whereas the pump radiation source (PL1) emitting pump radiation (LB) suitable for exciting the paramagnetic center or centers (NV1), and
whereas the paramagnetic center (NV1) or centers (NV1) are irradiated by pump radiation (LB)
whereas the paramagnetic center(s) (NV1) emit fluorescence radiation (FL) and
whereas the first field source (MQ1) is mechanically coupled to the mechanical system (MS), and
whereas the mechanical system (MS) allows and/or causes movement of the first field source (MQ1) relative to the diamagnetic material (MPZ), and
whereas the radiation receiver (PD) detects the fluorescence radiation (FL) and converts it into a receiver output signal (S0) and/or a signal (S1) derived therefrom which depends on the fluorescence radiation (FL) of the paramagnetic center (NV1) or centers (NV1) or on a physical parameter influencing it,
whereas in particular the value of the receiver output signal (S0) and/or the value of a signal (S1) derived therefrom depends on the fluorescence radiation (FL) of the paramagnetic center (NV1) or paramagnetic centers (NV1) or on a physical parameter influencing the latter and thus represents, at least in terms of value, a measure of the fluorescence radiation (FL) of the paramagnetic center (NV1) or paramagnetic centers (NV1) or of the physical parameter influencing the latter.

Feature 95. Decorative diamond
where the decorative diamond is a single crystal and
wherein the decorative diamond is colored by a dyeing process, and
where the decorative diamond appears red to a human observer when illuminated with white light, and
said decorative diamond having a first absorption coefficient ($\alpha_1$) when transilluminated with light having a wavelength of 437 nm in at least one possible transillumination direction at room temperature, and
said decorative diamond having a second absorption coefficient ($\alpha_2$) when transilluminated with light having a wavelength of 500 nm in at least one possible transillumination direction at room temperature, and
said decorative diamond having a third absorption coefficient ($\alpha_3$) when transilluminated with light having a wavelength of 570 nm in at least one possible transillumination direction at room temperature, and
said decorative diamond having a fourth absorption coefficient ($\alpha_4$) when transilluminated with light having a wavelength of 800 nm in at least one possible transillumination direction at room temperature, and
said decorative diamond having a fifth absorption coefficient ($\alpha_5$) when transilluminated with light having a wavelength between 200 nm and 400 nm in at least one possible transillumination direction at room temperature, and
wherein the fifth absorption coefficient ($\alpha_5$) is greater than the first absorption coefficient ($\alpha_1$), and
wherein the first absorption coefficient ($\alpha_1$) is greater than the third absorption coefficient ($\alpha_3$), and
wherein the third absorption coefficient ($\alpha_3$) is greater than the second absorption coefficient ($\alpha_2$), and
wherein the second absorption coefficient ($\alpha_2$) is greater than the fourth absorption coefficient ($\alpha_4$), and
wherein the difference of the third absorption coefficient ($\alpha_3$) minus the second absorption coefficient ($\alpha_2$) is less than the difference of the second absorption coefficient ($\alpha_2$) minus the fourth absorption coefficient ($\alpha_4$).

Feature 96. Decorative diamond
wherein the decorative diamond is colored by a dyeing process, and
wherein the crystal of the decorative diamond is produced by a crystal growing process, and
where the decorative diamond appears red to a human observer when illuminated with white light, and
said decorative diamond having a first absorption coefficient ($\alpha_1$) when transilluminated with light having a wavelength of 437 nm in at least one possible transillumination direction at room temperature, and
said decorative diamond having a second absorption coefficient ($\alpha_2$) when transilluminated with light having a wavelength of 500 nm in at least one possible transillumination direction at room temperature, and
said decorative diamond having a third absorption coefficient ($\alpha_3$) when transilluminated with light having a wavelength of 570 nm in at least one possible transillumination direction at room temperature, and
said decorative diamond having a fourth absorption coefficient ($\alpha_4$) when transilluminated with light having a wavelength of 800 nm in at least one possible transillumination direction at room temperature, and
said decorative diamond having a fifth absorption coefficient ($\alpha_5$) when transilluminated with light having a wavelength between 200 nm and 400 nm in at least one possible transillumination direction at room temperature, and
wherein the fifth absorption coefficient ($\alpha_5$) is greater than the first absorption coefficient ($\alpha_1$), and
wherein the first absorption coefficient ($\alpha_1$) is greater than the third absorption coefficient ($\alpha_3$), and
wherein the third absorption coefficient ($\alpha_3$) is greater than the second absorption coefficient ($\alpha_2$), and
wherein the second absorption coefficient ($\alpha_2$) is greater than the fourth absorption coefficient ($\alpha_4$), and
wherein the difference of the third absorption coefficient ($\alpha_3$) minus the second absorption coefficient ($\alpha_2$) is less than the difference of the second absorption coefficient ($\alpha_2$) minus the fourth absorption coefficient ($\alpha_4$).

Feature 97. Decorative diamond according to one or more of features 95 to 96
where the decorative diamond has one of the following cuts:
Pointed stone cut
Table stone Cut
Rose cut
Mazarin cut
Brilliant cut
Drop cut
Prince cut
Oval cut
Heart cut
Marquise cut
Smaragd cut
Asscher cut
Cushion cut
Radiant cut
Diamond old cut
Smaragd cut
Baguette cut Feature 98. A decorative diamond according to one or more of features 95 to 97
with a quality grade of SI1 or VS1 or better.

Feature 99. A decorative diamond according to one or more of features 96 to 98
wherein the decorative diamond, when illuminated with white light against a white background, displays to the human observer a colour corresponding to RAL 3020 and/or RAL3024 and/or RAL 3026 and/or another RAL colour 3XXX, where XXX represents a three-digit number between 000 and 999.

Feature 100. A decorative diamond according to one or more of features 97 to 99
where the decorative diamond shows the red color "fancy-red" according to the GIA standard or
where the decorative diamond shows the red color "fancy-deep" according to GIA standard or
where the decorative diamond shows the red color "fancy-vivid" according to the GIA standard or
where the decorative diamond shows the red color "fancy-dark" according to the GIA standard or
where the decorative diamond shows the red color "fancy-intense" according to the GIA standard or
where the decorative diamond shows the red color "fancy light" according to GIA standard or
where the decorative diamond shows the red color "light" according to the GIA standard or
where the decorative diamond shows a red colour according to the images of diamonds on page 13 of John M. King's publication "GIA Colored Diamonds, Color Reference Charts", Gemological Institute of America, 2006, ISBN-10: 0873110536, ISBN-13: 978-0873110532 or
where the decorative diamond shows the orange-pink color "fancy-red" according to the GIA standard or
where the decorative diamond shows the orange-pink color "fancy-deep" according to the GIA standard or
where the decorative diamond shows the orange-pink color "fancy-vivid" according to the GIA standard or
where the decorative diamond shows the orange-pink color "fancy-dark" according to the GIA standard or
where the decorative diamond shows the orange-pink color "fancy-intense" according to the GIA standard or
where the decorative diamond shows the orange-pink color "fancy light" according to the GIA standard or
where the decorative diamond shows the orange-pink color "light" according to the GIA standard or
where the decorative diamond shows an orange-pink color according to the pictures of the diamonds on page 12 of John M. King's paper "GIA Colored Diamonds, Color Reference Charts", Gemological Institute of America, 2006, ISBN-10: 0873110536, ISBN-13: 978-0873110532.

Feature 101. A decorative diamond according to one or more of features 95 to 100
where the decorative diamond fluoresces with a color in the range of 637 nm+/−10 nm when illuminated with white light against a white background.

Feature 102. A decorative diamond according to one or more of features 95 to 101
wherein the decorative diamond has a fluorescence with a color temperature less than 2000K and/or less than 1000K.

Feature 103. A decorative diamond according to one or more of features 95 to 102
wherein the decorative diamond has a color temperature of less than 1000K when irradiated with white light in at least one irradiation direction.

Feature 104. A decorative diamond according to one or more of features 95 to 103
having a density of NV centers of more than 0.01 ppm and/or of more than $10^{-3}$ ppm and/or of more than $10^{-4}$ ppm and/or of more than 10-5 ppm and/or of more than $10^{-6}$ ppm relative to the number of carbon atoms per unit volume.

Feature 105. A decorative diamond according to one or more of features 96 to 104
wherein the density of the NV centers is less than 10 ppm and/or of less than 2 ppm and/or of less than 1 ppm and/or of less than 0.5 ppm and/or of less than 0.2 ppm and/or of less than 0.1 ppm and/or of less than 0.05 ppm and/or of less than 0.02 ppm and/or of less than 0.01 ppm and/or of less than 0.005 ppm and/or of less than 0.002 ppm and/or of less than 0,001 ppm and/or less than $5*10^{-4}$ ppm and/or less than $2*10^{-4}$ ppm and/or less than $10^{-5}$ ppm and/or less than $5*10^{-5}$ ppm and/or less than $2*10^{-5}$ ppm and/or less than $10^{-6}$ ppm and/or less than $5*10^{-6}$ ppm and/or less than $2*10^{-6}$ ppm and/or less than $10^{-7}$ ppm based on the number of carbon atoms per unit volume.

Feature 106. A decorative diamond according to one or more of features 95 to 105
wherein the decorative diamond has traces of irradiation with particles, in particular with electrons and/or protons.

Feature 107. A method of producing one or more red decorative diamonds, particularly according to one or more of features 95 to 106:
provision of the diamond blank(s),
the diamond blank(s) comprising nitrogen atoms in the form of P1 centers and/or
the diamond blank(s) having a yellow colour, and/or
wherein the diamond blank or blanks comprise nitrogen atoms together with hydrogen;
irradiation of the diamond blank(s) with electrons,
wherein the energy of the electrons is greater than 500keV and/or greater than 1 MeV and/or greater than 3 MeV and/or greater than 4 MeV and/or greater than 5 MeV and/or greater than 6 MeV and/or greater than 7 MeV and/or greater than 8 MeV and/or greater than 9 MeV and/or greater than 10 MeV, an energy of 10 MeV being preferred
wherein the irradiation dose is preferably between $5*10^{17}$ cm$^{-2}$ and $2*10^{18}$ cm$^{-2}$, but at least below $10^{19}$ cm$^{-2}$, and
wherein the temperature of the diamond blank or blanks during irradiation is at an irradiation temperature greater than 600° C. and/or greater than 700° C. and/or greater than 800° C. and less than 900° C. and/or less than 1000° C. and/or less than 1100° C. and/or less than 1200° C., preferably between 800° C. and 900° C., and
wherein the beam current of the electric current of these electrons is adjusted such that the irradiation time to achieve the above irradiation dose is at least 0.05 days and/or at least 0.5 days and/or at least 1 day and/or at least 2 days and/or at least 4 days and/or at least 8 days, but preferably 2 days.

Feature 108. A method of feature 107,
whereby the diamond blanks are thermally coupled to a heat sink via a thermal resistor during irradiation.

Feature 109. A method according to feature 107 or 108,
wherein the total energy input to the diamond blanks is controlled such that the one temperature probe placed in the vicinity of the diamond blanks during irradiation detects an average irradiation temperature of the diamond blanks of greater than 600° C. and/or greater than 700° C. and/or greater than 800° C. and less than 900° C. and/or less than 1000° C. and/or less than 1100° C. and/or less than 1200° C., preferably between 800° C. and 900° C.

Feature 110. A method according to feature 109,
wherein the total energy input to the diamond blanks has a temporal DC component and a temporal pulsed component with a temporal pulse spacing and a pulse height of the total energy input pulses, wherein the pulse height of the total energy input pulses of the total energy input and/or the temporal pulse spacing of the total energy input pulses is used to control the average irradiation temperature detected by the temperature probe.

Feature 111. A method of any one or more of features 107 to 110,
wherein a diamond blank is a synthetic HPHT diamond or wherein a diamond blank is a synthetic CVD diamond.

Feature 112. A method of one or more of the preceding features 108 to 111,
wherein a diamond blank has at least one ground surface prior to irradiation.

Feature 113. A method of one or more of the preceding features 108 to 112,
wherein the irradiation takes place in a vacuum with a residual pressure of less than $10^{-4}$ mBar and/or of less than $10^{-5}$ mBar and/or of less than $10^{-6}$ mBar and/or of less than $10^{-7}$ mBar and/or of less than $10^{-8}$ mBar and/or of less than $10^{-9}$ mBar and/or of less than $10^{-10}$ mBar and/or wherein a residual pressure of less than $10^{-6}$ mBar is preferred or
wherein the irradiation takes place in an inert gas atmosphere, in particular in an agon atmosphere.

Feature 114. A method of any one or more of the preceding features 108 to 113,
wherein a diamond blank has one of the following cuts prior to irradiation.
Pointed stone cut
Table stone cut
Rose cut
Mazarin cut
Brilliant cut
Drop cut
Prince cut
Oval cut
Heart cut
Marquise cut
Emerald cut
Asscher cut
Cushion cut
Radiant cut
Diamond old cut
Emerald cut
Baguette cut Feature 115. A method of any one or more of the preceding features 108 to 114,
wherein a diamond blank has a size greater than 0.1 ct and/or greater than 0.2 ct and/or greater than 0.5 ct and/or greater than 1 ct and/or greater than 1.5 ct and/or greater than 2 ct.

Feature 116. A method of any one or more of the preceding features 108 to 115,
wherein the diamond blank or diamond blanks, when irradiated in a temperature controlled process chamber, are at a process chamber temperature or
wherein the diamond blank or diamond blanks are at a process chamber temperature during irradiation in a temperature controlled vessel or
wherein the process chamber temperature is not more than 200° C. and/or not more than 100° C. and/or not more than 50° C. and/or not more than 20° C. and/or not more than 10° C. different from the irradiation temperature.

Feature 117. The method of any one or more of the preceding features 108 to 116,
wherein the diamond blank or blanks are in a quartz vessel during irradiation.

Feature 118. Apparatus for carrying out a process according to one or more of the preceding features 108 to 117, comprising.
an electron accelerator that delivers electrons with an energy between 2 MeV and 10 MeV into a process chamber,
a vacuum system suitable and intended to evacuate the process chamber,
a heating device
wherein the heating device is suitable and intended to heat the process chamber and/or a vessel within the process chamber to a process temperature, and
a temperature sensor suitable and intended to detect the temperature of the process chamber and/or the temperature of the vessel and/or the temperature of one or more diamond blanks within the vessel or within the process chamber as a temperature measurement value, and
a controller suitable and intended to control the heating device as a function of the detected temperature reading.

Feature 119. Usage of a method according to one or more of features 108 to 117 for producing one or more red decorative diamonds, in particular a decorative diamond according to one or more of features 95 to 106.

Feature 120. Usage of a method according to one or more of features 108 to 117 and of an apparatus according to feature 118 to produce one or more red decorative diamonds, in particular a decorative diamond according to one or more of features 95 to 106.

Feature 121. Method of operating a sensor system
wherein the sensor system comprises a sensor element and
wherein the sensing element comprises one or more paramagnetic centers (NV1), and comprising the steps
generating a modulated transmission signal (S5w);
emitting a modulated pump radiation (LB) as a function of the modulated transmission signal (S5w),
generating a modulated fluorescence radiation (FL) by means of the paramagnetic center (NV1) or centers (NV1) which depends on the modulated pump radiation (LB),
wherein the value of a physical parameter influences the modulated fluorescence radiation (FL) and/or where the value of the magnetic flux density B at the location of the paramagnetic center (NV1) influences the modulated fluorescence radiation (FL);

receiving the modulated fluorescence radiation (FL) and generating a modulated receiver output signal (S0) as a function of the modulated fluorescence radiation (FL);

correlating the modulated receiver output signal (S0) with the modulated transmission signal (S5w) or a signal derived therefrom and forming a filter output signal (S4), the filter output signal (S4) depending on the intensity of the correlation of the modulation of the fluorescence radiation (FL) with the modulated transmission signal (S5w);

using the filter output signal (S4) as a measured value for the value of a physical parameter influencing the modulated fluorescence radiation (FL) and/or the value of the magnetic flux density B at the location of the paramagnetic center (NV1), characterized in that the modulated transmission signal (S5w) is PWM-modulated or otherwise pulse-modulated with a duty cycle of less than 50%, and in that the duty cycle of the modulated transmission signal (S5w) is defined here as the transmission signal pulse duration ($T_{S5pmp}$) divided by the transmission signal period ($T_P$).

Feature 122. Optical waveguide characterized in that the optical waveguide is optically coupled to an HD-NV diamond, that is, a diamond according to one or more of features 78 to 80.

Feature 123. Optical function element characterized in that the optical functional element comprises an HD-NV diamond, that is, a diamond according to one or more of features 78 to 80.

Feature 124. Fluorescent light source characterized in that it comprises a pump light source (PL1) which generates pump radiation (LB) having a pump radiation wavelength ($\lambda_{pmp}$), and in that it comprises an HD-NV diamond, i.e. a diamond according to one or more of features 78 to 80, wherein the HD-NV diamond is irradiated with the pump radiation (LB) and emits fluorescence radiation (FL) having a fluorescence radiation wavelength ($\lambda_{fl}$), where the fluorescence radiation (FL) leaves the fluorescence light source.

Feature 125. Fluorescent light source according to feature 124 with a first filter (F1), which is substantially non-transparent to radiation at the pumping wavelength ($\lambda_{pmp}$), and which is substantially transparent to radiation of fluorescence wavelength ($\lambda_{fl}$), so that essentially only fluorescence radiation (FL) leaves the fluorescent light source.

Feature 126. Fluorescent light source according to feature 124 or 125 wherein the fluorescence radiation (FL) depends on a physical parameter and/or the magnetic flux density B.

Feature 127. Filter (F1) for an optical quantum technological device wherein the quantum technological device comprises one or more paramagnetic centers (NV1) and/or one or more groups (NVC) of paramagnetic centers (NV1), and wherein electromagnetic radiation occurs or is used in the sensor system, and wherein the filter (F1) being intended to allow predetermined portions of this radiation to pass and not to allow other portions of the electromagnetic radiation to pass, and wherein the filter is constructed from metallization pieces of the metallization stack of an integrated microelectronic circuit.

Feature 128. Sensor system with one or more paramagnetic centers (NV1) or one or more groups (NVC) of paramagnetic centers (NV1) in a substrate (D), hereinafter referred to as paramagnetic centers (NV1), wherein the sensor system comprises first means (G, PL1, F1, PD, M1, TP) for exciting and detecting and evaluating the fluorescence radiation (FL) of these paramagnetic centers (NV1), and wherein the sensor system generates and/or provides a measured value by means of the first means (G, PL1, F1, PD, M1, TP) as a function of the fluorescence radiation (FL) of these paramagnetic centers (NV1), and wherein the sensor system comprises an electrical conductor (LH, LV, LTG) and wherein the electrical conductor (LH, LV, LTG) is mechanically connected to the substrate (D) having the paramagnetic centers (D), and wherein an electric current (IH, IV) flows through the electric conductor (LH, LV, LTG), characterized in that the said electric current (IH, IV) generates a magnetic flux B which influences the fluorescence radiation (FL) of these paramagnetic centers (NV1), and in that the shortest distance (r) between the center of gravity of the paramagnetic centers (NV1) and the conductor (LH, LV, LTG) is shorter than 1 µm, better less than 500 nm, better less than 200 nm, better less than 100 nm, better less than 50 nm, better less than 20 nm or in that the shortest distance (r) between a paramagnetic center (NV1) of the paramagnetic centers (NV1) and the conductor (LH, LV, LTG) is shorter than 1 µm, better less than 500 nm, better less than 200 nm, better less than 100 nm, better less than 50 nm, better less than 20 nm.

Feature 129. Quantum sensor system for detecting a relative value of a physical parameter with a sensor element and with evaluation means (G, PD, V1, M1, TP), wherein the sensing element comprises a paramagnetic center (NV1) which is influenced by the physical parameter, or several paramagnetic centers (NV1) influenced by the physical parameters, or a group (NVC) of paramagnetic centers (NV1) influenced by the physical parameter, or several groups (NVC) of paramagnetic centers (NV1) influenced by the physical parameter, as a quantum dot and wherein the quantum dot is irradiated with pump radiation (LB) and wherein the evaluation means (PD, V1) either detect a first photocurrent of the quantum dot of the sensing element and generate a receiver output signal (S0) as a function of the first photocurrent or detect an intensity ($I_{fl}$) of a fluorescence radiation (FL) of the quantum dot of the sensing element and generate a receiver output signal (S0) depending on the intensity ($I_{fl}$) of a fluorescence radiation (FL), and with a reference element and wherein the reference element comprises a paramagnetic reference center (NV2) influenced by the physical parameter, or several paramagnetic reference centers (NV2) influenced by the physical parameter, or a group (NVC2) of paramagnetic reference centers (NV2) influenced by the physical parameter, or several groups (NVC2) of paramagnetic reference centers (NV2), which is influenced by the physical parameter, as a reference quantum dot and wherein the reference quantum dot is irradiated with compensation radiation (KS) and wherein the evaluation means (PD, V1, M1, TP) either additionally detect a second photocurrent of the reference quantum dot of the reference element and generate a receiver output signal (S0) as a function of the first photocurrent and now additionally also as a simultaneous function of the second photocurrent or additionally detect an intensity ($I_{kfl}$) of a compensation fluorescence radiation (KFL) of the reference quantum dot of the reference element and generate a receiver output signal (S0) as a function of the intensity ($I_{fl}$) of a fluorescence radiation (FL) and now additionally also as a simultaneous function of the intensity ($I_{kfl}$) of a compensation fluorescence radiation (KFL), and wherein the evaluation means (M1, TP) generates from the receiver output signal (S0) a measured value in the form of the value of a sensor output signal (out) for the difference between the value of the physical parameter at the location of the quantum dot and the value of the physical parameter at the location of the reference quantum dot, which is used or can be used as a measured value for this measured value.

LIST OF REFERENCE SYMBOLS AND ABBREVIATIONS $\alpha_k$ crossing angle between the horizontal line (LH) and the vertical line (LV) of a quantum bit (QUB) comprising one or more paramagnetic centers (NV1) or a group (NVC) or groups (NVC) of paramagnetic centers.

a1 portion of the value i1 of the pump radiation (LB) in the first transmission path (I1) which reaches the sensor element and the paramagnetic centers (NV1) contained therein.

A1 first adder;

a2 second portion of the pump radiation (LB), which the paramagnetic center or centers (NV1) convert into fluorescence radiation (FL), with an intensity ifl and which reaches the first optical filter (F1);

A2 second adder;

a3 third portion of the pump radiation (LB) to which the intensity ($I_{pmp}$) of the pump radiation (LB) is reduced after interaction with the sensing element and when it reaches the first optical filter (F1);

a4 fraction of the value of the fluorescence radiation (FL) reaching the radiation receiver (PD) by which the fluorescence radiation (FL) is reduced after passing the first filter (F1);

a5 fifth fraction of the radiation intensity emitted by the compensating radiation source (PLK) reaching the radiation receiver (PD);

AK absorption coefficient (in FIG. 90 referred to 1=100% absorption);

AS magnetic shielding;

ASv frontside adoption layer (anti-reflective layer);

ASr backside adoption layer (anti-reflective layer);

AN anode contact b0 offset value;

$B_0$ bias flux density;

BA1 first barrier;

BA2 second barrier;

BA3 third barrier;

BD1 first bond wire;

BD2 second bond wire;

BD3 third bond wire;

BD4 fourth bond wire;

$B_m$ is the minimum magnetic flux density for the flux density B at the location of the paramagnetic center (NV1) or the paramagnetic centers (NV1) or the group or groups (NVC) of paramagnetic centers (NV1) above which the monotonically falling curve of FIG. 27 for the dependence of the intensity ($I_{fl}$) of the fluorescence radiation (FL) on the magnetic flux density B results, whereas this curve then also being bijective and thus calibratable.

$B_{NV}$ flux density vector of the circularly polarized electromagnetic wave field for manipulating the quantum dot with the paramagnetic center (NV1) or the group or groups (NVC) of paramagnetic centers (NV1) at the location of the quantum dot with the paramagnetic center (NV1) or the group or groups (NVC) of paramagnetic centers (NV1). In FIG. 75, the rotation of this flux density vector is drawn for better understanding. In FIG. 75, the rotation of the flux density vector is obtained by driving the horizontal line (LH) with a horizontal current component (IH) modulated with a horizontal electron-electron microwave frequency ($f_{MWH}$) with a horizontal modulation, and by driving the vertical line (LV) with a vertical current component (IV) modulated with a vertical electron-electron microwave frequency ($f_{MWV}$) with a vertical modulation shifted +/−π/2 in phase with respect to the horizontal modulation. The vertical electron-electron microwave frequency ($f_{MWV}$) and the horizontal electron-electron microwave frequency ($f_{MWH}$) are typically equal to each other, and thus typically equal to a common electron-electron microwave frequency ($f_{MW}$). Thus, when the quantum bit (QUB) is driven, the modulation of the horizontal current (IH) in the horizontal line (LH) is phase-locked with respect to the modulation of the vertical current (IV) in the vertical line (LH) for the duration of the drive, e.g., during a π/4π or a/2 or a π-pulse;

$B_{NV1}$ flux density vector of the circularly polarized electromagnetic wave field for manipulating the first quantum dot (NV1) at the location of the first quantum dot (NV1);

BO package bottom;

$B_{opt}$ flux density of the optimum magnetic operating point of the sensor element with the paramagnetic centers (NV1) and/or the group (NVC) of paramagnetic centers (NV1) and/or the groups (NVC) of paramagnetic centers. At this value of the optimum magnetic flux density ($B_{opt}$), the dependence of the intensity ($I_{fl}$) of the fluorescence radiation (FL) on the magnetic flux density B is maximized;

$B_{VHNV1}$ first virtual horizontal magnetic flux density vector at the location of the first virtual horizontal quantum dot (VHNV1);

$B_{VHNV2}$ second virtual horizontal magnetic flux density vector at the location of the second virtual horizontal quantum dot (VHNV2);

$B_{VVNV1}$ first virtual vertical magnetic flux density vector at the location of the first virtual vertical quantum dot (VVNV1);

$B_{VVNV2}$ second virtual vertical magnetic flux density vector at the location of the second virtual vertical quantum dot (VVNV2);

CAV cavity formed by the package bottom (BO) and the circumferential wall (WA) and opened upwards without cover (DE) via the mounting opening (MO);

CBA control unit A;

CBB control unit B;

CI nuclear center. In the case of an isotopically pure $^{12}$C diamond, a nuclear center can be formed by, for example, $^{13}$introducing a C isotope into the diamond that has a nuclear magnetic momentum.

$CI1_1$ first nuclear quantum dot ($CI1_1$) of the first quantum ALU (QUALU1);

$CI1_2$ second nuclear quantum dot ($CI1_2$) of the first quantum ALU (QUALU1);

$CI1_3$ third nuclear quantum dot ($CI1_3$) of the first quantum ALU (QUALU1);

$CI2_1$ first nuclear quantum dot ($CI2_1$) of the second quantum ALU (QUALU2);

$CI2_2$ second nuclear quantum dot ($CI2_2$) of the second quantum ALU (QUALU2);

$CI2_3$ third nuclear quantum dot ($CI2_3$) of the second quantum ALU (QUALU2);

CIC group (cluster) of nuclear centers (CI). Such a group comprises at least one nuclear center (CI). Preferably, however, such a group comprises a plurality of nuclear centers (NV1). The nuclear centers (CI) of a group of nuclear centers (CI) are generally arranged in such close proximity to one or more paramagnetic centers (NV1) or one or more groups (NVC) of paramagnetic centers (NV1) that the nuclear centers (CI) are in contact with the paramagnetic center (NV1) or the paramagnetic centers (NV1) or the group or groups (NVC) of paramagnetic centers (NV1), respectively, and thus can be entangled. By using the paramagnetic center(s) (NV1) as ancilla bits, the nuclear centers (CI) of a group of nuclear centers (CI) can be indirectly coupled to each other and thus entangled. They can thus couple with each other within the group and, if necessary, preferentially form mixed states. Since the range of the coupling of the paramagnetic centers (NV1) is greater than the range of the nuclear centers (CI), with the aid of chains of paramagnetic centers as ancilla bits, groups of nuclear centers (CI) which are remote from one another can also be coupled and entangled with one another. Very preferably, the density of the paramagnetic centers (NV1) in the vicinity of such a group is so high that the paramagnetic centers (NV1) exhibit collective behavior and couple collectively with the nuclear centers (CI). The extent of the group of nuclear centers (CI) is typically determined by the range of their interaction with the associated paramagnetic center;

ΔKTFL compensation fluorescence phase shift time: This is the delay of the emission of the compensation fluorescence radiation (KFL) compared to the application of the compensation emission signal (S7);

ΔTFL fluorescence phase shift time: this is the delay of the emission of the fluorescence radiation (FL) a) with respect to the application of the transmission signal (S5) or b) with respect to the pump radiation (LB), the first definition a) being preferred;

$\Delta t_{Ipmp}$ transmission delay: This is the delay in the transmission of the pump radiation (LB) by the pump radiation source (PL1) compared to the application of the transmission signal (S5) to the pump radiation source (PL1). In many applications, this transmission delay can be approximated with a value of 0 s to simplify calculations;

D substrate. The substrate may be one of a plurality of substrates within the sensor element. However, the substrate (D) may also be the sensor element itself. When NV centers are used as paramagnetic centers (NV1), the material of the substrate (D) is diamond. Preferably, in most cases described herein, the substrate is a HD-NV diamond;

d extension of a group (NVC) of paramagnetic centers (NV1) perpendicular to the pointing vector of the incident pump radiation (LB) within a sensor element.

d0 offset constant of the receiver output signal (S0), which is independent of the value of the total radiation ig reaching the radiation receiver (PD);

d1 proportionality factor by which the value (s0) of the receiver output signal (S0) depends on the value (ig) of the intensity of the total radiation striking the receiver (PD);

$d_a1$ first distance at which a paramagnetic center (NV1) or a group (NVC) of paramagnetic centers (NV1) is located below the surface (OFL1) of the substrate (D) in the sensor element;

$d_a2$ second distance at which a nuclear center (CI) or a group of nuclear centers (CI) is located below the surface (OFL1) of the substrate (D) in the sensor element;

DCS dichroic mirror for selective selection of pump radiation (LB) and fluorescence radiation (FL);

DE cover;

$d_{NVC}$ extension of a group (NVC) of paramagnetic centers (NV1) parallel to the pointing vector of the incident pump radiation (LB) within a sensor element. It is thus the thickness of the group (NVC) of paramagnetic centers (NV1) in the substrate (D);

$d_{NVC2}$ extension of a group (NVC2) of paramagnetic reference centers (NV2) perpendicular to the pointing vector of the incident compensating radiation (KS) within a sensor element.

$d_{PZC}$ extension of a group (PZC) of centers (PZ) emitting pump radiation (LB) within a sensor element.

dRa value of the noise of the value (s0) of the receiver output signal (S0) of the radiation receiver (PD) which does not depend on the value of the total intensity ig of the radiation hitting the radiation receiver (PD).

dRb value of the noise of the value (s0) of the receiver output signal (S0) of the radiation receiver (PD), which depends on the value of the total intensity ig of the radiation hitting the radiation receiver (PD).

DS Dicke switch;

EMI external mirror;

F[ ] linear filter function of the loop filter (TP) and the additional loop filter (TP'). The filter function satisfies the equations F[X1+X2]=F[X1]+F[X2] and F[x*X1]=x*F[X1], making said loop filters (TP, TP') linear filters. (Let X1 and X1 be the two values of any two signals. Let x be any real factor);

F1 first filter. The first filter is transparent to the fluorescence radiation (FL) of the paramagnetic centers (NV1) in the material of the sensor element. Preferably, this is the fluorescence radiation (FL) of a NV center, wherein the sensor element is preferably a nano diamond with diamond and/or a HD NV diamond as material;

F2 optional second filter for selecting a wavelength optimally chosen for excitation of the one or more paramagnetic centers (NV1) from a broader radiation spectrum. Preferably, the second filter is substantially non-transparent to the fluorescence radiation wavelength ($\lambda_{fl}$) of the fluorescence radiation (FL). The second filter is not shown in most figures because a narrow-band pump radiation source (PL1), such as a LASER, preferably does not emit radiation in the fluorescence radiation wavelength range ($\lambda_{fl}$). However, the second filter is mandatory if the pump radiation source (PL1) has in its pump radiation spectrum a radiation component with the fluorescence radiation wavelength ($\lambda_{fl}$) of the fluorescence radiation (FL). In this case, the transmission signal (S5) would crosstalk directly into the receive path without the second filter and thus falsify the measurement signal.

FeM ferromagnetic material;

FL fluorescence radiation of the paramagnetic centers (NV1) in the material of the sensor element. Preferably, this is the fluorescence radiation of one or more paramagnetic centers (NV1) and/or one or more groups (NVC) of paramagnetic centers (NV1). Preferably, this is the fluorescence radiation of one or more NV centers and/or one or more groups of NV centers, wherein the reference element is preferably one or more diamonds and/or nano-diamonds with diamond as the material;

FLw modulated portion of the intensity ($I_{fl}$) of the fluorescence radiation (FL);

$f_{MW}$ common electron-electron microwave frequency ($f_{MW}$);

$f_{MWH}$ horizontal electron-electron microwave frequency. The vertical electron-electron microwave frequency ($f_{MWV}$) and the horizontal electron-electron microwave frequency ($f_{MWH}$) are typically equal to each other and thus typically equal to a common electron-electron microwave frequency ($f_{MW}$);

$f_{MWV}$ vertical electron-electron microwave frequency. The vertical electron-electron microwave frequency ($f_{MWV}$) and the horizontal electron-electron microwave frequency ($f_{MWH}$) are typically equal to each other and thus typically equal to a common electron-electron microwave frequency ($f_{MW}$);

Q signal generator;

Ge fixing means by which the sensor element with the paramagnetic centers (NV1) in the material of the sensor element is fixed to the first filter (F1) and/or to the integrated circuit (IC). The fixing means is preferably transparent to radiation having the fluorescence radiation wavelength ($\lambda_{fl}$) of the fluorescence radiation (FL) of the paramagnetic centers (NV1) in the material of the sensor element. The fixing means is preferably transparent to radiation having the fluorescence radiation wavelength ($\lambda_{fl}$) of the fluorescence radiation (FL) of the paramagnetic centers (NV1) in the material of the sensor element. The fixing means is preferably transparent to radiation with the pump radiation wavelength ($\lambda_{pmp}$) of the pump radiation of the pump radiation source (PL1);

GL1 first adhesive for fastening the sensor element to the first filter (F1);

GL2 second adhesive applied to the second lead frame surface (LF2);

GL3 third adhesive applied to the third lead frame face (LF3);

GL4 fourth adhesive for fastening the cover (DL);

GT Body of an electric guitar as an example of a musical instrument;

HA Holder;

h0 fulfills h0'+h1+h1*s5g=h0;

h0' offset value for the value of the intensity ($I_{pmp}$) of the pump radiation (LB) emitted into the first transmission path (I1) by the pump radiation source (PL1), which is independent at the operating point of the value of the transmission signal (S5) and thus independent of the value of the alternating component (S5w) of the transmission signal (S5) and independent of the value of the direct portion (S5g) of the transmission signal (S5);

h1 proportionality factor for the value of the intensity ($I_{pmp}$) of the pump radiation (LB) emitted into the first transmission path (I1) by the pump radiation source (PL1), which intensity is dependent at the operating point on the value of the transmission signal (S5) and is thus dependent on the value of the alternating component (S5w) of the transmission signal (S5) and dependent on the value of the direct component (S5g) of the transmission signal (S5);

HD1 first horizontal driver stage (HD1) for driving the first horizontal line (LH1) of the first quantum bit to be driven (QUB11) and for driving the first shield line (SH1) and for driving the second shield line (SH2);

HD2 second horizontal driver stage (HD2) for driving the second horizontal line (LH2) of the second quantum bit (QUB12) to be driven and for driving the second shield line (SH2) and for driving the third shield line (SH3);

HD3 third horizontal driver stage (HD3) for driving the third horizontal line (LH3) of the third quantum bit (QUB13) to be driven and for driving the third shield line (SH3) and for driving the fourth shield line (SH4);

HD NV sensor element having, at least locally in a part of the sensor element, a high density of paramagnetic centers (NV1). Preferably, this part is a substrate (D) having an at least local density of more than 10 ppm, more preferably more than 20 ppm of paramagnetic centers (NV1) relative to the number of atoms in the volume of space under consideration. Preferably, the substrate (D) comprises one or more groups (NVC) of paramagnetic centers (NV1), preferably exceeding within the respective group (NVC) the density of paramagnetic centers (NV1) of more than 10 ppm, preferably more than 20 ppm. Also, the whole substrate (D) may have a density of paramagnetic centers (NV1) of more than 10 ppm, preferably more than 20 ppm of paramagnetic centers (NV1). In the case of NV centers in diamond as substrate (D), it is preferably a HD-NV diamond (HD-NV).

hRa satisfies hRa'+hRb+hRb*s5g=hRa;

hRa' value of the noise of the pump radiation source (PL1) at the operating point, which is independent of the value of the transmission signal (S5) and thus independent of the value of the alternating component (S5w) of the transmission signal (S5) and independent of the value of the direct portion (S5g) of the transmission signal (S5);

hRb value of the noise of the pump radiation source (PL1) which is dependent on the value of the transmission signal (S5) and thus dependent on the value of the alternating component (S5w) of the transmission signal (S5) and dependent on the value of the direct component (S5g) of the transmission signal (S5);

HS1 first horizontal receiver stage (HS1), which can form a unit with the first horizontal driver stage (HD1), for driving the first quantum bit (QUB11) to be driven;

HS2 second horizontal receiver stage (HS2), which can form a unit with the second horizontal driver stage (HD2), for driving the second quantum bit (QUB12) to be driven;

HS3 third horizontal receiver stage (HS3), which can form a unit with the third horizontal driver stage (HD3), for driving the third quantum bit to be driven (QUB13);

i1 momentum value of the intensity ($I_{pmp}$) of the pump radiation (LB) emitted into the first transmission path (I1) by the pump radiation source (PL1);

I1 first transmission path;

i2 value of the radiation intensity emitted by the compensating radiation source (PLK);

I2 second transmission path;

I3 third transmission path;

I4 fourth transmission path;

IC integrated circuit;

id intensity of pump radiation (LB) after interaction with the sensing element reaching the first optical filter (F1)

ifd value of the intensity of the fluorescence radiation (FL) reaching the radiation receiver (PD);

ifl value of the intensity ($I_{fl}$) of the fluorescence radiation (FL) reaching the first optical filter (F1);

$I_{fl}$ intensity of fluorescence radiation (FL);

Ift value of the intensity of the radiation in the first transmission path (I1) passing the first optical filter (F1);

Ig value of the total radiation reaching the radiation receiver (PD);

IH horizontal electric current;

IH1 first horizontal current. The first horizontal current is the electric current flowing through the first horizontal line (LH1);

IH2 second horizontal current. The second horizontal current is the electric current flowing through the second horizontal line (LH2);

IH3 third horizontal current. The third horizontal current is the electric current flowing through the third horizontal line (LH3);

IH4 fourth horizontal current. The fourth horizontal current is the electric current flowing through the fourth horizontal line (LH4);

Ik portion value of the intensity of the compensating radiation (KS) reaching the radiation receiver (PD);

$I_{kfl}$ intensity of compensating fluorescence radiation (KFL);

$I_{ks}$ intensity of the compensating radiation (KS);

$I_{pmp}$ intensity of pump radiation (LB);

$I_{pmpmax}$ pump radiation intensity maximum;

$I_{pmpoff}$ bias value of the intensity ($I_{pmp}$) of the pump radiation (LB);

IS insulation, e.g. spin-on glass;

ISH1 first horizontal shield current flowing through the first horizontal shield line (SH1);

ISH2 second horizontal shield current current flowing through the second horizontal shield line (SH2);

ISH3 third horizontal shield current Current flowing through the third horizontal shield line (SH3);

ISH4 fourth horizontal shield current Current flowing through the fourth horizontal shield line (SH3);

ISV1 first vertical shield current flowing through the first vertical shield line (SV1);

IS V2 second vertical shield current flowing through the second vertical shield line (SV2);

IV vertical electric current. The vertical current is the electric current flowing through the vertical line (LV);

IV1 first vertical current. The first vertical current is the electric current flowing through the first vertical line (LV1);

IV2 second vertical current. The second vertical current is the electric current flowing through the second vertical line (LV2);

IV3 third vertical current. The third vertical current is the electric current flowing through the third vertical line (LV3);

IV4 fourth vertical current. The fourth vertical current is the electric current flowing through the fourth vertical line (LV4);

k0 offset constant for the value of the intensity of the compensation radiation (KS) emitted by the compensation radiation source (PLK), which is independent of the value of the compensation transmission signal (S7);

KFL compensation fluorescence radiation of the paramagnetic reference centers (NV2) in the material of the reference element. Preferably, this is the compensation fluorescence radiation of one or more paramagnetic reference centers (NV2) and/or one or more groups (NVC2) of paramagnetic reference centers (NV2). Preferably, this is compensation fluorescence radiation from one or more NV centers and/or one or more groups of NV centers, wherein the reference element is preferably one or more diamonds and/or nano-diamonds with diamond as the material;

KH contact between horizontal line (LH) and substrate (D). While such a contact is possible, it is inferior to the other contacts disclosed herein (KH11, KH22, KH33, KH44) to separate horizontal shield lines (SH1, SH2, SH3, SH4);

KH11 first horizontal contact of the first quantum bit (QUB1). The first horizontal contact of the first quantum bit (QUB1) electrically connects the first horizontal shield line (SH1) in the first quantum bit (QUB1) to the substrate (D) or an epitaxial layer (DEPI). Preferably, in the case of diamond as substrate material, the contact comprises or is made of titanium;

KH22 second horizontal contact of the first quantum bit (QUB11) and first horizontal contact of the second quantum bit (QUB12). The first quantum bit (QUB11) and the second quantum bit (QUB12) share this contact in the example of FIG. 82. The contact electrically connects the second horizontal shield line (SH2) in the first quantum bit (QUB11) and the second quantum bit (QUB12), respectively, to the substrate (D) and an epitaxial layer (DEPI), respectively. Preferably, in the case of diamond as substrate material, the contact comprises or is made of titanium;

KH33 second horizontal contact of the second quantum bit (QUB12) and first horizontal contact of the third quantum bit (QUB13). The second quantum bit (QUB12) and the third quantum bit (QUB13) share this contact in the example of FIG. 82. The contact electrically connects the third horizontal shield line (SH3) in the second quantum bit (QUB12) or third quantum bit (QUB13) to the substrate (D) or an epitaxial layer (DEPI). Preferably, in the case of diamond as substrate material, the contact comprises or is made of titanium;

KH44 second horizontal contact of the third quantum bit (QUB13). The second horizontal contact of the third quantum bit (QUB13) electrically connects the fourth horizontal shield line (SH4) in the third quantum bit (QUB13) to the substrate (D) or an epitaxial layer (DEPI). Preferably, in the case of diamond as substrate material, the contact comprises or is made of titanium;

KNT contact or corresponding structure for collecting photoelectrons in a material of the sensor element;

kRa value of the noise component of the value of the intensity of the compensating radiation (KS) emitted by the compensating radiation source (PLK), which is independent of the value of the compensating transmission signal (S7) and, in particular, is independent of the alternating component s7w of the compensating transmission signal (S7)

KS compensation radiation;

KT contrast. The contrast (KT) is understood here as the maximum intensity ($I_{fl}$) of the fluorescence radiation (FL) at the magnetic flux density B of this maximum intensity divided by the limit value of the intensity ($I_{fl}$) of the fluorescence radiation (FL) towards large magnetic flux densities B (see FIG. 28);

KTH Cathode contact;

KV contact between vertical line (LV) and substrate (D). While such a contact is possible, it is inferior to the other contacts disclosed herein (KV11, KH21, KH31, KV12, KH22, KH32) to separate vertical shield lines (SV1, SV2);

KV11 first vertical contact of the first quantum bit (QUB11). The first vertical contact of the first quantum bit (QUB11) electrically connects the first vertical shield line (SV1) in the first quantum bit (QUB11) to the substrate (D) or an epitaxial layer (DEPI). Preferably, in the case of diamond as substrate material, the contact comprises or is made of titanium;

KV21 first vertical contact of the second quantum bit (QUB12). The first vertical contact of the second quantum bit (QUB12) electrically connects the first vertical shield line (SV1) in the second quantum bit (QUB12) to the substrate (D) or an epitaxial layer (DEPI). Preferably, in the case of diamond as substrate material, the contact comprises or is made of titanium;

KV31 first vertical contact of the third quantum bit (QUB13). The first vertical contact of the third quantum bit (QUB13) electrically connects the first vertical shield line (SV1) in the third quantum bit (QUB13) to the substrate (D) or an epitaxial layer (DEPI). Preferably, in the case of diamond as substrate material, the contact comprises or is made of titanium;

KV12 second vertical contact of the first quantum bit (QUB11). The second vertical contact of the first quantum bit (QUB11) electrically connects the second vertical shield line (SV2) in the first quantum bit (QUB11) to the substrate (D) or an epitaxial layer (DEPI). Preferably, in the case of diamond as substrate material, the contact comprises or is made of titanium;

KV22 second vertical contact of the second quantum bit (QUB12). The second vertical contact of the second quantum bit (QUB12) electrically connects the second vertical shield line (SV2) in the second quantum bit (QUB12) to the substrate (D) or an epitaxial layer (DEPI). Preferably, in the case of diamond as substrate material, the contact comprises or is made of titanium;

KV32 second vertical contact of the third quantum bit (QUB13). The second vertical contact of the third quantum bit (QUB13) electrically connects the second vertical shield line (SV2) in the third quantum bit (QUB13) to the substrate (D) or an epitaxial layer (DEPI). Preferably, in the case of diamond as substrate material, the contact comprises or is made of titanium;

$\lambda_{fl}$ fluorescence radiation wavelength of the fluorescence radiation (FL) of the paramagnetic center (NV1) and/or the paramagnetic centers (NV1) and/or the group (NVC) of paramagnetic centers (NV1). For NV centers in diamond as paramagnetic centers (NV1), this fluorescence radiation wavelength ($\lambda_{fl}$) is typically about 637 nm, thus typically red;

$\lambda_{kfl}$ compensation fluorescence radiation wavelength of the compensation fluorescence radiation (KFL) of the paramagnetic reference center (NV2) and/or the paramagnetic reference centers (NV2) and/or the group (NVC2) of paramagnetic reference centers (NV2). For NV centers in diamond as paramagnetic reference centers (NV2), this compensation fluorescence radiation wavelength is typically about 637 nm, so is typically red;

$\lambda_{ks}$ compensation radiation wavelength of the compensation radiation (KS). If the compensating radiation is not to irradiate the radiation receiver (PD) directly, but is to irradiate a reference element with a reference center (NV2) or a plurality of reference centers (NV2) or one or more groups (NVC2) of reference centers (NV2) in order to cause them to emit compensating fluorescence radiation (KFL), which then impinges on the radiation receiver (PD) instead of the compensating radiation (KS), the compensation radiation wavelength is selected so as to be able to excite the paramagnetic reference center (NV2) and/or the paramagnetic reference centers (NV2) and/or the group (NVC2) of paramagnetic reference centers (NV2) and/or the groups (NVC2) of paramagnetic reference centers (NV2) to emit compensation fluorescence radiation (KFL) having a compensation fluorescence wavelength ($\lambda_{fkfl}$). For NV centers in diamond as paramagnetic reference centers (NV2), this compensation radiation wavelength is then preferably in a wavelength range of 500-600 nm. Preferably, a laser diode with a wavelength of 550 nm or 520 nm is then used as compensation radiation source (PLK).

$\lambda_{pmp}$ pump radiation wavelength of the pump radiation (LB). The pump radiation wavelength is selected to excite the paramagnetic center (NV1) and/or the paramagnetic centers (NV1) and/or the group (NVC) of paramagnetic centers (NV1) and/or the groups (NVC) of paramagnetic centers (NV1) to emit fluorescence radiation (FL) having a fluorescence radiation wavelength ($\lambda_{fl}$). For NV centers in diamond as paramagnetic centers (NV1), this pump radiation wavelength is preferably in a wavelength range of 500-600 nm. Preferably, a laser diode with a wavelength of 550 nm or 520 nm is used as the pump radiation source (PL1);

L1 first coil. The first coil is an optional element, which is preferably a part of the integrated circuit (IC) and can generate a magnetic field. Preferably, the first coil is energized by the integrated circuit (IC);

L2 second coil. The second coil is another optional element, which is preferably a part of the integrated circuit (IC) and can generate a magnetic field. Preferably, the second coil is energized by the integrated circuit (IC);

L3 third coil. The third coil is another optional element, which is preferably a part of the integrated circuit (IC) and can generate a magnetic field. Preferably, the third coil is energized by the integrated circuit (IC);

L4 fourth coil. The fourth coil is another optional element, which is preferably a part of the integrated circuit (IC) and can generate a magnetic field. Preferably, the fourth coil is energized by the integrated circuit (IC);

L5 fifth coil. The fifth coil is another optional element, which is preferably a part of the integrated circuit (IC) and can generate a magnetic field. Preferably, the fifth coil is energized by the integrated circuit (IC);

L6 sixth coil. The sixth coil is another optional element, which is preferably a part of the integrated circuit (IC) and can generate a magnetic field. Preferably, the sixth coil is energized by the integrated circuit (IC).

L7 seventh coil. The seventh coil is another optional element, which is preferably a part of the integrated circuit (IC) and can generate a magnetic field. Preferably, the seventh coil is energized by the integrated circuit (IC);

LB Pump Radiation;

LC compensation coil. The compensation coil can, for example, be only a first coil (L1) or a plurality of coils (L1 to L7), possibly also differently energized, for example depending on different control signals, or also only a single line (LH), in the vicinity of which the relevant paramagnetic center (NV1) or the paramagnetic centers (NV1) or the group or groups (NVC) of paramagnetic centers (NV1) are located, or the combination of such lines (LH, LV);

LCK further compensation coil;

LED1 first test LED;

LEDDR light source driver for the pump radiation source (PL1);

LF1 first lead frame area;

LF2 second lead frame area;

LF3 third lead frame area;

LF4 fourth lead frame area;

LF5 fifth lead frame area;

LF6 sixth lead frame area;

LF7 seventh lead frame area;

LH horizontal line. Preferably, the horizontal line is made of a material transparent to radiation of the pump radiation wavelength ($\lambda_{pmp}$) of the pump radiation (LB), for example ITO. Preferably, the horizontal line is fabricated on the surface (OFL1) of the substrate (D) and is firmly connected thereto;

LH1 first horizontal line. Preferably, the first horizontal line is made of a material transparent to radiation of the pump radiation wavelength ($\lambda_{pmp}$) of the pump radiation (LB), for example ITO. Preferably, the first horizontal line is fabricated on the surface (OFL1) of the substrate (D) and is fixedly connected thereto;

LH2 second horizontal line. Preferably, the second horizontal line is made of a material transparent to radiation of the pump radiation wavelength ($\lambda_{pmp}$) of the pump radiation (LB), for example ITO. Preferably, the second horizontal line is fabricated on the surface (OFL1) of the substrate (D) and is fixedly connected thereto;

LH3 third horizontal line. Preferably, the third horizontal line is made of a material transparent to radiation of the pump radiation wavelength ($\lambda_{pmp}$) of the pump radiation (LB), for example ITO. Preferably, the third horizontal line is fabricated on the surface (OFL1) of the substrate (D) and is fixedly connected thereto;

LH4 fourth horizontal line. Preferably, the fourth horizontal line is made of a material transparent to radiation of the pump radiation wavelength ($\lambda_{pmp}$) of the pump radiation (LB), for example ITO. Preferably, the fourth horizontal line is fabricated on the surface (OFL1) of the substrate (D) and is fixedly connected thereto;

LIV driving and evaluation unit for driving the pump radiation source (PL1) by means of a transmission signal (S5) and reading out the radiation receiver (PD) or the photoelectrons of the paramagnetic centers (NV1) by means of a photocurrent, for example via a contact (KNT). Preferably, a lock-in amplifier (FIG. 1) is used as part of the drive and evaluation unit for conditioning the receiver output signal (S0). Typically, the intensity ($I_{pmp}$) of the pump radiation (LB) of the pump radiation source (PL1) is modulated by means of an alternating component (S5w) of the transmission signal (S5) with a frequency of 1 Hz up to 100 MHz. Preferably, this alternating component (S5w) of the transmission signal (S5) is used as the carrier frequency of the measurement signal (MES) for the lock-in amplifier and is output as the sensor input signal (out). In the case of a pickup, this sensor output signal (out) is then converted into acoustically equivalent signals by means of suitable electronic units. Preferably, this can be done in a commonly used standardized digital form (e.g., as an MP3 stream) or as an analog electrical signal.

LOT perpendicular line (LOT) of the lot from the location of the quantum point of the paramagnetic center (NV1) or the center of gravity of the paramagnetic centers (NV1) or the center of gravity of the group (NVC) or groups (NVC) of paramagnetic centers (NV1) to the surface (OFL1) of the substrate (D) and/or the epitaxial layer (DEPI), if present. This is an imaginary line;

LTL line whose current is to be measured;

LV vertical line. Preferably, the vertical line is made of a material transparent to radiation of the pump radiation wavelength ($\lambda_{pmp}$) of the pump radiation (LB), for example ITO. Preferably, the vertical line is fabricated on the surface (OFL1) of the substrate (D) and is firmly connected thereto;

LV1 first vertical line. Preferably, the first vertical line is made of a material transparent to radiation of the pump radiation wavelength ($\lambda_{pmp}$) of the pump radiation (LB), for example ITO. Preferably, the first vertical line is fabricated on the surface (OFL1) of the substrate (D) and is fixedly connected thereto;

LV2 second vertical line. Preferably, the second vertical line is made of a material transparent to radiation of the pump radiation wavelength ($\lambda_{pmp}$) of the pump radiation (LB), for example ITO. Preferably, the second vertical line is fabricated on the surface (OFL1) of the substrate (D) and is fixedly connected thereto;

LV3 third vertical line. Preferably, the third vertical line is made of a material transparent to radiation of the pump radiation wavelength ($\lambda_{pmp}$) of the pump radiation (LB), for example ITO. Preferably, the third vertical line is fabricated on the surface (OFL1) of the substrate (D) and is fixedly connected thereto;

LV4 fourth vertical line. Preferably, the fourth vertical line is made of a material transparent to radiation of the pump radiation wavelength ($\lambda_{pmp}$) of the pump radiation (LB), for example ITO. Preferably, the fourth vertical line is fabricated on the surface (OFL1) of the substrate (D) and is fixedly connected thereto;

LWK1 first wave coupler;

LWK2 second wave coupler;

LWL optical waveguide for transporting the electromagnetic pump radiation (LB) and/or the fluorescence radiation (FL). Preferably, the optical waveguide is adapted to the environmental conditions such as high temperatures or radiation fields and achieves an optimum transmission performance in the form of the lowest possible attenuation for both the pump radiation (LB) and the fluorescence radiation (FL). Suitable materials for the optical waveguide are glasses, SiO2 and its compounds, diamond, ITO (indium tin oxide) and other materials which are optically transparent in the relevant spectral ranges of the pump radiation wavelength ($\lambda_{pmp}$) and/or fluorescence wavelength ($\lambda_{fl}$), such as plastics;

LWL1 first optical waveguide for transporting the electromagnetic pump radiation (LB). Preferably, the first optical waveguide is adapted to the environmental conditions such as high temperatures or radiation fields and achieves an optimum transmission performance for the pump radiation (LB) in the form of the lowest possible attenuation. Suitable materials for the first optical waveguide are glasses, SiO2 and its compounds, diamond, ITO (indium tin oxide) and other materials that are optically transparent in the relevant spectral range of the pump radiation wavelength ($\lambda_{pmp}$), such as plastics.

LWL2 second optical waveguide for transporting the electromagnetic fluorescence radiation (FL). Preferably, the second optical waveguide is adapted to the ambient conditions such as high temperatures or radiation fields and achieves both for the fluorescence radiation (FL) an optimum transmission performance in the form of the lowest possible attenuation. Preferably, the second optical waveguide achieves the lowest possible transmission power in the form of the greatest possible attenuation for the pump radiation (LB), so that the first filter (F1) can then be omitted if necessary, since the second optical waveguide can then perform this function. Provided that the second optical waveguide has these properties, the first filter (F1) is present within the meaning of the present disclosure and is encompassed by the claims, if applicable. Suitable materials for the second optical waveguide include glasses, SiO2 and compounds thereof, diamond, ITO (indium tin oxide), and other materials that are optically transparent in the relevant spectral ranges of the fluorescence radiation wavelength ($\lambda_{fl}$), such as plastics.

µC control device;

M1 first multiplier;

M1' additional first multiplier;

M2 second multiplier;

M2' additional second multiplier;

MAS shielding;

ME1 first medium (e.g. air or vacuum or the material of an optical fibre (LWL) or other optical functional element)

MES measurement signal. The measurement signal is the reference signal with which the first multiplier (M1) and the loop filter (TP) compare the receiver output signal (S0) and form the filter output signal (S4) with the aid of the holding circuit (S&H). In many examples, the measurement signal is equal to the alternating component (s5w) of the transmission signal (S5);

MFC magnetic field control. The magnetic field control (MFC) is preferably a regulator (RG) whose task is to globally compensate an external magnetic field with an external magnetic flux density B for the entire device by active counter-regulation, for example by means of a compensation coil (LC);

MFK magnetic field control device;

MFS magnetic field sensor;

MO mounting opening;

MPZ diamagnetic material having one or more paramagnetic centers (NV1) of the sensing element. Preferably, the diamagnetic material is diamond and the paramagnetic center(s) (NV1) are NV centers. The one or more paramagnetic centers (NV1) emit fluorescence radiation (FL) having a fluorescence radiation wavelength ($\lambda_{fl}$) when irradiated with pump radiation (LB) from the pump radiation source (PL1). This fluorescence radiation (FL) of the paramagnetic center(s) (NV1) thereby preferably depends on the magnetic flux density B at the location of the respective paramagnetic center (NV1) and possibly further parameters such as pressure and/or temperature. The crystal orientation of the material of the sensor element can typically influence this radiation and the dependence of this radiation of the fluorescence radiation (FL) on the magnetic flux B. The paramagnetic center(s) (NV1) are preferably one or more NV centers. The material is preferably diamond.

$MPZ_1$ diamagnetic material having one or more paramagnetic centers (NV1), which are preferably one or more NV centers in diamond. In this case, the diamagnetic material is comprised by the first of n sensor elements of an exemplary system for detecting the vibration of n mechanically vibrating subsystems ($MS_1$, $MS_2$, . . . $MS_n$) respectively associated with these n sensor elements;

$MPZ_2$ diamagnetic material having one or more paramagnetic centers (NV1), which are preferably one or more NV centers in diamond. In this case, the diamagnetic material is comprised by the second of n sensor elements of an exemplary system for detecting the vibration of n mechanically vibrating subsystems ($MS_1$, $MS_2$, . . . $MS_n$) respectively associated with these n sensor elements;

$MPZ_n$ diamagnetic material having one or more paramagnetic centers (NV1), which are preferably one or more NV centers in diamond. In this case, the diamagnetic material is comprised by the nth of n sensor elements of an exemplary system for detecting the vibration of n mechanically vibrating subsystems ($MS_1$, $MS_2$, . . . $MS_n$) respectively associated with these n sensor elements;

MQ1 first field source for generating a magnetic or electric field that is not in the reference system of the sensing element, such that an alternating electromagnetic field is generated, for example in combination with a vibrating system (MS). The first field source may be, for example, a magnetized ferromagnetic material, a guitar string or a permanent magnet or the like. In a further example, it may also optionally additionally be an electrically charged structure. Preferably, the field source generates a static magnetic field when the overall system is not set into mechanical oscillations and has, at the location of the sensor element, for example of a diamond with NV centers as paramagnetic centers (NV1), together with the second rock source (MQ2), a total magnetic flux density B of preferably 1-20 mT, less preferably from 0.1 mT to 50 mT, in a direction different from the axis of the paramagnetic centers (NV1), preferably from the axis of the NV centers preferably used.

$MQ1_1$ first field source associated with the first of n sensor elements of an exemplary system for detecting the vibration of n mechanically vibrating subsystems ($MS_1$, $MS_2$, ... $MS_n$) respectively associated with said n sensor elements;

$MQ1_2$ first field source associated with the second of n sensor elements of an exemplary system for detecting the vibration of n mechanically vibrating subsystems ($MS_1$, $MS_2$, ... $MS_n$) respectively associated with said n sensor elements;

$MQ1_n$ first field source associated with the $n^{th}$ of n sensor elements of an exemplary system for detecting the vibration of n mechanically vibrating subsystems ($MS_1$, $MS_2$, ... $MS_n$) respectively associated with said n sensor elements;

MQ2 optional second field source for generating a magnetic or electric field which is preferably at rest in the reference system of the sensor element. It is preferably used to adjust the operating point to maximize the sensitivity of the sensor system and, if necessary, to linearize the measuring range. For example, the second field source may be a magnetized ferromagnetic material or a permanent magnet or a compensation coil (LC) through which an electric current flows. Preferably, the field source generates a static or, with respect to a slow readjustment by means of a compensation coil (LC), quasi-static magnetic field when the overall system is not subjected to mechanical oscillations. Preferably, the magnetic flux density of the second field source is chosen such that, together with the magnetic first flux density generated by the first magnetic field source (MQ1), an overall magnetic flux density at the location of the paramagnetic centers (NV1) results, which achieves an optimal sensitivity of the fluorescence radiation (FL) with respect to a change of the fluorescence radiation (FL) upon a change of the magnetic flux density B at the location of the paramagnetic center (NV1) or centers (NV1). Preferably, the magnetic second flux density $B_0$ generated by the second field source at the location of the paramagnetic center(s) (NV1) is selected such that at the location of the paramagnetic center(s) (NV1) there is a total magnetic flux density of 1-20 mT in a direction different from the axis of the paramagnetic center(s) (NV1), for example different from the axis of the NV center(s).

$MQ2_1$ second field source associated with the first of n sensor elements of an exemplary system for detecting the vibration of n mechanically vibratable subsystems ($MS_1$, $MS_2$, ... $MS_n$) respectively associated with said n sensor elements;

$MQ2_2$ second field source associated with the second of n sensor elements of an exemplary system for detecting the vibration of n mechanically vibratable subsystems ($MS_1$, $MS_2$, ... $MS_n$) respectively associated with said n sensor elements;

$MQ2_n$ second field source associated with the nth of n sensor elements of an exemplary system for detecting the vibration of n mechanically vibrating subsystems ($MS_1$, $MS_2$, ... $MS_n$) respectively associated with said n sensor elements;

MS schematical representation of a mechanically vibrating system in a preferred exemplary frequency range from 1 Hz up to 100 MHz. For example, it may be a vibrating device part of a mechanical device such as a resonating body of a musical instrument or a vibrating tensioned string. Other examples include a vibrating mechanical device or organically movable body part. Preferably, the vibrations have a harmonic component.

Figure 77:
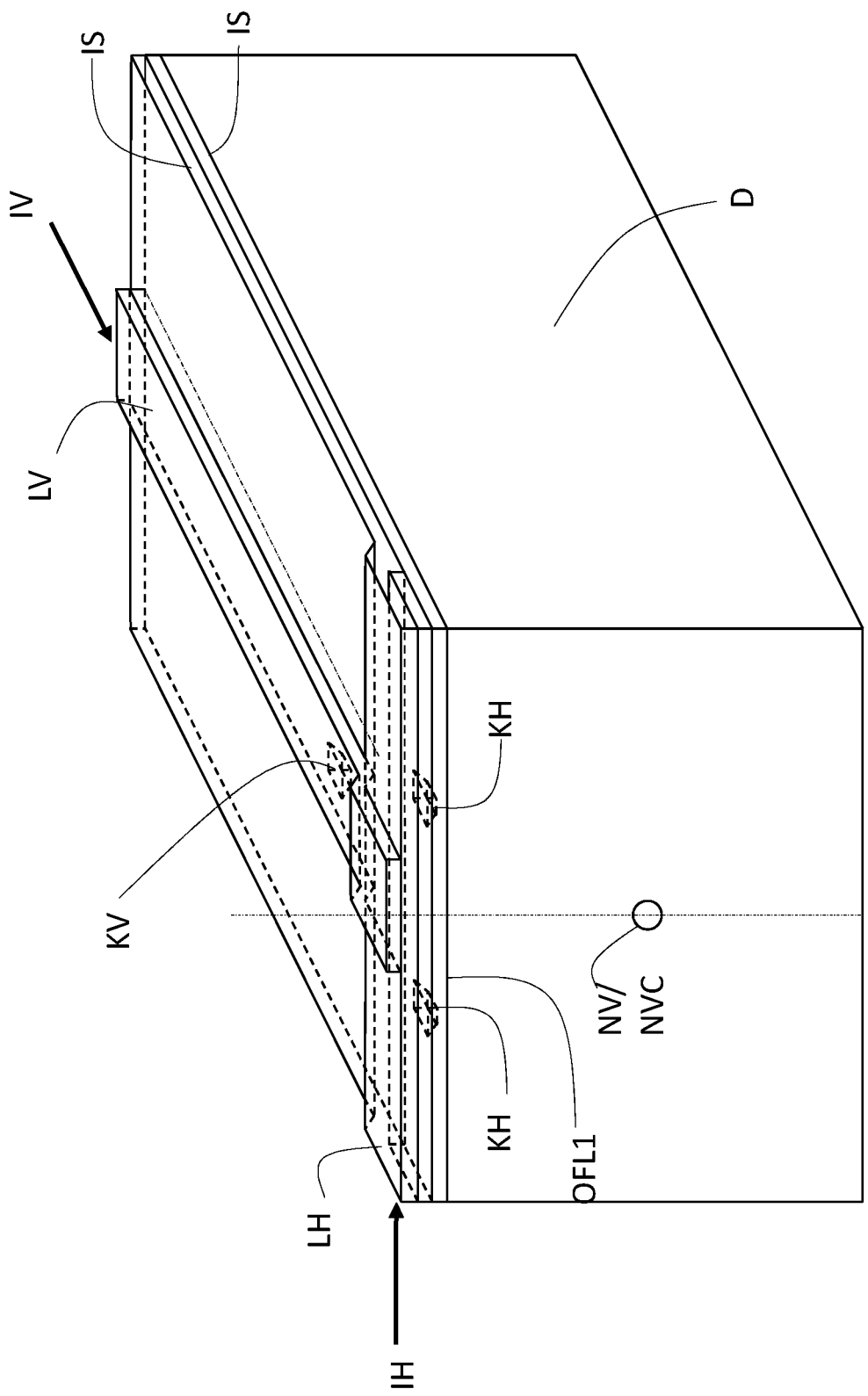
FIG. 77 shows a sensor element with a substrate (D), which in the case of NV centers as paramagnetic centers (NV1) is preferably diamond, with one or more paramagnetic centers (NV1) and/or one or more groups (NVC) of paramagnetic centers (NV1) in the substrate (D), the latter being provided with a horizontal line (LH) which is mounted and fixed on the surface (OFL1) of the substrate (D) and which is preferably electrically insulated from the substrate (D), for example by insulation (IS) and with a vertical line (LV) which is mounted and fixed on the surface (OFL1) of the substrate (D) and which is preferably electrically insulated from the substrate (D) and the vertical line (LV), for example by insulation (IS), interacting with the magnetic field of said vertical line (LV) and/or of said horizontal line (LH) by virtue of a very small first distance (d1), preferably less than 100 nm, when the horizontal line (LH) is traversed by a horizontal electric current (IH) and/or when the vertical line (LV) is traversed by a vertical electric current (IV) In contrast to FIG. 75, the vertical line (LV) is electrically connected to the material of the substrate (D) by a vertical contact (KV) and the horizontal line (LH) is electrically connected to the material of the substrate (D) by one or more horizontal contacts (KH) in order to be able to extract photoelectrons.

$MS_1$ first mechanically vibrating subsystem of n subsystems of a mechanically vibrating system (MS), for example an electric guitar (GT), where n is a positive integer;

$MS_2$ second mechanically vibrating subsystem of n subsystems of a mechanically vibrating system (MS), for example an electric guitar (GT), where n is a positive integer;

$MS_1$ third mechanically vibrating subsystem of n subsystems of a mechanically vibrating system (MS), for example an electric guitar (GT), where n is a positive integer;

n FIG. 51: Path of referral in the event of a negative answer to the question. Elsewhere in this paper: a positive integer;

$N_1$ surface normal of the first surface (OFL1) of the substrate (D);

$N_2$ surface normal of the second surface (OFL2) of the substrate (D);

NBR groove width;

NV11 quantum dot having one or more paramagnetic centers (NV1) or a group or groups (NVC) of paramagnetic centers (NV1) of the quantum bit (QUB11) in the first vertical column and in the first horizontal row of a one-dimensional quantum register having a plurality of quantum bits (QUB) or a two-dimensional quantum register having a plurality of quantum bits (QUB);

NV12 quantum dot having one or more paramagnetic centers (NV1) or a group or groups (NVC) of paramagnetic centers (NV1) of the quantum bit (QUB11) in the first vertical column and in the second horizontal row of a one-dimensional quantum register having a plurality of quantum bits (QUB) or a two-dimensional quantum register having a plurality of quantum bits (QUB);

NV13 quantum dot having one or more paramagnetic centers (NV1) or a group or groups (NVC) of paramagnetic centers (NV1) of the quantum bit (QUB11) in the first vertical column and in the third horizontal row of a one-dimensional quantum register having a plurality of quantum bits (QUB) or a two-dimensional quantum register having a plurality of quantum bits (QUB);

NV21 quantum dot having one or more paramagnetic centers (NV1) or a group or groups (NVC) of paramagnetic centers (NV1) of the quantum bit (QUB11) in the second vertical column and in the first horizontal row of a two-dimensional quantum register having a plurality of quantum bits (QUB);

NV22 quantum dot having one or more paramagnetic centers (NV1) or a group or groups (NVC) of paramagnetic centers (NV1) of the quantum bit (QUB11) in the second vertical column and in the second horizontal row of a two-dimensional quantum register having a plurality of quantum bits (QUB);

NV23 quantum dot having one or more paramagnetic centers (NV1) or a group or groups (NVC) of paramagnetic centers (NV1) of the quantum bit (QUB11) in the second vertical column and in the third horizontal row of a two-dimensional quantum register having a plurality of quantum bits (QUB);

NVC group (cluster) of paramagnetic centers (NV1). Such a group comprises at least one paramagnetic center (NV1). Preferably, however, such a group comprises a plurality of paramagnetic centers (NV1). Preferably, the density of the paramagnetic centers (NV1) within the group is higher than 10 ppm, more preferably higher than 20 ppm with respect to the number of atoms in the spatial volume of the group. Preferably, the region of such a group of paramagnetic centers is HD-NV diamond, i.e. the material is preferably diamond and the density of the paramagnetic centers, which are then NV centers, is such that the criteria for HD-NV diamond named in this paper are met. I.e. the density should be above 10 ppm, better 20 ppm within the group. If centers other than NV centers and/or materials other than diamond are used, this applies accordingly. The density of the paramagnetic centers (NV1) within this group is preferably so high that the paramagnetic centers (NV1) within the group couple with one another and, if necessary, preferably form mixed states. Most preferably, the density of the paramagnetic centers (NV1) within such a group is so high that the paramagnetic centers (NV1) exhibit collective behavior. The group has an extent (d) of the collection of paramagnetic centers (NV1) perpendicular to the pointing vector of the incident pump radiation (LB) within a sensor element, and a thickness ($d_{NVC}$) of the group (NVC) of paramagnetic centers (NV1) in the substrate (D) parallel to the pointing vector of the incident pump radiation (LB). Preferably, the thickness ($d_{NVC}$) of the group (NVC) of paramagnetic centers (NV1) is of the order of a few pump radiation wavelengths ($\lambda_{pmp}$) of the pump radiation. The reference sign NVC is used in this paper to denote a single group, but also several groups as a whole. The maximum density of a group is calculated from the inverse of the smallest spherical volume that at least two paramagnetic centers (NV1) occupy within the group. Multiplied by the number of paramagnetic centers in this volume of space. The group is bounded by the ellipsoidal volume, which leads to a reduction of the density to 50%. The principal axes are determined in such a way that the volume becomes minimal and yet all paramagnetic centers (NV1) of the group are included;

NVC2 group (cluster) of paramagnetic reference centers (NV2). Such a group comprises at least one paramagnetic reference center (NV2). Preferably, however, such a group comprises a plurality of paramagnetic reference centers (NV2). Preferably, the density of the paramagnetic reference centers (NV2) within the group is higher than 10 ppm, more preferably higher than 20 ppm with respect to the number of atoms in the spatial volume of the group. Preferably, the region of such a group of paramagnetic centers is HD-NV diamond, i.e., the material is preferably diamond and the density of the paramagnetic centers (NV1), which are then NV centers, is such that the criteria for HD-NV diamond designated in this writing are satisfied. I.e. the density within the group should be above 10 ppm, better 20 ppm. If centers other than NV centers and/or materials other than diamond are used, this applies accordingly. The density of the paramagnetic reference centers (NV2) within this group is preferably so high that the paramagnetic reference centers (NV2) within the group couple with one another and, if necessary, preferably form mixed states. Most preferably, the density of the paramagnetic reference centers (NV2) within such a group is such that the paramagnetic reference centers (NV2) exhibit collective behavior. The group has an extent (d) of the collection of paramagnetic reference centers (NV2) perpendicular to the pointing vector of the incident compensating radiation (KS) within a sensor element, and a thickness ($d_{NVC2}$) of the group (NVC2) of paramagnetic reference centers (NV2) in the substrate (D) parallel to the pointing vector of the incident compensating radiation (KS). Preferably, the thickness ($d_{NVC2}$) of the group (NVC2) of paramagnetic reference centers (NV2) is of the order of a few compensation radiation wavelengths ($\lambda_{ks}$) of the compensation radiation (KS). The reference sign NVC2 is used in this paper to denote a single group but also several groups as a whole. The maximum density of a group is calculated from the inverse of the smallest spherical volume that at least two paramagnetic reference centers (NV2) occupy within the group. Multiplied by the number of paramagnetic reference centers (NV2) in that volume of space. The group is bounded by the ellipsoidal volume, which leads to a reduction of the density to 50%. The principal axes are determined in such a way that the volume becomes minimal and yet all paramagnetic reference centers (NV2) of the group are included;

NV1 paramagnetic center or paramagnetic centers in the material of the sensor element. The paramagnetic centers emit fluorescence radiation (FL) upon irradiation with pump radiation (LB) of the pump radiation source (PL1) with a pump radiation wavelength ($\lambda_{fl}$). This fluorescence radiation (FL) of one or more paramagnetic centers thereby typically depends on the magnetic flux density B at the location of the respective paramagnetic center and further physical parameters, such as pressure P, acceleration a, gravitational field strength velocity v, electric flux density D, temperature $\vartheta$, intensity of ionizing radiation. The crystal orientation of the material of the sensing element may typically influence this radiation and the dependence of the intensity ($I_{fl}$) of this radiation of fluorescence (FL) on the magnetic flux B or on the other physical parameters at the location of the paramagnetic center(s). The paramagnetic center(s) is preferably one or more NV centers in one or more diamonds. The material is preferably diamond. The sensing element is preferably one or more diamond crystals, even more preferably one or more diamond nanocrystals with preferably a very high density of NV centers. Preferably, the paramagnetic centers are present in the sensing element at least locally in a very high density so that they can couple with each other and produce collective effects that further increase the dependence of the intensity ($I_{fl}$) of the fluorescence radiation (FL) of the paramagnetic centers on the magnetic flux density B or the other physical parameters. Preferably, the paramagnetic centers are present in at least locally high density in the crystal, for example in a HD-NV diamond as NV centers. The use of centers other than NV centers as paramagnetic reference centers, e.g., the TR1 centers, SiV centers, the GeV center, etc., is conceivable. Reference is made here to the book by A. M. Zaitsev "Optical Properties of Diamond, A Data Handbook", Springer 2001 ISBN 978-3-662-04548-0. The use of other materials such as silicon (Si) or silicon carbide (SiC) is also conceivable. Suitable centers in silicon are the so-called G-centers. Suitable centers in SiC are so-called V centers. The pump radiation wavelength ($\lambda_{pmp}$) for G-centers in silicon and V-centers in SiC is typically in the infrared region, since silicon and SiC are only transparent there. Thus, for these specific examples, the green pump radiation is actually infrared. A readout of the G-centers or the V-centers is performed using either the fluorescence radiation (FL) of the G-centers or V-centers, where the fluorescence wavelength ($\lambda_{fl}$) of the G-centers in silicon or the V-centers in SiC, respectively, is in the infrared. Another way of reading out the G-centers or V-centers is an electronic readout as exemplified in this paper with the aid of FIGS. 77 and 79 and 83;

NV2 paramagnetic reference center in the material of the reference sensor element. The paramagnetic reference centers (NV2) emit compensation fluorescence radiation (KFL) with a compensation fluorescence radiation wavelength ($\lambda_{kfl}$) when irradiated with compensation radiation (KS) from the compensation radiation source (PLK). This compensation fluorescence radiation (KFL) of a paramagnetic reference center (NV2) thereby typically depends on the magnetic flux density B at the location of the respective paramagnetic reference center and further physical parameters, such as pressure P, acceleration a, gravitational field strength velocity v, electric flux density D, temperature $\vartheta$, intensity of ionizing radiation. Therefore, the paramagnetic reference centers are preferably placed or provided with a shield (AS) at a location of defined magnetic flux density B or at a location of defined values of the further physical parameters, such as pressure P, acceleration a, gravitational field strength velocity v, electric flux density D, temperature $\vartheta$, intensity of ionizing radiation. For example, this location may be inside a tubular conductor, for example a copper or metal tube, the electric current flowing through this conductor being intended to be detected by means of the sensor element with the paramagnetic center or centers (NV1). In that case, the reference element generates, with the aid of the paramagnetic reference centers, a compensation reference radiation (KFL) which reflects, for example, the value of the magnetic flux density component of the magnetic flux density B flowing jointly through the sensor element and the reference element. The crystal orientation of the material of the reference sensor element can typically influence this radiation and the dependence of this radiation of the compensation fluorescence radiation (KFL) on the magnetic flux B and on the other physical parameters, such as pressure P, acceleration a, gravitational field strength velocity v, electric flux density D, temperature $\vartheta$, intensity of ionizing radiation, at the location of the paramagnetic reference center. The paramagnetic reference center is preferably a NV center. The material is preferably diamond. Preferably the reference sensor element is a diamond crystal, even more preferably one or more diamond nanocrystals. Preferably, the reference sensor element has more than one paramagnetic reference center. Preferably, the type of paramagnetic reference centers is the same as the type of paramagnetic centers (NV2). For example, the paramagnetic reference centers are preferably NV centers in diamond when the paramagnetic centers (NV1) are NV centers. In the case where the center types are equal, the compensation radiation wavelength ($\lambda_{ks}$) of the compensation radiation (KS) is preferably equal to the pump radiation wavelength ($\lambda_{pmp}$) of the pump radiation (LB). The fluorescence radiation wavelength ($\lambda_{fl}$) of the fluorescence radiation (FL) of the paramagnetic centers (NV1)—e.g. 637 nm for NV centers—is then equal to the compensation fluorescence wavelength ($\lambda_{kfl}$) of the compensation fluorescence radiation (KFL) of the reference paramagnetic centers. Preferably, the reference sensor element comprises nanocrystals with preferably a very high density of NV centers. Preferably, the paramagnetic centers are present in the reference sensor element at least locally in very high density so that they can couple with each other and generate collective effects that further increase the dependence of the intensity ($I_{kfl}$) of the compensation fluorescence radiation (KFL) of the paramagnetic reference centers on the magnetic flux density B and possibly other physical parameters, such as pressure P, acceleration a, gravitational field strength velocity v, electric flux density D, temperature $\vartheta$, intensity of ionizing radiation. Preferably, the paramagnetic reference centers are present in at least locally high density in the respective crystal, for example as NV centers in a HD-NV diamond The use of centers other than NV centers as paramagnetic reference centers, for example the TR1 centers, SiV centers, the GeV center, etc. is conceivable. Reference is made here to the book by A. M. Zaitsev "Optical Properties of Diamond, A Data Handbook", Springer 2001 ISBN 978-3-662-04548-0. The use of other materials such as silicon (Si) or silicon carbide (SiC) is also conceivable. Suitable centers in silicon are the so-called G-centers. Suitable centers in SiC are so-called V centers. The pump radiation wavelength ($\lambda_{pmp}$) for G-centers in silicon and V-centers in SiC is typically in the infrared region, since silicon and SiC are only transparent there. Thus, for these specific examples, the green pump radiation is actually infrared. A readout of the G-centers or the V-centers is performed using either the fluorescence radiation (FL) of the G-centers or V-centers, where the fluorescence wavelength ($\lambda_{fl}$) of the G-centers in silicon or the V-centers in SiC, respectively, is in the infrared. Another way of reading out the G-centers or V-centers is an electronic readout as exemplified in this paper with the aid of FIGS. 77 and 79 and 83;

O measurement object;
OF1 first matching circuit;
OF2 second matching circuit;
OF3rd third matching circuit;
OF3' further third matching circuit;
OF4 fourth matching circuit;
OFL1 first surface of the sensor element, which is preferably plane-parallel to an opposite second surface (OFL2) of the sensor element.
OFL2 second surface of the sensor element, which is preferably plane-parallel to an opposite first surface (OFL1) of the sensor element.
Out sensor output signal;
out' additional sensor output signal;
out" second sensor output signal;
P in FIG. 51 of this paper: positive referral path if the question is answered in the affirmative;
PD1 radiation receiver. The radiation receiver is sensitive to the fluorescence radiation (FL) of the paramagnetic centers (NV1) in the material of the sensing element. Preferably, this is the fluorescence radiation (FL) of one or more NV centers, wherein the sensor element preferably comprises one or more nano-diamonds with diamond as material. Preferably, the receiver is a part of the integrated circuit (IC). Preferably, the receiver is a photodiode. For example, it may be a photodiode or an APD (avalanche photo diode) or a SPAD (single photo avalanche diode) and/or another photosensitive detector which transforms an irradiation intensity with electromagnetic radiation in the wavelength range of the fluorescence radiation wavelength ($\lambda_{fl}$) of the fluorescence radiation (FL) of the paramagnetic centers (NV1) into electrical signals, namely current or/and voltage signals. Special advantages arise when the paramagnetic centers (NV1) and thus the sensor elements themselves are used as radiation receivers (PD), in that the photoelectrons of the paramagnetic centers (NV1) of the material of the sensor element are extracted and detected. In this case, the separate radiation receiver (PD) is replaced by the sensor element. In any case, the claims are to be understood as including the simultaneous use of the sensor element as radiation receiver (PD). This applies in particular even if the extraction of the charge carriers prevents the emission of the fluorescence radiation (FL), i.e. this is only virtual. As an alternative detection method, in addition to detecting the intensity ($I_{fl}$) of the fluorescence radiation (FL), electrons generated by the photoelectric effect can also be directly detected and evaluated in the sensor element;

PL1 pump radiation source. The pump radiation source may also be a laser diode or other suitable light source. The pump radiation source emits pump radiation (LB) that excites the paramagnetic centers (NV1) in the material of the sensor element to emit fluorescent radiation (FL). For example, this pump radiation source (PL1) in the form of the first laser may be a first laser diode of the company Osram of the type PLT5 520B with 520 nm for use with NV centers as paramagnetic centers (NV1), which is commercially available. Preferably, however, circularly polarized pump radiation sources are used. Preferably, the pump radiation source (PL1) is arranged opposite the material surface of the sensor element, for example the surface of an HD-NV diamond, in such a way that a maximum of the pump radiation power enters the material of the sensor element Typically, this means a preferably perpendicular arrangement of the sensor element surface, for example the surface of an HD-NV diamond, with respect to the beam of pump radiation (LB) from the pump radiation source. Particular advantages arise if the excitation of the paramagnetic center or centers (NV1) is achieved by means of an electric current through the sensor element. In this context, reference should be made, for example, to DE 4 322 830 A1, which describes such an excitation. In this case, the pump radiation source (PL1) is replaced by the sensor element itself. In any case, the claims are to be understood as including the simultaneous use of the sensor element as radiation source (PL1). This applies in particular even if no pump radiation (LB) occurs, i.e. this is only virtual. The pump radiation (LB) of the pump radiation source serves to excite magnetic or electrical sensitive paramagnetic centers (NV1), preferably NV centers in diamond. The pump radiation wavelength ($\lambda_{pmp}$) of the pump radiation source (PL1) is preferably chosen such that the one or more paramagnetic centers (NV1) generate photostable optimal fluorescence radiation (FL), for example to detect the mechanical vibrations of the mechanically vibrating system (MS). The pump radiation wavelength ($\lambda_{pmp}$) is preferably in a wavelength range of 500-600 nm for optimal excitation of NV centers in diamond. Preferably, a laser diode with a wavelength of 550 nm or 520 nm is used as the pump radiation source.

PLK compensation radiation source. The compensation radiation source may also be a laser diode or other suitable light source. Preferably, the compensation radiation source is constructed in the same manner as the pump radiation source (PL1). For example, this compensating radiation source (PLK) in the form of the second laser can be a second laser diode of the company Osram of the type PLT5 520B, which is available in specialist shops;

PU exemplary pickup of the exemplary electric guitar (GT) with exemplary visible diamonds as exemplary quantum sensor elements, wherein the exemplarily selected diamonds preferably have one of the cuts listed in this paper and are designed as decorative diamonds and wherein the diamonds preferably have a red color and wherein the diamonds preferably have paramagnetic centers (NV1) and more specifically preferably NV-centers as paramagnetic centers (NV1) and wherein the diamonds are preferably irradiated with green pump radiation (LB) during the operation of the musical instrument and wherein preferably the red fluorescence radiation (FL) of the exemplary NV centers is visible during this operation to a human observer with normal vision and wherein a drive and evaluation circuit (LIV) converts oscillations of device parts of the musical instrument into, in particular, electrical signals which are further processed;

PWM pulse width modulation;

PZ Zentrum serving as a pump radiation source (PL1). For example, it may be H3 center in a diamond as a sensing element that emits green pump radiation (LB) when a current flows in the diamond. This green pump radiation from the exemplary H3 center may then be used to excite a paramagnetic center (NV1), such as a NV center in the exemplary diamond, to emit fluorescent radiation (FL).

PZC group (cluster) of centers (PZ), which serve as pump radiation source (PL1). Such a group comprises at least one center (PZ). Preferably, however, such a group comprises a plurality of such centers (PZ). Preferably, the density of centers (PZ) within the group is higher than 10 ppm, more preferably higher than 20 ppm with respect to the number of atoms in the spatial volume of the group. Preferably, the density of the centers (PZ) within the group is such that the centers (PZ) within the group couple with each other and optionally preferably form mixed states. Most preferably, the density of centers (PZ) within such a group is such that the centers (PZ) exhibit collective behavior. Preferably, the thickness ($d_{PZC}$) of the group (PZC) of these centers (PZ) is of the order of a few pump radiation wavelengths ($\lambda_{pmp}$) of the pump radiation (LB). In this paper, the reference sign PZ is used to denote a single group but also several groups as a whole. The maximum density of a group is calculated from the inverse of the smallest spherical volume that at least two of these centers (PZ) occupy within the group. Multiplied by the number of centers (PZ) in this volume of space. The group is bounded by the ellipsoidal volume, which leads to a reduction of the density to 50%. The main axes are determined in such a way that the volume becomes minimal and yet all centers (PZ) of the group are included;

Q1 first oscillating quartz;
Q2 second oscillating crystal;
QUALU1 first quantum ALU. In this writing, an exemplary first quantum ALU comprises a first quantum dot (NV11) and at least one first nuclear quantum dot (CI1$_1$). The exemplary first quantum ALU of FIG. 81 comprises a first quantum dot (NV1) and a first nuclear quantum dot (CI1$_1$) of the first quantum ALU, and a second nuclear quantum dot (CI1) of the first quantum ALU and a third nuclear quantum dot (CI1$_3$) of the first quantum ALU (FIG. 81);
QUALU2' second quantum ALU. In this writing, an exemplary second quantum ALU comprises a second quantum dot (NV12) and at least one second nuclear quantum dot (CI2$_1$). The exemplary second quantum ALU of FIG. 81 The exemplary second quantum ALU comprises a second quantum dot (NV12) and a first nuclear quantum dot (CI2$_1$) of the second quantum ALU and a second nuclear quantum dot (CI2$_2$) of the second quantum ALU and a third nuclear quantum dot (CI2) of $_3$the second quantum ALU (FIG. 81);
QUB quantum bit;
QUB11 first quantum bit in the first vertical column and the first horizontal row of a quantum register;
QUB12 second quantum bit in the first vertical column and the second horizontal row of a quantum register;
QUB13 third quantum bit in the first vertical column and the third horizontal row of a quantum register;
r distance between a line (LH, LV, LTG) and the paramagnetic center(s) (NV1) or the group(s) (NVC) of paramagnetic centers (NV1);
RE reflector;
RG regulator. Preferably, the regulator has a low-pass characteristic which has an upper cut-off frequency which is smaller than the cut-off frequency of the loop filter (TP) which is preferably designed as a low-pass filter. Preferably, the regulator (RG) regulates the current through the compensation coil (LC) in such a way that at the location of the paramagnetic center (NV1), which is preferably an NV center in diamond, an operating point is established by a corresponding mean magnetic flux density B at the location of the paramagnetic center (NV1) which is in the optimum operating range (see FIG. 27);
s0 momentary value of the receiver output signal (S0);
S0 receiver output signal;
s1 momentary value of the reduced receiver output signal;
S1 reduced receiver output signal;
s3 momentary value of the filter input signal (S3);
S3 filter input signal;
S3' additional filter input signal;
s4 momentary value of the filter output signal (S4);
S4 filter output signal;
S4' additional filter output signal;
s5 momentary value of the transmission signal (S5);
S5 transmission signal;
s5c momentary value of the complementary alternating component (S5c) of the transmission signal (S5);
S5c complementary alternating component of the transmission signal (S5);
s5c' instantaneous value of the complementary alternating component (S5c') of the orthogonal reference signal (S5');
S5c' complementary alternating component of the orthogonal reference signal (S5');
S5g direct component value of the transmission signal (S5);

S5g' direct component value of the orthogonal reference signal (S5');
s5w alternating component value of the transmission signal (S5). This is the momentane value of the alternating component of the transmission signal (S5);
s5w' alternating component value of the orthogonal reference signal (S5'). This is the momentane value of the alternating component of the orthogonal reference signal (S5');
S5w alternating component of the transmission signal (S5);
S5w$_A$, value of the amplitude of the alternating component (S5w) of the transmission signal (S5);
s5w$_A$" value of the amplitude of the alternating component (S5w') of the additional transmission signal (S5');
S5w$_A$ amplitude of the alternating component (S5w) of the transmission signal (S5);
S5' orthogonal reference signal also referred to as further transmission signal (S5');
s6 momentary value of the feedback signal (S6);
S6 feedback signal;
S6' additional feedback signal;
s7 momentary value of the compensation transmission signal (S7);
s7g momentary value of the constant DC component compensation transmission signal (S7);
s7w momentary value of the alternating component of the compensation transmission signal (S7);
s7$_0$ real offset value added to the instantaneous value (s6) of the feedback signal (S6) by the second matching circuit (OF2);
S7 compensation transmission signal;
S7c complementary alternating component of the compensation transmission signal (S7);
S7g constant direct component of the compensation transmission signal (S7);
S7w alternating component of the compensation transmission signal (S7);
s8 momentary value of the complex feedback signal (S8);
S8 complex feedback signal;
s9 momentary value of the operating point control signal (S9);
S9 operating point control signal;
s10 momentary value of the hold circuit input signal (S10);
S10 hold circuit input signal;
S10' additional hold circuit input signal;
S11 further operating point control signal;
S&H hold circuit. The hold circuit is preferably used primarily to suppress the chopper frequency of the alternating component (S5w) of the transmission signal (S5). It is not absolutely necessary for the basic functionality of the sensor systems shown here, but it significantly improves their signal-to-noise ratio;
S&H' additional hold circuit. The additional hold circuit is preferably used primarily to suppress the chopper frequency of the alternating component (S5w) of the transmission signal (S5). It is not absolutely necessary for the basic functionality of the sensor systems shown here, but it significantly improves their signal-to-noise ratio;
SBR bar width;
SdT state of the art;
SH1 first horizontal shield line. The first horizontal shield line is preferably fabricated on the surface (OFL1) of the substrate (D) and electrically insulated therefrom and mechanically directly connected thereto. However, if necessary, contacts, for example the first horizontal contact (KH11) of the first quantum bit (QUB11), provide an electrical connection to the substrate (D) at predetermined locations in order to be able to extract the photocurrent. Preferably, the first horizontal shielding line is made of a material transparent to radiation of the pump radiation wavelength ($\lambda_{pmp}$) of the pump radiation (LB), for example ITO. Preferably, the first horizontal shielding line is fabricated on the surface (OFL1) of the substrate (D) and is fixedly connected thereto;

SH2 second horizontal shield line. The second horizontal shield line is preferably fabricated on the surface (OFL1) of the substrate (D) and electrically insulated therefrom and mechanically directly connected thereto. However, if necessary, contacts, for example the first horizontal contact (KH22) of the second quantum bit (QUB12), make an electrical connection to the substrate (D) at predetermined locations in order to be able to extract the photocurrent. Preferably, the second horizontal shielding line is made of a material transparent to radiation of the pump radiation wavelength ($\lambda_{pmp}$) of the pump radiation (LB), for example ITO. Preferably, the second horizontal shielding line is fabricated on the surface (OFL1) of the substrate (D) and is fixedly connected thereto;

SH3 third horizontal shield line. The third horizontal shield line is preferably fabricated on the surface (OFL1) of the substrate (D) and electrically insulated therefrom and mechanically directly connected thereto. However, if necessary, contacts, for example the first horizontal contact (KH33) of the third quantum bit (QUB13), make an electrical connection to the substrate (D) at predetermined locations in order to be able to extract the photocurrent. Preferably, the third horizontal shield line is made of a material transparent to radiation of the pump radiation wavelength ($\lambda_{pmp}$) of the pump radiation (LB), for example ITO. Preferably, the third horizontal shielding line is fabricated on the surface (OFL1) of the substrate (D) and is fixedly connected thereto;

SH4 fourth horizontal shield line. The fourth horizontal shield line is preferably fabricated on the surface (OFL1) of the substrate (D) and electrically insulated therefrom and mechanically directly connected thereto. However, if necessary, contacts, for example the second horizontal contact (KH44) of the third quantum bit (QUB13), make an electrical connection to the substrate (D) at predetermined locations in order to be able to extract the photocurrent. Preferably, the fourth horizontal shield line is made of a material transparent to radiation of the pump radiation wavelength ($\lambda_{pmp}$) of the pump radiation (LB), for example ITO. Preferably, the fourth horizontal shielding line is fabricated on the surface (OFL1) of the substrate (D) and is fixedly connected thereto;

STR trigger signal. The signal generator (G) preferably generates a signaling via this trigger signal at the end of a transmission signal period of the transmission signal (S5), which causes the holding circuits (S&H) to sample the output signal of the respective filter, for example the loop filter (TP), and thus obtain the instantaneous sample value. The respective holding circuit (S&H) then outputs this sample value as the filter output signal (S4) until the next signaling occurs via the trigger signal;

SV1 first vertical shield line. The first vertical shield line is preferably fabricated on the surface (OFL1) of the substrate (D) and electrically insulated therefrom and mechanically directly connected thereto. However, if necessary, contacts, for example the first vertical contact (KV11) of the first quantum bit (QUB11), provide an electrical connection to the substrate (D) at predetermined locations in order to be able to extract the photocurrent. Preferably, the first vertical shielding line is made of a material transparent to radiation of the pump radiation wavelength ($\lambda_{pmp}$) of the pump radiation (LB), for example ITO. Preferably, the first vertical shielding line is fabricated on the surface (OFL1) of the substrate (D) and is fixedly connected thereto;

SV2 second vertical shield line. The second vertical shield line is preferably fabricated on the surface (OFL1) of the substrate (D) and electrically insulated therefrom and mechanically directly connected thereto. However, if necessary, contacts, for example the second vertical contact (KV12) of the first quantum bit (QUB11), make an electrical connection to the substrate (D) at predetermined locations in order to be able to extract the photocurrent. Preferably, the first vertical shielding line is made of a material transparent to radiation of the pump radiation wavelength ($\lambda_{pmp}$) of the pump radiation (LB), for example ITO. Preferably, the first vertical shielding line is fabricated on the surface (OFL1) of the substrate (D) and is fixedly connected thereto;

$\theta_a$ Angle of emission of fluorescence radiation (FL);

$\theta_e$ Angle of incidence of the pump radiation (LB);

t Time;

$\tau_1$ first time constant;

T1 first times at which the transmission signal (S5) is active and the pump radiation source (PL1) emits pump radiation (LB);

$\tau_2$ second time constant;

T2 second times when the transmission signal (S5) is not active and the pump radiation source (PL1) does not emit pump radiation (LB);

$t_d$ transition time of a paramagnetic center, for example a NV center, coming from an excited state into an energetically lower intermediate state;

TFL test radiation corresponding to fluorescence radiation (FL) out of the housing;

$T_{Ic}$ pump radiation complementary time;

$T_{Ipmp}$ pump radiation pulse duration;

$T_{Ipmpd}$ pump radiation decay time of the intensity ($I_{pmp}$) of the pump radiation (LB);

$T_{Ipmpr}$ pump radiation rise time of the intensity ($I_{pmp}$) of the pump radiation (LB);

TLP test pump radiation;

TP Loop Filter. The loop filter is preferably designed as a low-pass filter and/or integrator;

$T_p$ Transmission signal period of the alternating component (S5w) of the transmission signal (S5);

TP' additional second loop filter. The additional loop filter is preferably designed as a low-pass filter corresponding to the loop filter (TP);

$T_{S5c}$ transmission design complementary time. The definition of the transmission design complementary time can be taken from FIG. 91;

$T_{S5pmp}$ transmission signal pulse duration. The definition of the transmission signal pulse duration can be taken from FIG. 91;

$T_{S5pmpd}$ transmission signal decay time. The definition of the transmission signal decay time can be taken from FIG. 91;

$T_{S5pmpp}$ transmission signal plateau time. The definition of the transmission signal plateau time can be taken from FIG. 91;

$T_{S5pmpr}$ transmission signal rise time. The definition of the transmission signal rise time can be taken from FIG. 91;

V gain of the loop filter (TP);

VD1 first vertical driver stage for driving the first vertical line (LV1) of the first quantum bit to be driven (QUB11) and the second quantum bit to be driven (QUB12) and the third quantum bit to be driven (QUB13);

$V_{ext}$ Extraction voltage for the extraction of the photo-current;

VLOTP1 first further vertical perpendicular point;

VLOTP2 second additional vertical perpendicular point;

VHNV1 first virtual horizontal quantum dot;

VHNV2 second virtual horizontal quantum dot;

VS1 first vertical receiver stage which can form a unit with the first vertical driver stage (VD1), for example for reading out the first quantum bit to be driven (QUB11) and, if appropriate, for reading out the second quantum bit to be driven (QUB12) and, if appropriate, for reading out the third quantum bit to be driven (QUB13) of the first column of quantum bits;

VS2 second vertical receiver stage which can form a unit with the second vertical driver stage (VD2), for example for reading out the first quantum bit to be driven (QUB21) and, if appropriate, for reading out the second quantum bit to be driven (QUB22) and, if appropriate, for reading out the third quantum bit to be driven (QUB23) of the second column of quantum bits;

VS3 third vertical receiver stage which can form a unit with the third vertical driver stage (VD3), for example for reading out the first quantum bit to be driven (QUB31) and, if appropriate, for reading out the second quantum bit to be driven (QUB32) and, if appropriate, for reading out the third quantum bit to be driven (QUB33) of the third column of quantum bits;

VVNV1 first virtual vertical quantum dot;

VVNV2 second virtual vertical quantum dot;

WA circumfencing housing wall of the casing;

List of Quotations

Patent Literature

CN 107 840 331 A, DE 4 322 830 A1, DE 19 514 062 A1, DE 19 546 563 C2,

DE 19 914 362 A1, DE 10 2006 036 167 B4, DE 10 2008 021 588 A1, DE 10 2009 060 873 A1,

DE 10 2014 105 482 A1, DE 10 2016 116 369 A1, DE 10 2016 116 875 A1,

DE 10 2017 100 879 A1, DE 10 2017 121 713 A1, DE 10 2017 122 365 B3,

DE 10 2018 106 860 A1, DE 10 2018 106 861 A1, DE 10 2018 127 394.0,

DE 10 2019 114 032.3, DE 10 2019 117 423.6, DE 10 2019 120 076.8, DE 10 2019 121 028.3,

DE 10 2019 121 029.1, EP 0 014 528 B1, EP 0 275 063 A2, EP 0 316 856 B1, EP 0 615 954 A1,

EP 1 097 107 B1, EP 1 490 772 B1, EP 1 645 664 A1, EP 2 521 179 B1, EP 3 301 473 A1,

JPH 0 536 399 B2, PCT/DE 2020/100 430, RU 2015 132 335 A, RU 2 145 365 C1,

U.S. Pat. Nos. 4,124,690 A, 5,637,878 A, 6,697,402 B2, 7,604,846 B2, 7,812,692 B2,

U.S. Pat. Nos. 8,168,413 B2, 8,547,090 B2, 8,766,154 B2, 8,947,080 B2, 8,961,920 B1,

U.S. Pat. Nos. 8,986,646 B2, 9,185,762 B2, 9,222,887 B2, 9,368,936 B1, 9,541,610 B2,

U.S. Pat. Nos. 9,551,763 B1, 9,557,391 B2, 9,599,562 B2, 9,632,045 B2, 9,638,821 B2,

U.S. Pat. Nos. 9,658,301 B2, 9,664,767 B2, 9,720,055 B1, 9,817,081 B2, 9,823,314 B2,

U.S. Pat. Nos. 9,829,545 B2, 9,910,104 B2, 9,910,105 B2, 9,958,320 B2, 10,006,973 B2,

U.S. Pat. Nos. 10,007,885 B1, 10,012,704 B2, 10,120,039 B2, 10,168,393 B2,

U.S. Pat. Nos. 10,193,304 B2, 10,241,158 B2, 10,345,396 B2, 10,359,479 B2,

U.S. Pat. Nos. 10,408,889 B2, 10,408,890 B2, US 2006 0 044 429 A1, US 2008 0 170 143 A1,

US 2009 0 110 626 A1, US 2010 0 176 280 A1, WO 2001 073 617 A2, WO 2009 106 316 A2,

WO 2016 083 140 A1, WO 2017 148 772 A1, WO 2018 169 997 A1,

Non-Patent Literature

GIA standard by John M. King "Colored Diamonds, colored reference Chart".

Data sheet 63646—UHU ALLESKLEBER folding box 35 g EN—45015

A. Wickenbrock et. Al. "Microwave-free magnetometry with nitrogen-vacancy centers in diamond" Appl. Phys. Lett, 109, 053505 (2016), Feb. 8, 2016

U. Klein "Radio astronomy:tools, applications and impacts; Course astro 841" Argelander-Institut für Astronomie Bonn, Edition 2011

M. Capelli, A. H. Heffernan, T. Ohshima, H. Abe, J. Jeske, A. Hope, A. D. Greentree, P. Reineck, B. C. Gibson, Increased nitrogen-vacancy center creation yield in diamond through electron beam irradiation at high temperature, Carbon (2018), doi: https://doi.org/10.1016/j.carbon.2018.11.051

B. Burchard "Electronic and optoelectronic components and component structures based on diamond", dissertation, Hagen 1994

Staacke, R., John, R., Wunderlich, R., Horsthemke, L., Knolle, W., Laube, C., Glösekötter, P., Burchard, B., Abel, B. and Meijer, J. (2020), "Isotropic Scalar Quantum Sensing of Magnetic Fields for Industrial Application", Adv. Quantum Technol. doi:10.1002/qute.202000037 (published after the priority date of the papers giving priority here).

L. Horsthemke, C. Bischoff, P. Glösekötter, B. Burchard, R. Staacke, J. Meijer "Highly Sensitive Compact Room Temperature Quantum Scalar Magnetometer" SMSI 2020, Pages 47-48, DOI 10.5162/SMSI2020/A1.4, ISBN 978-3-9819376-2-6 (published after the priority date of the papers giving priority here).

James L. Webb, Joshua D. Clement, Luca Troise, Sepehr Ahmadi, Gustav Juhl Johansen, Alexander Hucka and Ulrik L. Andersen, "Nanotesla sensitivity magnetic field sensing using a compact diamond nitrogen-vacancy magnetometer", Appl. Opt. Phys. Lett. 114, 231103 (2019), https://doi.org/10.1063/1.5095241

Gurudev Dutt, Liang Jiang, Jeronimo R. Maze, A. S. Zibrov "Quantum Register Based on Individual Electronic and Nuclear Spin Qubits in Diamond", Science, Vol. 316, 1312-1316, 01.06.2007, DOI: 10.1126/science.1139831;

Thiago P. Mayer Alegre, Antonio C. Torrezan de Souza, Gilberto Medeiros-Ribeiro, "Microstrip resonator for microwaves with controllable polarization", arXiv: 0708.0777v2 [cond-mat.other] 11.10.2007;

Benjamin Smeltzer, Jean McIntyre, Lilian Childress "Robust control of individual nuclear spins in diamond", Phys. Rev. A 80, 050302(R)—25 Nov. 2009;

Petr Siyushev, Milos Nesladek, Emilie Bourgeois, Michal Gulka, Jaroslav Hruby, Takashi Yamamoto, Michael Trupke, Tokuyuki Teraji, Junichi Isoya, Fedor Jelezko, "Photoelectrical imaging and coherent spin-state readout of single nitrogen-vacancy centers in diamond" Science 15 Feb. 2019, Vol. 363, Issue 6428, pp. 728-731, DOI: 10.1126/science.aav2789;

Timothy J. Proctor, Erika Andersson, Viv Kendon "Universal quantum computation by the unitary control of ancilla qubits and using a fixed ancilla-register interaction", Phys. Rev. A 88, 042330—24 Oct. 2013;

Alexander Zaitsev, "Optical Properties of Diamond," Springer; edition: 2001 (Jun. 20, 2001) ISBN 978-3-662-04548-0;

Mathias H. Metsch, Katharina Senkalla, Benedikt Tratzmiller, Jochen Scheuer, Michael Kern, Jocelyn Achard, Alexandre Tallaire, Martin B. Plenio, Petr Siyushev, and Fedor Jelezko, "Initialization and Readout of Nuclear Spins via a Negatively Charged Silicon-Vacancy Center in Diamond" Phys. Rev. Lett. 122, 190503—Published 17 May 2019;

Unden T, Tomek N, Weggler T, Frank F, London P, Zopes J, Degen C, Raatz N, Meijer J, Watanabe H, Itoh K M, Plenio M B, Naydenov B & Jelezko F, "Coherent control of solid state nuclear spin nano-ensemble", npj Quantum Information 4, Article number: 39 (2018);

Häußler S, Thiering G, Dietrich A, Waasem N, Teraji T, Isoya J, Iwasaki T, Hatano M, Jelezko F, Gali A, Kubanek A, "Photoluminescence excitation spectroscopy of SiV- and GeV-color center in diamond", New Journal of Physics, Volume 19 (2017);

Matthias Pfender, Nabeel Aslam, Patrick Simon, Denis Antonov, Gergő Thiering, Sina Burk, Felipe Fávaro de Oliveira, Andrej Denisenko, Helmut Fedder, Jan Meijer, Jose A. Garrido, Adam Gali, Tokuyuki Teraji, Junichi Isoya, Marcus William Doherty, Audrius Alkauskas, Alejandro Gallo, Andreas Griineis, Philipp Neumann, and Jörg Wrachtrup, "Protecting a Diamond Quantum Memory by Charge State Control", DOI: 10.1021/acs.nanolett.7b01796, Nano Lett. 2017, 17, 5931-5937;

Marcel Manheller, Stefan Trellenkamp, Rainer Waser, Silvia Karthäuser, "Reliable fabrication of 3 nm gaps between nanoelectrodes by electron-beam lithography", Nanotechnology, Vol. 23, No. 12, March 2012, DOI: 10.1088/0957-4484/23/12/125302.

J. Meijer, B. Burchard, M. Domhan, C. Wittmann, T. Gaebel, I. Popa, F. Jelezko, J. Wrachtrup, "Generation of single color centers by focused nitrogen implantation" Appl. Opt. Phys. Lett. 87, 261909 (2005); https://doi.org/10.1063/1.2103389

G. Balasubramanian, I. Y. Chan, R. Kolesov, M. Al-Hmoud, J. Tisler, C. Shin, C. Kim, A. Wojcik, P. R. Hemmer, A. Krueger, T. Hanke, A. Leitenstorfer, R. Bratschitsch, F. Jelezko, J. Wrachtrup, "nanoscale imaging magnetometry with diamond spins under ambient conditions", Nature 455, 648 (2008) (magnetic field measurement with NV centers).

G. Kucsko, P. C. Maurer, N. Y. Yao, M. Kubo, H. J. Noh, P. K. Lo, H. Park, M. D. Lukin, "Nanometre-scale thermometry in a living cell", Nature 500, 54-58 (2013) (Thermometry with NV centers).

F. Dole, H. Fedder, M. W. Doherty, T. Nobauer, F. Rempp, G. Balasubramanian, T. Wolf, F. Reinhard, L. C. L. Hollenberg, F. Jeletzko, J. Wrachtup, "Electric-field sensing using single diamond spins," Nat. Phs. 7, 459-463 (2011 (electric-field sensing with NV centers).

A. Albrecht, A. Retzker, M. Plenio, "Nanodiamond interferometry meets quantum gravity" arXiv:1403.6038v1 [quant-ph] 24 Mar. 2014(Measurement of gravitational fields with NV centers and consequently the possibility of measuring rotations and accelerations with NV centers as well as the possibility of navigation systems with NV centers and paramagnetic centers).

B. Kress, P. Meyrueis, "Digital Diffractive Optics" J. Wiley & Sons, London, 2000.

B. Kress, P. Meyrueis, "Applied Digital Diffractive Optics", J. Wiley & Sons, London, 2009.

B. E. A. Saleh, M. C. Teich "Fundamentals of Photonics" Wiley-VCH, Weinheim, 2nd edition, 2008.

L. W. Snyman, J-L. Polleux, K. A. Ogudo, C. Viana, S. Wahlc, "High Intensity 100 nW 5 GHz Silicon Avalanche LED utilizing carrier energy and momentum engineering", Conference Paper in Proceedings of SPIE—The International Society for Optical Engineering—February 2014, DOI: 10.1117/12.2038195.

C. Beaufils, W. Redjem, E. Rousseau, V. Jacques, A. Yu. Kuznetsov, C. Raynaud, C. Voisin, A. Benali, T. Herzig, S. Pezzagna, J. Meijer, M. Abbarchi, G. Cassabois "Optical properties of an ensemble of G-centers in silicon", Phys. Rev. B 97, 035303 Jan. 9, 2018.

S. Castelletto, A. Boretti, "Silicon carbide color centers for quantum applications," J. Phys. Photonics 2 022001, 2020 h.

J. R. Leger, D. Chen, G. Mowry, "Design and performance of diffractive optics for custom laser resonators," PPLIED OPTICS @Vol. 34, No. 14@10 May 1995, p. 2498-2509.

J. Cal, F. Jelezko, M. B. Pleniol, "Signal transduction and conversion with color centers in diamond and piezo-elements" arXiv:1404.6393v2 [quant-ph] 30 Oct. 2017.

The invention claimed is:

1. A method for producing a diamond with a high concentration of NV centers,
   comprising:
   providing a diamond blank:
   wherein the diamond blank, when provided, comprises nitrogen atoms in a form of P1 centers; and/or
   the diamond blank being of a yellow color when supplied; and/or
   the diamond blank being of GIA colors "fancy yellow" or "fancy deep yellow" or "fancy light yellow" or "fancy intense yellow" when supplied; and/or
   wherein the diamond blank, when provided, comprises nitrogen atoms together with hydrogen;
   irradiating the diamond blank with particles:
   wherein:
   an energy of the particles is greater than 4 MeV;
   an irradiation dose is between $5*10^{17}$ cm$^{-2}$ and $a*10^{19}$ cm$^{-2}$;
   a temperature of the diamond blank during irradiation is greater than 600° C. and less than 1200° C.;
   a radiation current of an electric current of the particles is adjusted such that an irradiation time to achieve the irradiation dose is at least 0.05 days;
   the particles are electrons;
   the temperature of the diamond blank is controlled by controlling a heating energy pulse height and/or a sensing factor and/or a temporal heating energy pulse spacing and/or a heating energy pulse width, whereby the control takes place in dependence on a temperature value;

the diamond blank is a synthetic HPHT diamond blank or a synthetic CVD diamond blank;

the temperature of the diamond blank during the irradiation is measured as a temperature value;

a total energy input to the diamond blank is composed of an energy from a heating device, a thermal energy derived via a thermal bleeder resistor, and a heating energy of the electron beam during the irradiation;

the diamond blank is heated with electrons during the irradiation;

the heating energy of the electron beam is determined by an energy of the electrons and an average beam current;

by controlling the total energy input by controlling at least one energy flow into the diamond blank during the irradiation and, if necessary, a total energy dissipation in such a way that a temperature probe placed in a vicinity of the diamond blank during the irradiation detects an average irradiation temperature of the diamond blank of greater than 600° C. and less 1200° C.;

the beam current of the electric current of the electrons of the electron beam is controlled;

a pulsed accelerator is used for the irradiation with the pulsed electron beam;

during irradiation a pulsation of the electron beam and thus also its heating energy is stabilized by a control system, such that a relevant controlled heating energy current, which heats the diamond blank during irradiation, is at least temporarily pulse-modulated in parts;

the heating energy is supplied pulsed or PWM-modulated or otherwise pulse-modulated by heating energy pulses;

the control is performed by adjusting the heating pulse width, the heating pulse spacing or a duty cycle of a pulse modulation of the heating pulses.

2. A diamond, comprising:
a single crystal, wherein:
the diamond is colored by a dyeing process;
the diamond appears red to a human observer when illuminated with white light;
the diamond has a first absorption coefficient ($\alpha_1$) when transilluminated with light having a wavelength of 437 nm in at least one possible transillumination direction at room temperature;
the diamond has a second absorption coefficient ($\alpha_2$) when transilluminated with light having a wavelength of 500 nm in at least one possible transillumination direction at room temperature;
the diamond has a third absorption coefficient ($\alpha_3$) when transilluminated with light having a wavelength of 570 nm in at least one possible transillumination direction at room temperature;
the diamond has a fourth absorption coefficient ($\alpha_4$) when transilluminated with light having a wavelength of 800 nm in at least one possible transillumination direction at room temperature;
the diamond has a fifth absorption coefficient ($\alpha_5$) when transilluminated with light having a wavelength between 200 nm and 400 nm in at least one possible transillumination direction at room temperature;
the fifth absorption coefficient ($\alpha_5$) is greater than the first absorption coefficient ($\alpha_1$);

wherein the first absorption coefficient ($\alpha_1$) is greater than the third absorption coefficient ($\alpha_3$);
the third absorption coefficient ($\alpha_3$) is greater than the second absorption coefficient ($\alpha_2$);
the second absorption coefficient ($\alpha_2$) is greater than the fourth absorption coefficient ($\alpha_4$); and
a difference of the third absorption coefficient ($\alpha_3$) minus the second absorption coefficient ($\alpha_2$) is less than a difference of the second absorption coefficient ($\alpha_2$) minus the fourth absorption coefficient ($\alpha_4$).

3. The method according to claim 1,
wherein the diamond blank has at least one ground surface prior to irradiation.

4. The method according to claim 1,
wherein the irradiation takes place in a vacuum with a residual pressure of less than $10^{-6}$ mBar or
wherein the irradiation takes place in an inert gas atmosphere.

5. The method according to claim 1,
wherein the diamond blank has one of following cuts prior to irradiation:
Pointed cut;
Table stone cut;
Rose cut;
Mazarin cutl;
Brilliant cut;
Teardrop cut;
Prince's cut;
Oval cut;
Heart cut;
Marquise cut;
Emerald cut;
Asscher cut;
Cushion cut;
Radiant cut;
Diamond old cut;
Emerald cut; or
Baguette cut.

6. The method of claim 1,
wherein the diamond blank is smaller than 1 mm.

7. The method of claim 1,
wherein the diamond blank is in a quartz vessel during irradiation.

8. A diamond produced according to the method of claim 1, wherein the diamond is synthetic.

9. The diamond according to claim 8, comprising:
a local NV center density generated by irradiation with particles of at least 10 ppm relative to a number of carbon atoms per unit volume, wherein local means a reference volume greater than half a pump radiation wavelength ($\lambda_{pmp}$) to a third power.

10. The diamond according to claim 8:
wherein the diamond is isotopically pure, wherein isotopically pure means that more than 99.5% of the atoms of the diamond can be assigned to one carbon isotope.

11. The diamond according to claim 8, wherein:
the diamond is colored by a dyeing process;
a crystal of the diamond is produced by a crystal growing process;
the diamond appears red to a human observer when illuminated with white light;
the diamond has a first absorption coefficient ($\alpha_1$) when transilluminated with light having a wavelength of 437 nm in at least one possible transillumination direction at room temperature;
the diamond has a second absorption coefficient ($\alpha_2$) when transilluminated with light having a wavelength of 500 nm in at least one possible transillumination direction at room temperature;

the diamond has a third absorption coefficient ($\alpha_3$) when transilluminated with light having a wavelength of 570 nm in at least one possible transillumination direction at room temperature;

the diamond has a fourth absorption coefficient ($\alpha_4$) when transilluminated with light having a wavelength of 800 nm in at least one possible transillumination direction at room temperature;

the diamond having a fifth absorption coefficient ($\alpha_5$) when transilluminated with light having a wavelength between 200 nm and 400 nm in at least one possible transillumination direction at room temperature;

the fifth absorption coefficient ($\alpha_5$) is greater than the first absorption coefficient ($\alpha_1$);

the first absorption coefficient ($\alpha_1$) is greater than the third absorption coefficient ($\alpha_3$);

the third absorption coefficient ($\alpha_3$) is greater than the second absorption coefficient ($\alpha_2$);

the second absorption coefficient ($\alpha_2$) is greater than the fourth absorption coefficient ($\alpha_4$); and a difference of the third absorption coefficient ($\alpha_3$) minus the second absorption coefficient ($\alpha_2$) is less than a difference of the second absorption coefficient ($\alpha_2$) minus the fourth absorption coefficient ($\alpha_4$).

12. An optical waveguide, wherein the optical waveguide is optically coupled to an HD-NV diamond according to claim 8.

13. An optical function element comprising an HD-NV diamond according to claim 8.

14. A fluorescent light source comprising:
an HD-NV diamond according to claim 8; and
a pump light source which generates pump radiation having a pump radiation wavelength ($\lambda_{pmp}$), wherein:
upon irradiation with the pump radiation, the HD-NV diamond emits fluorescence radiation having a fluorescence radiation wavelength ($\lambda_{fl}$); and
the fluorescence radiation leaves the fluorescence light source.

15. The fluorescent light source according to claim 14 comprising:
a first filter, wherein:
the first filter is substantially non-transparent to radiation at the pumping wavelength ($\lambda_{pmp}$); and
the first filter is substantially transparent to radiation of fluorescence wavelength ($\lambda_{fl}$), such that essentially only fluorescence radiation (FL) leaves the fluorescent light source.

16. The fluorescent light source according to claim 14, wherein the fluorescence radiation depends on a physical parameter and/or a magnetic flux density B.

* * * * *